US012729215B2

(12) United States Patent
Dai et al.

(10) Patent No.: US 12,729,215 B2
(45) Date of Patent: Sep. 8, 2026

(54) ELECTROLUMINESCENT MATERIAL AND DEVICE THEREOF

(71) Applicant: BEIJING SUMMER SPROUT TECHNOLOGY CO., LTD., Beijing (CN)

(72) Inventors: Zhihong Dai, Beijing (CN); Zhen Wang, Beijing (CN); Chuanjun Xia, Beijing (CN); Chi Yuen Raymond Kwong, Beijing (CN)

(73) Assignee: Beijing Summer Sprout Technology Co., Ltd., Beijing (CN)

( * ) Notice: Subject to any disclaimer, the term of this patent is extended or adjusted under 35 U.S.C. 154(b) by 981 days.

(21) Appl. No.: 17/977,557

(22) Filed: Oct. 31, 2022

(65) Prior Publication Data

US 2023/0250118 A1 Aug. 10, 2023

(30) Foreign Application Priority Data

Nov. 2, 2021 (CN) ........................ 202111286618.5
Sep. 20, 2022 (CN) ........................ 202211134409.3

(51) Int. Cl.
*C07F 15/00* (2006.01)
*C07F 1/08* (2006.01)
(Continued)

(52) U.S. Cl.
CPC ............ *C07F 15/0033* (2013.01); *C07F 1/08* (2013.01); *C07F 1/12* (2013.01); *C07F 13/00* (2013.01);
(Continued)

(58) Field of Classification Search
None
See application file for complete search history.

(56) References Cited

U.S. PATENT DOCUMENTS 5,703,436 A 12/1997 Forrest et al.
5,707,745 A 1/1998 Forrest et al.
(Continued)

FOREIGN PATENT DOCUMENTS

CN 1860202 A 11/2006
CN 110698518 A 1/2020

OTHER PUBLICATIONS

Office Action received for Chinese Patent Application No. 202211134409.3, mailed on Jan. 23, 2025, 11 pages (5 pages of English Translation and 6 pages of Original Document).
(Continued)

*Primary Examiner* — Dawn L Garrett
(74) *Attorney, Agent, or Firm* — KDW Firm PLLC

(57) ABSTRACT

Provided are an electroluminescent material and a device thereof. The electroluminescent material is a metal complex having a ligand represented by Formula 1 and can be used as light-emitting materials in electroluminescent devices. These new metal complexes can effectively regulate and control the luminescence wavelength, reduce the drive voltage of electroluminescent devices, greatly improve the current efficiency, power efficiency and EQE of electroluminescent devices, prolong the device lifetime, and provide better device performance. Further provided are an electroluminescent device and a compound composition.

23 Claims, 1 Drawing Sheet

(51) Int. Cl.
*C07F 1/12* (2006.01)
*C07F 13/00* (2006.01)
*H10K 50/11* (2023.01)
*H10K 85/30* (2023.01)

(52) U.S. Cl.
CPC ........ *C07F 15/002* (2013.01); *C07F 15/0073* (2013.01); *C07F 15/0086* (2013.01); *H10K 50/11* (2023.02); *H10K 85/341* (2023.02); *H10K 85/342* (2023.02); *H10K 85/346* (2023.02); *H10K 85/348* (2023.02); *H10K 85/371* (2023.02)

(56) References Cited

U.S. PATENT DOCUMENTS

| | | | | |
|---|---|---|---|---|
| 5,844,363 | A | 12/1998 | Gu et al. | |
| 6,097,147 | A | 8/2000 | Baldo et al. | |
| 6,303,238 | B1 | 10/2001 | Thompson et al. | |
| 7,279,704 | B2 | 10/2007 | Walters et al. | |
| 7,968,146 | B2 | 6/2011 | Wagner et al. | |
| 2003/0230980 | A1 | 12/2003 | Forrest et al. | |
| 2004/0174116 | A1 | 9/2004 | Lu et al. | |
| 2007/0034863 | A1 | 2/2007 | Fortte et al. | |
| 2010/0331506 | A1 | 12/2010 | Fortte et al. | |
| 2015/0349273 | A1 | 12/2015 | Hung et al. | |
| 2016/0359122 | A1 | 12/2016 | Boudreault et al. | |
| 2021/0376261 | A1* | 12/2021 | Boudreault | C07F 15/0086 |
| 2022/0106343 | A1* | 4/2022 | Shih | H10K 85/633 |
| 2024/0254153 | A1* | 8/2024 | Ji | H10K 85/654 |

OTHER PUBLICATIONS

Tang et al., "Organic electroluminescent diodes", Appl. Phys. Lett., vol. 51, No. 12, Sep. 21, 1987, pp. 913-915.

Uoyama et al., "Highly efficient organic light-emitting diodes from delayed fluorescence", Nature, vol. 492, Dec. 13, 2012, 7 pages.

* cited by examiner

ELECTROLUMINESCENT MATERIAL AND DEVICE THEREOF

CROSS-REFERENCE TO RELATED APPLICATION(S)

This application claims priority to Chinese Patent Application No. 202111286618.5 filed on Nov. 2, 2021 and Chinese Patent Application No. 202211134409.3 filed on Sep. 20, 2022, the disclosure of which are incorporated herein by reference in their entireties.

TECHNICAL FIELD

The present disclosure relates to compounds for organic electronic devices such as organic light-emitting devices. More particularly, the present disclosure relates to a metal complex having a ligand represented by Formula 1, an organic electroluminescent device comprising the metal complex, and a compound composition.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules.

Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

US20070034863A1 has disclosed a metal complex comprising the following structure

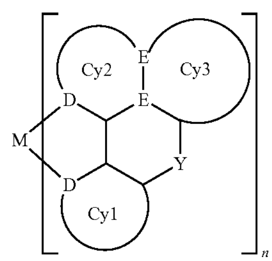, wherein two ring systems are joined through Y in the ligand. The various structures disclosed therein comprises alkyl- or phenyl-substituted complexes with B, N or P atoms as bridging atoms, such as

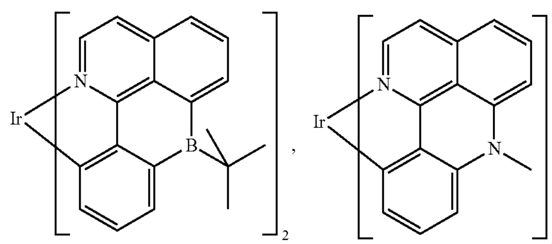

-continued

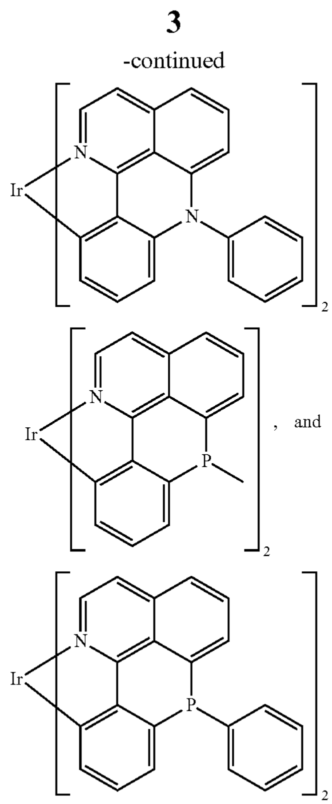

,

, and

.

This patent does not disclose or teach the great influence brought by the further introduction of a fused ring structure at a specific position.

CN110698518A discloses a phosphorescent light-emitting material whose general structural formula is

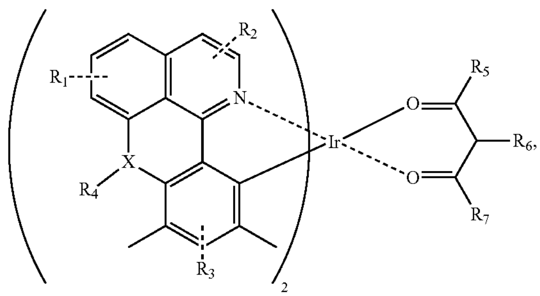

wherein X is N or P. Specific examples are

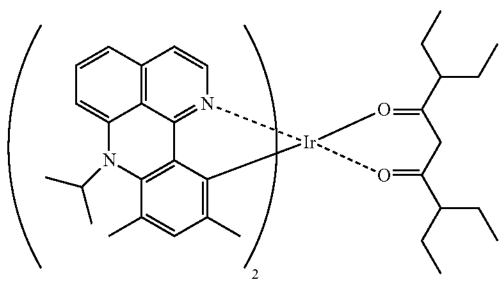

and

-continued

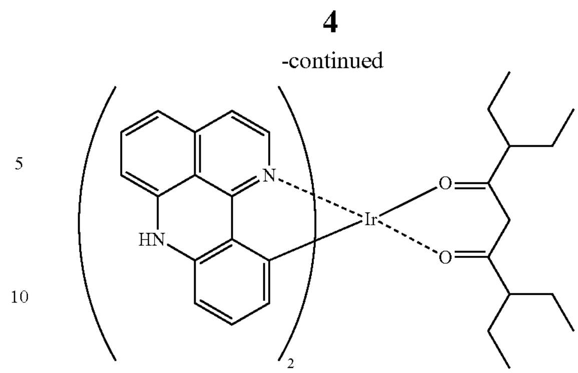

This patent does not pay attention to the great influence brought by the further introduction of a fused ring structure at a specific position.

The phosphorescent materials have been reported in the related art, but further research and development are still needed to meet the increasing requirements of the industry for device performance such as device emitting color, luminous saturation, voltage, drive efficiency, device lifetime and so on.

SUMMARY

The present disclosure aims to provide a series of metal complexes comprising a ligand represented by Formula 1 to solve at least part of the above-mentioned problems. The metal complexes may be used as light-emitting materials in organic electroluminescent devices. These new metal complexes can reduce the drive voltage of electroluminescent devices, greatly improve the current efficiency, power efficiency and EQE of electroluminescent devices, prolong the device lifetime, and provide better device performance.

According to an embodiment of the present disclosure, a metal complex is disclosed. The metal complex comprises a metal M and a ligand La coordinated to the metal M, wherein the metal M is selected from metals having a relative atomic mass greater than 40, and the ligand La has a structure represented by Formula 1:

Formula 1

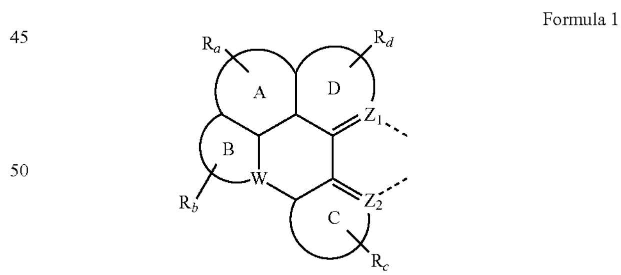

wherein $Z_1$ and $Z_2$ are each independently selected from C or N, and $Z_1$ and $Z_2$ are different;

W is, at each occurrence identically or differently, selected from B, N or P;

ring A, ring C, and ring D are, at each occurrence identically or differently, selected from a five-membered unsaturated carbocyclic ring, an aromatic ring having 6 to 30 carbon atoms or a heteroaromatic ring having 3 to 30 carbon atoms;

ring B is selected from a hetero ring having 5 to 30 ring atoms;

$R_a$, $R_b$, $R_c$, and $R_d$ represent, at each occurrence identically or differently, mono-substitution, multiple substitutions or non-substitution;

$R_a$, $R_b$, $R_c$, and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof, adjacent substituents $R_a$, $R_b$, $R_c$, and $R_d$ can be optionally joined to form a ring.

According to another embodiment of the present disclosure, an electroluminescent device is further disclosed. The electroluminescent device comprises an anode, a cathode, and an organic layer disposed between the anode and the cathode, wherein the organic layer comprises the metal complex in the preceding embodiment.

According to another embodiment of the present disclosure, a compound composition is further disclosed. The compound composition comprises the metal complex in the preceding embodiment.

The new metal complex disclosed in the present disclosure having a ligand represented by Formula 1 may be used as a light-emitting material in electroluminescent devices. These new metal complexes can effectively regulate and control the luminescence wavelength, reduce the drive voltage of electroluminescent devices, greatly improve the current efficiency, power efficiency and EQE of electroluminescent devices, prolong the device lifetime, and provide better device performance.

DETAILED DESCRIPTION

Figure 1:
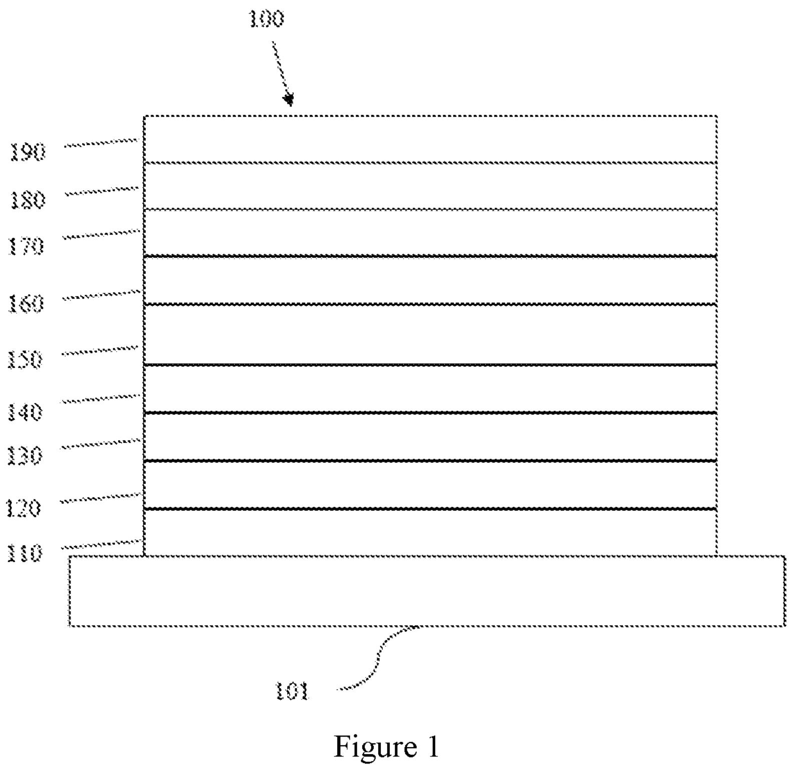
FIG. 1 is a schematic diagram of an organic light-emitting apparatus that may comprise a metal complex and a compound composition disclosed herein.

OLEDs can be fabricated on various types of substrates such as glass, plastic, and metal foil. FIG. 1 schematically shows an organic light-emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with F4-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may include a single layer or multiple layers.

Figure 2:
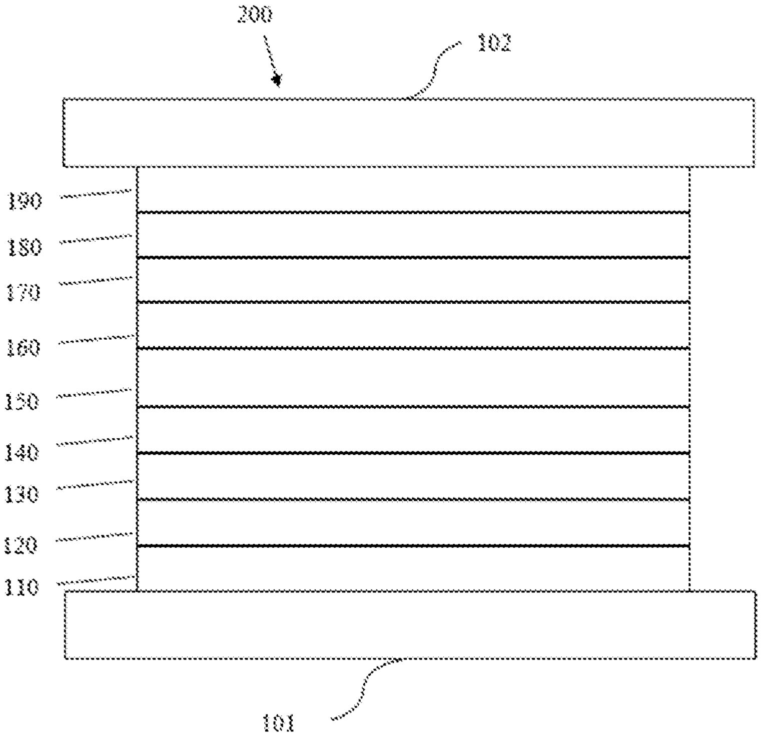
FIG. 2 is a schematic diagram of another organic light-emitting apparatus that may comprise a metal complex and a compound composition disclosed herein.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing (RISC) rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-T). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small AES-T. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, a n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, and a 3-methylpentyl group. Of the above, preferred are a methyl group, an ethyl group, a propyl group, an isopropyl group, a n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbornyl, 2-norbornyl, and the like. Of the above, preferred are cyclopentyl, cyclohexyl, 4-methylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthioethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylgermanylmethyl, trimethylgermanylethyl, trimethylgermanylisopropyl, dimethylethylgermanylmethyl, dimethylisopropylgermanylmethyl, tert-butyldimethylgermanylmethyl, triethylgermanylmethyl, triethylgermanylethyl, triisopropylgermanylmethyl, triisopropylgermanylethyl, trimethylsilylmethyl, trimethylsilylethyl, trimethylsilylisopropyl, triisopropylsilylmethyl, and triisopropylsilylethyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, 1-propenyl group, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, cyclohexenyl, cycloheptenyl, cycloheptatrienyl, cyclooctenyl, cyclooctatetraenyl, and norbornenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heterocyclic groups or heterocycle—as used herein include non-aromatic cyclic groups. Non-aromatic heterocyclic groups include saturated heterocyclic groups having 3 to 20 ring atoms and unsaturated non-aromatic heterocyclic groups having 3 to 20 ring atoms, where at least one ring atom is selected from the group consisting of a nitrogen atom, an oxygen atom, a sulfur atom, a selenium atom, a silicon atom, a phosphorus atom, a germanium atom, and a boron atom. Preferred non-aromatic heterocyclic groups are those having 3 to 7 ring atoms, each of which includes at least one hetero-atom such as nitrogen, oxygen, silicon, or sulfur. Examples of non-aromatic heterocyclic groups include oxiranyl, oxetanyl, tetrahydrofuranyl, tetrahydropyranyl, dioxolanyl, dioxanyl, aziridinyl, dihydropyrrolyl, tetrahydropyrrolyl, piperidinyl, oxazolidinyl, morpholinyl, piperazinyl, oxepinyl, thiepinyl, azepinyl, and tetrahydrosilolyl. Additionally, the heterocyclic group may be optionally substituted.

Heteroaryl—as used herein, includes non-condensed and condensed hetero-aromatic groups having 1 to 5 hetero-atoms, where at least one hetero-atom is selected from the group consisting of a nitrogen atom, an oxygen atom, a sulfur atom, a selenium atom, a silicon atom, a phosphorus atom, a germanium atom, and a boron atom. A hetero-aromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, —O-heteroalkyl, or —O-heterocyclic group. Examples and preferred examples of alkyl, cycloalkyl, heteroalkyl, and heterocyclic groups are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, tetrahydrofuranyloxy, tetrahydropyranyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl. Additionally, the arylalkyl group may be optionally substituted.

Alkylsilyl—as used herein, contemplates a silyl group substituted with an alkyl group. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyldi-t-butylsilyl. Additionally, the alkylsilyl group may be optionally substituted.

Arylsilyl—as used herein, contemplates a silyl group substituted with an aryl group. Arylsilyl groups may be those having 6 to 30 carbon atoms, preferably those having 8 to 20 carbon atoms. Examples of arylsilyl groups include triphenylsilyl, phenyldibiphenylylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl. Additionally, the arylsilyl group may be optionally substituted.

Alkylgermanyl—as used herein contemplates a germanyl substituted with an alkyl group. The alkylgermanyl may be those having 3 to 20 carbon atoms, preferably those having 3 to 10 carbon atoms. Examples of alkylgermanyl include trimethylgermanyl, triethylgermanyl, methyldiethylgermanyl, ethyldimethylgermanyl, tripropylgermanyl, tributylgermanyl, triisopropylgermanyl, methyldiisopropylgermanyl, dimethylisopropylgermanyl, tri-t-butylgermanyl, triisobutylgermanyl, dimethyl-t-butylgermanyl, and methyldi-t-butylgermanyl. Additionally, the alkylgermanyl may be optionally substituted.

Arylgermanyl—as used herein contemplates a germanyl substituted with at least one aryl group or heteroaryl group. Arylgermanyl may be those having 6 to 30 carbon atoms, preferably those having 8 to 20 carbon atoms. Examples of arylgermanyl include triphenylgermanyl, phenyldibiphenylylgermanyl, diphenylbiphenylgermanyl, phenyldiethylgermanyl, diphenylethylgermanyl, phenyldimethylgermanyl, diphenylmethylgermanyl, phenyldiisopropylgermanyl, diphenylisopropylgermanyl, diphenylbutylgermanyl, diphenylisobutylgermanyl, and diphenyl-t-butylgermanyl. Additionally, the arylgermanyl may be optionally substituted.

The term “aza” in azadibenzofuran, azadibenzothiophene, etc. means that one or more of C—H groups in the respective aromatic fragment are replaced by a nitrogen atom. For example, azatriphenylene encompasses dibenzo[f,h]quinoxaline, dibenzo[f,h]quinoline and other analogs with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted heterocyclic group, substituted arylalkyl, substituted alkoxy, substituted aryloxy, substituted alkenyl, substituted alkynyl, substituted aryl, substituted heteroaryl, substituted alkylsilyl, substituted arylsilyl, substituted alkylgermanyl, substituted arylgermanyl, substituted amino, substituted acyl, substituted carbonyl, a substituted carboxylic acid group, a substituted ester group, substituted sulfinyl, substituted sulfonyl, and substituted phosphino is used, it means that any group of alkyl, cycloalkyl, heteroalkyl, heterocyclic group, arylalkyl, alkoxy, aryloxy, alkenyl, alkynyl, aryl, heteroaryl, alkylsilyl, arylsilyl, alkylgermanyl, arylgermanyl, amino, acyl, carbonyl, a carboxylic acid group, an ester group, sulfinyl, sulfonyl, and phosphino may be substituted with one or more groups selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl group having 6 to 20 carbon atoms, unsubstituted alkylgermanyl group having 3 to 20 carbon atoms, unsubstituted arylgermanyl group having 6 to 20 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or an attached fragment are considered to be equivalent.

In the compounds mentioned in the present disclosure, hydrogen atoms may be partially or fully replaced by deuterium. Other atoms such as carbon and nitrogen may also be replaced by their other stable isotopes. The replacement by other stable isotopes in the compounds may be preferred due to its enhancements of device efficiency and stability.

In the compounds mentioned in the present disclosure, multiple substitutions refer to a range that includes di-substitutions, up to the maximum available substitutions. When substitution in the compounds mentioned in the present disclosure represents multiple substitutions (including di-, tri-, and tetra-substitutions etc.), that means the substituent may exist at a plurality of available substitution positions on its linking structure, the substituents present at a plurality of available substitution positions may have the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, the expression that adjacent substituents can be optionally joined to form a ring includes a case where adjacent substituents may be joined to form a ring and a case where adjacent substituents are not joined to form a ring. When adjacent substituents can be optionally joined to form a ring, the ring formed may be monocyclic or polycyclic (including spirocyclic, endocyclic, fusedcyclic, and etc.), as well as alicyclic, heteroalicyclic, aromatic, or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

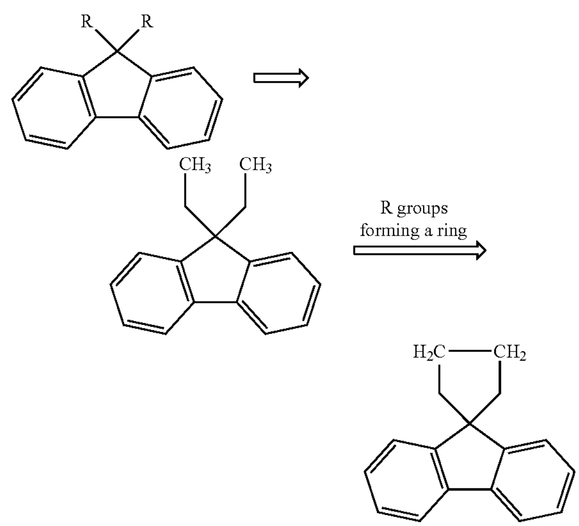

The expression that adjacent substituents can be optionally joined to form a ring is also intended to mean that two substituents bonded to carbon atoms which are directly bonded to each other are joined to each other via a chemical bond to form a ring, which can be exemplified by the following formula:

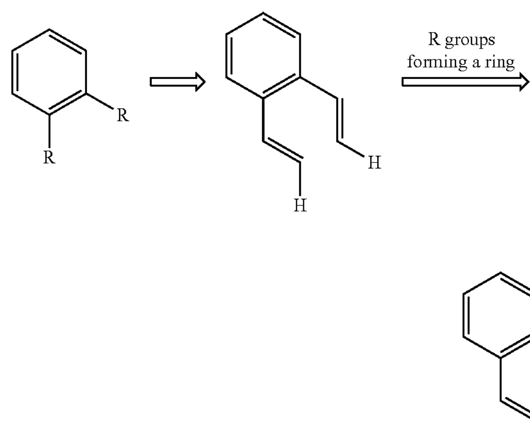

The expression that adjacent substituents can be optionally joined to form a ring is also intended to mean that two substituents bonded to further distant carbon atoms are joined to each other via a chemical bond to form a ring, which can be exemplified by the following formula:

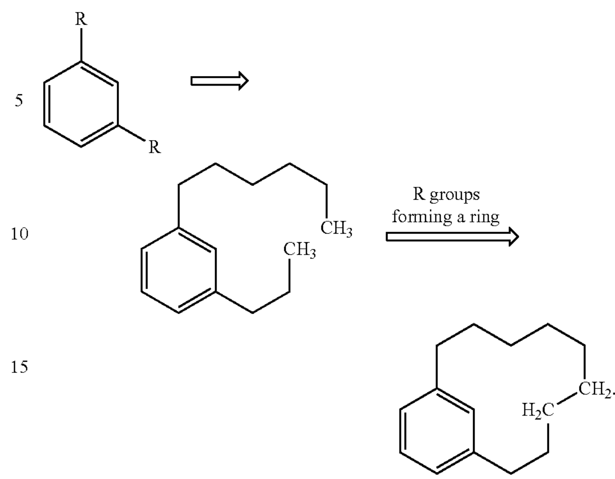

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

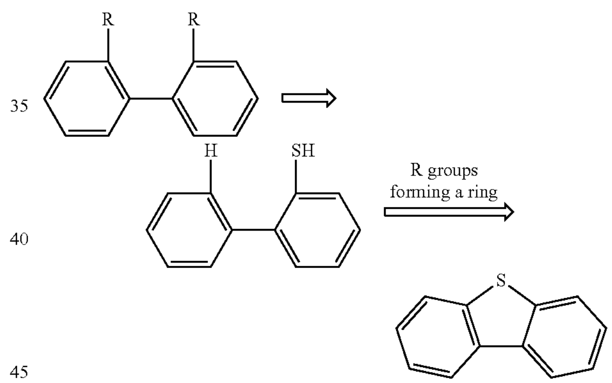

According to an embodiment of the present disclosure, a metal complex is disclosed. The metal complex comprises a metal M and a ligand La coordinated to the metal M, wherein the metal M is selected from metals having a relative atomic mass greater than 40, and the ligand La has a structure represented by Formula 1:

Formula 1

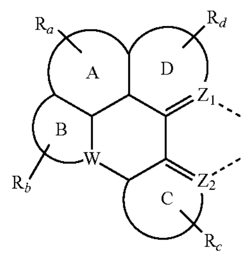

wherein $Z_1$ and $Z_2$ are each independently selected from C or N, and $Z_1$ and $Z_2$ are different;

W is, at each occurrence identically or differently, selected from B, N or P;

ring A, ring C, and ring D are, at each occurrence identically or differently, selected from a five-membered unsaturated carbocyclic ring, an aromatic ring having 6 to 30 carbon atoms or a heteroaromatic ring having 3 to 30 carbon atoms;

ring B is selected from a hetero ring having 5 to 30 ring atoms;

$R_a$, $R_b$, $R_c$, and $R_d$ represent, at each occurrence identically or differently, mono-substitution, multiple substitutions or non-substitution;

$R_a$, $R_b$, $R_c$, and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof, adjacent substituents $R_a$, $R_b$, $R_c$, and $R_d$ can be optionally joined to form a ring.

In the present disclosure, the expression that adjacent substituents $R_a$, $R_b$, $R_c$, and $R_d$ can be optionally joined to form a ring is intended to mean that any one or more of groups of adjacent substituents, such as adjacent substituents $R_a$, adjacent substituents $R_b$, adjacent substituents $R_c$, adjacent substituents $R_d$, adjacent substituents $R_a$ and $R_b$, and adjacent substituents $R_a$ and $R_d$, can be joined to form a ring. Obviously, it is also possible that none of these adjacent substituents are joined to form a ring.

According to an embodiment of the present disclosure, the metal complex optionally comprises other ligands which are optionally joined to La to form a tridentate ligand, a tetradentate ligand, a pentadentate ligand or a hexadentate ligand.

According to an embodiment of the present disclosure, in La, ring A, ring C, and ring D are, at each occurrence identically or differently, selected from an aromatic ring having 6 to 18 carbon atoms or a heteroaromatic ring having 3 to 18 carbon atoms; and ring B is selected from a heteroaromatic ring having 5 to 18 ring atoms.

According to an embodiment of the present disclosure, in La, ring A, ring C, and ring D are, at each occurrence identically or differently, selected from an aromatic ring having 6 to 10 carbon atoms or a heteroaromatic ring having 3 to 10 carbon atoms; and ring B is selected from a fused heteroaromatic ring having 8 to 18 ring atoms.

In this embodiment, the expression that ring B is selected from a fused heteroaromatic ring having 8 to 18 ring atoms is intended to mean that the ring B is selected from a fused heteroaromatic ring and the fused heteroaromatic ring has 8 to 18 ring atoms. For example, when ring B is selected from an indole ring, ring B is a fused heteroaromatic ring and has 9 ring atoms.

For example, when ring B is selected from an azaindole ring, ring B is a fused heteroaromatic ring and has 9 ring atoms.

According to an embodiment of the present disclosure, in La, ring A, ring C, and ring D are each independently selected from a benzene ring, a pyridine ring, a pyrimidine ring, a furan ring, a thiophene ring, a pyrrole ring, an imidazole ring, a thiazole ring, an oxazole ring, a pyrazole ring, an isothiazole ring, an isoxazole ring, a naphthalene ring, a quinoline ring, an isoquinoline ring, a naphthyridine ring, a benzofuran ring, a benzothiophene ring, a benzimidazole ring, a benzothiazole ring, a benzoxazole ring, a pyridofuran ring or a pyridothiophene ring; and ring B is selected from a pyrrole ring, an indole ring, an imidazole ring, a pyrazole ring or an azaindole ring.

According to an embodiment of the present disclosure, in La, ring A, ring C, and ring D are each independently selected from a benzene ring, a naphthalene ring, a pyridine ring or a pyrimidine ring; and ring B is selected from a pyrrole ring, an indole ring or an azaindole ring.

According to an embodiment of the present disclosure, La is selected from a structure represented by any one of Formula 2 to Formula 19:

Formula 2

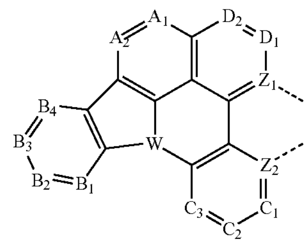

Formula 3

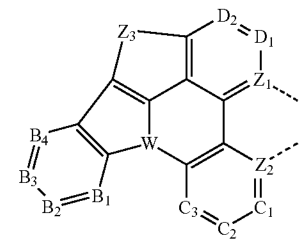

Formula 4

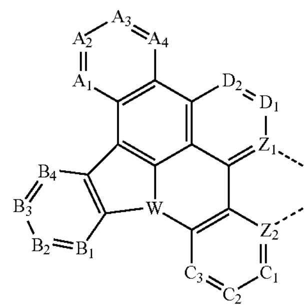

-continued
Formula 5
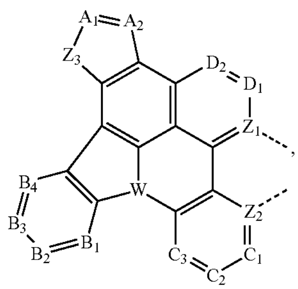
Formula 6
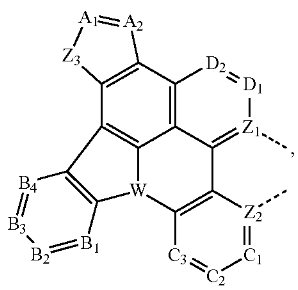
Formula 7
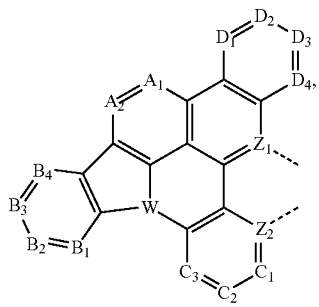
Formula 8
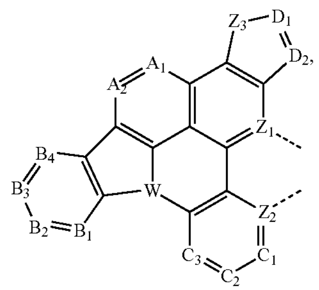
Formula 9
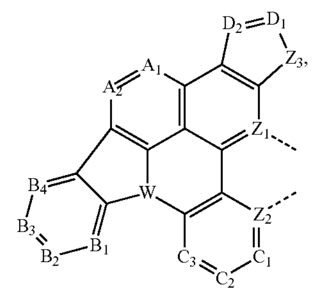
-continued
Formula 10
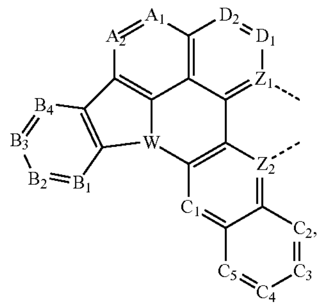
Formula 11
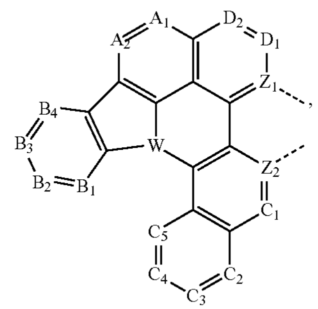
Formula 12
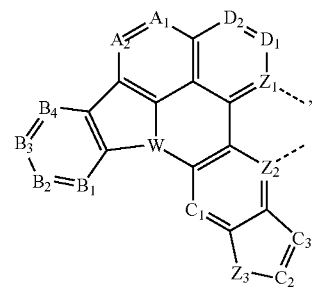
Formula 13
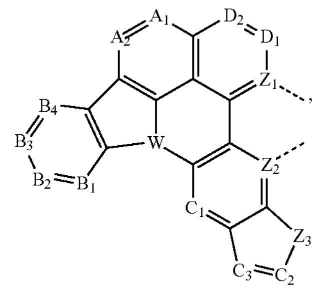
Formula 14
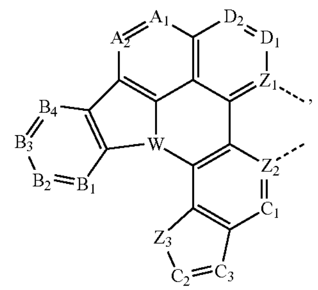

-continued

Formula 15

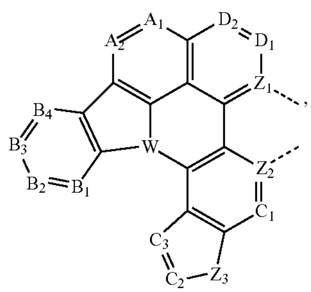

Formula 16

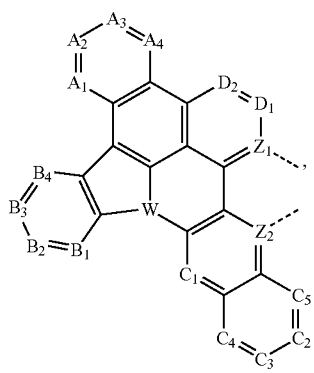

Formula 17

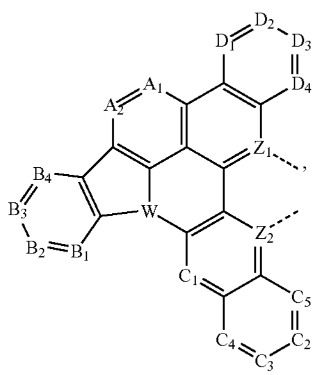

Formula 18

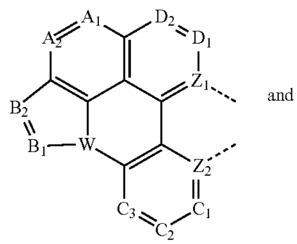

and

Formula 19

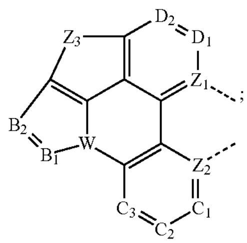

;

wherein $Z_1$ and $Z_2$ are each independently selected from C or N, and $Z_1$ and $Z_2$ are different;

W is, at each occurrence identically or differently, selected from B, N or P;

$A_1$ to $A_4$ are, at each occurrence identically or differently, selected from N or $CR_a$;

$B_1$ to $B_4$ are, at each occurrence identically or differently, selected from N or $CR_b$;

$C_1$ to $C_5$ are, at each occurrence identically or differently, selected from N or $CR_c$;

$D_1$ to $D_4$ are, at each occurrence identically or differently, selected from N or $CR_d$;

$Z_3$ is, at each occurrence identically or differently, selected from O, S, Se, $NR_z$, $CR_zR_z$, $SiR_zR_z$ or $PR_z$; when two $R_z$ are present at the same time, the two $R_z$ are identical or different;

$R_a$, $R_b$, $R_c$, $R_d$, and $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_a$, $R_b$, $R_c$, $R_d$, and $R_z$ can be optionally joined to form a ring.

According to an embodiment of the present disclosure, La is selected from a structure represented by Formula 2, Formula 4, Formula 7, Formula 10, Formula 16 or Formula 17.

According to an embodiment of the present disclosure, La is selected from a structure represented by Formula 2, Formula 4, Formula 10 or Formula 16.

According to an embodiment of the present disclosure, in Formula 2 to Formula 19, $Z_1$ is N, and $Z_2$ is C.

According to an embodiment of the present disclosure, in Formula 2 to Formula 19, $Z_2$ is N, and $Z_1$ is C.

According to an embodiment of the present disclosure, in Formula 2 to Formula 19, W is N.

According to an embodiment of the present disclosure, in Formula 2 to Formula 19, $Z_1$ is N, and $D_1$ and/or $D_2$ are N; or in Formula 2 to Formula 19, $Z_2$ is N, and $C_1$ and/or $C_2$ are N.

According to an embodiment of the present disclosure, in Formula 2 to Formula 19, $Z_1$ is N, and $D_2$ is N; or in Formula 2 to Formula 19, $Z_2$ is N, and $C_2$ is N.

According to an embodiment of the present disclosure, $A_1$ to $A_4$ are each independently selected from $CR_a$, $B_1$ to $B_4$ are each independently selected from $CR_b$, $C_1$ to $C_5$ are each independently selected from $CR_c$, and $D_1$ to $D_4$ are each independently selected from $CR_d$; $R_a$, $R_b$, $R_c$, and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof, adjacent substituents $R_a$, $R_b$, $R_c$, and $R_d$ can be optionally joined to form a ring.

According to an embodiment of the present disclosure, $A_1$ to $A_4$ are each independently selected from $CR_a$, $B_1$ to $B_4$ are each independently selected from $CR_b$, $C_1$ to $C_5$ are each independently selected from $CR_c$, and $D_1$ to $D_4$ are each independently selected from $CR_d$; $R_a$, $R_b$, $R_c$, and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkoxy having 1 to 20 carbon atoms, substituted or unsubstituted aryloxy having 6 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, a cyano group, and combinations thereof, adjacent substituents $R_a$, $R_b$, $R_c$, and $R_d$ can be optionally joined to form a ring.

According to an embodiment of the present disclosure, $A_1$ to $A_4$ are each independently selected from $CR_a$, $B_1$ to $B_4$ are each independently selected from $CR_b$, $C_1$ to $C_5$ are each independently selected from $CR_c$, and $D_1$ to $D_4$ are each independently selected from $CR_d$; $R_a$, $R_b$, $R_c$, and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, a cyano group, and combinations thereof, adjacent substituents $R_a$, $R_b$, $R_c$, and $R_d$ can be optionally joined to form a ring.

According to an embodiment of the present disclosure, in Formula 2 and Formula 4 to Formula 18, at least one of $A_1$ to $A_n$ is, at each occurrence identically or differently, selected from $CR_a$, and $A_n$ corresponds to one having the largest serial number among $A_1$ to $A_4$ in Formula 2 and Formula 4 to Formula 18; or in Formula 2 to Formula 19, at least one of $B_1$ to Bn is, at each occurrence identically or differently, selected from $CR_b$, and $B_n$ corresponds to one having the largest serial number among $B_1$ to $B_4$ in any one of Formula 2 to Formula 19; or in Formula 2 to Formula 19, at least one of $C_1$ to C is, at each occurrence identically or differently, selected from $CR_c$, and $C_G$ corresponds to one having the largest serial number among $C_1$ to $C_5$ in any one of Formula 2 to Formula 19; or in Formula 2 to Formula 19, at least one of $D_1$ to $D_n$ is, at each occurrence identically or differently, selected from $CR_d$, and $D_n$ corresponds to one having the largest serial number among $D_1$ to $D_4$ in any one of Formula 2 to Formula 19;

$R_a$, $R_b$, $R_c$, and $R_d$ are, at each occurrence identically or differently, selected from the group consisting of: deuterium, halogen, cyano, hydroxyl, sulfanyl, substituted or unsubstituted alkyl having 1 to 20 carbon atoms, substituted or unsubstituted cycloalkyl having 3 to 20 ring carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, and combinations thereof;

adjacent substituents $R_a$, $R_b$, $R_c$, and $R_d$ can be optionally joined to form a ring.

In the present disclosure, in Formula 2 and Formula 4 to Formula 18, at least one of $A_1$ to $A_n$ is, at each occurrence identically or differently, selected from $CR_a$, and $A_n$ corresponds to one having the largest serial number among $A_1$ to $A_4$ in any one of Formula 2 and Formula 4 to Formula 18. For example, for Formula 2, $A_n$ corresponds to $A_2$ whose serial number is the largest among $A_1$ to $A_4$ in Formula 2, that is, in Formula 2, at least one of $A_1$ to $A_2$ is, at each occurrence identically or differently, selected from $CR_a$. For another example, for Formula 4, $A_n$ corresponds to $A_4$ whose serial number is the largest among $A_1$ to $A_4$ in Formula 4, that is, in Formula 4, at least one of $A_1$ to $A_4$ is, at each occurrence identically or differently, selected from $CR_a$. Similarly, in Formula 2 to Formula 19, at least one of $B_1$ to Bn is, at each occurrence identically or differently, selected from $CR_b$, and Bn corresponds to one having the largest serial number among $B_1$ to $B_4$ in any one of Formula 2 to Formula 19. For example, for Formula 2, $B_n$ corresponds to $B_4$ whose serial number is the largest among $B_1$ to $B_4$ in Formula 2, that is, in Formula 2, at least one of $B_1$ to $B_4$ is, at each occurrence identically or differently, selected from $CR_b$. For another example, for Formula 18, $B_n$ corresponds to $B_2$ whose serial number is the largest among $B_1$ to $B_4$ in Formula 18, that is, in Formula 18, at least one of $B_1$ to $B_2$ is, at each occurrence identically or differently, selected from $CR_b$. Similarly, in Formula 2 to Formula 19, at least one of $C_1$ to $C_G$ is, at each occurrence identically or differently, selected from $CR_c$, and C corresponds to one having the largest serial number among $C_1$ to $C_5$ in any one of Formula 2 to Formula 19. For example, for Formula 2, $C_G$ corresponds to $C_3$ whose serial number is the largest among $C_1$ to $C_5$ in Formula 2, that is, in Formula 2, at least one of $C_1$ to $C_3$ is, at each occurrence identically or differently, selected from $CR_c$. For another example, for Formula 11, C corresponds to $C_5$ whose serial number is the largest among $C_1$ to $C_5$ in Formula 11, that is, in Formula 11, at least one of $C_1$ to $C_5$ is, at each occurrence identically or differently, selected from $CR_c$. Similarly, in Formula 2 to Formula 19, at least one of $D_1$ to $D_n$ is, at each occurrence identically or differently, selected from $CR_d$, and $D_n$ corresponds to one having the largest serial number among $D_1$ to $D_4$ in any one of Formula 2 to Formula 19. For example, for Formula 2, $D_n$ corresponds to $D_2$ whose serial number is the largest among $D_1$ to $D_4$ in Formula 2, that is, in Formula 2, at least one of $D_1$ to $D_2$ is, at each occurrence identically or differently, selected from $CR_d$. For another example, for Formula 7, $D_n$ corresponds to $D_4$ whose serial number is the largest among $D_1$ to $D_4$ in Formula 7, that is, in Formula 7, at least one of $D_1$ to $D_4$ is, at each occurrence identically or differently, selected from $CR_d$.

According to an embodiment of the present disclosure, in Formula 2 and Formula 4 to Formula 18, $A_1$ and/or $A_2$ are, at each occurrence identically or differently, selected from $CR_a$; or in Formula 2 to Formula 17, at least one of $B_2$ to $B_4$ is, at each occurrence identically or differently, selected from $CR_b$; in Formula 18 to Formula 19, $B_1$ and/or $B_2$ are selected from $CR_b$; or in Formula 2 to Formula 19, at least one of $C_1$ to $C_3$ is, at each occurrence identically or differently, selected from $CR_c$; or in Formula 2 to Formula 19, $D_1$ and/or $D_2$ are selected from $CR_d$; $R_a$, $R_b$, $R_c$, and $R_d$ are, at each occurrence identically or differently, selected from the group consisting of: deuterium, halogen, cyano, substituted or unsubstituted alkyl having 1 to 20 carbon atoms, substituted or unsubstituted cycloalkyl having 3 to 20 ring carbon atoms, substituted or unsubstituted alkoxy having 1 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, and combinations thereof.

According to an embodiment of the present disclosure, in Formula 2 and Formula 4 to Formula 18, $A_1$ and/or $A_2$ are, at each occurrence identically or differently, selected from $CR_a$; or in Formula 2 to Formula 17, at least one of $B_2$ to $B_4$ is, at each occurrence identically or differently, selected from $CR_b$; in Formula 18 to Formula 19, $B_1$ and/or $B_2$ are selected from $CR_b$; or in Formula 2 to Formula 19, at least one of $C_1$ to $C_3$ is, at each occurrence identically or differently, selected from $CR_c$; or in Formula 2 to Formula 19, $D_1$ and/or $D_2$ are selected from $CR_d$; $R_a$, $R_b$, $R_c$, and $R_d$ are, at each occurrence identically or differently, selected from the group consisting of: deuterium, fluorine, cyano, methyl, ethyl, isopropyl, isobutyl, tert-butyl, neopentyl, cyclopentyl, cyclopentylmethyl, cyclohexyl, norbornyl, adamantly, trimethylsilyl, triethylsilyl, trimethylgermanyl, phenyl, pyridyl, triazinyl, trifluoromethyl, methoxy, dimethylamino, deuterated methyl, deuterated ethyl, deuterated isopropyl, deuterated isobutyl, deuterated tert-butyl, deuterated cyclopentyl, deuterated cyclopentylmethyl, deuterated cyclohexyl, deuterated neopentyl, and combinations thereof.

According to an embodiment of the present invention, in Formula 18 to Formula 19, $B_1$ or $B_2$ is selected from $CR_b$; $R_b$ is, at each occurrence identically or differently, selected from the group consisting of: substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, and combinations thereof.

According to an embodiment of the present disclosure, $L_a$ is, at each occurrence identically or differently, selected from the group consisting of $L_{a1}$ to $L_{a1241}$, wherein for the specific structures of $L_{a1}$ to $L_{a1241}$, reference is made to claim 9.

According to an embodiment of the present disclosure, hydrogens in the structures $L_{a1}$ to $L_{a1241}$ can be partially or completely substituted with deuterium.

According to an embodiment of the present disclosure, $L_a$ is, at each occurrence identically or differently, selected from the group consisting of $L_{a1}$ to $L_{a1287}$, wherein for the specific structures of $L_{a1}$ to $L_{a1241}$, reference is made to claim 9, and the structures of $L_{a1242}$ to $L_{a1287}$ are as follows:

$L_{a1242}$

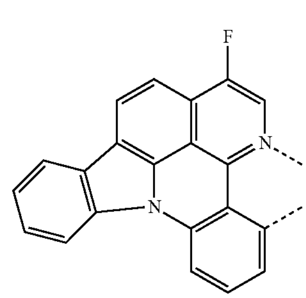

$L_{a1243}$

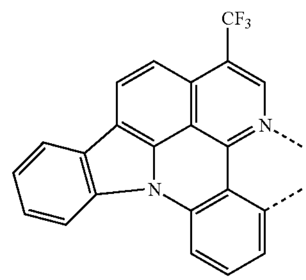

$L_{a1244}$

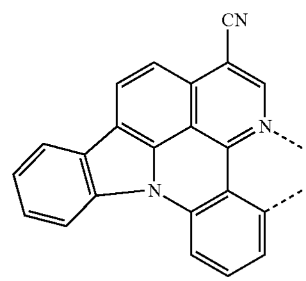

-continued
$L_{a1245}$
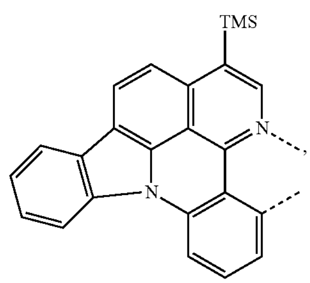
$L_{a1246}$
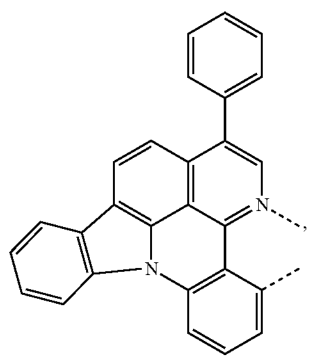
$L_{a1247}$
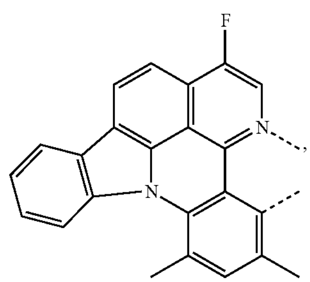
$L_{a1248}$
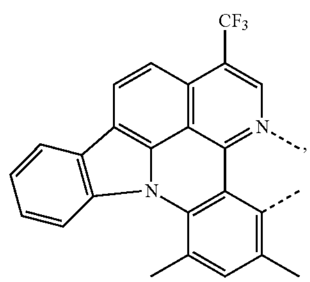
$L_{a1249}$
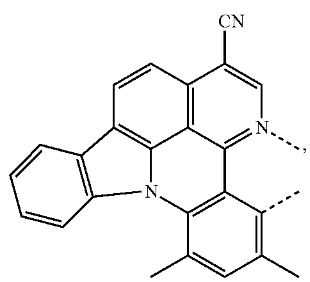
-continued
$L_{a1250}$
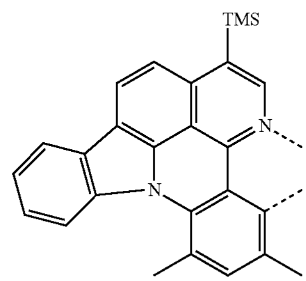
$L_{a1251}$
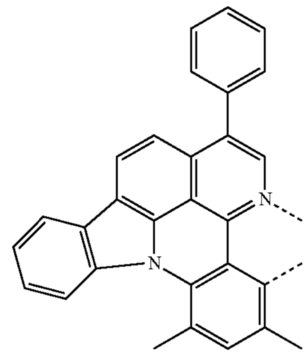
$L_{a1252}$
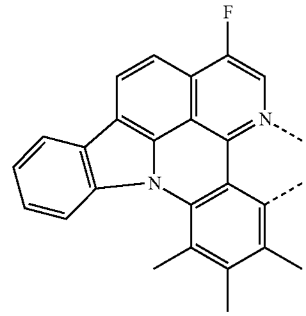
$L_{a1253}$
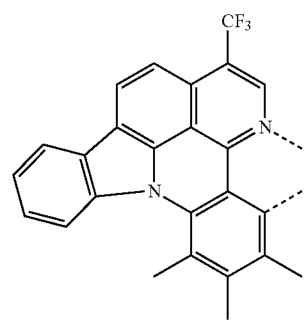
$L_{a1254}$
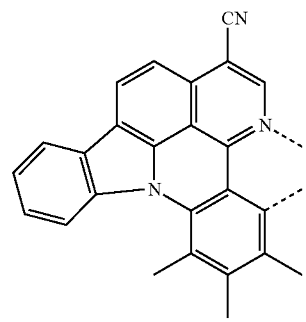

-continued
$L_{a1255}$
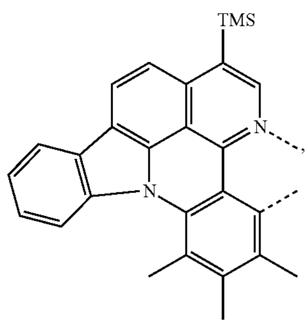
$L_{a1256}$
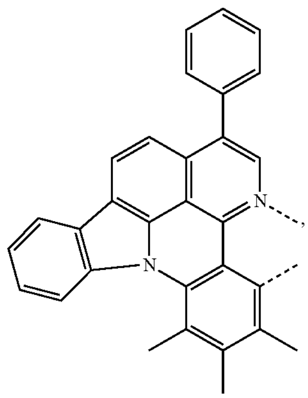
$L_{a1257}$
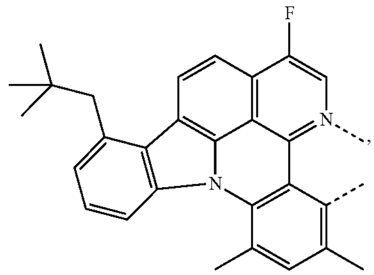
$L_{a1258}$
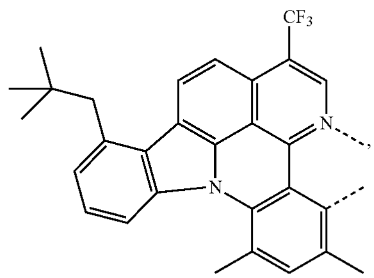
$L_{a1259}$
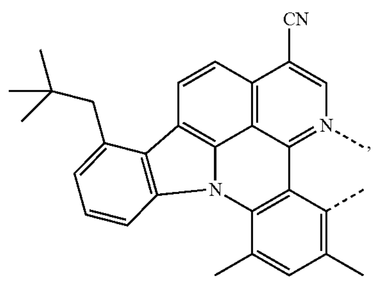
-continued
$L_{a1260}$
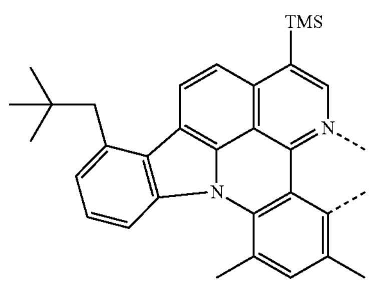
$L_{a1261}$
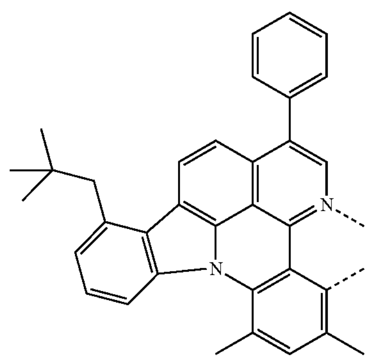
$L_{a1262}$
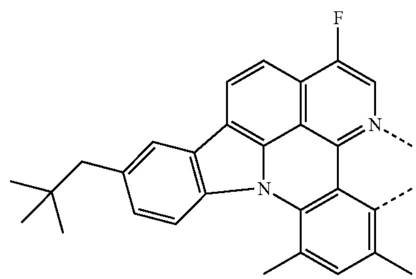
$L_{a1263}$
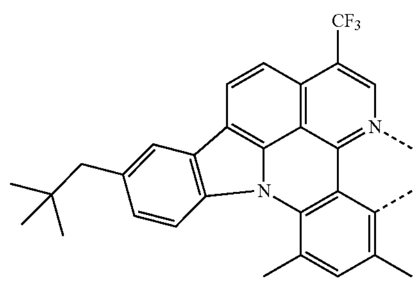
$L_{a1264}$
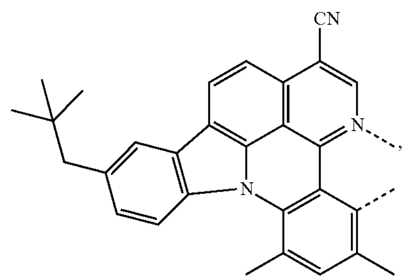

-continued
$L_{a1265}$
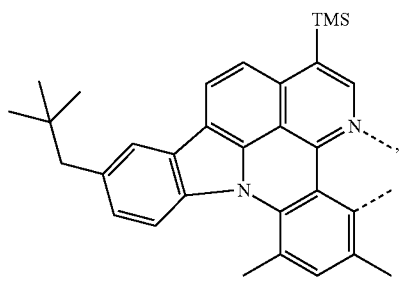
$L_{a1266}$
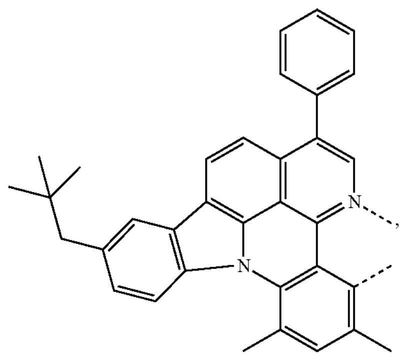
$L_{a1267}$
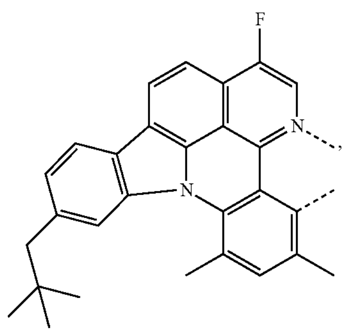
$L_{a1268}$
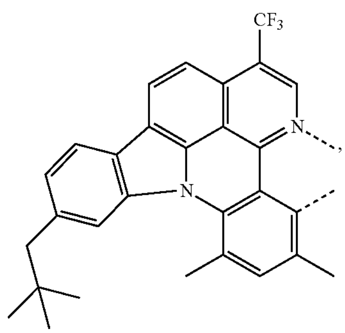
$L_{a1269}$
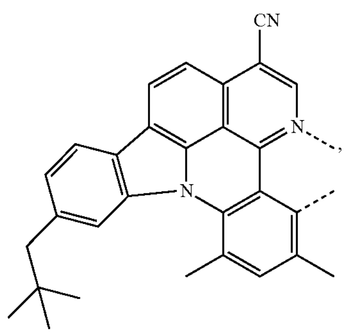
-continued
$L_{a1270}$
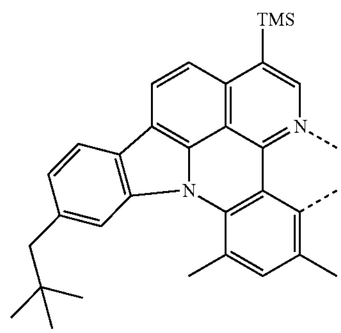
$L_{a1271}$
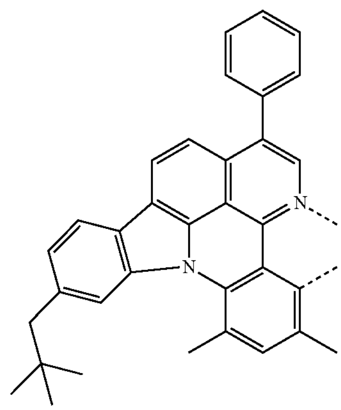
$L_{a1272}$
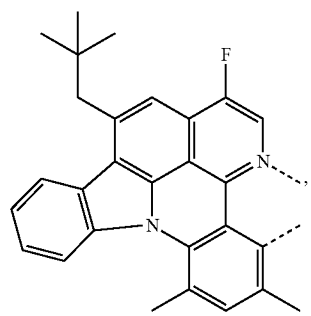
$L_{a1273}$
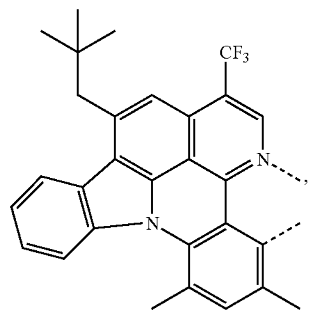

$L_{a1274}$
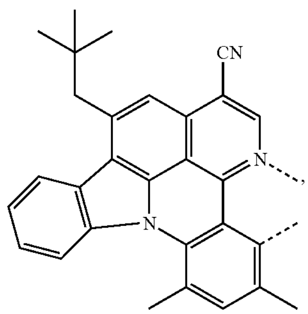
$L_{a1275}$
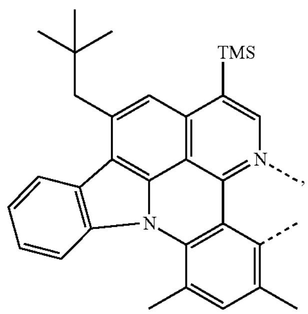
$L_{a1276}$
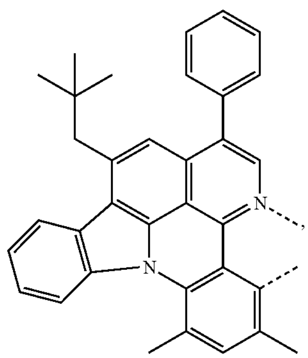
$L_{a1277}$
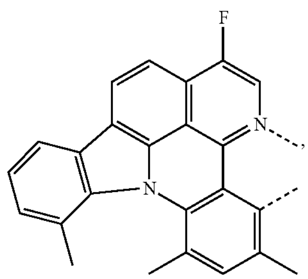
$L_{a1278}$
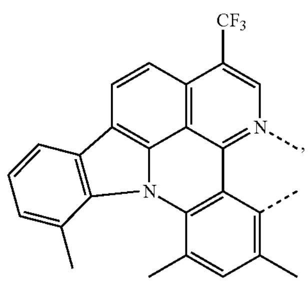
$L_{a1279}$
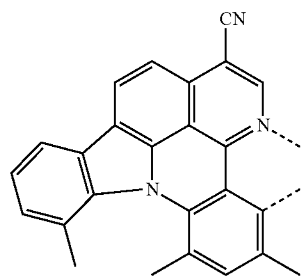
$L_{a1280}$
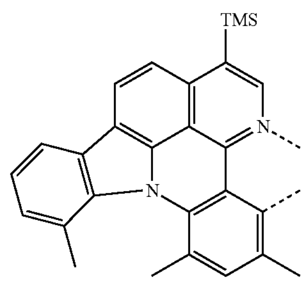
$L_{a1281}$
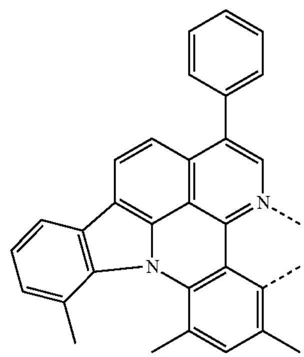
$L_{a1282}$
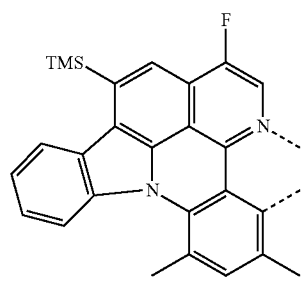
$L_{a1283}$
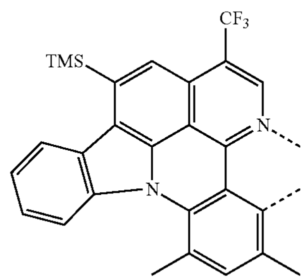

-continued $L_{a1284}$

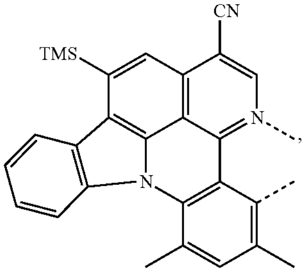

$L_{a1285}$

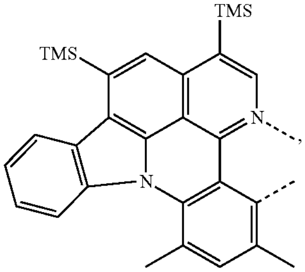

$L_{a1286}$

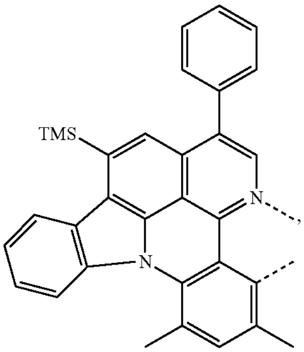

and $L_{a1287}$

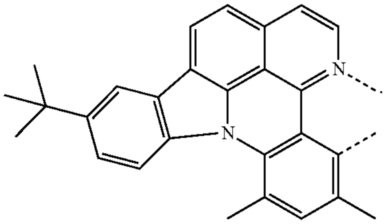

According to an embodiment of the present disclosure, hydrogens in the structures $L_{a1}$ to $L_{a1287}$ can be partially or fully substituted with deuterium.

According to an embodiment of the present disclosure, the metal complex has a general formula of $M(L_a)_m(L_b)_n(L_c)_q$;

wherein the metal M is selected from Ir, Rh, Re, Os, Pt, Au or Cu; $L_a$, $L_b$, and $L_c$ are a first ligand, a second ligand and a third ligand coordinated to the metal M, respectively; m is selected from 1, 2 or 3, n is selected from 0, 1 or 2, q is selected from 0, 1 or 2, and m+n+q is equal to an oxidation state of the metal M; when m is equal to 2 or 3, a plurality of $L_a$ can be identical or different; when n is equal to 2, two $L_b$ can be identical or different; and when q is equal to 2, two $L_c$ can be identical or different;

$L_a$, $L_b$, and $L_c$ can be optionally joined to form a multidentate ligand;

$L_b$ and $L_c$ are, at each occurrence identically or differently, selected from the group consisting of the following structures:

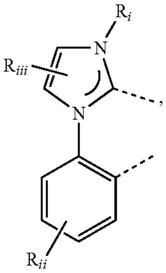

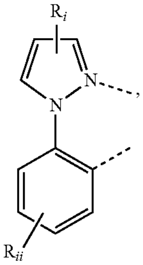

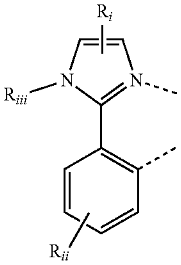

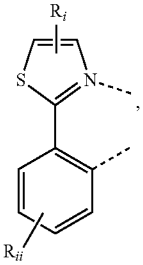

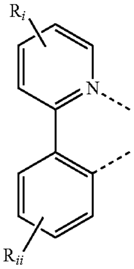

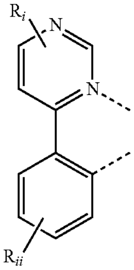

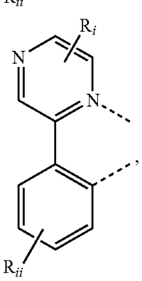

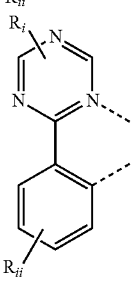

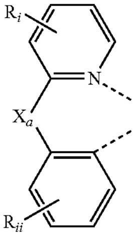

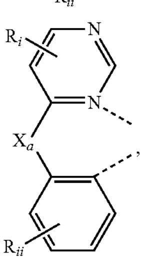

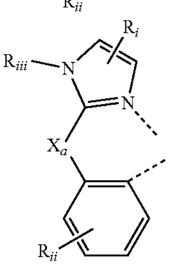

and

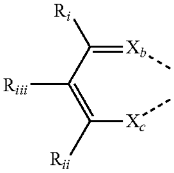

wherein $R_i$, $R_{ii}$ and $R_{iii}$ represent, at each occurrence identically or differently, mono-substitution, multiple substitutions or non-substitution;

$X_a$ is, at each occurrence identically or differently, selected from the group consisting of: O, S, Se, $NR_{N1}$, and $CR_{C1}R_{C2}$;

$X_b$ and $X_c$ are, at each occurrence identically or differently, selected from the group consisting of: O, S, Se and $NR_{N2}$;

$R_i$, $R_{ii}$, $R_{iii}$, $R_{N1}$, $R_{N2}$, $R_{C1}$, and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_i$, $R_{ii}$, $R_{iii}$, $R_{N1}$, $R_{N2}$, $R_{C1}$ and $R_{C2}$ can be optionally joined to form a ring.

In this embodiment, the expression that adjacent substituents $R_i$, $R_{ii}$, $R_{iii}$, $R_{N1}$, $R_{N2}$, $R_{C1}$ and $R_{C2}$ can be optionally joined to form a ring is intended to mean that any one or more of groups of adjacent substituents in the structures of $L_b$ and $L_c$, such as adjacent substituents $R_i$, adjacent substituents $R_{ii}$, adjacent substituents $R_{iii}$, adjacent substituents $R_i$ and $R_{ii}$, adjacent substituents $R_{ii}$ and $R_{iii}$, adjacent substituents $R_i$ and $R_{iii}$, adjacent substituents $R_i$ and $R_{N1}$, adjacent substituents $R_i$ and $R_{C1}$, adjacent substituents $R_i$ and $R_{C2}$, adjacent substituents $R_i$ and $R_{N1}$, adjacent substituents $R_{iii}$ and $R_{N1}$, adjacent substituents $R_{ii}$ and $R_{C1}$, adjacent substituents $R_{ii}$ and $R_{C2}$, adjacent substituents $R_{iii}$ and $R_{C1}$, adjacent substituents $R_{iii}$ and $R_{C2}$, adjacent substituents $R_i$ and $R_{N2}$, adjacent substituents $R_{ii}$ and $R_{N2}$, and adjacent substituents $R_{C1}$ and $R_{C2}$, may be joined to form a ring. Obviously, it is also possible that none of these substituents are joined to form a ring.

In this embodiment, $L_a$, $L_b$, and $L_c$ can be optionally joined to form a multi-dentate ligand, for example, any two or three of $L_a$, $L_b$, and $L_c$ can be joined to form a tetradentate ligand or a hexadentate ligand. Obviously, it is also possible that none of $L_a$, $L_b$ and $L_c$ are joined, so that no multidentate ligand is formed.

According to an embodiment of the present disclosure, the metal M is selected from Ir, Pt or Os.

According to an embodiment of the present disclosure, the metal M is Ir.

According to an embodiment of the present disclosure, $L_b$ is, at each occurrence identically or differently, selected from the following structure:

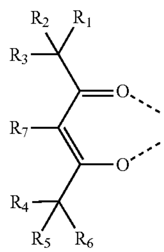

wherein $R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

According to an embodiment of the present disclosure, $L_b$ is, at each occurrence identically or differently, selected from the following structure:

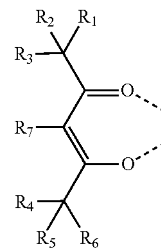

wherein at least one or two of $R_1$ to $R_3$ is(are), at each occurrence identically or differently, selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or combinations thereof; and/or at least one or two of $R_4$ to $R_6$ is(are), at each occurrence identically or differently, selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or combinations thereof.

According to an embodiment of the present disclosure, $L_b$ is, at each occurrence identically or differently, selected from the following structure:

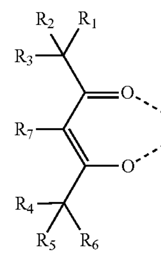

wherein at least two of $R_1$ to $R_3$ are, at each occurrence identically or differently, selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or combinations thereof; and/or at least two of $R_4$ to $R_6$ are, at each occurrence identically or differently, selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or combinations thereof.

According to an embodiment of the present disclosure, $L_c$ is, at each occurrence identically or differently, selected from the following structure:

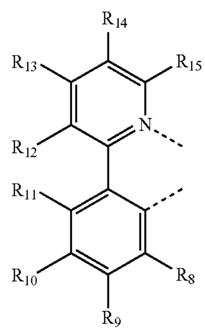

wherein $R_8$ to $R_{15}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof, adjacent substituents $R_8$ to $R_{15}$ can be optionally joined to form a ring.

In this embodiment, the expression that adjacent substituents $R_8$ to $R_{15}$ can be optionally joined to form a ring is intended to mean that any one or more of groups of adjacent substituents, such as substituents $R_8$ and $R_9$, substituents $R_9$ and $R_{10}$, substituents $R_{10}$ and $R_{11}$, substituents $R_{11}$ and $R_{12}$, substituents $R_{12}$ and $R_{13}$, substituents $R_{13}$ and $R_{14}$, and substituents $R_{14}$ and $R_{15}$, can be joined to form a ring. Obviously, it is also possible that none of these substituents are joined to form a ring.

According to an embodiment of the present disclosure, $L_b$ is, at each occurrence identically or differently, selected from the group consisting of $L_{b1}$ to $L_{b322}$, wherein for the specific structures of $L_{b1}$ to $L_{b322}$, reference is made to claim 13.

According to an embodiment of the present disclosure, $L_c$ is, at each occurrence identically or differently, selected from the group consisting of $L_{c1}$ to $L_{c321}$, wherein for the specific structures of $L_{c1}$ to $L_{c321}$, reference is made to claim 13.

According to an embodiment of the present disclosure, $L_c$ is, at each occurrence identically or differently, selected from the group consisting of $L_{c1}$ to $L_{c331}$, wherein for the specific structures of $L_{c1}$ to $L_{c321}$, reference is made to claim 13, and the structures of $L_{c322}$ to $L_{c331}$ are as follows:

$L_{c322}$

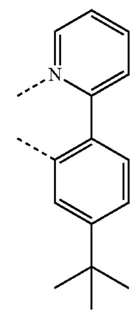

, $L_{c323}$

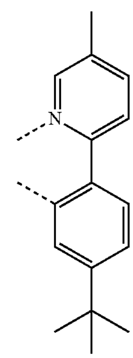

, $L_{c324}$

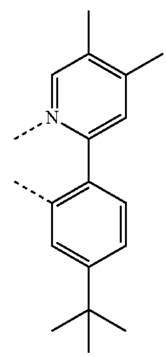

,

-continued $L_{c325}$

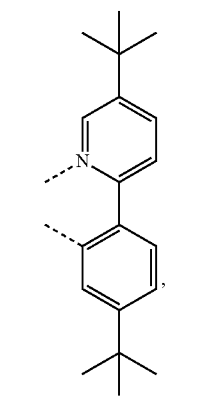

$L_{c326}$

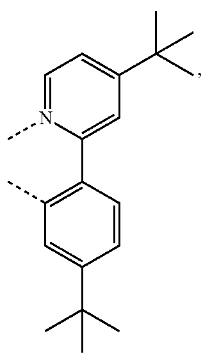

$L_{c327}$

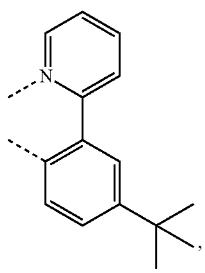

$L_{c328}$

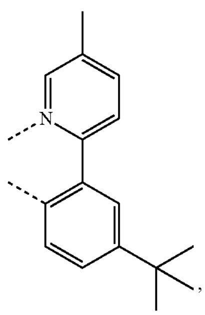

-continued $L_{c329}$

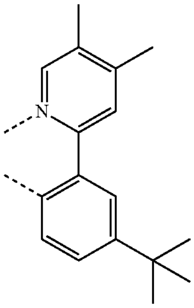

$L_{c330}$

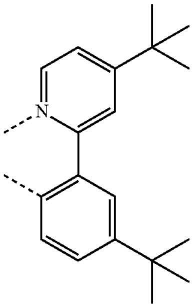

and $L_{b331}$

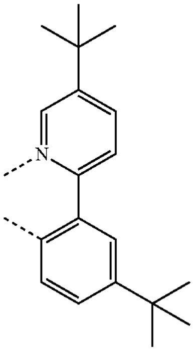

According to an embodiment of the present disclosure, the metal complex is an Ir complex and has a structure represented by any one of $Ir(L_a)(L_b)(L_c)$, $Ir(L_a)_2(L_b)$, $Ir(L_a)_2(L_c)$, and $Ir(L_a)(L_c)_2$; when the metal complex has a structure of $Ir(L_a)(L_b)(L_c)$, $L_a$ is selected from any one of the group consisting of $L_{a1}$ to $L_{a1241}$, $L_b$ is selected from any one of the group consisting of $L_{b1}$ to $L_{b322}$, and $L_c$ is selected from any one of the group consisting of $L_{c1}$ to $L_{c321}$; when the metal complex has a structure of $Ir(L_a)_2(L_b)$, $L_a$ is, at each occurrence identically or differently, selected from any one or any two of the group consisting of $L_{a1}$ to $L_{a1241}$, and $L_b$ is selected from any one of the group consisting of $L_{b1}$ to $L_{b322}$; when the metal complex has a structure of $Ir(L_a)_2(L_c)$, $L_a$ is, at each occurrence identically or differently, selected from any one or any two of the group consisting of $L_{a1}$ to $L_{a1241}$, and $L_c$ is selected from any one of the group consisting of $L_{c1}$ to $L_{c321}$; when the metal complex has a structure of $Ir(L_a)(L_c)_2$, $L_a$ is selected from any one of the group consisting of $L_{a1}$ to $L_{a1241}$, and $L_c$ is, at each occurrence identically or differently, selected from any one or any two of the group consisting of $L_{c1}$ to $L_{c321}$; optionally, hydrogens in the structure of the metal complex can be partially or completely substituted with deuterium.

According to an embodiment of the present disclosure, the metal complex is an Ir complex and has a structure represented by any one of $Ir(L_a)(L_b)(L_c)$, $Ir(L_a)_2(L_b)$, $Ir(L_a)_2(L_c)$, and $Ir(L_a)(L_c)_2$; when the metal complex has a structure of $Ir(L_a)(L_b)(L_c)$, $L_a$ is selected from any one of the group consisting of $L_{a1}$ to $L_{a1287}$, $L_b$ is selected from any one of the group consisting of $L_{b1}$ to $L_{b322}$, and $L_c$ is selected from any one of the group consisting of $L_{c1}$ to $L_{c331}$; when the metal complex has a structure of $Ir(L_a)_2(L_b)$, $L_a$ is, at each occurrence identically or differently, selected from any one or any two of the group consisting of $L_{a1}$ to $L_{a1287}$, and $L_b$ is selected from any one of the group consisting of $L_{b1}$ to $L_{b322}$; when the metal complex has a structure of $Ir(L_a)_2(L_c)$, $L_a$ is, at each occurrence identically or differently, selected from any one or any two of the group consisting of $L_{a1}$ to $L_{a1287}$, and $L_c$ is selected from any one of the group consisting of $L_{c1}$ to $L_{c331}$; when the metal complex has a structure of $Ir(L_a)(L_c)_2$, $L_a$ is selected from any one of the group consisting of $L_{a1}$ to $L_{a1287}$, and $L_c$ is, at each occurrence identically or differently, selected from any one or any two of the group consisting of $L_{c1}$ to $L_{c331}$; optionally, hydrogens in the structure of the metal complex can be partially or completely substituted with deuterium.

According to an embodiment of the present disclosure, the metal complex is selected from the group consisting of Compound 1 to Compound 690;

wherein Compounds 1 to 538 and Compound 669 to Compound 688 have the general formula of $Ir(L_a)_2(L_b)$, wherein two $L_a$ are identical, and $L_a$ and $L_b$ are selected from structures listed in the following table, respectively.

| Compound No. | $L_a$ | $L_b$ | Compound No. | $L_a$ | $L_b$ |
|---|---|---|---|---|---|
| 1 | $L_{a29}$ | $L_{b31}$ | 2 | $L_{a34}$ | $L_{b31}$ |
| 3 | $L_{a29}$ | $L_{b88}$ | 4 | $L_{a34}$ | $L_{b88}$ |
| 5 | $L_{a29}$ | $L_{b122}$ | 6 | $L_{a34}$ | $L_{b122}$ |
| 7 | $L_{a29}$ | $L_{b126}$ | 8 | $L_{a34}$ | $L_{b126}$ |
| 9 | $L_{a29}$ | $L_{b135}$ | 10 | $L_{a34}$ | $L_{b135}$ |
| 11 | $L_{a42}$ | $L_{b31}$ | 12 | $L_{a45}$ | $L_{b31}$ |
| 13 | $L_{a42}$ | $L_{b88}$ | 14 | $L_{a45}$ | $L_{b88}$ |
| 15 | $L_{a42}$ | $L_{b122}$ | 16 | $L_{a45}$ | $L_{b122}$ |
| 17 | $L_{a42}$ | $L_{b126}$ | 18 | $L_{a45}$ | $L_{b126}$ |
| 19 | $L_{a42}$ | $L_{b135}$ | 20 | $L_{a45}$ | $L_{b135}$ |
| 21 | $L_{a104}$ | $L_{b31}$ | 22 | $L_{a295}$ | $L_{b31}$ |
| 23 | $L_{a104}$ | $L_{b88}$ | 24 | $L_{a295}$ | $L_{b88}$ |
| 25 | $L_{a104}$ | $L_{b122}$ | 26 | $L_{a295}$ | $L_{b122}$ |
| 27 | $L_{a104}$ | $L_{b126}$ | 28 | $L_{a295}$ | $L_{b126}$ |
| 29 | $L_{a104}$ | $L_{b135}$ | 30 | $L_{a295}$ | $L_{b135}$ |
| 31 | $L_{a364}$ | $L_{b31}$ | 32 | $L_{a368}$ | $L_{b31}$ |
| 33 | $L_{a364}$ | $L_{b88}$ | 34 | $L_{a368}$ | $L_{b88}$ |
| 35 | $L_{a364}$ | $L_{b122}$ | 36 | $L_{a368}$ | $L_{b122}$ |
| 37 | $L_{a364}$ | $L_{b126}$ | 38 | $L_{a368}$ | $L_{b126}$ |
| 39 | $L_{a364}$ | $L_{b135}$ | 40 | $L_{a368}$ | $L_{b135}$ |
| 41 | $L_{a372}$ | $L_{b31}$ | 42 | $L_{a374}$ | $L_{b31}$ |
| 43 | $L_{a372}$ | $L_{b88}$ | 44 | $L_{a374}$ | $L_{b88}$ |
| 45 | $L_{a372}$ | $L_{b122}$ | 46 | $L_{a374}$ | $L_{b122}$ |
| 47 | $L_{a372}$ | $L_{b126}$ | 48 | $L_{a374}$ | $L_{b126}$ |
| 49 | $L_{a372}$ | $L_{b135}$ | 50 | $L_{a374}$ | $L_{b135}$ |
| 51 | $L_{a418}$ | $L_{b31}$ | 52 | $L_{a420}$ | $L_{b31}$ |
| 53 | $L_{a418}$ | $L_{b88}$ | 54 | $L_{a420}$ | $L_{b88}$ |
| 55 | $L_{a418}$ | $L_{b122}$ | 56 | $L_{a420}$ | $L_{b122}$ |
| 57 | $L_{a418}$ | $L_{b126}$ | 58 | $L_{a420}$ | $L_{b126}$ |
| 59 | $L_{a418}$ | $L_{b135}$ | 60 | $L_{a420}$ | $L_{b135}$ |
| 61 | $L_{a418}$ | $L_{b89}$ | 62 | $L_{a420}$ | $L_{b89}$ |
| 63 | $L_{a418}$ | $L_{b122}$ | 64 | $L_{a420}$ | $L_{b122}$ |
| 65 | $L_{a418}$ | $L_{b139}$ | 66 | $L_{a420}$ | $L_{b139}$ |
| 67 | $L_{a422}$ | $L_{b31}$ | 68 | $L_{a500}$ | $L_{b31}$ |
| 69 | $L_{a422}$ | $L_{b88}$ | 70 | $L_{a500}$ | $L_{b88}$ |
| 71 | $L_{a422}$ | $L_{b122}$ | 72 | $L_{a500}$ | $L_{b122}$ |
| 73 | $L_{a422}$ | $L_{b126}$ | 74 | $L_{a500}$ | $L_{b126}$ |
| 75 | $L_{a422}$ | $L_{b135}$ | 76 | $L_{a500}$ | $L_{b135}$ |
| 77 | $L_{a422}$ | $L_{b89}$ | 78 | $L_{a500}$ | $L_{b89}$ |
| 79 | $L_{a422}$ | $L_{b122}$ | 80 | $L_{a500}$ | $L_{b122}$ |

-continued

| Compound No. | $L_a$ | $L_b$ | Compound No. | $L_a$ | $L_b$ |
|---|---|---|---|---|---|
| 81 | $L_{a422}$ | $L_{b139}$ | 82 | $L_{a500}$ | $L_{b139}$ |
| 83 | $L_{a502}$ | $L_{b31}$ | 84 | $L_{a504}$ | $L_{b31}$ |
| 85 | $L_{a502}$ | $L_{b88}$ | 86 | $L_{a504}$ | $L_{b88}$ |
| 87 | $L_{a502}$ | $L_{b122}$ | 88 | $L_{a504}$ | $L_{b122}$ |
| 89 | $L_{a502}$ | $L_{b126}$ | 90 | $L_{a504}$ | $L_{b126}$ |
| 91 | $L_{a502}$ | $L_{b135}$ | 92 | $L_{a504}$ | $L_{b135}$ |
| 93 | $L_{a502}$ | $L_{b89}$ | 94 | $L_{a504}$ | $L_{b89}$ |
| 95 | $L_{a502}$ | $L_{b122}$ | 96 | $L_{a504}$ | $L_{b122}$ |
| 97 | $L_{a502}$ | $L_{b139}$ | 98 | $L_{a504}$ | $L_{b139}$ |
| 99 | $L_{a505}$ | $L_{b31}$ | 100 | $L_{a516}$ | $L_{b31}$ |
| 101 | $L_{a505}$ | $L_{b88}$ | 102 | $L_{a516}$ | $L_{b88}$ |
| 103 | $L_{a505}$ | $L_{b122}$ | 104 | $L_{a516}$ | $L_{b122}$ |
| 105 | $L_{a505}$ | $L_{b126}$ | 106 | $L_{a516}$ | $L_{b126}$ |
| 107 | $L_{a505}$ | $L_{b135}$ | 108 | $L_{a516}$ | $L_{b135}$ |
| 109 | $L_{a505}$ | $L_{b89}$ | 110 | $L_{a516}$ | $L_{b89}$ |
| 111 | $L_{a505}$ | $L_{b122}$ | 112 | $L_{a516}$ | $L_{b122}$ |
| 113 | $L_{a505}$ | $L_{b139}$ | 114 | $L_{a516}$ | $L_{b139}$ |
| 115 | $L_{a520}$ | $L_{b31}$ | 116 | $L_{a530}$ | $L_{b31}$ |
| 117 | $L_{a520}$ | $L_{b88}$ | 118 | $L_{a530}$ | $L_{b88}$ |
| 119 | $L_{a520}$ | $L_{b122}$ | 120 | $L_{a530}$ | $L_{b122}$ |
| 121 | $L_{a520}$ | $L_{b126}$ | 122 | $L_{a530}$ | $L_{b126}$ |
| 123 | $L_{a520}$ | $L_{b135}$ | 124 | $L_{a530}$ | $L_{b135}$ |
| 125 | $L_{a520}$ | $L_{b89}$ | 126 | $L_{a530}$ | $L_{b89}$ |
| 127 | $L_{a520}$ | $L_{b122}$ | 128 | $L_{a530}$ | $L_{b122}$ |
| 129 | $L_{a520}$ | $L_{b139}$ | 130 | $L_{a530}$ | $L_{b139}$ |
| 131 | $L_{a534}$ | $L_{b31}$ | 132 | $L_{a575}$ | $L_{b31}$ |
| 133 | $L_{a534}$ | $L_{b88}$ | 134 | $L_{a575}$ | $L_{b88}$ |
| 135 | $L_{a534}$ | $L_{b122}$ | 136 | $L_{a575}$ | $L_{b122}$ |
| 137 | $L_{a534}$ | $L_{b126}$ | 138 | $L_{a575}$ | $L_{b126}$ |
| 139 | $L_{a534}$ | $L_{b135}$ | 140 | $L_{a575}$ | $L_{b135}$ |
| 141 | $L_{a534}$ | $L_{b89}$ | 142 | $L_{a575}$ | $L_{b89}$ |
| 143 | $L_{a534}$ | $L_{b122}$ | 144 | $L_{a575}$ | $L_{b122}$ |
| 145 | $L_{a534}$ | $L_{b139}$ | 146 | $L_{a575}$ | $L_{b139}$ |
| 147 | $L_{a579}$ | $L_{b31}$ | 148 | $L_{a701}$ | $L_{b31}$ |
| 149 | $L_{a579}$ | $L_{b88}$ | 150 | $L_{a701}$ | $L_{b88}$ |
| 151 | $L_{a579}$ | $L_{b122}$ | 152 | $L_{a701}$ | $L_{b122}$ |
| 153 | $L_{a579}$ | $L_{b126}$ | 154 | $L_{a701}$ | $L_{b126}$ |
| 155 | $L_{a579}$ | $L_{b135}$ | 156 | $L_{a701}$ | $L_{b135}$ |
| 157 | $L_{a579}$ | $L_{b89}$ | 158 | $L_{a701}$ | $L_{b89}$ |
| 159 | $L_{a579}$ | $L_{b122}$ | 160 | $L_{a701}$ | $L_{b122}$ |
| 161 | $L_{a579}$ | $L_{b139}$ | 162 | $L_{a701}$ | $L_{b139}$ |
| 163 | $L_{a713}$ | $L_{b31}$ | 164 | $L_{a679}$ | $L_{b31}$ |
| 165 | $L_{a713}$ | $L_{b88}$ | 166 | $L_{a679}$ | $L_{b88}$ |
| 167 | $L_{a713}$ | $L_{b122}$ | 168 | $L_{a679}$ | $L_{b122}$ |
| 169 | $L_{a713}$ | $L_{b126}$ | 170 | $L_{a679}$ | $L_{b126}$ |
| 171 | $L_{a713}$ | $L_{b135}$ | 172 | $L_{a679}$ | $L_{b135}$ |
| 173 | $L_{a713}$ | $L_{b89}$ | 174 | $L_{a679}$ | $L_{b89}$ |
| 175 | $L_{a713}$ | $L_{b122}$ | 176 | $L_{a679}$ | $L_{b122}$ |
| 177 | $L_{a713}$ | $L_{b139}$ | 178 | $L_{a679}$ | $L_{b139}$ |
| 179 | $L_{a690}$ | $L_{b31}$ | 180 | $L_{a423}$ | $L_{b31}$ |
| 181 | $L_{a690}$ | $L_{b88}$ | 182 | $L_{a423}$ | $L_{b88}$ |
| 183 | $L_{a690}$ | $L_{b122}$ | 184 | $L_{a423}$ | $L_{b122}$ |
| 185 | $L_{a690}$ | $L_{b126}$ | 186 | $L_{a423}$ | $L_{b126}$ |
| 187 | $L_{a690}$ | $L_{b135}$ | 188 | $L_{a423}$ | $L_{b135}$ |
| 189 | $L_{a690}$ | $L_{b89}$ | 190 | $L_{a423}$ | $L_{b89}$ |
| 191 | $L_{a690}$ | $L_{b122}$ | 192 | $L_{a423}$ | $L_{b122}$ |
| 193 | $L_{a690}$ | $L_{b139}$ | 194 | $L_{a423}$ | $L_{b139}$ |
| 195 | $L_{a425}$ | $L_{b31}$ | 196 | $L_{a472}$ | $L_{b31}$ |
| 197 | $L_{a425}$ | $L_{b88}$ | 198 | $L_{a472}$ | $L_{b88}$ |
| 199 | $L_{a425}$ | $L_{b122}$ | 200 | $L_{a472}$ | $L_{b122}$ |
| 201 | $L_{a425}$ | $L_{b126}$ | 202 | $L_{a472}$ | $L_{b126}$ |
| 203 | $L_{a425}$ | $L_{b135}$ | 204 | $L_{a472}$ | $L_{b135}$ |
| 205 | $L_{a425}$ | $L_{b89}$ | 206 | $L_{a472}$ | $L_{b89}$ |
| 207 | $L_{a425}$ | $L_{b122}$ | 208 | $L_{a472}$ | $L_{b122}$ |
| 209 | $L_{a425}$ | $L_{b139}$ | 210 | $L_{a472}$ | $L_{b139}$ |
| 211 | $L_{a506}$ | $L_{b31}$ | 212 | $L_{a536}$ | $L_{b31}$ |
| 213 | $L_{a506}$ | $L_{b88}$ | 214 | $L_{a536}$ | $L_{b88}$ |
| 215 | $L_{a506}$ | $L_{b122}$ | 216 | $L_{a536}$ | $L_{b122}$ |
| 217 | $L_{a506}$ | $L_{b126}$ | 218 | $L_{a536}$ | $L_{b126}$ |
| 219 | $L_{a506}$ | $L_{b135}$ | 220 | $L_{a536}$ | $L_{b135}$ |
| 221 | $L_{a506}$ | $L_{b89}$ | 222 | $L_{a536}$ | $L_{b89}$ |
| 223 | $L_{a506}$ | $L_{b122}$ | 224 | $L_{a536}$ | $L_{b122}$ |
| 225 | $L_{a506}$ | $L_{b139}$ | 226 | $L_{a536}$ | $L_{b139}$ |
| 227 | $L_{a559}$ | $L_{b31}$ | 228 | $L_{a534}$ | $L_{b31}$ |
| 229 | $L_{a559}$ | $L_{b88}$ | 230 | $L_{a534}$ | $L_{b88}$ |
| 231 | $L_{a559}$ | $L_{b122}$ | 232 | $L_{a534}$ | $L_{b122}$ |

-continued

| Compound No. | $L_a$ | $L_b$ | Compound No. | $L_a$ | $L_b$ |
|---|---|---|---|---|---|
| 233 | $L_{a559}$ | $L_{b126}$ | 234 | $L_{a534}$ | $L_{b126}$ |
| 235 | $L_{a559}$ | $L_{b135}$ | 236 | $L_{a534}$ | $L_{b135}$ |
| 237 | $L_{a559}$ | $L_{b89}$ | 238 | $L_{a534}$ | $L_{b89}$ |
| 239 | $L_{a559}$ | $L_{b122}$ | 240 | $L_{a534}$ | $L_{b122}$ |
| 241 | $L_{a559}$ | $L_{b139}$ | 242 | $L_{a534}$ | $L_{b139}$ |
| 243 | $L_{a537}$ | $L_{b31}$ | 244 | $L_{a587}$ | $L_{b31}$ |
| 245 | $L_{a537}$ | $L_{b88}$ | 246 | $L_{a587}$ | $L_{b88}$ |
| 247 | $L_{a537}$ | $L_{b122}$ | 248 | $L_{a587}$ | $L_{b122}$ |
| 249 | $L_{a537}$ | $L_{b126}$ | 250 | $L_{a587}$ | $L_{b126}$ |
| 251 | $L_{a537}$ | $L_{b135}$ | 252 | $L_{a587}$ | $L_{b135}$ |
| 253 | $L_{a537}$ | $L_{b89}$ | 254 | $L_{a587}$ | $L_{b89}$ |
| 255 | $L_{a537}$ | $L_{b122}$ | 256 | $L_{a587}$ | $L_{b122}$ |
| 257 | $L_{a537}$ | $L_{b139}$ | 258 | $L_{a587}$ | $L_{b139}$ |
| 259 | $L_{a589}$ | $L_{b31}$ | 260 | $L_{a543}$ | $L_{b31}$ |
| 261 | $L_{a589}$ | $L_{b88}$ | 262 | $L_{a543}$ | $L_{b88}$ |
| 263 | $L_{a589}$ | $L_{b122}$ | 264 | $L_{a543}$ | $L_{b122}$ |
| 265 | $L_{a589}$ | $L_{b126}$ | 266 | $L_{a543}$ | $L_{b126}$ |
| 267 | $L_{a589}$ | $L_{b135}$ | 268 | $L_{a543}$ | $L_{b135}$ |
| 269 | $L_{a589}$ | $L_{b89}$ | 270 | $L_{a543}$ | $L_{b89}$ |
| 271 | $L_{a589}$ | $L_{b122}$ | 272 | $L_{a543}$ | $L_{b122}$ |
| 273 | $L_{a589}$ | $L_{b139}$ | 274 | $L_{a543}$ | $L_{b139}$ |
| 275 | $L_{a592}$ | $L_{b31}$ | 276 | $L_{a622}$ | $L_{b31}$ |
| 277 | $L_{a592}$ | $L_{b88}$ | 278 | $L_{a622}$ | $L_{b88}$ |
| 279 | $L_{a592}$ | $L_{b122}$ | 280 | $L_{a622}$ | $L_{b122}$ |
| 281 | $L_{a592}$ | $L_{b126}$ | 282 | $L_{a622}$ | $L_{b126}$ |
| 283 | $L_{a592}$ | $L_{b135}$ | 284 | $L_{a622}$ | $L_{b135}$ |
| 285 | $L_{a592}$ | $L_{b89}$ | 286 | $L_{a622}$ | $L_{b89}$ |
| 287 | $L_{a592}$ | $L_{b122}$ | 288 | $L_{a622}$ | $L_{b122}$ |
| 289 | $L_{a592}$ | $L_{b139}$ | 290 | $L_{a622}$ | $L_{b139}$ |
| 291 | $L_{a624}$ | $L_{b31}$ | 292 | $L_{a635}$ | $L_{b31}$ |
| 293 | $L_{a624}$ | $L_{b88}$ | 294 | $L_{a635}$ | $L_{b88}$ |
| 295 | $L_{a624}$ | $L_{b122}$ | 296 | $L_{a635}$ | $L_{b122}$ |
| 297 | $L_{a624}$ | $L_{b126}$ | 298 | $L_{a635}$ | $L_{b126}$ |
| 299 | $L_{a624}$ | $L_{b135}$ | 300 | $L_{a635}$ | $L_{b135}$ |
| 301 | $L_{a624}$ | $L_{b89}$ | 302 | $L_{a635}$ | $L_{b89}$ |
| 303 | $L_{a624}$ | $L_{b122}$ | 304 | $L_{a635}$ | $L_{b122}$ |
| 305 | $L_{a624}$ | $L_{b139}$ | 306 | $L_{a635}$ | $L_{b139}$ |
| 307 | $L_{a630}$ | $L_{b31}$ | 308 | $L_{a654}$ | $L_{b31}$ |
| 309 | $L_{a630}$ | $L_{b88}$ | 310 | $L_{a654}$ | $L_{b88}$ |
| 311 | $L_{a630}$ | $L_{b122}$ | 312 | $L_{a654}$ | $L_{b122}$ |
| 313 | $L_{a630}$ | $L_{b126}$ | 314 | $L_{a654}$ | $L_{b126}$ |
| 315 | $L_{a630}$ | $L_{b135}$ | 316 | $L_{a654}$ | $L_{b135}$ |
| 317 | $L_{a630}$ | $L_{b89}$ | 318 | $L_{a654}$ | $L_{b89}$ |
| 319 | $L_{a630}$ | $L_{b122}$ | 320 | $L_{a654}$ | $L_{b122}$ |
| 321 | $L_{a630}$ | $L_{b139}$ | 322 | $L_{a654}$ | $L_{b139}$ |
| 323 | $L_{a597}$ | $L_{b31}$ | 324 | $L_{a701}$ | $L_{b31}$ |
| 325 | $L_{a597}$ | $L_{b88}$ | 326 | $L_{a701}$ | $L_{b88}$ |
| 327 | $L_{a597}$ | $L_{b122}$ | 328 | $L_{a701}$ | $L_{b122}$ |
| 329 | $L_{a597}$ | $L_{b126}$ | 330 | $L_{a701}$ | $L_{b126}$ |
| 331 | $L_{a597}$ | $L_{b135}$ | 332 | $L_{a701}$ | $L_{b135}$ |
| 333 | $L_{a597}$ | $L_{b89}$ | 334 | $L_{a701}$ | $L_{b89}$ |
| 335 | $L_{a597}$ | $L_{b122}$ | 336 | $L_{a701}$ | $L_{b122}$ |
| 337 | $L_{a597}$ | $L_{b139}$ | 338 | $L_{a701}$ | $L_{b139}$ |
| 339 | $L_{a704}$ | $L_{b31}$ | 340 | $L_{a706}$ | $L_{b31}$ |
| 341 | $L_{a704}$ | $L_{b88}$ | 342 | $L_{a706}$ | $L_{b88}$ |
| 343 | $L_{a704}$ | $L_{b122}$ | 344 | $L_{a706}$ | $L_{b122}$ |
| 345 | $L_{a704}$ | $L_{b126}$ | 346 | $L_{a706}$ | $L_{b126}$ |
| 347 | $L_{a704}$ | $L_{b135}$ | 348 | $L_{a706}$ | $L_{b135}$ |
| 349 | $L_{a704}$ | $L_{b89}$ | 350 | $L_{a706}$ | $L_{b89}$ |
| 351 | $L_{a704}$ | $L_{b122}$ | 352 | $L_{a706}$ | $L_{b122}$ |
| 353 | $L_{a704}$ | $L_{b139}$ | 354 | $L_{a706}$ | $L_{b139}$ |
| 355 | $L_{a707}$ | $L_{b31}$ | 356 | $L_{a713}$ | $L_{b31}$ |
| 357 | $L_{a707}$ | $L_{b88}$ | 358 | $L_{a713}$ | $L_{b88}$ |
| 359 | $L_{a707}$ | $L_{b122}$ | 360 | $L_{a713}$ | $L_{b122}$ |
| 361 | $L_{a707}$ | $L_{b126}$ | 362 | $L_{a713}$ | $L_{b126}$ |
| 363 | $L_{a707}$ | $L_{b135}$ | 364 | $L_{a713}$ | $L_{b135}$ |
| 365 | $L_{a707}$ | $L_{b89}$ | 366 | $L_{a713}$ | $L_{b89}$ |
| 367 | $L_{a707}$ | $L_{b122}$ | 368 | $L_{a713}$ | $L_{b122}$ |
| 369 | $L_{a707}$ | $L_{b139}$ | 370 | $L_{a713}$ | $L_{b139}$ |
| 371 | $L_{a716}$ | $L_{b31}$ | 372 | $L_{a720}$ | $L_{b31}$ |
| 373 | $L_{a716}$ | $L_{b88}$ | 374 | $L_{a720}$ | $L_{b88}$ |
| 375 | $L_{a716}$ | $L_{b122}$ | 376 | $L_{a720}$ | $L_{b122}$ |
| 377 | $L_{a716}$ | $L_{b126}$ | 378 | $L_{a720}$ | $L_{b126}$ |
| 379 | $L_{a716}$ | $L_{b135}$ | 380 | $L_{a720}$ | $L_{b135}$ |
| 381 | $L_{a716}$ | $L_{b89}$ | 382 | $L_{a720}$ | $L_{b89}$ |
| 383 | $L_{a716}$ | $L_{b122}$ | 384 | $L_{a720}$ | $L_{b122}$ |

-continued

| Compound No. | $L_a$ | $L_b$ | Compound No. | $L_a$ | $L_b$ |
|---|---|---|---|---|---|
| 385 | $L_{a716}$ | $L_{b139}$ | 386 | $L_{a720}$ | $L_{b139}$ |
| 387 | $L_{a679}$ | $L_{b31}$ | 388 | $L_{a682}$ | $L_{b31}$ |
| 389 | $L_{a679}$ | $L_{b88}$ | 390 | $L_{a682}$ | $L_{b88}$ |
| 391 | $L_{a679}$ | $L_{b122}$ | 392 | $L_{a682}$ | $L_{b122}$ |
| 393 | $L_{a679}$ | $L_{b126}$ | 394 | $L_{a682}$ | $L_{b126}$ |
| 395 | $L_{a679}$ | $L_{b135}$ | 396 | $L_{a682}$ | $L_{b135}$ |
| 397 | $L_{a679}$ | $L_{b89}$ | 398 | $L_{a682}$ | $L_{b89}$ |
| 399 | $L_{a679}$ | $L_{b122}$ | 400 | $L_{a682}$ | $L_{b122}$ |
| 401 | $L_{a679}$ | $L_{b139}$ | 402 | $L_{a682}$ | $L_{b139}$ |
| 403 | $L_{a684}$ | $L_{b31}$ | 404 | $L_{a685}$ | $L_{b31}$ |
| 405 | $L_{a684}$ | $L_{b88}$ | 406 | $L_{a685}$ | $L_{b88}$ |
| 407 | $L_{a684}$ | $L_{b122}$ | 408 | $L_{a685}$ | $L_{b122}$ |
| 409 | $L_{a684}$ | $L_{b126}$ | 410 | $L_{a685}$ | $L_{b126}$ |
| 411 | $L_{a684}$ | $L_{b135}$ | 412 | $L_{a685}$ | $L_{b135}$ |
| 413 | $L_{a684}$ | $L_{b89}$ | 414 | $L_{a685}$ | $L_{b89}$ |
| 415 | $L_{a684}$ | $L_{b122}$ | 416 | $L_{a685}$ | $L_{b122}$ |
| 417 | $L_{a684}$ | $L_{b139}$ | 418 | $L_{a685}$ | $L_{b139}$ |
| 419 | $L_{a690}$ | $L_{b31}$ | 420 | $L_{a692}$ | $L_{b31}$ |
| 421 | $L_{a690}$ | $L_{b88}$ | 422 | $L_{a692}$ | $L_{b88}$ |
| 423 | $L_{a690}$ | $L_{b122}$ | 424 | $L_{a692}$ | $L_{b122}$ |
| 425 | $L_{a690}$ | $L_{b126}$ | 426 | $L_{a692}$ | $L_{b126}$ |
| 427 | $L_{a690}$ | $L_{b135}$ | 428 | $L_{a692}$ | $L_{b135}$ |
| 429 | $L_{a690}$ | $L_{b89}$ | 430 | $L_{a692}$ | $L_{b89}$ |
| 431 | $L_{a690}$ | $L_{b122}$ | 432 | $L_{a692}$ | $L_{b122}$ |
| 433 | $L_{a690}$ | $L_{b139}$ | 434 | $L_{a692}$ | $L_{b139}$ |
| 435 | $L_{a695}$ | $L_{b31}$ | 436 | $L_{a697}$ | $L_{b31}$ |
| 437 | $L_{a695}$ | $L_{b88}$ | 438 | $L_{a697}$ | $L_{b88}$ |
| 439 | $L_{a695}$ | $L_{b122}$ | 440 | $L_{a697}$ | $L_{b122}$ |
| 441 | $L_{a695}$ | $L_{b126}$ | 442 | $L_{a697}$ | $L_{b126}$ |
| 443 | $L_{a695}$ | $L_{b135}$ | 444 | $L_{a697}$ | $L_{b135}$ |
| 445 | $L_{a695}$ | $L_{b89}$ | 446 | $L_{a697}$ | $L_{b89}$ |
| 447 | $L_{a695}$ | $L_{b122}$ | 448 | $L_{a697}$ | $L_{b122}$ |
| 449 | $L_{a695}$ | $L_{b139}$ | 450 | $L_{a697}$ | $L_{b139}$ |
| 451 | $L_{a698}$ | $L_{b31}$ | 452 | $L_{a733}$ | $L_{b31}$ |
| 453 | $L_{a698}$ | $L_{b88}$ | 454 | $L_{a733}$ | $L_{b88}$ |
| 455 | $L_{a698}$ | $L_{b122}$ | 456 | $L_{a733}$ | $L_{b122}$ |
| 457 | $L_{a698}$ | $L_{b126}$ | 458 | $L_{a733}$ | $L_{b126}$ |
| 459 | $L_{a698}$ | $L_{b135}$ | 460 | $L_{a733}$ | $L_{b135}$ |
| 461 | $L_{a698}$ | $L_{b89}$ | 462 | $L_{a733}$ | $L_{b89}$ |
| 463 | $L_{a698}$ | $L_{b122}$ | 464 | $L_{a733}$ | $L_{b122}$ |
| 465 | $L_{a698}$ | $L_{b139}$ | 466 | $L_{a733}$ | $L_{b139}$ |
| 467 | $L_{a755}$ | $L_{b31}$ | 468 | $L_{a777}$ | $L_{b31}$ |
| 469 | $L_{a755}$ | $L_{b88}$ | 470 | $L_{a777}$ | $L_{b88}$ |
| 471 | $L_{a755}$ | $L_{b122}$ | 472 | $L_{a777}$ | $L_{b122}$ |
| 473 | $L_{a755}$ | $L_{b126}$ | 474 | $L_{a777}$ | $L_{b126}$ |
| 475 | $L_{a755}$ | $L_{b135}$ | 476 | $L_{a777}$ | $L_{b135}$ |
| 477 | $L_{a755}$ | $L_{b89}$ | 478 | $L_{a777}$ | $L_{b89}$ |
| 479 | $L_{a755}$ | $L_{b122}$ | 480 | $L_{a777}$ | $L_{b122}$ |
| 481 | $L_{a755}$ | $L_{b139}$ | 482 | $L_{a777}$ | $L_{b139}$ |
| 483 | $L_{a788}$ | $L_{b31}$ | 484 | $L_{a780}$ | $L_{b31}$ |
| 485 | $L_{a788}$ | $L_{b88}$ | 486 | $L_{a780}$ | $L_{b88}$ |
| 487 | $L_{a788}$ | $L_{b122}$ | 488 | $L_{a780}$ | $L_{b122}$ |
| 489 | $L_{a788}$ | $L_{b126}$ | 490 | $L_{a780}$ | $L_{b126}$ |
| 491 | $L_{a788}$ | $L_{b135}$ | 492 | $L_{a780}$ | $L_{b135}$ |
| 493 | $L_{a788}$ | $L_{b89}$ | 494 | $L_{a780}$ | $L_{b89}$ |
| 495 | $L_{a788}$ | $L_{b122}$ | 496 | $L_{a780}$ | $L_{b122}$ |
| 497 | $L_{a788}$ | $L_{b139}$ | 498 | $L_{a780}$ | $L_{b139}$ |
| 499 | $L_{a791}$ | $L_{b31}$ | 500 | $L_{a793}$ | $L_{b31}$ |
| 501 | $L_{a791}$ | $L_{b88}$ | 502 | $L_{a793}$ | $L_{b88}$ |
| 503 | $L_{a791}$ | $L_{b122}$ | 504 | $L_{a793}$ | $L_{b122}$ |
| 505 | $L_{a791}$ | $L_{b126}$ | 506 | $L_{a793}$ | $L_{b126}$ |
| 507 | $L_{a791}$ | $L_{b135}$ | 508 | $L_{a793}$ | $L_{b135}$ |
| 509 | $L_{a791}$ | $L_{b89}$ | 510 | $L_{a793}$ | $L_{b89}$ |
| 511 | $L_{a791}$ | $L_{b122}$ | 512 | $L_{a793}$ | $L_{b122}$ |
| 513 | $L_{a791}$ | $L_{b139}$ | 514 | $L_{a793}$ | $L_{b139}$ |
| 515 | $L_{a794}$ | $L_{b31}$ | 516 | $L_{a795}$ | $L_{b31}$ |
| 517 | $L_{a794}$ | $L_{b88}$ | 518 | $L_{a795}$ | $L_{b88}$ |
| 519 | $L_{a794}$ | $L_{b122}$ | 520 | $L_{a795}$ | $L_{b122}$ |
| 521 | $L_{a794}$ | $L_{b126}$ | 522 | $L_{a795}$ | $L_{b126}$ |
| 523 | $L_{a794}$ | $L_{b135}$ | 524 | $L_{a795}$ | $L_{b135}$ |
| 525 | $L_{a794}$ | $L_{b89}$ | 526 | $L_{a795}$ | $L_{b89}$ |
| 527 | $L_{a794}$ | $L_{b122}$ | 528 | $L_{a795}$ | $L_{b122}$ |
| 529 | $L_{a794}$ | $L_{b139}$ | 530 | $L_{a795}$ | $L_{b139}$ |
| 531 | $L_{a272}$ | $L_{b31}$ | 532 | $L_{a918}$ | $L_{b31}$ |
| 533 | $L_{a272}$ | $L_{b88}$ | 534 | $L_{a918}$ | $L_{b88}$ |
| 535 | $L_{a272}$ | $L_{b122}$ | 536 | $L_{a918}$ | $L_{b122}$ |

-continued

| Compound No. | $L_a$ | $L_b$ | Compound No. | $L_a$ | $L_b$ |
|---|---|---|---|---|---|
| 537 | $L_{a272}$ | $L_{b126}$ | 538 | $L_{a918}$ | $L_{b126}$ |
| 669 | $L_{a1235}$ | $L_{b122}$ | 670 | $L_{a1235}$ | $L_{b126}$ |
| 671 | $L_{a412}$ | $L_{b122}$ | 672 | $L_{a412}$ | $L_{b126}$ |
| 673 | $L_{a1247}$ | $L_{b31}$ | 674 | $L_{a1248}$ | $L_{b31}$ |
| 675 | $L_{a1247}$ | $L_{b88}$ | 676 | $L_{a1248}$ | $L_{b88}$ |
| 677 | $L_{a1247}$ | $L_{b122}$ | 678 | $L_{a1248}$ | $L_{b122}$ |
| 679 | $L_{a1247}$ | $L_{b126}$ | 680 | $L_{a1248}$ | $L_{b126}$ |
| 681 | $L_{a1249}$ | $L_{b31}$ | 682 | $L_{a1274}$ | $L_{b31}$ |
| 683 | $L_{a1249}$ | $L_{b88}$ | 684 | $L_{a1274}$ | $L_{b88}$ |
| 685 | $L_{a1249}$ | $L_{b122}$ | 686 | $L_{a1274}$ | $L_{b122}$ |
| 687 | $L_{a1249}$ | $L_{b126}$ | 688 | $L_{a1274}$ | $L_{b126}$ |

Compound 539 to Compound 668, Compound 689, and Compound 690 have the general formula of $Ir(L_a)(L_c)_2$, wherein two LU are identical, and $L_a$ and $L_c$ are selected from structures listed in the following table, respectively:

| Compound No. | $L_a$ | $L_c$ | Compound No. | $L_a$ | $L_c$ |
|---|---|---|---|---|---|
| 539 | $L_{a1}$ | $L_{c1}$ | 540 | $L_{a1}$ | $L_{c3}$ |
| 541 | $L_{a1}$ | $L_{c4}$ | 542 | $L_{a1}$ | $L_{c11}$ |
| 543 | $L_{a1}$ | $L_{c12}$ | 544 | $L_{a1}$ | $L_{c13}$ |
| 545 | $L_{a1}$ | $L_{c15}$ | 546 | $L_{a1}$ | $L_{c16}$ |
| 547 | $L_{a1}$ | $L_{c20}$ | 548 | $L_{a1}$ | $L_{c21}$ |
| 549 | $L_{a1}$ | $L_{c22}$ | 550 | $L_{a1}$ | $L_{c23}$ |
| 551 | $L_{a1}$ | $L_{c36}$ | 552 | $L_{a1}$ | $L_{c37}$ |
| 553 | $L_{a1}$ | $L_{c38}$ | 554 | $L_{a1}$ | $L_{c39}$ |
| 555 | $L_{a1}$ | $L_{c42}$ | 556 | $L_{a1}$ | $L_{c43}$ |
| 557 | $L_{a1}$ | $L_{c44}$ | 558 | $L_{a1}$ | $L_{c47}$ |
| 559 | $L_{a1}$ | $L_{c232}$ | 560 | $L_{a1}$ | $L_{c233}$ |
| 561 | $L_{a1}$ | $L_{c235}$ | 562 | $L_{a1}$ | $L_{c251}$ |
| 563 | $L_{a1}$ | $L_{c261}$ | 564 | $L_{a1}$ | $L_{c271}$ |
| 565 | $L_{a1}$ | $L_{c308}$ | 566 | $L_{a1}$ | $L_{c309}$ |
| 567 | $L_{a1}$ | $L_{c316}$ | 568 | $L_{a1}$ | $L_{c319}$ |
| 569 | $L_{a1}$ | $L_{c320}$ | 570 | $L_{a1}$ | $L_{c321}$ |
| 571 | $L_{a21}$ | $L_{c1}$ | 572 | $L_{a21}$ | $L_{c3}$ |
| 573 | $L_{a21}$ | $L_{c4}$ | 574 | $L_{a21}$ | $L_{c11}$ |
| 575 | $L_{a21}$ | $L_{c12}$ | 576 | $L_{a21}$ | $L_{c13}$ |
| 577 | $L_{a21}$ | $L_{c15}$ | 578 | $L_{a21}$ | $L_{c16}$ |
| 579 | $L_{a21}$ | $L_{c20}$ | 580 | $L_{a21}$ | $L_{c21}$ |
| 581 | $L_{a21}$ | $L_{c22}$ | 582 | $L_{a21}$ | $L_{c23}$ |
| 583 | $L_{a21}$ | $L_{c36}$ | 584 | $L_{a21}$ | $L_{c37}$ |
| 585 | $L_{a21}$ | $L_{c38}$ | 586 | $L_{a21}$ | $L_{c39}$ |
| 587 | $L_{a21}$ | $L_{c42}$ | 588 | $L_{a21}$ | $L_{c43}$ |
| 589 | $L_{a21}$ | $L_{c44}$ | 590 | $L_{a21}$ | $L_{c47}$ |
| 591 | $L_{a21}$ | $L_{c232}$ | 592 | $L_{a21}$ | $L_{c233}$ |
| 593 | $L_{a21}$ | $L_{c235}$ | 594 | $L_{a21}$ | $L_{c251}$ |
| 595 | $L_{a21}$ | $L_{c261}$ | 596 | $L_{a21}$ | $L_{c271}$ |
| 597 | $L_{a21}$ | $L_{c308}$ | 598 | $L_{a21}$ | $L_{c309}$ |
| 599 | $L_{a21}$ | $L_{c316}$ | 600 | $L_{a21}$ | $L_{c319}$ |
| 601 | $L_{a21}$ | $L_{c320}$ | 602 | $L_{a21}$ | $L_{c321}$ |
| 603 | $L_{a1238}$ | $L_{c1}$ | 604 | $L_{a1238}$ | $L_{c3}$ |
| 605 | $L_{a1238}$ | $L_{c4}$ | 606 | $L_{a1238}$ | $L_{c11}$ |
| 607 | $L_{a1238}$ | $L_{c12}$ | 608 | $L_{a1238}$ | $L_{c13}$ |
| 609 | $L_{a1238}$ | $L_{c15}$ | 610 | $L_{a1238}$ | $L_{c16}$ |
| 611 | $L_{a1238}$ | $L_{c20}$ | 612 | $L_{a1238}$ | $L_{c21}$ |
| 613 | $L_{a1238}$ | $L_{c22}$ | 614 | $L_{a1238}$ | $L_{c23}$ |
| 615 | $L_{a1238}$ | $L_{c36}$ | 616 | $L_{a1238}$ | $L_{c37}$ |
| 617 | $L_{a1238}$ | $L_{c38}$ | 618 | $L_{a1238}$ | $L_{c39}$ |
| 619 | $L_{a1238}$ | $L_{c42}$ | 620 | $L_{a1238}$ | $L_{c43}$ |
| 621 | $L_{a1238}$ | $L_{c44}$ | 622 | $L_{a1238}$ | $L_{c47}$ |
| 623 | $L_{a1238}$ | $L_{c232}$ | 624 | $L_{a1238}$ | $L_{c233}$ |
| 625 | $L_{a1238}$ | $L_{c235}$ | 626 | $L_{a1238}$ | $L_{c251}$ |
| 627 | $L_{a1238}$ | $L_{c261}$ | 628 | $L_{a1238}$ | $L_{c271}$ |
| 629 | $L_{a1238}$ | $L_{c308}$ | 630 | $L_{a1238}$ | $L_{c309}$ |
| 631 | $L_{a1238}$ | $L_{c316}$ | 632 | $L_{a1238}$ | $L_{c319}$ |
| 633 | $L_{a1238}$ | $L_{c320}$ | 634 | $L_{a1238}$ | $L_{c321}$ |
| 635 | $L_{a1240}$ | $L_{c1}$ | 636 | $L_{a1240}$ | $L_{c3}$ |
| 637 | $L_{a1240}$ | $L_{c4}$ | 638 | $L_{a1240}$ | $L_{c11}$ |
| 639 | $L_{a1240}$ | $L_{c12}$ | 640 | $L_{a1240}$ | $L_{c13}$ |
| 641 | $L_{a1240}$ | $L_{c15}$ | 642 | $L_{a1240}$ | $L_{c16}$ |
| 643 | $L_{a1240}$ | $L_{c20}$ | 644 | $L_{a1240}$ | $L_{c21}$ |

-continued

| Compound No. | $L_a$ | $L_c$ | Compound No. | $L_a$ | $L_c$ |
|---|---|---|---|---|---|
| 645 | $L_{a1240}$ | $L_{c22}$ | 646 | $L_{a1240}$ | $L_{c23}$ |
| 647 | $L_{a1240}$ | $L_{c36}$ | 648 | $L_{a1240}$ | $L_{c37}$ |
| 649 | $L_{a1240}$ | $L_{c38}$ | 650 | $L_{a1240}$ | $L_{c39}$ |
| 651 | $L_{a1240}$ | $L_{c42}$ | 652 | $L_{a1240}$ | $L_{c43}$ |
| 653 | $L_{a1240}$ | $L_{c44}$ | 654 | $L_{a1240}$ | $L_{c47}$ |
| 655 | $L_{a1240}$ | $L_{c232}$ | 656 | $L_{a1240}$ | $L_{c23}$ |
| 657 | $L_{a1240}$ | $L_{c235}$ | 658 | $L_{a1240}$ | $L_{c251}$ |
| 659 | $L_{a1240}$ | $L_{c261}$ | 660 | $L_{a1240}$ | $L_{c271}$ |
| 661 | $L_{a1240}$ | $L_{c308}$ | 662 | $L_{a1240}$ | $L_{c309}$ |
| 663 | $L_{a1240}$ | $L_{c316}$ | 664 | $L_{a1240}$ | $L_{c319}$ |
| 665 | $L_{a1240}$ | $L_{c320}$ | 666 | $L_{a1240}$ | $L_{c321}$ |
| 667 | $L_{a1229}$ | $L_{c232}$ | 668 | $L_{a1232}$ | $L_{c232}$ |
| 689 | $L_{a1238}$ | $L_{c325}$ | 690 | $L_{a1287}$ | $L_{c232}$ |

According to an embodiment of the present disclosure, an electroluminescent device is further disclosed. The electroluminescent device comprises:

an anode, a cathode, and an organic layer disposed between the anode and the cathode, wherein the organic layer comprises a metal complex whose specific structure is shown in any one of the preceding embodiments.

According to an embodiment of the present disclosure, in the device, the organic layer is a light-emitting layer, and the metal complex is a light-emitting material.

According to an embodiment of the present disclosure, the electroluminescent device emits red light.

According to an embodiment of the present disclosure, the electroluminescent device emits yellow light.

According to an embodiment of the present disclosure, the electroluminescent device emits green light.

According to an embodiment of the present disclosure, the electroluminescent device emits white light.

According to an embodiment of the present disclosure, in the device, the light-emitting layer further comprises at least one host material.

According to an embodiment of the present disclosure, in the device, the light-emitting layer further comprises at least two host materials.

According to an embodiment of the present disclosure, in the device, the at least one host material comprises at least one chemical group selected from the group consisting of: benzene, pyridine, pyrimidine, triazine, carbazole, azacarbazole, indolocarbazole, dibenzothiophene, azadibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene, and combinations thereof.

According to an embodiment of the present disclosure, in the device, the host material may be a conventional host material in the related art. For example, the host material may typically comprise the following host materials without limitations:

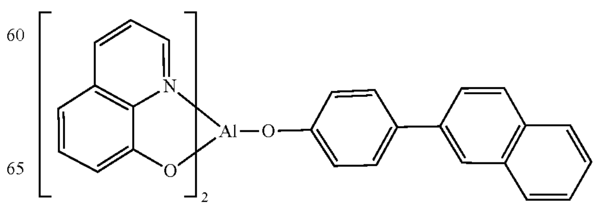,

-continued
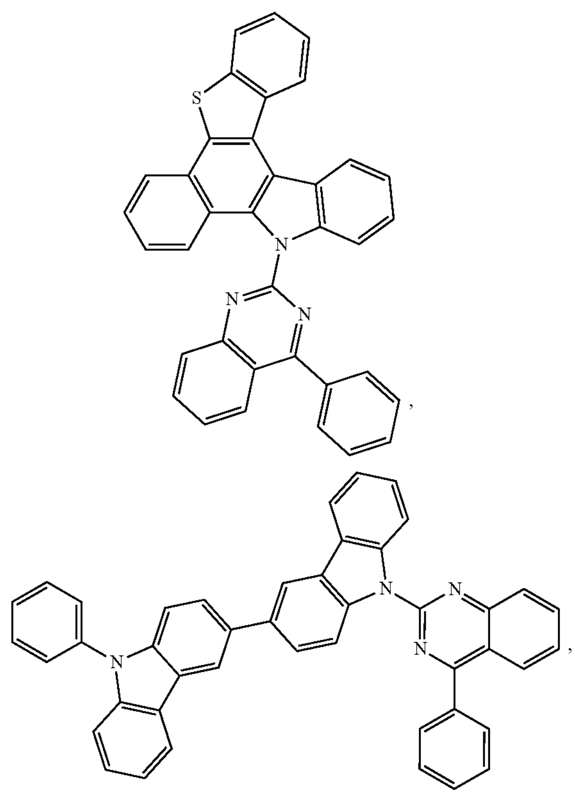
,
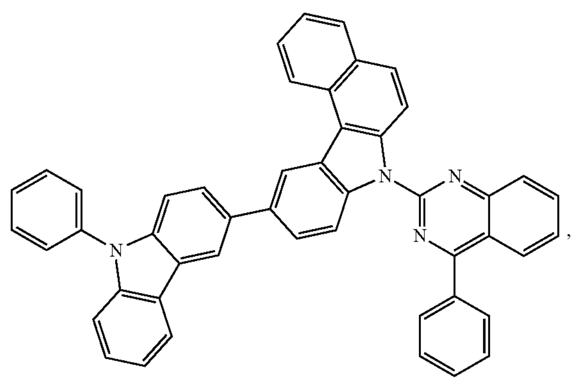
,
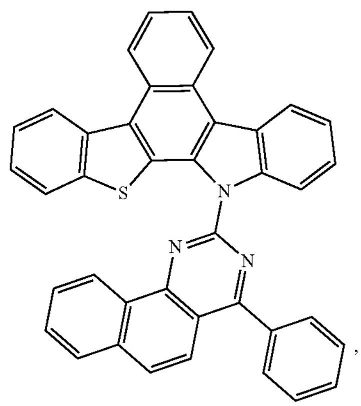
,
-continued
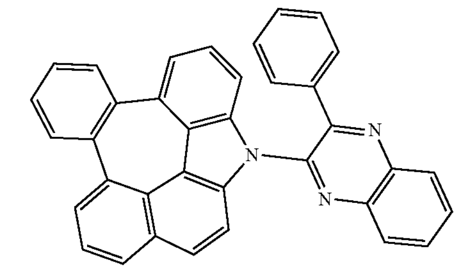
,
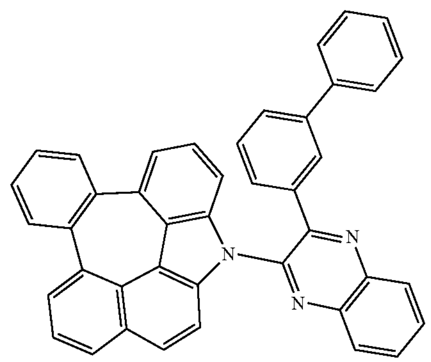
,
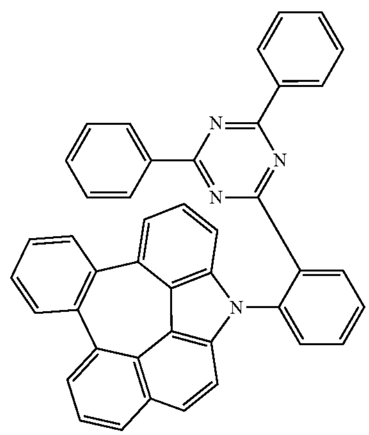
,
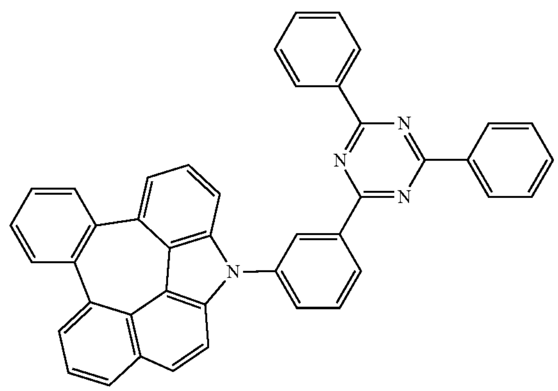
, -continued
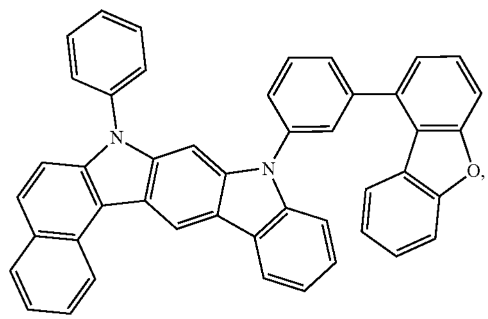
,
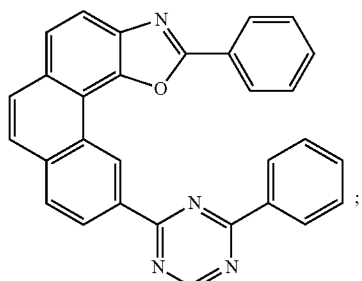
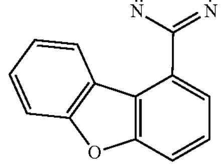
;
H-1
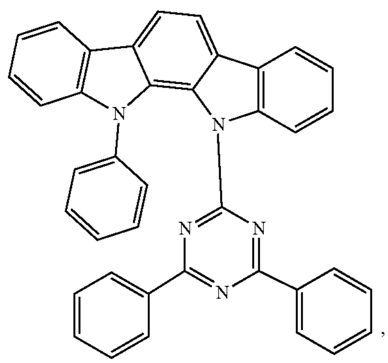
,
H-2
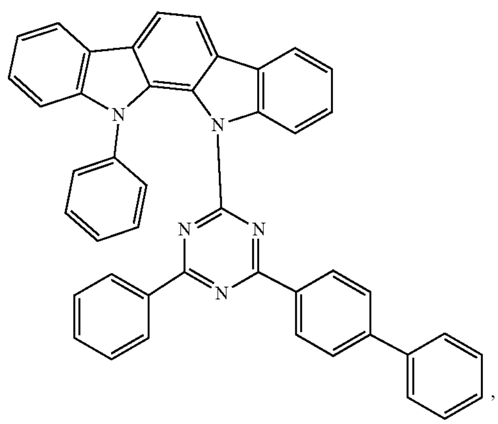
,
-continued
H-3
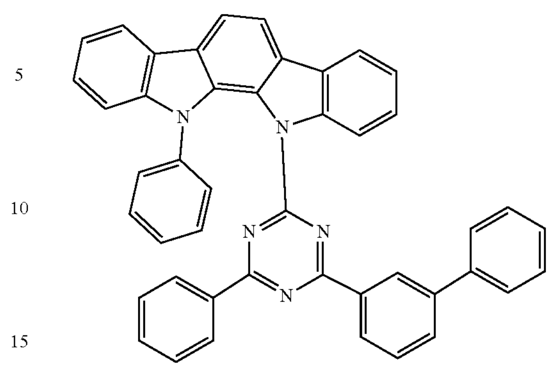
,
H-4
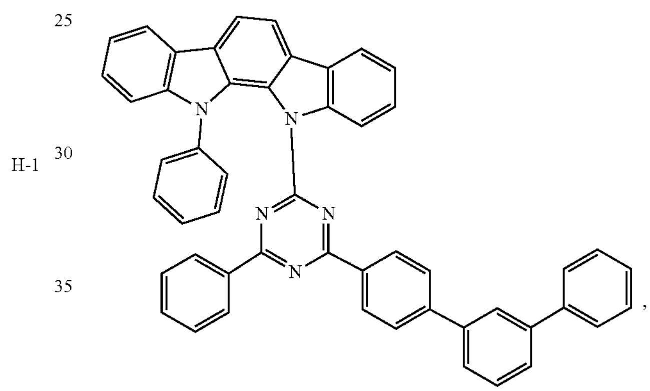
,
H-5
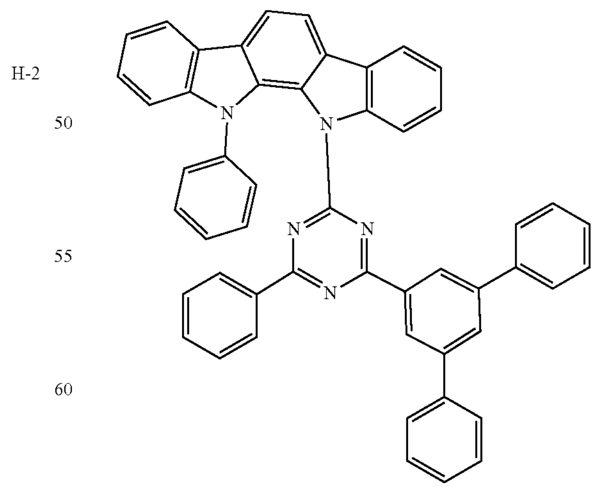
, -continued
H-6
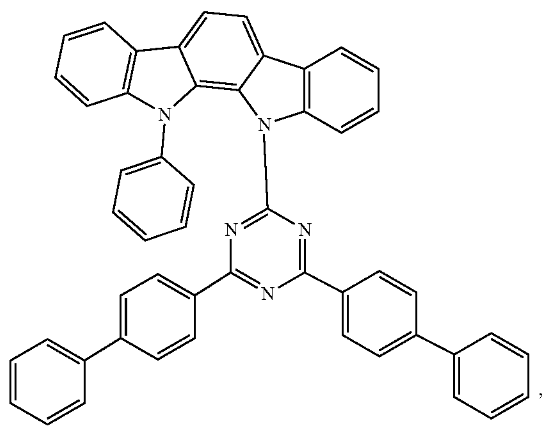
,
H-7
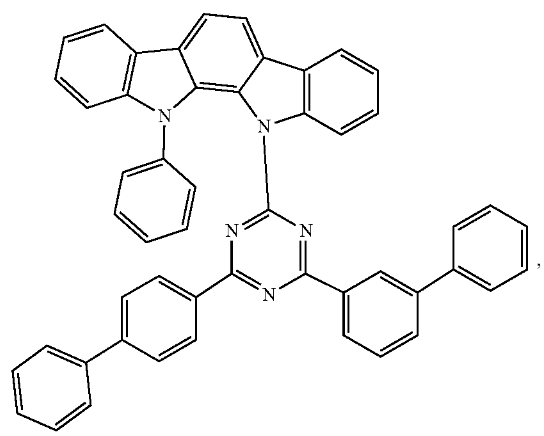
,
H-8
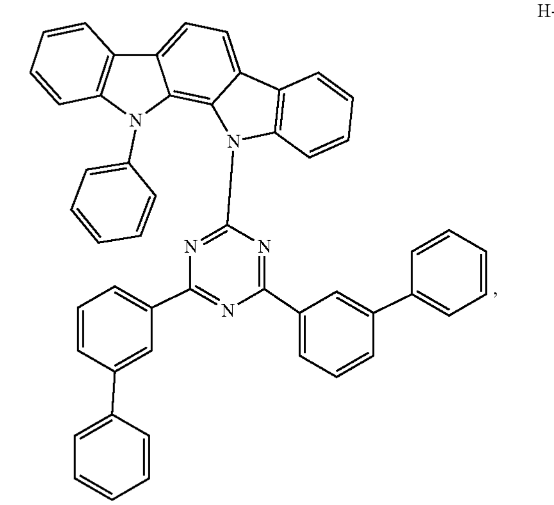
,
-continued
H-9
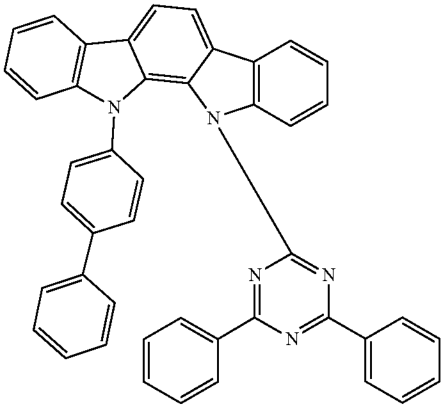
,
H-10
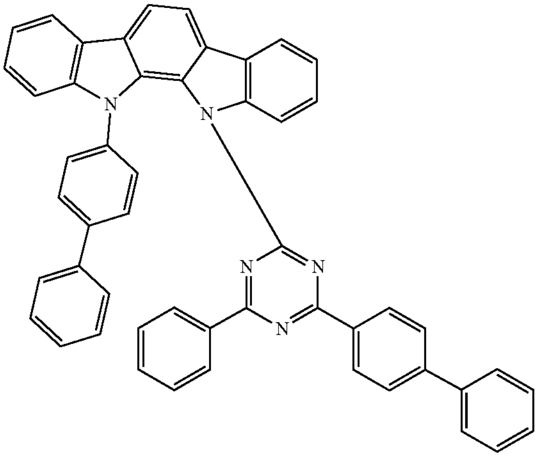
,
H-11
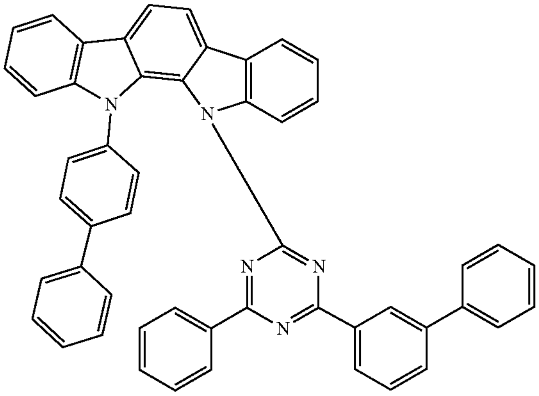
, -continued
H-12
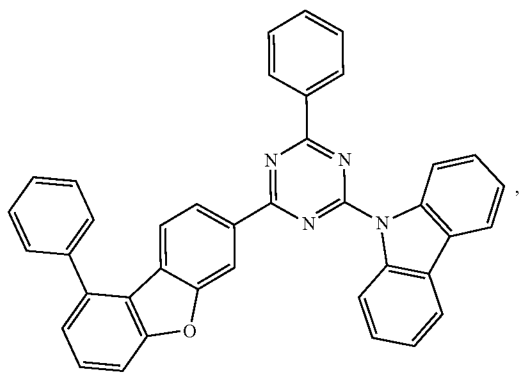
X-1
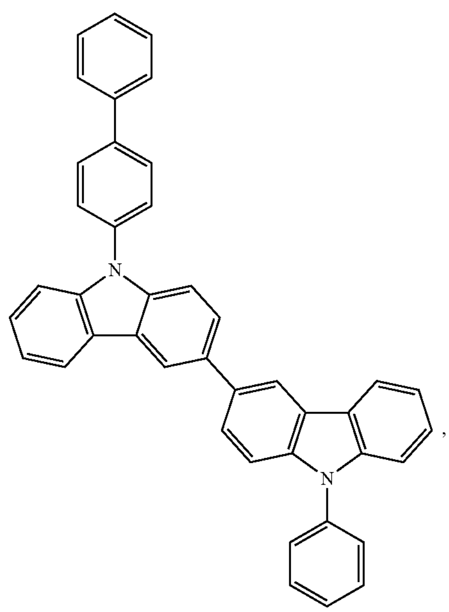
X-2
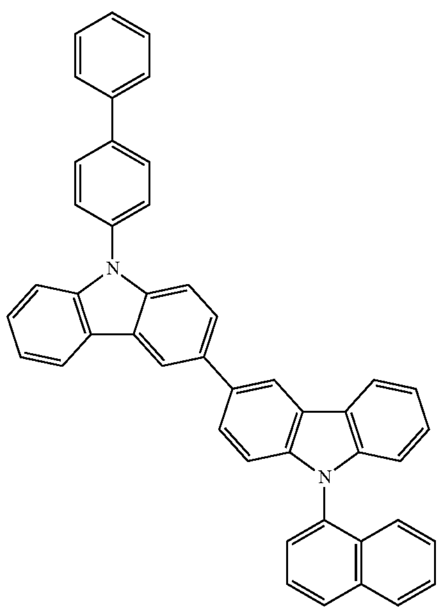
-continued
X-3
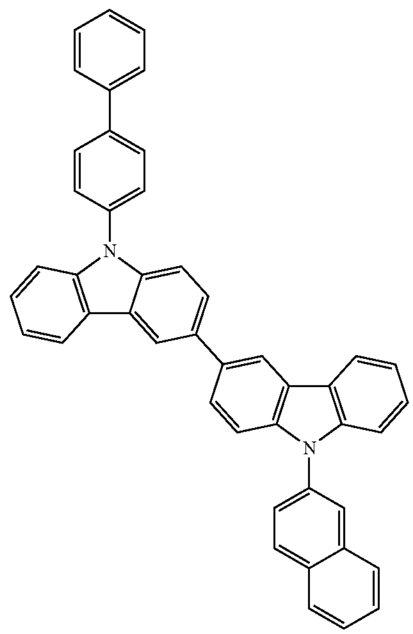
X-4
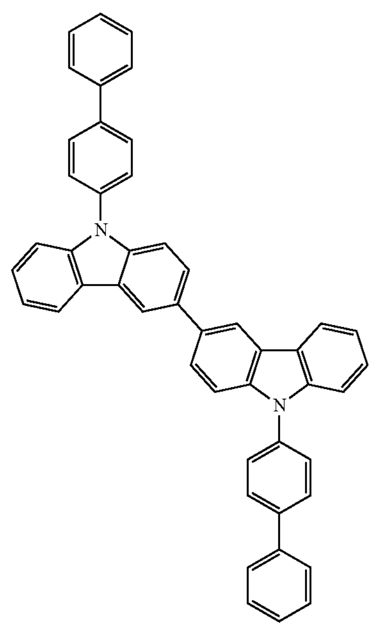

-continued
X-5
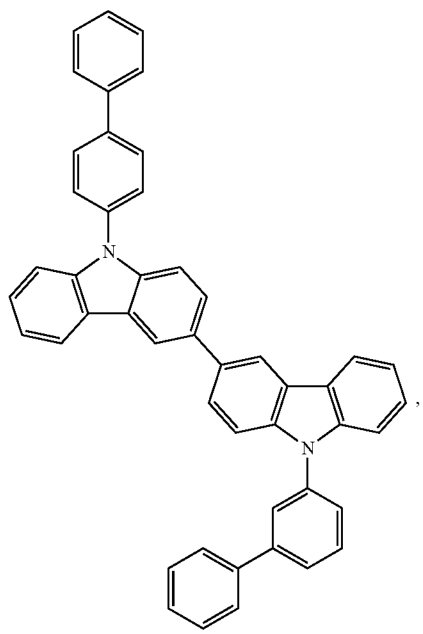
,
X-6
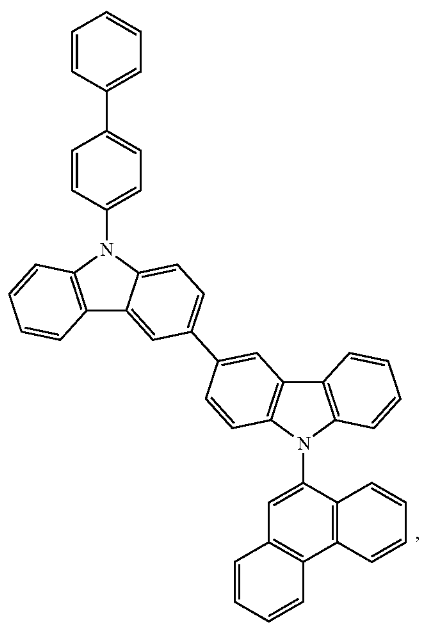
,
-continued
X-7
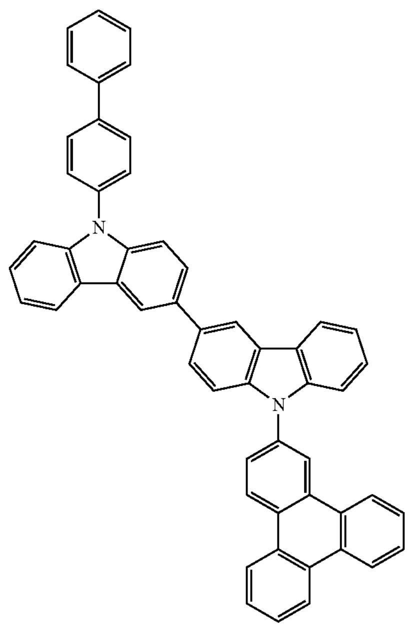
,
X-8
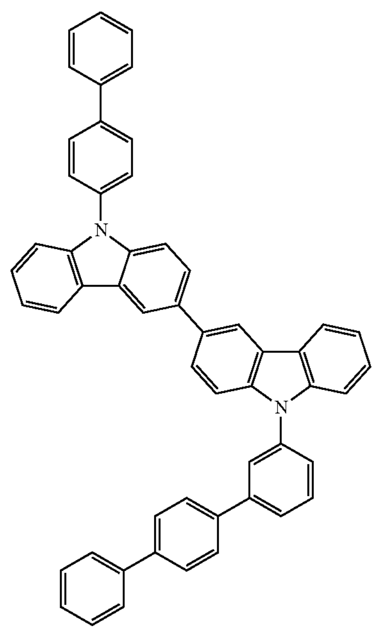
, -continued

X-9

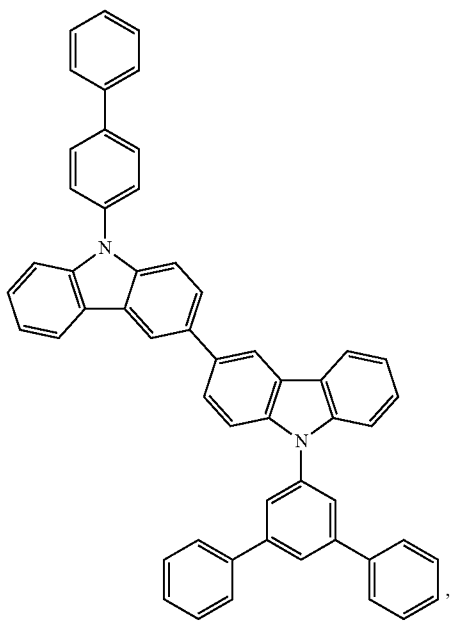

,

X-10

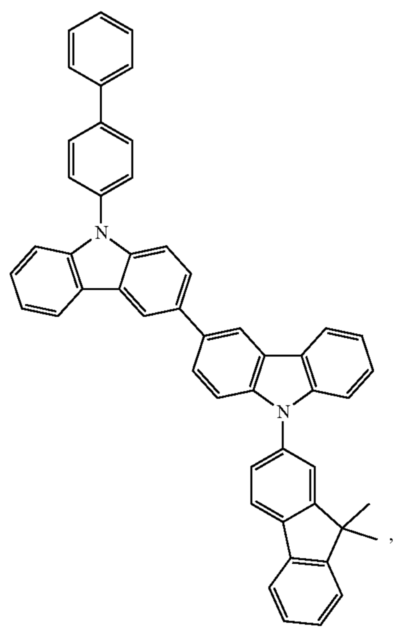

,

-continued

X-11

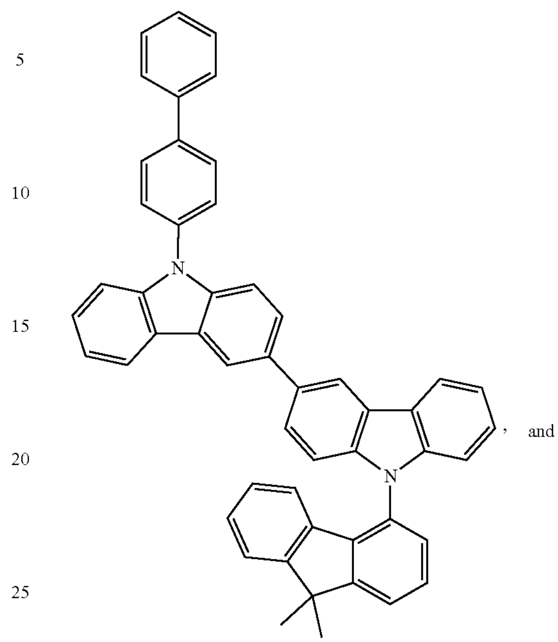

, and

X-12

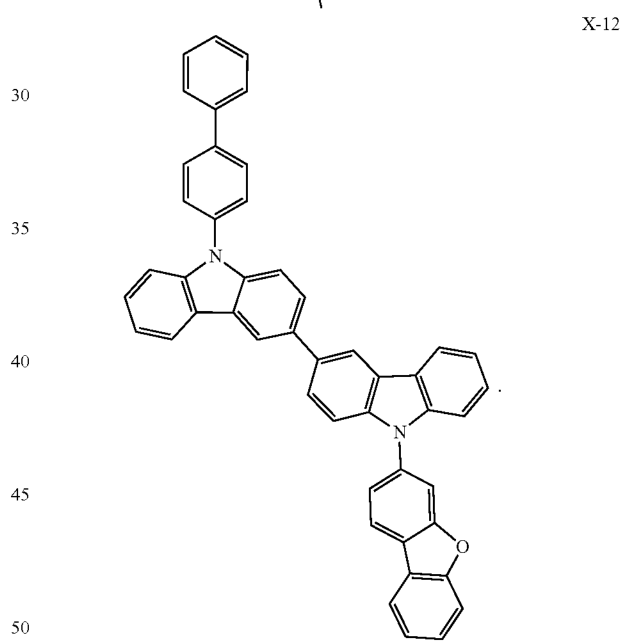

.

According to another embodiment of the present disclosure, a compound composition is further disclosed. The compound composition comprises a metal complex whose specific structure is shown in any one of the preceding embodiments.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, materials disclosed herein may be used in combination with a wide variety of dopants, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FSTAR, life testing system produced by SUZHOU FSTAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this present disclosure.

Material Synthesis Example

The method for preparing a compound in the present disclosure is not limited herein. Typically, the following compounds are used as examples without limitations, and synthesis routes and preparation methods thereof are described below.

Synthesis Example 1: Synthesis of Compound 5

Step 1: Synthesis of Intermediate 3

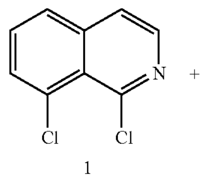

1

-continued

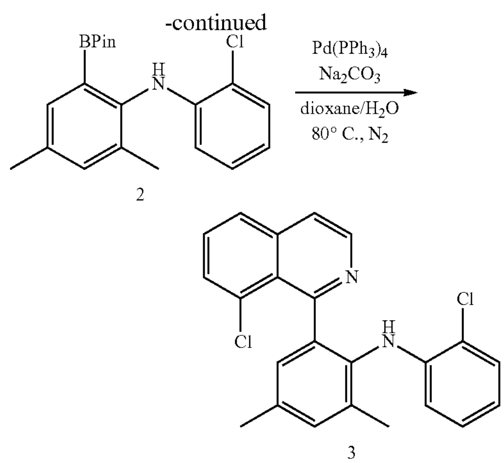

2

3

Intermediate 1 (2.16 g, 10.9 mmol), Intermediate 2 (3.9 g, 10.9 mmol), $Pd(PPh_3)_4$ (624 mg, 0.54 mmol) and $Na_2CO_3$ (1.74 g, 16.35 mmol) added to a 250 mL three-mouth flask, 1,4-dioxane/$H_2O$ (44 mL/11 mL) were added, the mixture was purged with nitrogen and reacted at 80° C. overnight. After the reaction was completed as detected by TLC, the reaction was cooled to room temperature, the reaction solution was diluted with EA and extracted by adding water. The organic phases were collected, concentrated and purified by column chromatography to give Intermediate 3 (3.94 g, with a yield of 91.9%).

Step 2: Synthesis of Intermediate 4

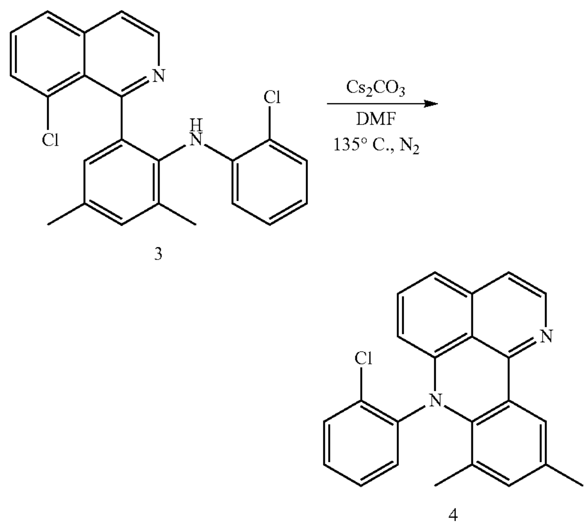

3

4

Intermediate 3 (3.94 g, 10 mmol) and $Cs_2CO_3$ (8.1 g, 25 mmol) were mixed in DMF (100 mL), purged with nitrogen and reacted at 135° C. for 1 hour. After the reaction was completed as detected by TLC, the reaction was cooled to room temperature, and water was added to the reaction solution. The product was precipitated and filtered, and the filter cake was washed with an appropriate amount of water and PE and dried to give Intermediate 4 (2.6 g, with a yield of 72.9%).

Step 3: Synthesis of Intermediate 5

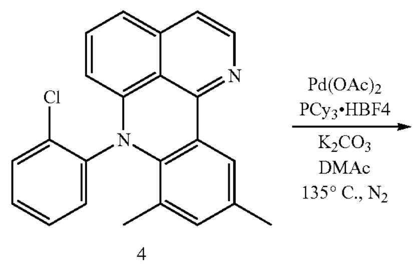

4

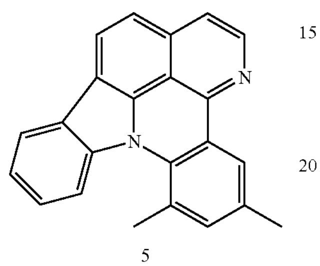

5

Intermediate 4 (2.3 g, 6.5 mmol), $Pd(OAc)_2$ (72 mg, 0.32 mmol), tricyclohexylphosphonium tetrafluoroborate ($PCy_3 \cdot HBF_4$, 236 mg, 0.64 mmol) and $K_2CO_3$ (1.8 g, 13 mmol) were mixed in DMAc (32 mL), purged with nitrogen and reacted at 135° C. for 24 hours. The reaction was cooled to room temperature, water was added to the reaction solution, and the reaction solution was extracted with dichloromethane, concentrated and separated by column chromatography to give Intermediate 5 (720 mg, with a yield of 34.6%).

Step 4: Synthesis of Iridium Dimer 6

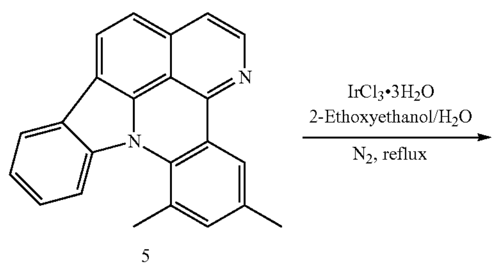

5

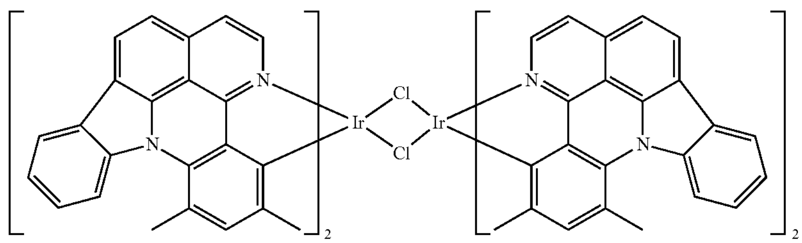

6

Intermediate 5 (720 mg, 2.2 mmol) and $IrCl_3 \cdot 3H_2O$ (282 mg, 0.8 mmol) were mixed in ethoxyethanol (12 mL) and water (4 mL), purged with nitrogen and refluxed at 130° C. for 24 hours. After the reaction was cooled to room temperature, the reaction solution was concentrated to give the crude product of Iridium dimer 6, which was directly used in the next step without further purification.

Step 5: Synthesis of Compound 5

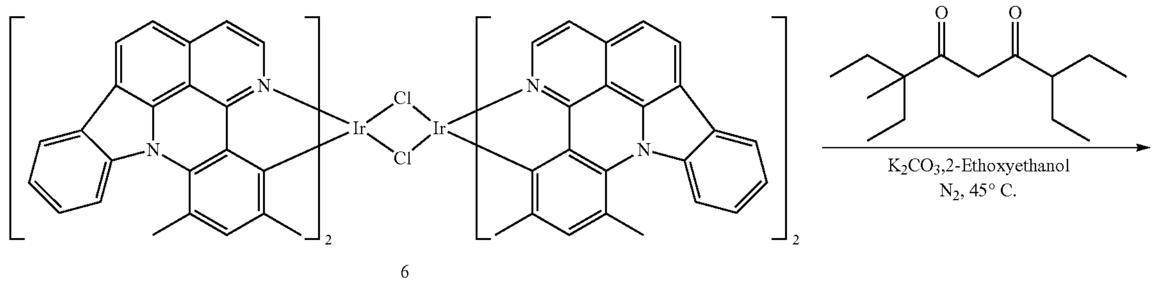

6

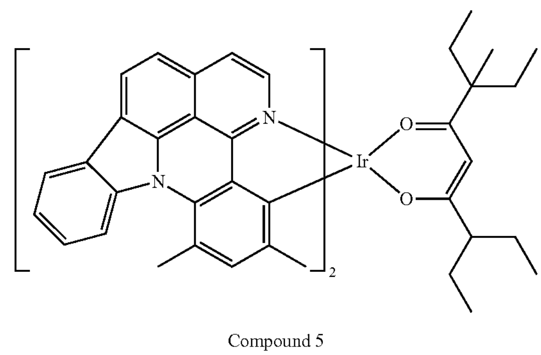

Compound 5

Iridium dimer 6 prepared in step 4, 3,7-diethyl-3-methyl-4,6-nonanedione (270 mg, 1.2 mmol), $K_2CO_3$ (552 mg, 4 mmol) and ethoxyethanol (12 mL) were mixed in a 100 mL single-necked flask, purged with nitrogen and reacted at 45° C. overnight. After the reaction was completed as detected by TLC, the reaction was cooled to room temperature. The reaction solution was filtered through Celite, the filter cake was washed with an appropriate amount of EtOH, and the crude product was washed with DCM and placed into a 250 mL eggplant flask. EtOH (about 10 mL) was added to the flask, and DCM was removed through rotary evaporation at room temperature. Solids were precipitated, filtered and washed with an appropriate amount of EtOH. The crude product was purified by column chromatography to give the product Compound 5 (240 mg, with a total yield of 28.4% over two steps). The product was confirmed as the target product with a molecular weight of 1056.4.

Synthesis Example 2: Synthesis of Compound 26

Step 1: Synthesis of Iridium Dimer 8

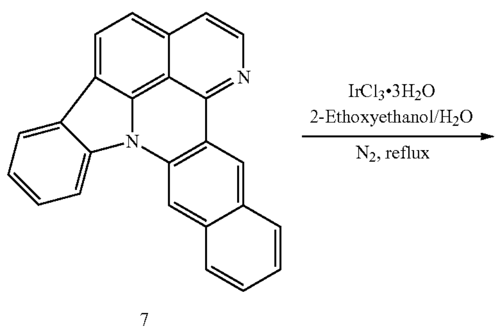

7

-continued

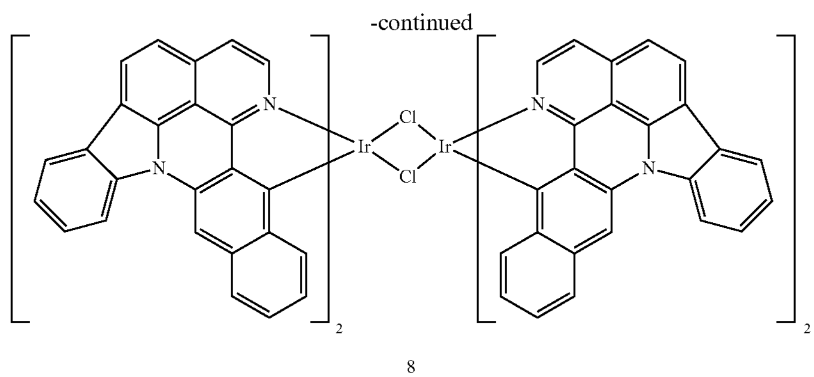

8

Intermediate 7 (45 mg, 0.13 mmol) and $IrCl_3 \cdot 3H_2O$ (18 mg, 0.052 mmol) were mixed in ethoxyethanol (3.9 mL) and water (1.3 mL), purged with nitrogen and refluxed at 130° C. for 24 hours. After the reaction was cooled to room temperature, the reaction solution was concentrated to give the crude product of Iridium dimer 8, which was directly used in the next step without further purification.

Step 2: Synthesis of Compound 26

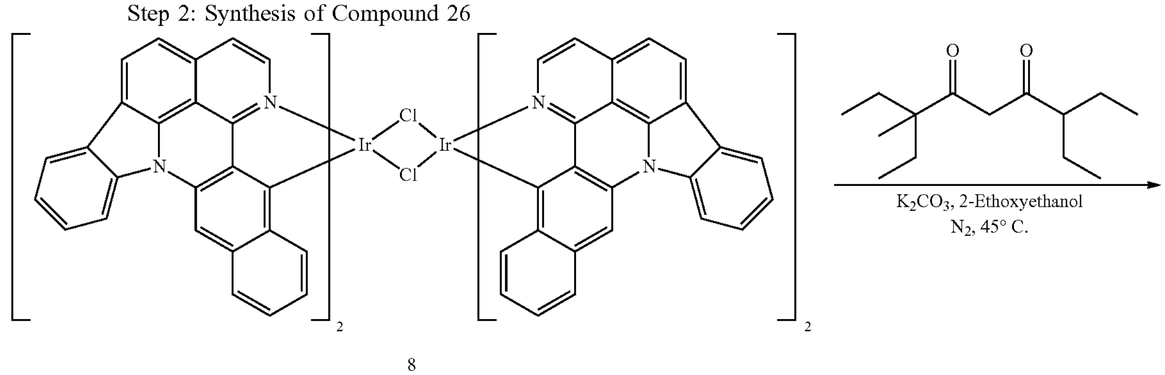

8

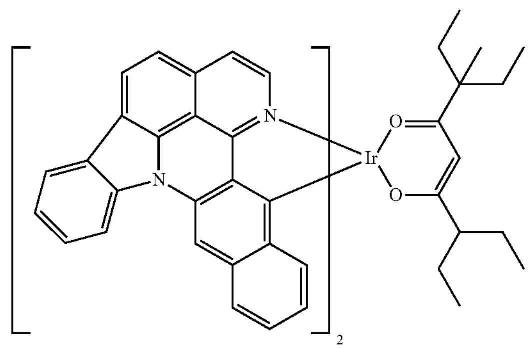

Compound 26

The prepared Iridium dimer 8, 3,7-diethyl-3-methyl-4,6-nonanedione (18 mg, 0.08 mmol), $K_2CO_3$ (36 mg, 0.26 mmol) and ethoxyethanol (4 mL) were mixed in a 100 mL single-necked flask, purged with nitrogen, and reacted at 45° C. overnight. After the reaction was completed as detected by TLC, the reaction solution was cooled to room temperature. The reaction solution was filtered through Celite, the filter cake was washed with an appropriate amount of EtOH, and the crude product was washed with DCM and placed into a 250 mL eggplant flask. The crude product was purified by column chromatography to give the product Compound 26 (20 mg, with a total yield of 35.0% over two steps). The product was confirmed as the target product with a molecular weight of 1100.4.

Synthesis Example 3: Synthesis of Compound 559

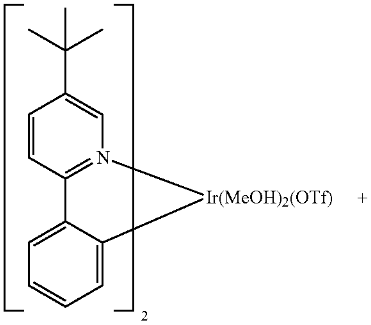

9

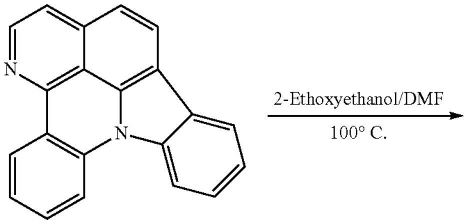

10

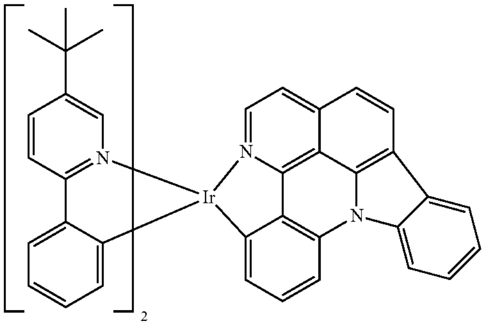

Compound 559

Intermediate 9 (2.6 g, 3.2 mmol), Intermediate 10 (1.4 g, 4.8 mmol), 2-ethoxyethanol (30 mL) and DMF (30 mL) were sequentially added to a dry 250 mL round-bottom flask and heated to react at 100° C. for 120 hours under $N_2$ protection. The filter cake was washed twice with methanol and n-hexane separately, yellow solids on the Celite were dissolved in dichloromethane. The organic phases were collected, concentrated under reduced pressure and purified by column chromatography to give Compound 559 (1.3 g, with a yield of 44.9%). The product was confirmed as the target product with a molecular weight of 904.3.

Synthesis Example 4: Synthesis of Compound 689

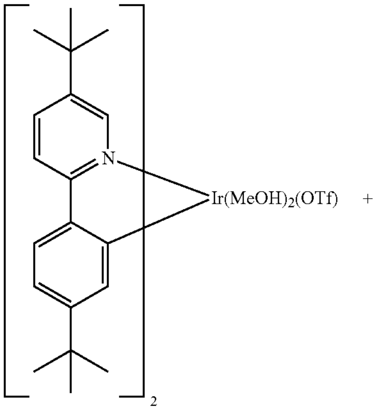

11

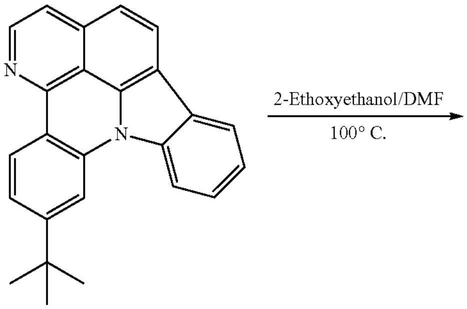

12

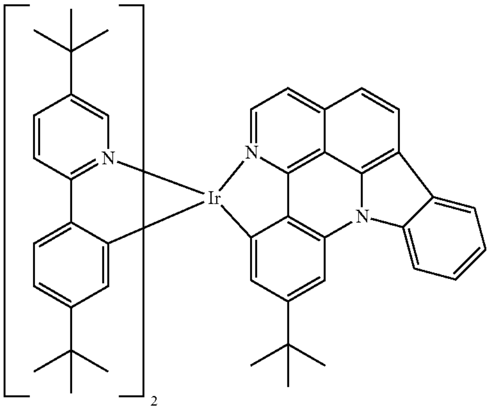

Compound 689

Intermediate 11 (2.2 g, 2.3 mmol), Intermediate 12 (1.1 g, 3.2 mmol), 2-ethoxyethanol (30 mL) and DMF (30 mL) were sequentially added to a dry 250 mL round-bottom flask and heated to react at 100° C. for 120 hours under $N_2$ protection. After the reaction was cooled, the reaction solution was filtered through Celite. The filter cake was washed twice with methanol and n-hexane separately, yellow solids on the Celite were dissolved in dichloromethane. The organic phases were collected, concentrated under reduced pressure and purified by column chromatography to give Compound 689 (0.4 g, with a yield of 16%). The product was confirmed as the target product with a molecular weight of 1072.5.

Synthesis Example 5: Synthesis of Compound 690

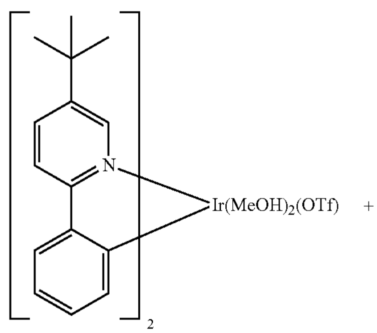

9

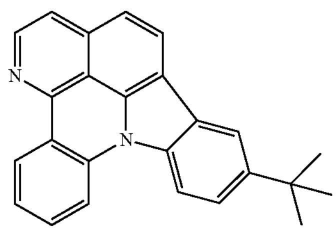

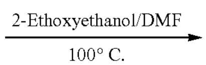

13

-continued

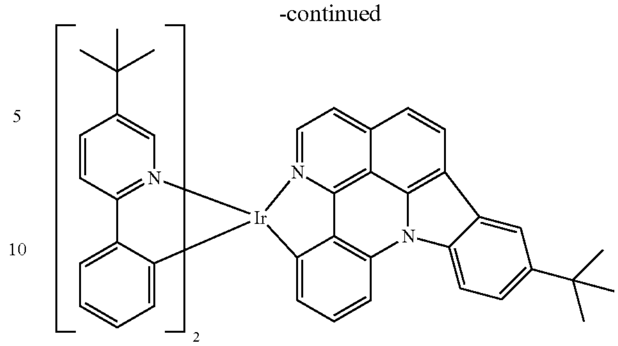

Compound 690

Intermediate 9 (1.8 g, 2.2 mmol), Intermediate 13 (0.9 g, 2.6 mmol), 2-ethoxyethanol (30 mL) and DMF (30 mL) were sequentially added to a dry 250 mL round-bottom flask and heated to react at 100° C. for 120 hours under $N_2$ protection. After the reaction was cooled, the reaction solution was filtered through Celite. The filter cake was washed twice with methanol and n-hexane separately, yellow solids on the Celite were dissolved in dichloromethane. The organic phases were collected, concentrated under reduced pressure and purified by column chromatography to give Compound 690 (0.9 g, with a yield of 43%). The product was confirmed as the target product with a molecular weight of 960.4.

Synthesis Example 6: Synthesis of Compound 35

Step 1: Synthesis of Iridium Dimer 15

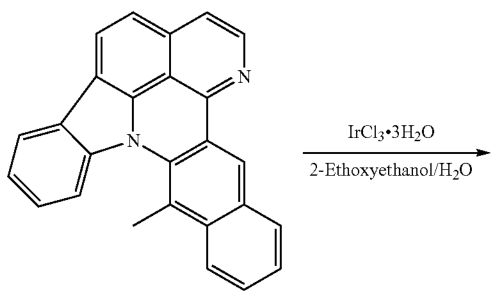

14

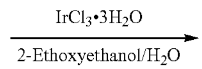

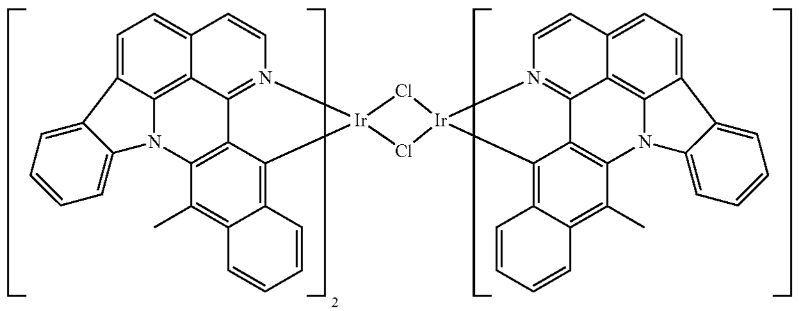

15

Intermediate 14 (1.22 g, 3.42 mmol) and $IrCl_3 \cdot 3H_2O$ (402 mg, 1.14 mmol) were mixed in ethoxyethanol (30 mL) and water (10 mL), purged with nitrogen and refluxed at 130° C. for 24 hours. After the reaction was cooled to room temperature, the reaction solution was filtered to give Iridium dimer 15, which was directly used in the next step without further purification.

Step 2: Synthesis of Compound 35

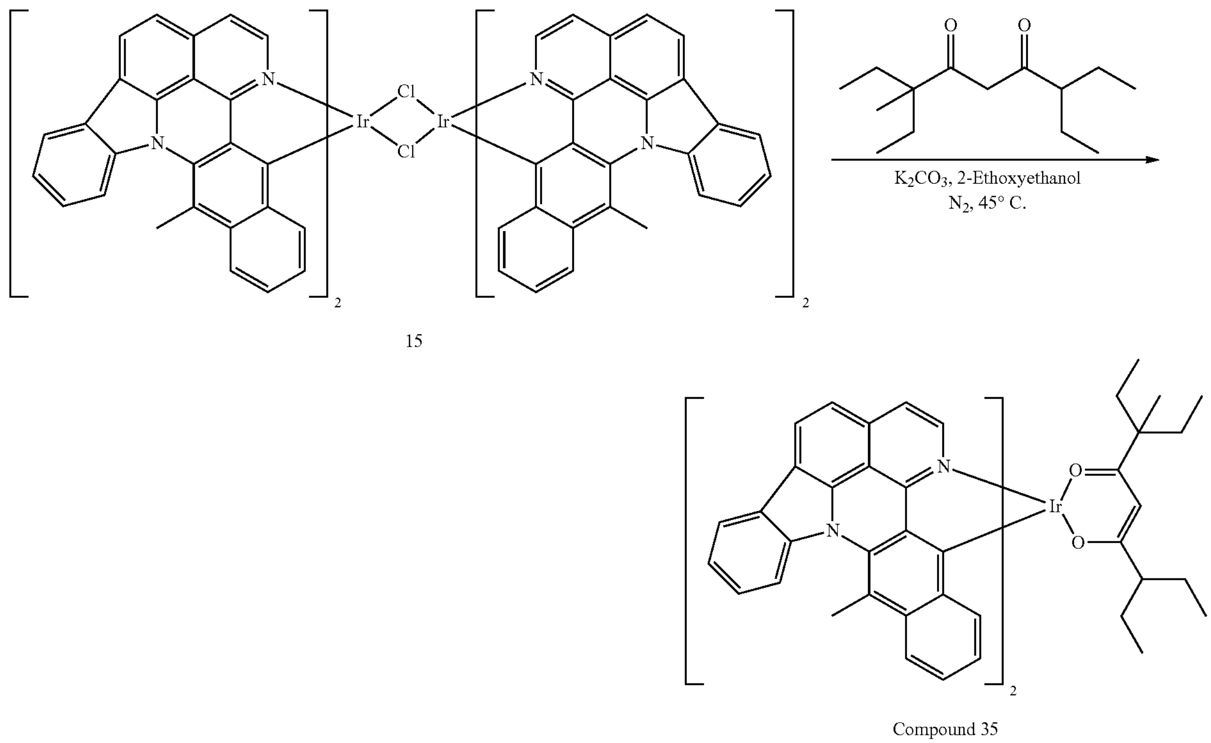

15

Compound 35

The prepared Iridium dimer 15, 3,7-diethyl-3-methyl-4,6-nonanedione (387 mg, 1.71 mmol), $K_2CO_3$ (788 mg, 5.7 mmol) and ethoxyethanol (30 mL) were mixed in a 100 mL single-necked flask, purged with nitrogen, and reacted at 60° C. overnight. After the reaction was completed as detected by TLC, the reaction was cooled to room temperature. The reaction solution was filtered through Celite, the filter cake was washed with an appropriate amount of EtOH, and the crude product was dissolved with DCM, concentrated, filtered and recrystallized from DCM/MeOH to give the product Compound 35 (360 mg, with a total yield of 28% over two steps). The product was confirmed as the target product with a molecular weight of 1128.4.

Synthesis Example 7: Synthesis of Compound 671

Step 1: Synthesis of Iridium Dimer 17

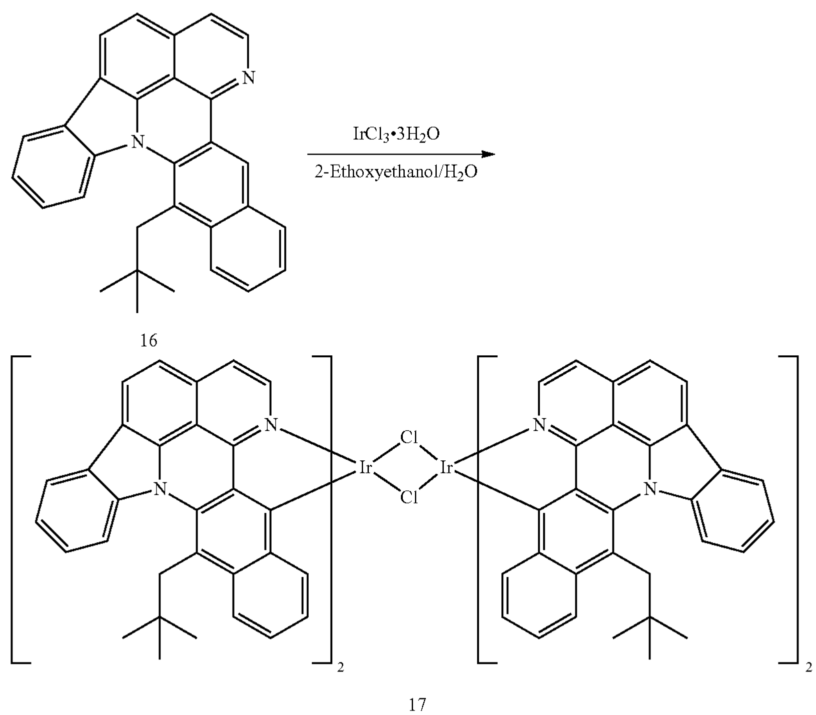

16

17

Intermediate 16 (74 mg, 0.18 mmol) and $IrCl_3 \cdot 3H_2O$ (24 mg, 0.07 mmol) were mixed in ethoxyethanol (6 mL) and water (2 mL), purged with nitrogen and refluxed at 130° C. for 24 hours. After the reaction was cooled to room temperature, the reaction solution was filtered to give the crude product of Iridium dimer 17, which was directly used in the next step without further purification.

Step 2: Synthesis of Compound 671

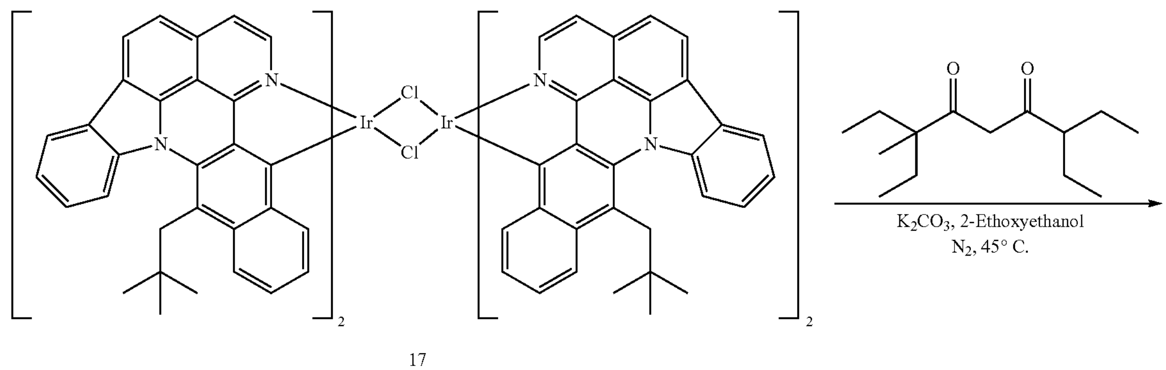

17

-continued

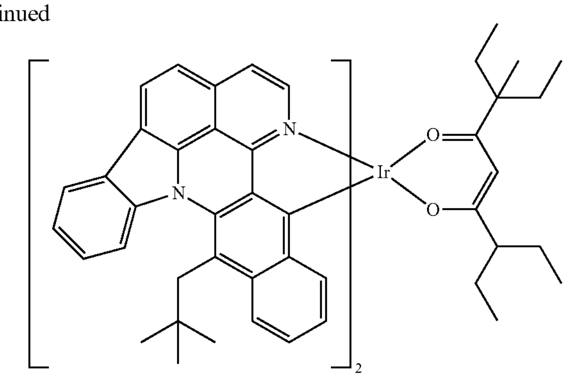

Compound 671

The prepared Iridium dimer 17, 3,7-diethyl-3-methyl-4,6-nonanedione (25 mg, 0.11 mmol), $K_2CO_3$ (49 mg, 0.35 mmol) and ethoxyethanol (6 mL) were mixed in a 100 mL single-necked flask, purged with nitrogen, and reacted at 60° C. overnight. After the reaction was completed as detected by TLC, the reaction was cooled to room temperature. The reaction solution was filtered through Celite, the filter cake was washed with an appropriate amount of EtOH, the crude product was dissolved with DCM, concentrated and filtered, and the filter cake was washed with MeOH and dried to give the product Compound 671 (20 mg, with a total yield of 23% over two steps). The product was confirmed as the target product with a molecular weight of 1240.5.

Those skilled in the art will appreciate that the above preparation methods are merely exemplary. Those skilled in the art can obtain other compound structures of the present disclosure through the modifications of the preparation methods.

Through the special design of the ligand structure, the metal complex of the present disclosure can effectively regulate and control the luminescence wavelength, and the following photoluminescence (PL) spectroscopy data prove such an excellent effect of the metal complex of the present disclosure.

Spectroscopy Data

The photoluminescence (PL) spectroscopy data of the compounds of the present disclosure and a comparative compound was measured using a fluorescence spectrophotometer F98 produced by SHANGHAI LENGGUANG TECHNOLOGY CO., LTD. Samples of Compound 35 of the present disclosure and the comparative compound RD-A were prepared into solutions each with a concentration of $3\times10^{-5}$ mol/L by using HPLC-grade toluene and excited at room temperature (298 K) using light with a wavelength of 500 nm, and their emission spectra were measured.

The structures of Compound 35 of the present disclosure and the comparative compound RD-A are as follows:

Compound 35

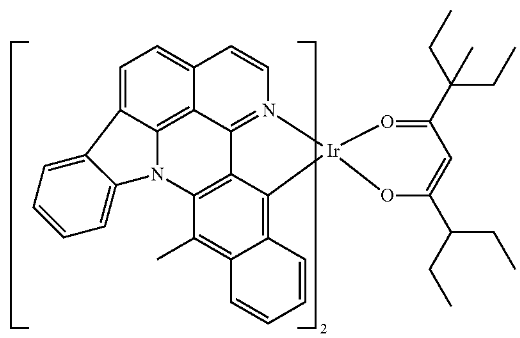

, and

Compound RD-A

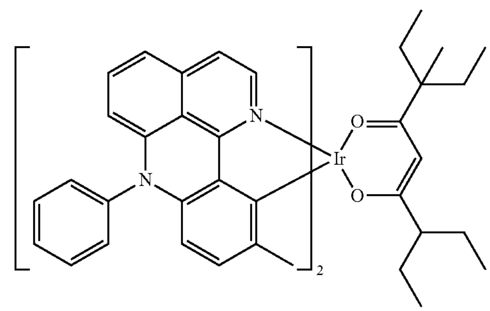

.

The maximum emission wavelength of the comparative compound RD-A is 575 nm in the PL spectrum, while the maximum emission wavelength of Compound 35 of the present disclosure is 625 nm in the PL spectrum and achieves the emission of red light. It can be seen that due to the special design of the ligand structure, the compounds of the present disclosure can effectively regulate and control the luminescence wavelength, which proves the excellent performance of the metal complex of the present disclosure.

In addition, the compounds of the present disclosure also have excellent device performance, and the excellent performance of the compounds of the present disclosure in the device is further verified through device examples below.

Device Example 1.1

First, a glass substrate having an indium tin oxide (ITO) anode with a thickness of 80 nm was cleaned and then treated with oxygen plasma and UV ozone. After the treatment, the substrate was dried in a glovebox to remove moisture. Then, the substrate was mounted on a substrate holder and placed in a vacuum chamber. Organic layers specified below were sequentially deposited through vacuum thermal evaporation on the ITO anode at a rate of 0.2 to 2 Angstroms per second at a vacuum degree of about $10^{-8}$ torr. Compound HI was deposited as a hole injection layer (HIL). Compound HT was deposited as a hole transport layer (HTL). Compound X-4 was deposited as an electron blocking layer (EBL). Compound 5 of the present disclosure was doped in Compound H-1 and Compound SD and co-deposited as an emissive layer (EML) (the weight ratio among Compound H-1, Compound SD and Compound 5 of the present disclosure was 80:17:3). On the EML, Compound H-1 was deposited as a hole blocking layer (HBL). On the HBL, Compound ET and 8-hydroxyquinolinolato-lithium (Liq) were co-deposited as an electron transport layer (ETL). Finally, 8-hydroxyquinolinolato-lithium (Liq) was deposited as an electron injection layer with a thickness of 1 nm, and Al was deposited as a cathode with a thickness of 120 nm. The device was transferred back to the glovebox and encapsulated with a glass lid and a moisture getter to complete the device.

Device Example 1.2

The preparation method in Device Example 1.2 was the same as that in Device Example 1.1, except that Compound H-1 and Compound SD were replaced with Compound X-4 and Compound H-12 in the emissive layer (EML) and the weight ratio among Compound X-4, Compound H-12 and Compound 5 of the present disclosure was adjusted to 47:47:6.

Device Comparative Example 1.1

The preparation method in Device Comparative Example 1.1 was the same as that in Device Example 1.1, except that Compound 5 of the present disclosure was replaced with Compound RD-A in the emissive layer (EML).

Device Comparative Example 1.2

The preparation method in Device Comparative Example 1.2 was the same as that in Device Example 1.2, except that Compound 5 of the present disclosure was replaced with Compound RD-A in the emissive layer (EML).

The structures and thicknesses of partial layers of the devices are shown in the following table. A layer using more than one material is obtained by doping different compounds at their weight ratio as recorded.

TABLE 1

Part of device structures in Device Examples and Device Comparative Examples

| Device No. | HIL | HTL | EBL | EML | HBL | ETL |
|---|---|---|---|---|---|---|
| Example 1.1 | Compound HI (100 Å) | Compound HT (350 Å) | Compound X-4 (50 Å) | Compound H-1: Compound SD:Compound 5 (80:17:3) (400 Å) | Compound H-1 (50 Å) | Compound ET:Liq (40:60) (350 Å) |
| Example 1.2 | Compound HI (100 Å) | Compound HT (350 Å) | Compound X-4 (50 Å) | Compound X-4:Compound H-12: Compound 5 (47:47:6) (400 Å) | Compound H-1 (50 Å) | Compound ET:Liq (40:60) (350 Å) |
| Comparative Example 1.1 | Compound HI (100 Å) | Compound HT (350 Å) | Compound X-4 (50 Å) | Compound H-1: Compound SD: Compound RD-A (80:17:3) (400 Å) | Compound H-1 (50 Å) | Compound ET:Liq (40:60) (350 Å) |
| Comparative Example 1.2 | Compound HI (100 Å) | Compound HT (350 Å) | Compound X-4 (50 Å) | Compound X-4: Compound H-12:Compound RD-A (47:47:6) (400 Å) | Compound H-1 (50 Å) | Compound ET:Liq (40:60) (350 A) |

The structures of the materials used in the devices are shown as follows.

Compound H1

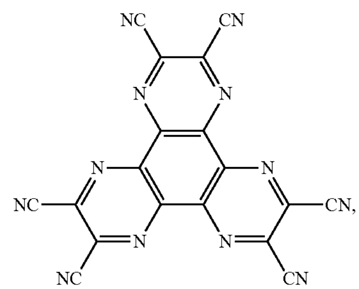

-continued

Compound HT

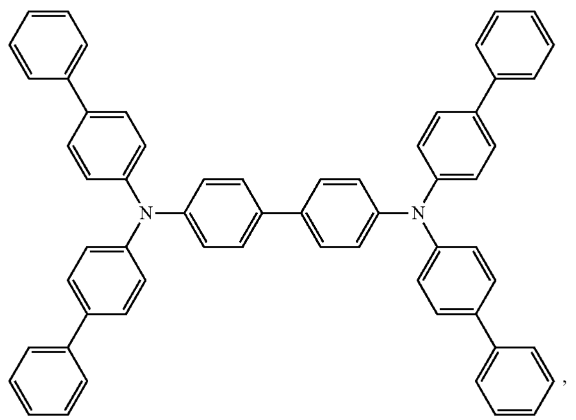

Compound X-4

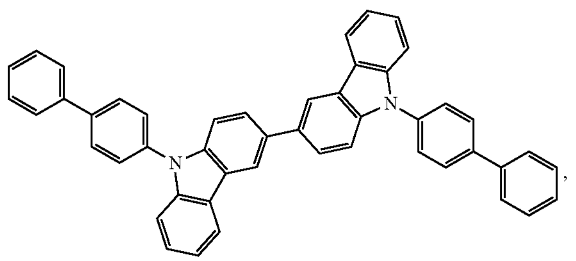

H-12

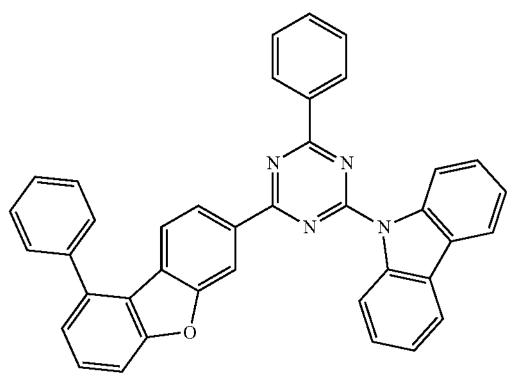

H-1

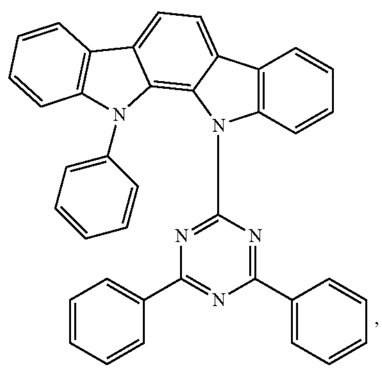

Liq

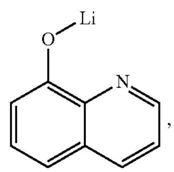

-continued

Compound ET

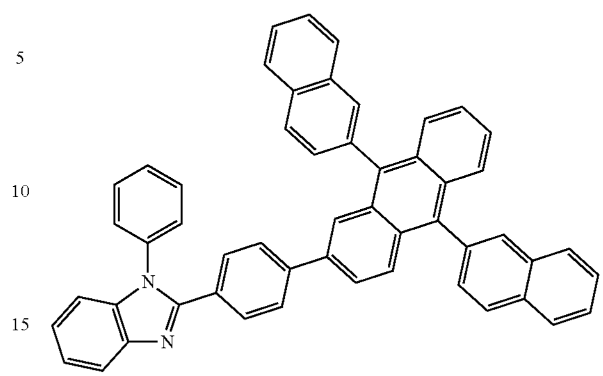

Compound SD

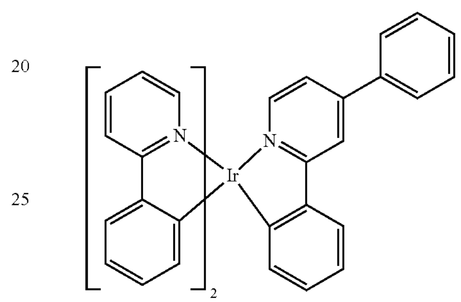

Compound 5

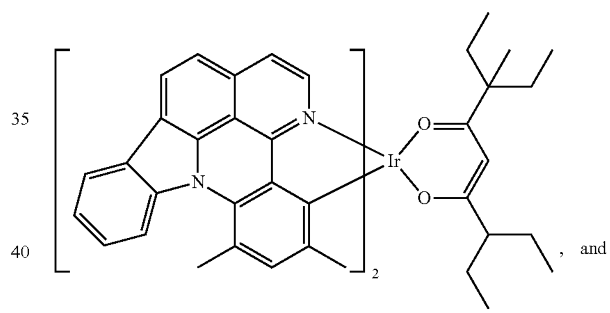

, and

Compound RD-A

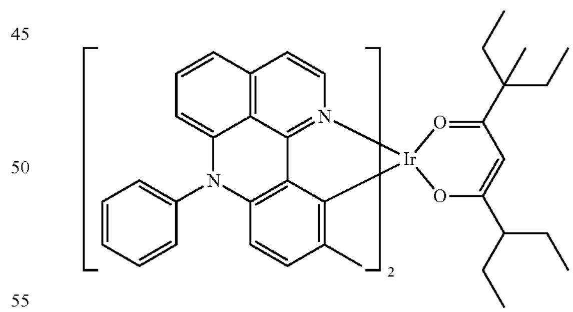

IVL characteristics of the devices were measured. The CIE data, maximum emission wavelength ($\lambda_{max}$), voltage (V), current efficiency (CE), power efficiency (PE) and external quantum efficiency (EQE) of each device were measured at 1000 cd/m$^2$. These data were recorded and shown in Table 2.

TABLE 2

| Device data | | | | | | |
|---|---|---|---|---|---|---|
| Device No. | CIE (x, y) | $\lambda_{max}$ (nm) | Voltage (V) | CE (cd/A) | PE (lm/W) | EQE (%) |
| Example 1.1 | (0.505, 0.493) | 563 | 2.73 | 79 | 91 | 25.04 |
| Comparative Example 1.1 | (0.561, 0.438) | 577 | 2.90 | 58 | 63 | 23.65 |
| Example 1.2 | (0.498, 0.500) | 563 | 2.95 | 92 | 97 | 27.99 |
| Comparative Example 1.2 | (0.566, 0.434) | 577 | 3.35 | 56 | 52 | 23.28 |

Discussion

As can be seen from Table 2, compared with the device performance of the comparative compounds, the compounds of the present disclosure comprising a ligand containing multiple fused rings had significant advantages in the drive voltage and the efficiency and, moreover, had more excellent device performance in a variety of light-emitting bodies: compared with Comparative Example 1.1, the CE, PE and EQE of Example 1.1 were significantly increased by 36%, 44% and 6%, respectively, and the drive voltage was reduced by nearly 6% compared with Comparative Example 1.1; compared with Comparative Example 1.2, the device performance of Example 1.2 was more excellent, the CE, PE and EQE of Example 1.2 were more significantly increased by 64%, 86% and 20%, respectively, and the drive voltage of Example 1.2 was reduced by 12% compared with Comparative Example 1.2. The comparison of these data proves that the metal complexes of the present disclosure have excellent properties for comprehensively and greatly improving the device performance due to the special fused ring structure design of the $L_a$ ligand and fully embodies the excellent performance and excellent application prospect of the metal complexes of the present disclosure.

Device Example 2.1

The preparation method in Device Example 2.1 was the same as that in Device Example 1.1, except that Compound 5 of the present disclosure was replaced with Compound 559 of the present disclosure in the emissive layer (EML).

Device Example 2.2

The preparation method in Device Example 2.2 was the same as that in Device Example 1.2, except that Compound 5 of the present disclosure was replaced with Compound 559 of the present disclosure in the emissive layer (EML).

Device Example 2.3

The preparation method in Device Example 2.3 was the same as that in Device Example 1.2, except that Compound 5 of the present disclosure was replaced with Compound 689 of the present disclosure in the emissive layer (EML).

Device Example 2.4

The preparation method in Device Example 2.4 was the same as that in Device Example 1.2, except that Compound 5 of the present disclosure was replaced with Compound 690 of the present disclosure in the emissive layer (EMIL).

The structures and thicknesses of partial layers of the devices are shown in the following table. A layer using more than one material is obtained by doping different compounds at their weight ratio as recorded.

TABLE 3

| Part of device structures in Device Examples | | | | | | |
|---|---|---|---|---|---|---|
| Device No. | HIL | HTL | EBL | EML | HBL | ETL |
| Example 2.1 | Compound HI (100 Å) | Compound HT (350 Å) | Compound X-4 (50 Å) | Compound H-1:Compound SD:Compound 559 (80:17:3) (400 Å) | Compound H-1 (50 Å) | Compound ET:Liq (40:60) (350 Å) |
| Example 2.2 | Compound HI (100 Å) | Compound HT (350 Å) | Compound X-4 (50 Å) | Compound X-4:Compound H-12:Compound 559 (47:47:6) (400 Å) | Compound H-1 (50 Å) | Compound ET:Liq (40:60) (350 Å) |
| Example 2.3 | Compound HI (100 Å) | Compound HT (350 Å) | Compound X-4 (50 Å) | Compound X-4:Compound H-12:Compound 689 (47:47:6) (400 Å) | Compound H-1 (50 Å) | Compound ET:Liq (40:60) (350 Å) |
| Example 2.4 | Compound HI (100 Å) | Compound HT (350 Å) | Compound X-4 (50 Å) | Compound X-4:Compound H-12:Compound 690 (47:47:6) (400 Å) | Compound H-1 (50 Å) | Compound ET:Liq (40:60) (350 Å) |

The structures of the new materials used in the devices are shown as follows:

Compound 559

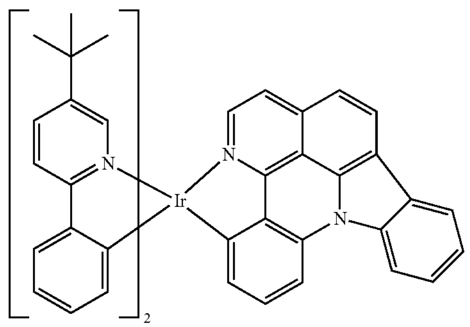

Compound 689

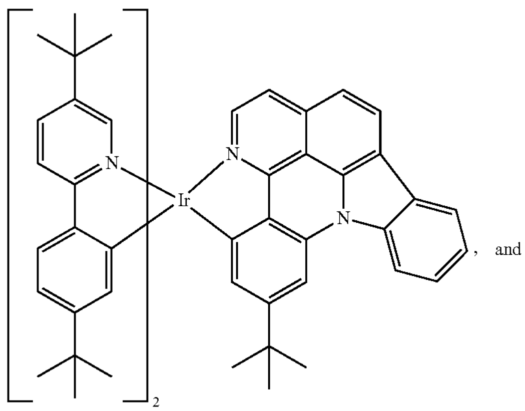

Compound 690

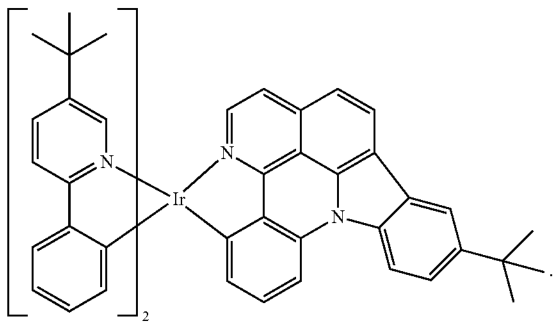

IVL characteristics of the devices were measured. The CIE data, maximum emission wavelength ($\lambda_{max}$), voltage (V), current efficiency (CE), power efficiency (PE) and external quantum efficiency (EQE) of each device were measured at 1000 cd/m$^2$. These data were recorded and shown in Table 4.

TABLE 4

| Device data | | | | | | |
|---|---|---|---|---|---|---|
| Device No. | CIE (x, y) | $\lambda_{max}$ (nm) | Voltage (V) | CE (cd/A) | PE (lm/W) | EQE (%) |
| Example 2.1 | (0.497, 0.499) | 563 | 2.74 | 64 | 74 | 21.25 |
| Example 2.2 | (0.490, 0.507) | 559 | 2.72 | 77 | 89 | 24.03 |
| Example 2.3 | (0.489, 0.508) | 561 | 3.47 | 76 | 69 | 23.71 |
| Example 2.4 | (0.487, 0.510) | 559 | 2.78 | 75 | 84 | 23.12 |

Discussion

As can be seen from the device data of Example 2.1, Example 2.2, Example 2.3 and Example 2.4, since different types of auxiliary ligands were used in the compounds of the present disclosure, the compounds of the present disclosure can successfully adjust the luminescence wavelength of the device to be in the yellow to green luminescence regions and, meanwhile, also had good device performance: the EQE of Example 2.1, Example 2.2, Example 2.3 and Example 2.4 can reach 21.25%, 24.03%, 23.71% and 23.12%, respectively, the devices obtained a high device efficiency, and Examples 2.1 to 2.4 all obtained a low voltage, especially the drive voltages of Example 2.1, Example 2.2 and Example 2.4 were very low (less than or equal to 2.78 V). More importantly, at the current density of 80 mA/cm$^2$, the lifetime (LT97) of Example 2.1, Example 2.2 and Example 2.4 reached the long lifetime level of 112.5 hours, 257 hours and 154 hours, respectively, indicating that the metal complexes of the present disclosure are yellow and green light-emitting materials with excellent performance.

In conclusion, due to the special fused ring structure design of the $L_a$ ligand, the metal complex of the present disclosure has the excellent device performance which is comprehensively improved, and moreover, the metal complex of the present disclosure can effectively control the luminescence wavelength and can meet the requirements of various luminescence bands from green light to red light of the OLED device, fully embodying the excellent application prospect of the metal complex of the present disclosure.

It should be understood that various embodiments described herein are merely embodiments and not intended to limit the scope of the present disclosure. Therefore, it is apparent to those skilled in the art that the present disclosure as claimed may include variations of specific embodiments and preferred embodiments described herein. Many of the materials and structures described herein may be replaced with other materials and structures without departing from the spirit of the present disclosure. It should be understood that various theories as to why the present disclosure works are not intended to be limitative.

What is claimed is:

1. A metal complex, comprising a metal M and a ligand $L_a$ coordinated with the metal M, wherein the metal M is selected from metals having a relative atomic mass greater than 40, and the ligand $L_a$ has a structure represented by Formula 1:

Formula 1

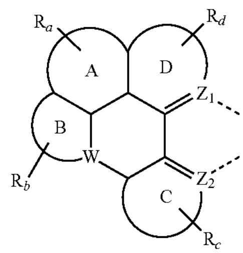

wherein $Z_1$ and $Z_2$ are each independently selected from C or N, and $Z_1$ and $Z_2$ are different;

W is, at each occurrence identically or differently, selected from B, N or P;

ring A, ring C, and ring D are, at each occurrence identically or differently, selected from a five-membered unsaturated carbocyclic ring, an aromatic ring having 6 to 30 carbon atoms or a heteroaromatic ring having 3 to 30 carbon atoms;

ring B is selected from a hetero ring having 5 to 30 ring atoms;

$R_a$, $R_b$, $R_c$, and $R_d$ represent, at each occurrence identically or differently, mono-substitution, multiple substitutions or non-substitution;

$R_a$, $R_b$, $R_c$, and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_a$, $R_b$, $R_c$, and $R_d$ can be optionally joined to form a ring.

2. The metal complex of claim 1, wherein in $L_a$, ring A, ring C, and ring D are, at each occurrence identically or differently, selected from an aromatic ring having 6 to 18 carbon atoms or a heteroaromatic ring having 3 to 18 carbon atoms; and ring B is selected from a heteroaromatic ring having 5 to 18 ring atoms.

3. The metal complex of claim 1, wherein $L_a$ is selected from a structure represented by any one of Formula 2 to Formula 19:

Formula 2

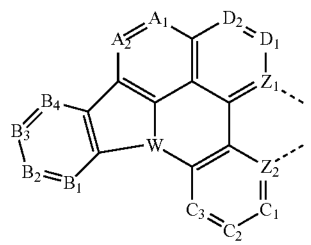

Formula 3

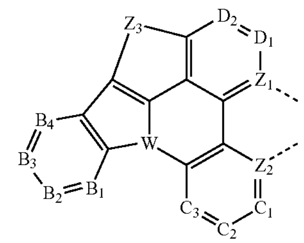

Formula 4

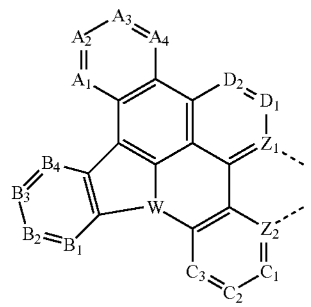

Formula 5

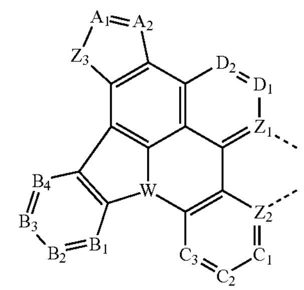

Formula 6

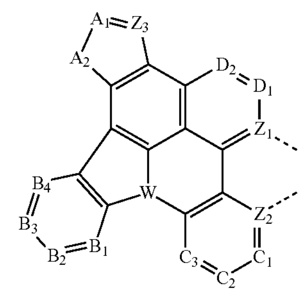

-continued
Formula 7
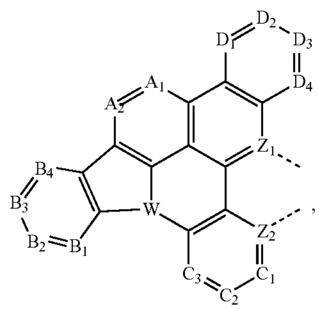
Formula 8
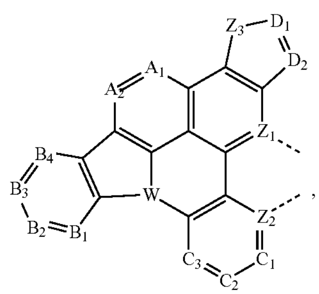
Formula 9
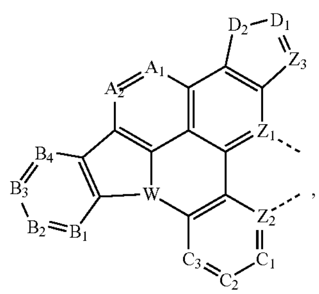
Formula 10
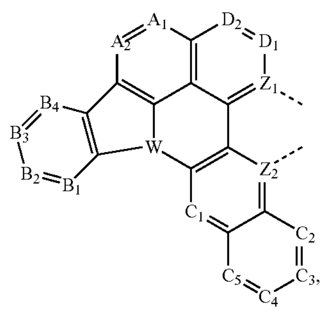
Formula 11
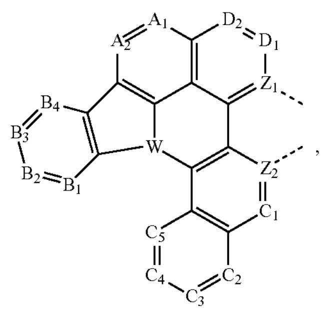
-continued
Formula 12
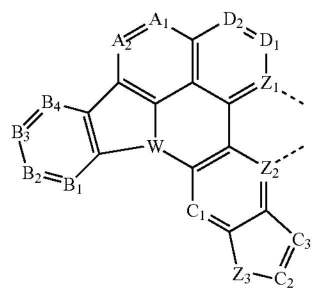
Formula 13
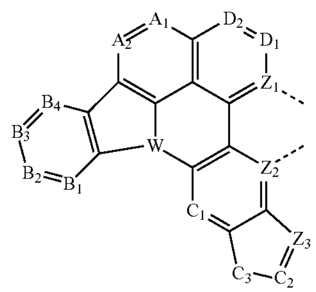
Formula 14
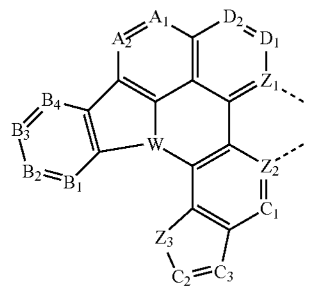
Formula 15
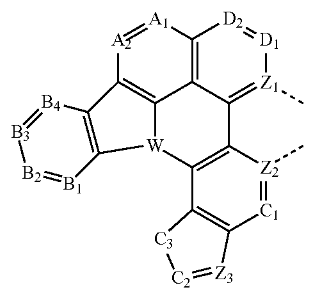
Formula 16
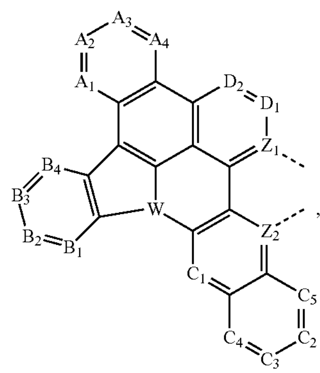

-continued

Formula 17

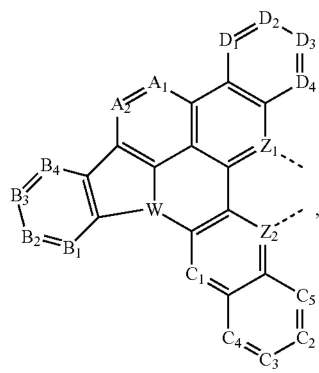

,

Formula 18

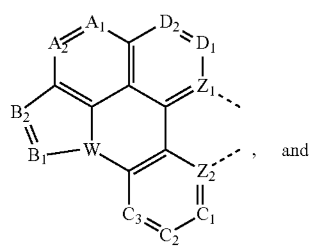

, and

Formula 19

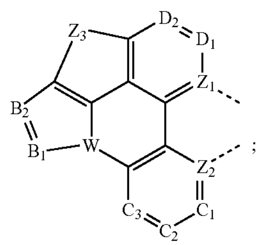

;

wherein $Z_1$ and $Z_2$ are each independently selected from C or N, and $Z_1$ and $Z_2$ are different;

W is, at each occurrence identically or differently, selected from B, N or P;

$A_1$ to $A_4$ are, at each occurrence identically or differently, selected from N or $CR_a$;

$B_1$ to $B_4$ are, at each occurrence identically or differently, selected from N or $CR_b$;

$C_1$ to $C_5$ are, at each occurrence identically or differently, selected from N or $CR_c$;

$D_1$ to $D_4$ are, at each occurrence identically or differently, selected from N or $CR_d$;

$Z_3$ is, at each occurrence identically or differently, selected from O, S, Se, $NR_z$, $CR_zR_z$, $SiR_zR_z$ or $PR_z$; when two $R_z$ are present at the same time, the two $R_z$ are identical or different;

$R_a$, $R_b$, $R_c$, $R_d$, and $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof, adjacent substituents $R_a$, $R_b$, $R_c$, $R_d$, and $R_z$ can be optionally joined to form a ring.

4. The metal complex of claim 3, wherein in Formula 2 to Formula 19, $Z_1$ is N, and $Z_2$ is C.

5. The metal complex of claim 3, wherein in Formula 2 to Formula 19, W is N.

6. The metal complex of claim 3, wherein in Formula 2 to Formula 19, $Z_1$ is N, and $D_1$ and/or $D_2$ are N; or in Formula 2 to Formula 19, $Z_2$ is N, and $C_1$ and/or $C_2$ are N.

7. The metal complex of claim 3, wherein in Formula 2 to Formula 19, $A_1$ to $A_4$ are each independently selected from $CR_a$, $B_1$ to $B_4$ are each independently selected from $CR_b$, $C_1$ to $C_5$ are each independently selected from $CR_c$, and $D_1$ to $D_4$ are each independently selected from $CR_d$; $R_a$, $R_b$, $R_c$, and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_a$, $R_b$, $R_c$, and $R_d$ can be optionally joined to form a ring.

8. The metal complex of claim 3, wherein in Formula 2 and Formula 4 to Formula 18, at least one of $A_1$ to $A_n$ is, at each occurrence identically or differently, selected from $CR_a$, and $A_n$ corresponds to one having a largest serial number among $A_1$ to $A_4$ in Formula 2 and Formula 4 to Formula 18; or in Formula 2 to Formula 19, at least one of $B_1$ to $B_n$ is, at each occurrence identically or differently, selected from $CR_b$, and $B_n$ corresponds to one having a largest serial number among $B_1$ to $B_4$ in any one of Formula 2 to Formula 19; or in Formula 2 to Formula 19, at least one of $C_1$ to $C_n$ is, at each occurrence identically or differently, selected from $CR_c$, and $C_n$ corresponds to one having a largest serial number among $C_1$ to $C_5$ in any one of Formula 2 to Formula 19; or in Formula 2 to Formula 19, at least one of $D_1$ to $D_n$ is, at each occurrence identically or differently, selected from $CR_d$, and $D_n$ corresponds to one having a largest serial number among $D_1$ to $D_4$ in any one of Formula 2 to Formula 19;

$R_a$, $R_b$, $R_c$, and $R_d$ are, at each occurrence identically or differently, selected from the group consisting of: deuterium, halogen, cyano, hydroxyl, sulfanyl, substituted or unsubstituted alkyl having 1 to 20 carbon atoms, substituted or unsubstituted cycloalkyl having 3 to 20 ring carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, and combinations thereof, adjacent substituents $R_a$, $R_b$, $R_c$, and $R_d$ can be optionally joined to form a ring.

9. The metal complex of claim 1, wherein $L_a$ is, at each occurrence identically or differently, selected from the group consisting of the following:

$L_{a1}$

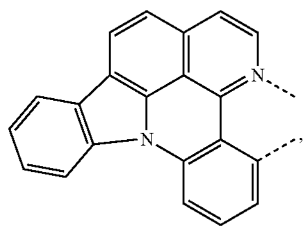

$L_{a2}$

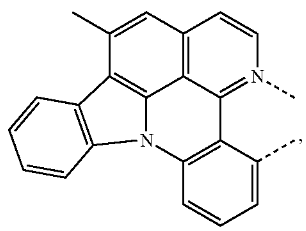

-continued $L_{a3}$

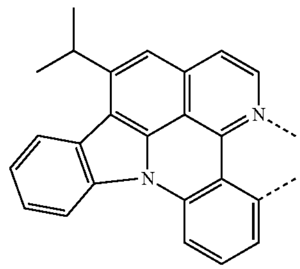

$L_{a4}$

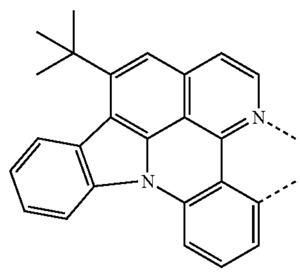

$L_{a5}$

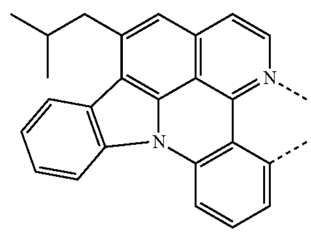

$L_{a6}$

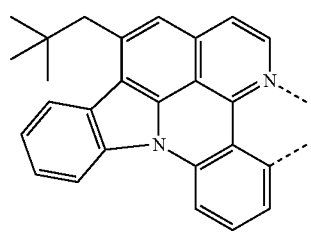

$L_{a7}$

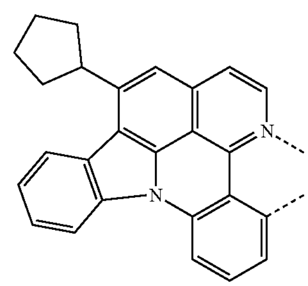

$L_{a8}$

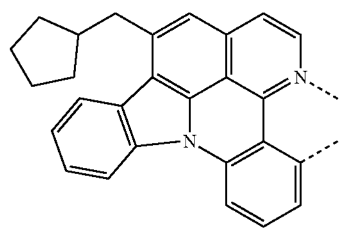

-continued
$L_{a9}$
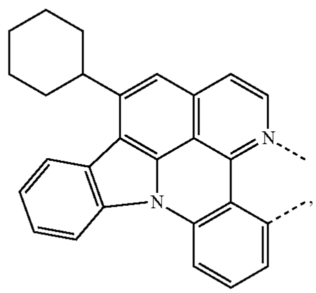
$L_{a10}$
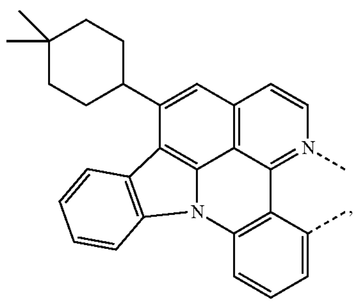
$L_{a11}$
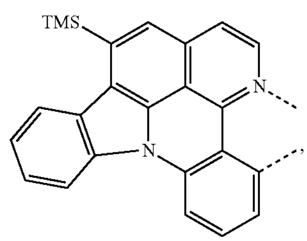
$L_{a12}$
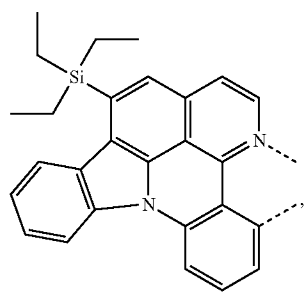
$L_{a13}$
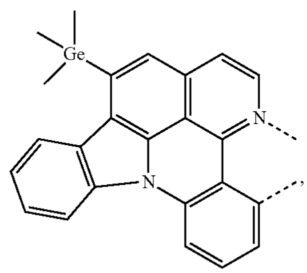
-continued
$L_{a13}$
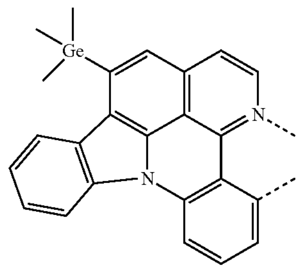
$L_{a15}$
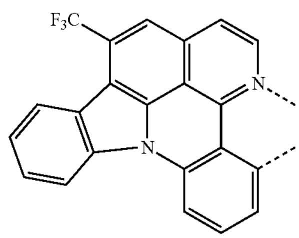
$L_{a16}$
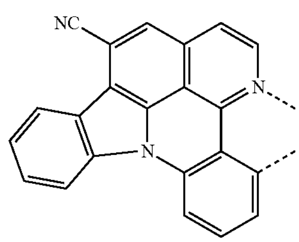
$L_{a17}$
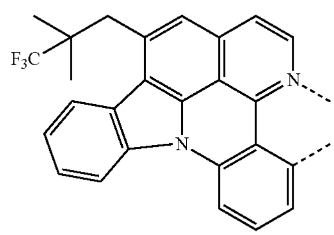
$L_{a18}$
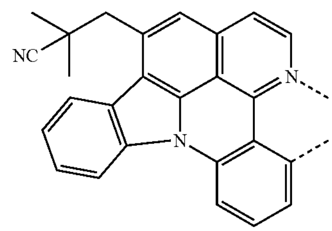
$L_{a19}$
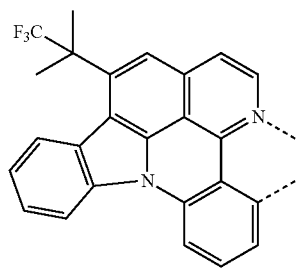

-continued
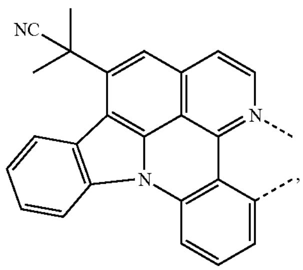
$L_{a20}$
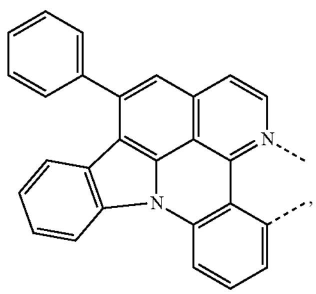
$L_{a21}$
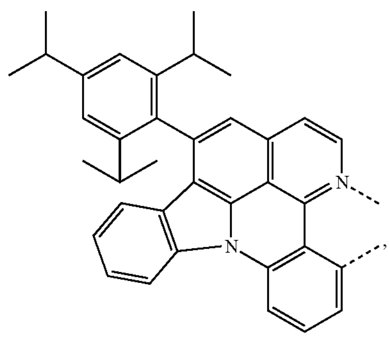
$L_{a22}$
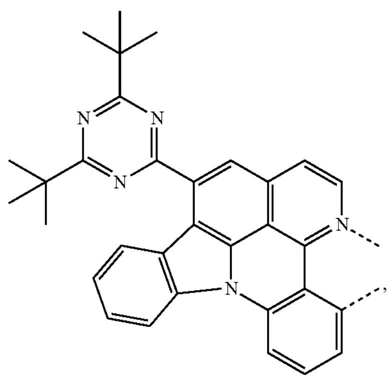
$L_{a23}$
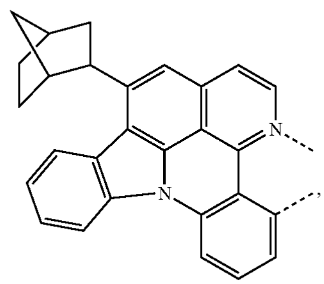
$L_{a24}$
-continued
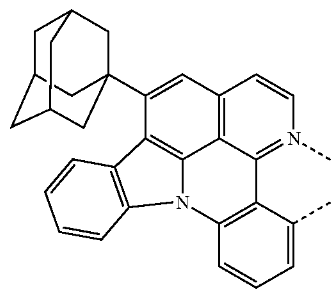
$L_{a25}$
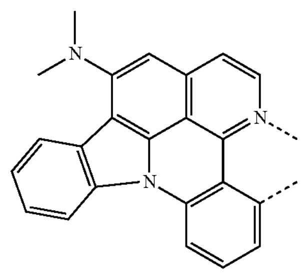
$L_{a26}$
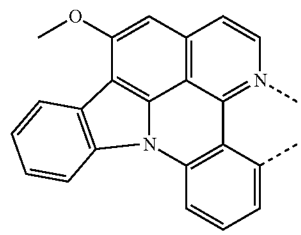
$L_{a27}$
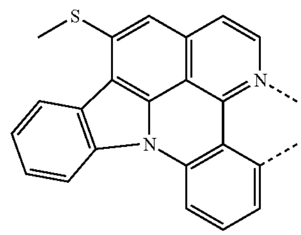
$L_{a28}$
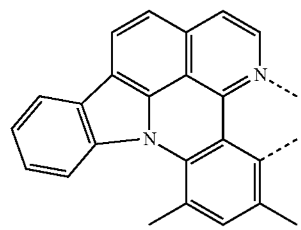
$L_{a29}$
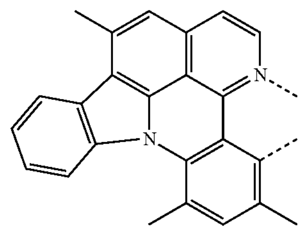
$L_{a30}$ -continued
$L_{a31}$
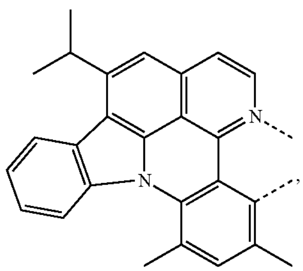
$L_{a32}$
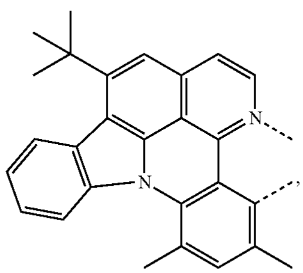
$L_{a33}$
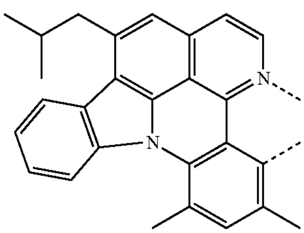
$L_{a34}$
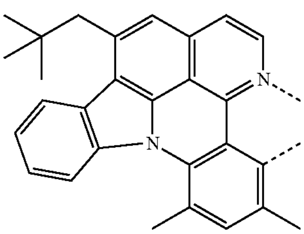
$L_{a35}$
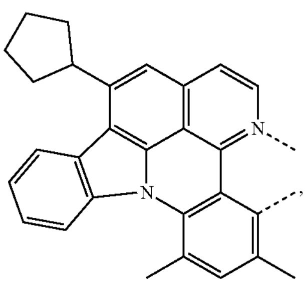
$L_{a36}$
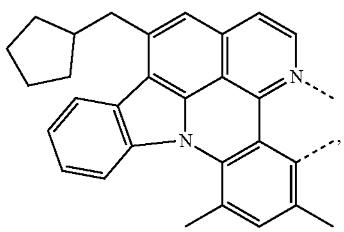
-continued
$L_{a37}$
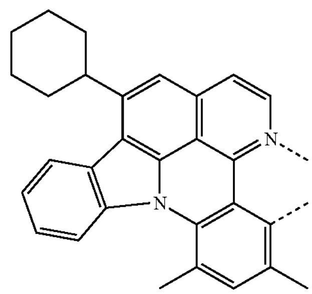
$L_{a38}$
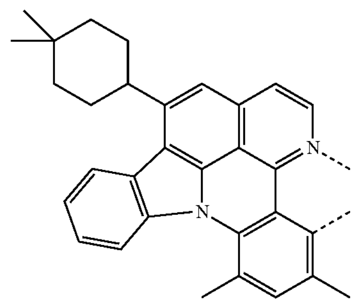
$L_{a39}$
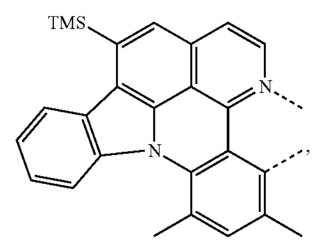
$L_{a40}$
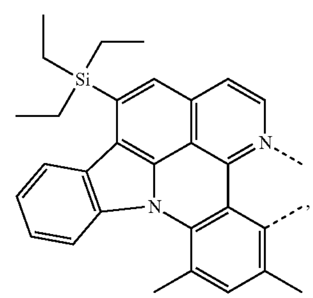
$L_{a41}$
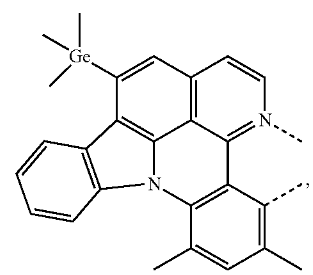

$L_{a42}$
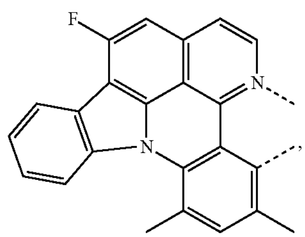
$L_{a43}$
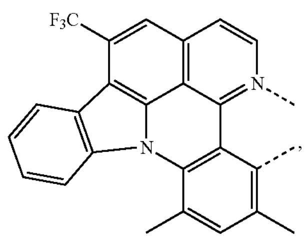
$L_{a44}$
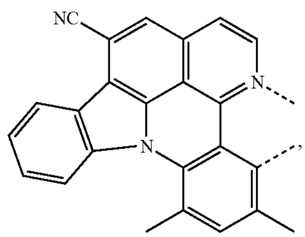
$L_{a45}$
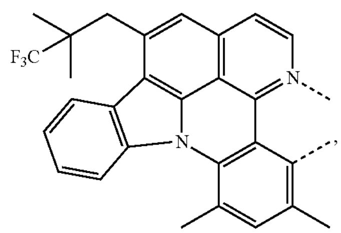
$L_{a46}$
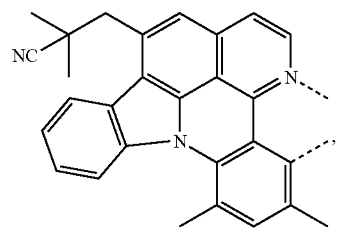
$L_{a47}$
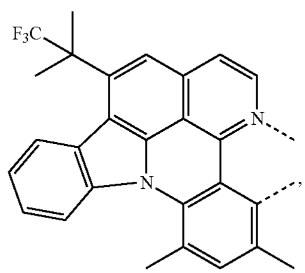
$L_{a48}$
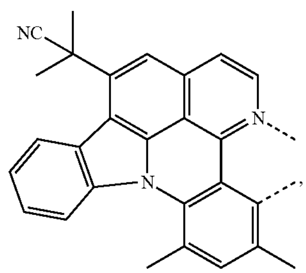
$L_{a49}$
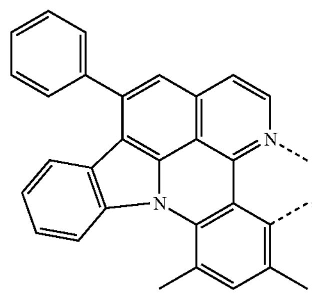
$L_{a50}$
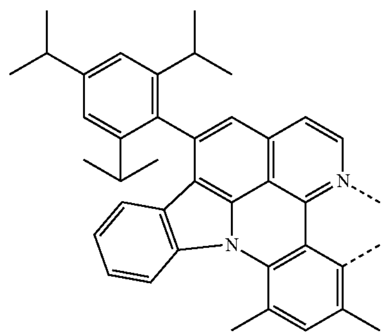
$L_{a51}$
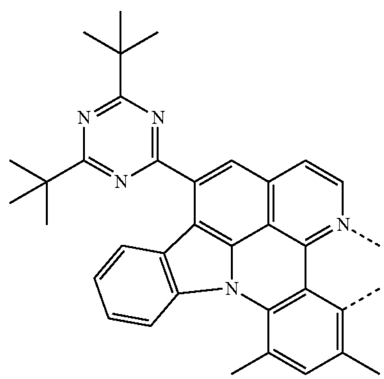
$L_{a52}$
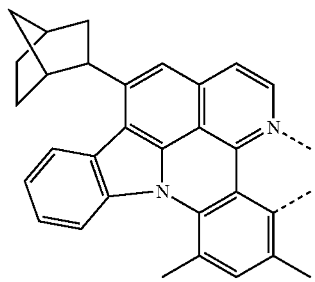

-continued
$L_{a53}$
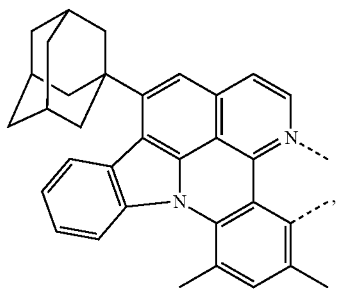
$L_{a54}$
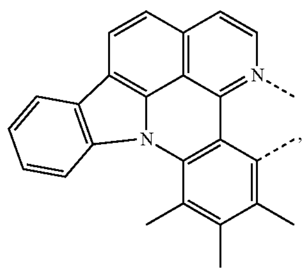
$L_{a55}$
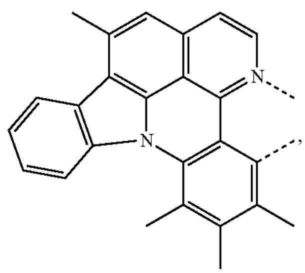
$L_{a56}$
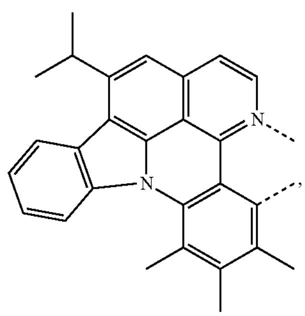
$L_{a57}$
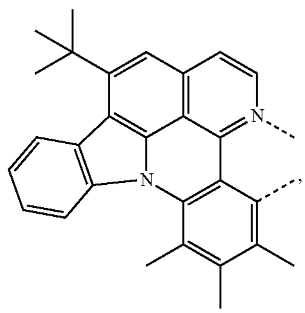
-continued
$L_{a58}$
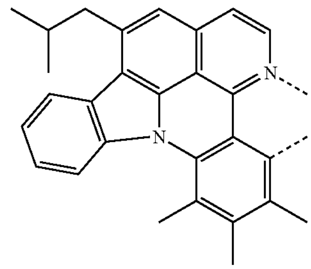
$L_{a59}$
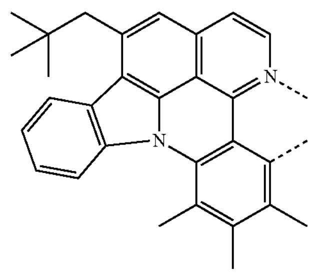
$L_{a60}$
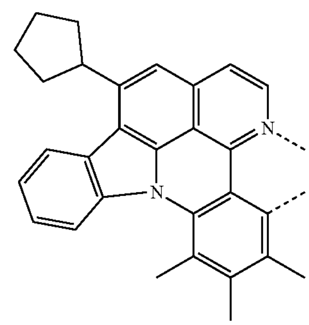
$L_{a61}$
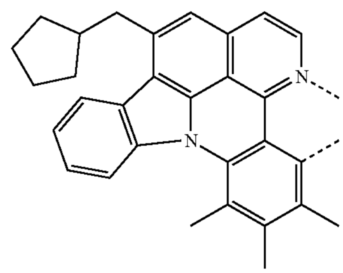
$L_{a62}$
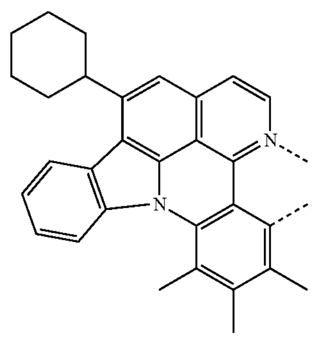

-continued
$L_{a63}$
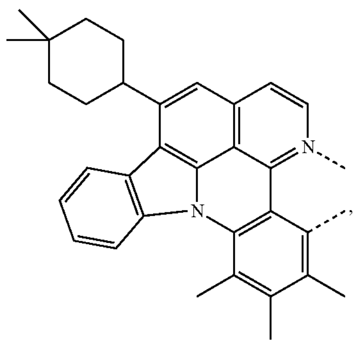
$L_{a64}$
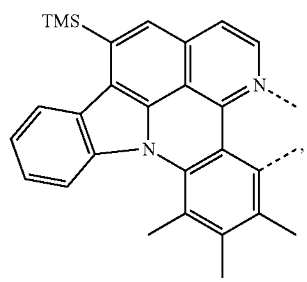
$L_{a65}$
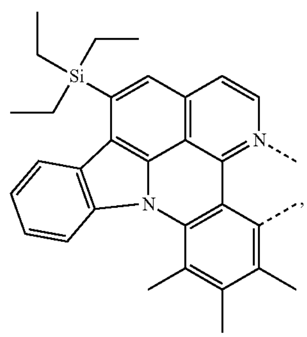
$L_{a66}$
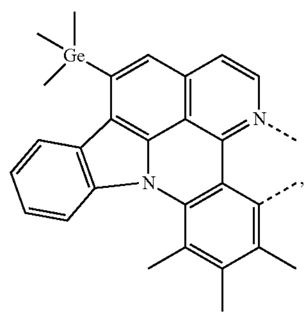
$L_{a67}$
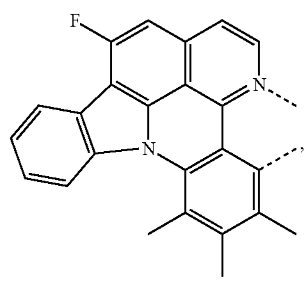
-continued
$L_{a68}$
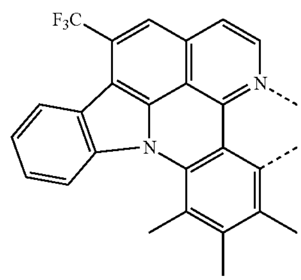
$L_{a69}$
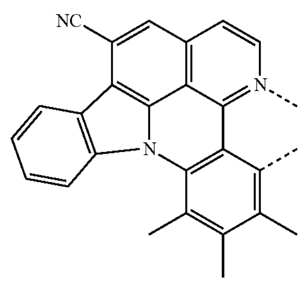
$L_{a70}$
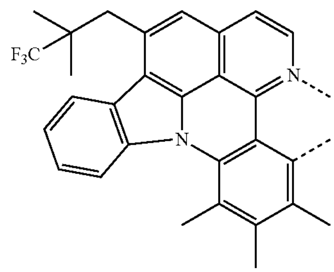
$L_{a71}$
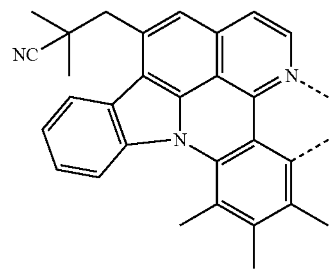
$L_{a72}$
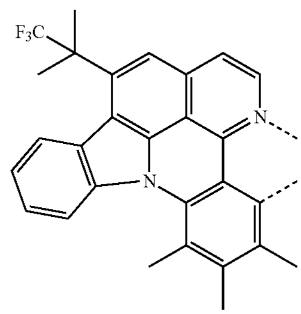

$L_{a73}$
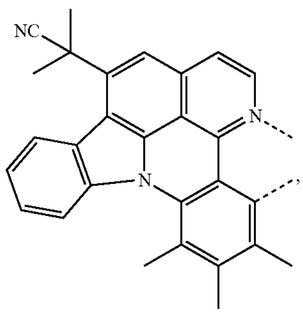
$L_{a74}$
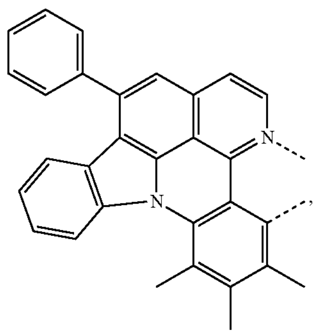
$L_{a75}$
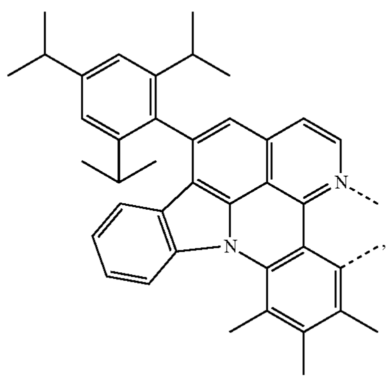
$L_{a76}$
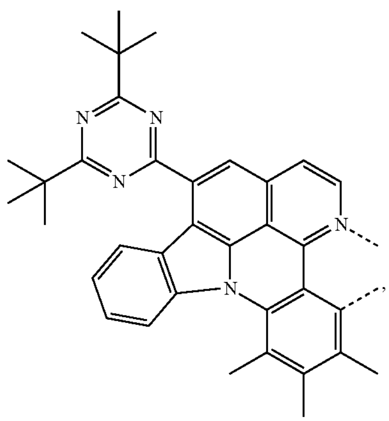
$L_{a77}$
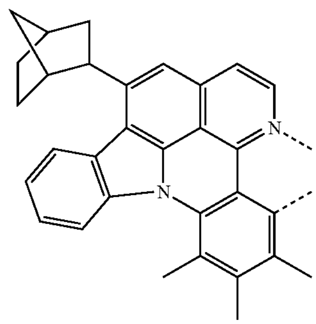
$L_{a78}$
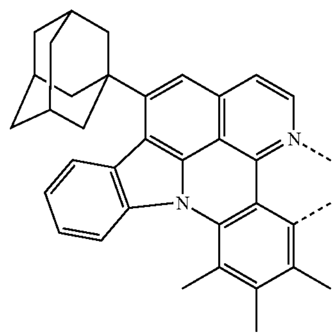
$L_{a79}$
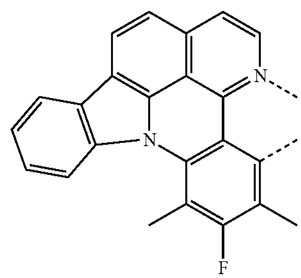
$L_{a80}$
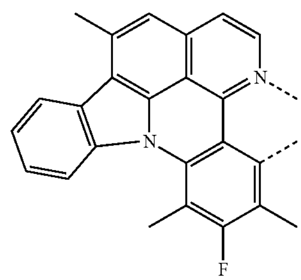
$L_{a81}$
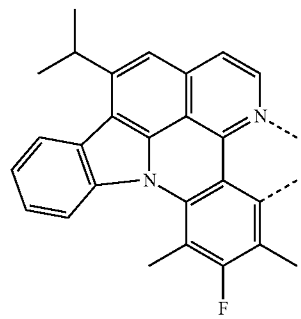

$L_{a82}$
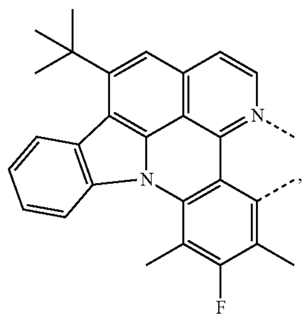
$L_{a83}$
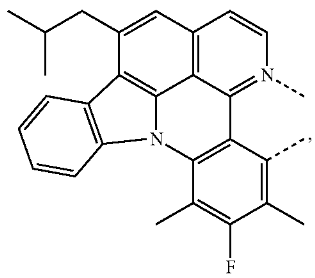
$L_{a84}$
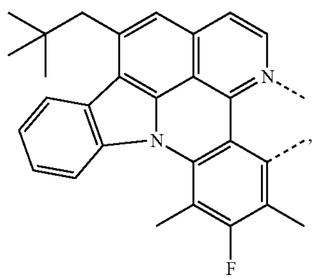
$L_{a85}$
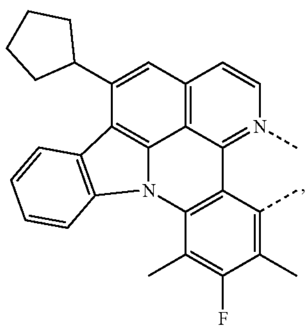
$L_{a86}$
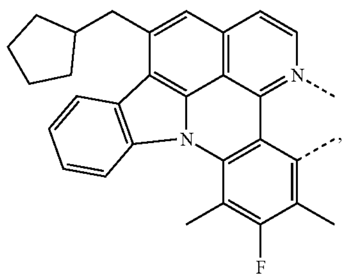
$L_{a87}$
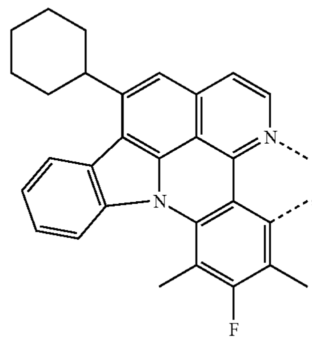
$L_{a88}$
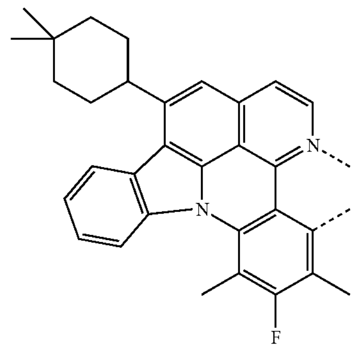
$L_{a89}$
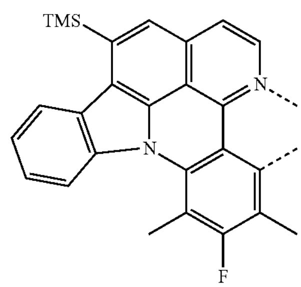
$L_{a90}$
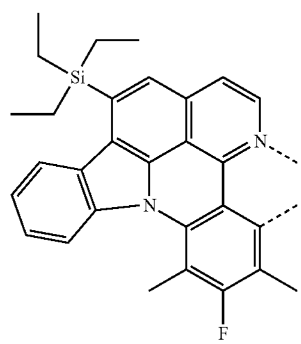
$L_{a91}$
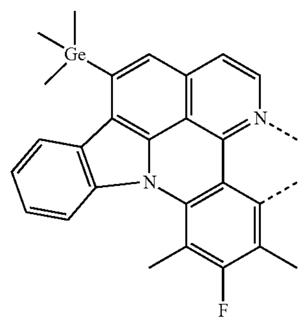

-continued
$L_{a92}$
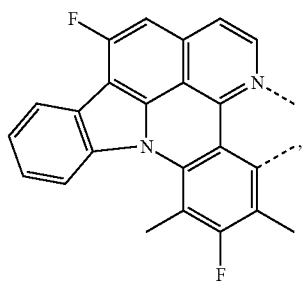
$L_{a93}$
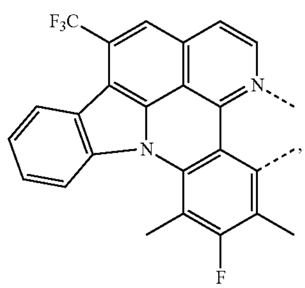
$L_{a94}$
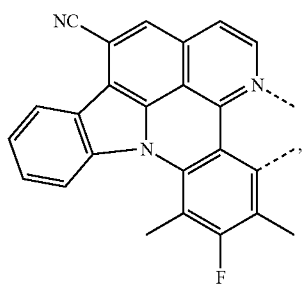
$L_{a95}$
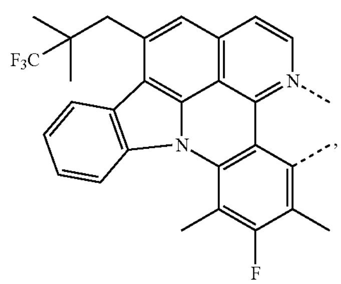
$L_{a96}$
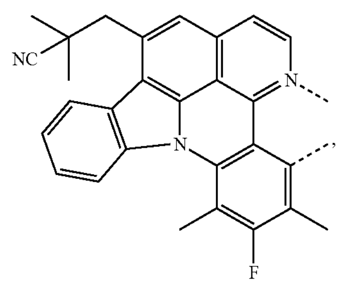
-continued
$L_{a97}$
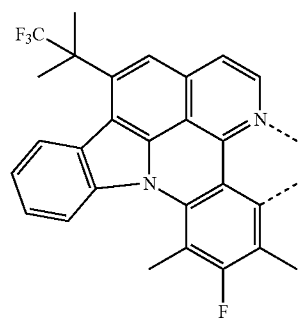
$L_{a98}$
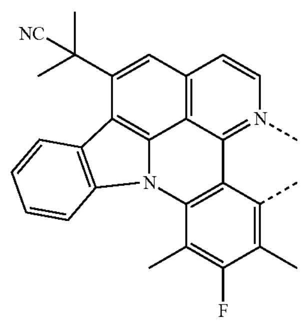
$L_{a99}$
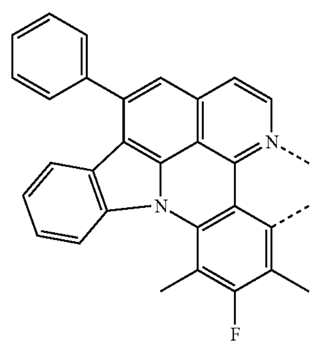
$L_{a100}$
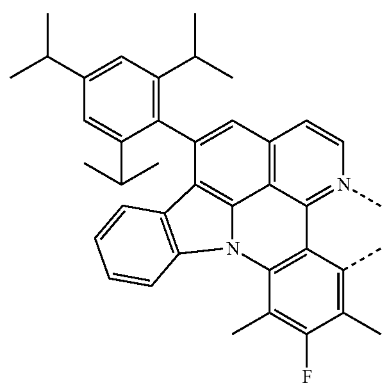

-continued
$L_{a101}$
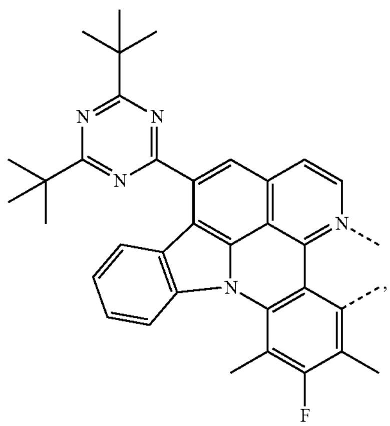
$L_{a102}$
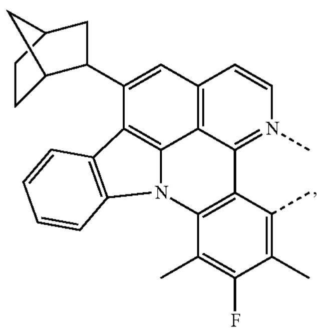
$L_{a103}$
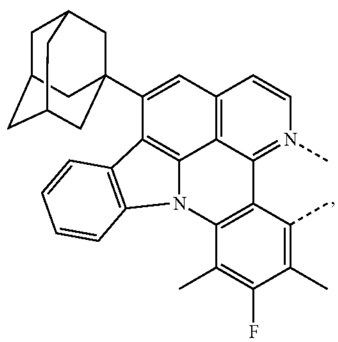
$L_{a104}$
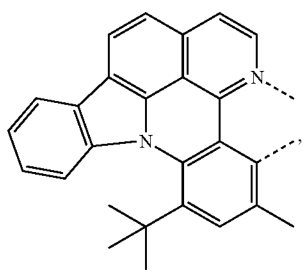
-continued
$L_{a105}$
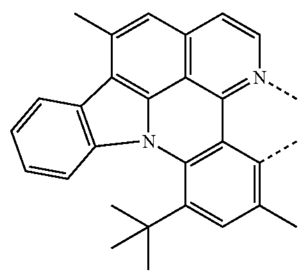
$L_{a106}$
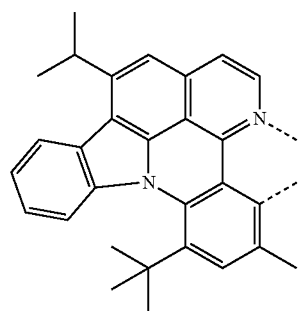
$L_{a107}$
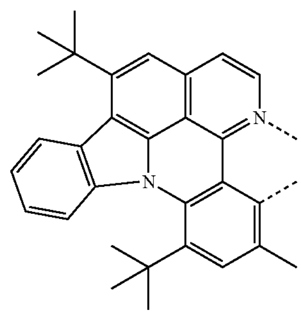
$L_{a108}$
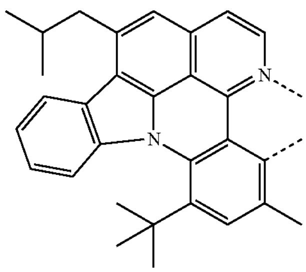
$L_{a109}$
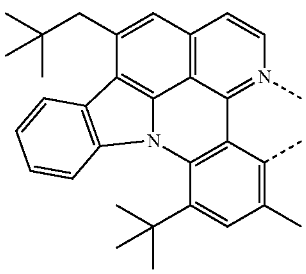

-continued
$L_{a110}$
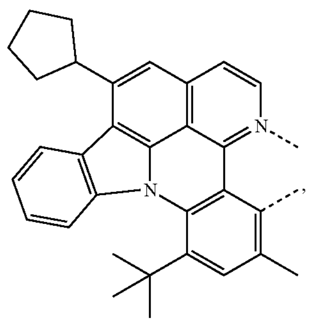
$L_{a111}$
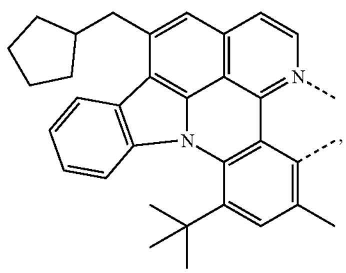
$L_{a112}$
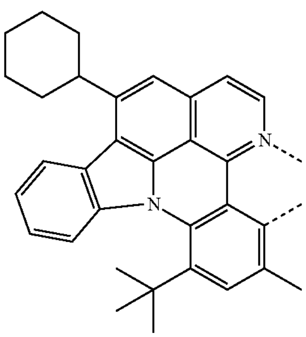
$L_{a113}$
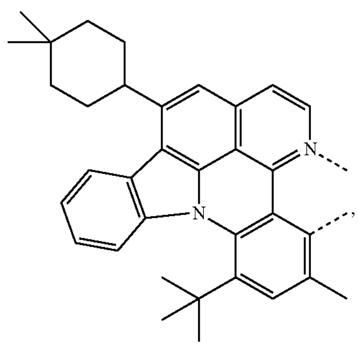
$L_{a114}$
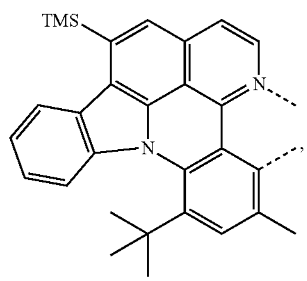
-continued
$L_{a115}$
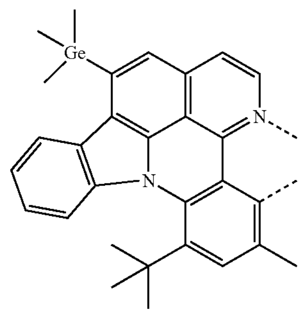
$L_{a116}$
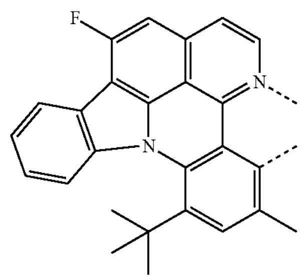
$L_{a117}$
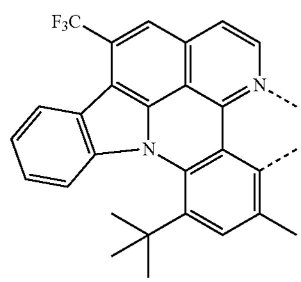
$L_{a118}$
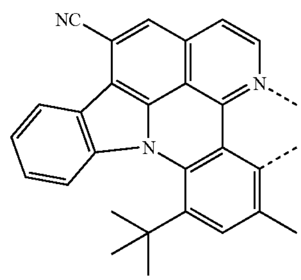
$L_{a119}$
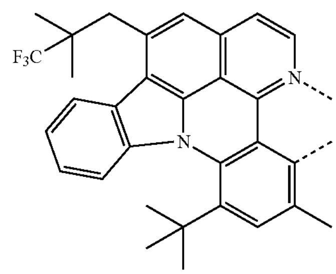

-continued
$L_{a120}$
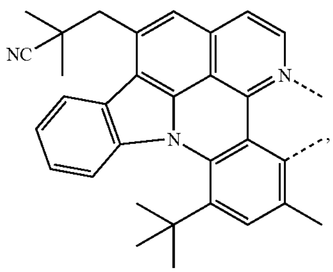
$L_{a121}$
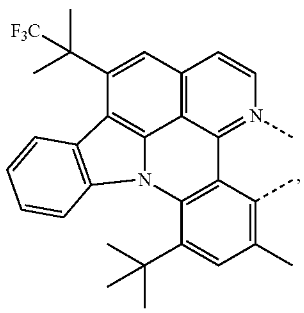
$L_{a122}$
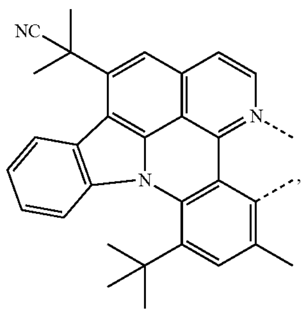
$L_{a123}$
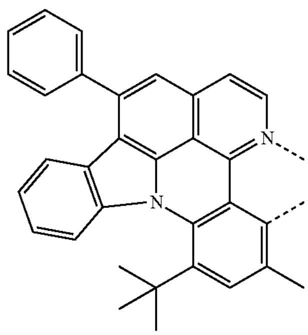
$L_{a124}$
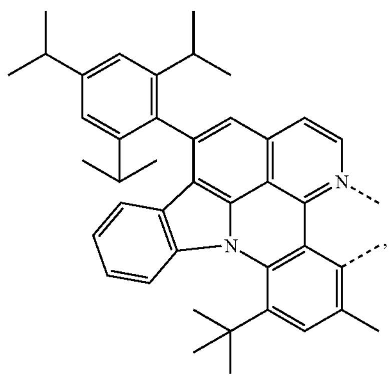
-continued
$L_{a125}$
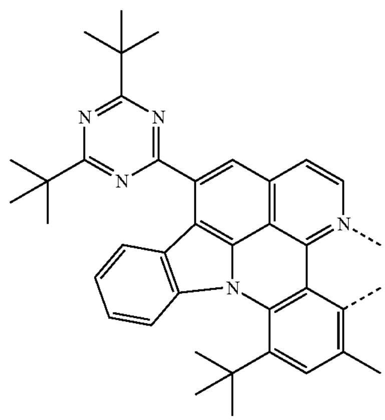
$L_{a126}$
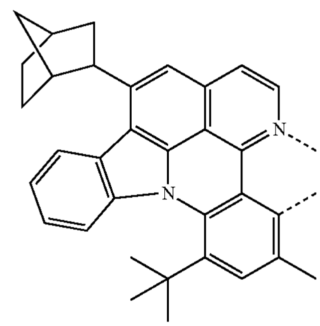
$L_{a127}$
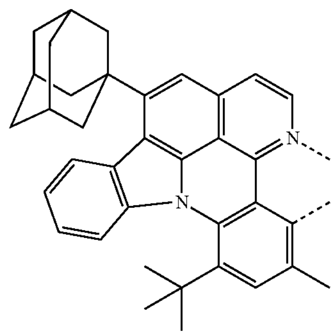
$L_{a128}$
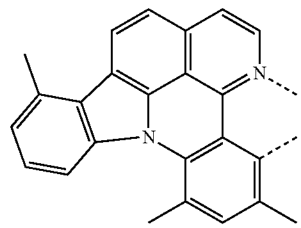
$L_{a129}$
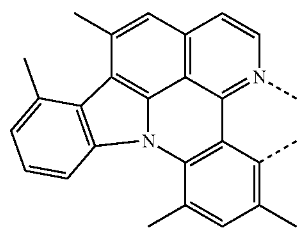

-continued
$L_{a130}$
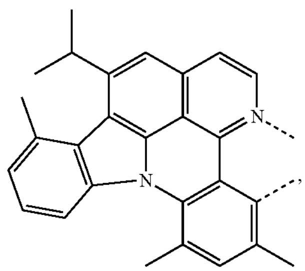
$L_{a131}$
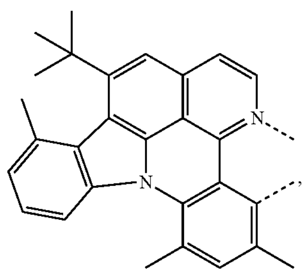
$L_{a132}$
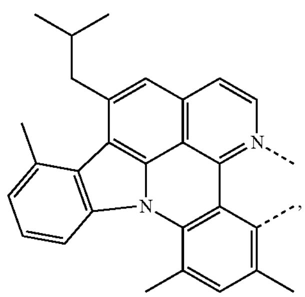
$L_{a133}$
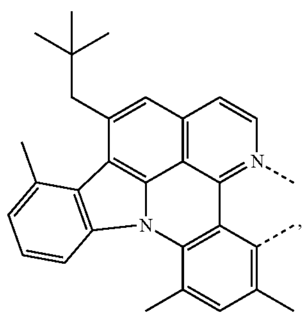
$L_{a134}$
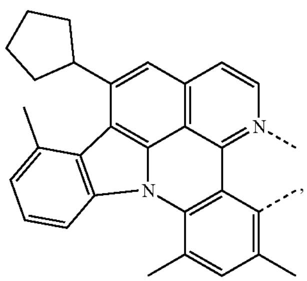
-continued
$L_{a135}$
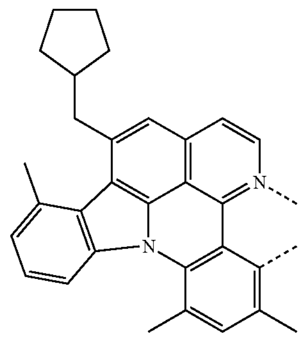
$L_{a136}$
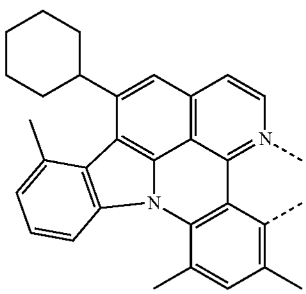
$L_{a137}$
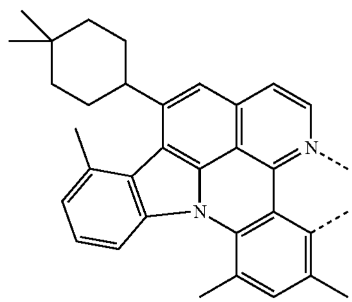
$L_{a138}$
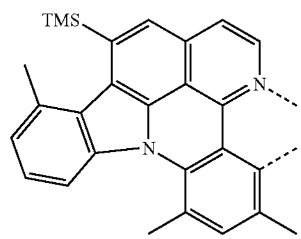
$L_{a139}$
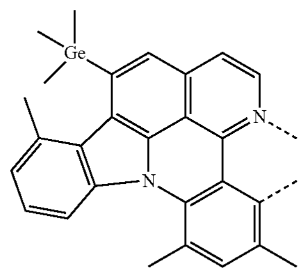

$L_{a140}$
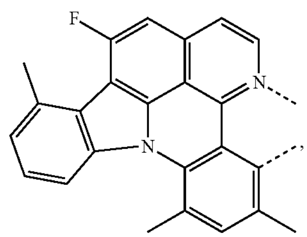
$L_{a141}$
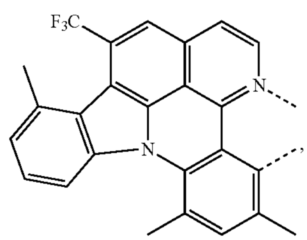
$L_{a142}$
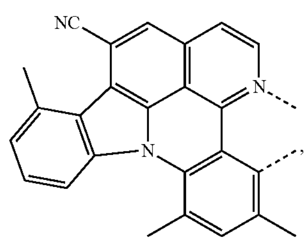
$L_{a143}$
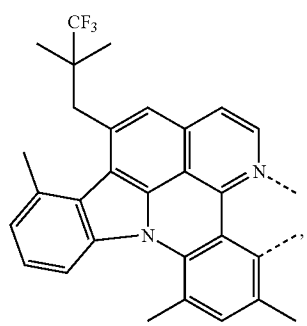
$L_{a144}$
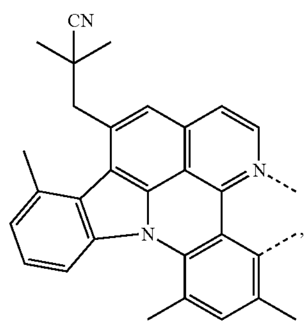
$L_{a145}$
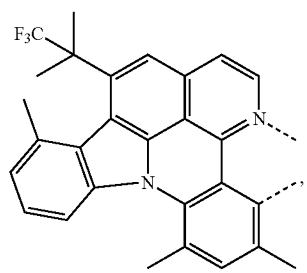
$L_{a146}$
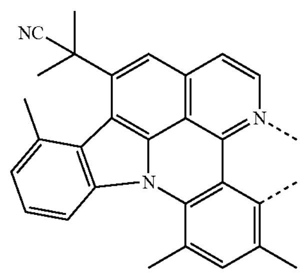
$L_{a147}$
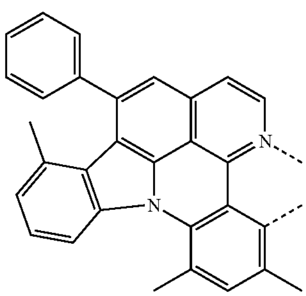
$L_{a148}$
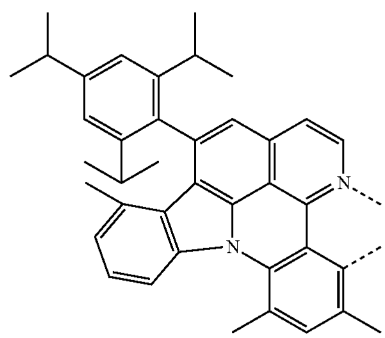
$L_{a149}$
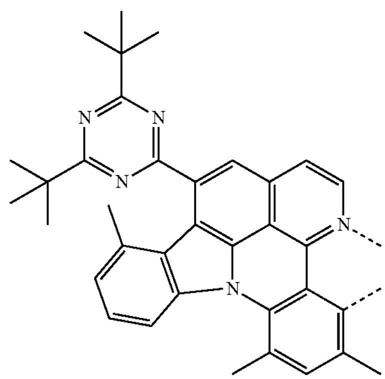
$L_{a150}$
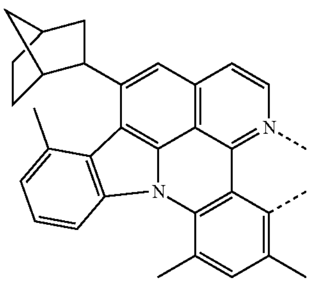

-continued
$L_{a151}$
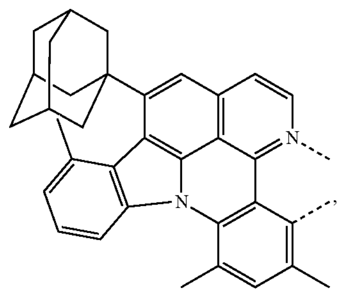
$L_{a152}$
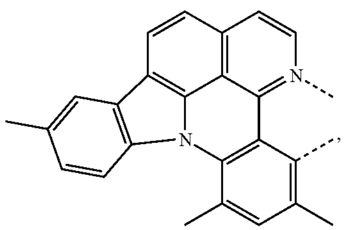
$L_{a153}$
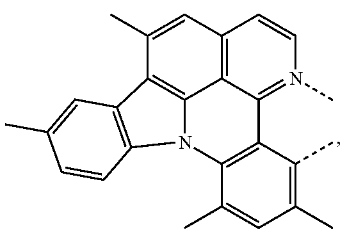
$L_{a154}$
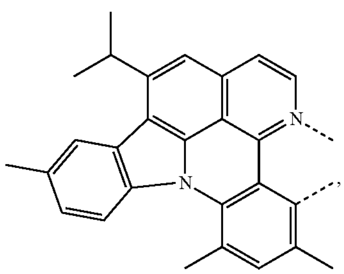
$L_{a155}$
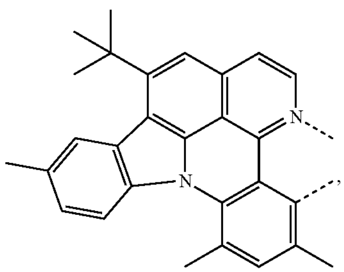
$L_{a156}$
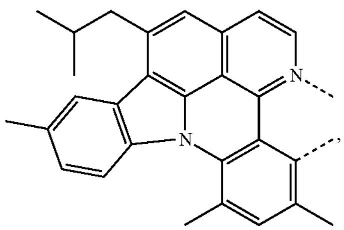
-continued
$L_{a157}$
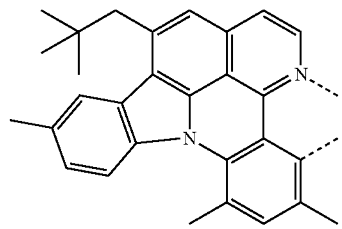
$L_{a158}$
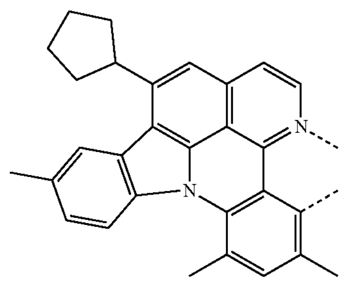
$L_{a159}$
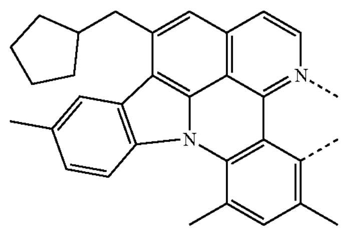
$L_{a160}$
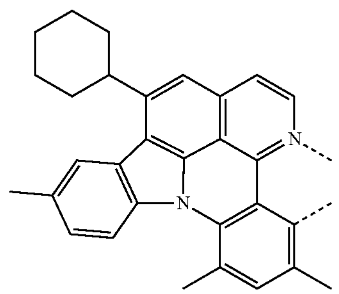
$L_{a161}$
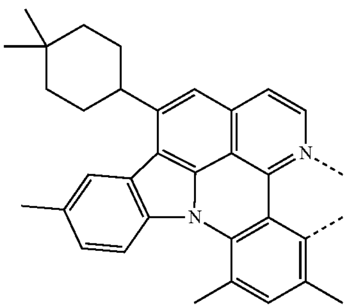

-continued
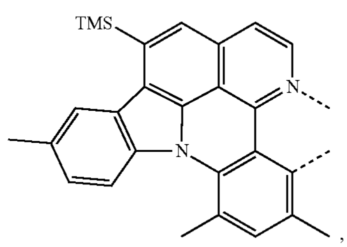
$L_{a162}$
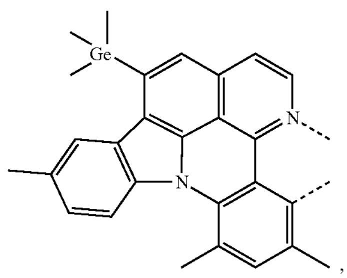
$L_{a163}$
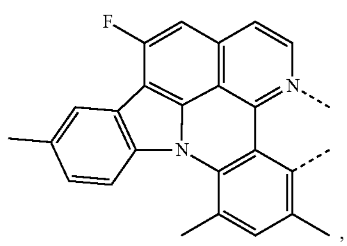
$L_{a164}$
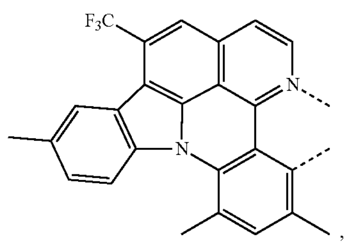
$L_{a165}$
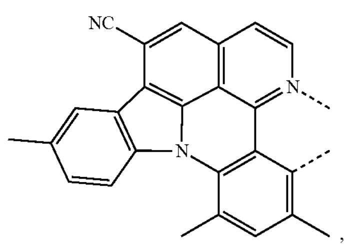
$L_{a166}$
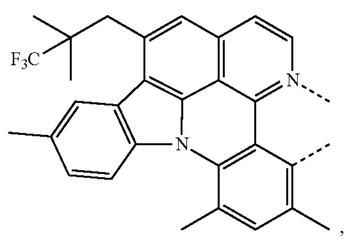
$L_{a167}$
-continued
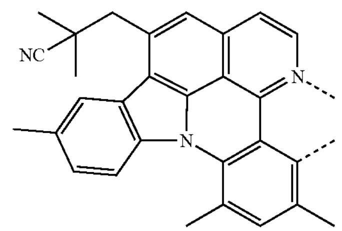
$L_{a168}$
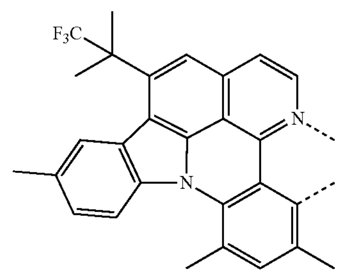
$L_{a169}$
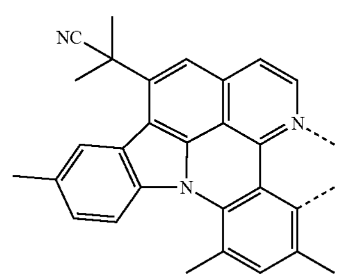
$L_{a170}$
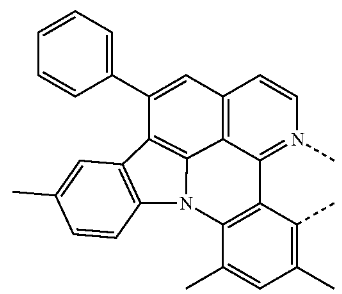
$L_{a171}$
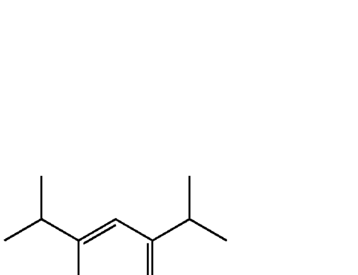
$L_{a172}$
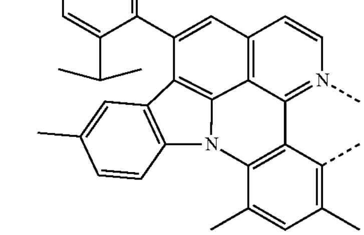

-continued
$L_{a173}$
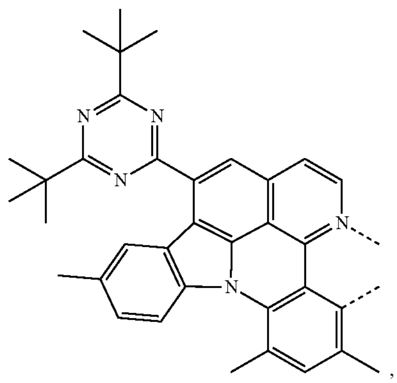
$L_{a174}$
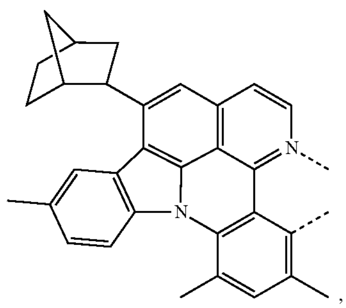
$L_{a175}$
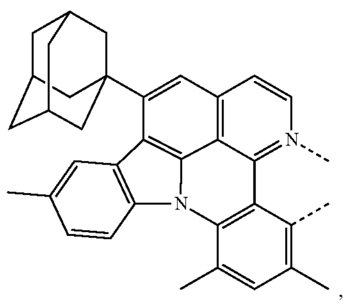
$L_{a176}$
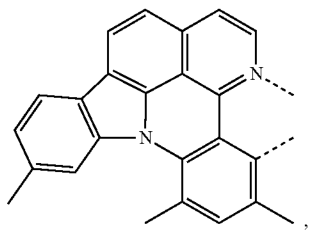
$L_{a177}$
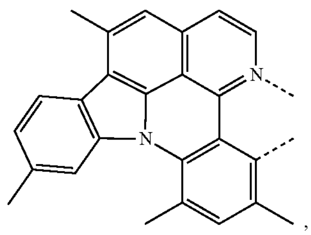
-continued
$L_{a178}$
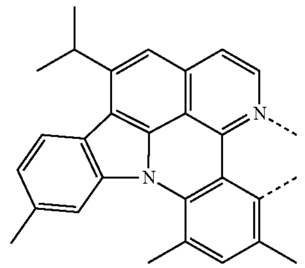
$L_{a179}$
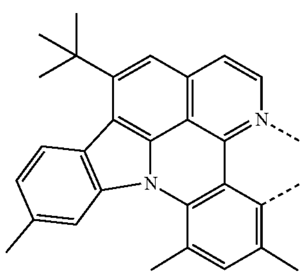
$L_{a180}$
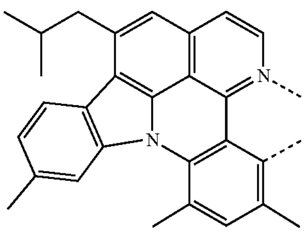
$L_{a181}$
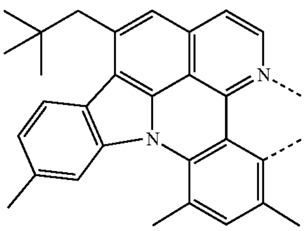
$L_{a182}$
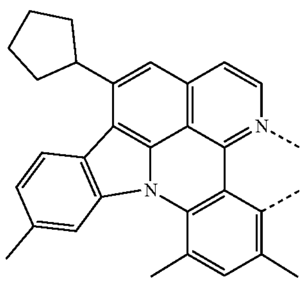
$L_{a183}$
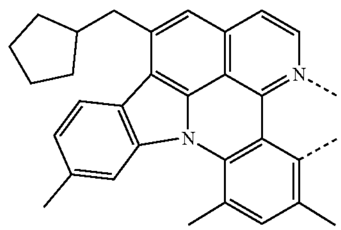

-continued
$L_{a184}$
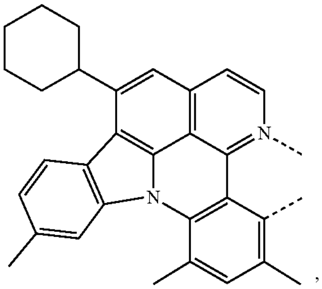
$L_{a185}$
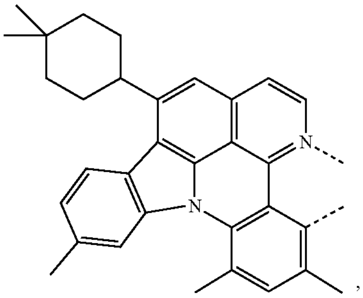
$L_{a186}$
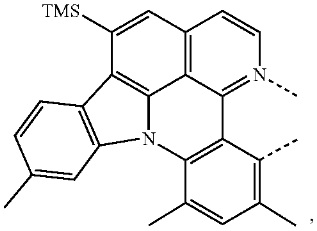
$L_{a187}$
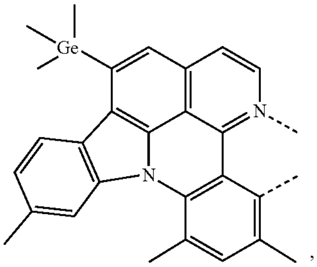
$L_{a188}$
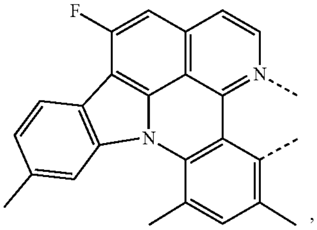
$L_{a189}$
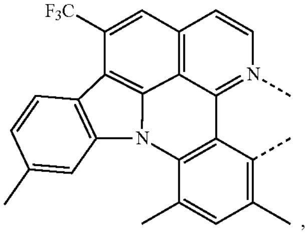
-continued
$L_{a190}$
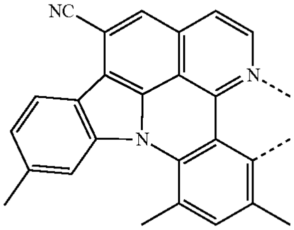
$L_{a191}$
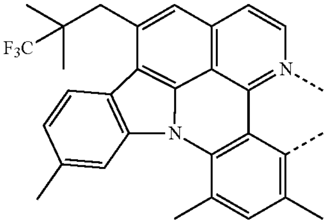
$L_{a192}$
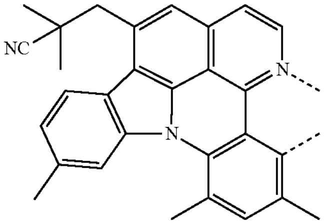
$L_{a193}$
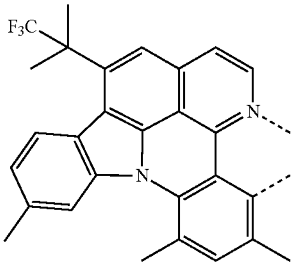
$L_{a194}$
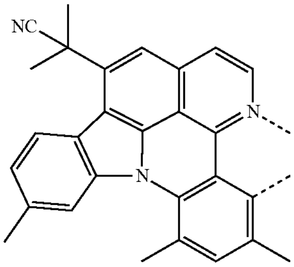
$L_{a195}$
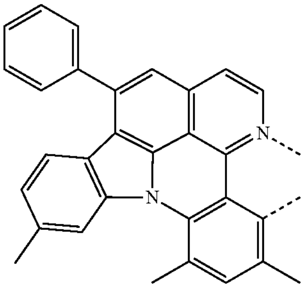

-continued
$L_{a196}$
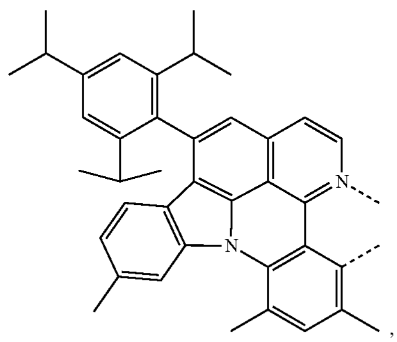
,
$L_{a197}$
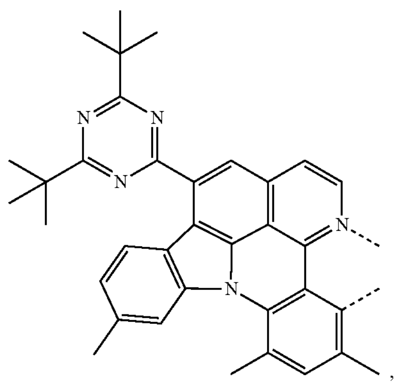
,
$L_{a198}$
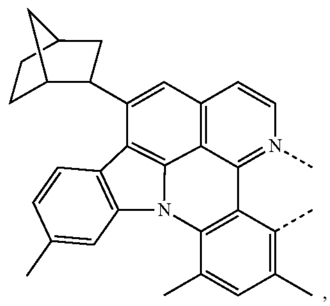
,
$L_{a199}$
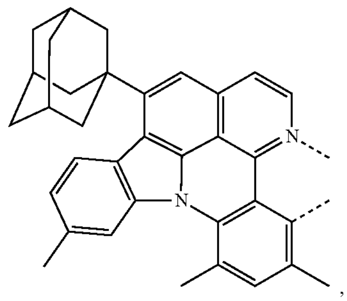
,
$L_{a200}$
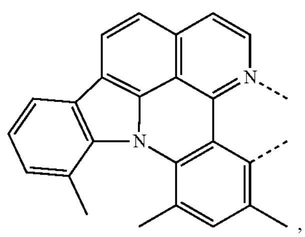
,
-continued
$L_{a201}$
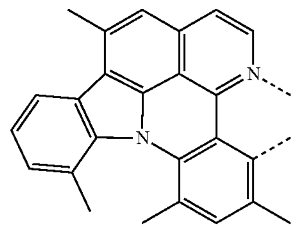
,
$L_{a202}$
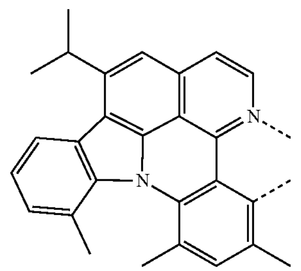
,
$L_{a203}$
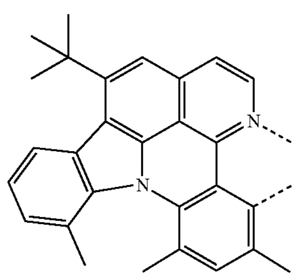
,
$L_{a204}$
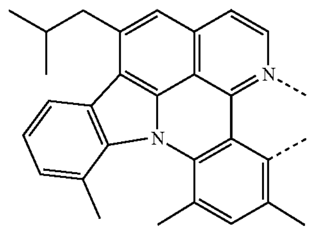
,
$L_{a205}$
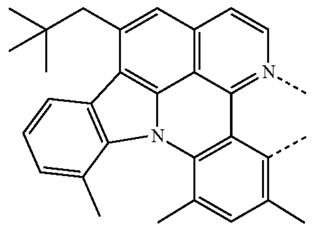
,
$L_{a206}$
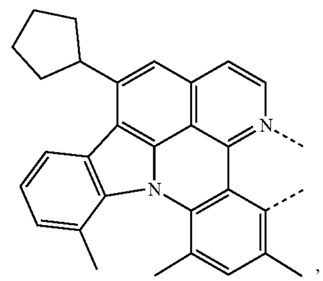
, -continued
$L_{a207}$
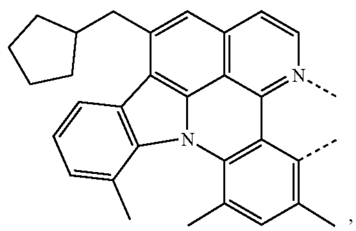
$L_{a208}$
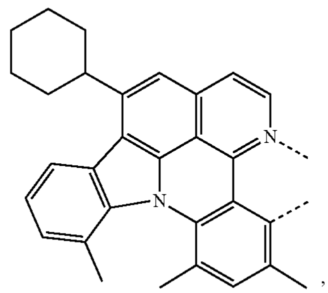
$L_{a209}$
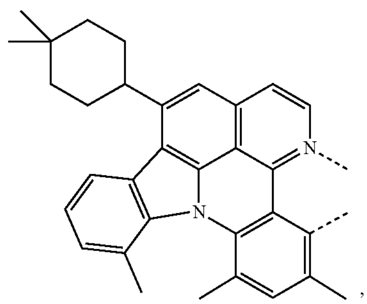
$L_{a210}$
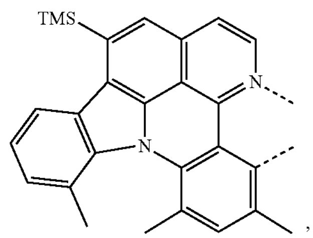
$L_{a211}$
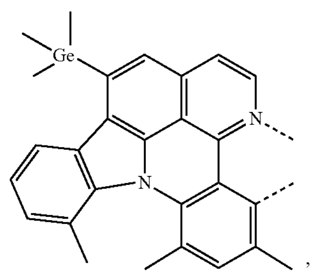
$L_{a212}$
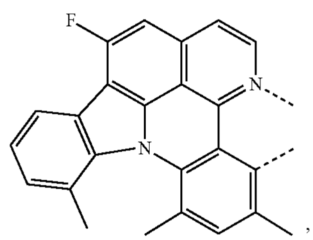
-continued
$L_{a213}$
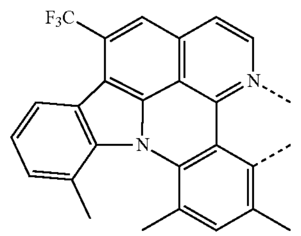
$L_{a214}$
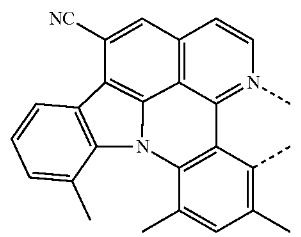
$L_{a215}$
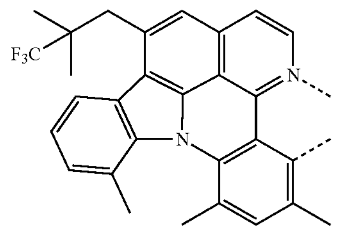
$L_{a216}$
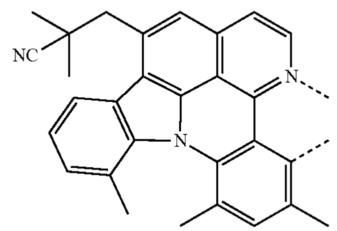
$L_{a217}$
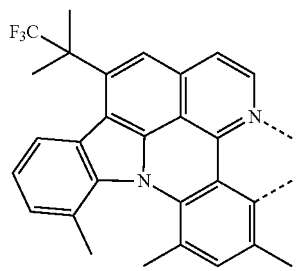
$L_{a218}$
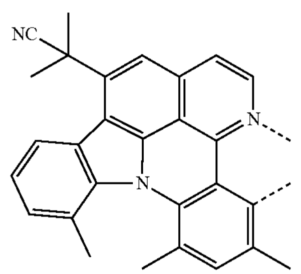

-continued
$L_{a219}$
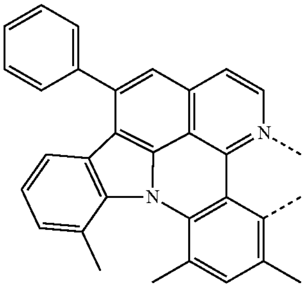
,
$L_{a220}$
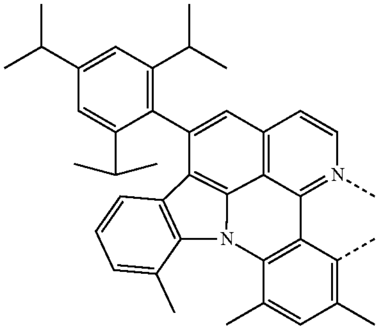
,
$L_{a221}$
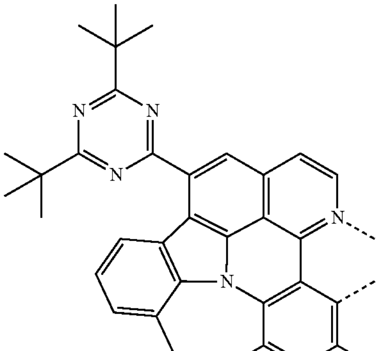
,
$L_{a222}$
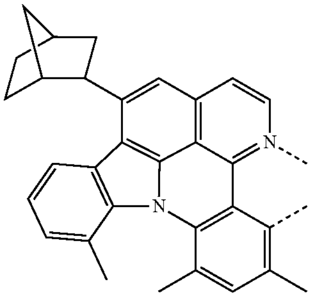
,
-continued
$L_{a223}$
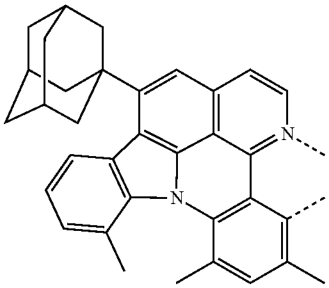
,
$L_{a224}$
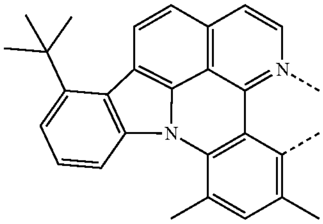
,
$L_{a225}$
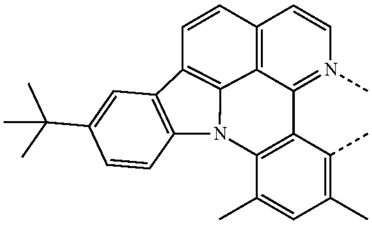
,
$L_{a226}$
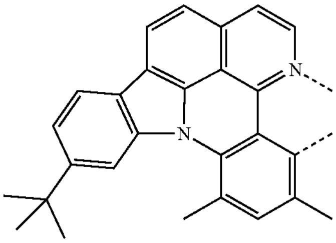
,
$L_{a227}$
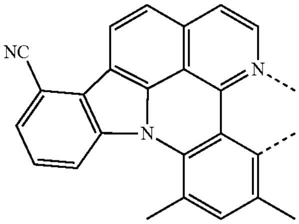
,
$L_{a228}$
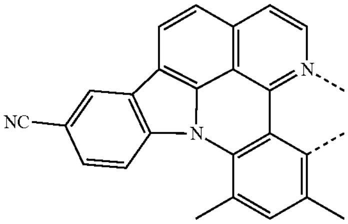
, -continued
$L_{a229}$
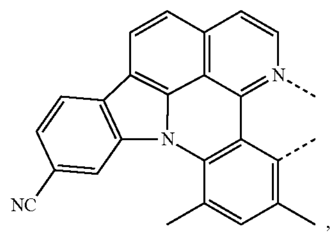
,
$L_{a230}$
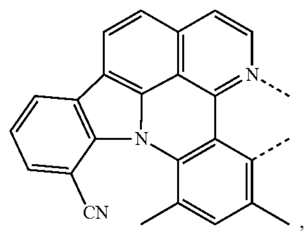
,
$L_{a231}$
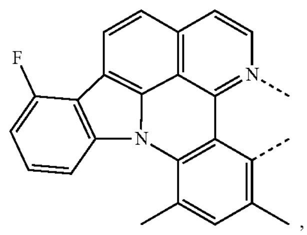
,
$L_{a232}$
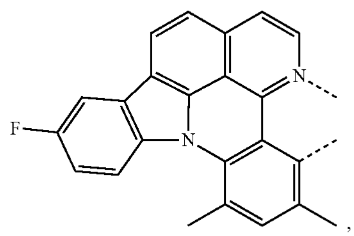
,
$L_{a233}$
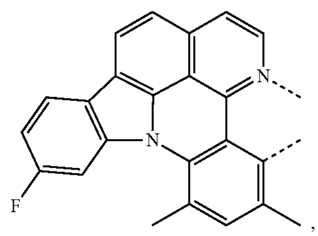
,
$L_{a234}$
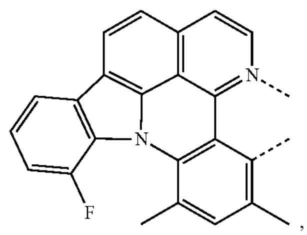
,
-continued
$L_{a235}$
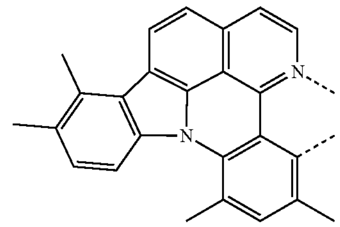
,
$L_{a236}$
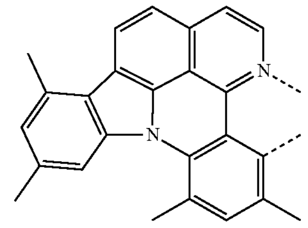
,
$L_{a237}$
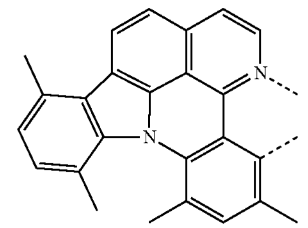
,
$L_{a238}$
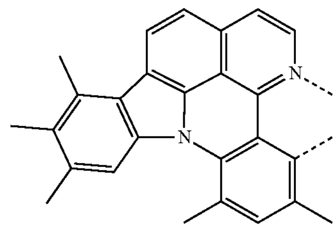
,
$L_{a239}$
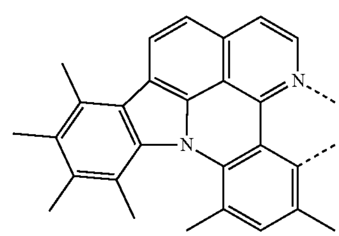
,
$L_{a240}$
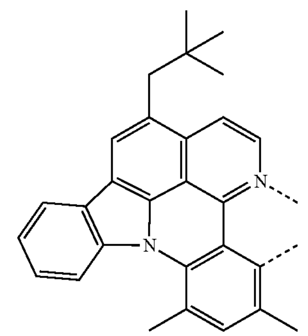
, -continued
$L_{a241}$
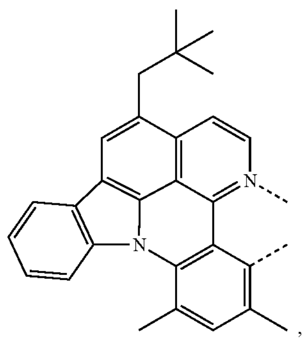
$L_{a242}$
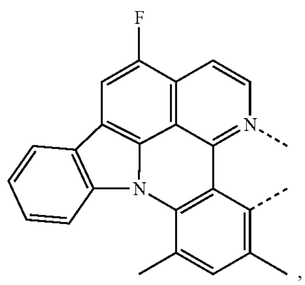
$L_{a243}$
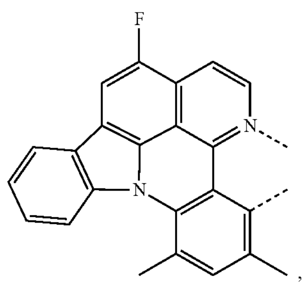
$L_{a244}$
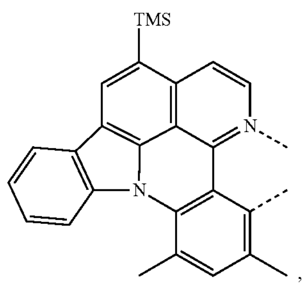
$L_{a245}$
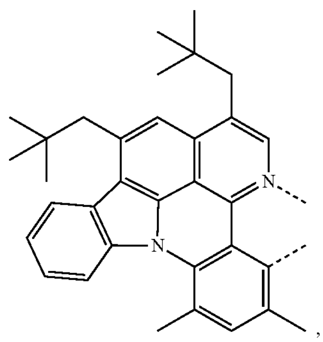
-continued
$L_{a246}$
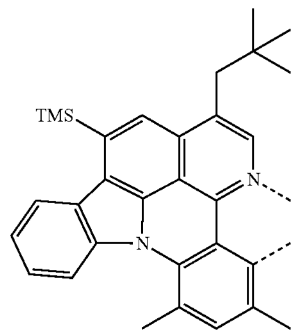
$L_{a247}$
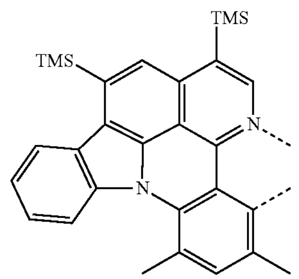
$L_{a248}$
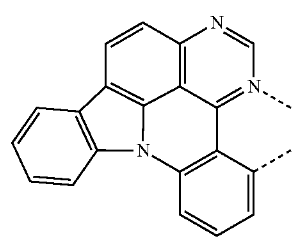
$L_{a249}$
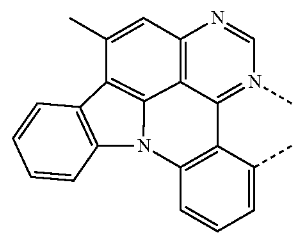
$L_{a250}$
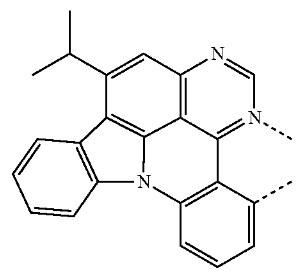

-continued
$L_{a251}$
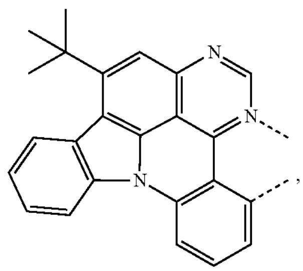
$L_{a252}$
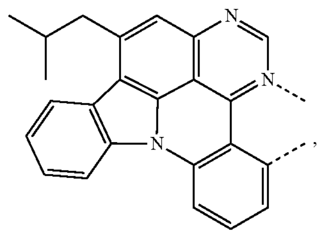
$L_{a253}$
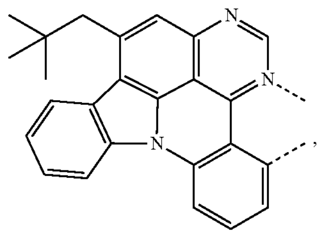
$L_{a254}$
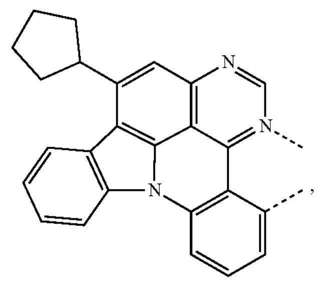
$L_{a255}$
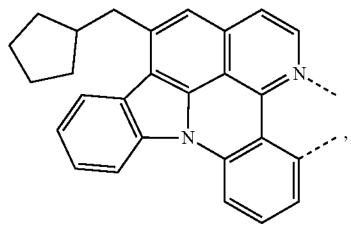
$L_{a256}$
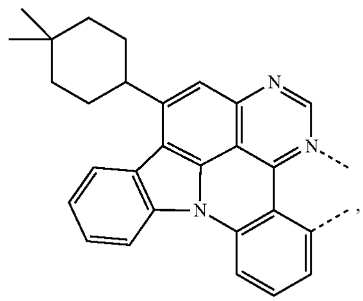
-continued
$L_{a257}$
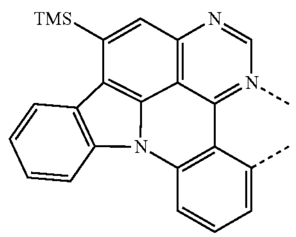
$L_{a258}$
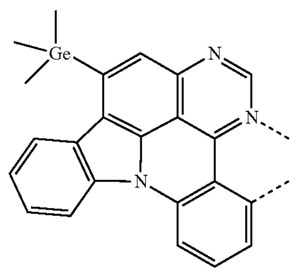
$L_{a259}$
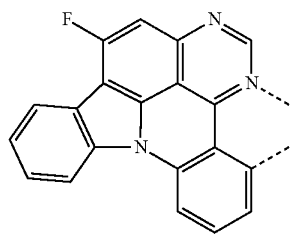
$L_{a260}$
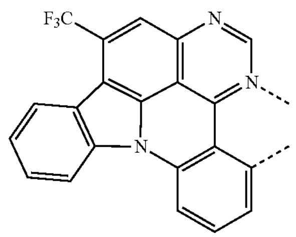
$L_{a261}$
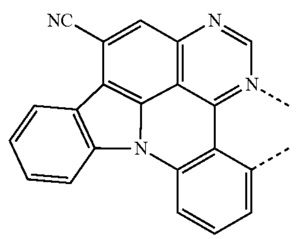
$L_{a262}$
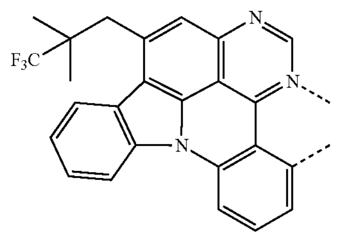

-continued
$L_{a263}$
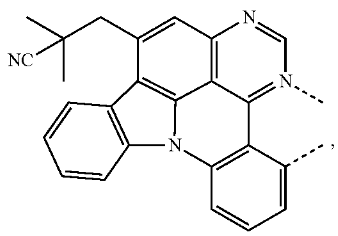
,
$L_{a264}$
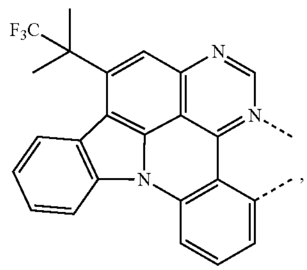
,
$L_{a265}$
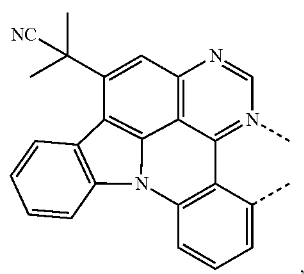
,
$L_{a266}$
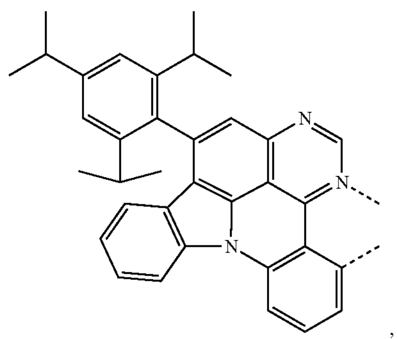
,
$L_{a267}$
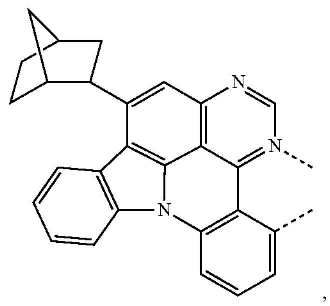
,
-continued
$L_{a268}$
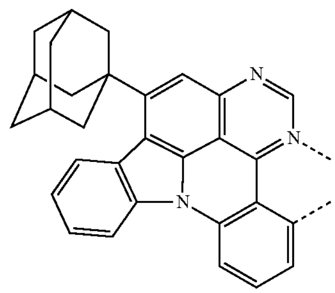
,
$L_{a269}$
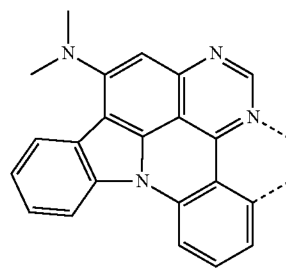
,
$L_{a270}$
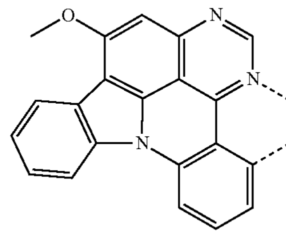
,
$L_{a271}$
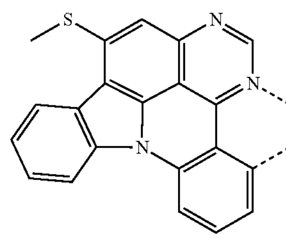
,
$L_{a272}$
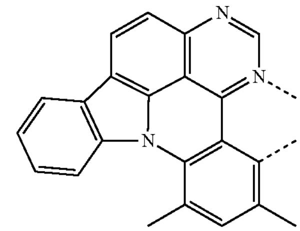
,
$L_{a273}$
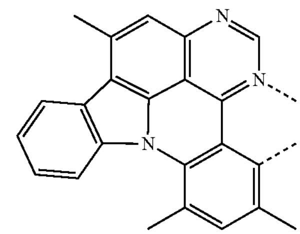
, -continued
$L_{a274}$
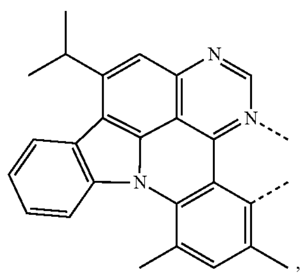
$L_{a275}$
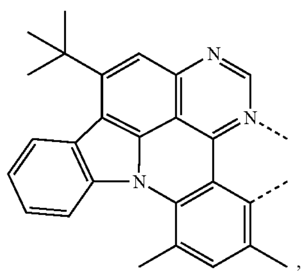
$L_{a276}$
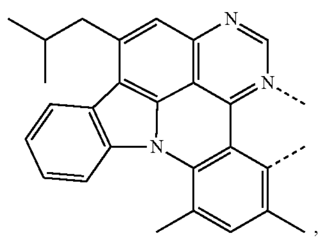
$L_{a277}$
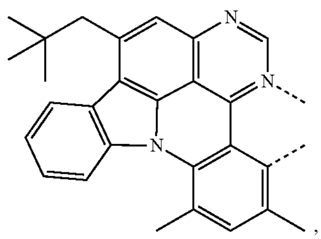
$L_{a278}$
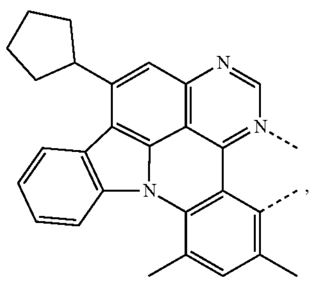
$L_{a279}$
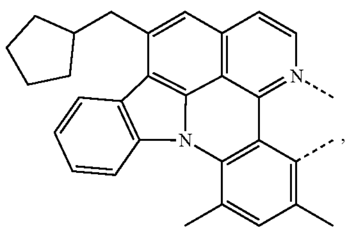
-continued
$L_{a280}$
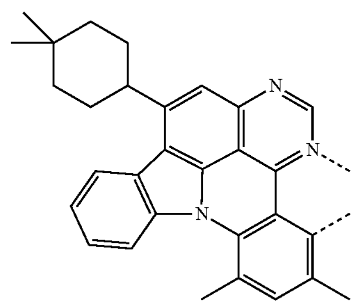
$L_{a281}$
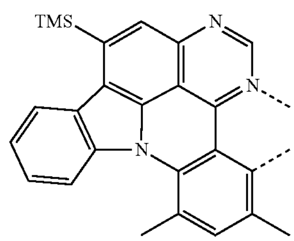
$L_{a282}$
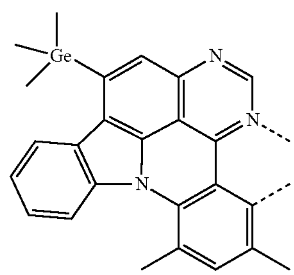
$L_{a283}$
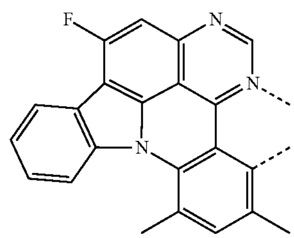
$L_{a284}$
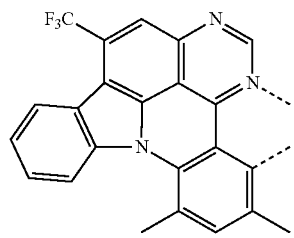
$L_{a285}$
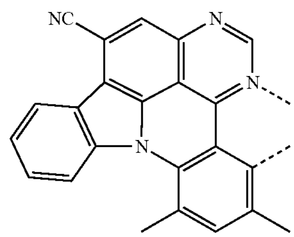

-continued
$L_{a286}$
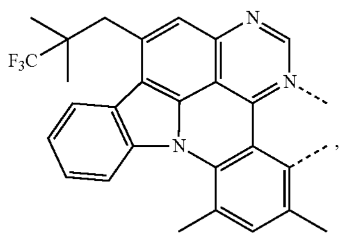
$L_{a287}$
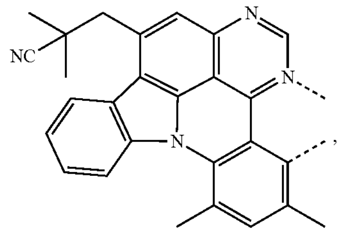
$L_{a288}$
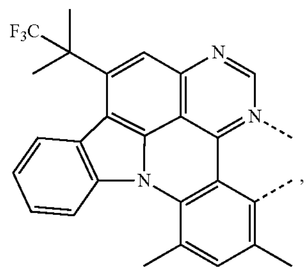
$L_{a289}$
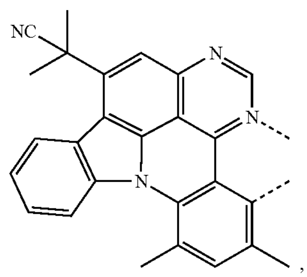
$L_{a290}$
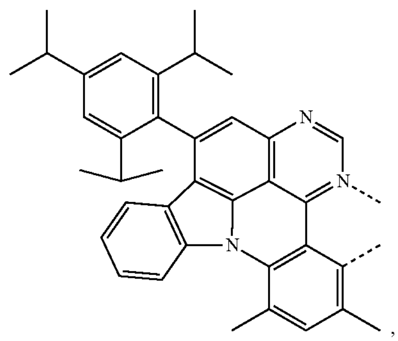
-continued
$L_{a291}$
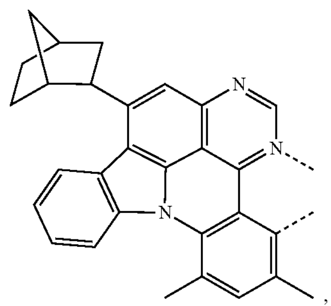
$L_{a292}$
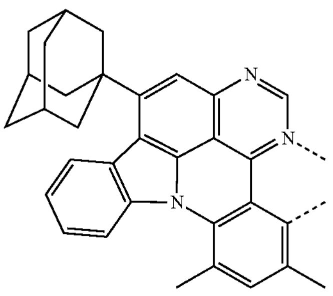
$L_{a293}$
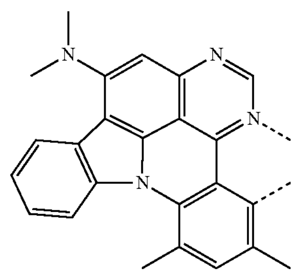
$L_{a294}$
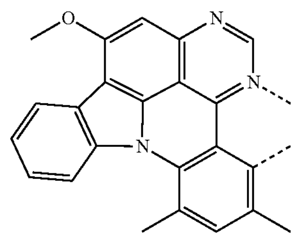
$L_{a295}$
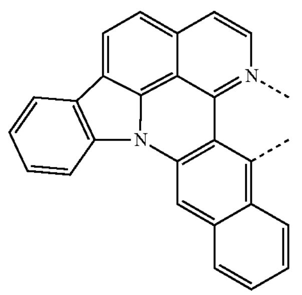

-continued
$L_{a296}$
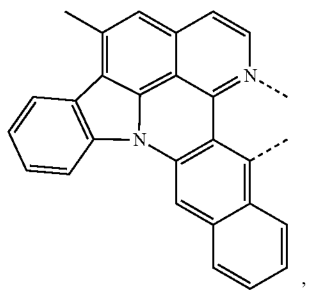
,
$L_{a297}$
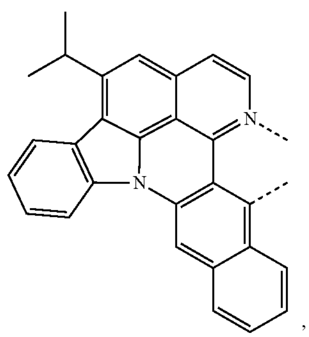
,
$L_{a298}$
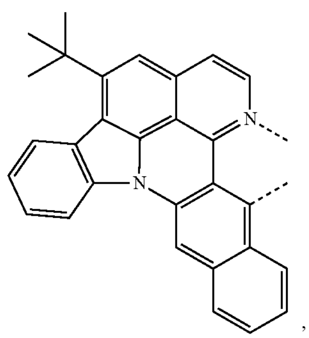
,
$L_{a299}$
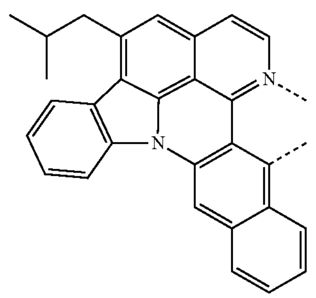
,
$L_{a300}$
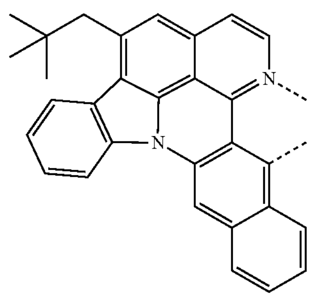
,
-continued
$L_{a301}$
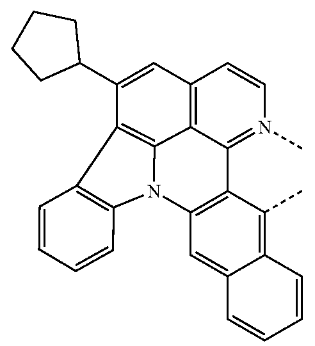
,
$L_{a302}$
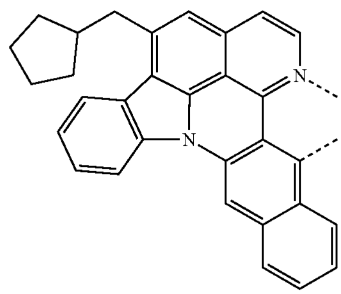
,
$L_{a303}$
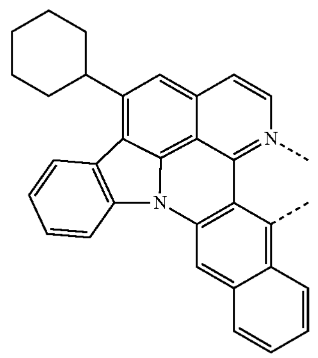
,
$L_{a304}$
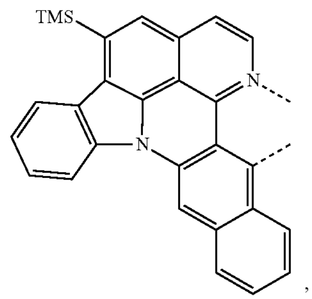
,
$L_{a305}$
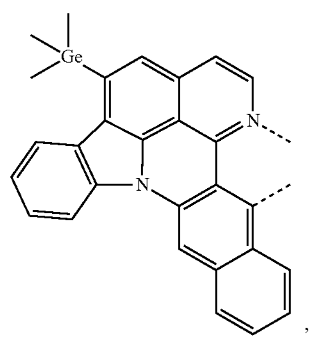
, -continued
$L_{a306}$
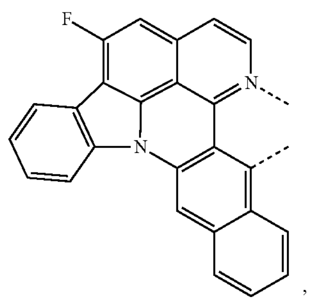
,
$L_{a307}$
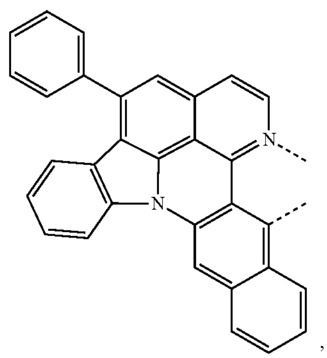
,
$L_{a308}$
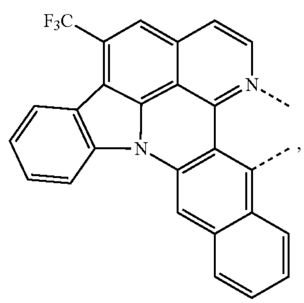
$L_{a309}$
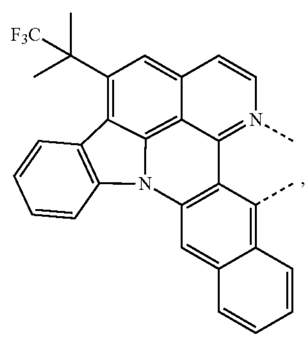
$L_{a310}$
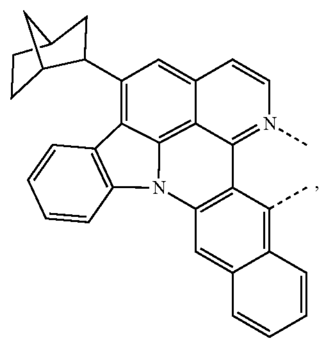
-continued
$L_{a311}$
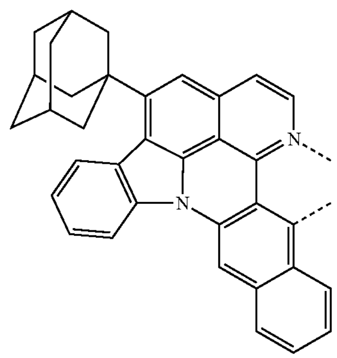
$L_{a312}$
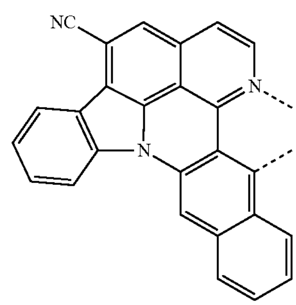
$L_{a313}$
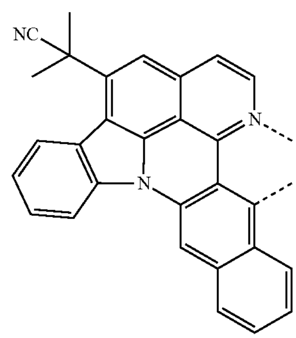
$L_{a314}$
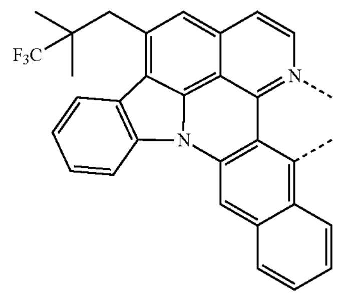
$L_{a315}$
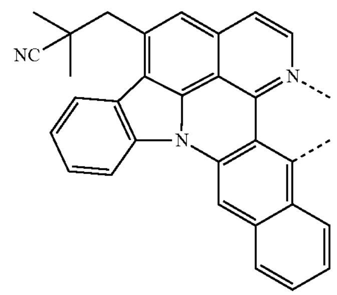

-continued
$L_{a316}$
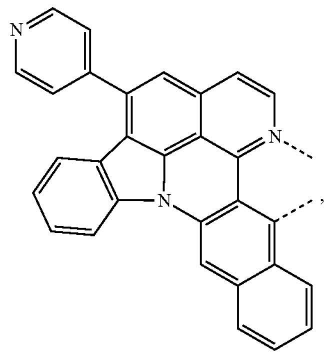
$L_{a317}$
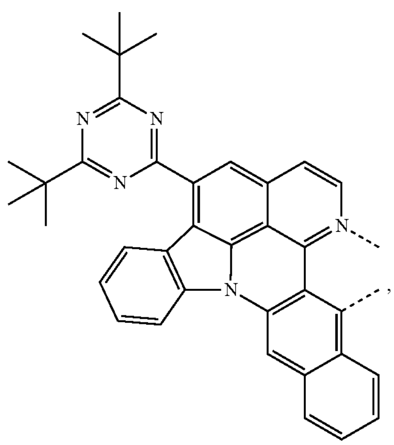
$L_{a318}$
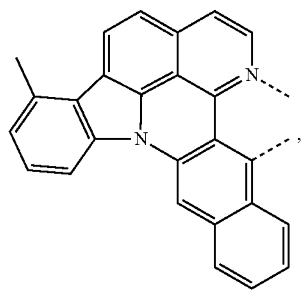
$L_{a319}$
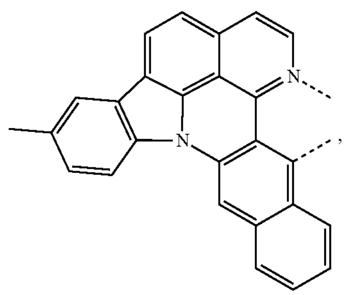
-continued
$L_{a320}$
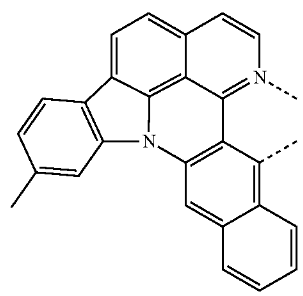
$L_{a321}$
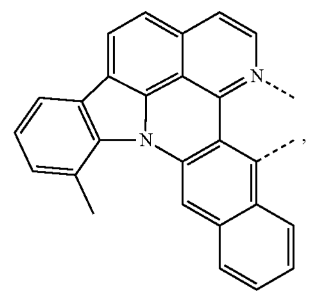
$L_{a322}$
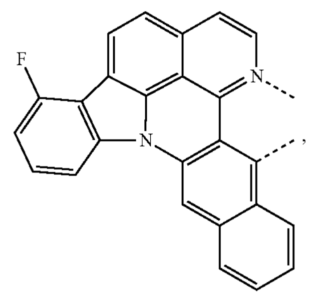
$L_{a323}$
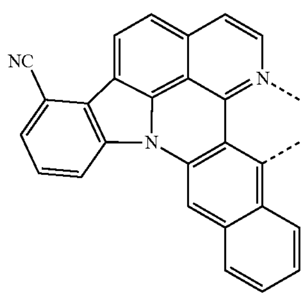
$L_{a324}$
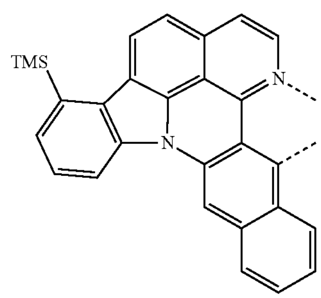

$L_{a325}$
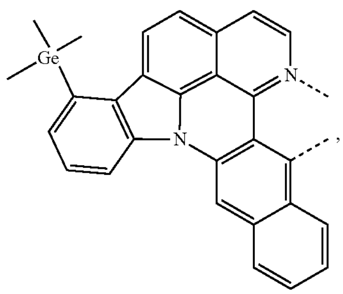
La326
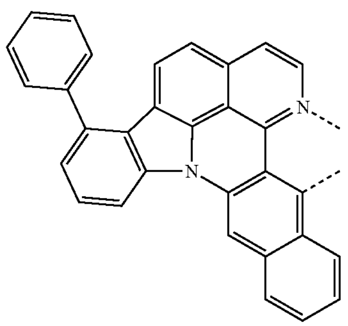
La327
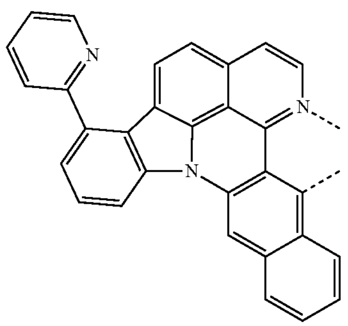
La328
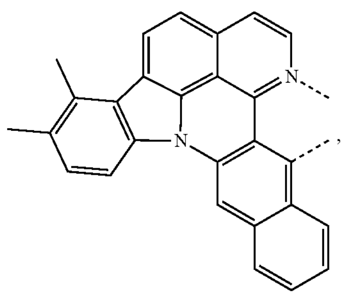
La329
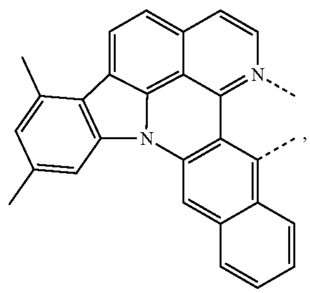
La330
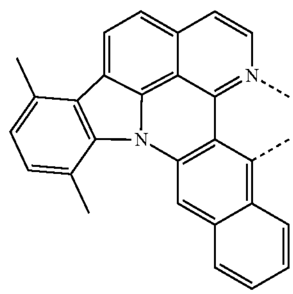
La331
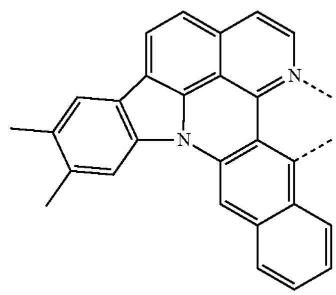
La332
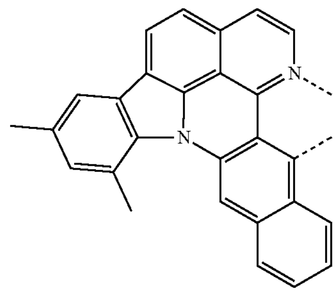
$L_{a333}$
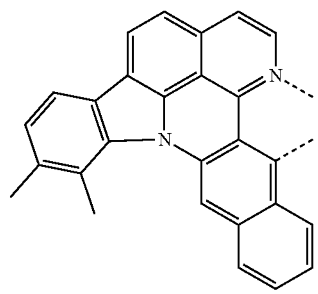
$L_{a334}$
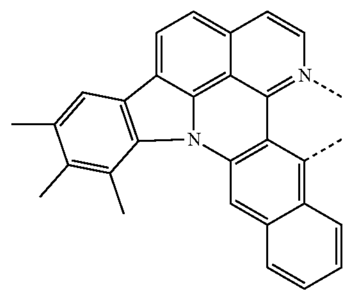

-continued
$L_{a335}$
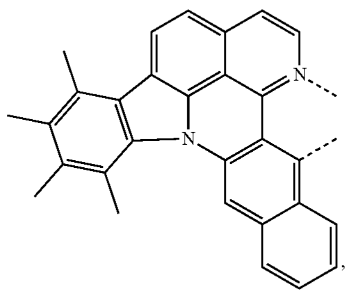
$L_{a336}$
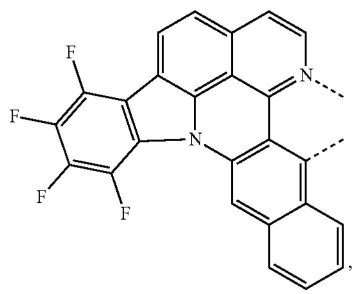
$L_{a337}$
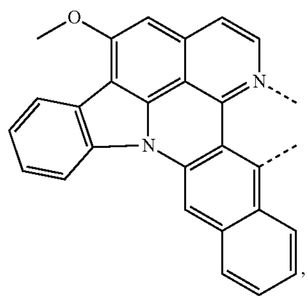
$L_{a338}$
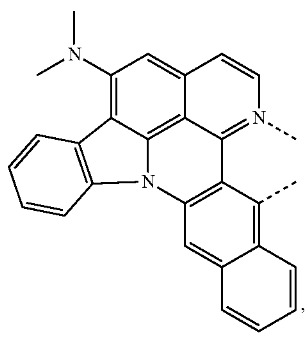
$L_{a339}$
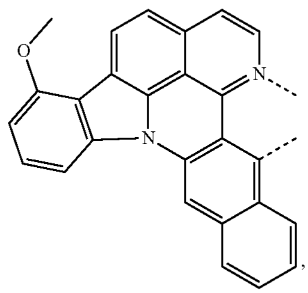
-continued
$L_{a340}$
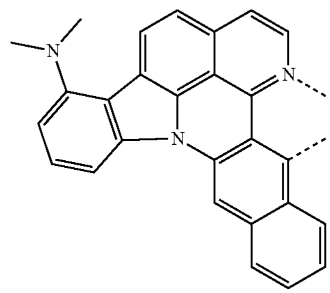
$L_{a341}$
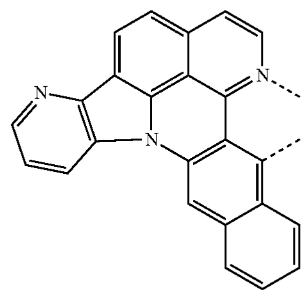
$L_{a342}$
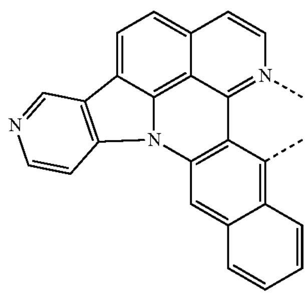
$L_{a343}$
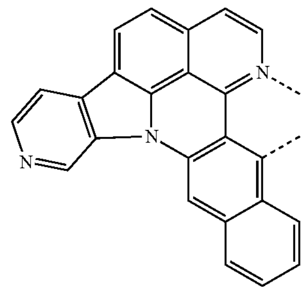
$L_{a344}$
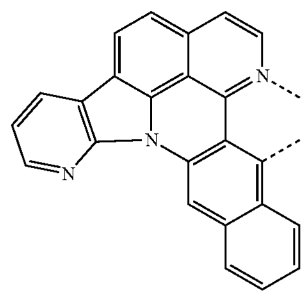

-continued
$L_{a345}$
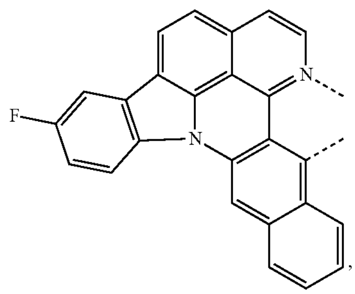
$L_{a346}$
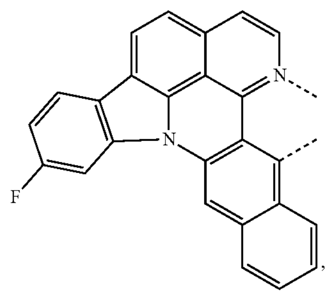
$L_{a347}$
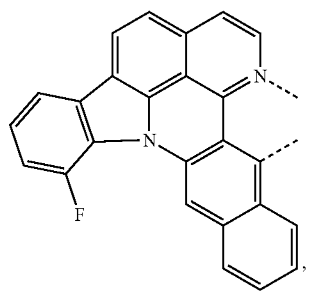
$L_{a348}$
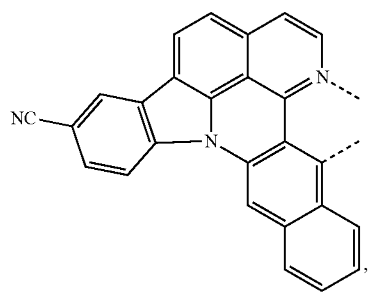
$L_{a349}$
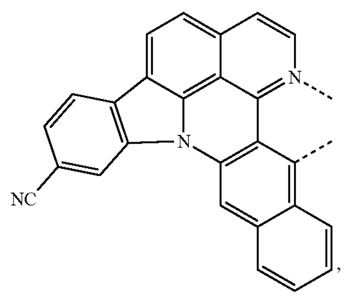
-continued
$L_{a350}$
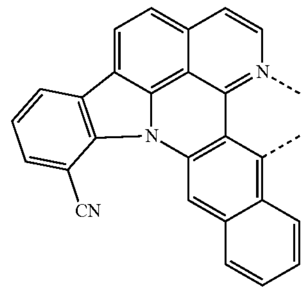
$L_{a351}$
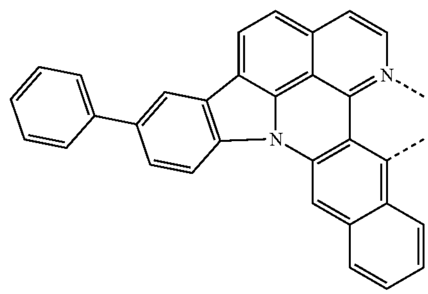
$L_{a352}$
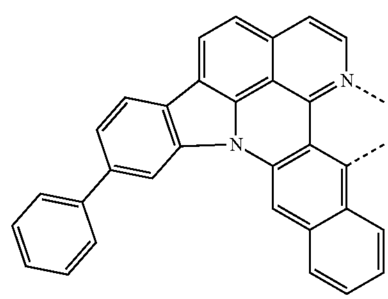
$L_{a353}$
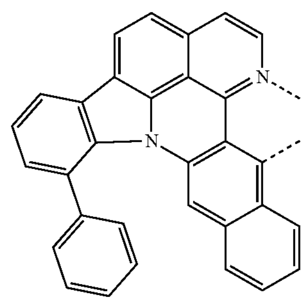
$L_{a354}$
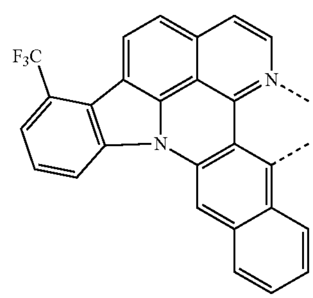

-continued
$L_{a355}$
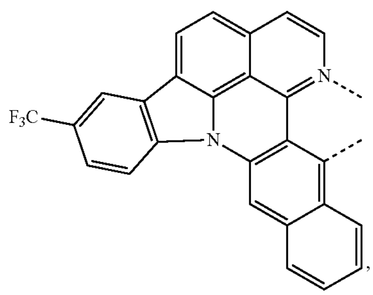
$L_{a356}$
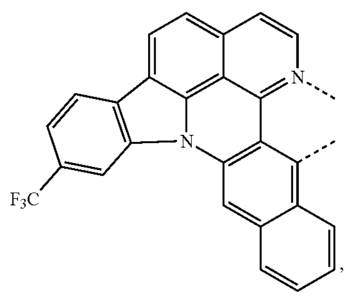
$L_{a357}$
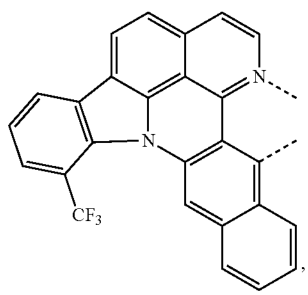
$L_{a358}$
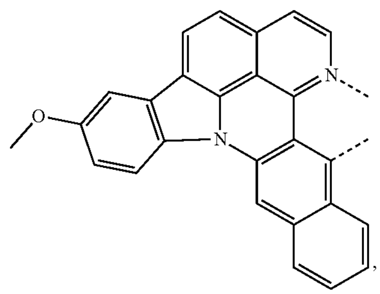
$L_{a359}$
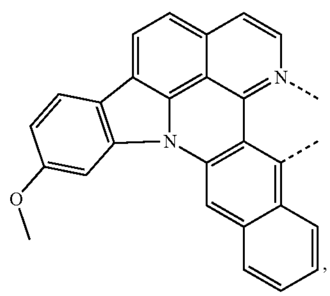
-continued
$L_{a360}$
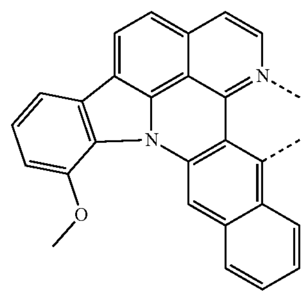
$L_{a361}$
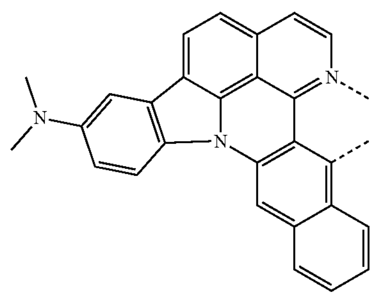
$L_{a362}$
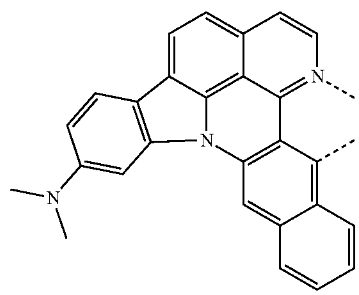
$L_{a363}$
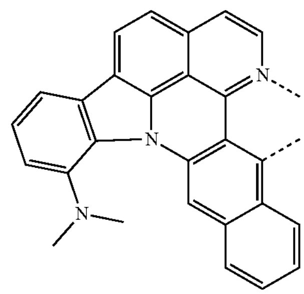
$L_{a364}$
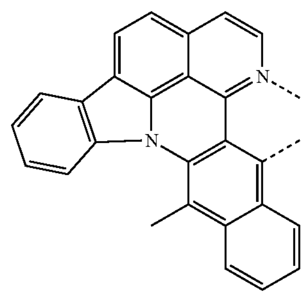

$L_{a365}$
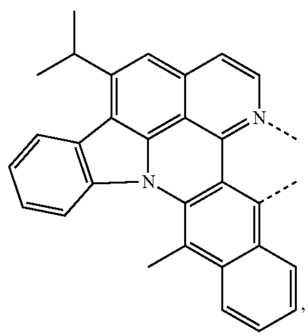
$L_{a366}$
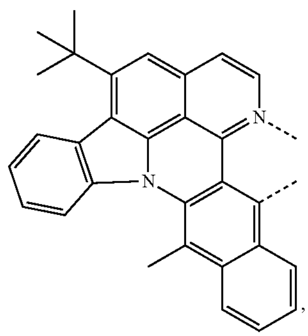
$L_{a367}$
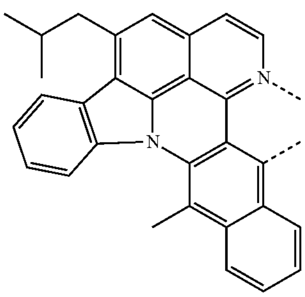
$L_{a368}$
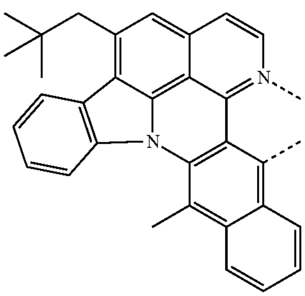
$L_{a369}$
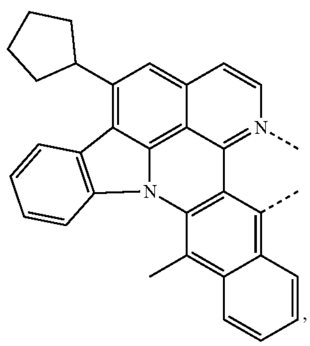
$L_{a370}$
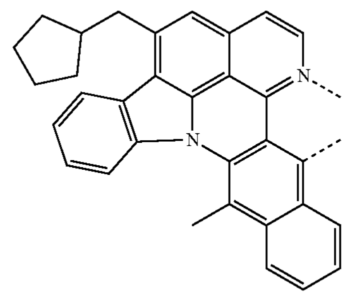
$L_{a371}$
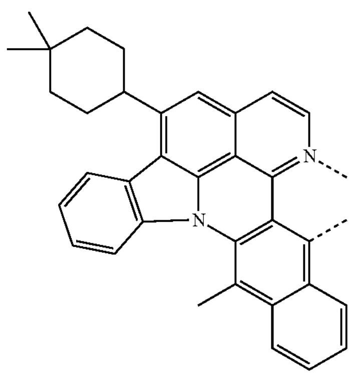
$L_{a372}$
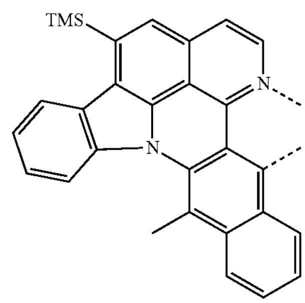
$L_{a373}$
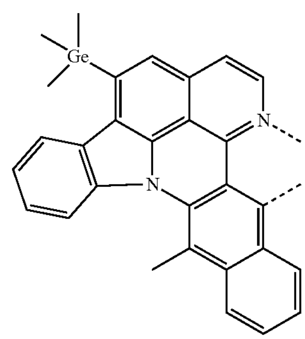
$L_{a374}$
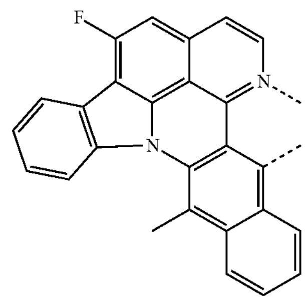

-continued
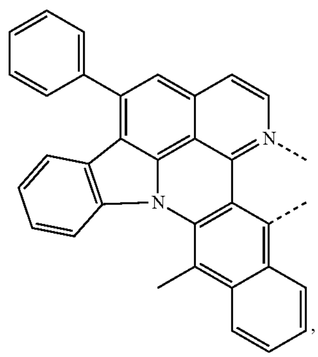
$L_{a375}$
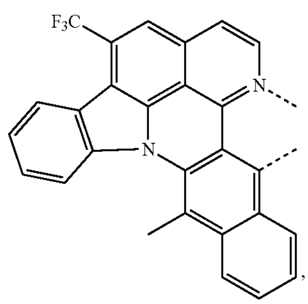
$L_{a376}$
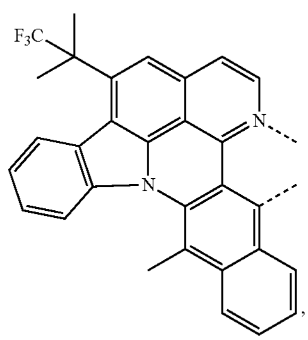
$L_{a377}$
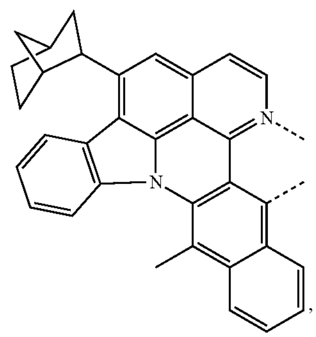
$L_{a378}$
-continued
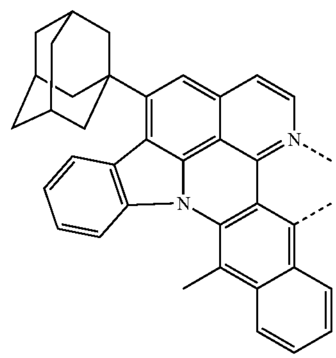
$L_{a379}$
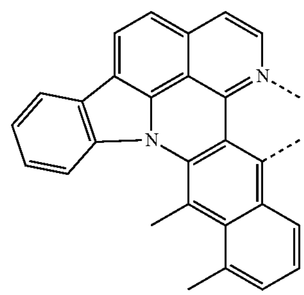
$L_{a380}$
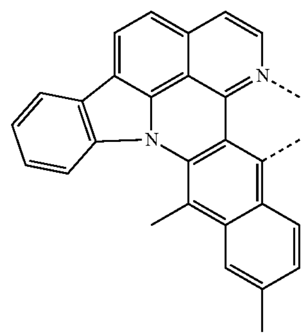
$L_{a381}$
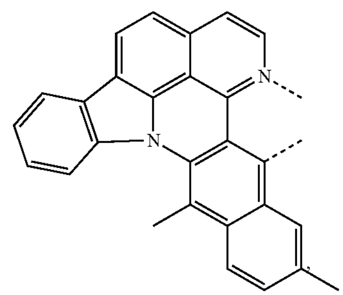
$L_{a382}$
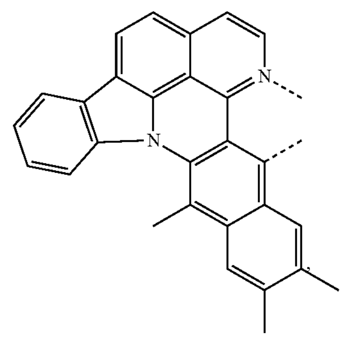
$L_{a383}$ -continued
$L_{a384}$
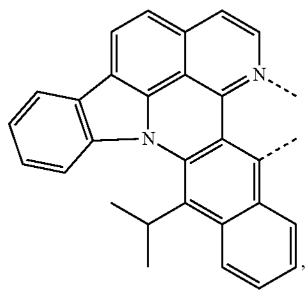
$L_{a385}$
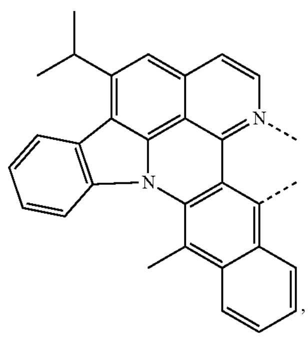
$L_{a386}$
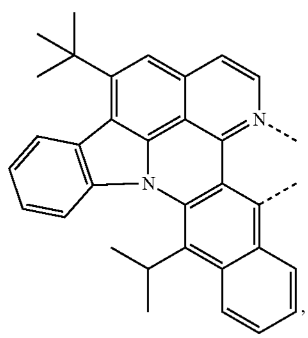
$L_{a387}$
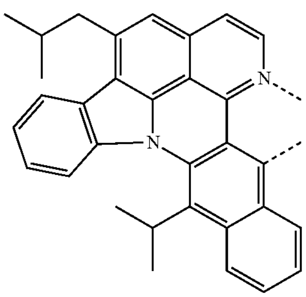
$L_{a388}$
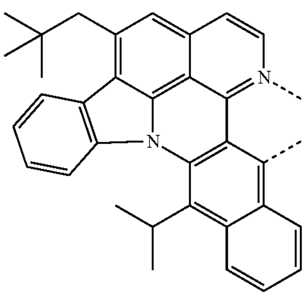
-continued
$L_{a389}$
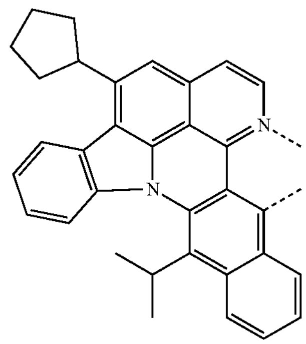
$L_{a390}$
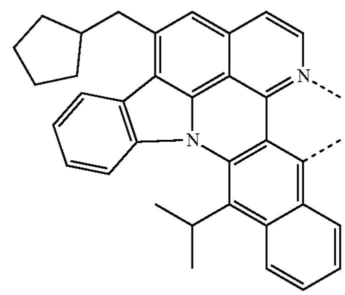
$L_{a391}$
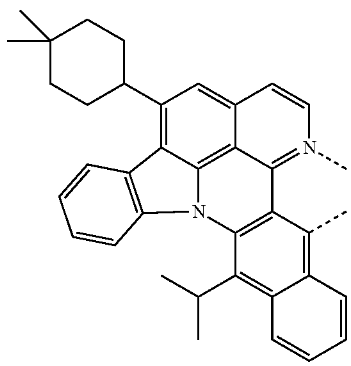
$L_{a392}$
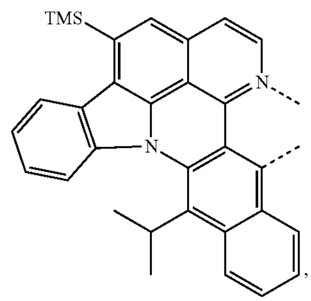
$L_{a393}$
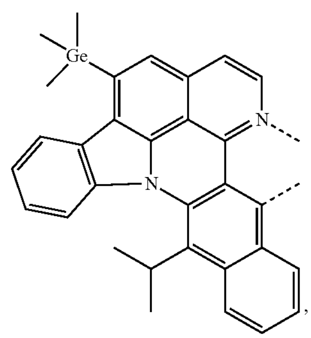

-continued
$L_{a394}$
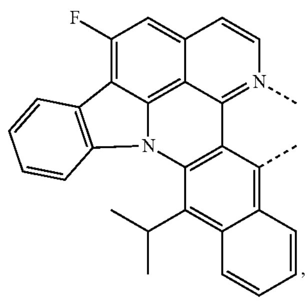
$L_{a395}$
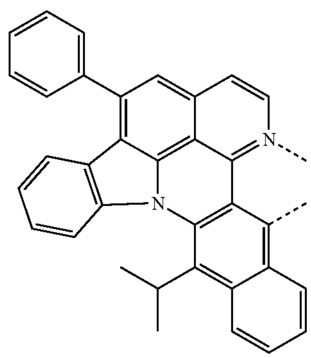
$L_{a396}$
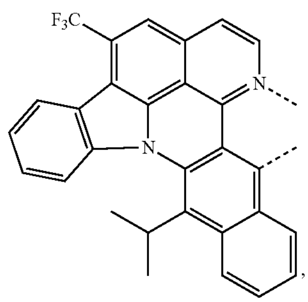
$L_{a397}$
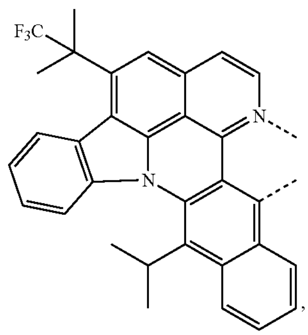
$L_{a398}$
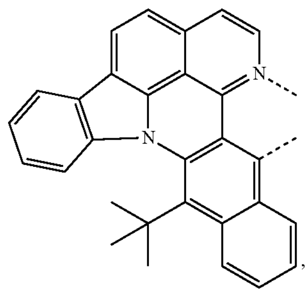
-continued
$L_{a399}$
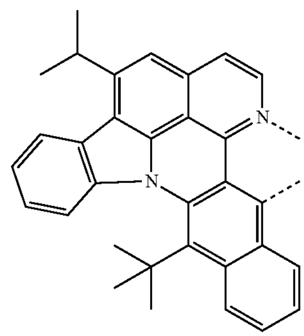
$L_{a400}$
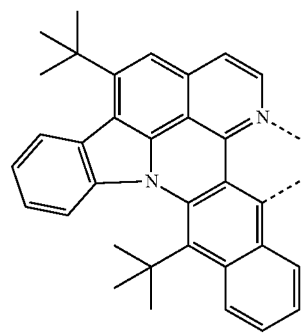
$L_{a401}$
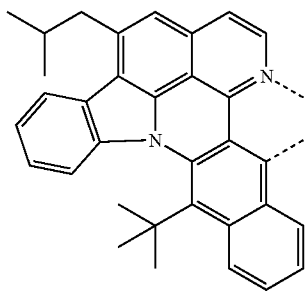
$L_{a402}$
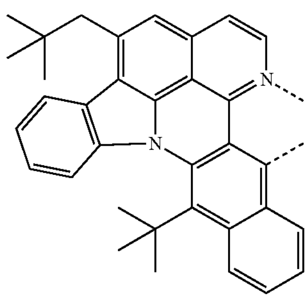
$L_{a403}$
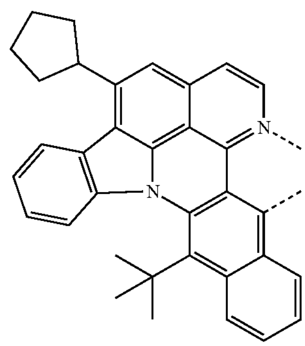

-continued
$L_{a404}$
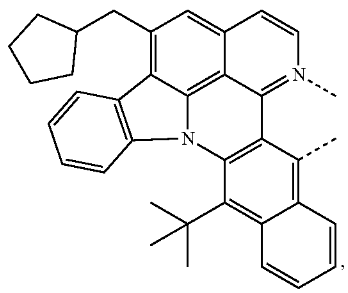
$L_{a405}$
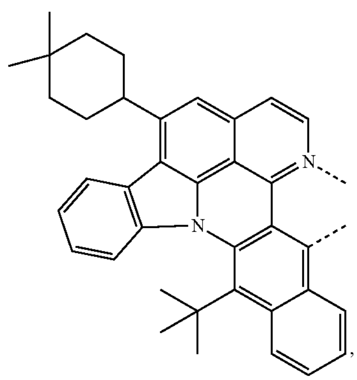
$L_{a406}$
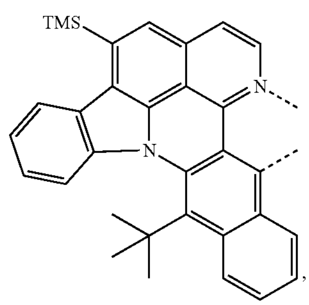
$L_{a407}$
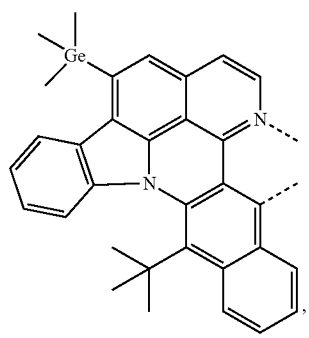
$L_{a408}$
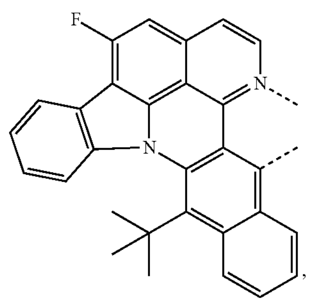
-continued
$L_{a409}$
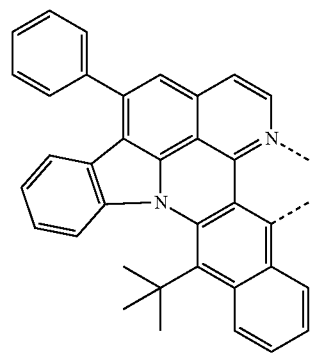
$L_{a410}$
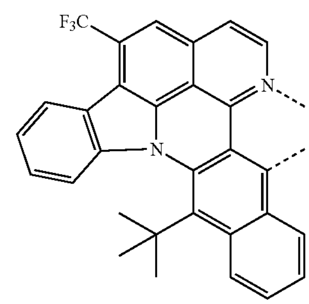
$L_{a411}$
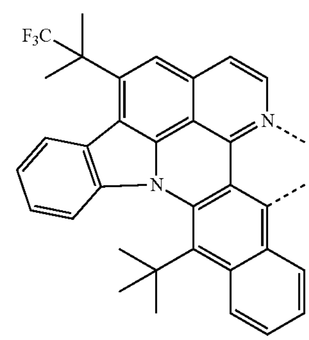
$L_{a412}$
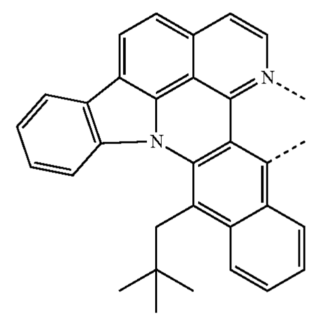

-continued
$L_{a413}$
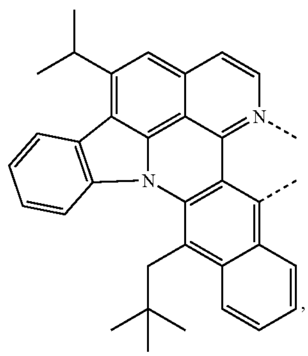
$L_{a414}$
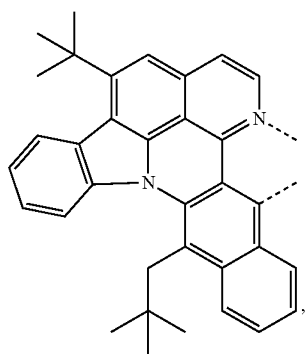
$L_{a415}$
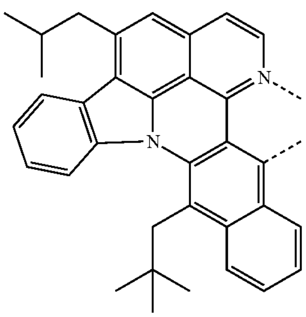
$L_{a416}$
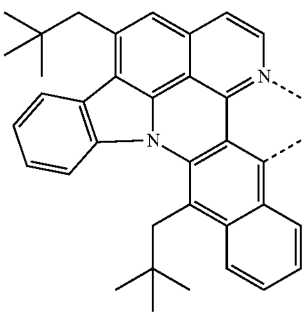
-continued
$L_{a417}$
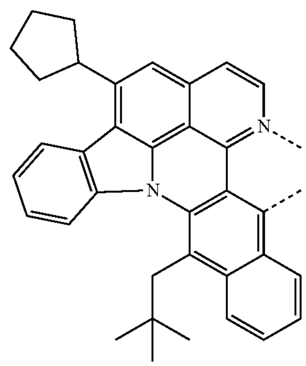
$L_{a418}$
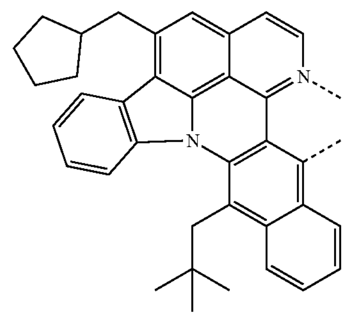
$L_{a419}$
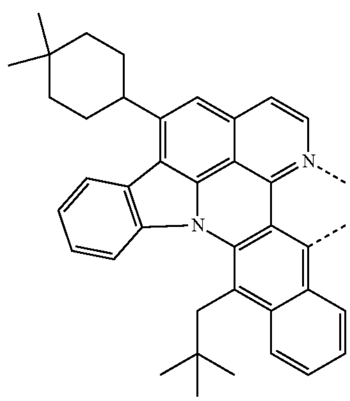
$L_{a420}$
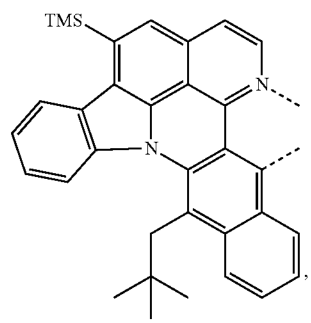

$L_{a421}$
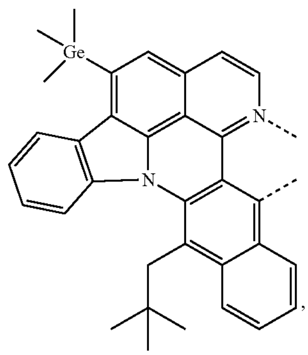
$L_{a422}$
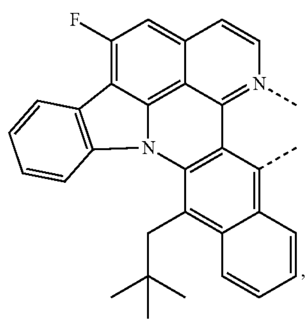
$L_{a423}$
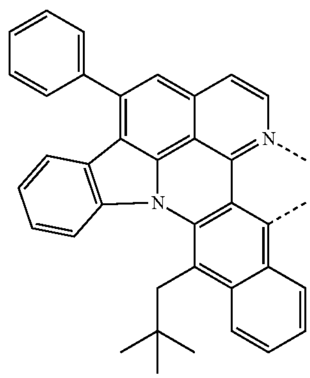
$L_{a424}$
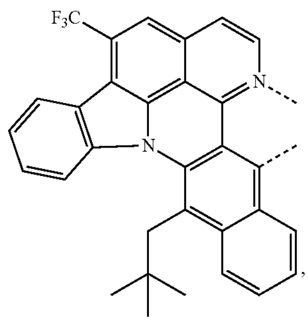
$L_{a425}$
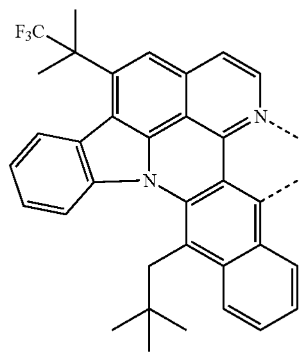
$L_{a426}$
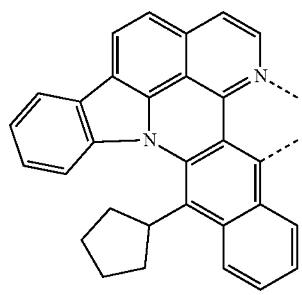
$L_{a427}$
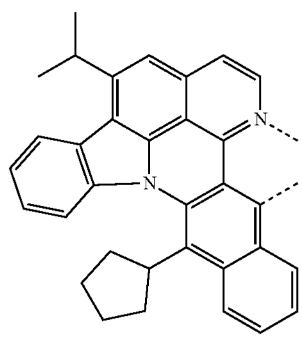
$L_{a428}$
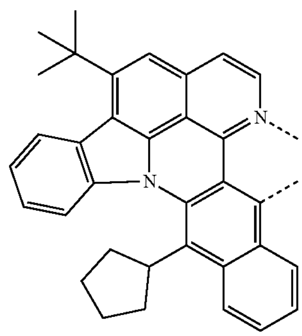
$L_{a429}$
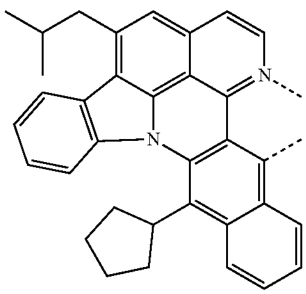

-continued
$L_{a430}$
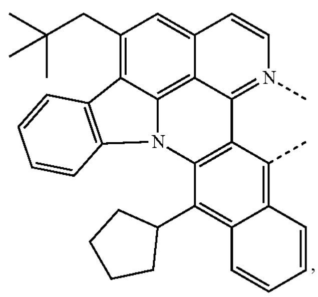
$L_{a431}$
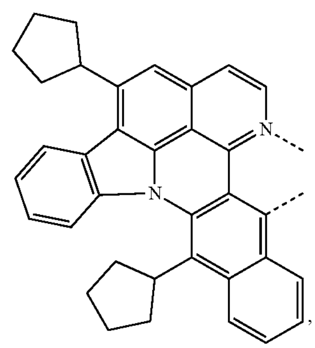
$L_{a432}$
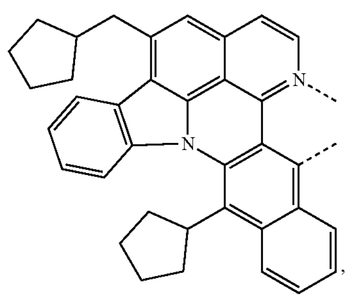
$L_{a433}$
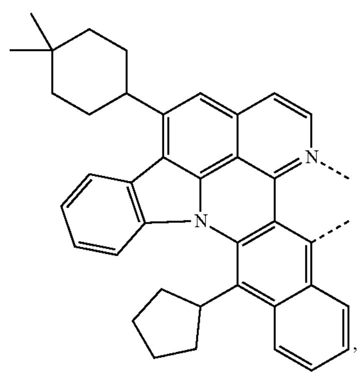
$L_{a434}$
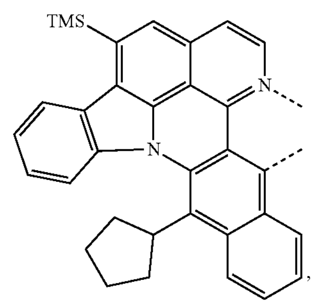
-continued
$L_{a435}$
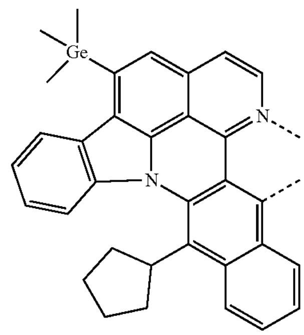
$L_{a436}$
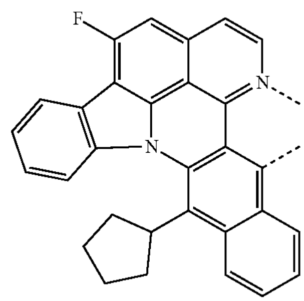
$L_{a437}$
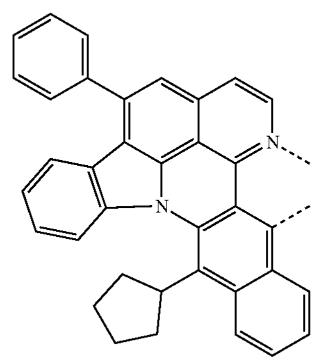
$L_{a438}$
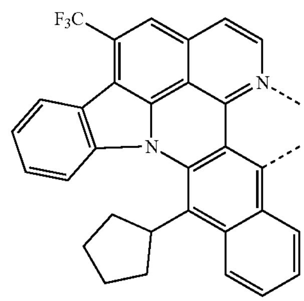
$L_{a439}$
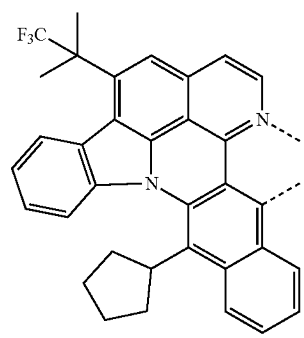

$L_{a440}$
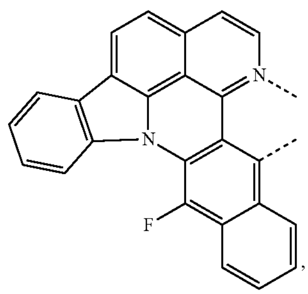
$L_{a441}$
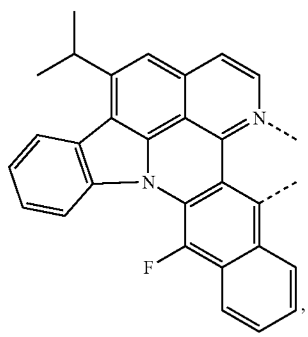
$L_{a442}$
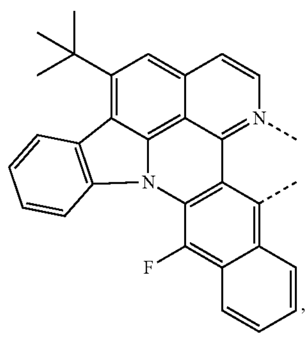
$L_{a443}$
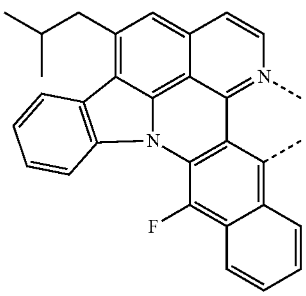
$L_{a444}$
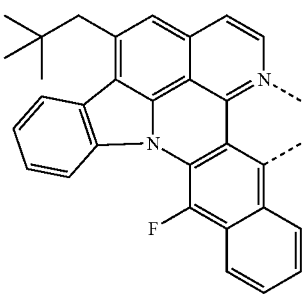
$L_{a445}$
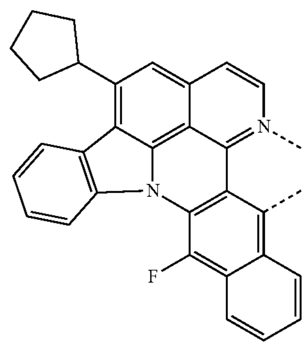
$L_{a446}$
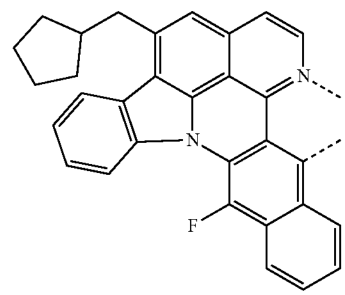
$L_{a447}$
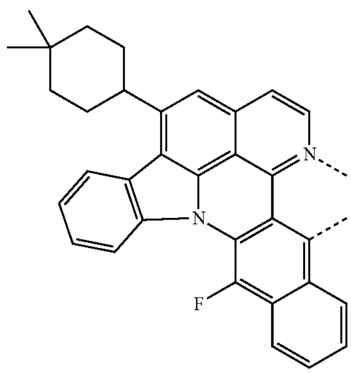
$L_{a448}$
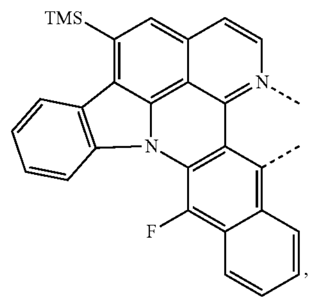

-continued
$L_{a449}$
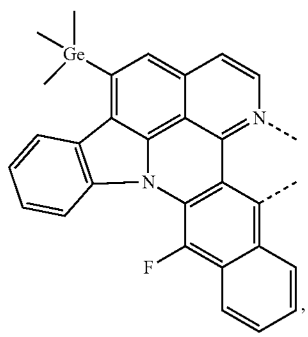
$L_{a450}$
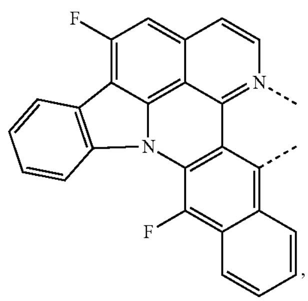
$L_{a451}$
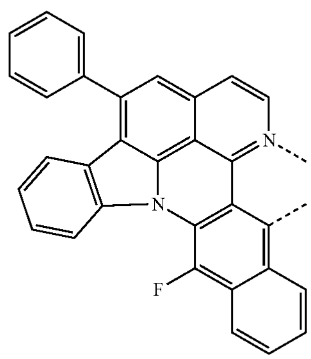
$L_{a452}$
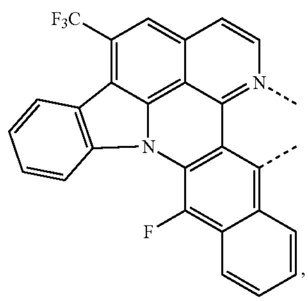
$L_{a453}$
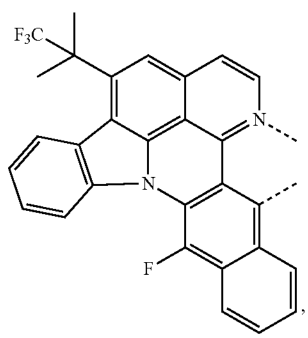
-continued
$L_{a454}$
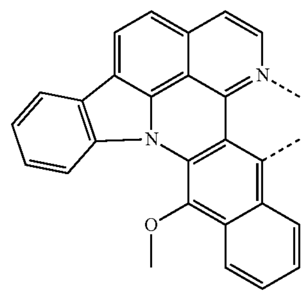
$L_{a455}$
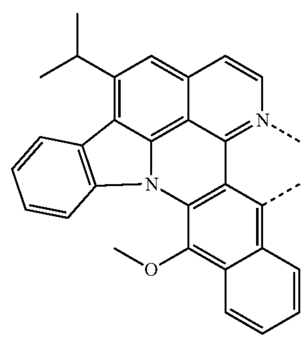
$L_{a456}$
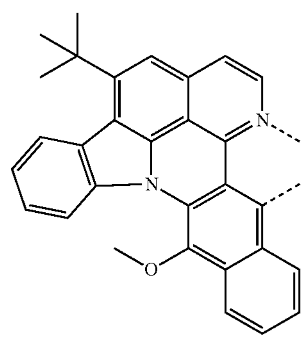
$L_{a457}$
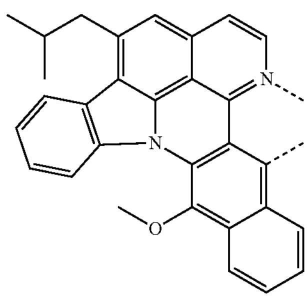
$L_{a458}$
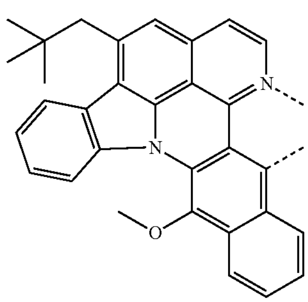

-continued
$L_{a459}$
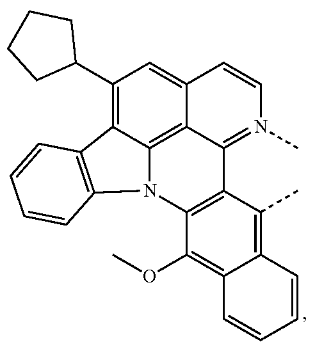
$L_{a460}$
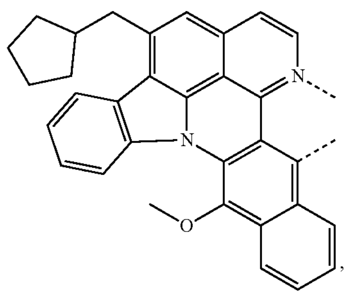
$L_{a461}$
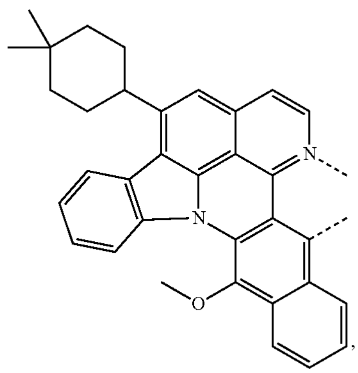
$L_{a462}$
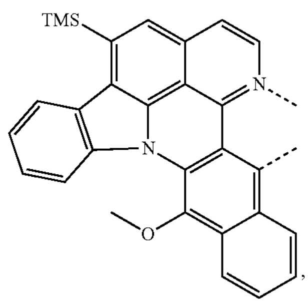
-continued
$L_{a463}$
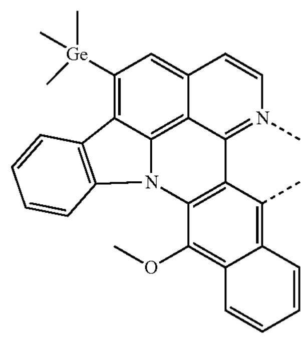
$L_{a464}$
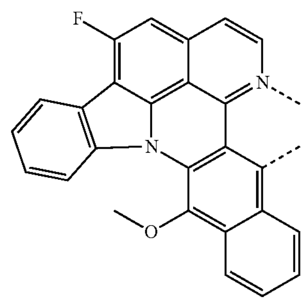
$L_{a465}$
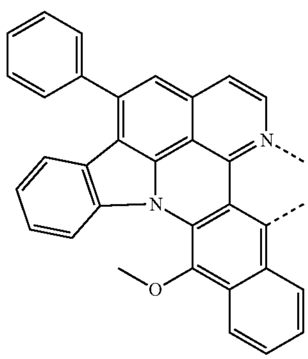
$L_{a466}$
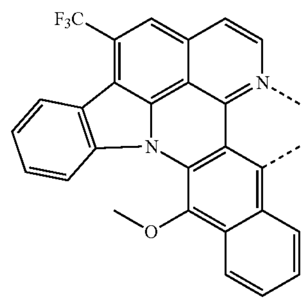
$L_{a467}$
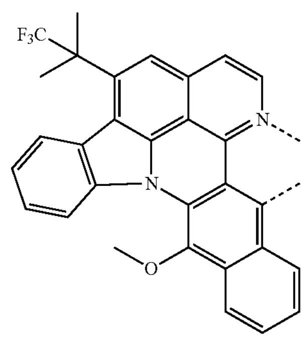

-continued
$L_{a468}$
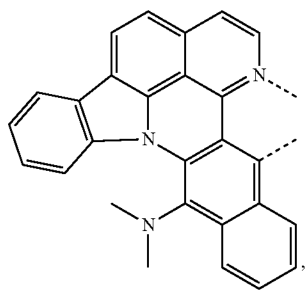
$L_{a469}$
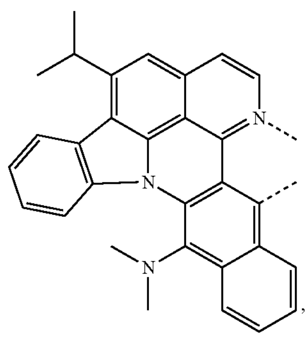
$L_{a470}$
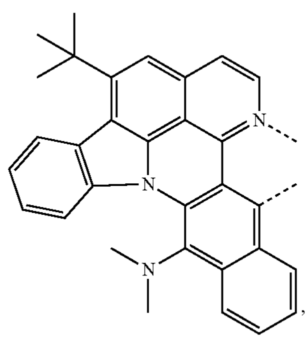
$L_{a471}$
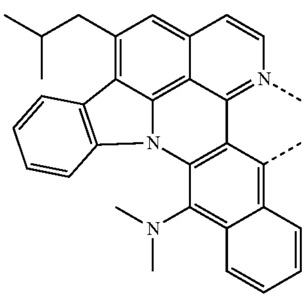
$L_{a472}$
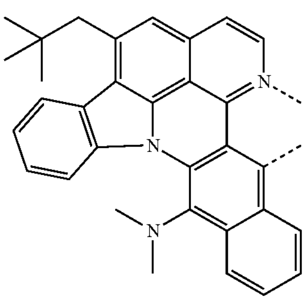
-continued
$L_{a473}$
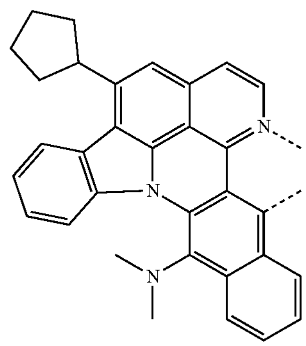
$L_{a474}$
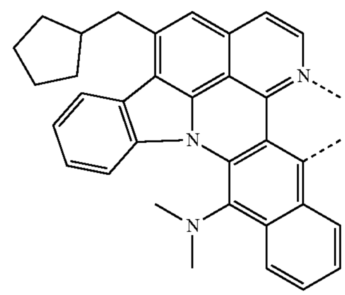
$L_{a475}$
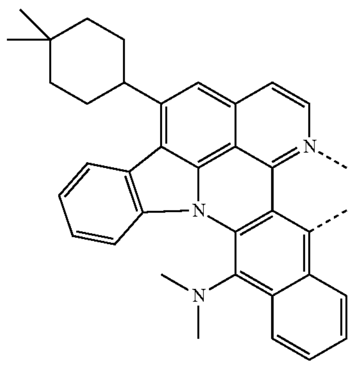
$L_{a476}$
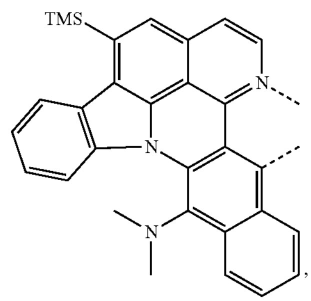

-continued
$L_{a477}$
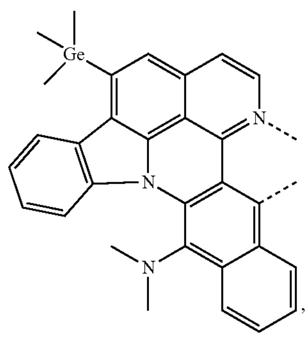
$L_{a478}$
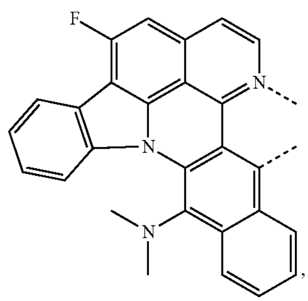
$L_{a479}$
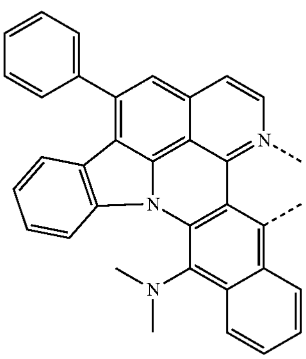
$L_{a480}$
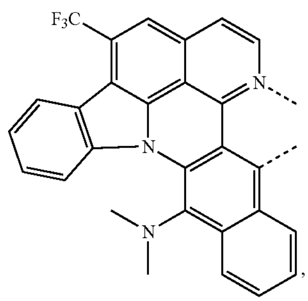
$L_{a481}$
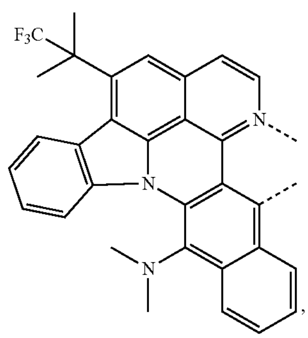
-continued
$L_{a482}$
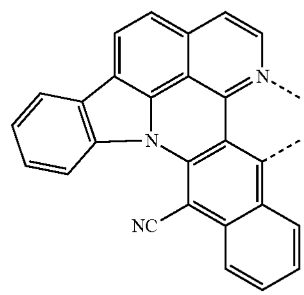
$L_{a483}$
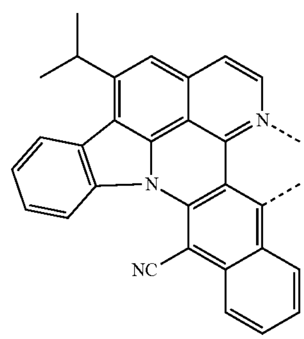
$L_{a484}$
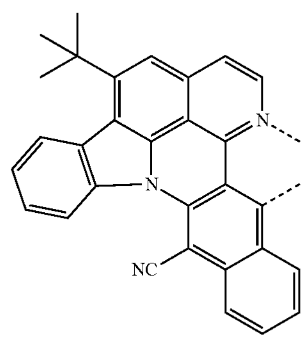
$L_{a485}$
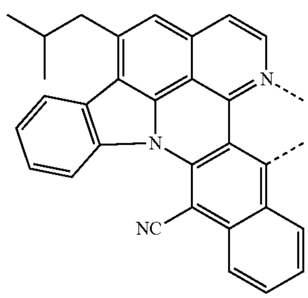
$L_{a486}$
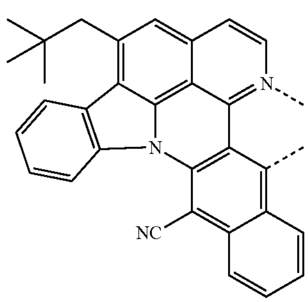

-continued
$L_{a487}$
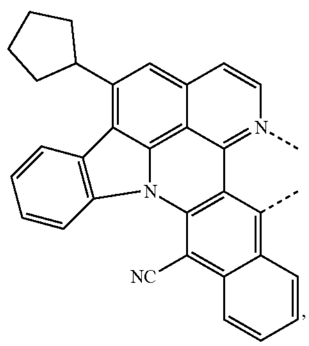
$L_{a488}$
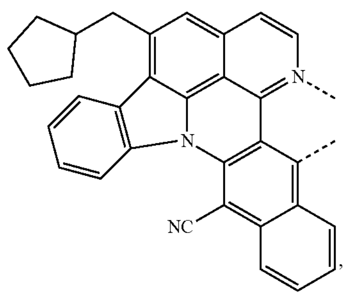
$L_{a489}$
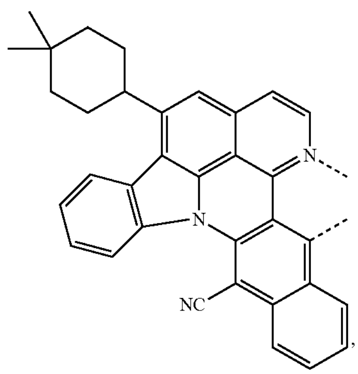
$L_{a490}$
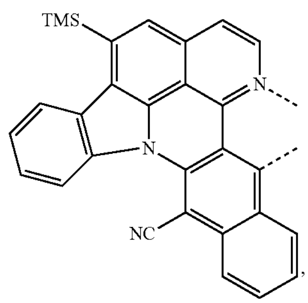
$L_{a491}$
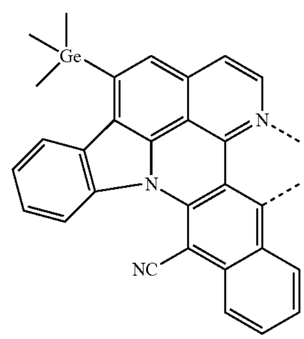
$L_{a492}$
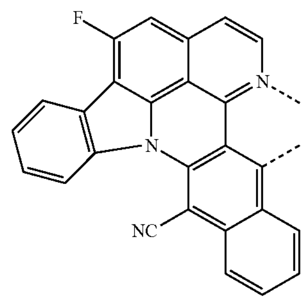
$L_{a493}$
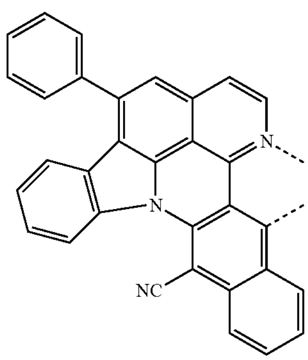
$L_{a494}$
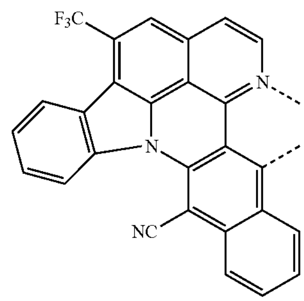
$L_{a495}$
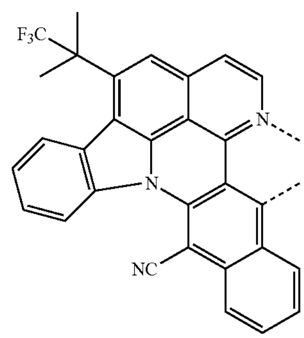

-continued
$L_{a496}$
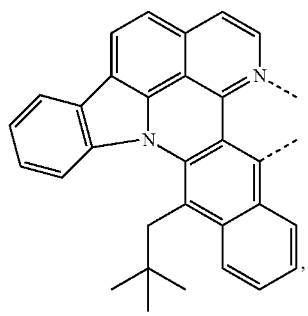
$L_{a497}$
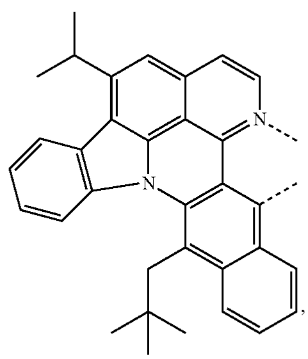
$L_{a498}$
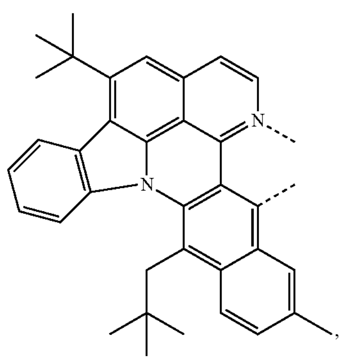
$L_{a499}$
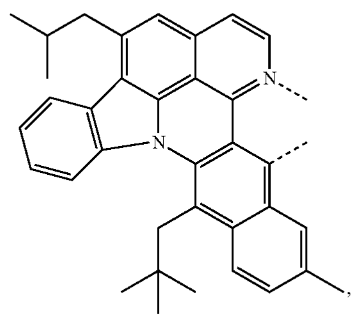
-continued
$L_{a500}$
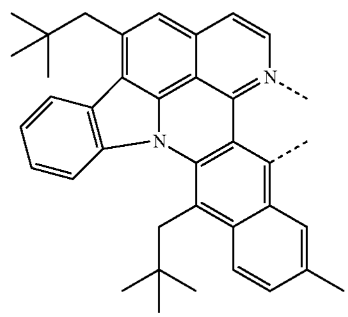
$L_{a501}$
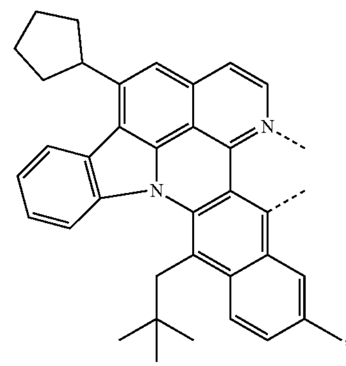
$L_{a502}$
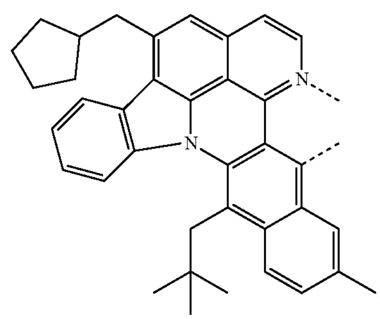
$L_{a503}$
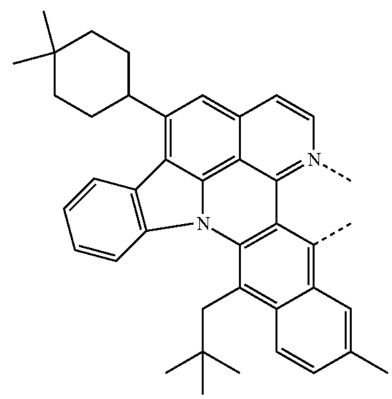

-continued
$L_{a504}$
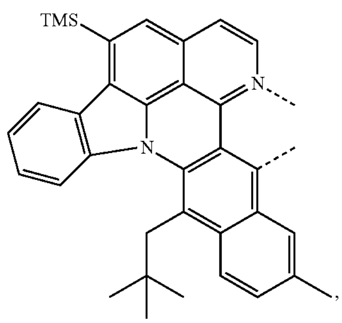
$L_{a505}$
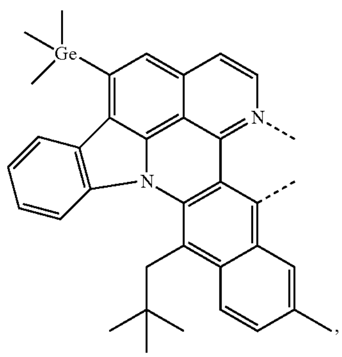
$L_{a506}$
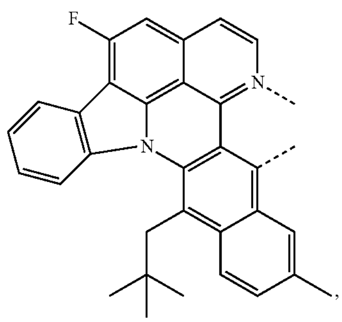
$L_{a507}$
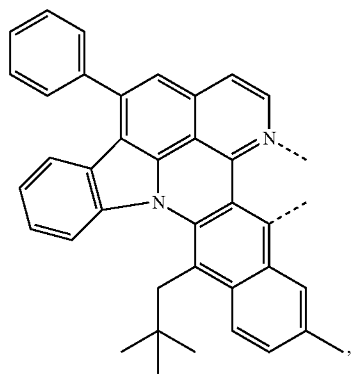
-continued
$L_{a508}$
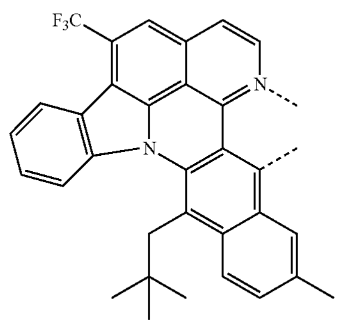
$L_{a509}$
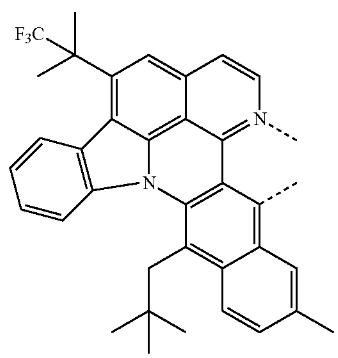
$L_{a510}$
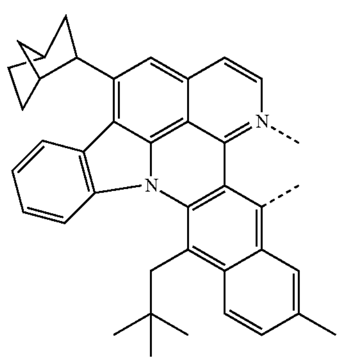
$L_{a511}$
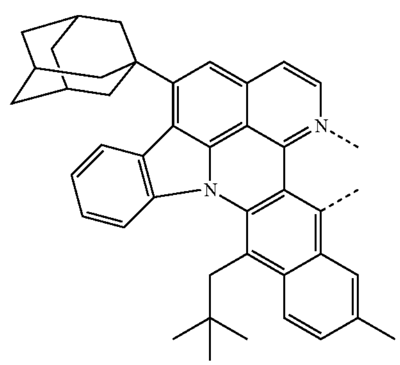

-continued
$L_{a512}$
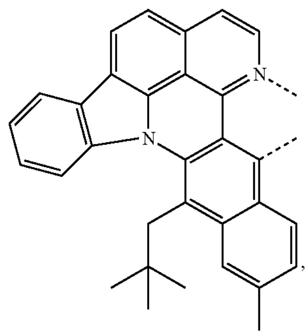
$L_{a513}$
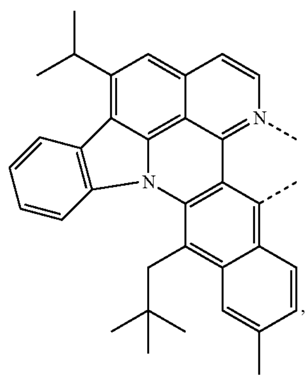
$L_{a514}$
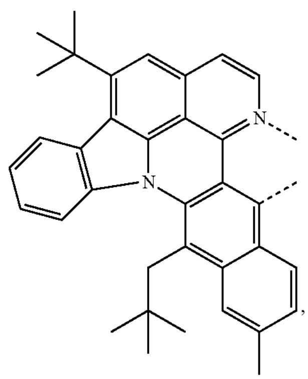
$L_{a515}$
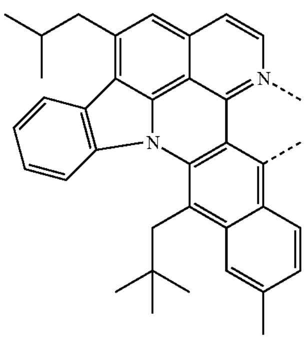
-continued
$L_{a516}$
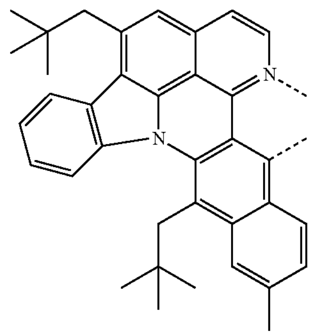
$L_{a517}$
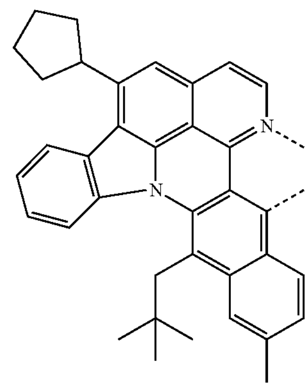
$L_{a518}$
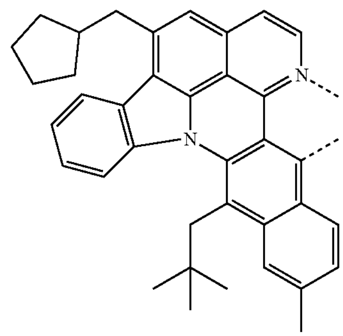
$L_{a519}$
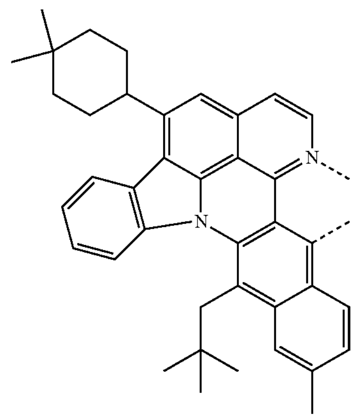

$L_{a520}$
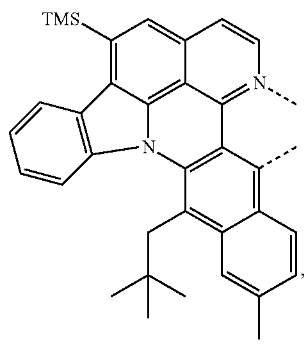
$L_{a521}$
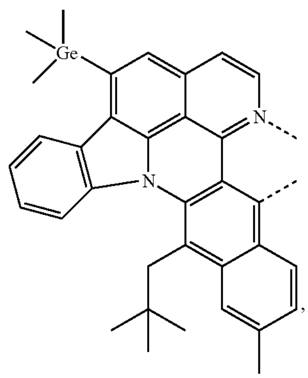
$L_{a522}$
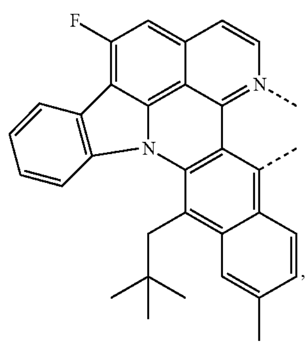
$L_{a523}$
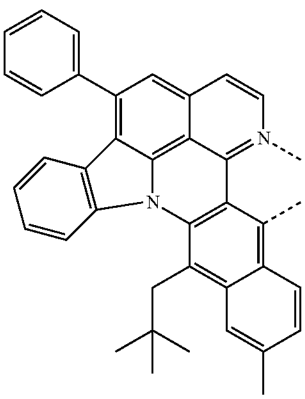
$L_{a524}$
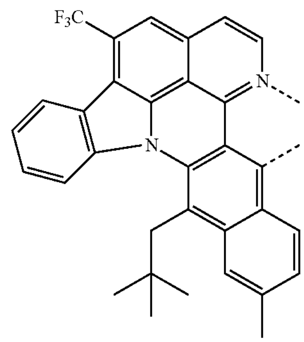
$L_{a525}$
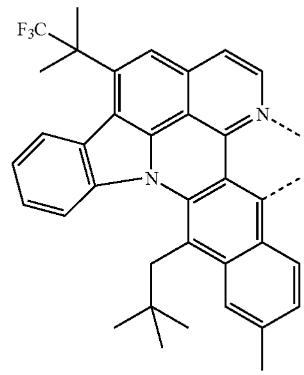
$L_{a526}$
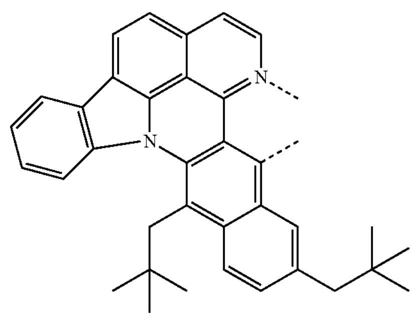
$L_{a527}$
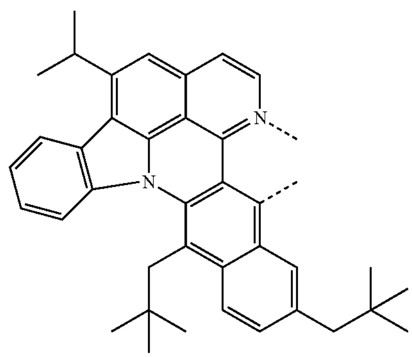

-continued
$L_{a528}$
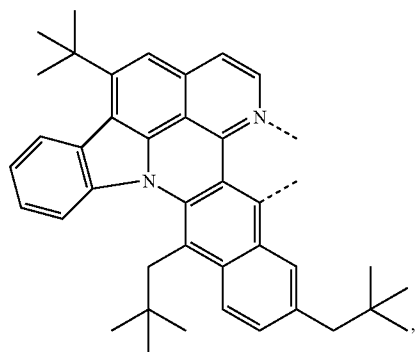
$L_{a529}$
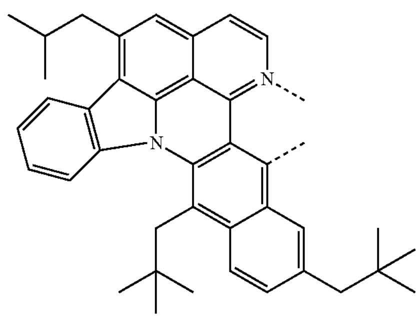
$L_{a530}$
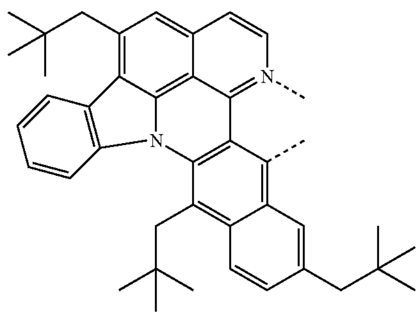
$L_{a531}$
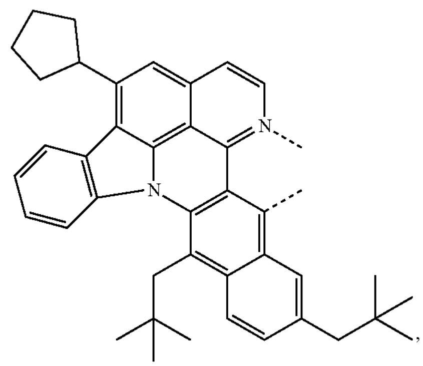
-continued
$L_{a532}$
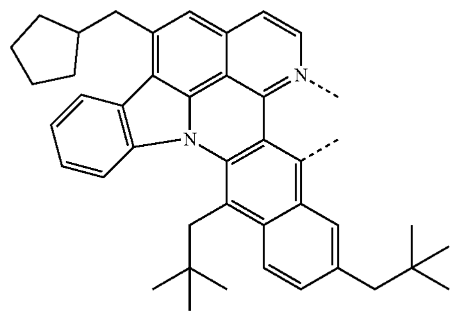
$L_{a533}$
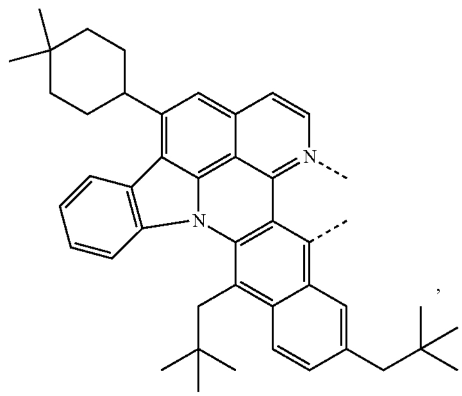
$L_{a534}$
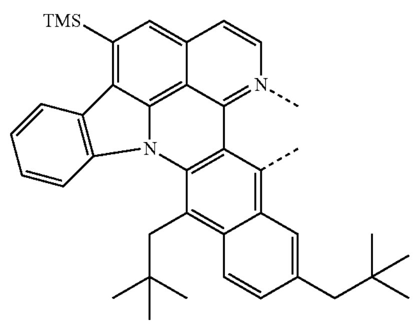
$L_{a535}$
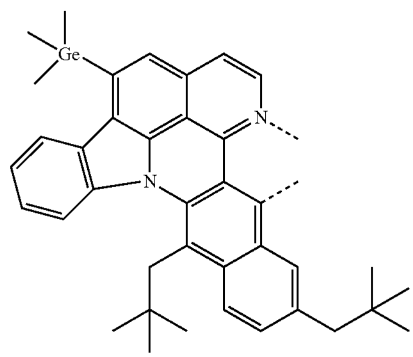

-continued
$L_{a536}$
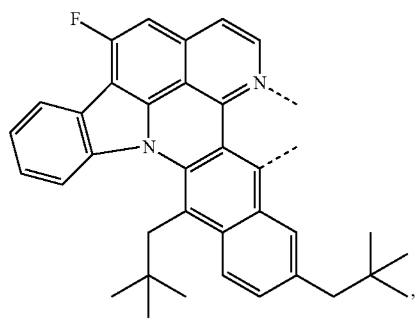
$L_{a537}$
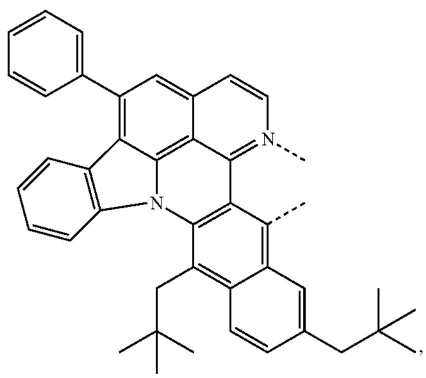
$L_{a538}$
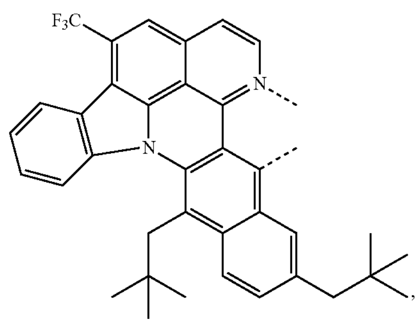
$L_{a539}$
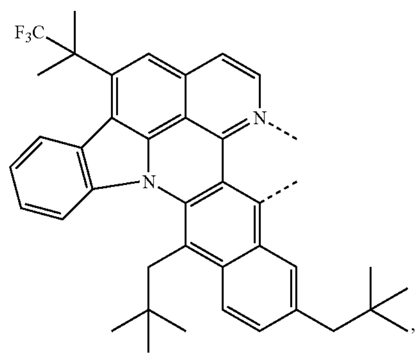
-continued
$L_{a540}$
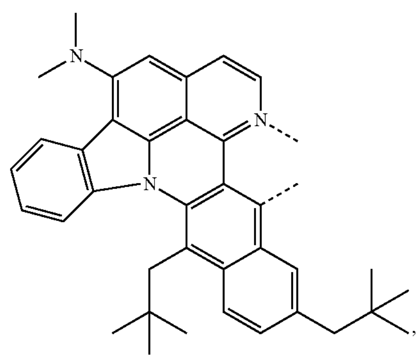
$L_{a541}$
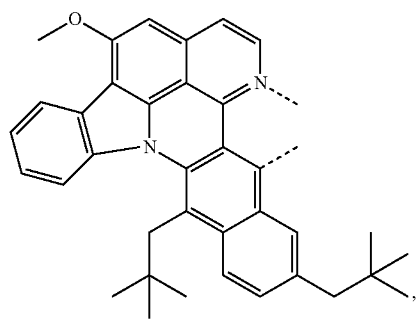
$L_{a542}$
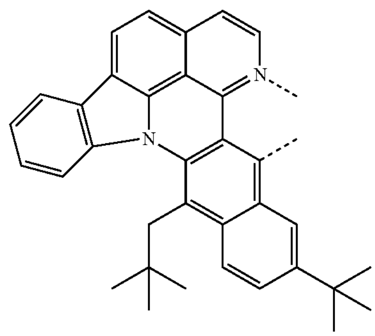
$L_{a543}$
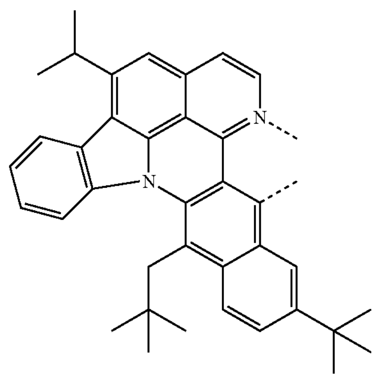

-continued
$L_{a544}$
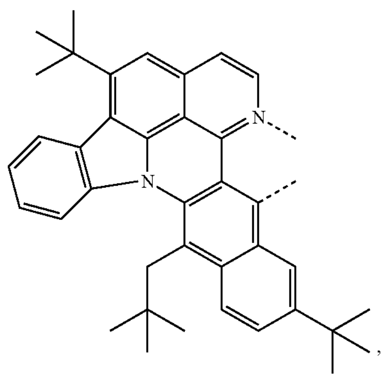
$L_{a545}$
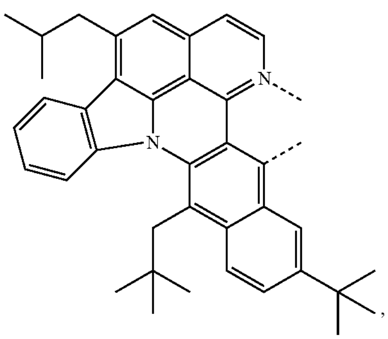
$L_{a546}$
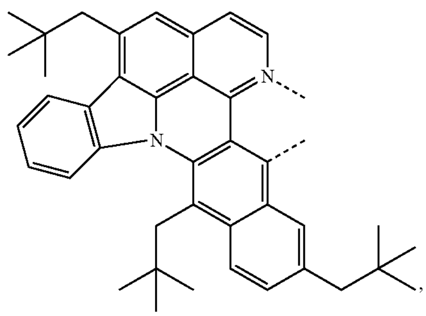
$L_{a547}$
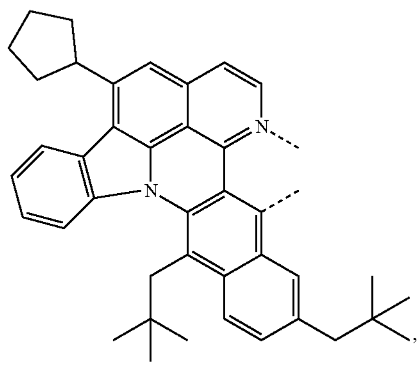
-continued
$L_{a548}$
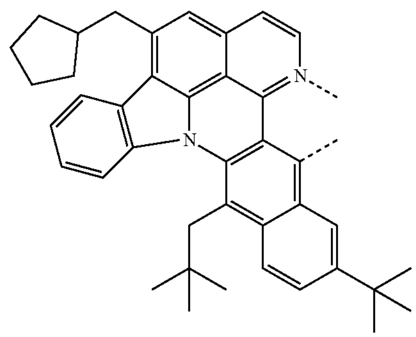
$L_{a549}$
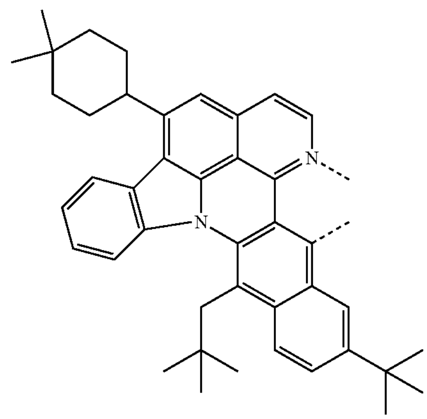
$L_{a550}$
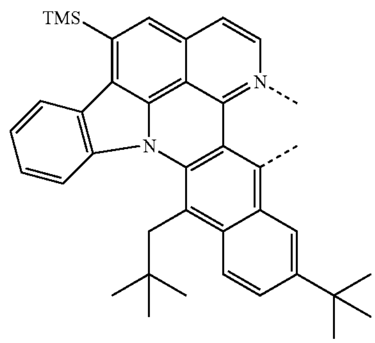
$L_{a551}$
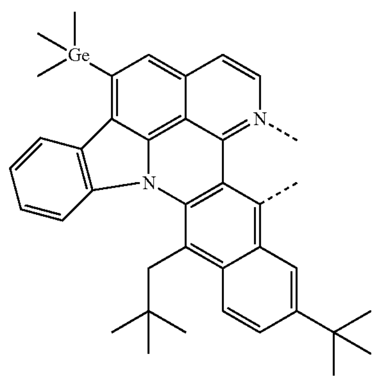

$L_{a552}$
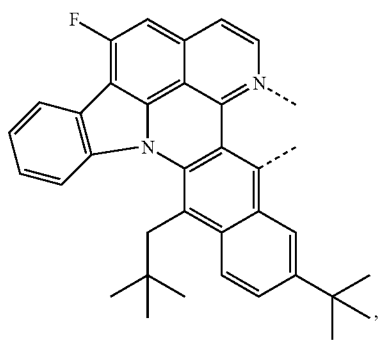
$L_{a553}$
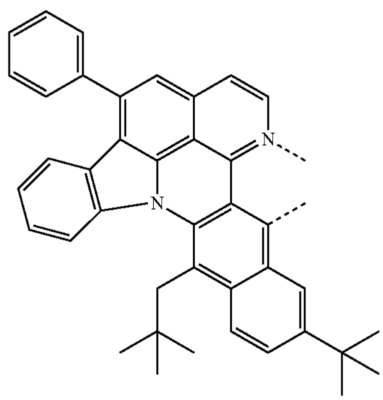
$L_{a554}$
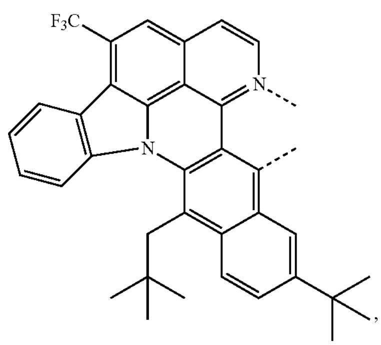
$L_{a555}$
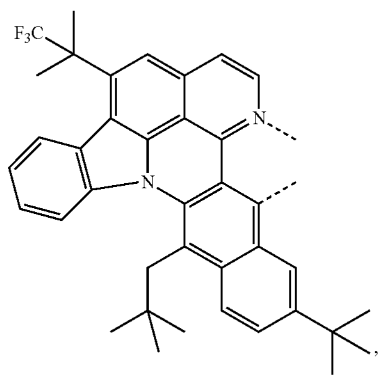
$L_{a556}$
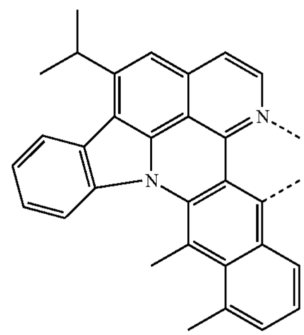
$L_{a557}$
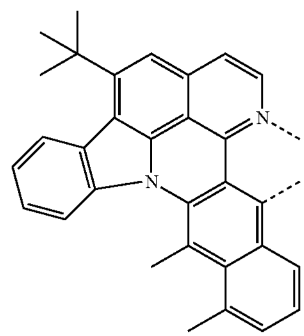
$L_{a558}$
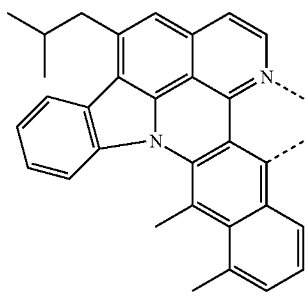
$L_{a559}$
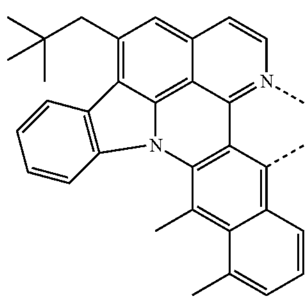
$L_{a560}$
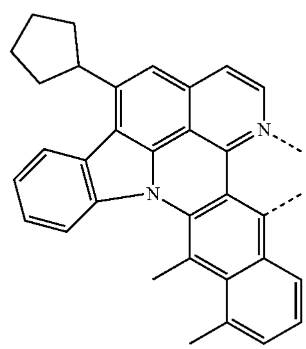

$L_{a561}$
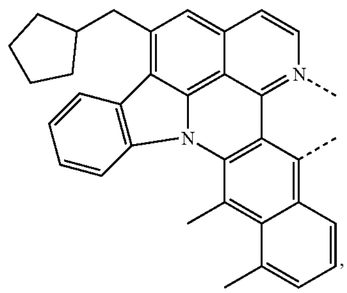
$L_{a562}$
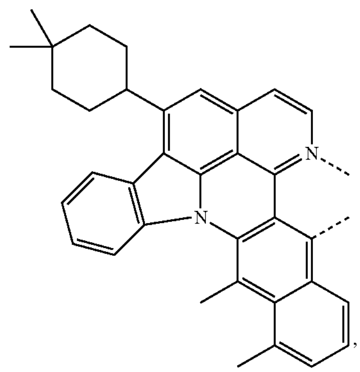
$L_{a563}$
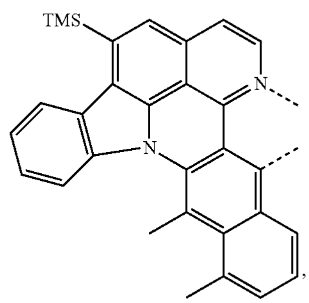
$L_{a564}$
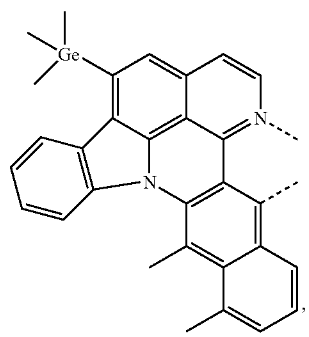
$L_{a565}$
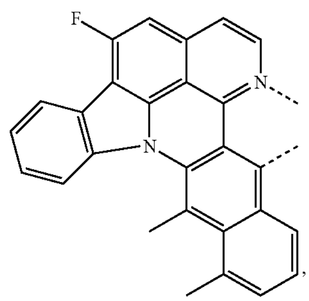
$L_{a566}$
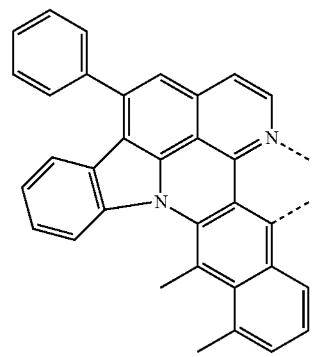
$L_{a567}$
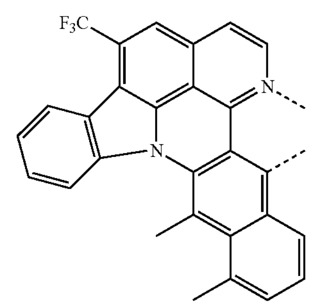
$L_{a568}$
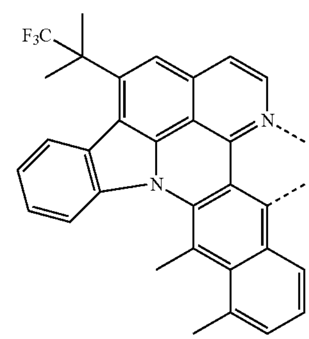
$L_{a569}$
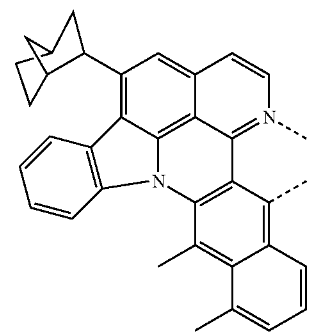

-continued
$L_{a570}$
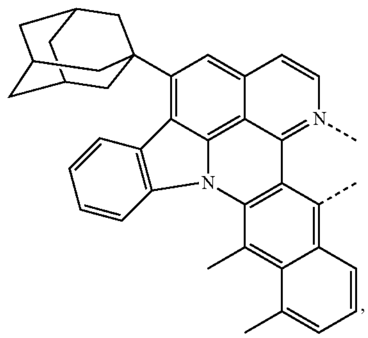
,
$L_{a571}$
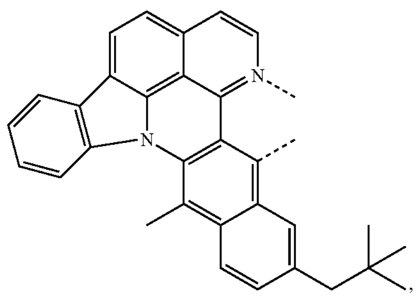
,
$L_{a572}$
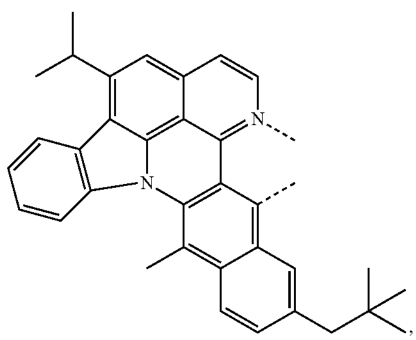
,
$L_{a573}$
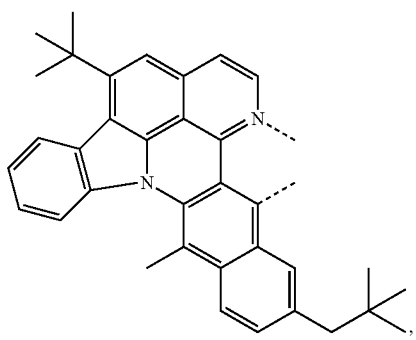
,
$L_{a574}$
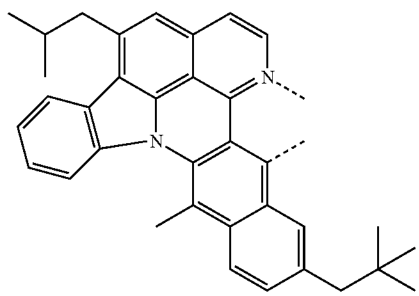
,
-continued
$L_{a575}$
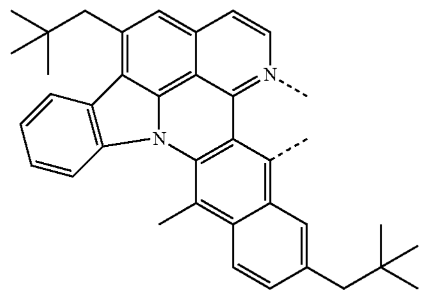
,
$L_{a576}$
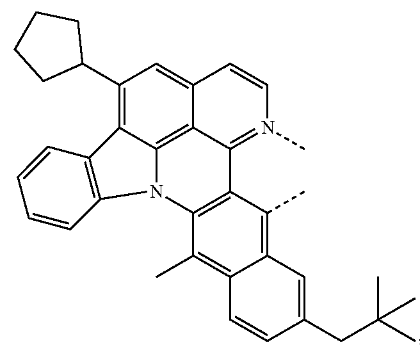
,
$L_{a577}$
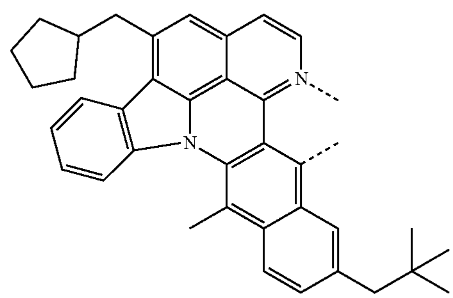
,
$L_{a578}$
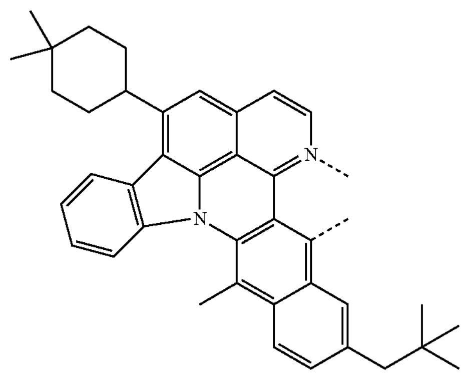
,
$L_{a579}$
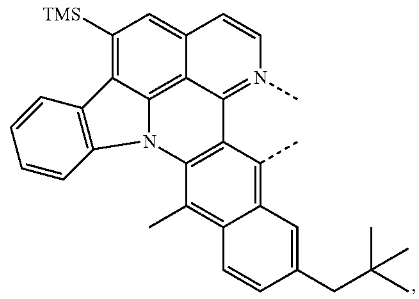
, -continued
$L_{a580}$
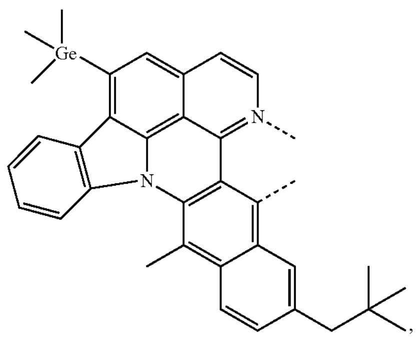
$L_{a581}$
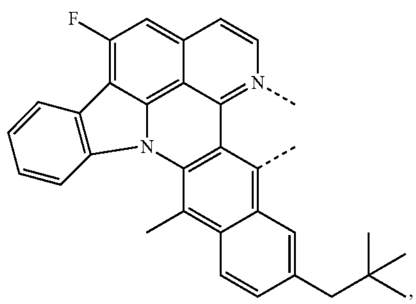
$L_{a582}$
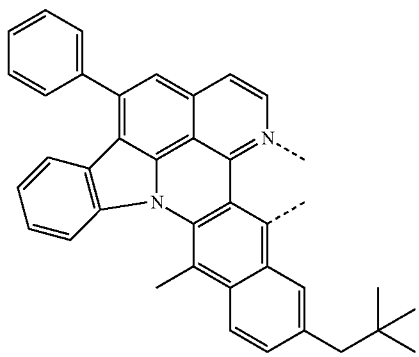
$L_{a583}$
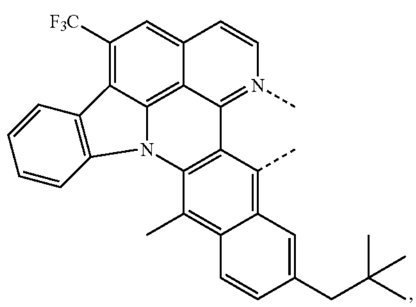
-continued
$L_{a584}$
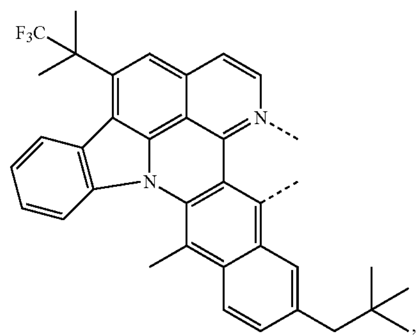
$L_{a585}$
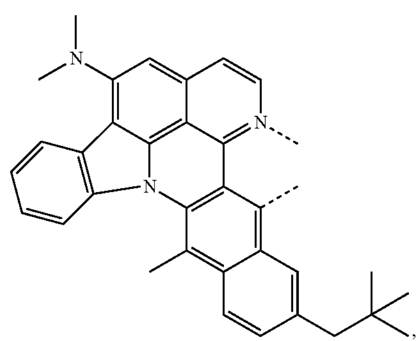
$L_{a586}$
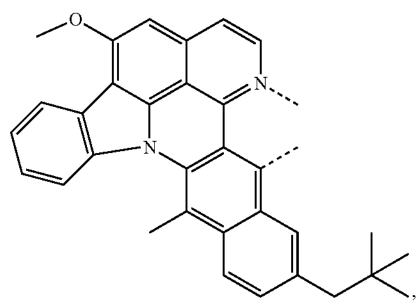
$L_{a587}$
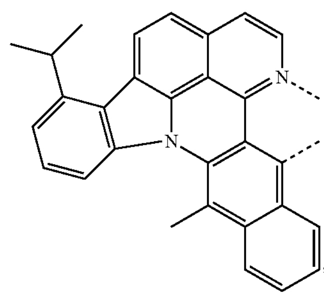
$L_{a588}$
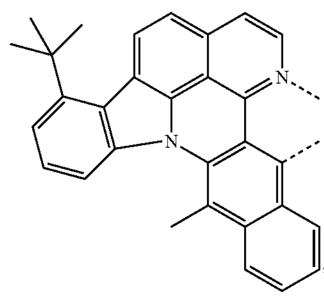

-continued
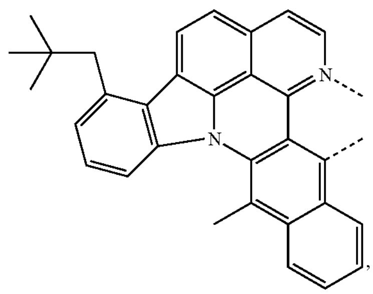
$L_{a589}$
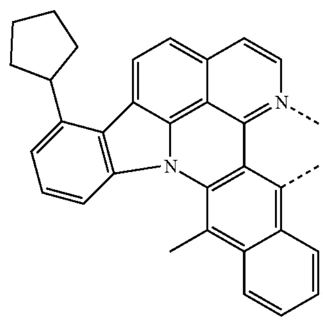
$L_{a590}$
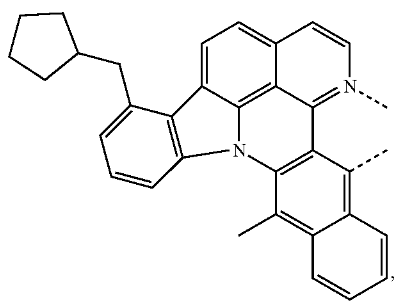
$L_{a591}$
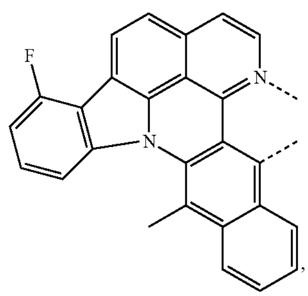
$L_{a592}$
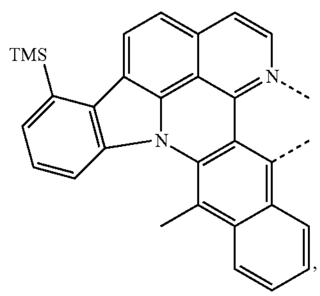
$L_{a593}$
-continued
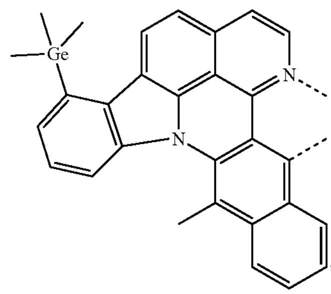
$L_{a594}$
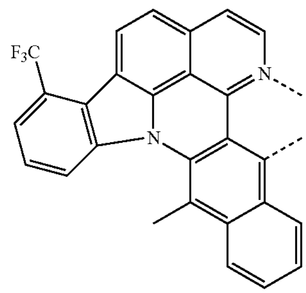
$L_{a595}$
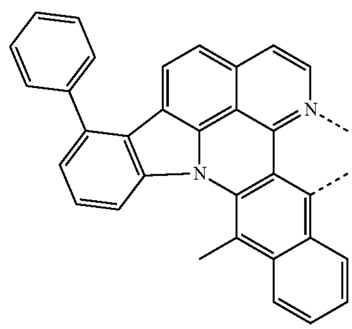
$L_{a596}$
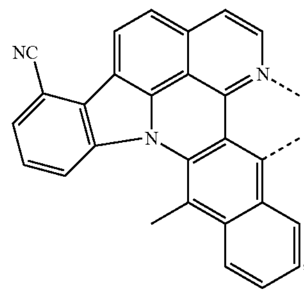
$L_{a597}$
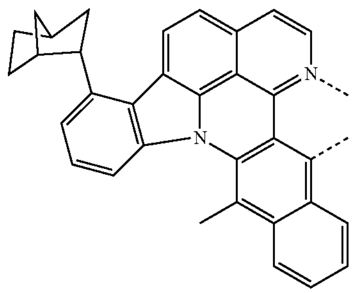
$L_{a598}$ -continued
$L_{a599}$
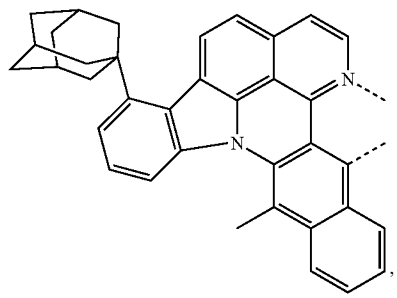
,
$L_{a600}$
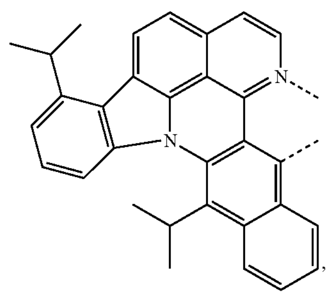
,
$L_{a601}$
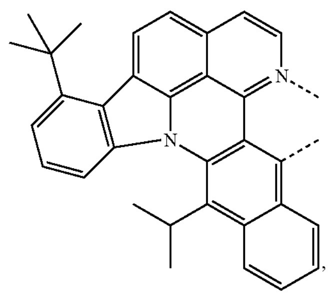
,
$L_{a602}$
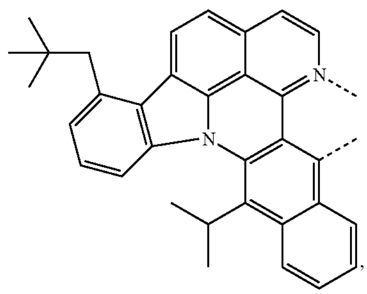
,
$L_{a603}$
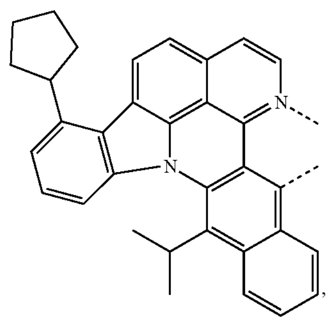
,
-continued
$L_{a604}$
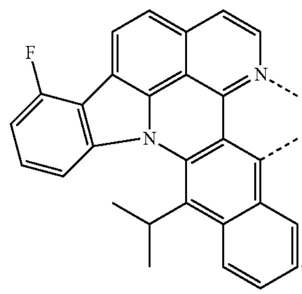
,
$L_{a605}$
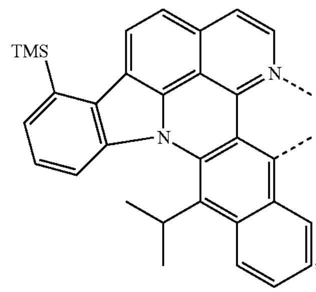
,
$L_{a606}$
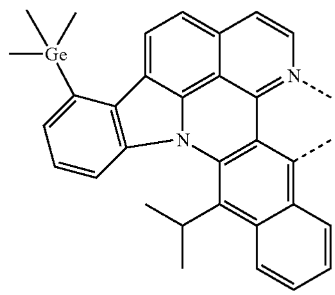
,
$L_{a607}$
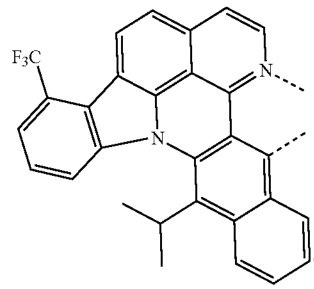
,
$L_{a608}$
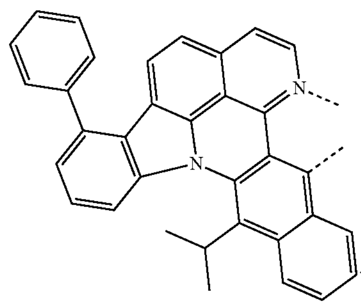
, -continued
$L_{a609}$
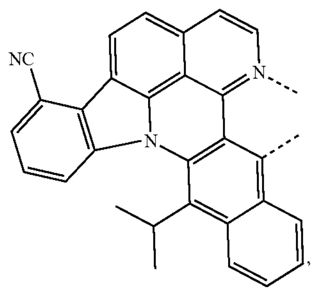
$L_{a610}$
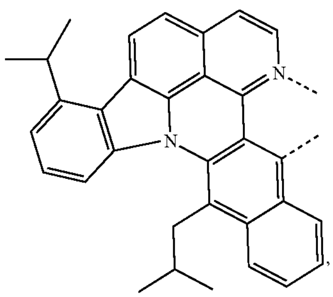
$L_{a611}$
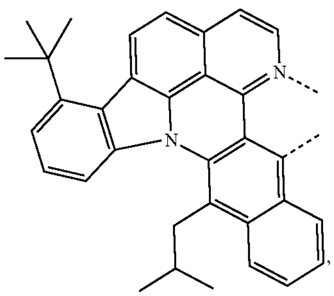
$L_{a612}$
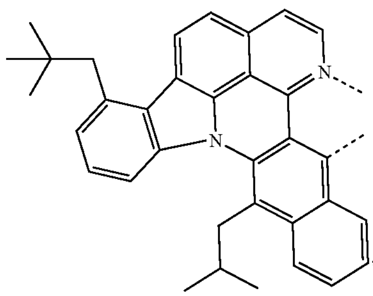
$L_{a613}$
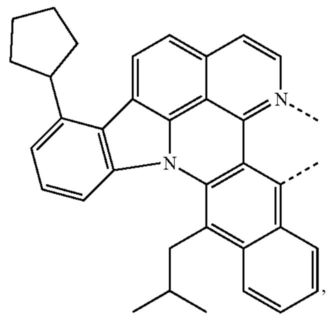
-continued
$L_{a614}$
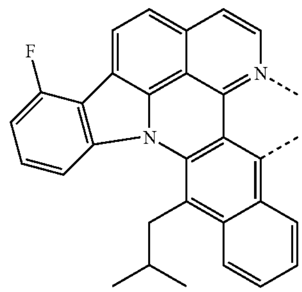
$L_{a615}$
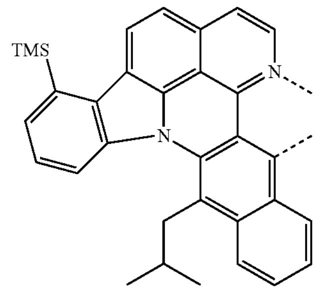
$L_{a616}$
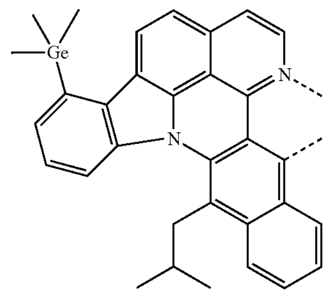
$L_{a617}$
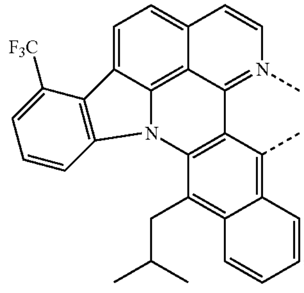
$L_{a618}$
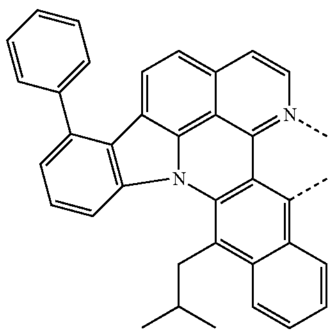

$L_{a619}$
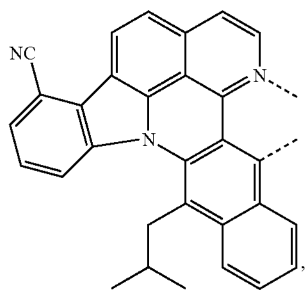
$L_{a620}$
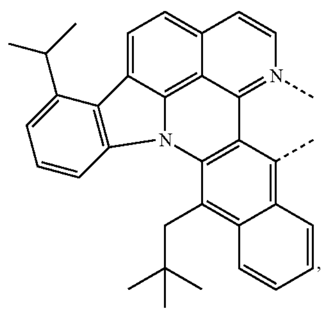
$L_{a621}$
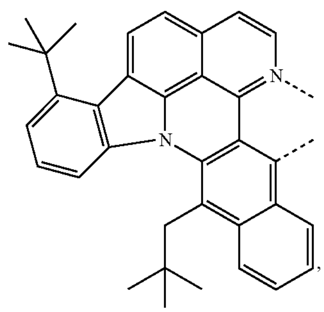
$L_{a622}$
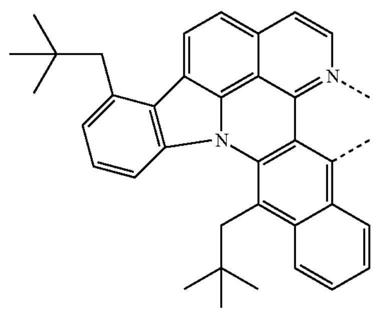
$L_{a623}$
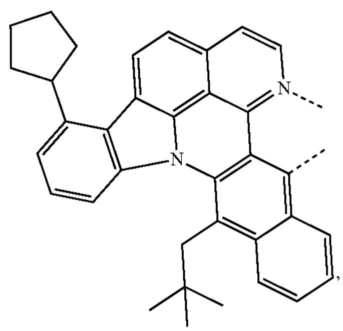
$L_{a624}$
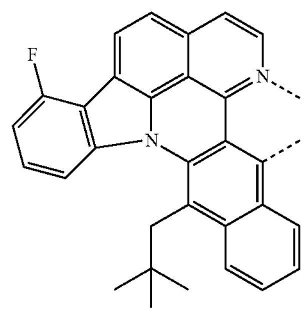
$L_{a625}$
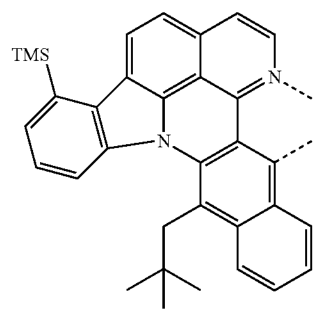
$L_{a626}$
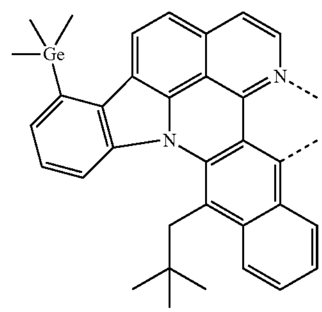
$L_{a627}$
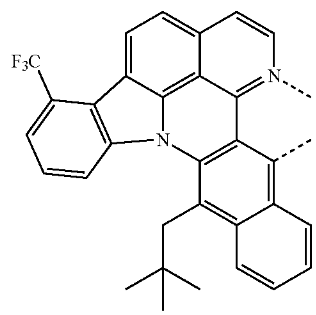

-continued
$L_{a628}$
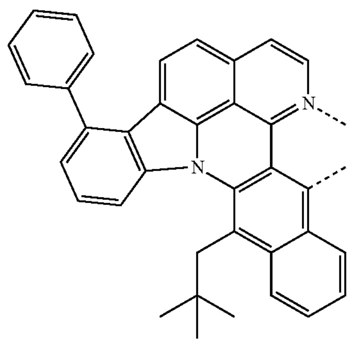
$L_{a629}$
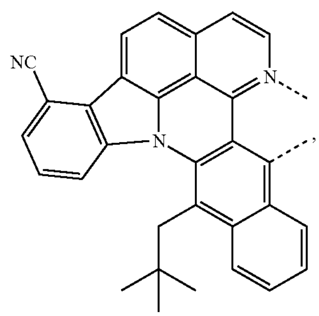
$L_{a630}$
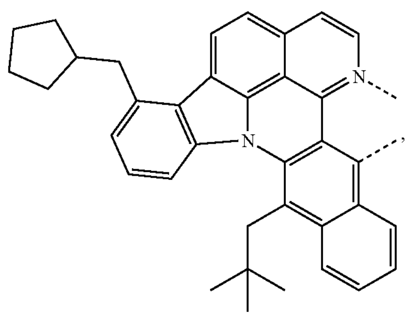
$L_{a631}$
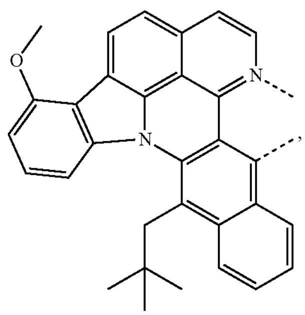
$L_{a632}$
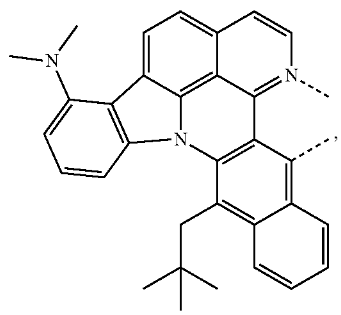
-continued
$L_{a633}$
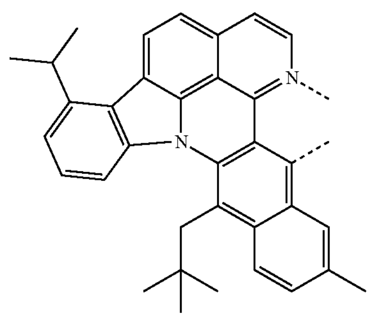
$L_{a634}$
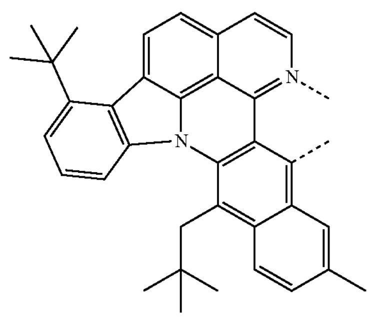
$L_{a635}$
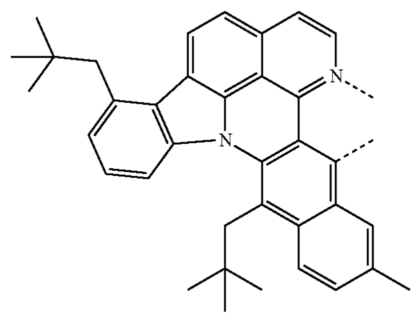
$L_{a636}$
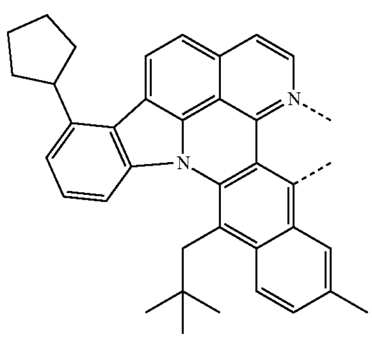
$L_{a637}$
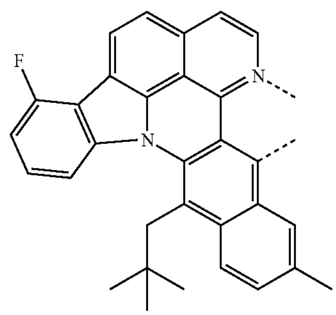

-continued
$L_{a638}$
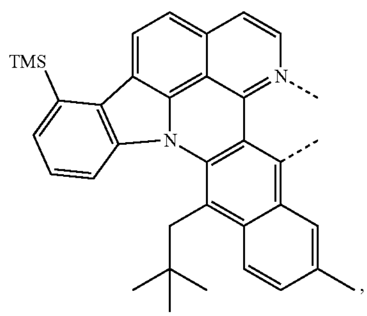
$L_{a639}$
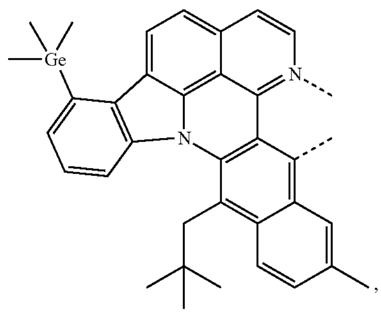
$L_{a640}$
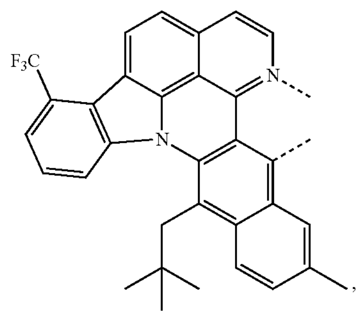
$L_{a641}$
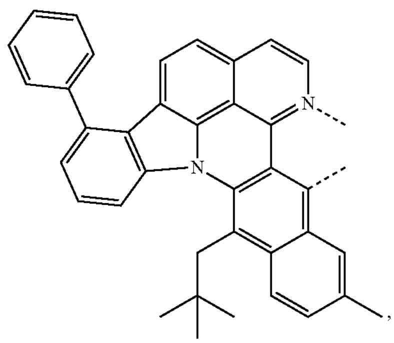
$L_{a642}$
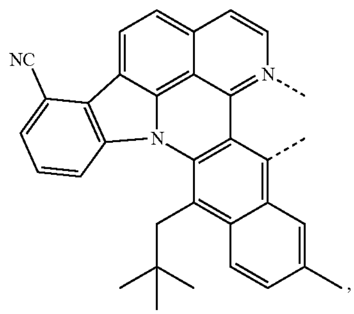
-continued
$L_{a643}$
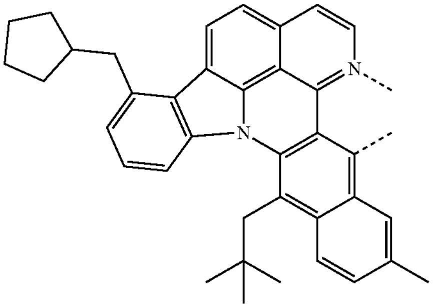
$L_{a644}$
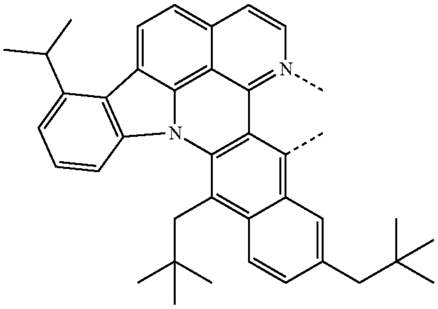
$L_{a645}$
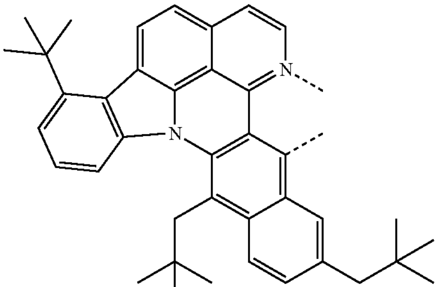
$L_{a646}$
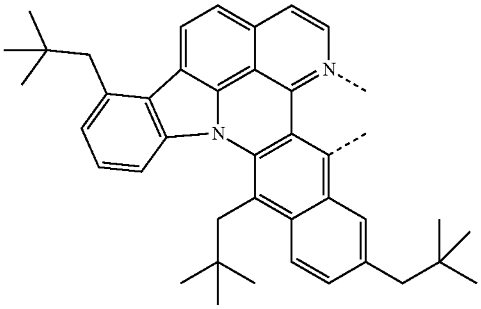
$L_{a647}$
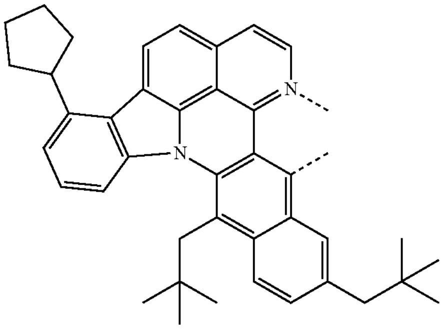

-continued
$L_{a648}$
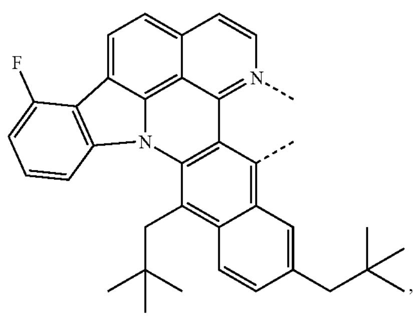
$L_{a649}$
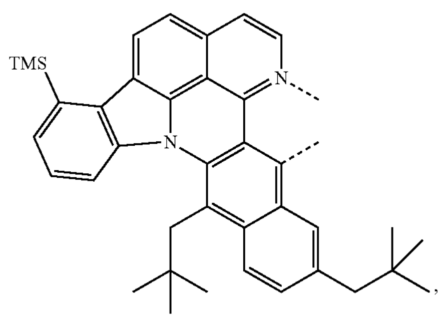
$L_{a650}$
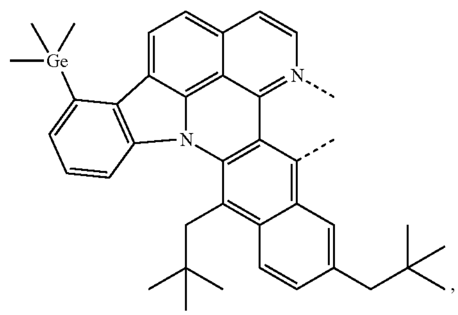
$L_{a651}$
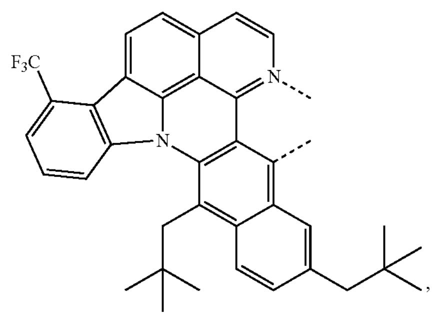
$L_{a652}$
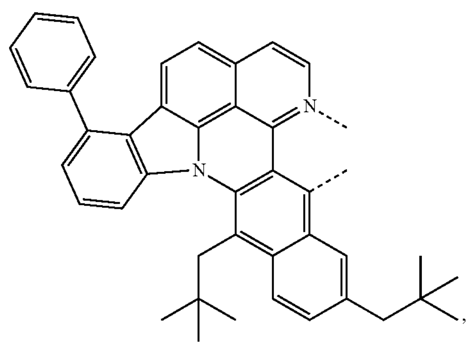
-continued
$L_{a653}$
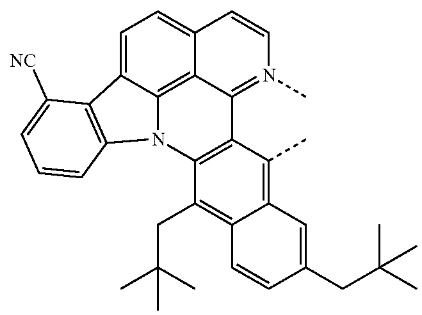
$L_{a654}$
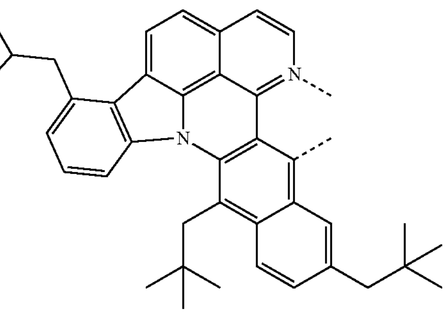
$L_{a655}$
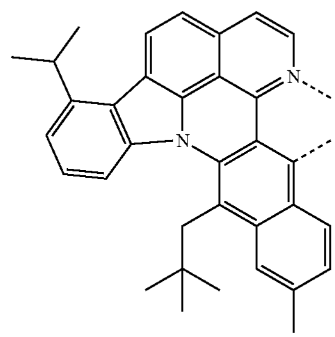
$L_{a656}$
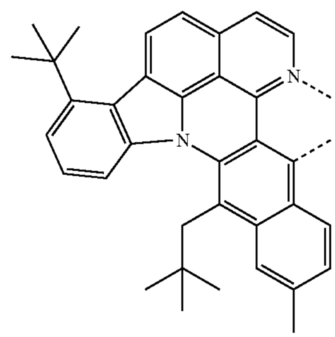

-continued
$L_{a657}$
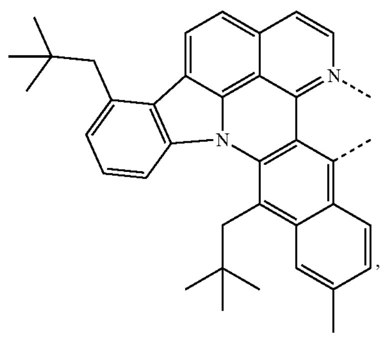
$L_{a658}$
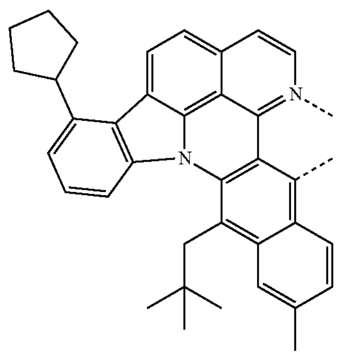
$L_{a659}$
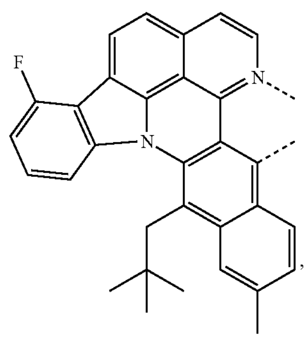
$L_{a660}$
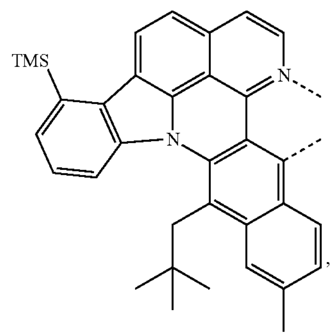
-continued
$L_{a661}$
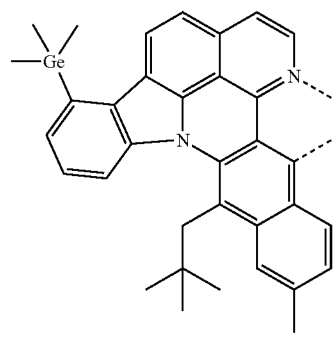
$L_{a662}$
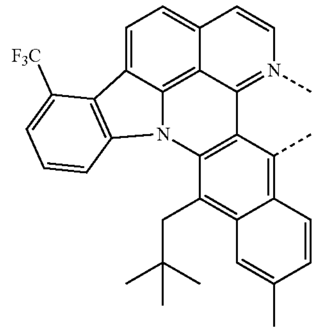
$L_{a663}$
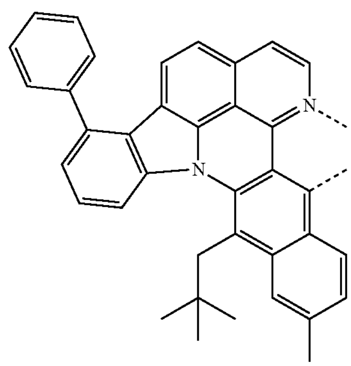
$L_{a664}$
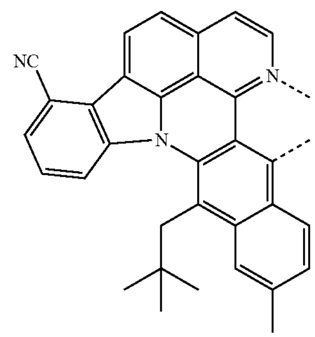

-continued
$L_{a665}$
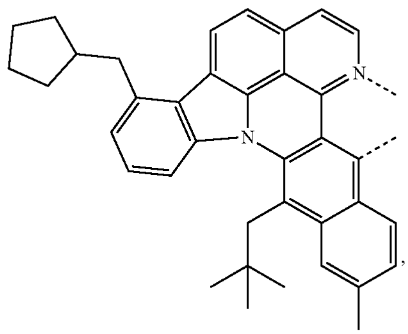
$L_{a666}$
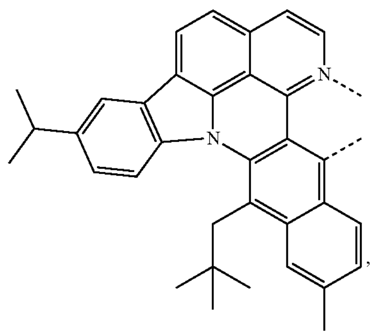
$L_{a667}$
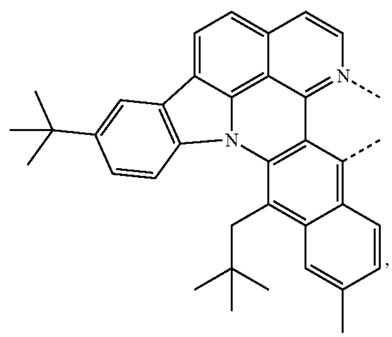
$L_{a668}$
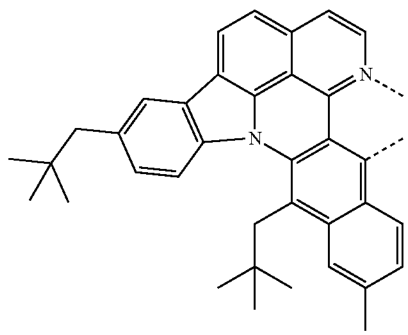
$L_{a669}$
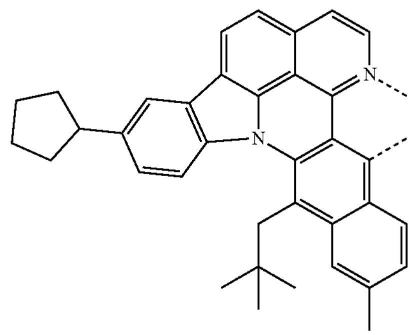
$L_{a670}$
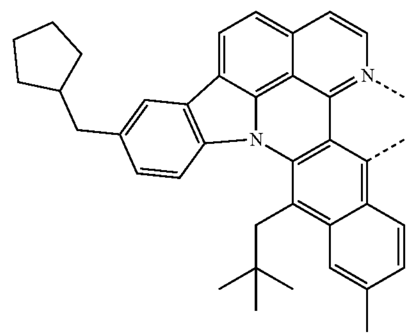
$L_{a671}$
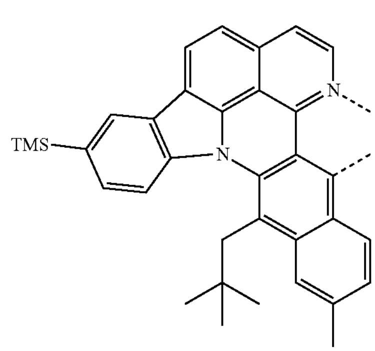
$L_{a672}$
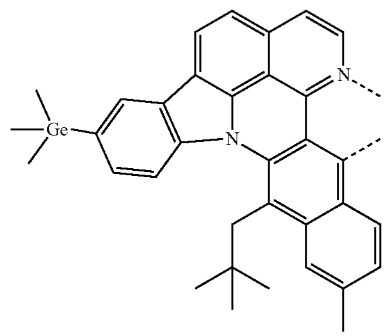

-continued
$L_{a673}$
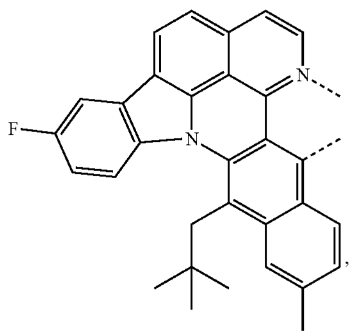
$L_{a674}$
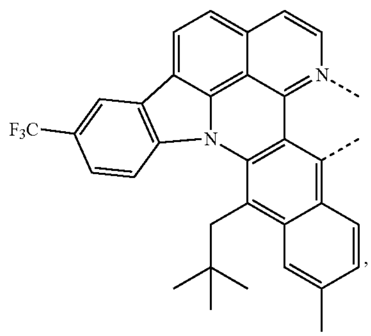
$L_{a675}$
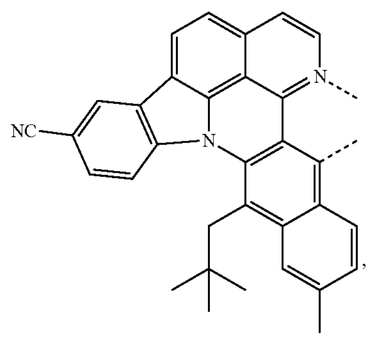
$L_{a676}$
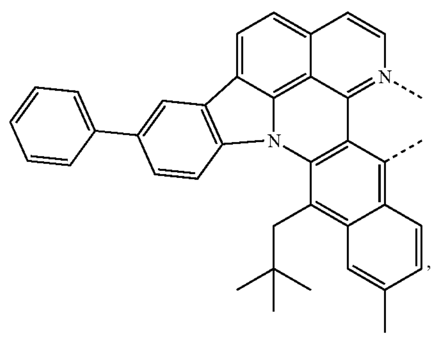
-continued
$L_{a677}$
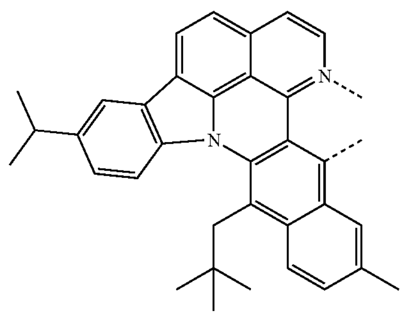
$L_{a678}$
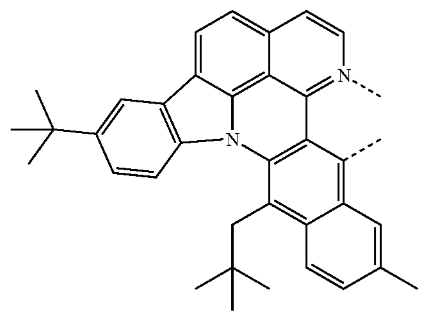
$L_{a679}$
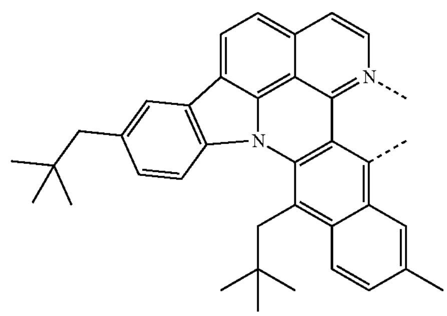
$L_{a680}$
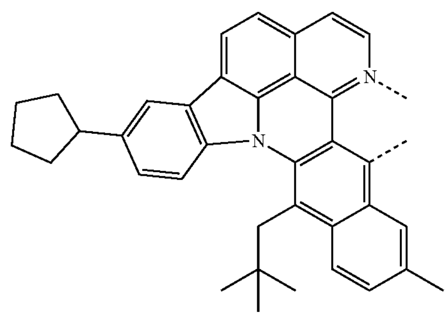
$L_{a681}$
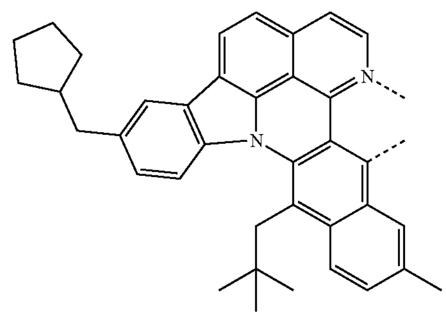

-continued
$L_{a682}$
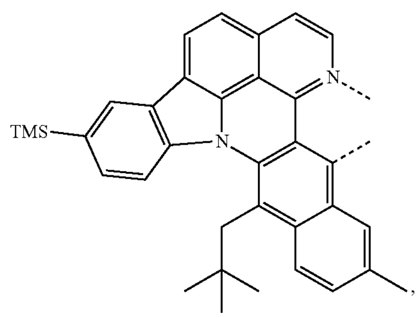
$L_{a683}$
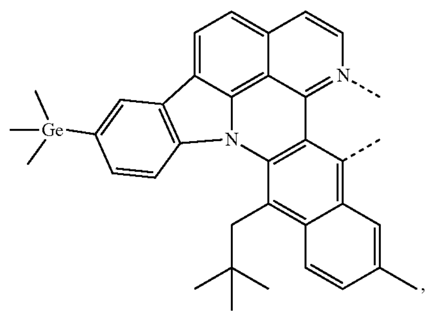
$L_{a684}$
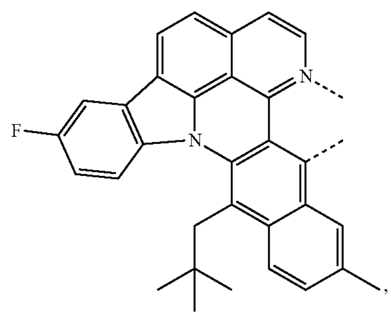
$L_{a685}$
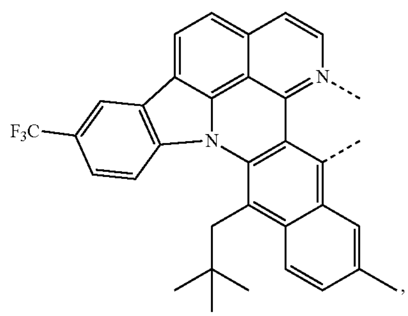
$L_{a686}$
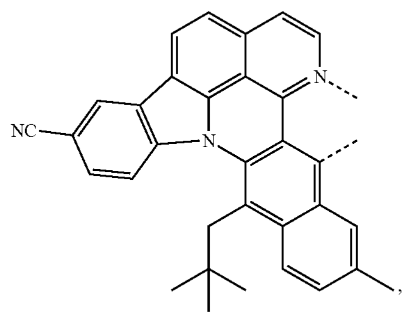
-continued
$L_{a687}$
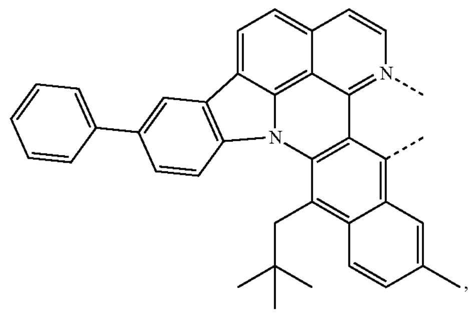
$L_{a688}$
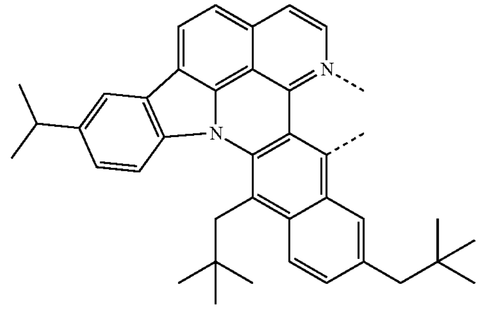
$L_{a689}$
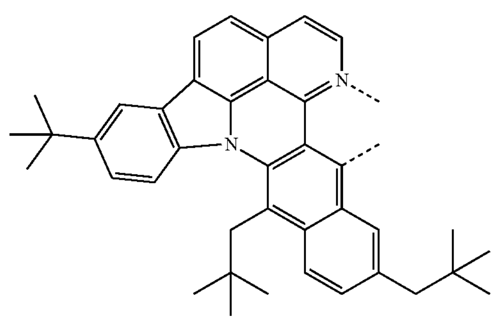
$L_{a690}$
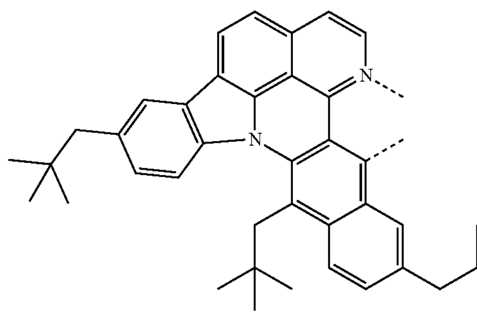
$L_{a691}$
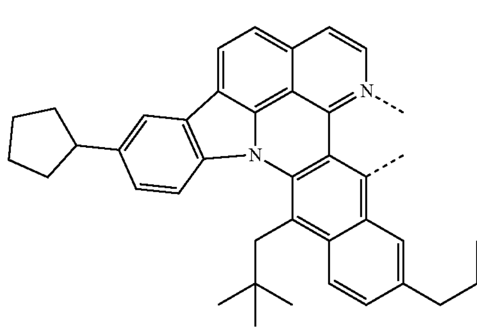

-continued
$L_{a692}$
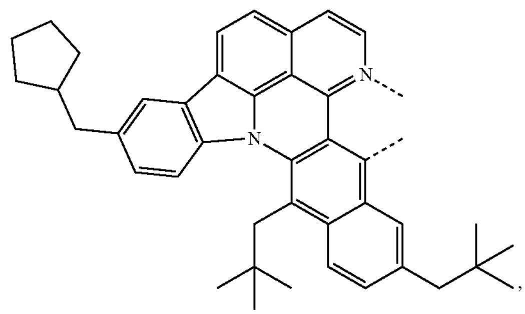
$L_{a693}$
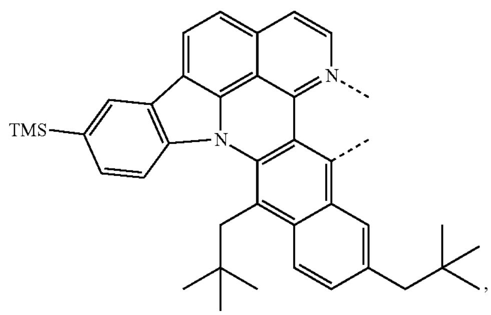
$L_{a694}$
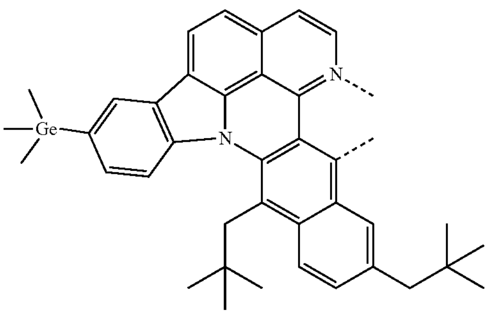
$L_{a695}$
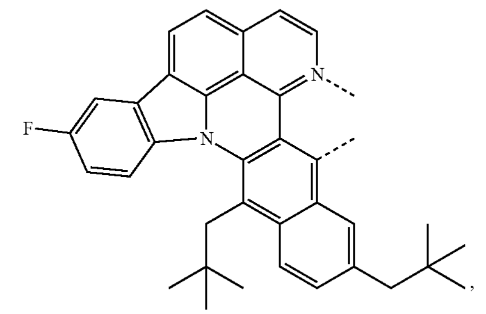
$L_{a696}$
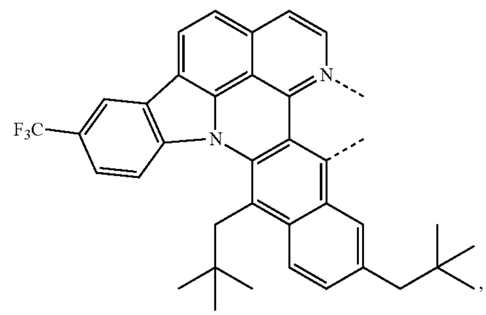
-continued
$L_{a697}$
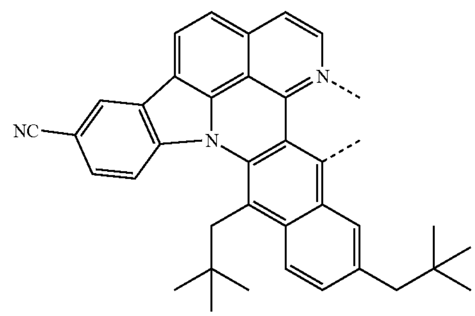
$L_{a698}$
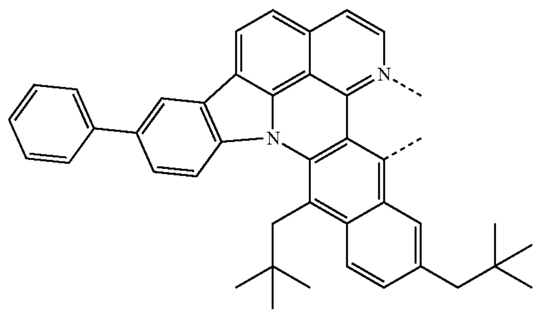
$L_{a699}$
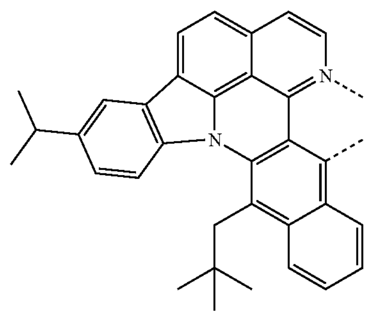
$L_{a700}$
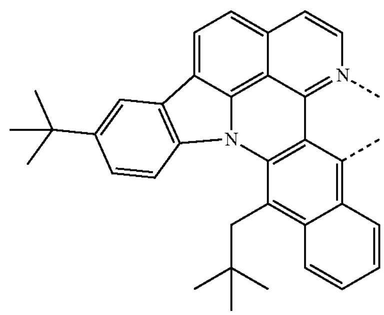
$L_{a701}$
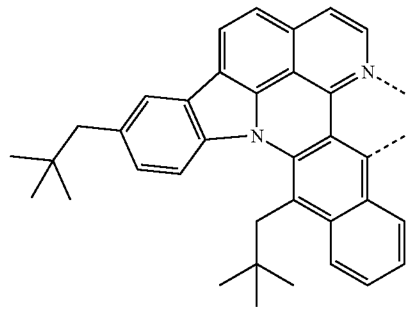

-continued
$L_{a702}$
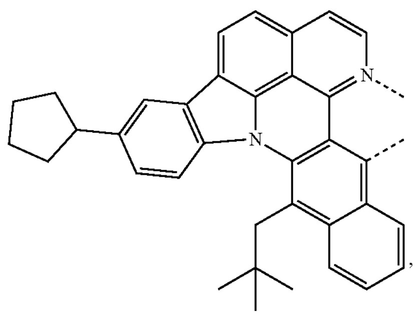
$L_{a703}$
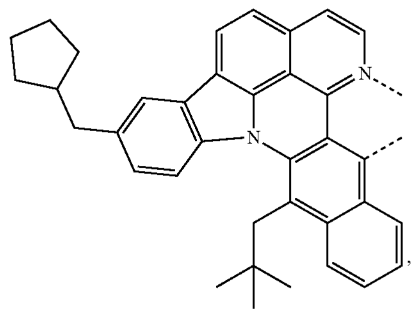
$L_{a704}$
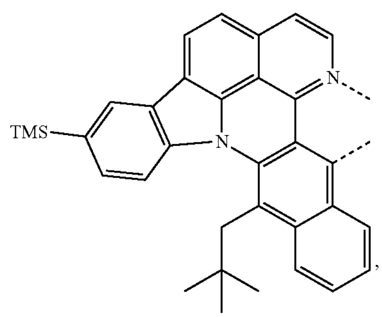
$L_{a705}$
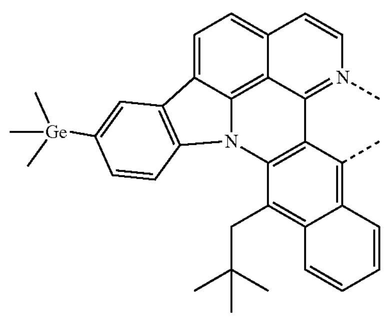
$L_{a706}$
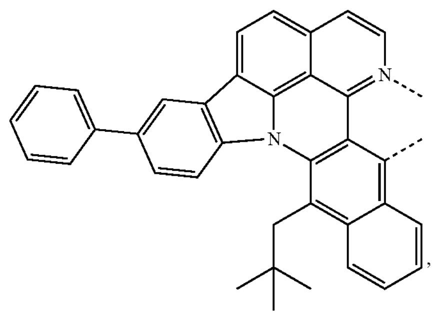
-continued
$L_{a707}$
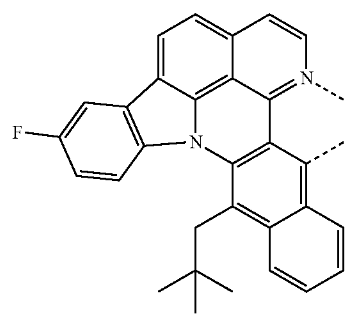
$L_{a708}$
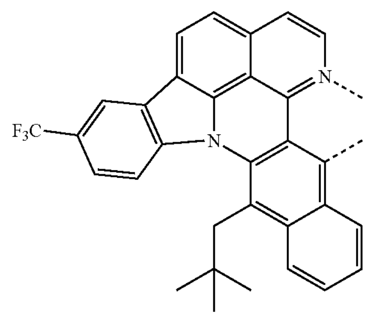
$L_{a709}$
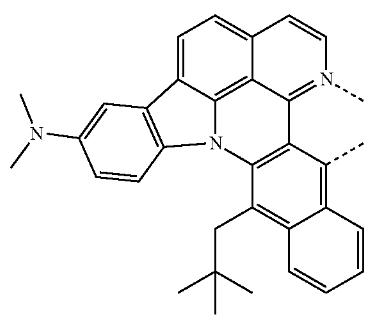
$L_{a710}$
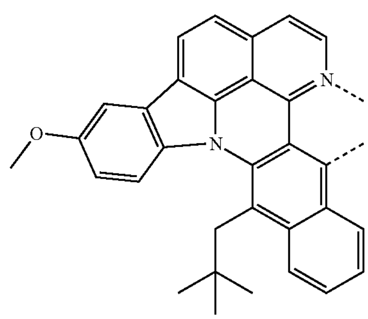
$L_{a711}$
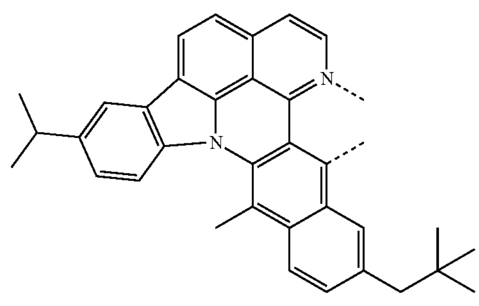

-continued
$L_{a712}$
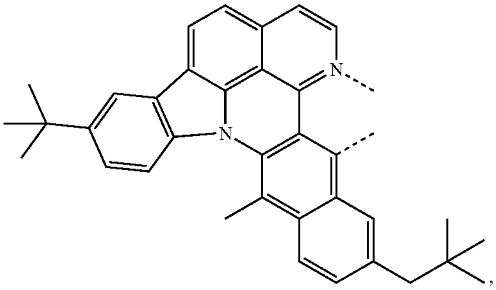
$L_{a713}$
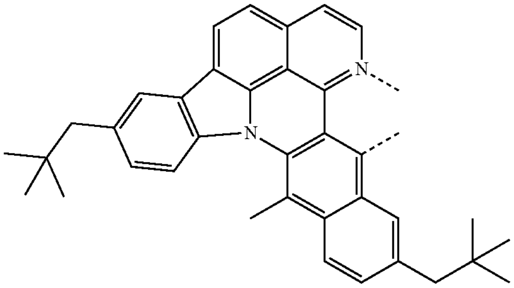
$L_{a714}$
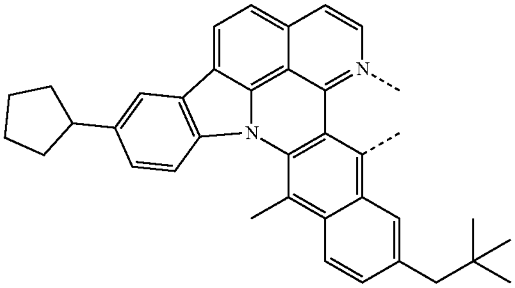
$L_{a715}$
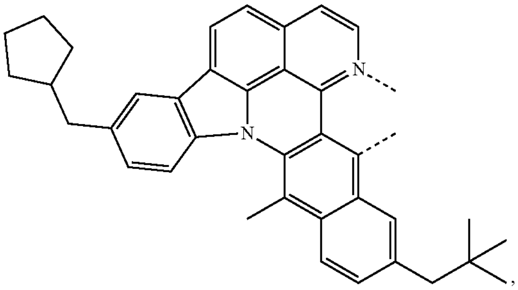
$L_{a716}$
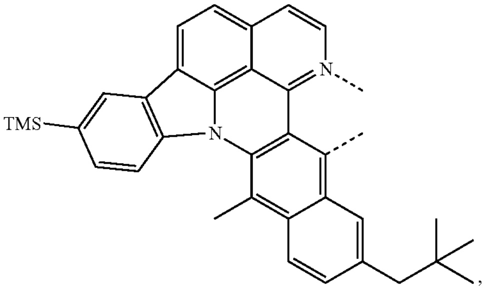
-continued
$L_{a717}$
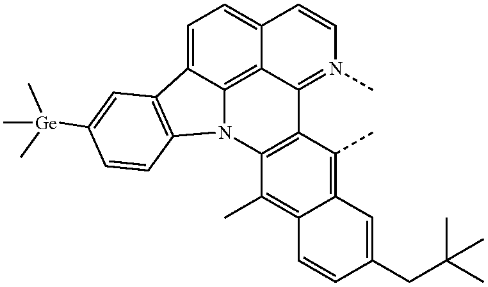
$L_{a718}$
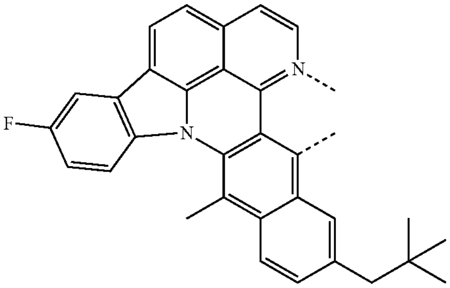
$L_{a719}$
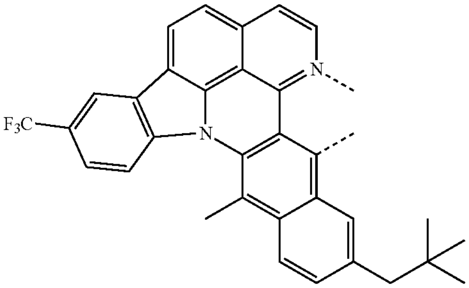
$L_{a720}$
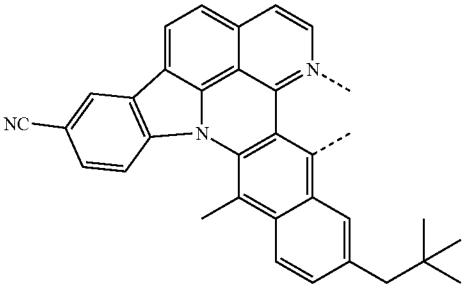
$L_{a721}$
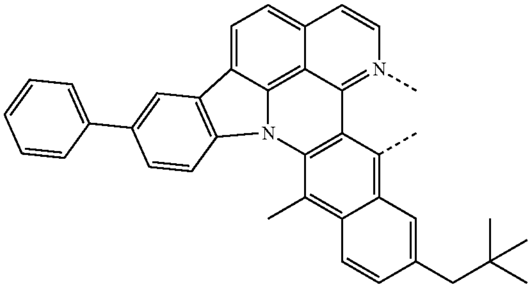

-continued
$L_{a722}$
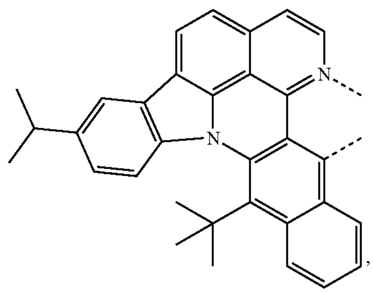
$L_{a723}$
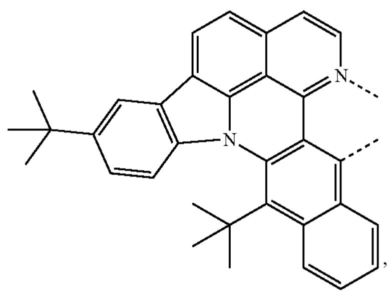
$L_{a724}$
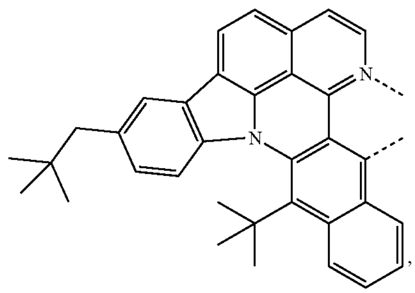
$L_{a725}$
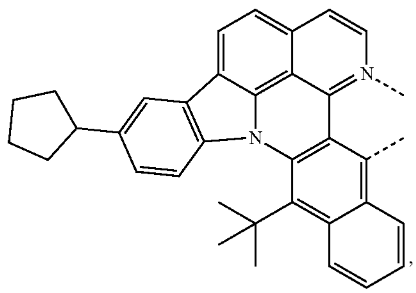
$L_{a726}$
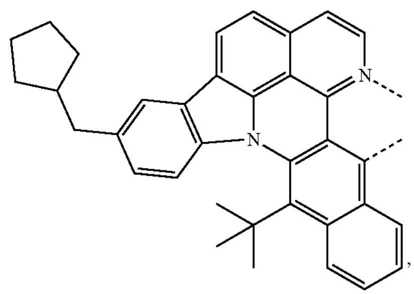
-continued
$L_{a727}$
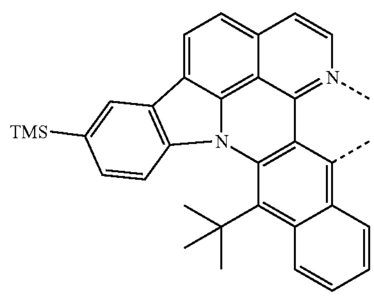
$L_{a728}$
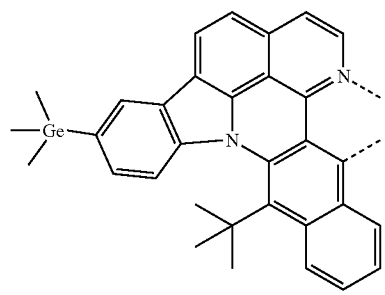
$L_{a729}$
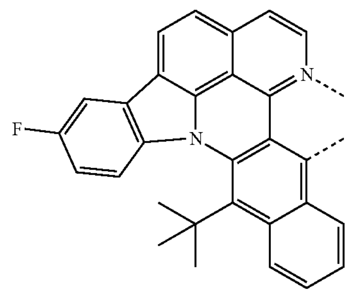
$L_{a730}$
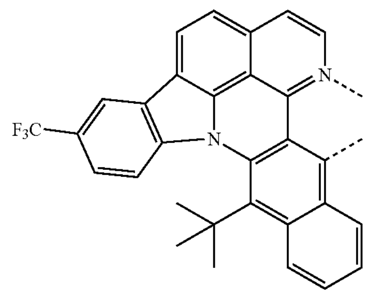
$L_{a731}$
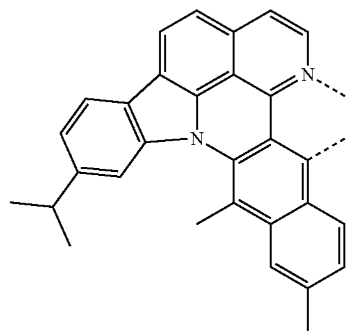

$L_{a732}$
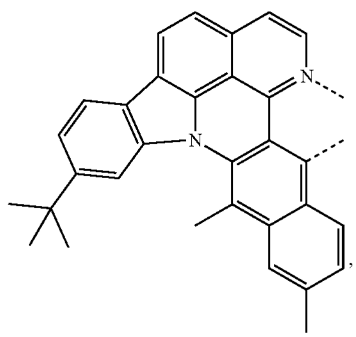
$L_{a733}$
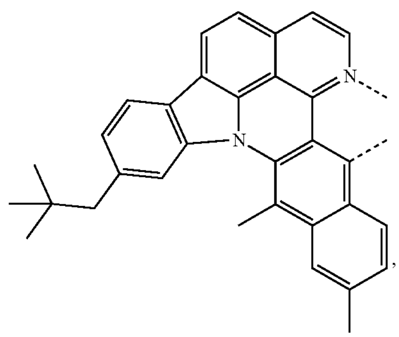
$L_{a734}$
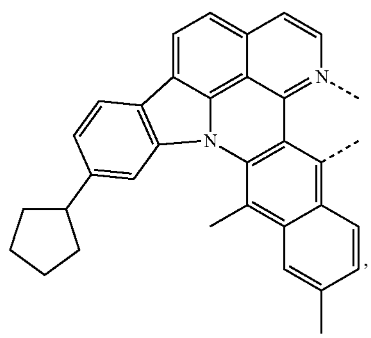
$L_{a735}$
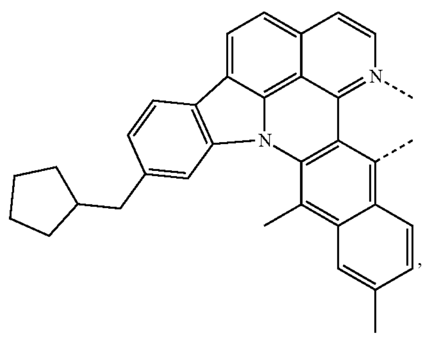
$L_{a736}$
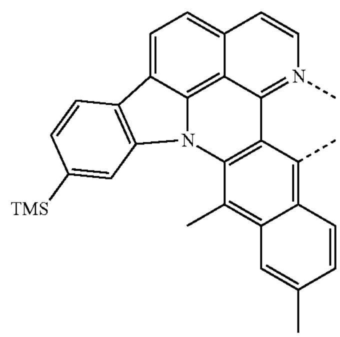
$L_{a737}$
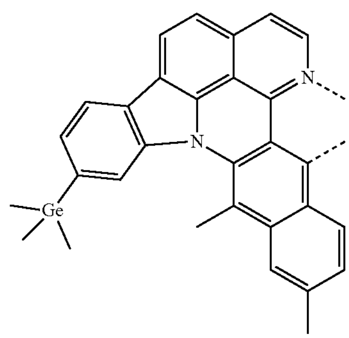
$L_{a738}$
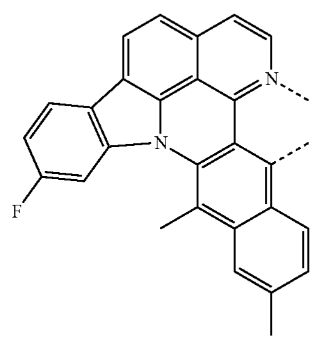
$L_{a739}$
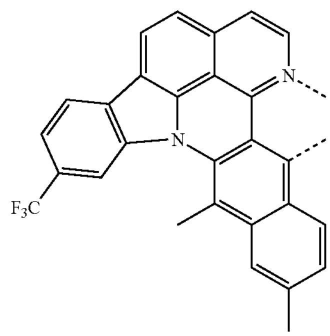

-continued
$L_{a740}$
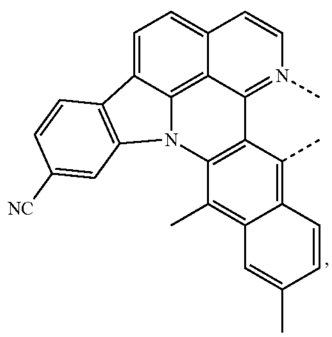
$L_{a741}$
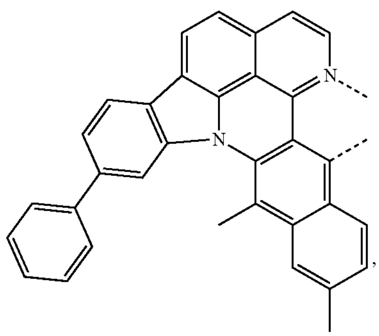
$L_{a742}$
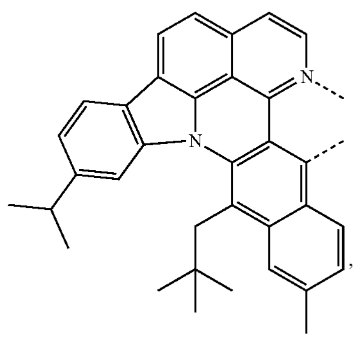
$L_{a743}$
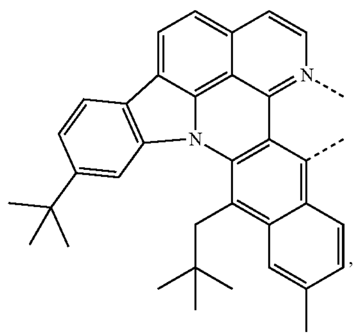
-continued
$L_{a744}$
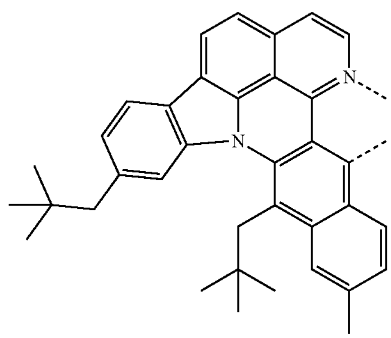
$L_{a745}$
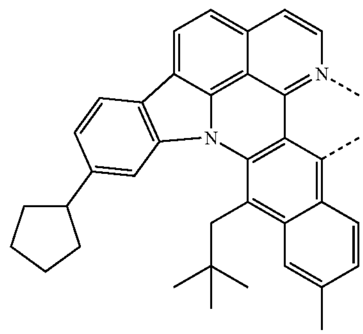
$L_{a746}$
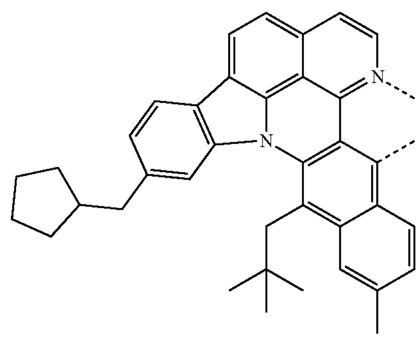
$L_{a747}$
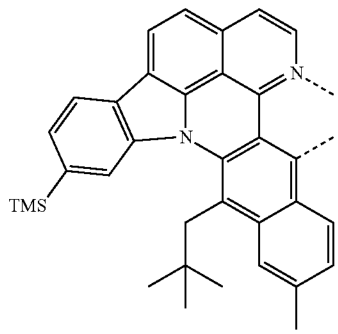

-continued
$L_{a748}$
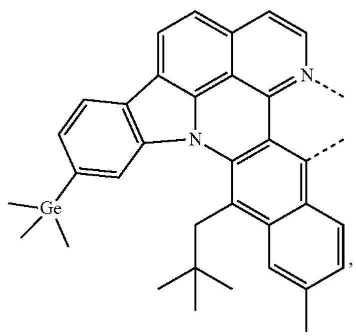
$L_{a749}$
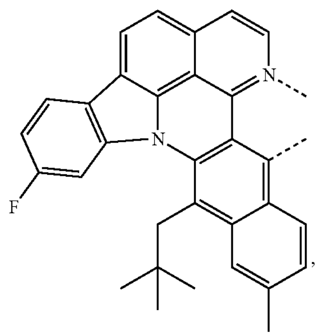
$L_{a750}$
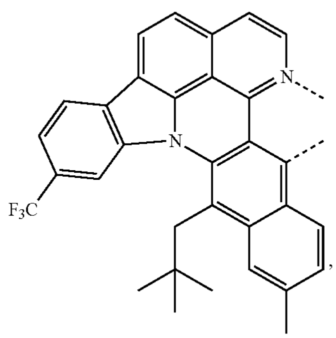
$L_{a751}$
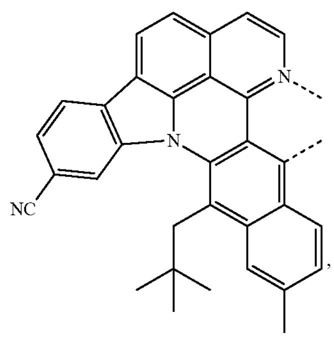
-continued
$L_{a752}$
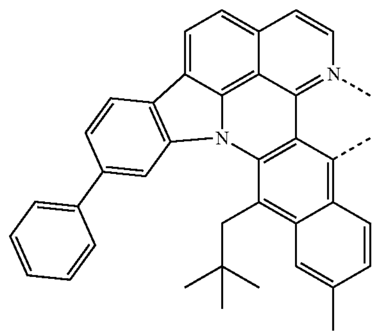
$L_{a753}$
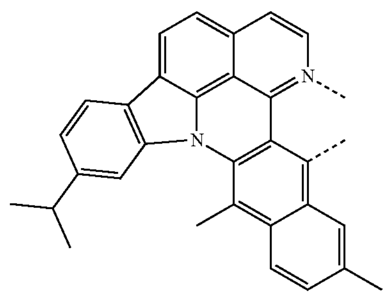
$L_{a754}$
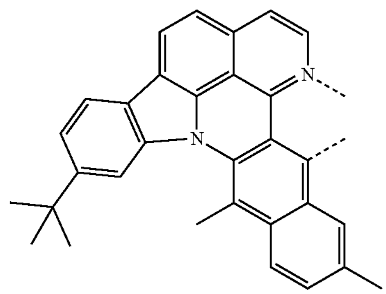
$L_{a755}$
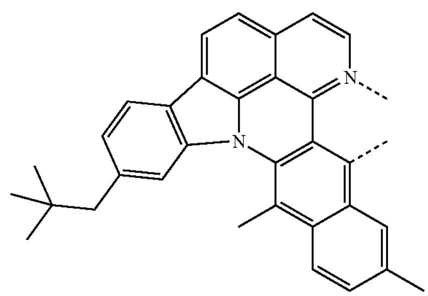
$L_{a756}$
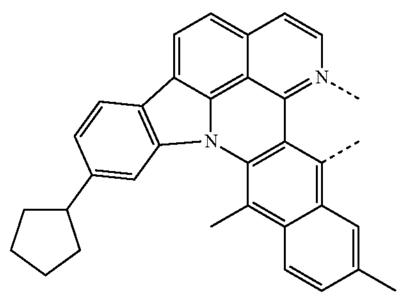

-continued
$L_{a757}$
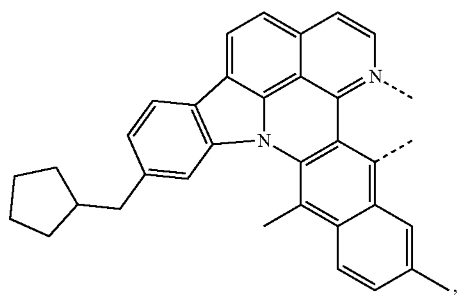
$L_{a758}$
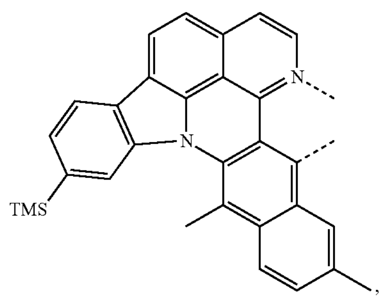
$L_{a759}$
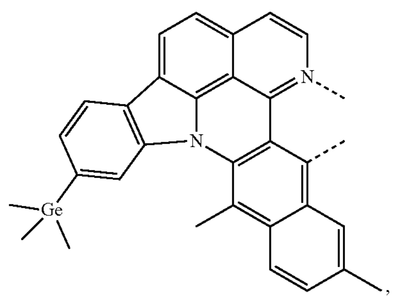
$L_{a760}$
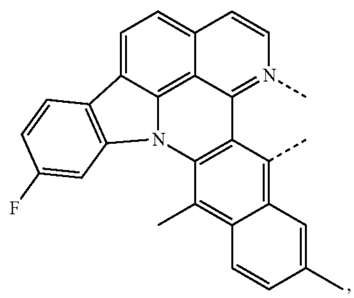
$L_{a761}$
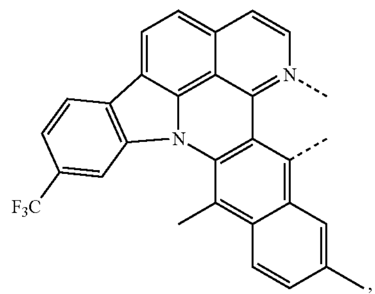
-continued
$L_{a762}$
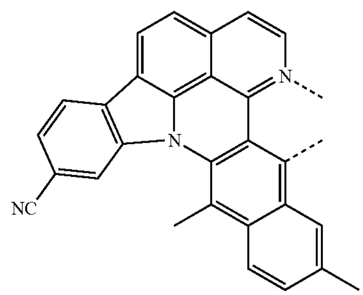
$L_{a763}$
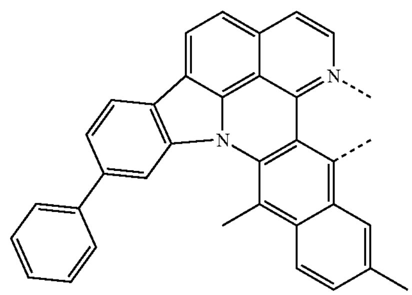
$L_{a764}$
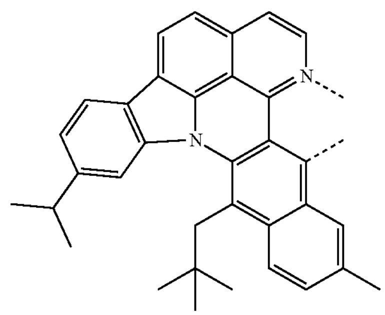
$L_{a765}$
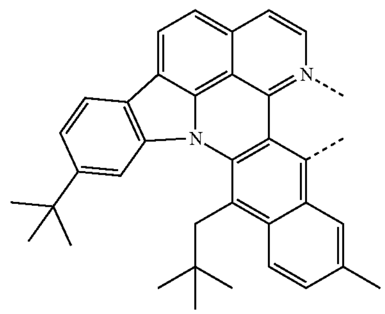
$L_{a766}$
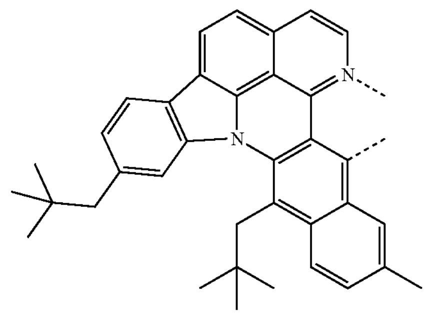

-continued
$L_{a767}$
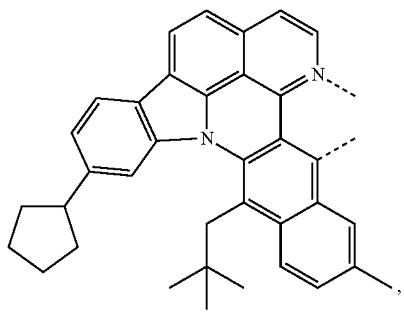
$L_{a768}$
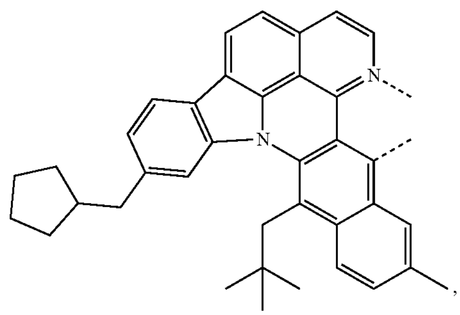
$L_{a769}$
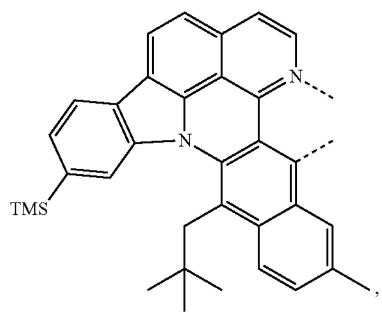
$L_{a770}$
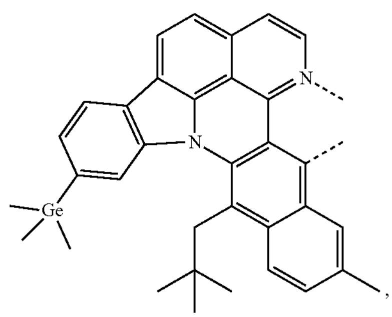
$L_{a771}$
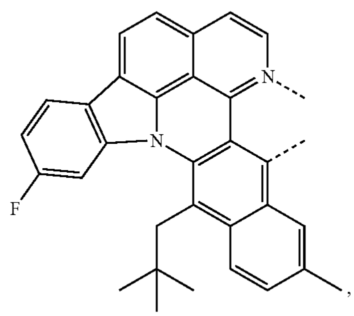
-continued
$L_{a772}$
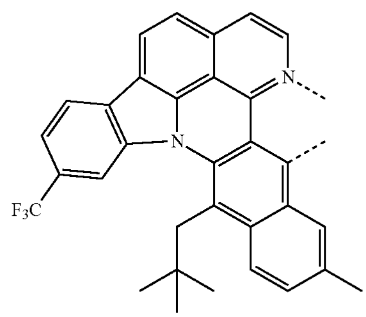
$L_{a773}$
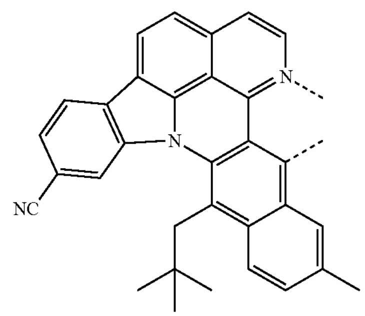
$L_{a774}$
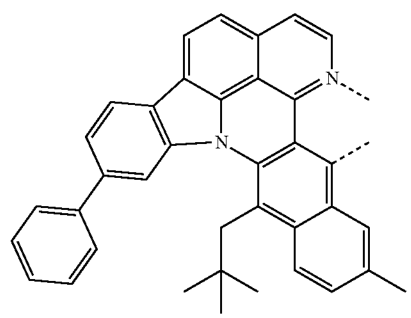
$L_{a775}$
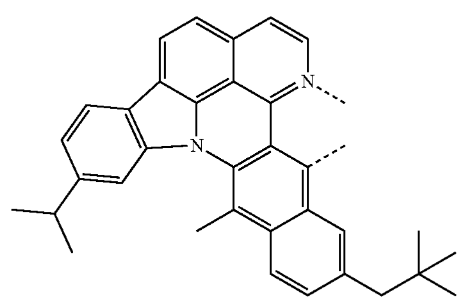
$L_{a776}$
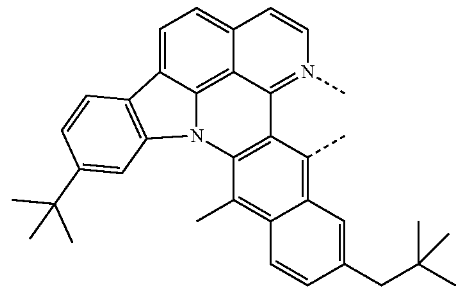

$L_{a777}$
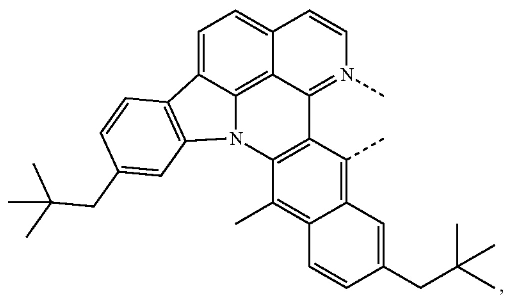
$L_{a778}$
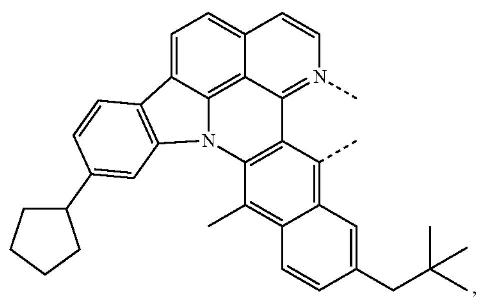
$L_{a779}$
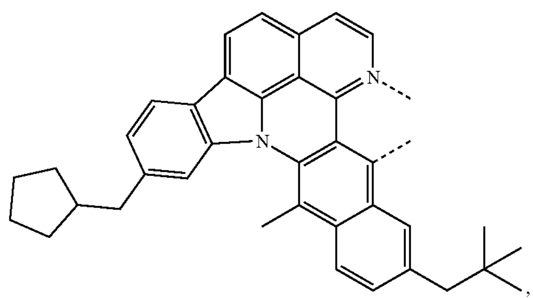
$L_{a780}$
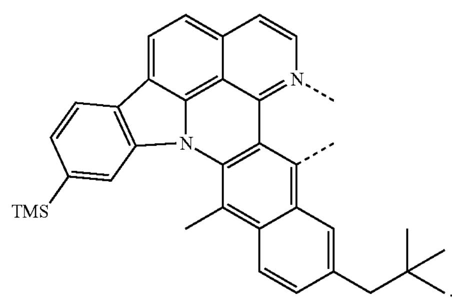
$L_{a781}$
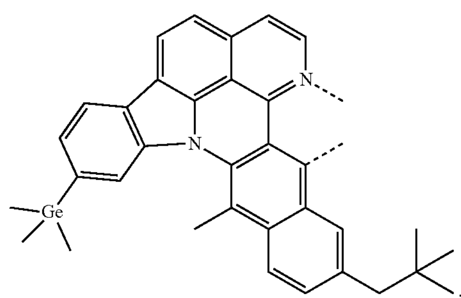
$L_{a782}$
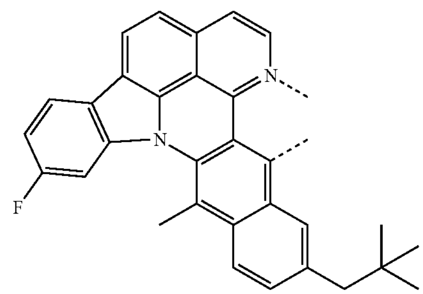
$L_{a783}$
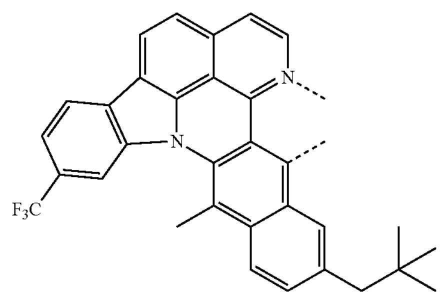
$L_{a784}$
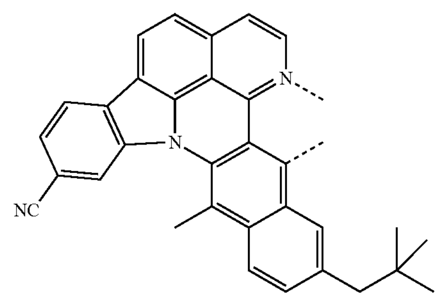
$L_{a785}$
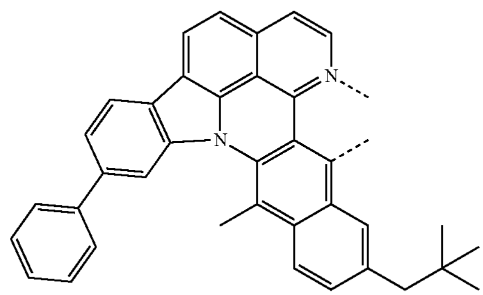
$L_{a786}$
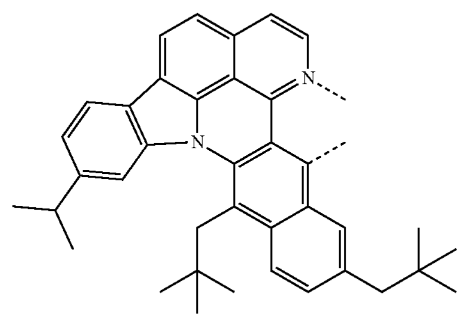

-continued
$L_{a787}$
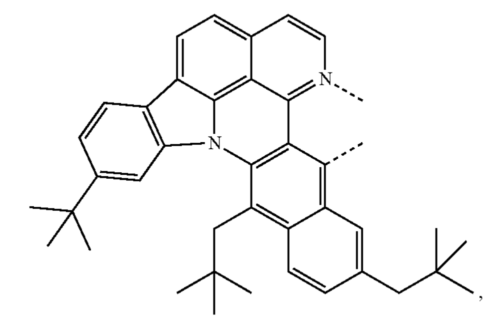
$L_{a788}$
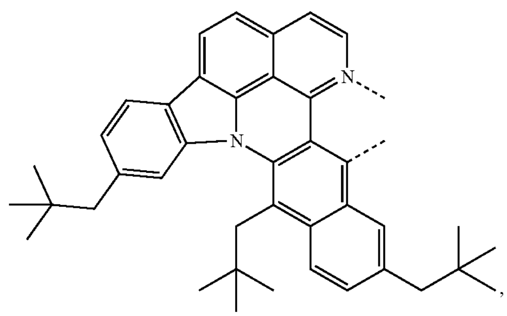
$L_{a789}$
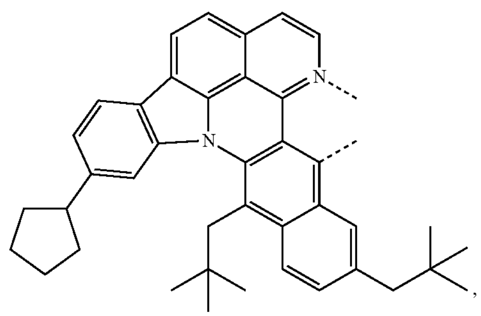
$L_{a790}$
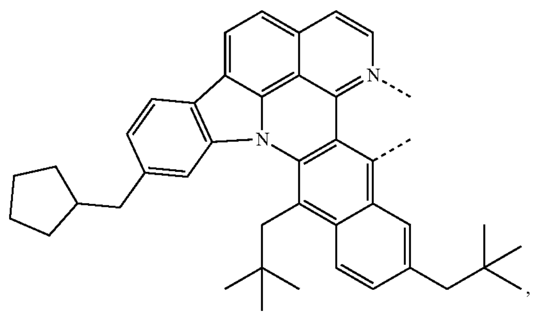
$L_{a791}$
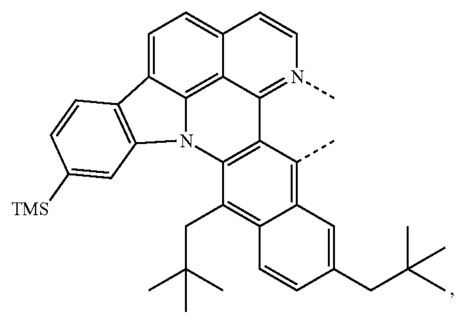
-continued
$L_{a792}$
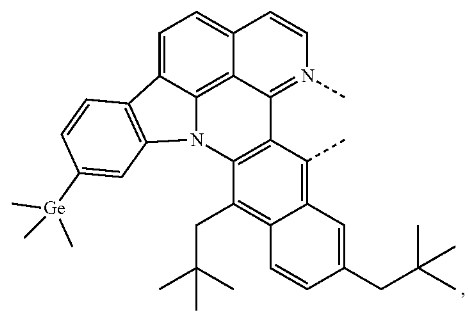
$L_{a793}$
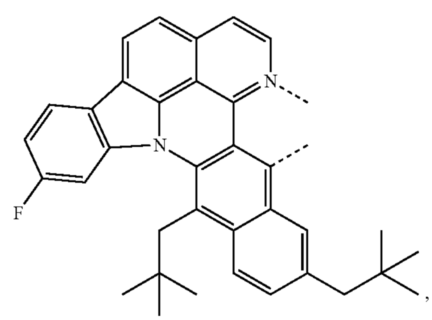
$L_{a794}$
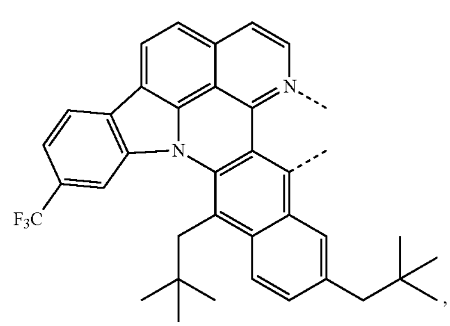
$L_{a795}$
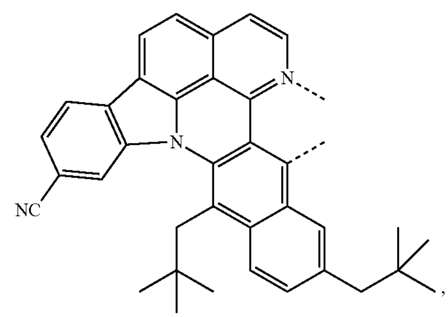
$L_{a796}$
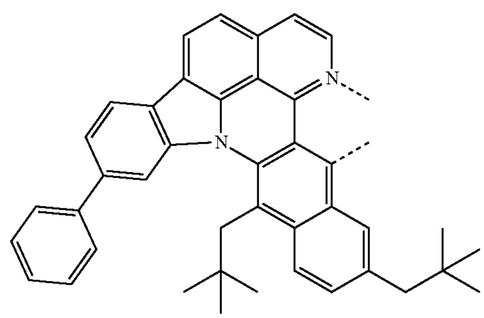

-continued
$L_{a797}$
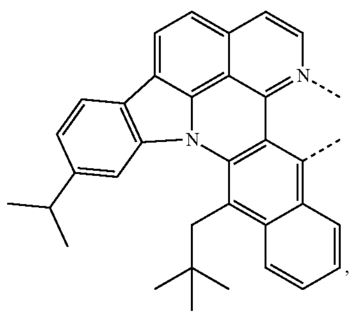
$L_{a798}$
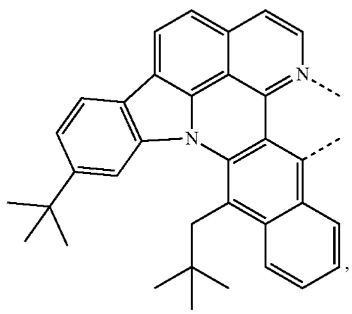
$L_{a799}$
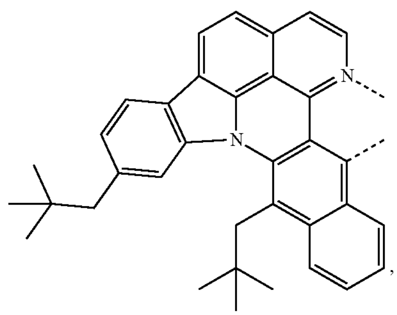
$L_{a800}$
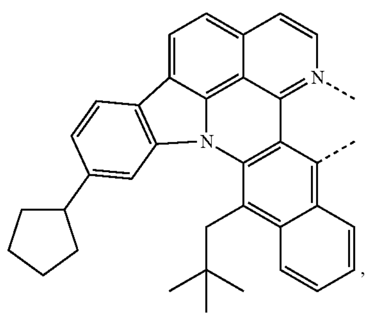
$L_{a801}$
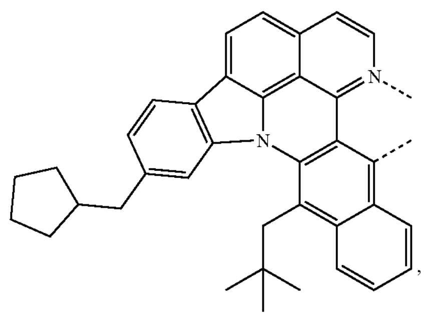
-continued
$L_{a802}$
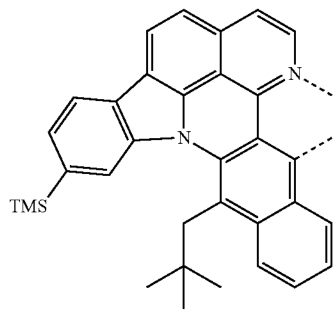
$L_{a803}$
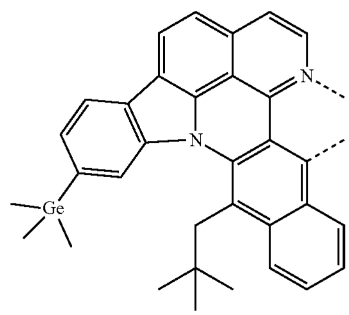
$L_{a804}$
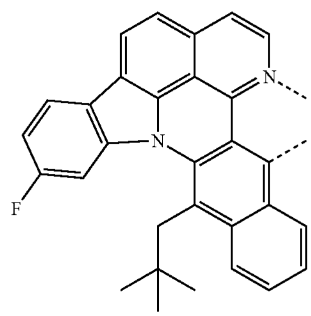
$L_{a805}$
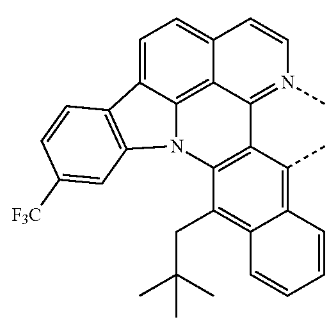
$L_{a806}$
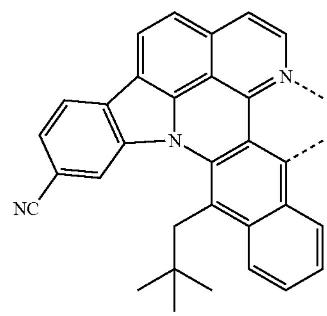

-continued
$L_{a807}$
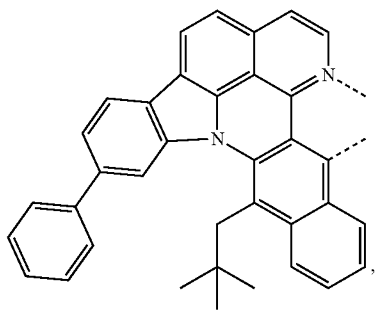
$L_{a808}$
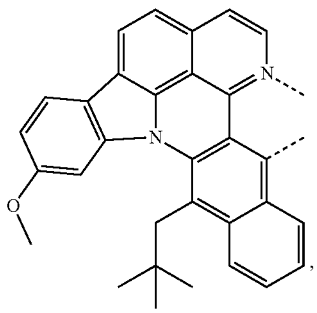
$L_{a809}$
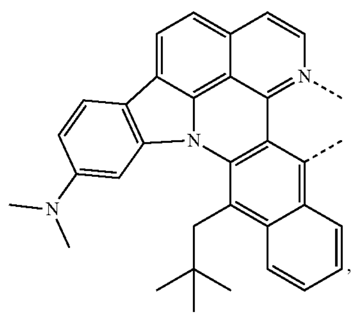
$L_{a810}$
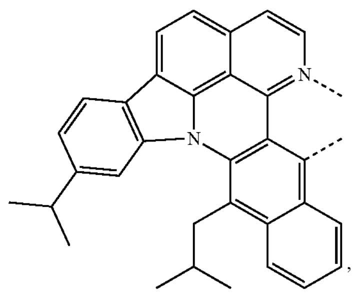
$L_{a811}$
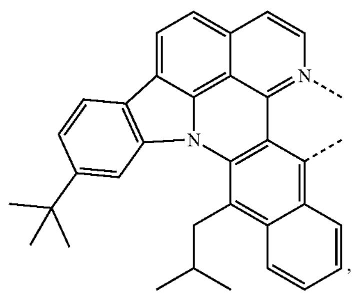
-continued
$L_{a812}$
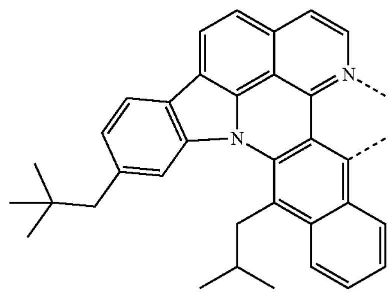
$L_{a813}$
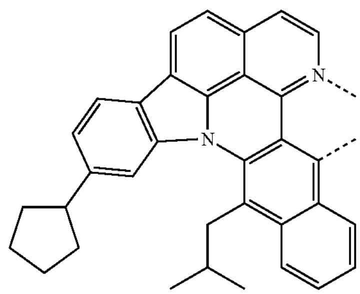
$L_{a814}$
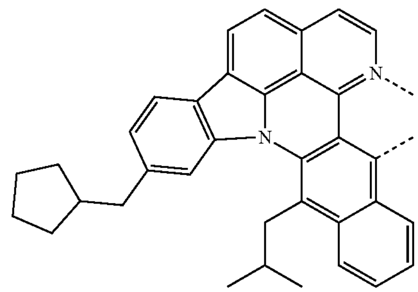
$L_{a815}$
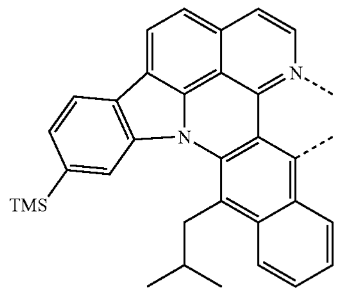
$L_{a816}$
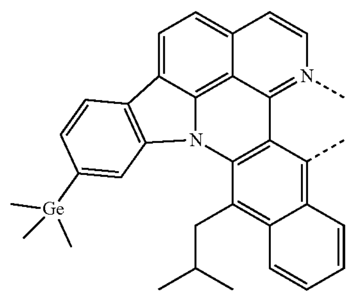

-continued
$L_{a817}$
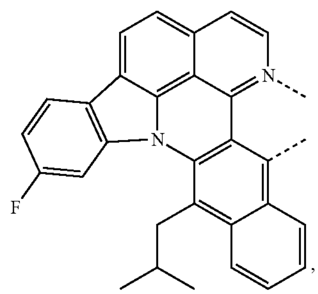
$L_{a818}$
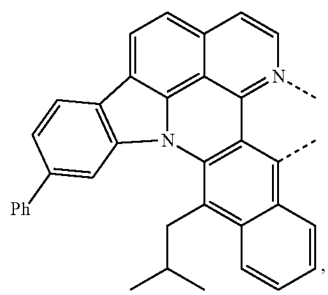
$L_{a819}$
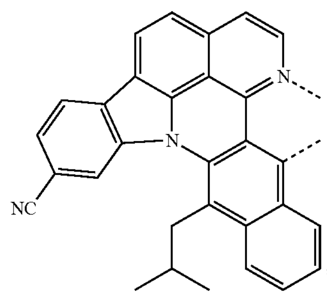
$L_{a825}$
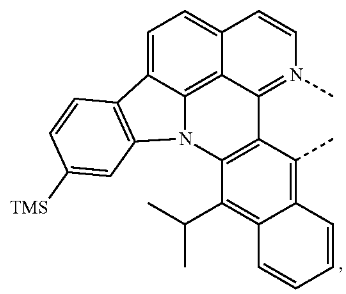
$L_{a826}$
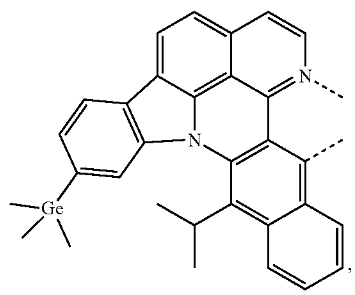
-continued
$L_{a827}$
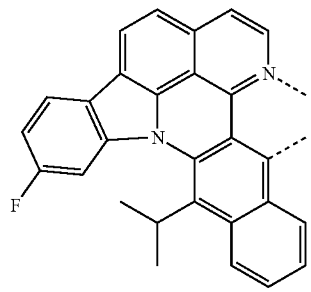
$L_{a828}$
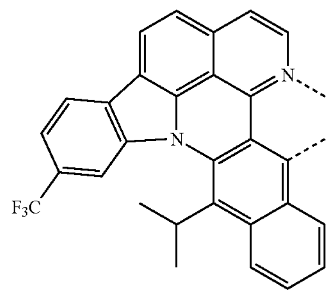
$L_{a829}$
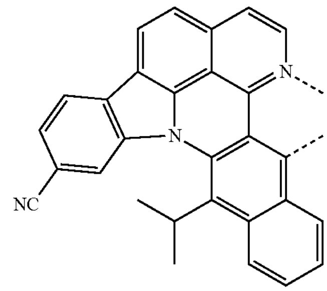
$L_{a830}$
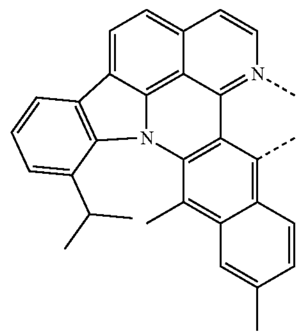
$L_{a831}$
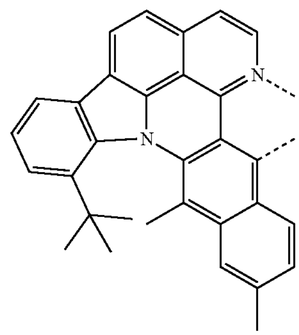

$L_{a832}$
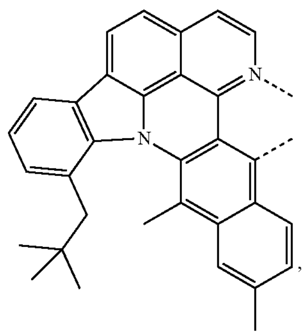
$L_{a833}$
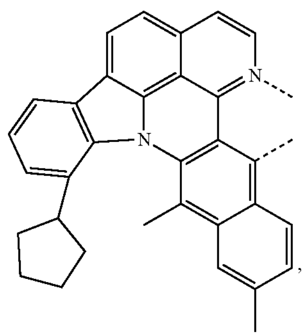
$L_{a834}$
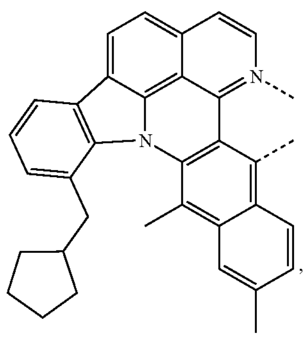
$L_{a835}$
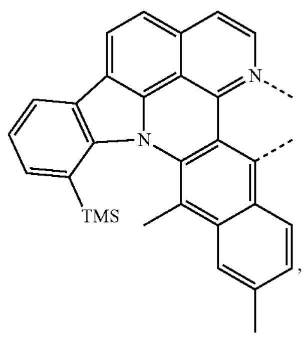
$L_{a836}$
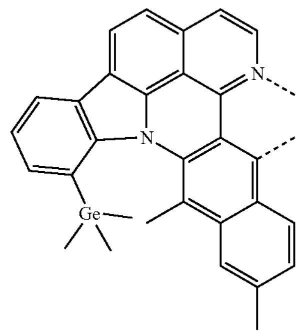
$L_{a837}$
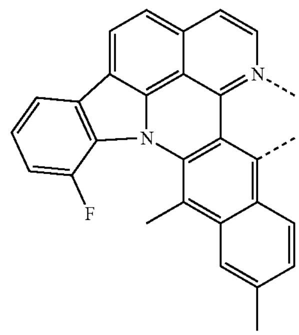
$L_{a838}$
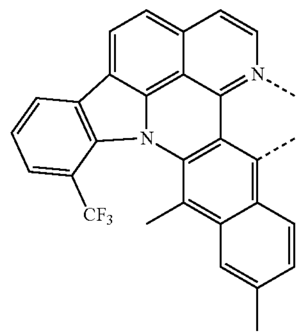
$L_{a839}$
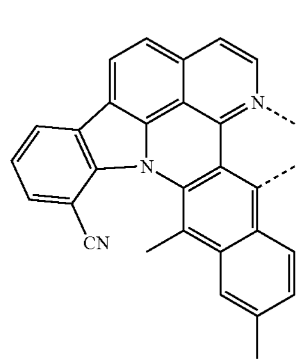

-continued
$L_{a840}$
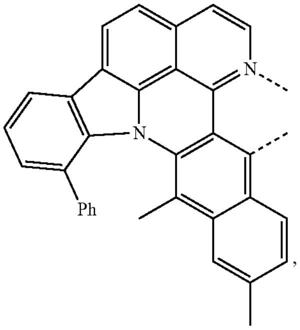
$L_{a841}$
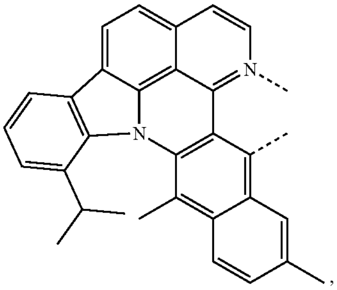
$L_{a842}$
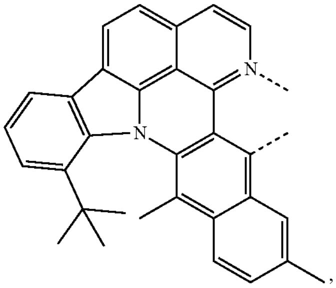
$L_{a843}$
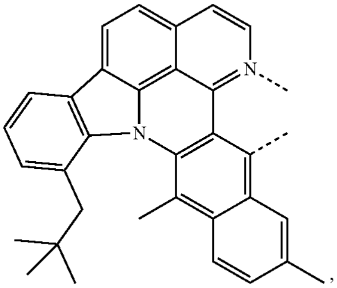
$L_{a844}$
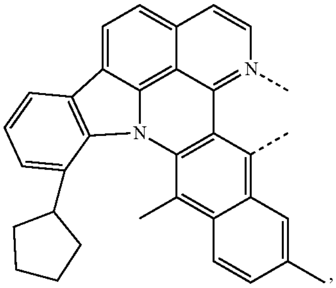
-continued
$L_{a845}$
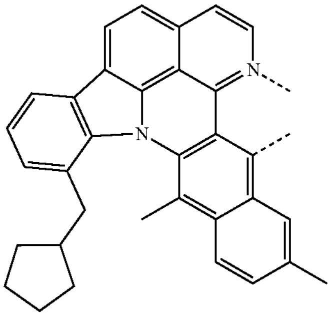
$L_{a846}$
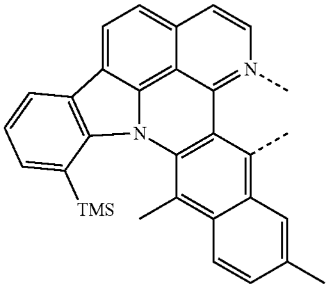
$L_{a847}$
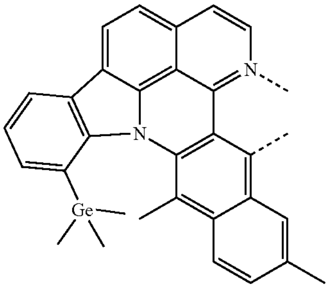
$L_{a848}$
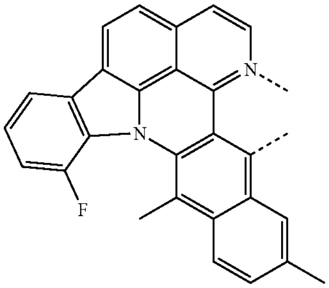
$L_{a849}$
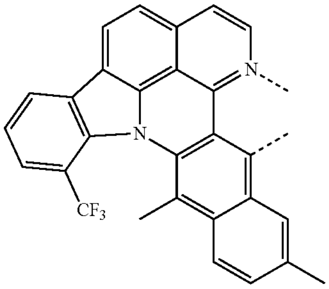

-continued
$L_{a850}$
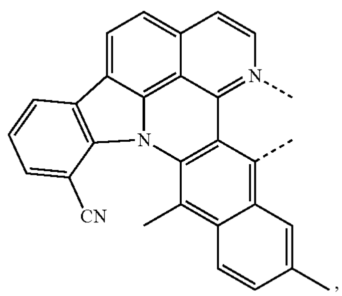
$L_{a851}$
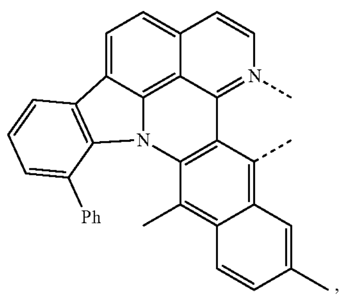
$L_{a852}$
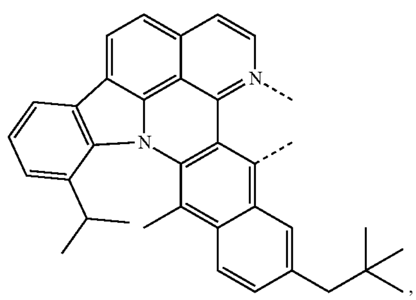
$L_{a853}$
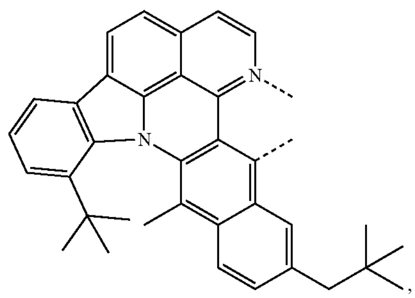
$L_{a854}$
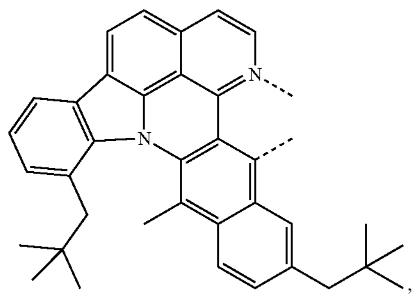
-continued
$L_{a855}$
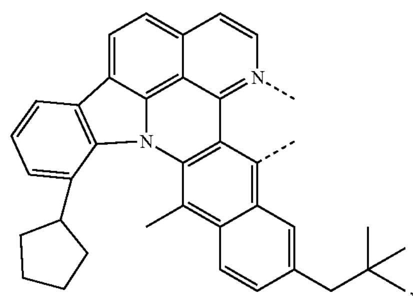
$L_{a856}$
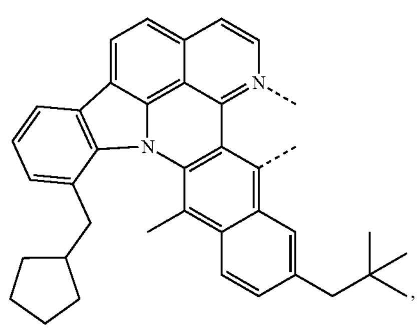
$L_{a857}$
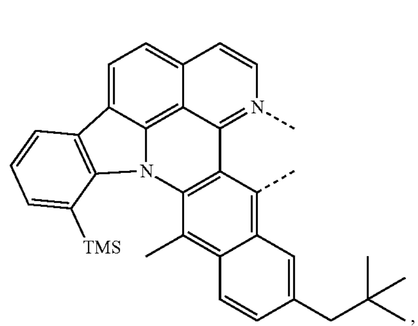
$L_{a858}$
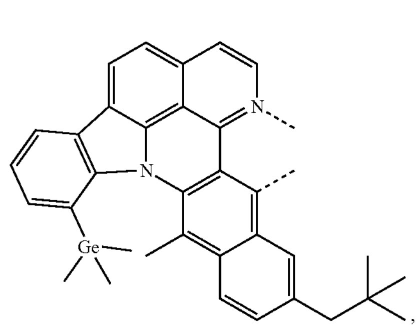
$L_{a859}$
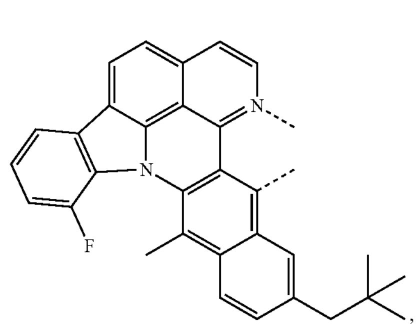

$L_{a860}$
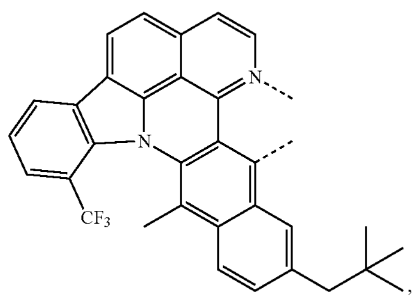
$L_{a861}$
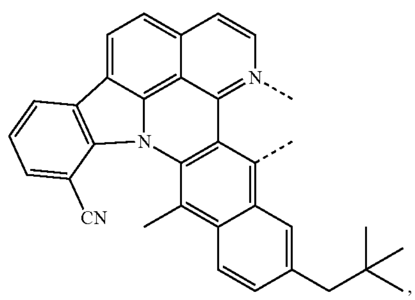
$L_{a862}$
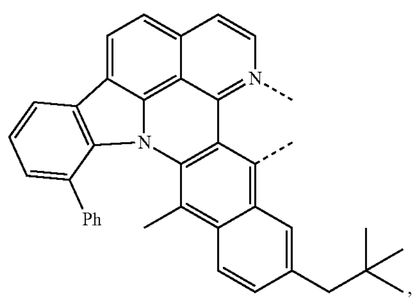
$L_{a863}$
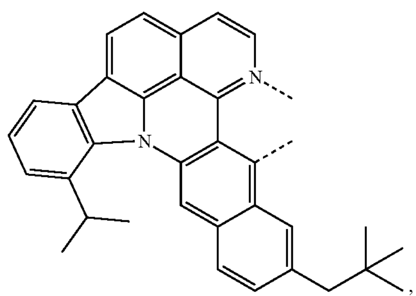
$L_{a864}$
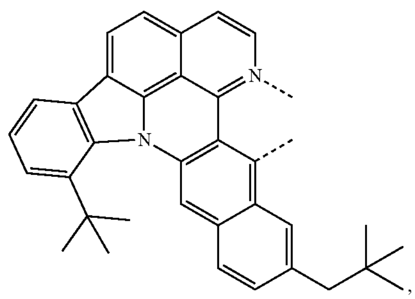
$L_{a865}$
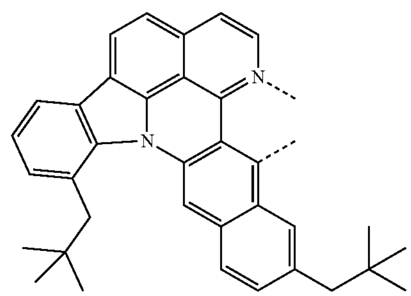
$L_{a866}$
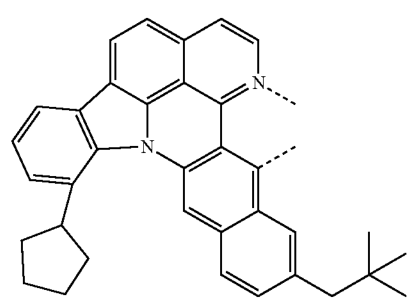
$L_{a867}$
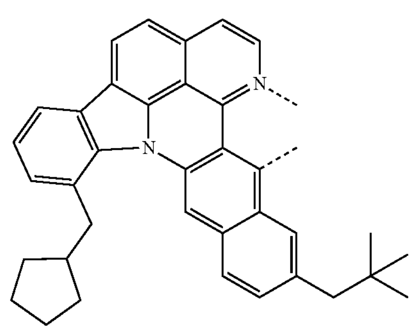
$L_{a868}$
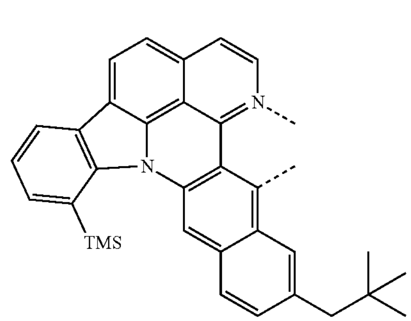
$L_{a869}$
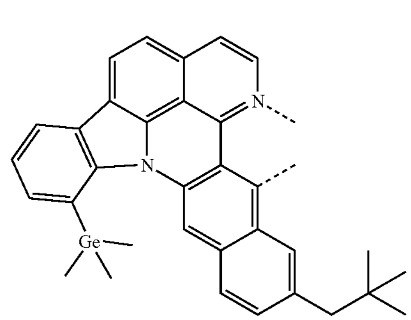

-continued
$L_{a870}$
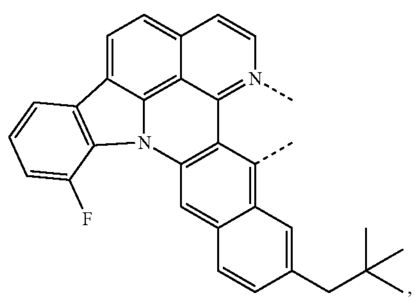
$L_{a871}$
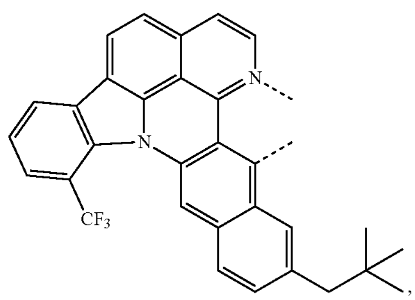
$L_{a872}$
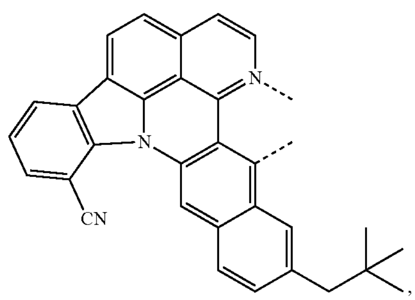
$L_{a873}$
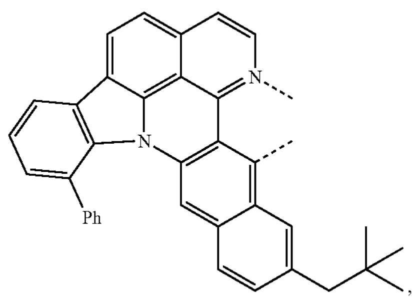
$L_{a874}$
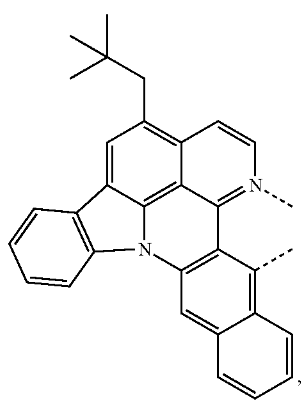
-continued
$L_{a875}$
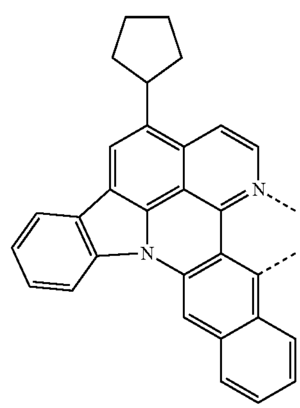
$L_{a876}$
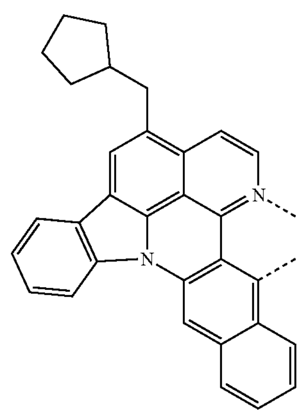
$L_{a877}$
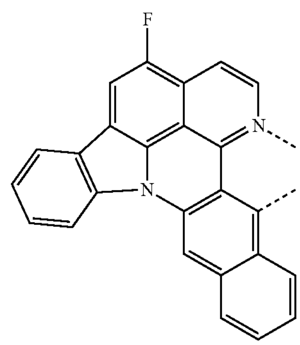
$L_{a878}$
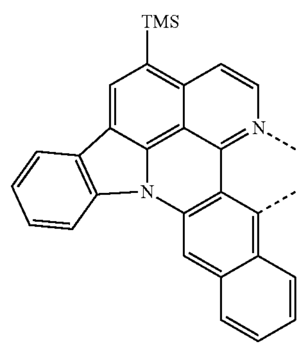

$L_{a879}$
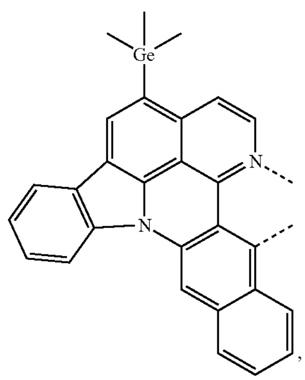
$L_{a880}$
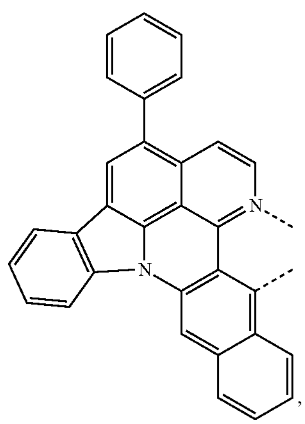
$L_{a881}$
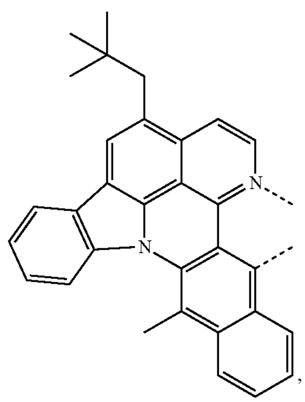
$L_{a882}$
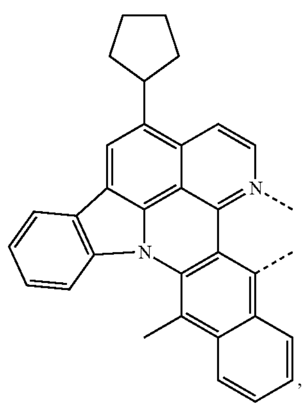
$L_{a883}$
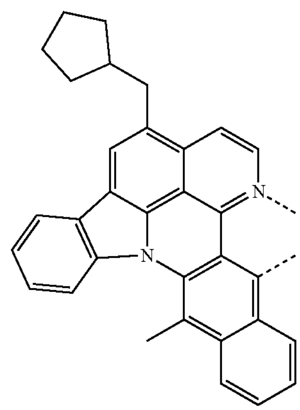
$L_{a884}$
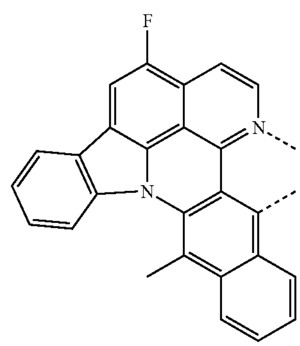
$L_{a885}$
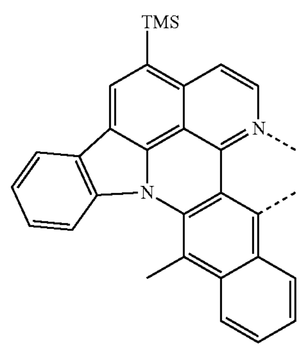
$L_{a886}$
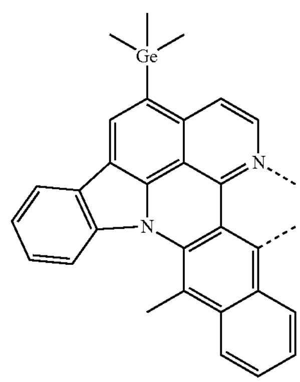

-continued
$L_{a887}$
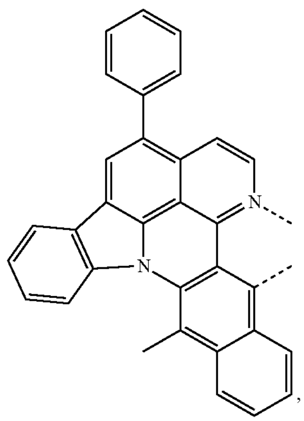
$L_{a888}$
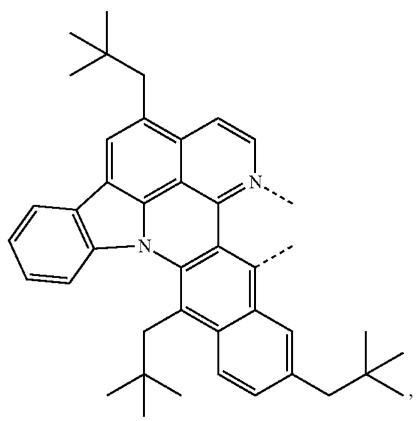
$L_{a889}$
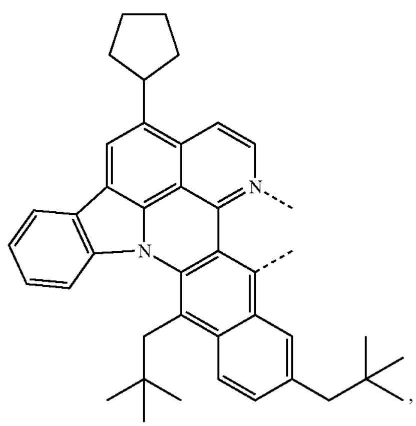
-continued
$L_{a890}$
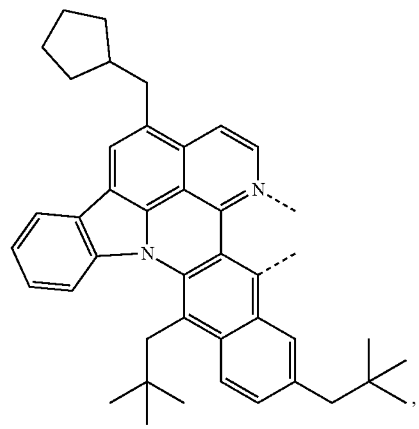
$L_{a891}$
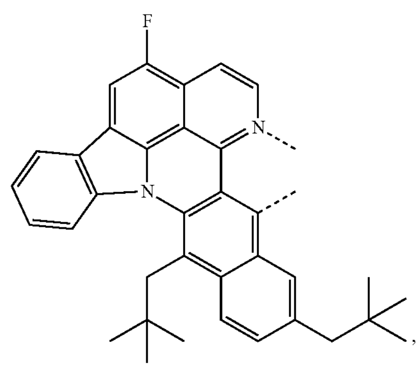
$L_{a892}$
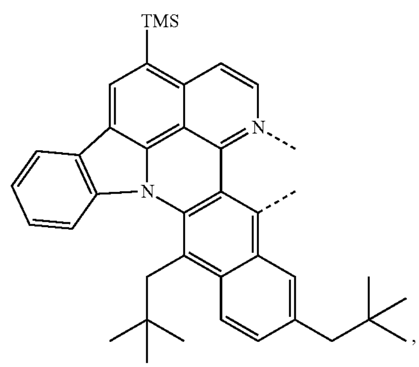
$L_{a893}$
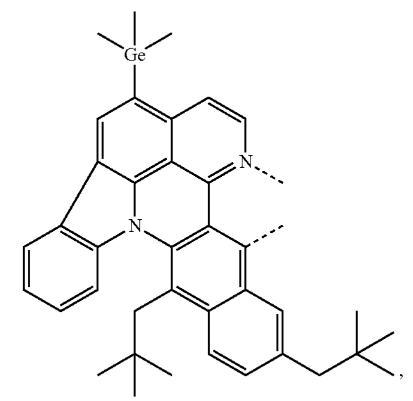

-continued
$L_{a894}$
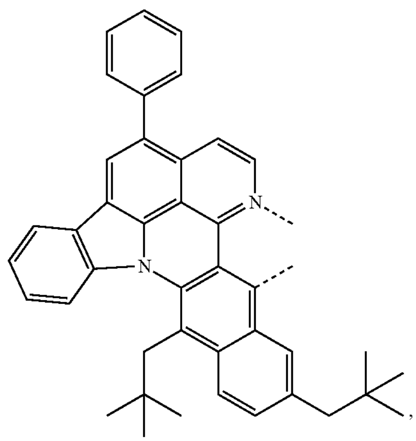
$L_{a895}$
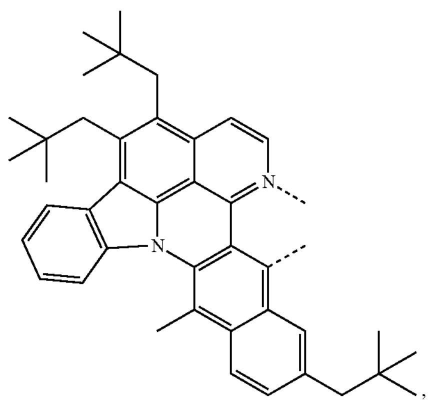
$L_{a896}$
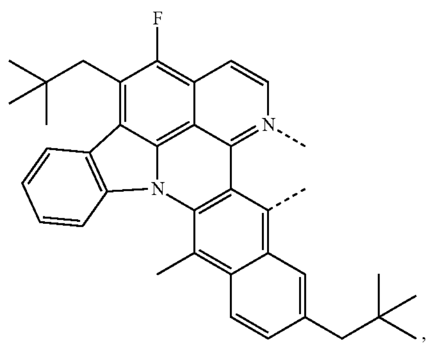
$L_{a897}$
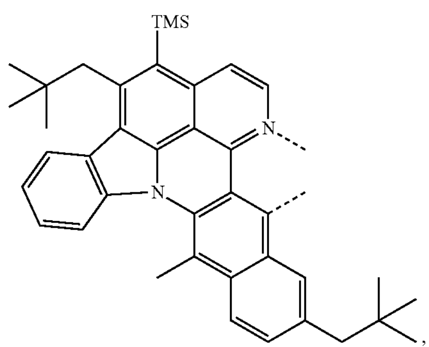
-continued
$L_{a898}$
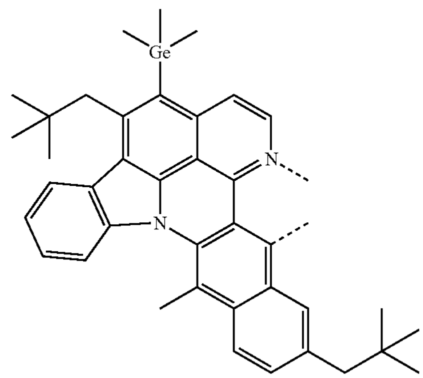
$L_{a899}$
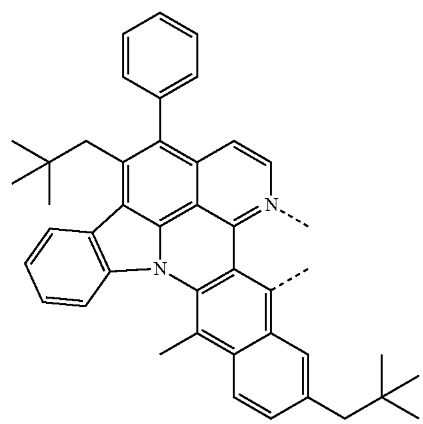
$L_{a900}$
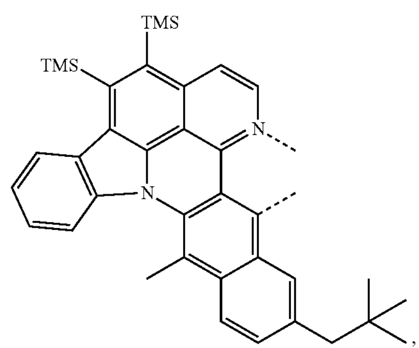
$L_{a901}$
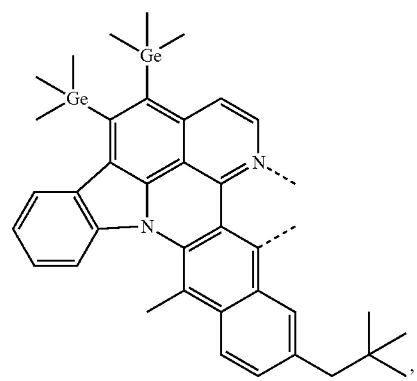

-continued
$L_{a902}$
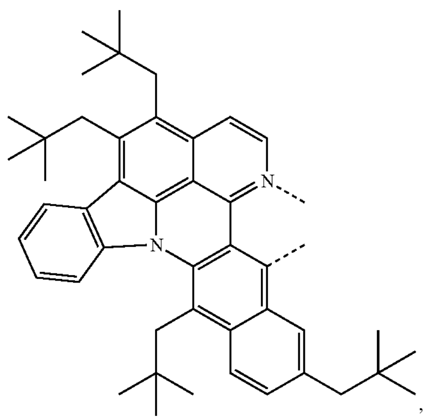
,
$L_{a903}$
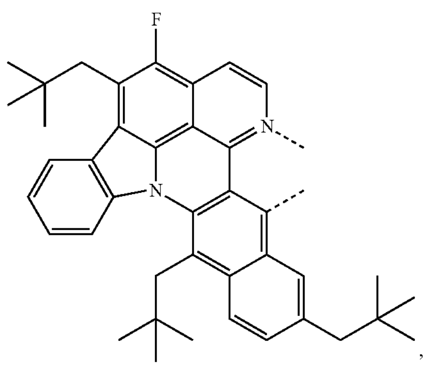
,
$L_{a904}$
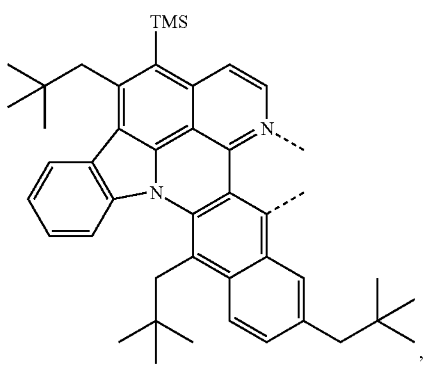
,
$L_{a905}$
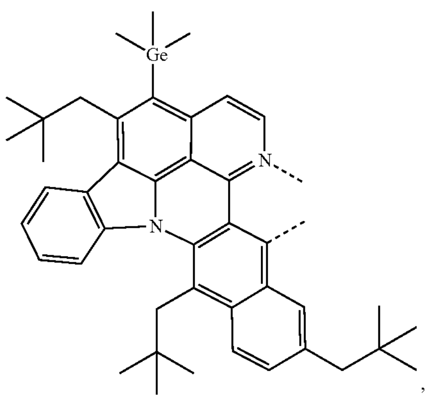
,
$L_{a906}$
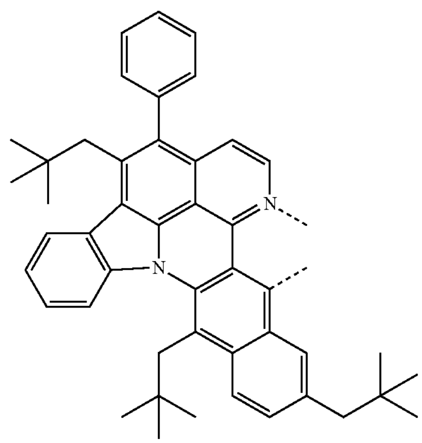
,
$L_{a907}$
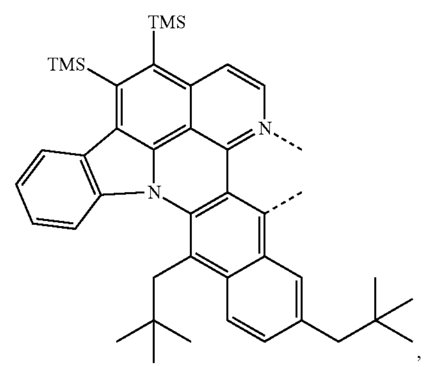
,
$L_{a908}$
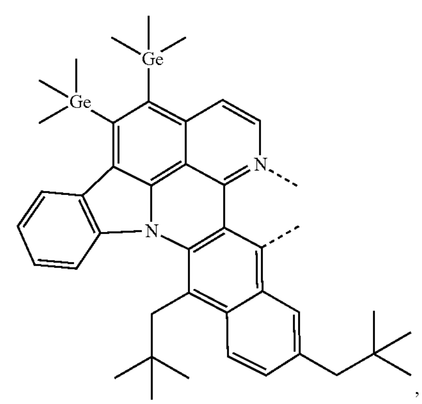
,
$L_{a909}$
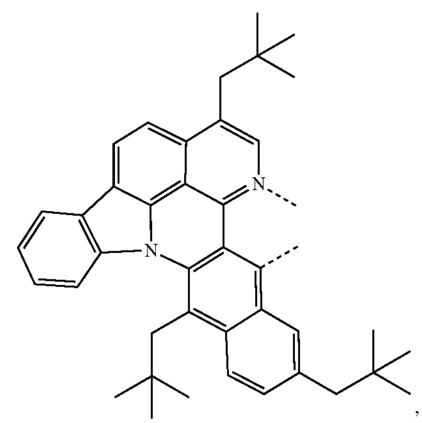
, $L_{a910}$
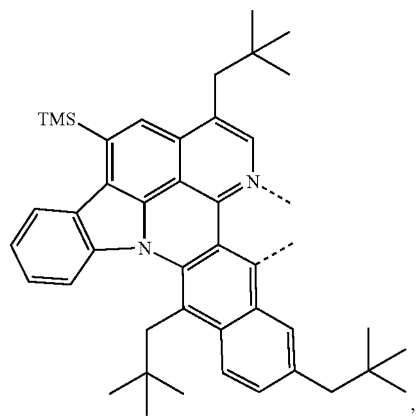
,
$L_{a911}$
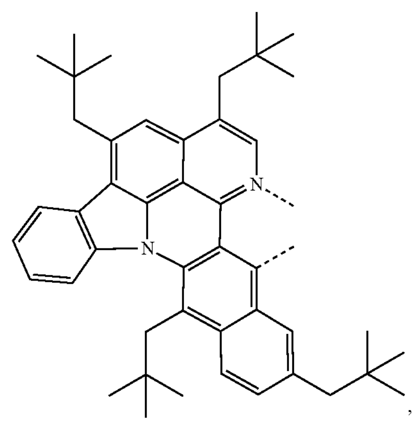
,
$L_{a912}$
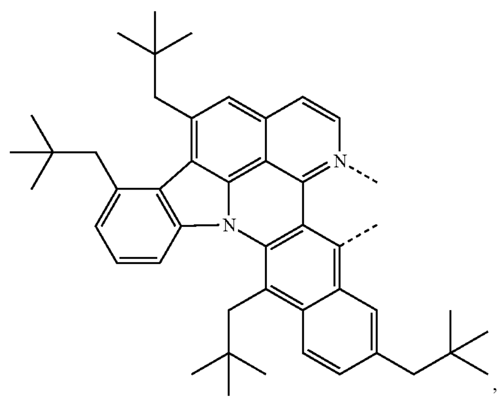
,
$L_{a913}$
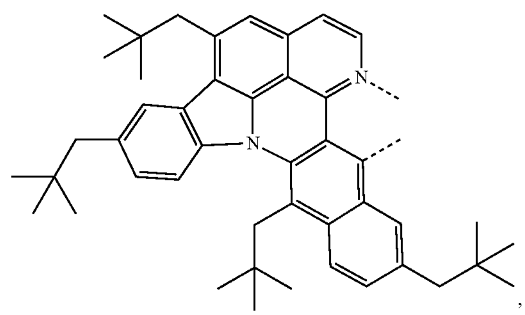
,
$L_{a914}$
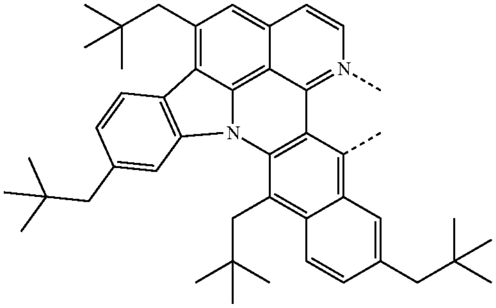
,
$L_{a915}$
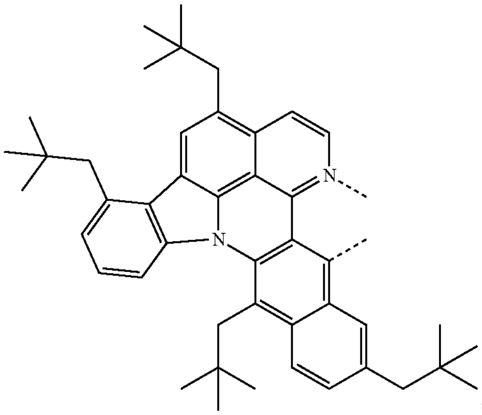
,
$L_{a916}$
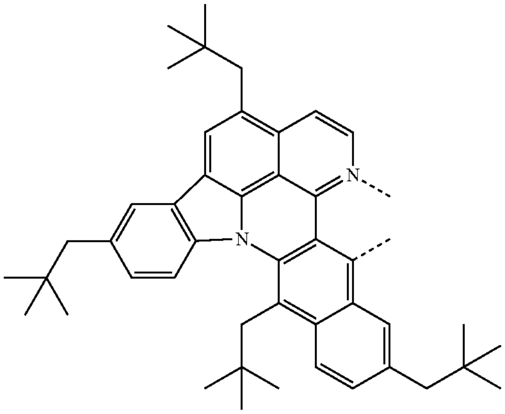
,
$L_{a917}$
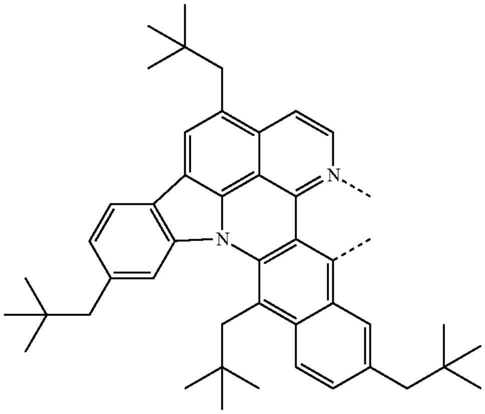
, -continued
$L_{a918}$
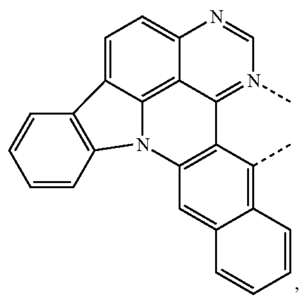
,
$L_{a919}$
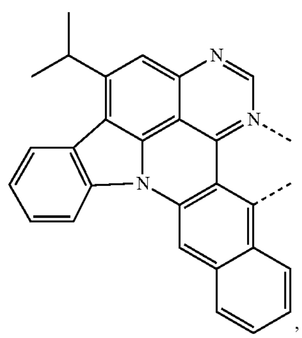
,
$L_{a920}$
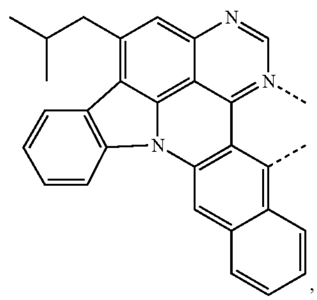
,
$L_{a921}$
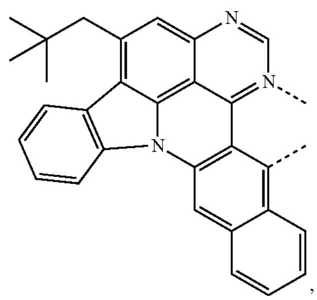
,
$L_{a922}$
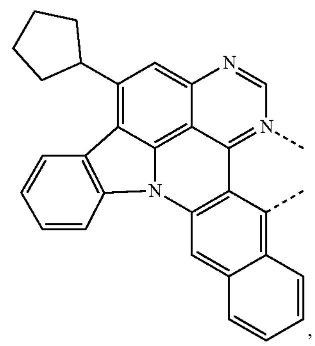
,
-continued
$L_{a923}$
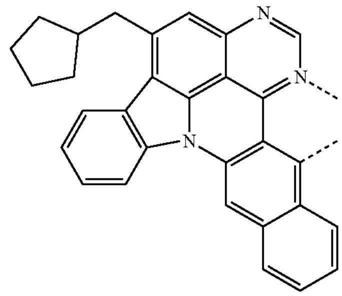
,
$L_{a924}$
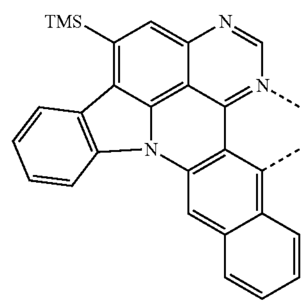
,
$L_{a925}$
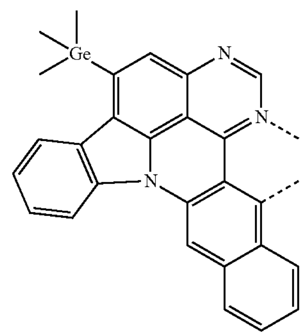
,
$L_{a926}$
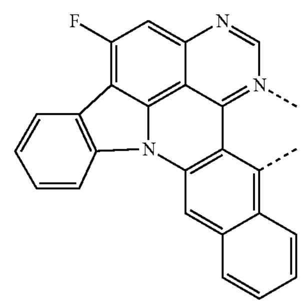
,
$L_{a927}$
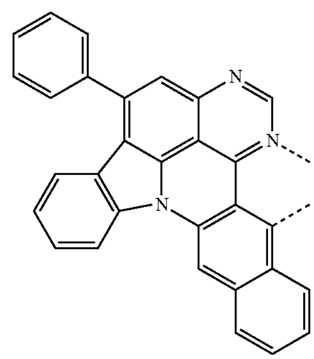
, -continued
$L_{a928}$
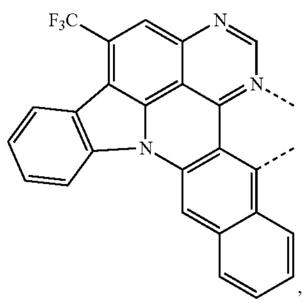
$L_{a929}$
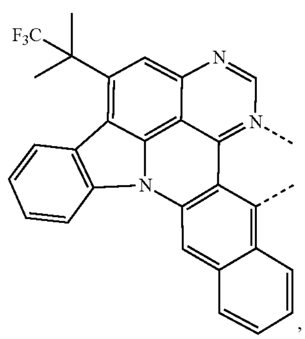
$L_{a930}$
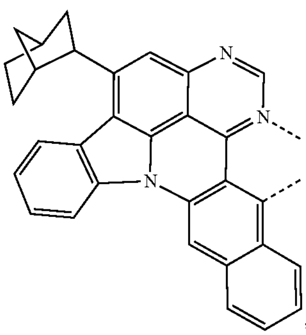
$L_{a931}$
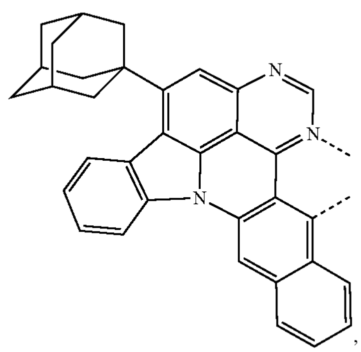
$L_{a932}$
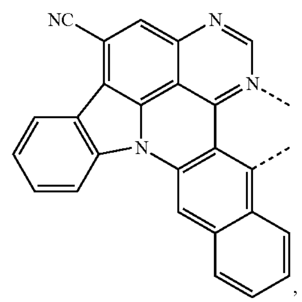
-continued
$L_{a933}$
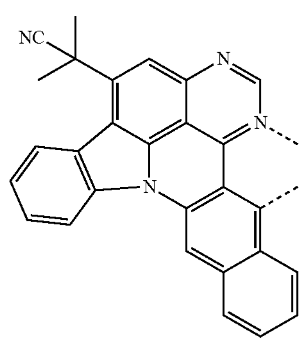
$L_{a934}$
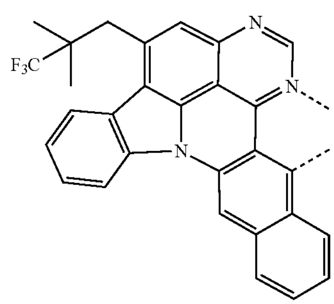
$L_{a935}$
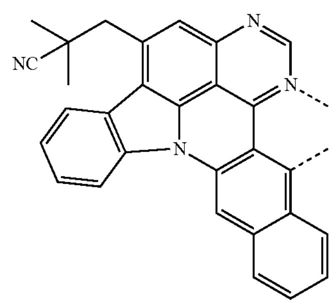
$L_{a936}$
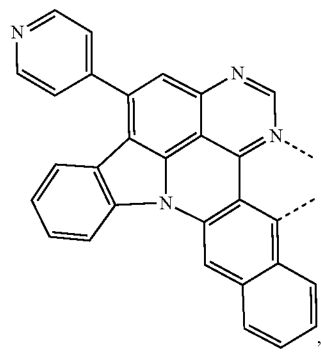

-continued
$L_{a937}$
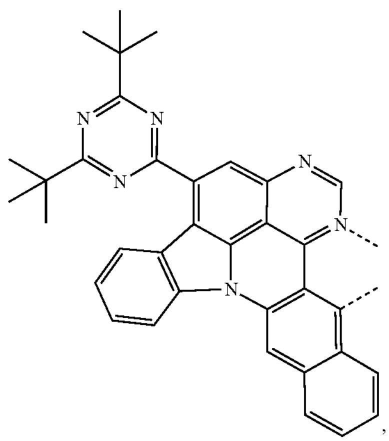
$L_{a938}$
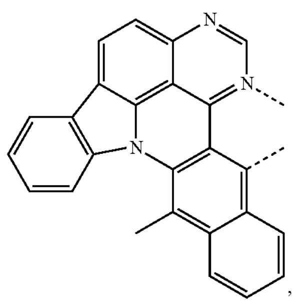
$L_{a939}$
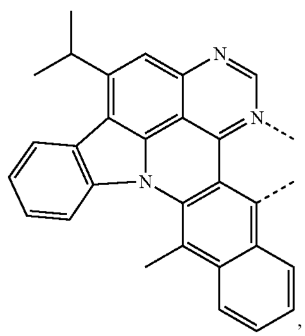
$L_{a940}$
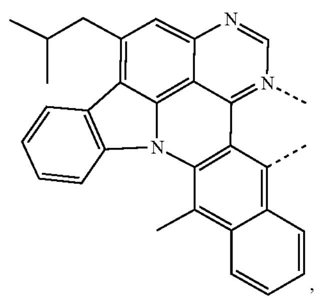
-continued
$L_{a941}$
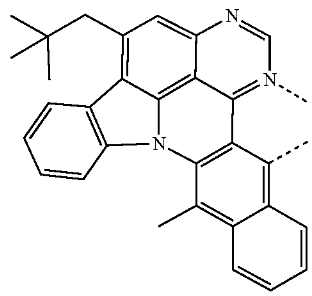
$L_{a942}$
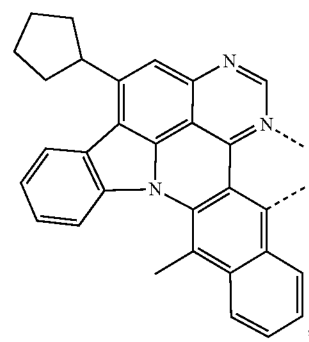
$L_{a943}$
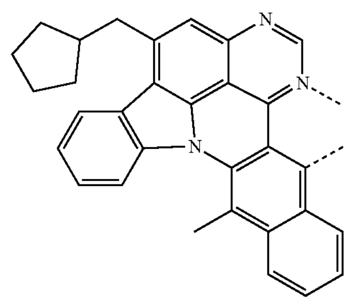
$L_{a944}$
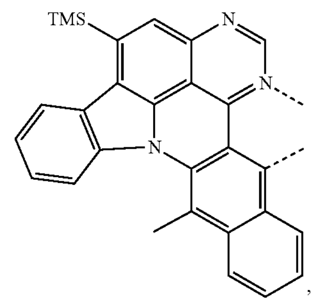
$L_{a945}$
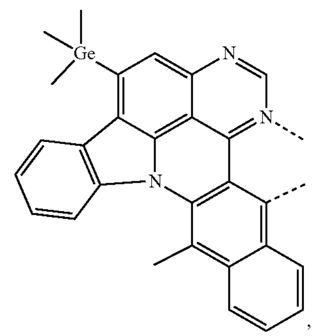

-continued
$L_{a946}$
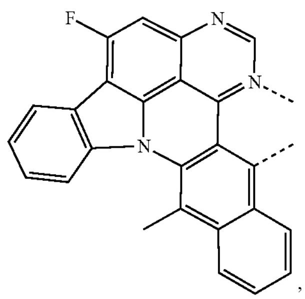
,
$L_{a947}$
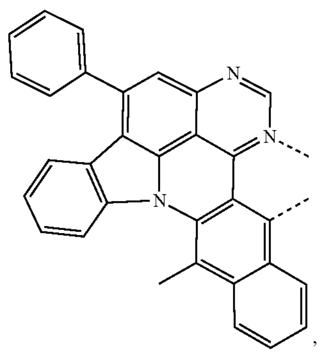
,
$L_{a948}$
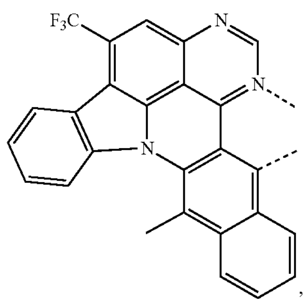
,
$L_{a949}$
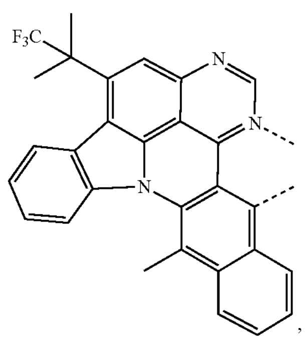
,
$L_{a950}$
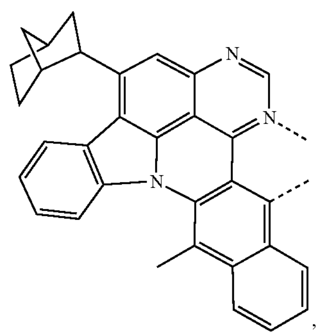
,
-continued
$L_{a951}$
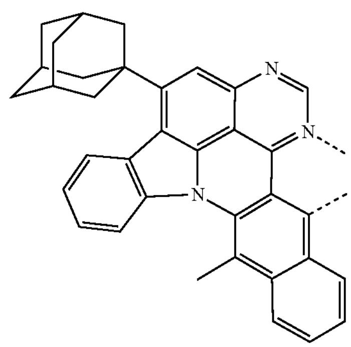
,
$L_{a952}$
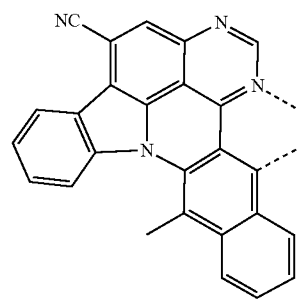
,
$L_{a953}$
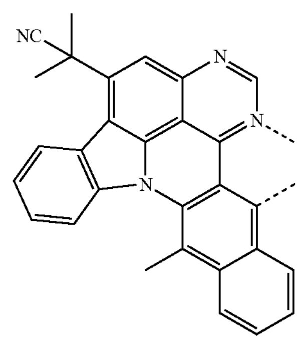
,
$L_{a954}$
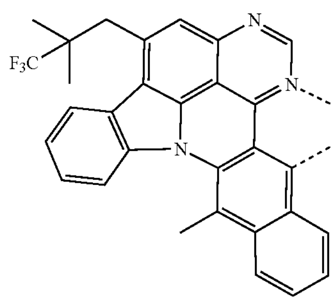
,
$L_{a955}$
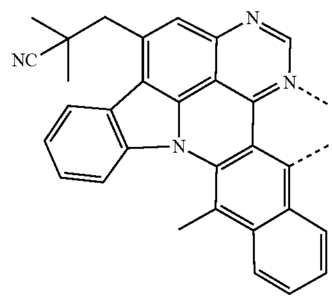
, -continued
$L_{a956}$
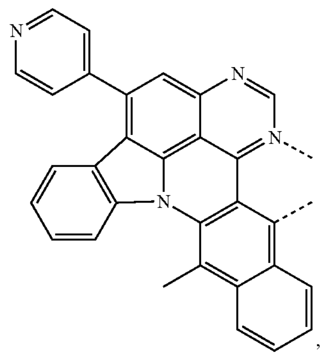
,
$L_{a957}$
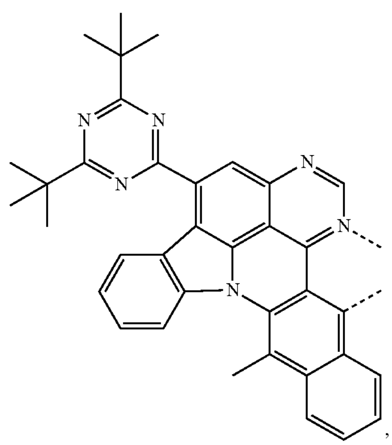
,
$L_{a958}$
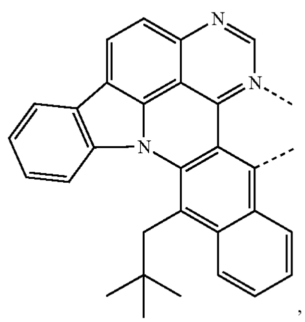
,
$L_{a959}$
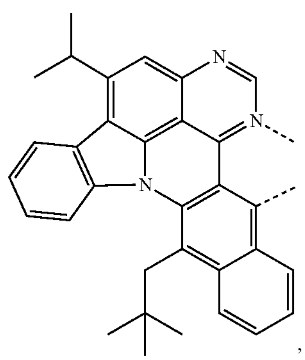
,
-continued
$L_{a960}$
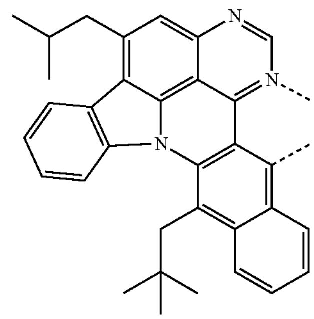
,
$L_{a961}$
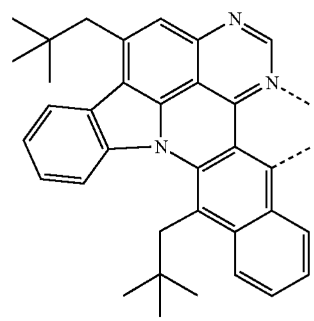
,
$L_{a962}$
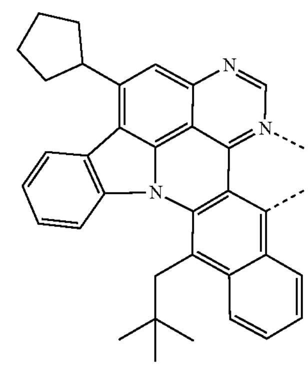
,
$L_{a963}$
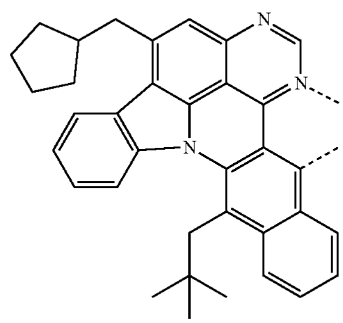
,
$L_{a964}$
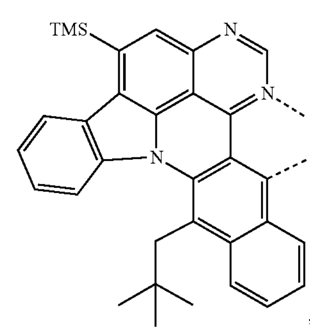
, -continued
$L_{a965}$
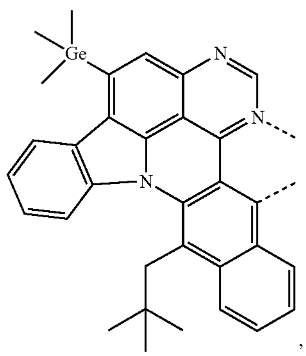
,
$L_{a966}$
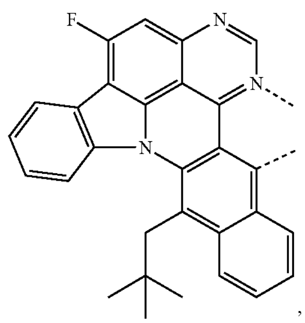
,
$L_{a967}$
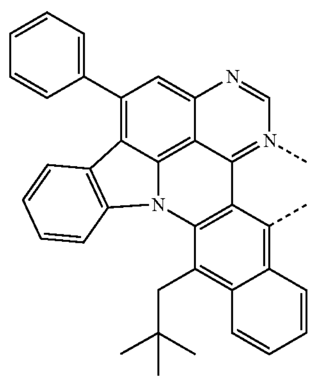
,
$L_{a968}$
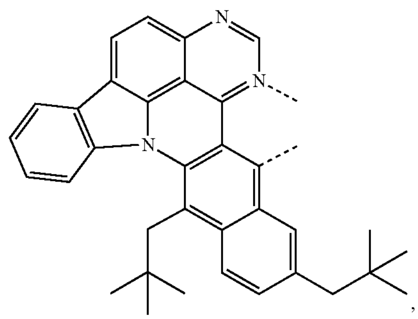
,
-continued
$L_{a969}$
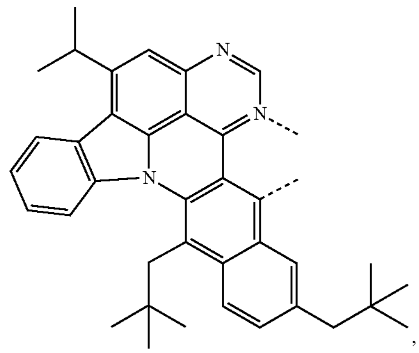
,
$L_{a970}$
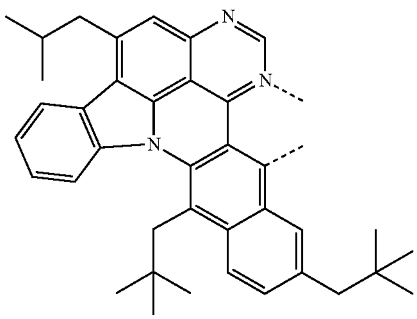
,
$L_{a971}$
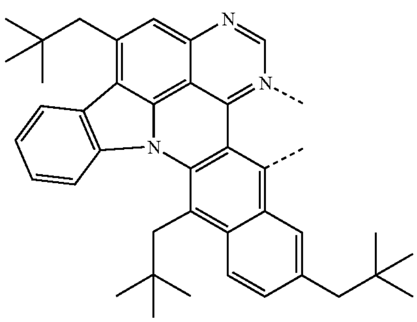
,
$L_{a972}$
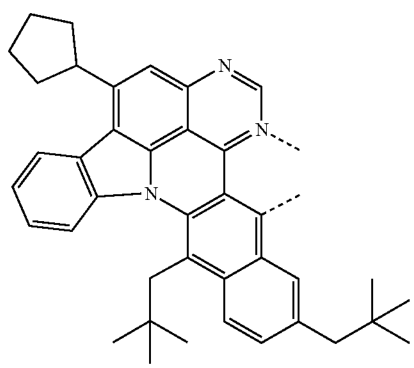
, $L_{a973}$
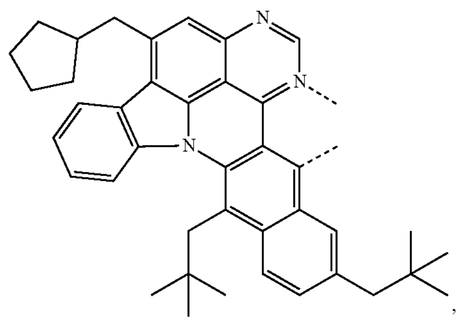
$L_{a944}$
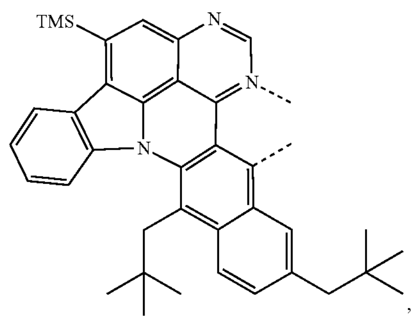
$L_{a975}$
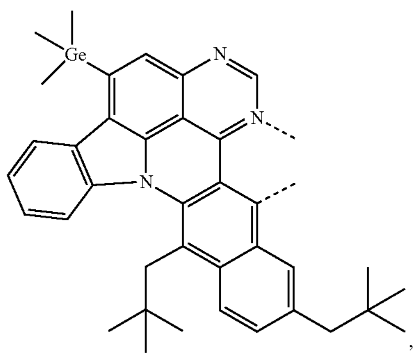
$L_{a946}$
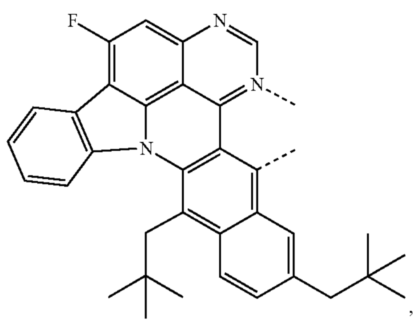
$L_{a977}$
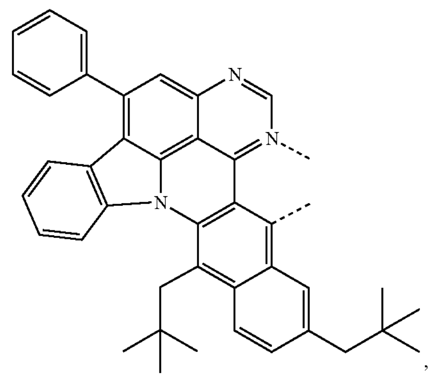
$L_{a978}$
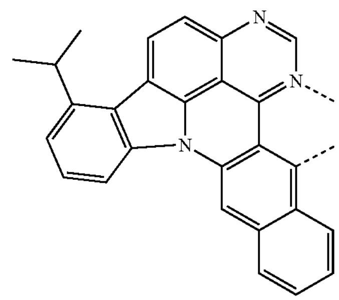
$L_{a979}$
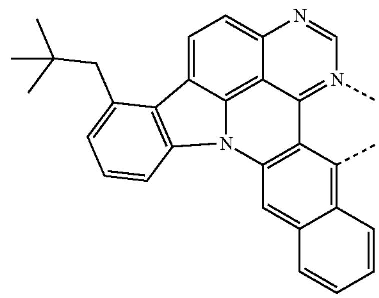
$L_{a980}$
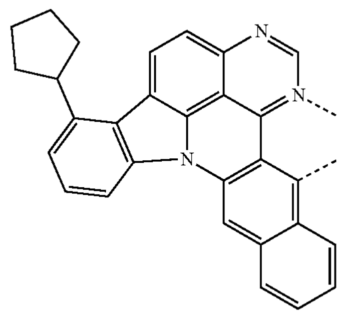
$L_{a981}$
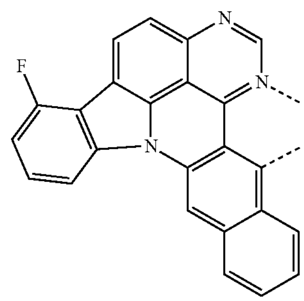

-continued
$L_{a982}$
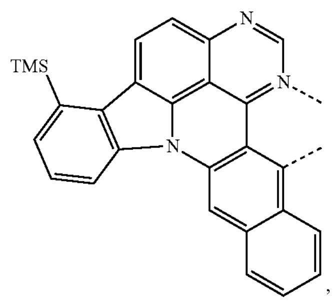
,
$L_{a983}$
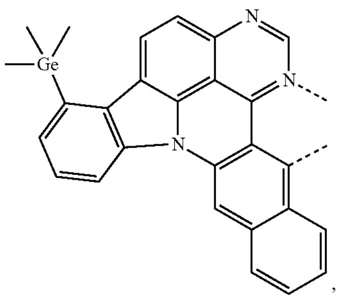
,
$L_{a984}$
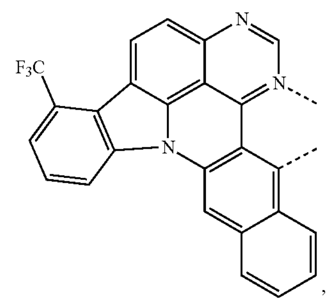
,
$L_{a985}$
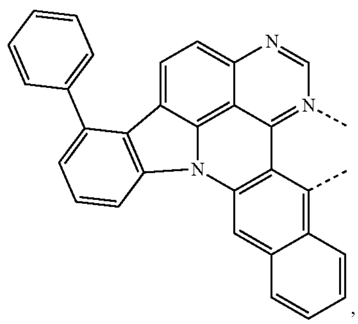
,
$L_{a986}$
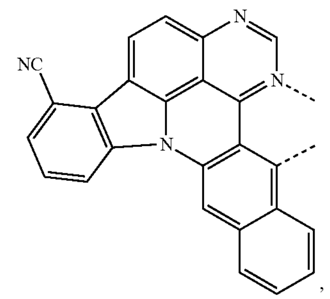
,
-continued
$L_{a987}$
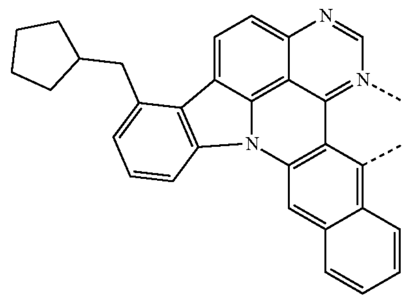
,
$L_{a988}$
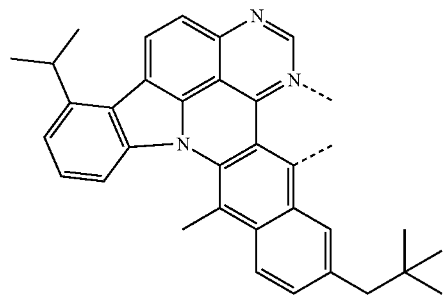
,
$L_{a989}$
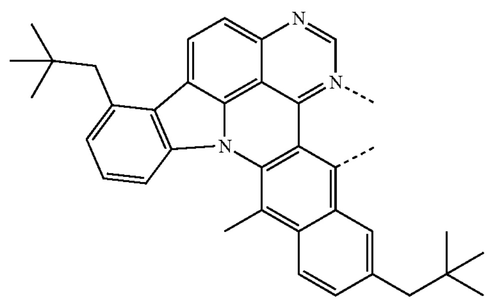
,
$L_{a990}$
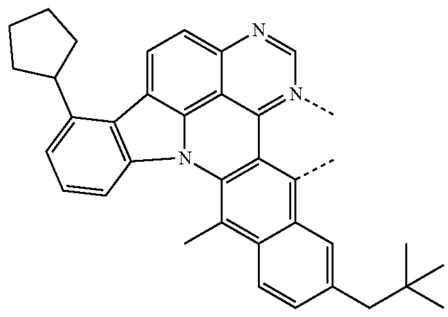
,
$L_{a991}$
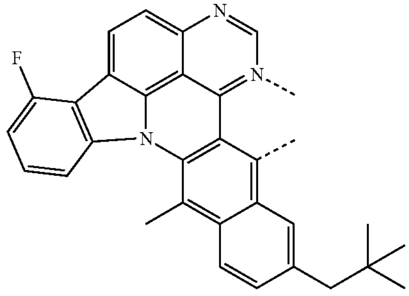
, -continued
$L_{a992}$
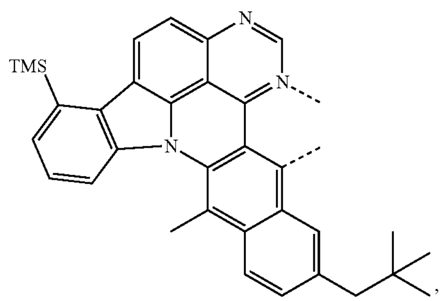
,
$L^{a993}$
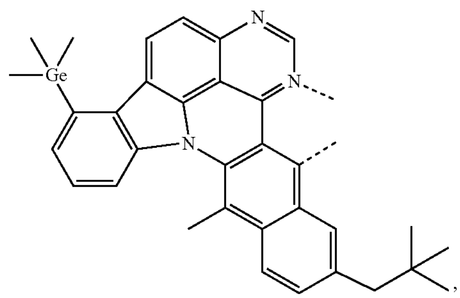
,
$L_{a994}$
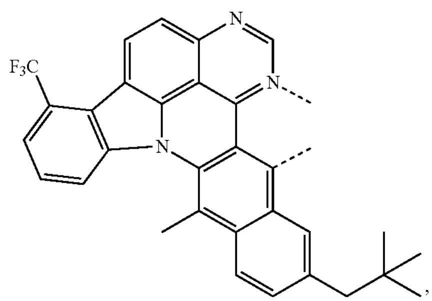
,
$L_{a995}$
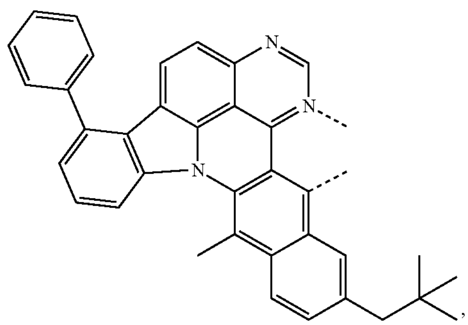
,
$L_{a996}$
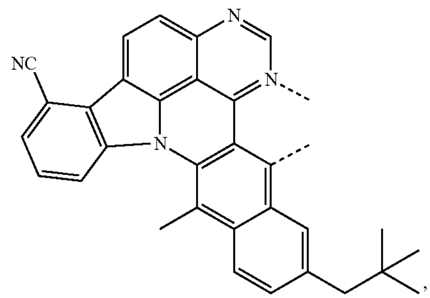
,
-continued
$L_{a997}$
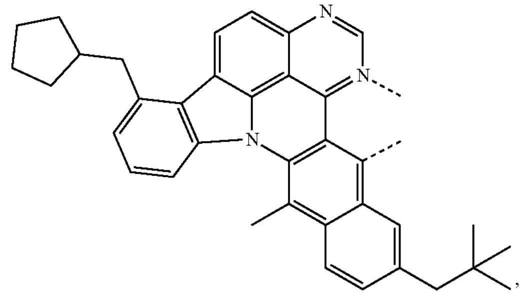
,
$L_{a998}$
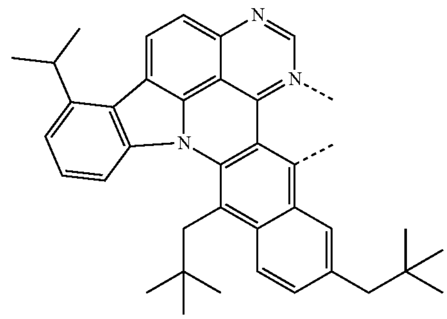
,
$L_{a999}$
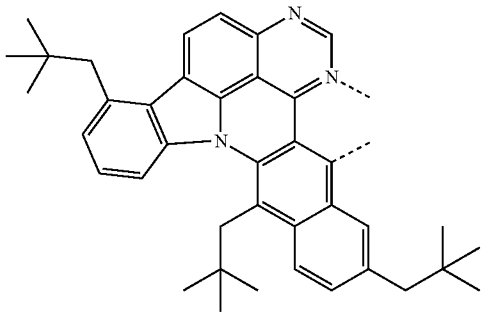
,
$L_{a1000}$
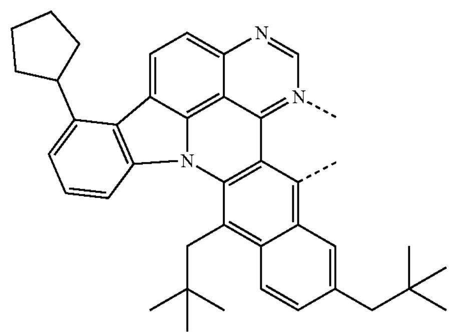
,
$L_{a1001}$
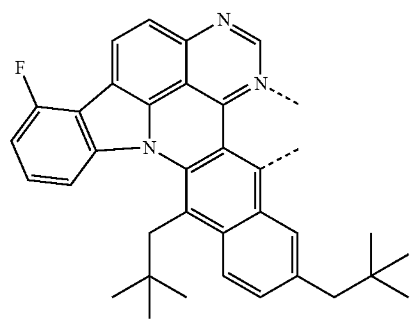
, -continued
$L_{a1002}$
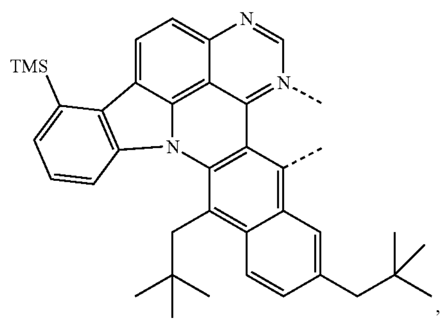
,
$L_{a1003}$
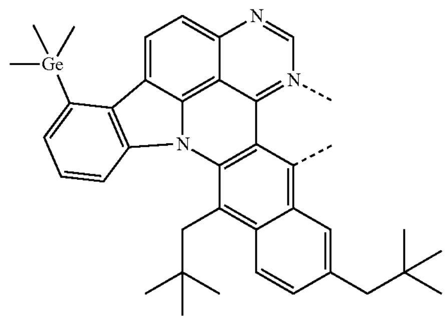
,
$L_{a1004}$
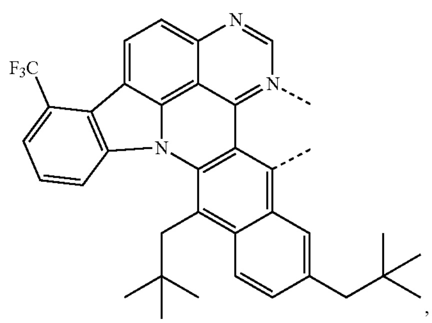
,
$L_{a1005}$
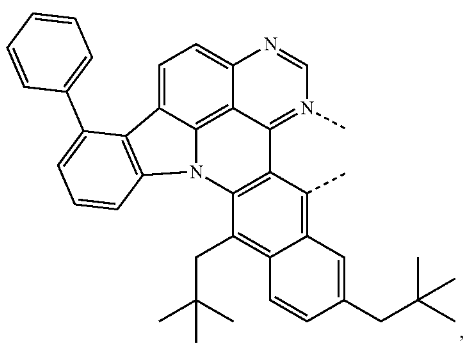
,
$L_{a1006}$
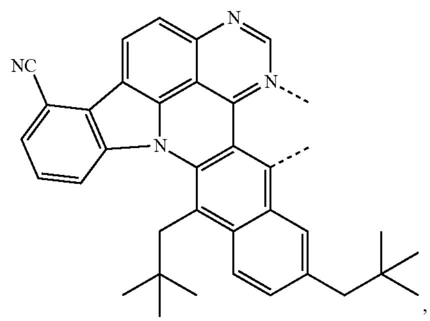
,
-continued
$L_{a1007}$
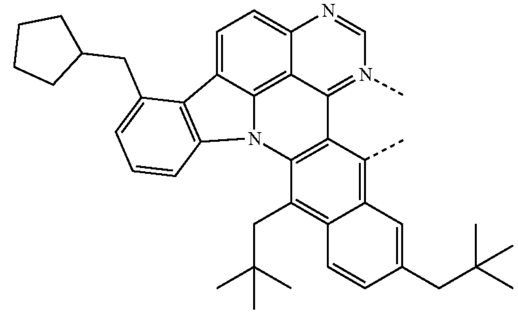
,
$L_{a1008}$
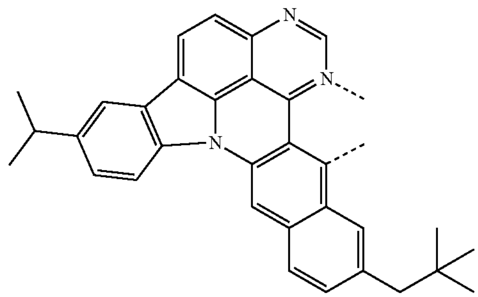
,
$L_{a1009}$
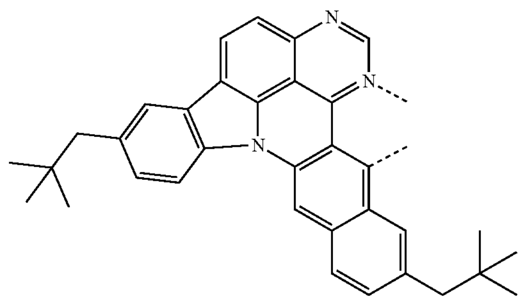
,
$L_{a1010}$
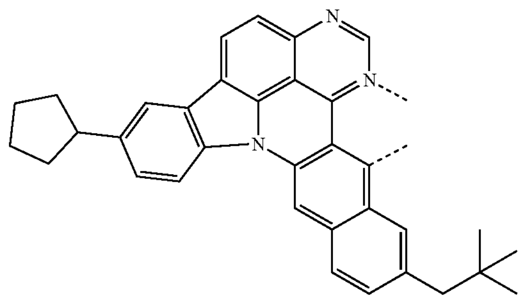
,
$L_{a1011}$
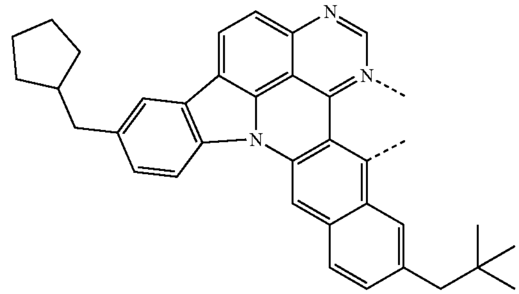
, -continued
$L_{a1012}$
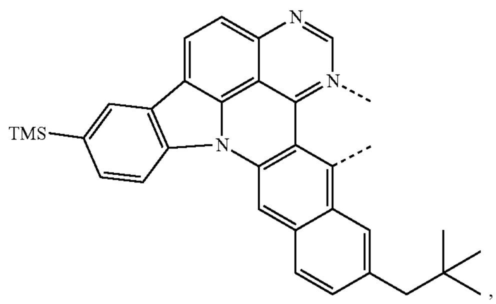
$L_{a1013}$
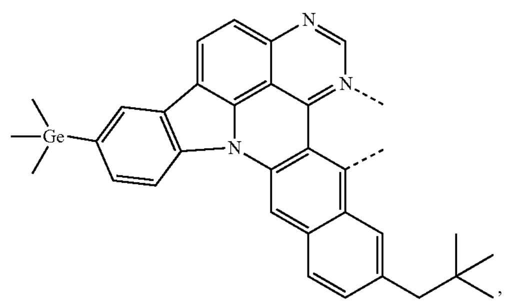
$L_{a1014}$
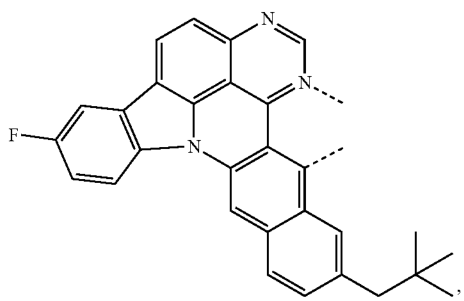
$L_{a1015}$
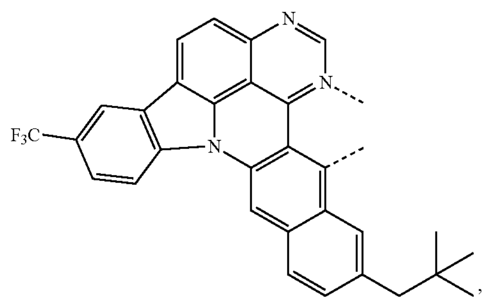
$L_{a1016}$
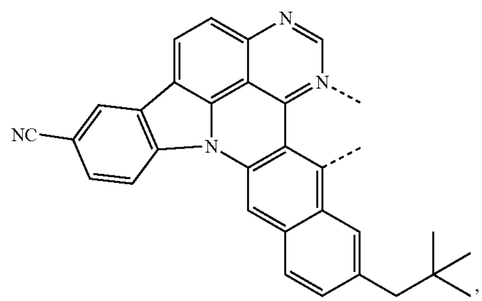
-continued
$L_{a1017}$
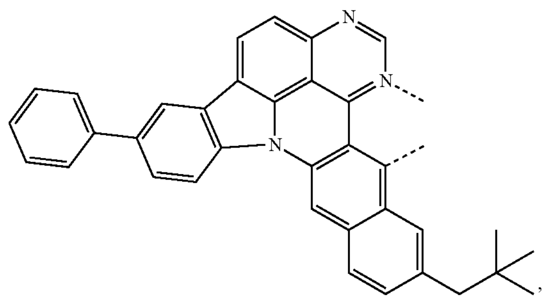
$L_{a1018}$
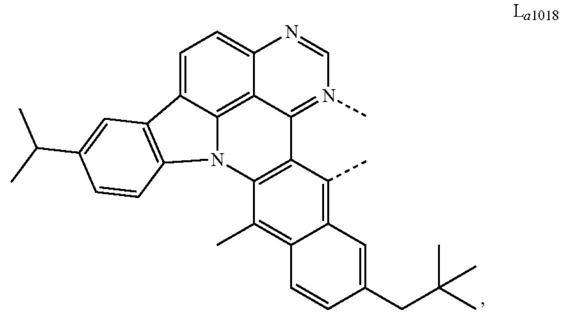
$L_{a1019}$
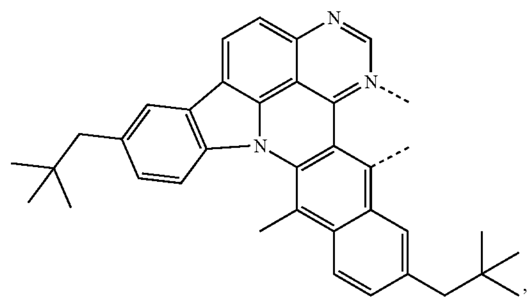
$L_{a1020}$
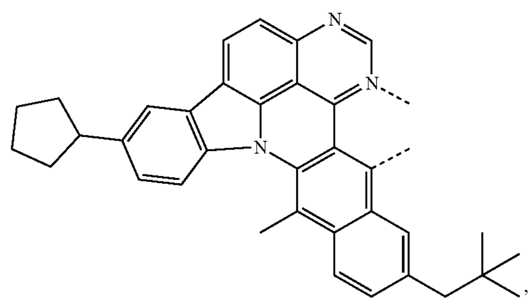
$L_{a1021}$
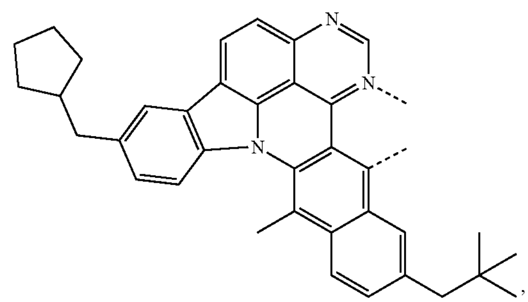

-continued
$L_{a1022}$
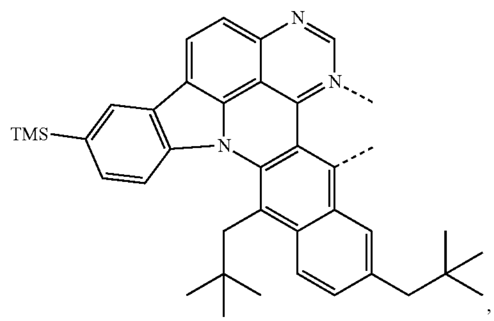
$L_{a1023}$
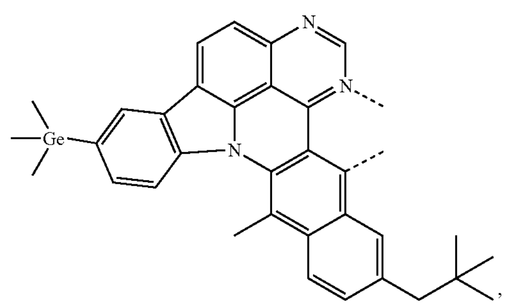
$L_{a1024}$
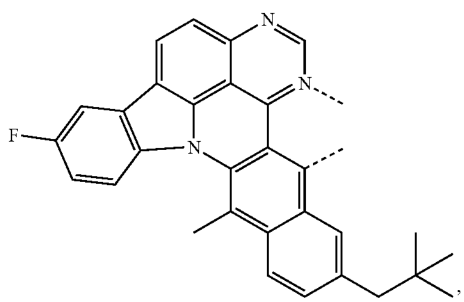
$L_{a1025}$
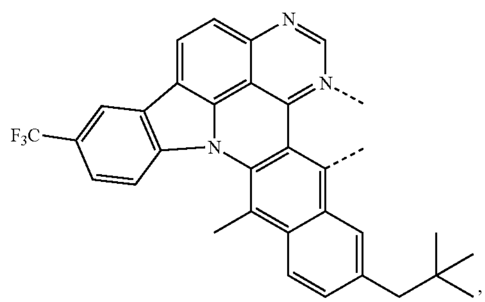
$L_{a1026}$
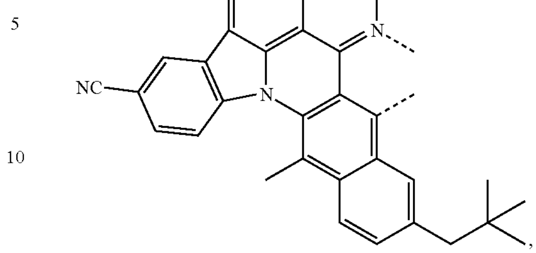
$L_{a1027}$
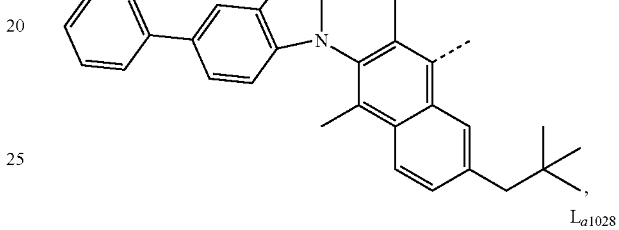
$L_{a1028}$
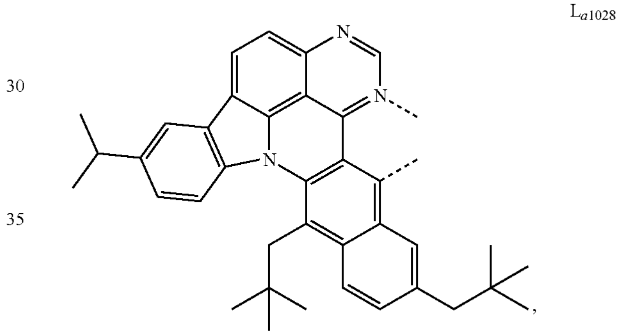
$L_{a1029}$
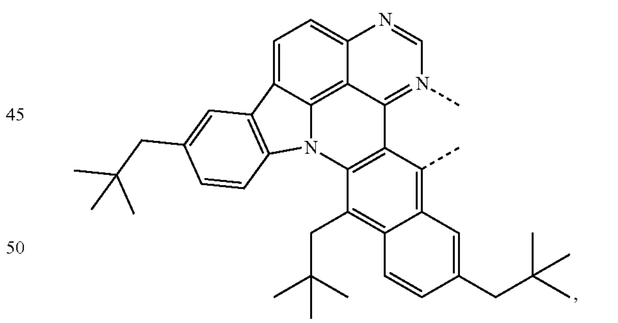
$L_{a1030}$
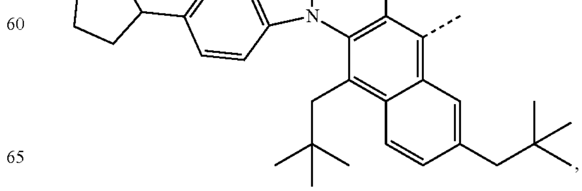

-continued
$L_{a1031}$
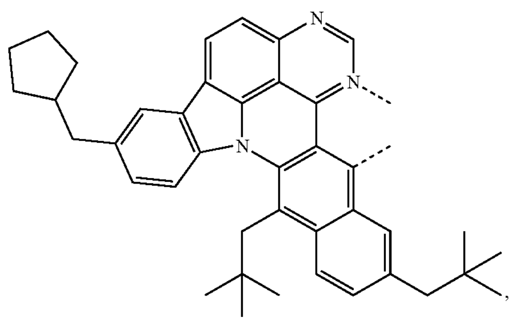
$L_{a1032}$
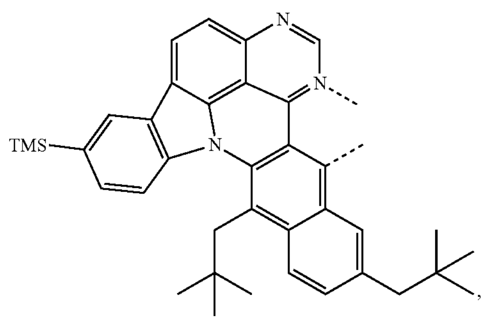
$L_{a1033}$
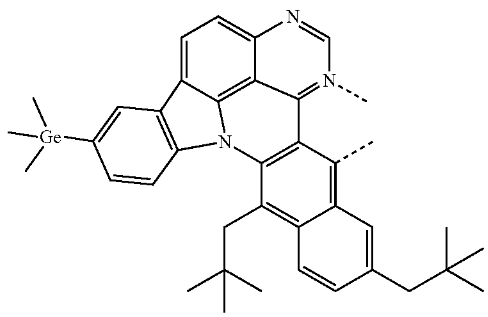
$L_{a1034}$
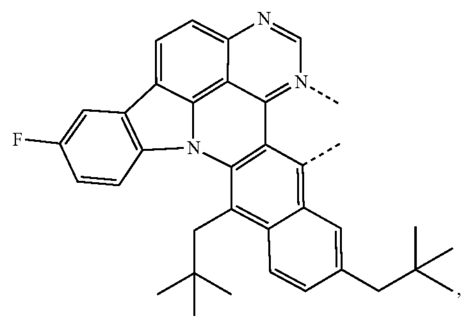
$L_{a1035}$
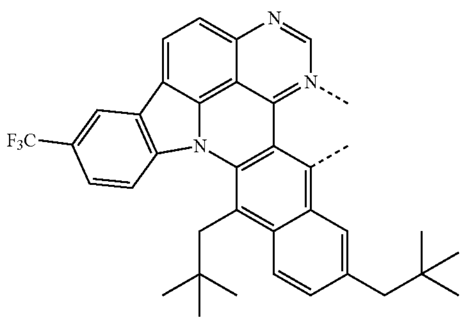
-continued
$L_{a1036}$
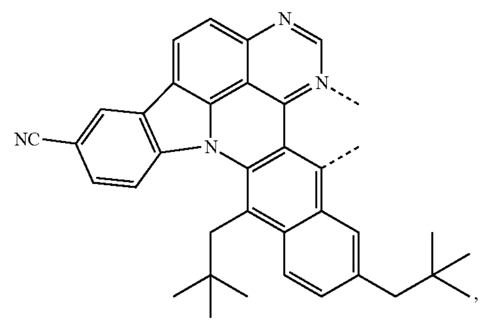
$L_{a1037}$
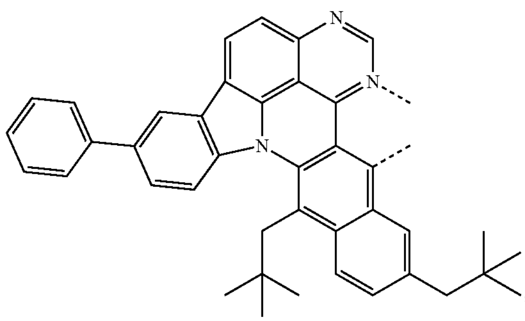
$L_{a1038}$
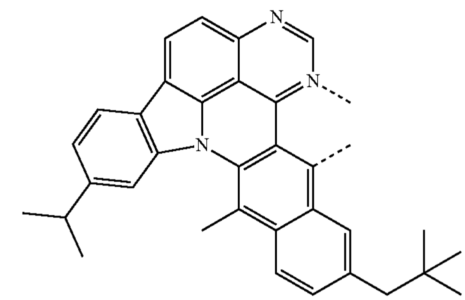
$L_{a1039}$
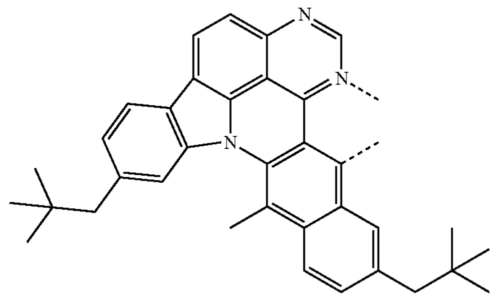
$L_{a1040}$
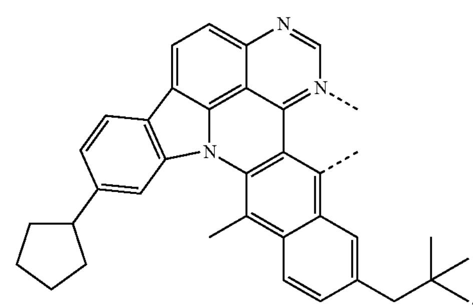

$L_{a1041}$
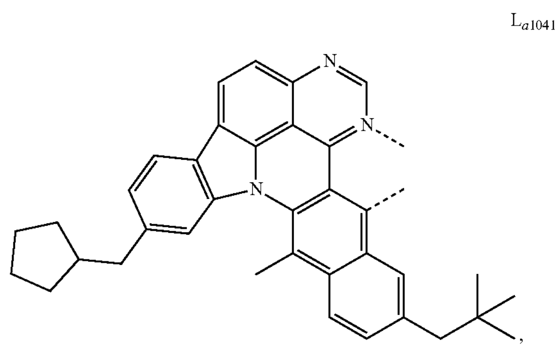
$L_{a1042}$
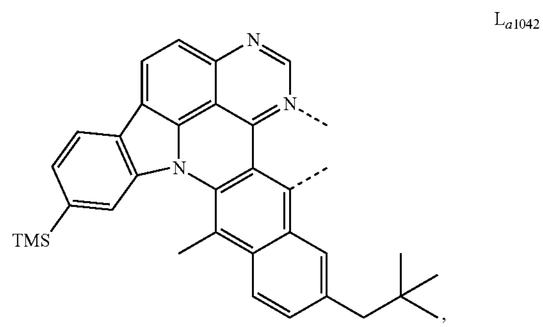
$L_{a1043}$
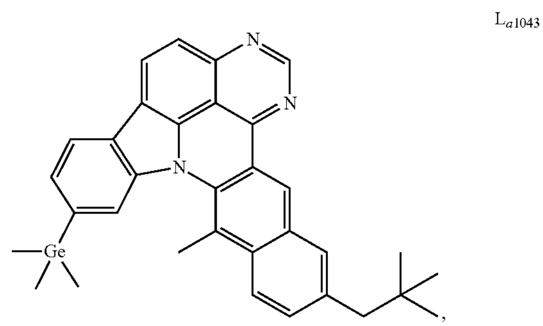
$L_{a1044}$
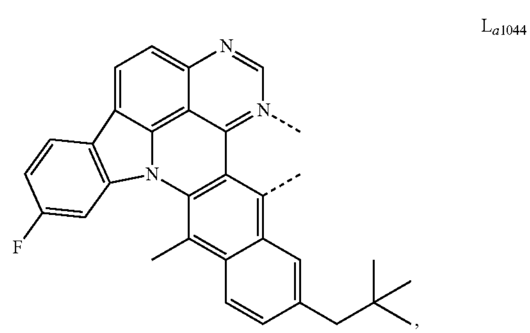
$L_{a1045}$
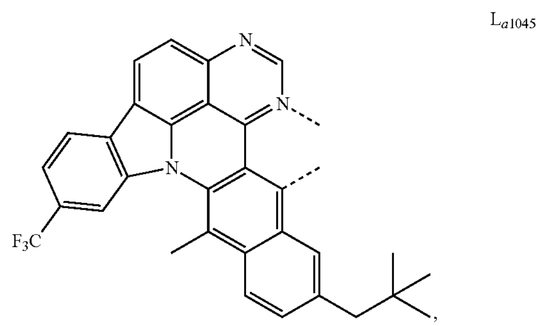
$L_{a1046}$
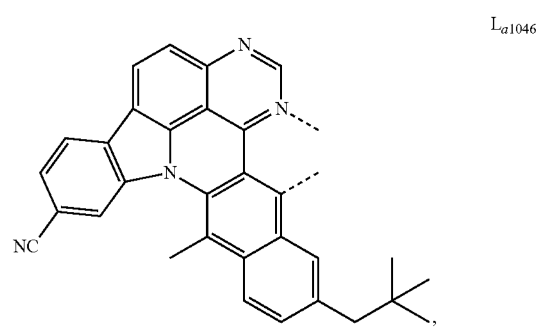
$L_{a1047}$
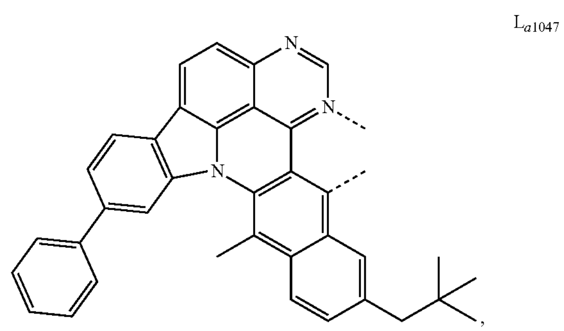
$L_{a1048}$
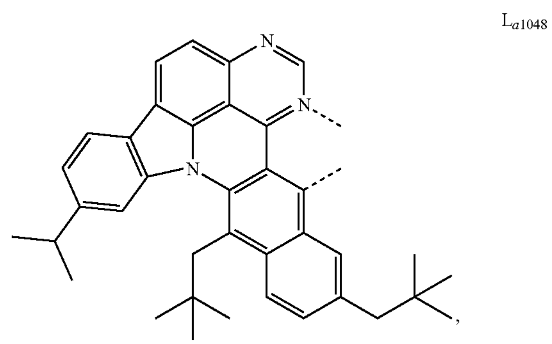
$L_{a1049}$
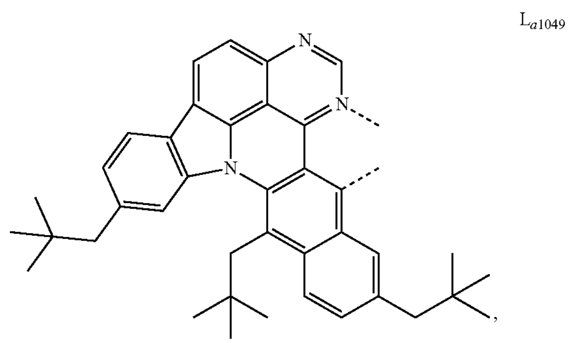
$L_{a1050}$
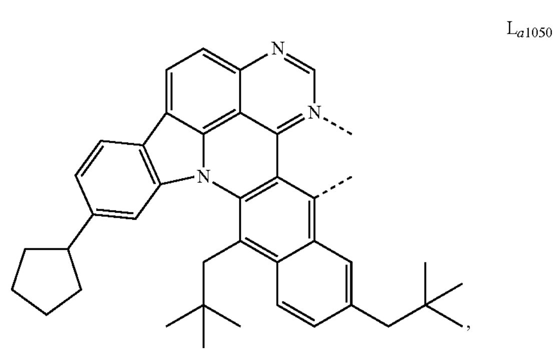

-continued
$L_{a1051}$
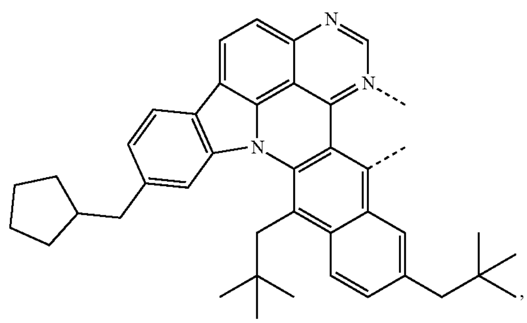
$L_{a1052}$
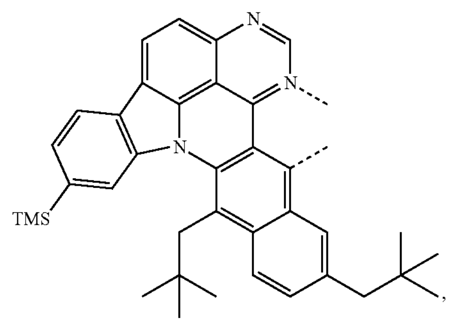
$L_{a1053}$
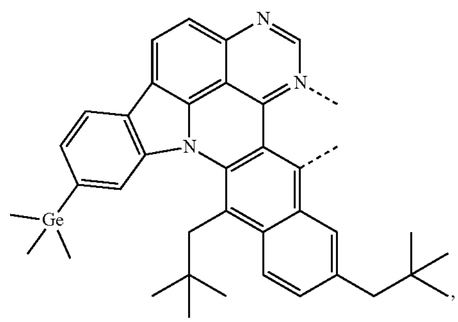
$L_{a1054}$
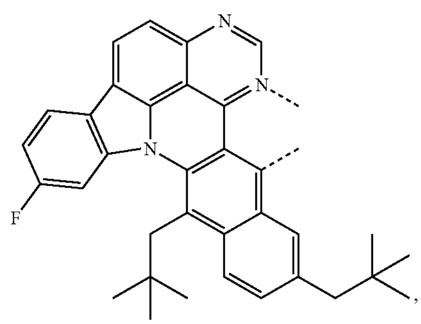
$L_{a1055}$
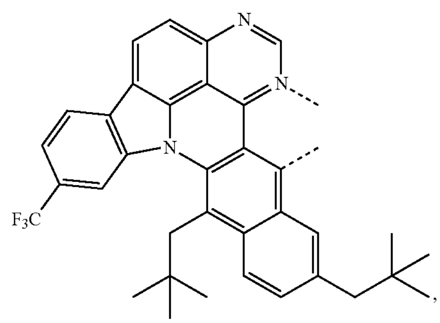
-continued
$L_{a1056}$
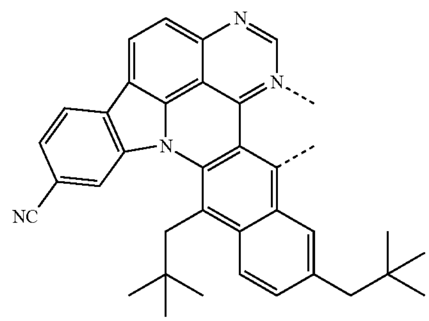
$L_{a1057}$
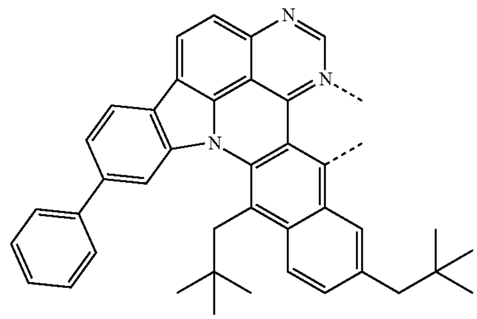
$L_{a1058}$
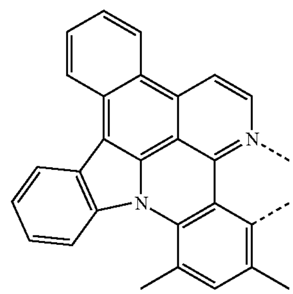
$L_{a1059}$
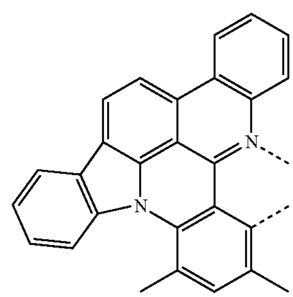
$L_{a1060}$
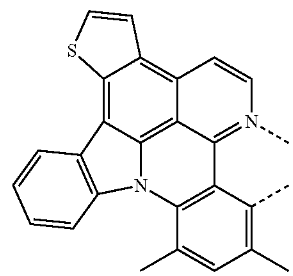

-continued
$L_{a1061}$
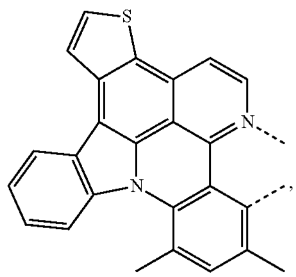
$L_{a1062}$
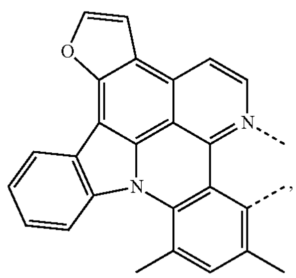
$L_{a1063}$
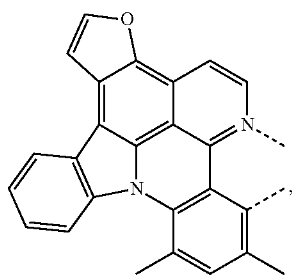
$L_{a1064}$
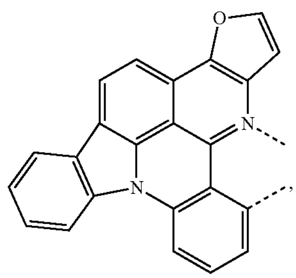
$L_{a1065}$
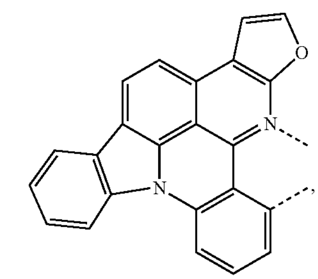
-continued
$L_{a1066}$
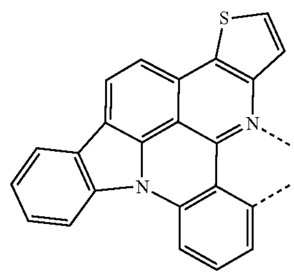
$L_{a1067}$
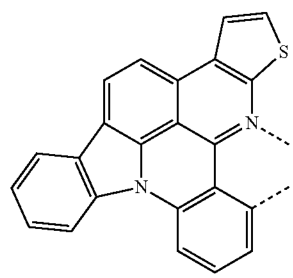
$L_{a1068}$
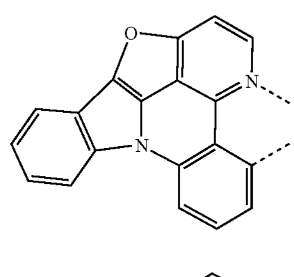
$L_{a1069}$
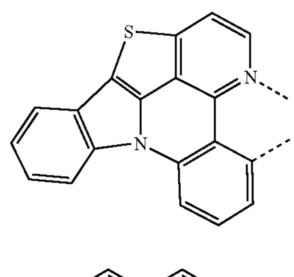
$L_{a1070}$
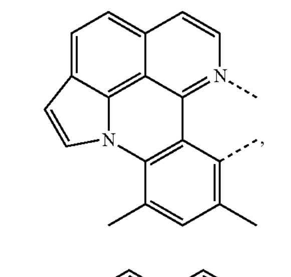
$L_{a1071}$
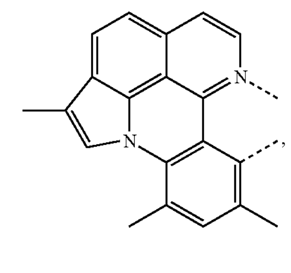

-continued
$L_{a1072}$
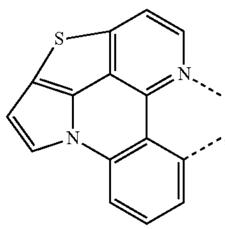
$L_{a1073}$
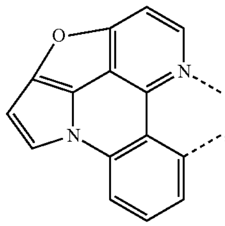
$L_{a1074}$
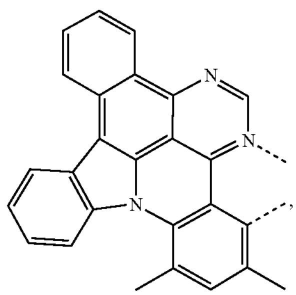
$L_{a1075}$
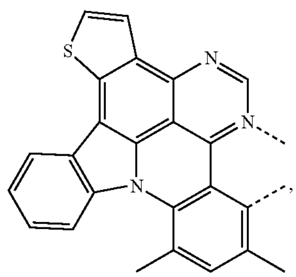
$L_{a1076}$
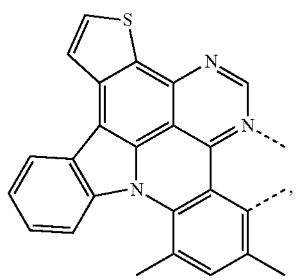
$L_{a1077}$
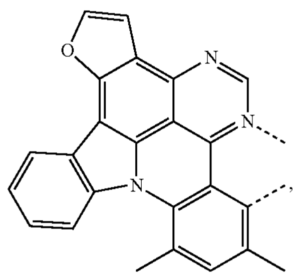
-continued
$L_{a1078}$
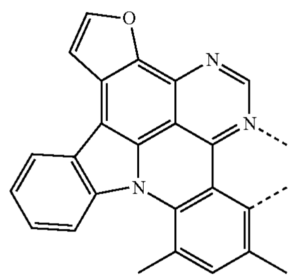
$L_{a1079}$
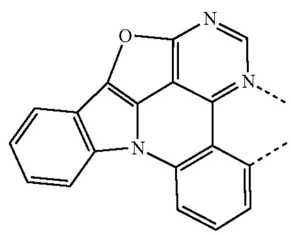
$L_{a1080}$
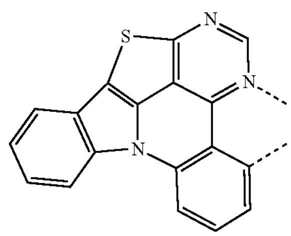
$L_{a1081}$
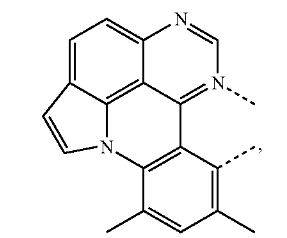
$L_{a1082}$
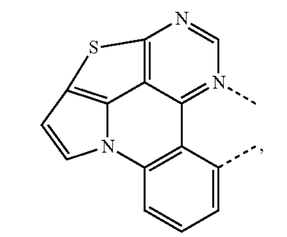
$L_{a1083}$
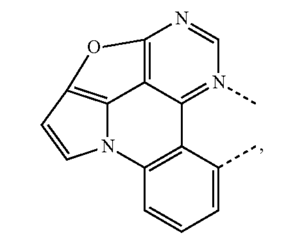

-continued
$L_{a1084}$
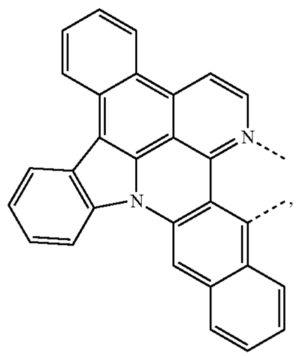
$L_{a1085}$
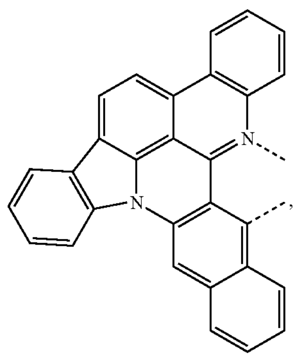
$L_{a1086}$
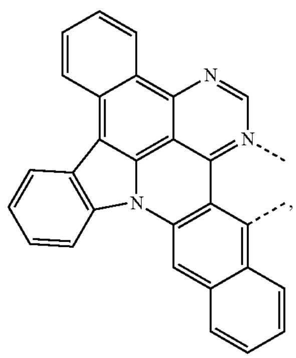
$L_{a1087}$
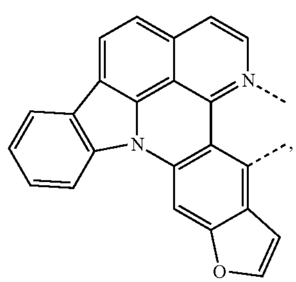
$L_{a1088}$
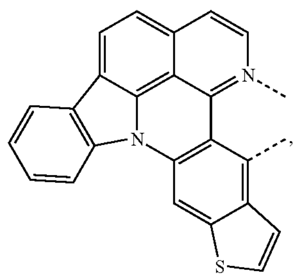
-continued
$L_{a1089}$
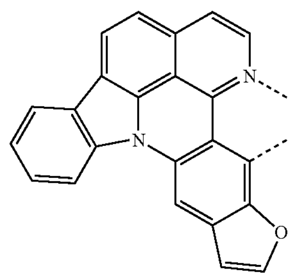
$L_{a1090}$
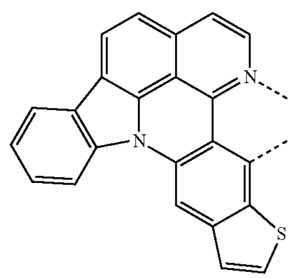
$L_{a1091}$
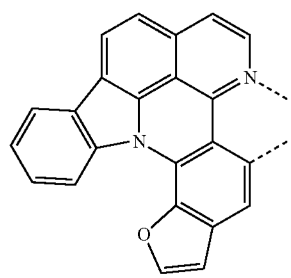
$L_{a1092}$
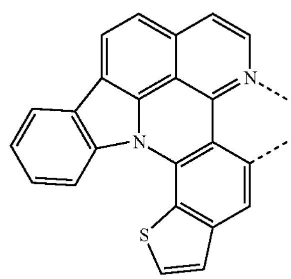
$L_{a1093}$
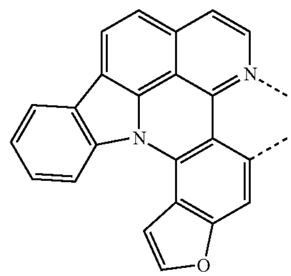

-continued
$L_{a1094}$
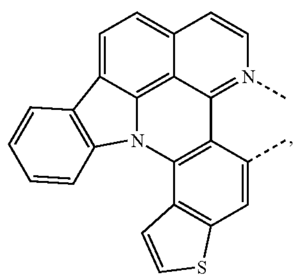
$L_{a1095}$
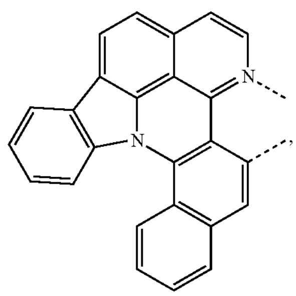
$L_{a1096}$
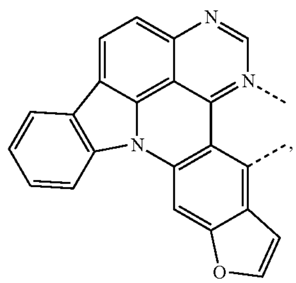
$L_{a1097}$
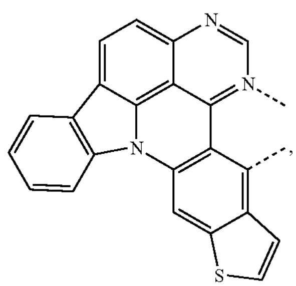
$L_{a1098}$
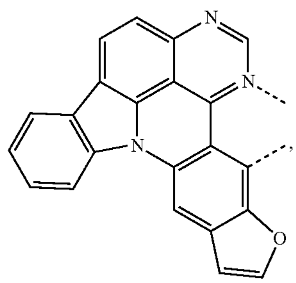
-continued
$L_{a1099}$
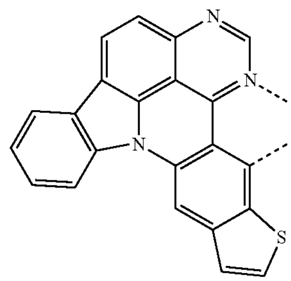
$L_{a1100}$
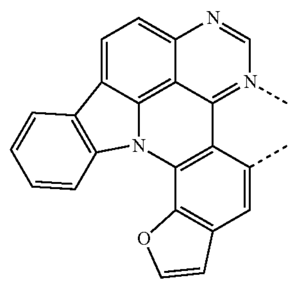
$L_{a1101}$
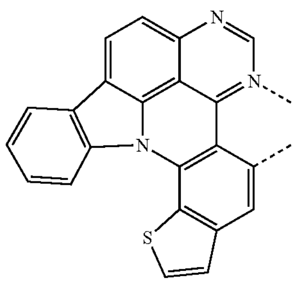
$L_{a1102}$
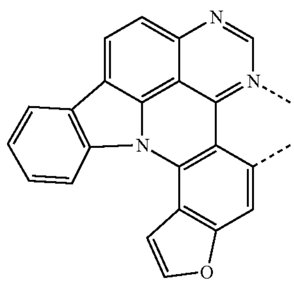
$L_{a1103}$
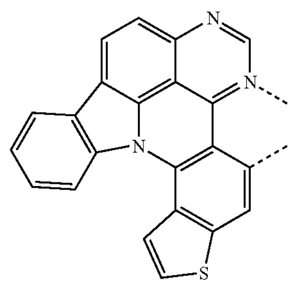

-continued
$L_{a1104}$
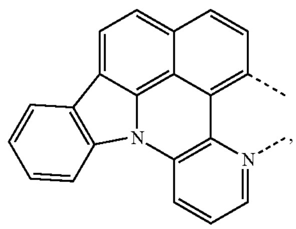
$L_{a1105}$
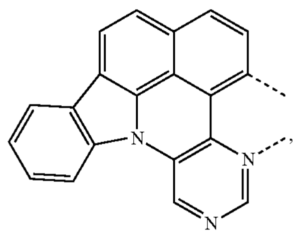
$L_{a1106}$
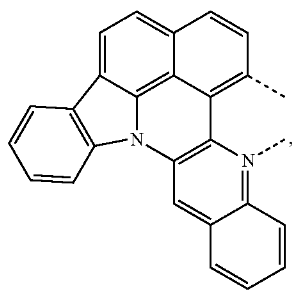
$L_{a1107}$
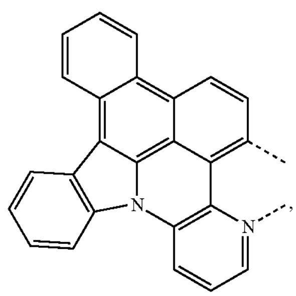
$L_{a1108}$
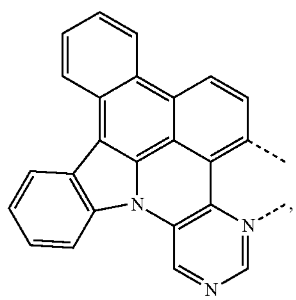
-continued
$L_{a1109}$
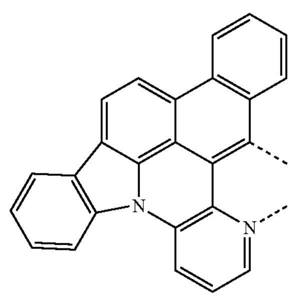
$L_{a1110}$
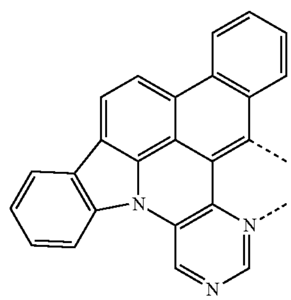
$L_{a1111}$
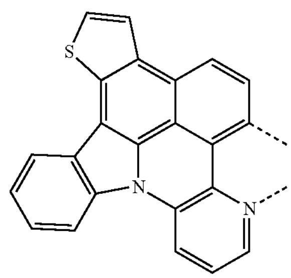
$L_{a1112}$
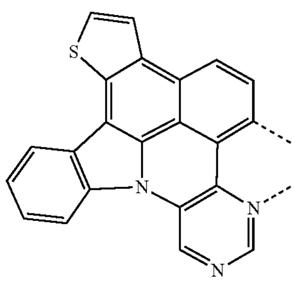
$L_{a1113}$
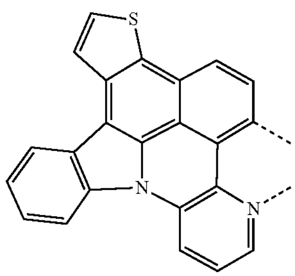

-continued
$L_{a1114}$
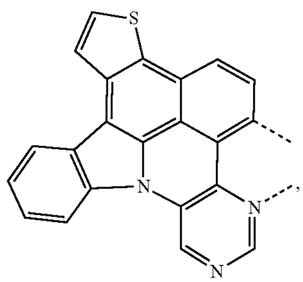
$L_{a1115}$
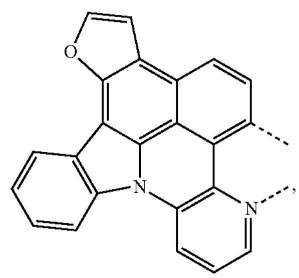
$L_{a1116}$
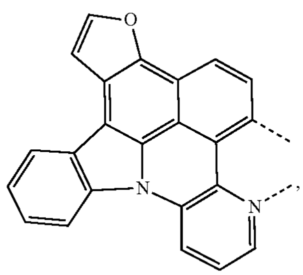
$L_{a1117}$
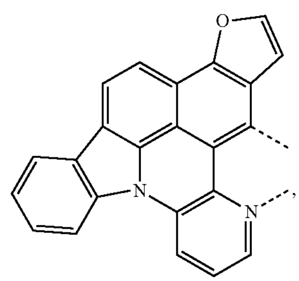
$L_{a1118}$
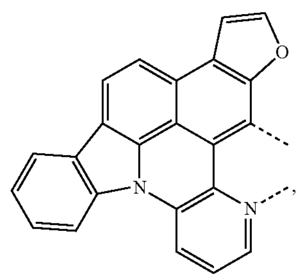
-continued
$L_{a1119}$
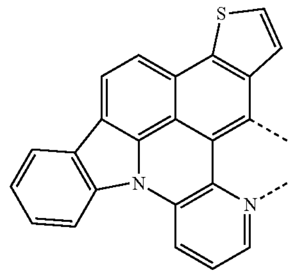
$L_{a1120}$
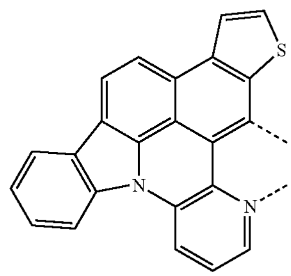
$L_{a1121}$
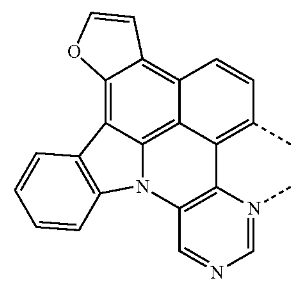
$L_{a1122}$
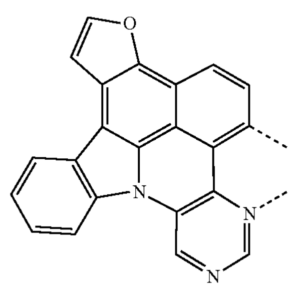
$L_{a1123}$
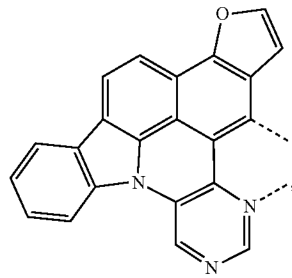

-continued
$L_{a1124}$
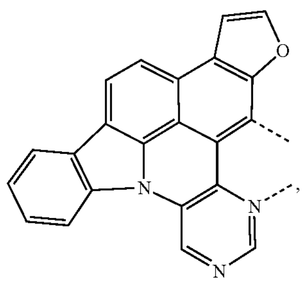
$L_{a1125}$
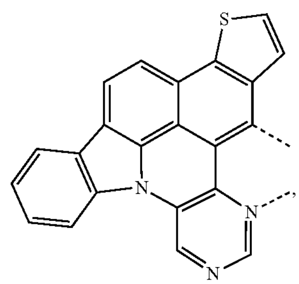
$L_{a1126}$
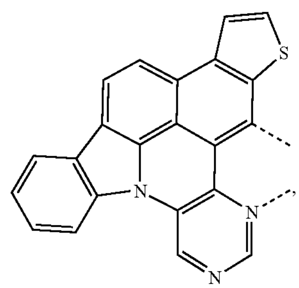
$L_{a1127}$
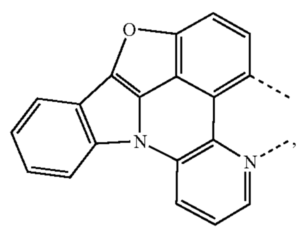
$L_{a1128}$
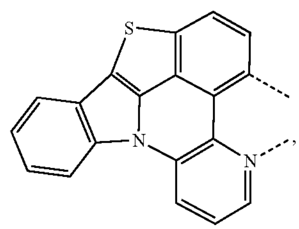
$L_{a1129}$
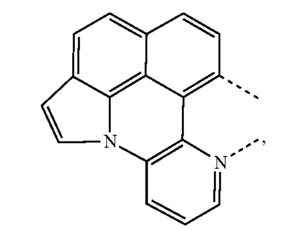
-continued
$L_{a1130}$
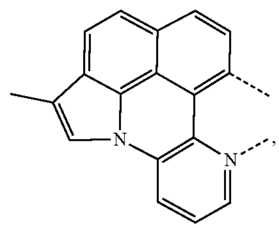
$L_{a1131}$
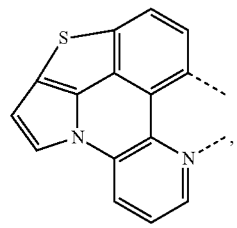
$L_{a1132}$
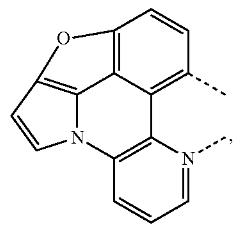
$L_{a1133}$
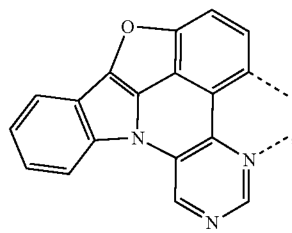
$L_{a1134}$
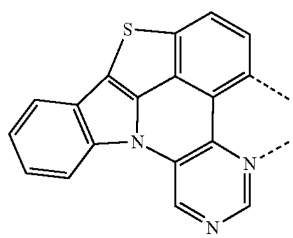
$L_{a1135}$
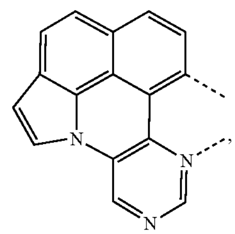

-continued
$L_{a1136}$
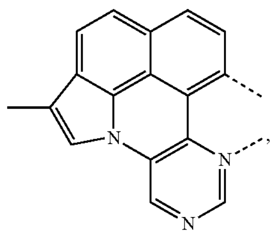
$L_{a1137}$
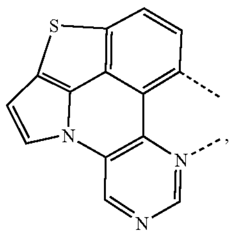
$L_{a1138}$
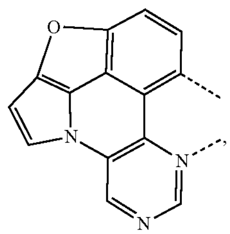
$L_{a1139}$
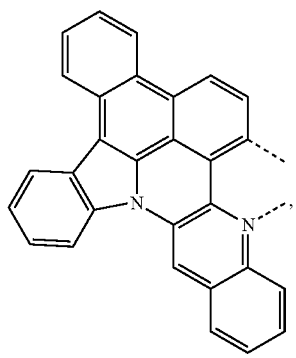
$L_{a1140}$
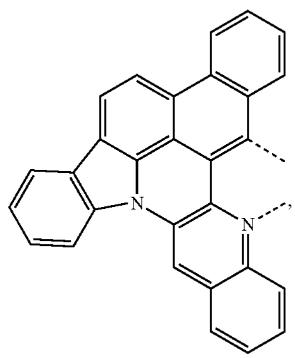
-continued
$L_{a1141}$
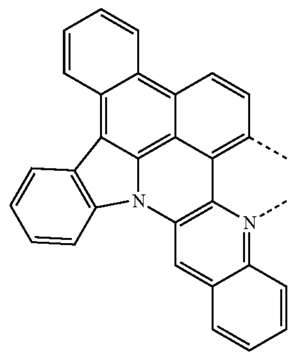
$L_{a1142}$
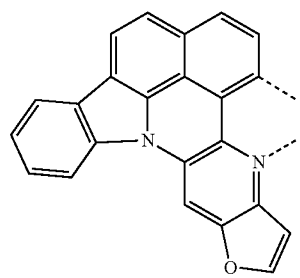
$L_{a1143}$
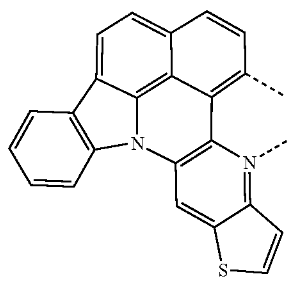
$L_{a1144}$
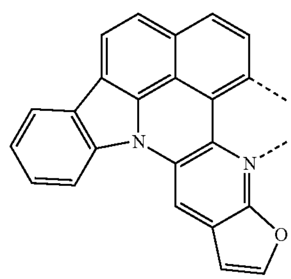
$L_{a1145}$
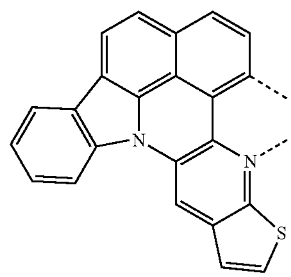

-continued
$L_{a1146}$
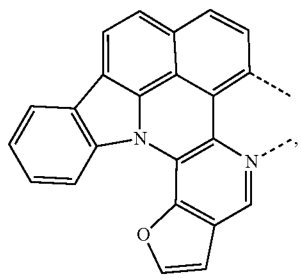
$L_{a1147}$
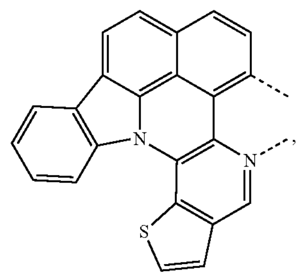
$L_{a1148}$
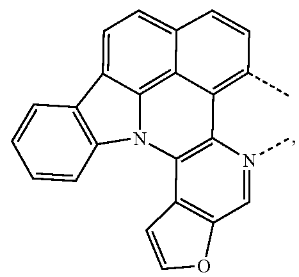
$L_{a1149}$
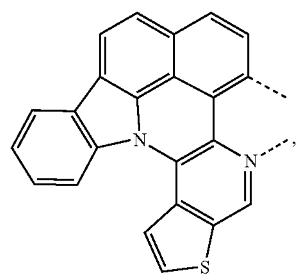
$L_{a1150}$
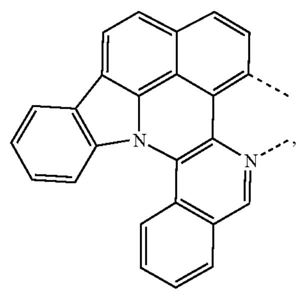
-continued
$L_{a1151}$
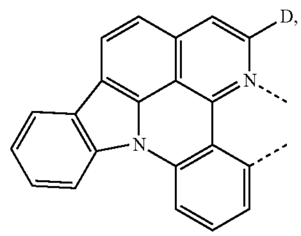
$L_{a1152}$
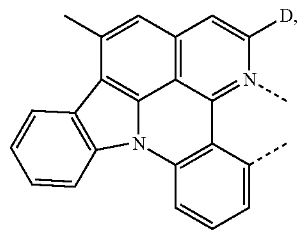
$L_{a1153}$
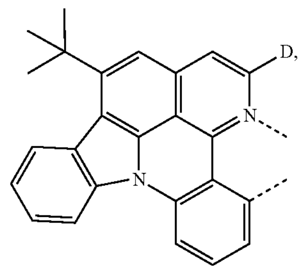
$L_{a1154}$
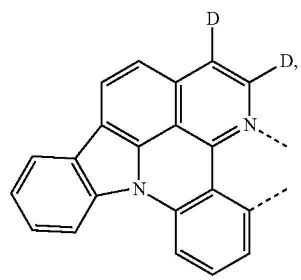
$L_{a1155}$
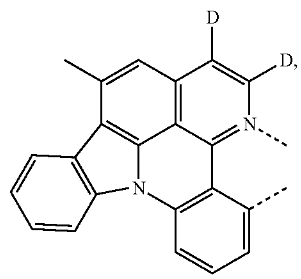
$L_{a1156}$
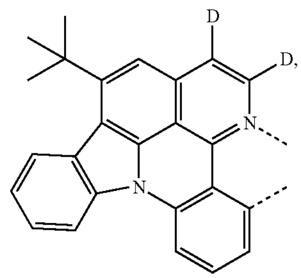

-continued
$L_{a1157}$
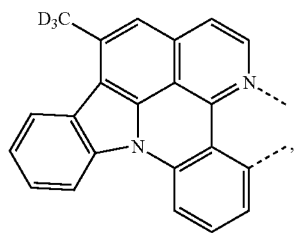
$L_{a1158}$
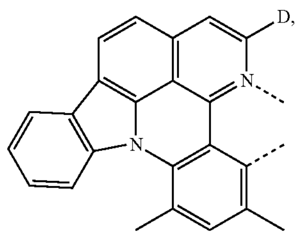
$L_{a1159}$
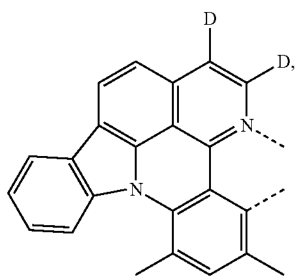
$L_{a1160}$
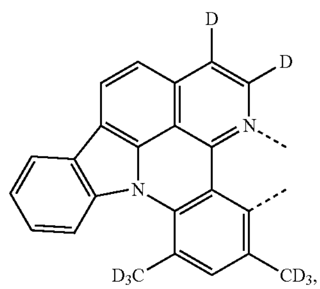
$L_{a1161}$
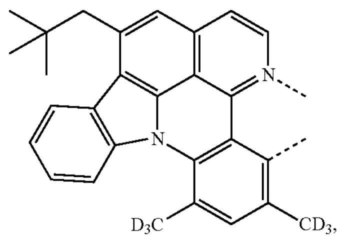
$L_{a1162}$
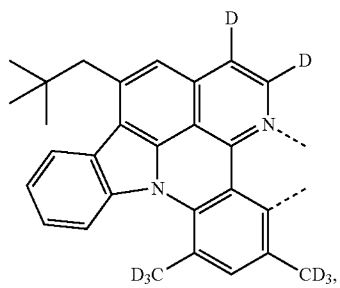
-continued
$L_{a1163}$
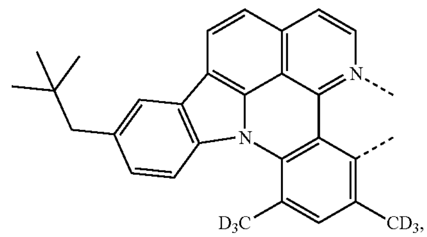
$L_{a1164}$
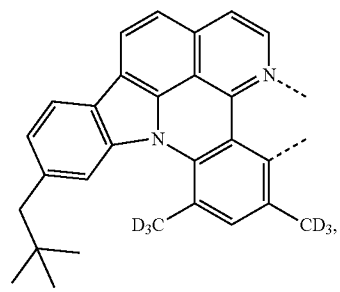
$L_{a1165}$
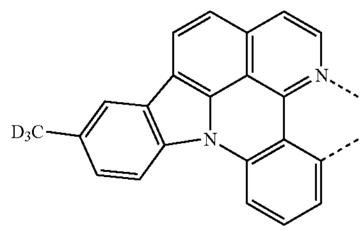
$L_{a1166}$
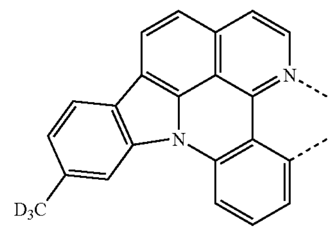
$L_{a1167}$
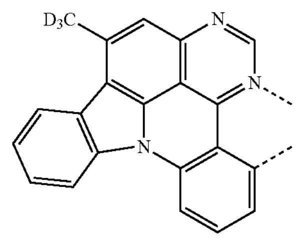
$L_{a1168}$
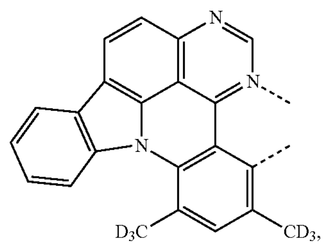

-continued
$L_{a1169}$
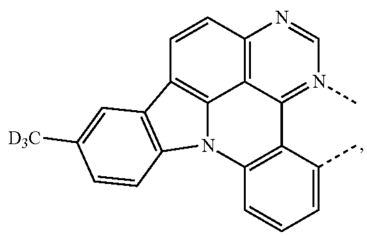
$L_{a1170}$
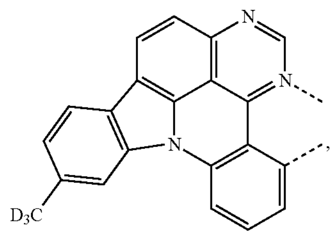
$L_{a1171}$
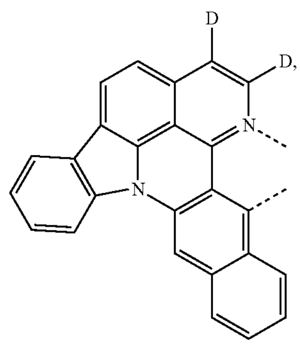
$L_{a1172}$
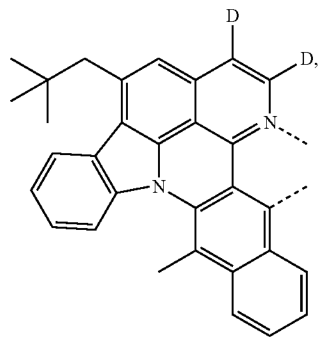
$L_{a1173}$
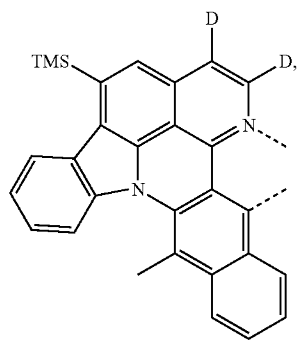
-continued
$L_{a1174}$
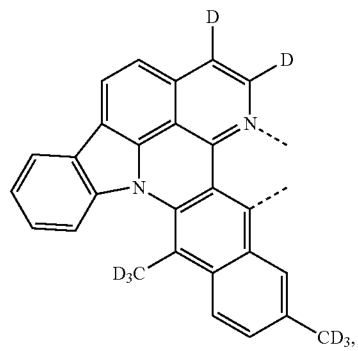
$L_{a1175}$
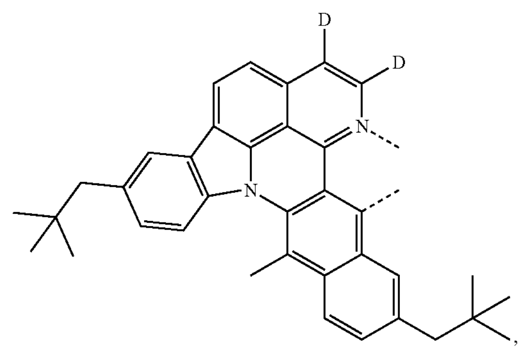
$L_{a1176}$
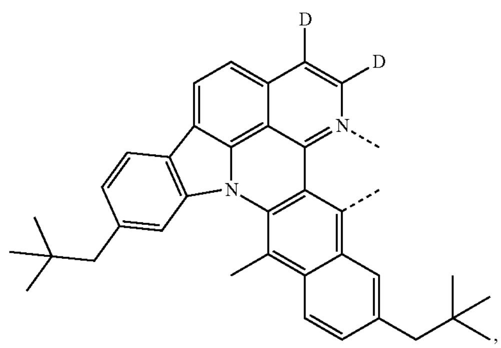
$L_{a1177}$
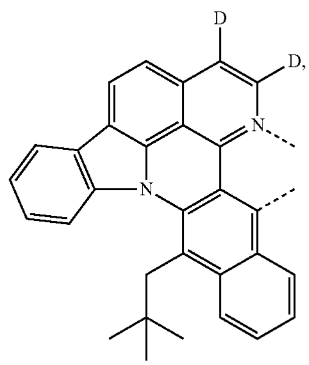

-continued
$L_{a1178}$
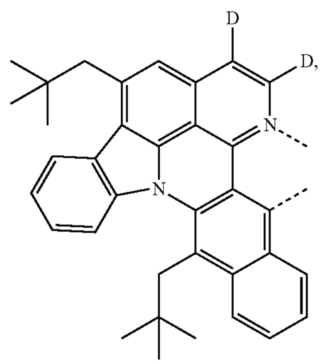
$L_{a1179}$
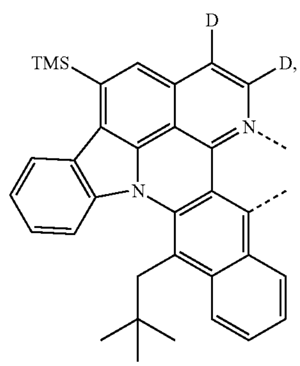
$L_{a1180}$
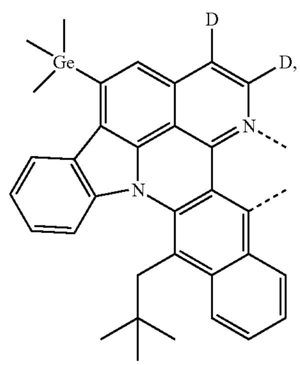
$L_{a1181}$
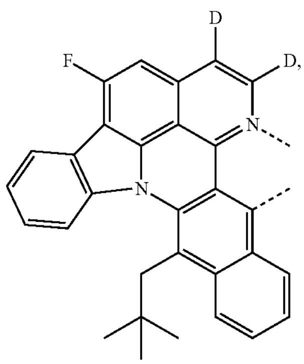
-continued
$L_{a1182}$
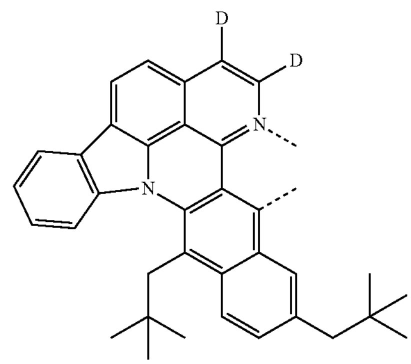
$L_{a1183}$
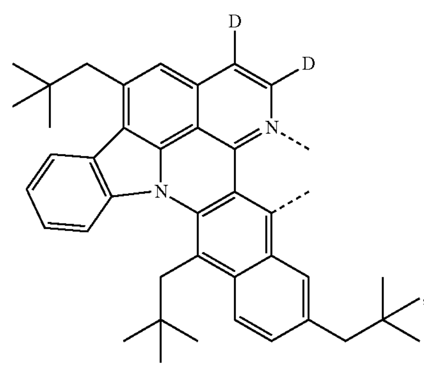
$L_{a1184}$
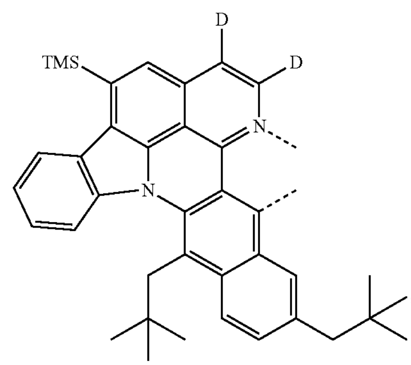
$L_{a1185}$
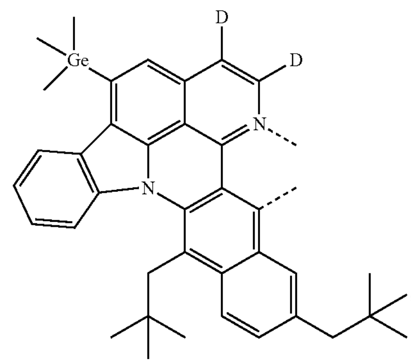

$L_{a1186}$
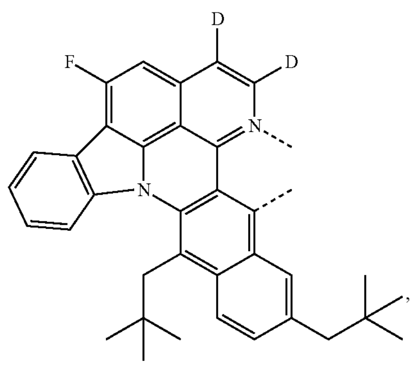
$L_{a1187}$
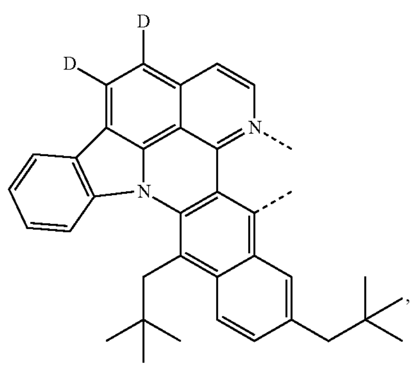
$L_{a1188}$
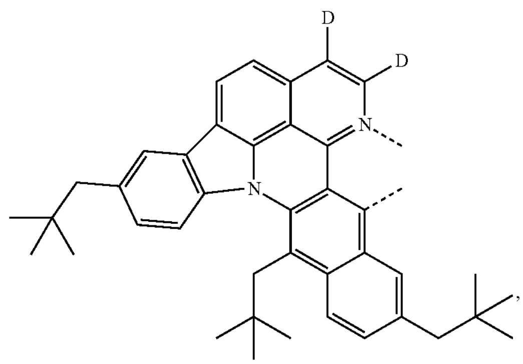
$L_{a1189}$
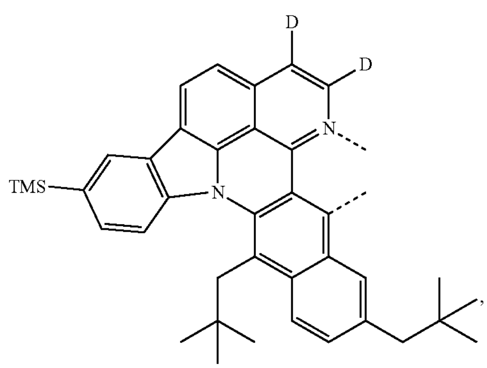
$L_{a1190}$
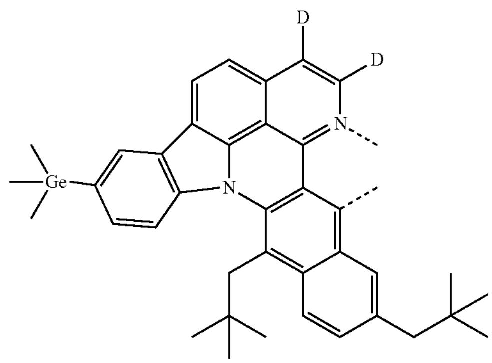
$L_{a1191}$
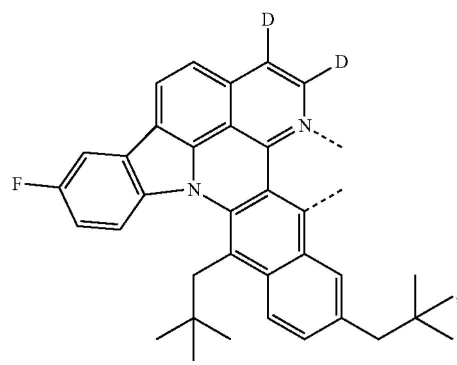
$L_{a1192}$
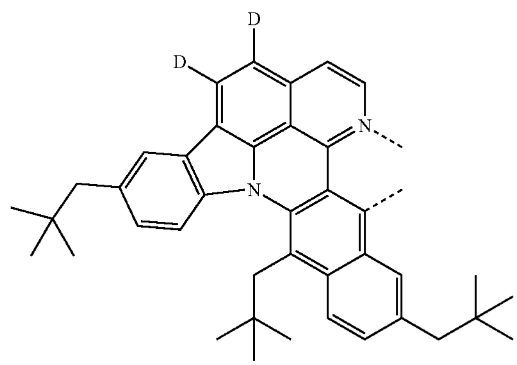
$L_{a1193}$
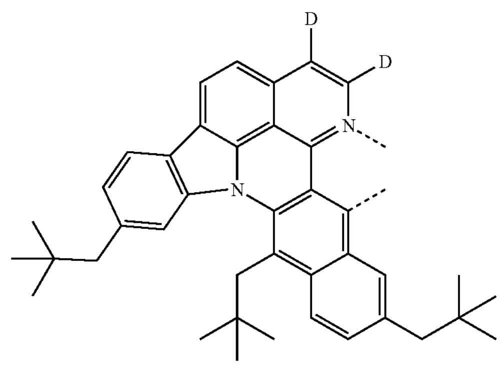

-continued
$L_{a1194}$
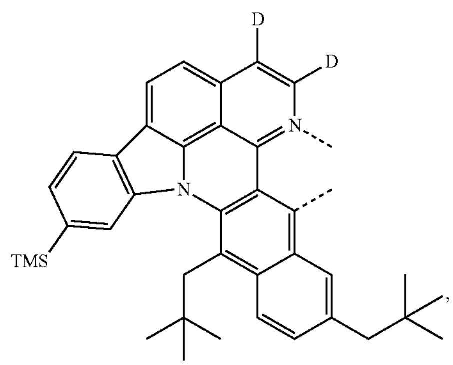
$L_{a1195}$
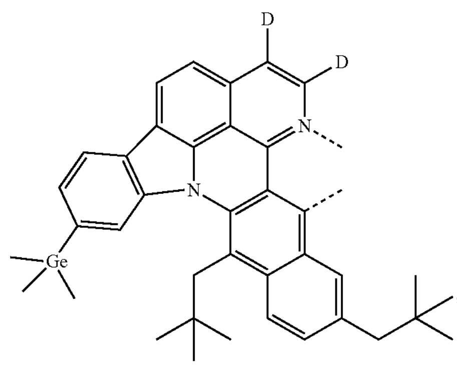
$L_{a1196}$
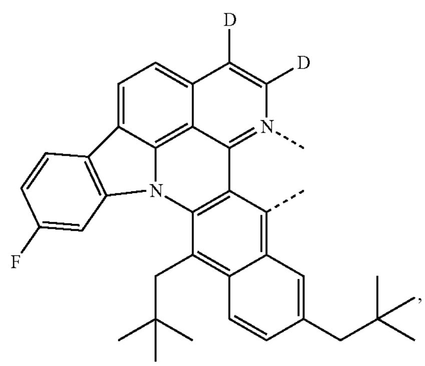
$L_{a1197}$
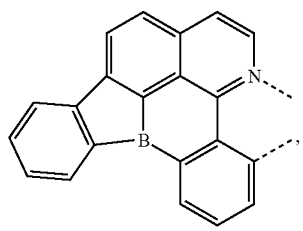
$L_{a1198}$
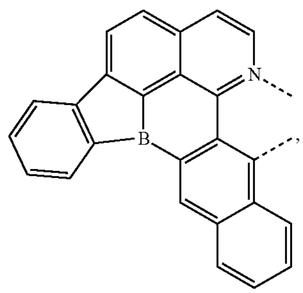
-continued
$L_{a1199}$
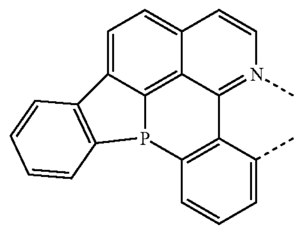
$L_{a1200}$
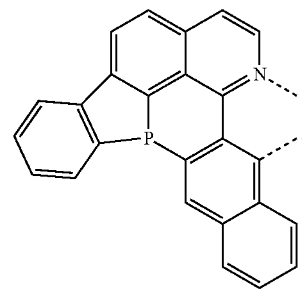
$L_{a1201}$
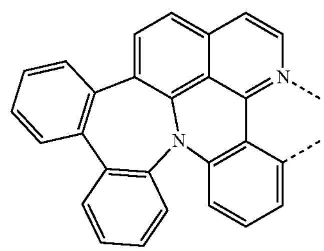
$L_{a1202}$
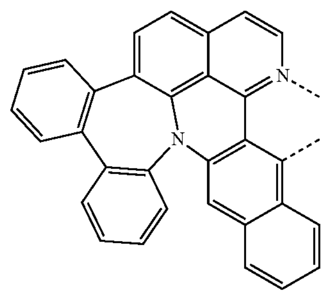
$L_{a1203}$
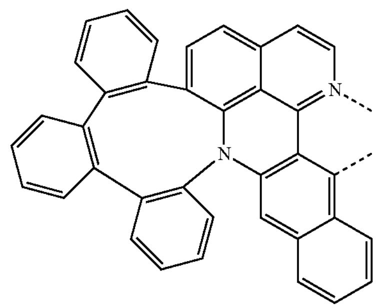

-continued
$L_{a1204}$
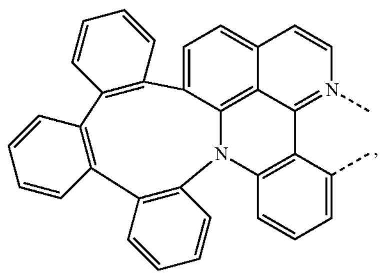
$L_{a1205}$
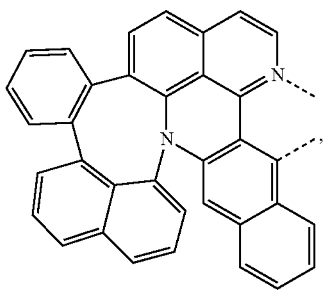
$L_{a1206}$
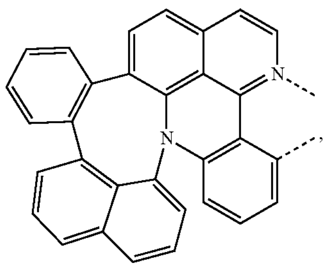
$L_{a1207}$
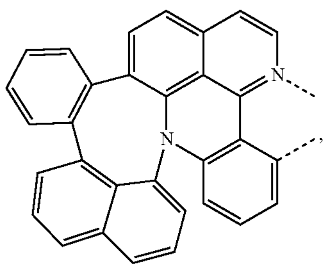
$L_{a1208}$
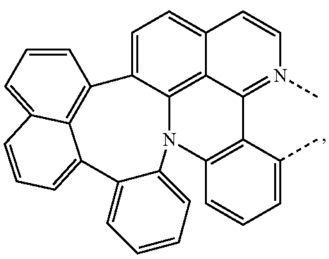
-continued
$L_{a1209}$
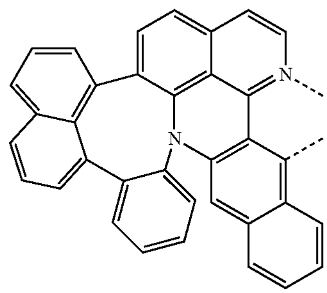
$L_{a1210}$
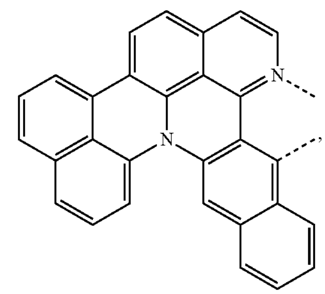
$L_{a1211}$
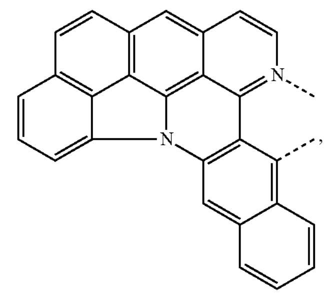
$L_{a1212}$
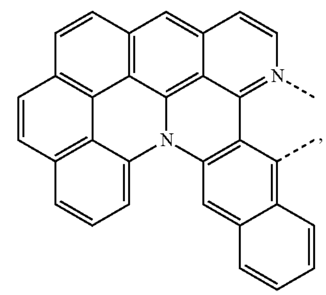
$L_{a1213}$
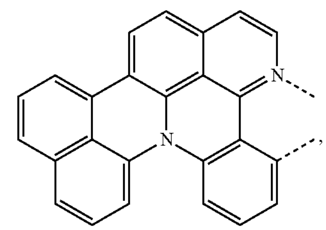

-continued
$L_{a1214}$
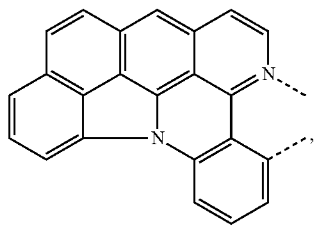
$L_{a1215}$
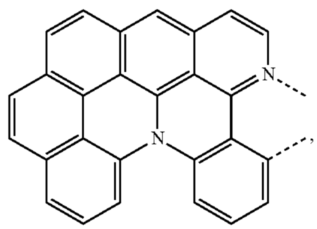
$L_{a1216}$
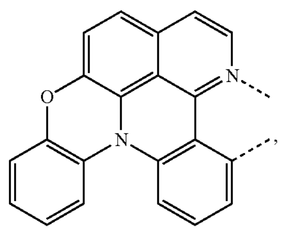
$L_{a1217}$
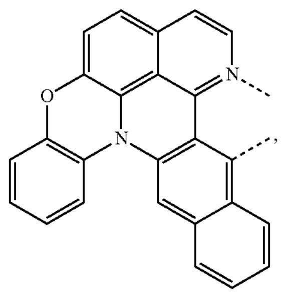
$L_{a1218}$
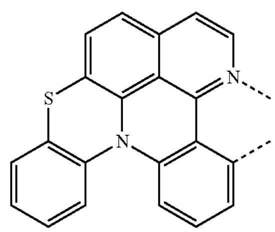
$L_{a1219}$
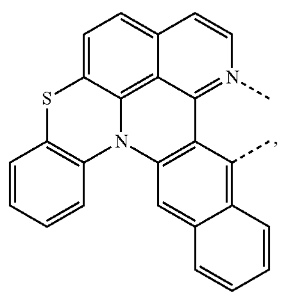
-continued
$L_{a1220}$
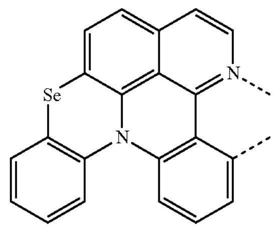
$L_{a1221}$
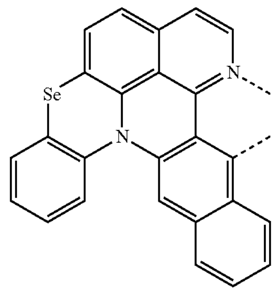
$L_{a1222}$
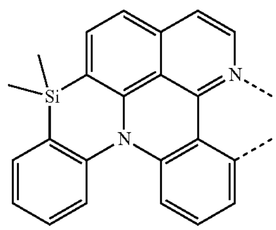
$L_{a1223}$
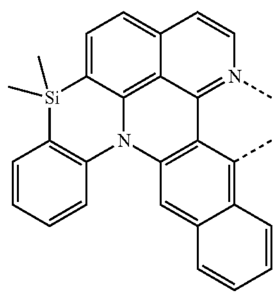
$L_{a1224}$
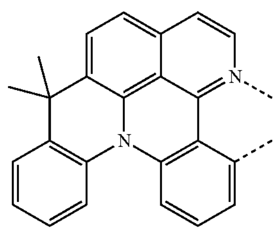
$L_{a1225}$
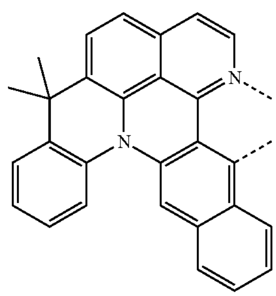

-continued
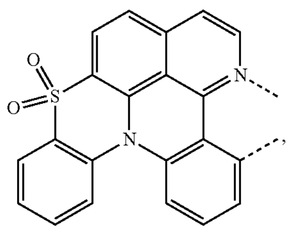
$L_{a1226}$
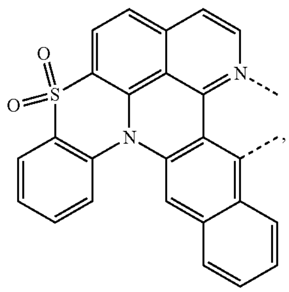
$L_{a1227}$
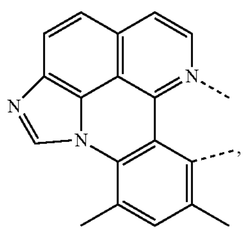
$L_{a1228}$
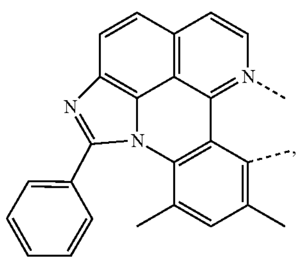
$L_{a1229}$
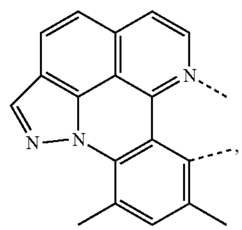
$L_{a1230}$
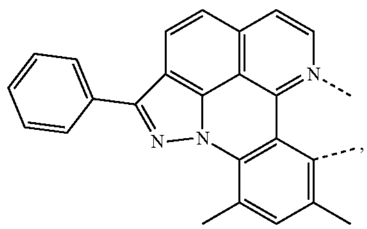
$L_{a1231}$
-continued
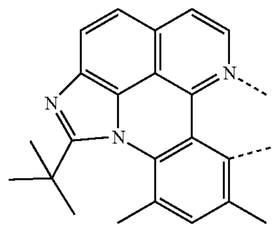
$L_{a1232}$
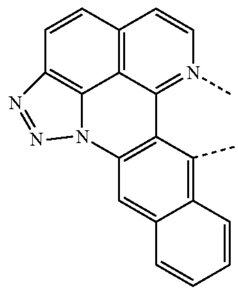
$L_{a1233}$
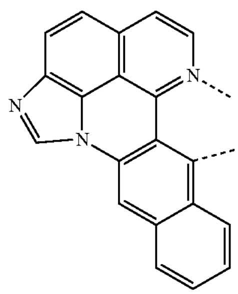
$L_{a1234}$
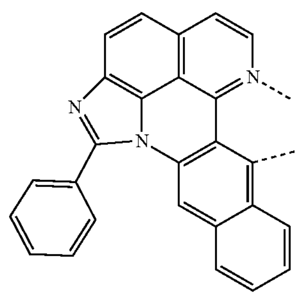
$L_{a1235}$
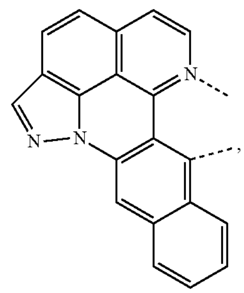
$L_{a1236}$ -continued $L_{a1237}$

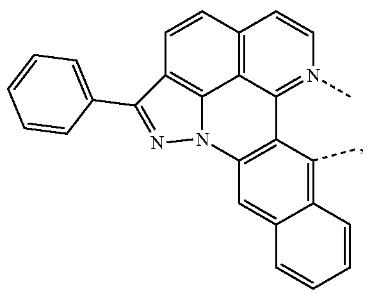

$L_{a1238}$

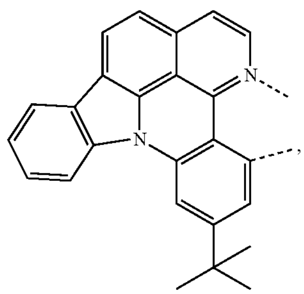

$L_{a1239}$

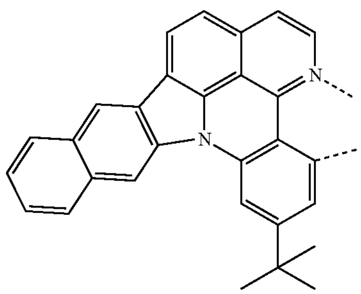

$L_{a1240}$

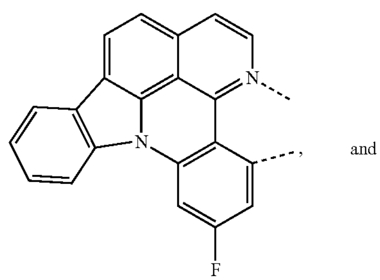

and $L_{a1241}$

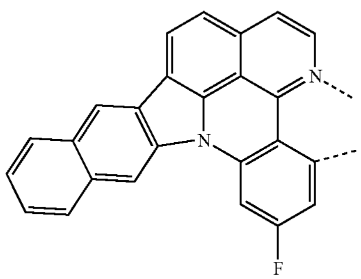

wherein TMS represents trimethylsilyl, and Ph represents phenyl;

optionally, hydrogens in the structures $L_{a1}$ to $L_{a1241}$ can be partially or completely substituted with deuterium.

10. The metal complex of claim 1, wherein the metal complex has a general formula of $M(L_a)_m(LU)_n(L_c)_q$;

wherein the metal M is selected from Ir, Rh, Re, Os, Pt, Au or Cu; $L_a$, $L_b$, and $L_c$ are a first ligand, a second ligand and a third ligand coordinated to the metal M, respectively; m is selected from 1, 2 or 3, n is selected from 0, 1 or 2, q is selected from 0, 1 or 2, and m+n+q is equal to an oxidation state of the metal M; when m is equal to 2 or 3, a plurality of $L_a$ can be identical or different; when n is equal to 2, two $L_b$ can be identical or different; and when q is equal to 2, two $L_c$ can be identical or different;

$L_a$, $L_b$, and $L_c$ can be optionally joined to form a multi-dentate ligand;

$L_b$ and $L_c$ are, at each occurrence identically or differently, selected from the group consisting of the following structures:

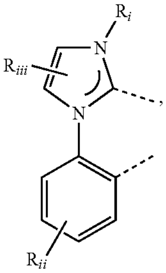

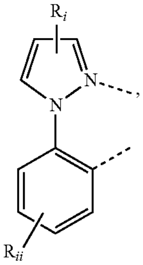

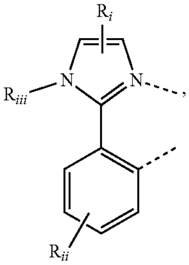

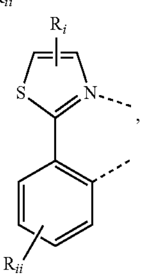

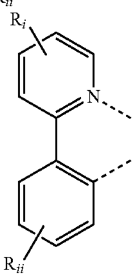

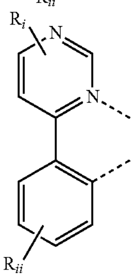

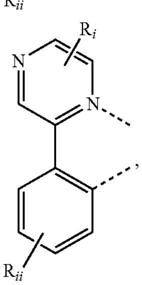

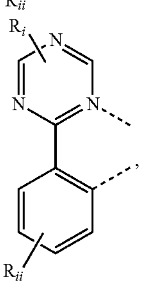

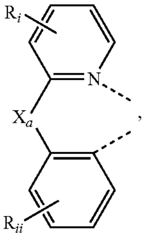

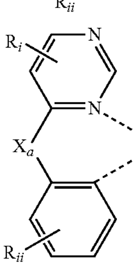

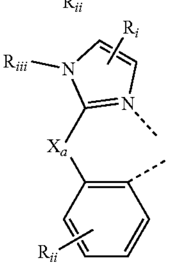

and

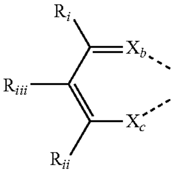

wherein $R_i$, $R_{ii}$, and $R_{iii}$ represent, at each occurrence identically or differently, mono-substitution, multiple substitutions or non-substitution;

$X_a$ is, at each occurrence identically or differently, selected from the group consisting of: O, S, Se, $NR_{N1}$, and $CR_{C1}R_{C2}$;

$X_b$ and $X_c$ are, at each occurrence identically or differently, selected from the group consisting of: O, S, Se and $NR_{N2}$;

$R_i$, $R_{ii}$, $R_{iii}$, $R_{N1}$, $R_{N2}$, $R_{C1}$, and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_i$, $R_{ii}$, $R_{iii}$, $R_{N1}$, $R_{N2}$, $R_{C1}$ and $R_{C2}$ can be optionally joined to form a ring.

11. The metal complex of claim 10, wherein $L_b$ is, at each occurrence identically or differently, selected from the following structure:

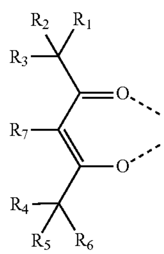

wherein $R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

12. The metal complex of claim 10, wherein L is, at each occurrence identically or differently, selected from the following structure:

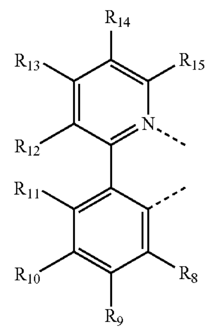

wherein $R_8$ to $R_{15}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof, adjacent substituents $R_8$ to $R_{15}$ can be optionally joined to form a ring.

13. The metal complex of claim 10, wherein $L_b$ is, at each occurrence identically or differently, selected from the group consisting of the following structures:

-continued
$L_{b1}$
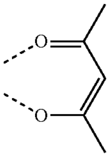,
$L_{b2}$
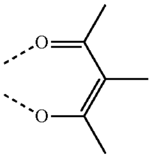,
$L_{b3}$
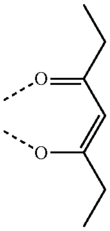,
$L_{b4}$
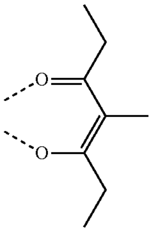,
$L_{b5}$
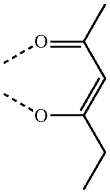,
$L_{b6}$
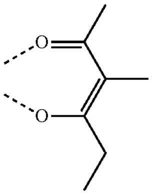,
$L_{b7}$
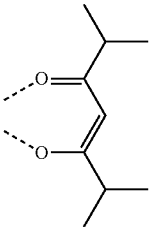,
$L_{b8}$
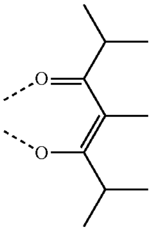,
$L_{b9}$
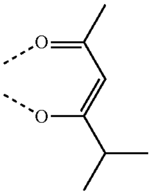,
$L_{b10}$
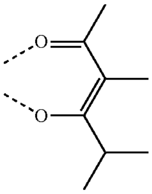,
$L_{b11}$
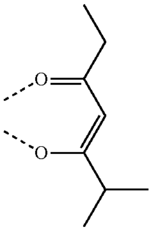,
$L_{b12}$
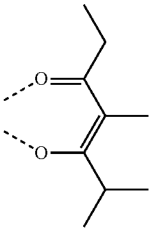,
$L_{b13}$
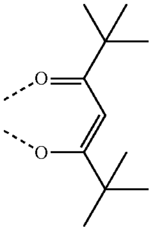,
$L_{b14}$
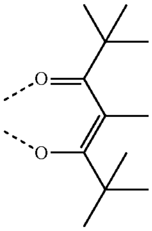, -continued
$L_{b15}$
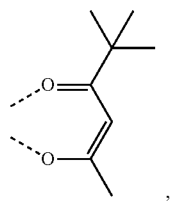
,
$L_{b16}$
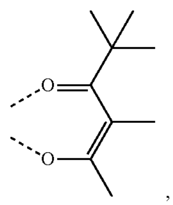
,
$L_{b17}$
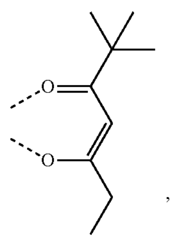
,
$L_{b18}$
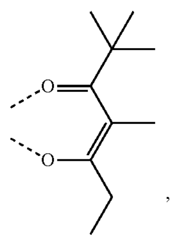
,
$L_{b19}$
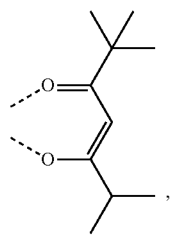
,
$L_{b20}$
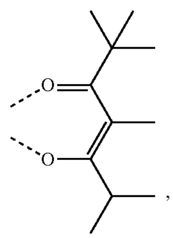
,
-continued
$L_{b21}$
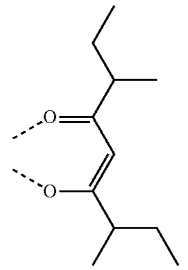
,
$L_{b22}$
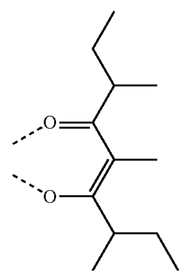
,
$L_{b23}$
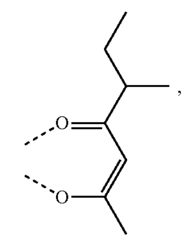
,
$L_{b24}$
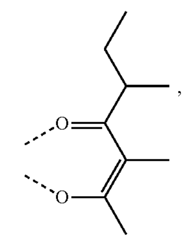
,
$L_{b25}$
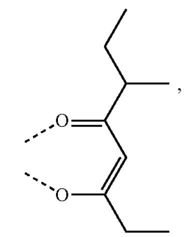
,
$L_{b26}$
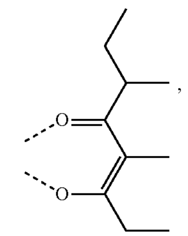
, $L_{b27}$
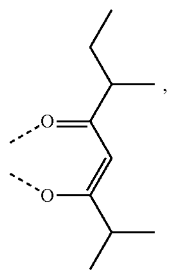
,
$L_{b28}$
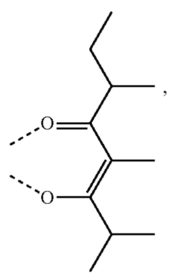
,
$L_{b29}$
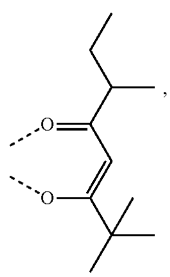
,
$L_{b30}$
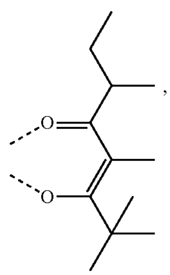
,
$L_{b31}$
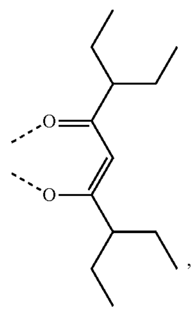
,
$L_{b32}$
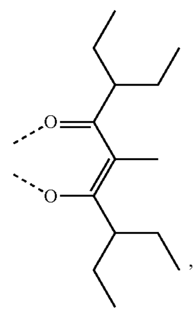
,
$L_{b33}$
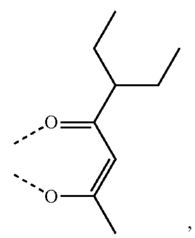
,
$L_{b34}$
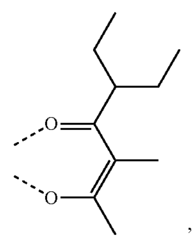
,
$L_{b35}$
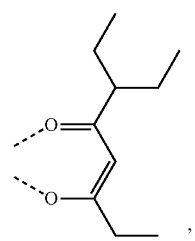
,
$L_{b36}$
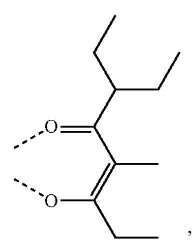
,
$L_{b37}$
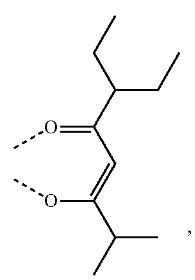
, $L_{b38}$
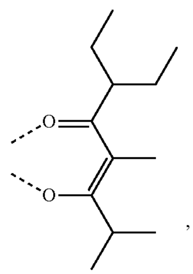
,
$L_{b39}$
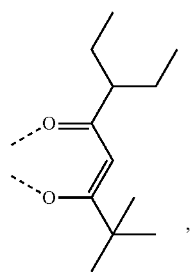
,
$L_{b40}$
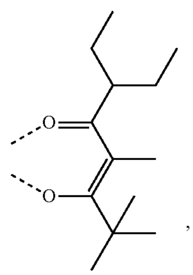
,
$L_{b41}$
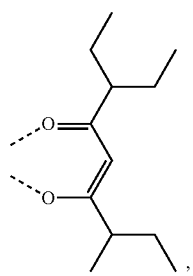
,
$L_{b42}$
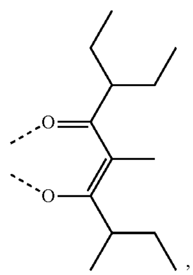
,
$L_{b43}$
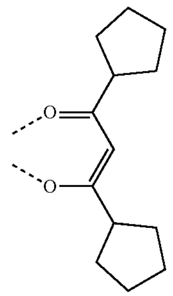
,
$L_{b44}$
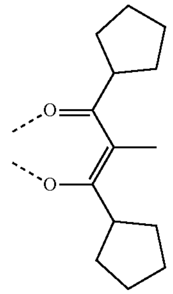
,
$L_{b45}$
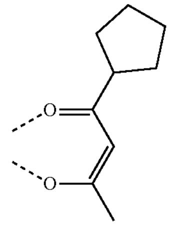
,
$L_{b46}$
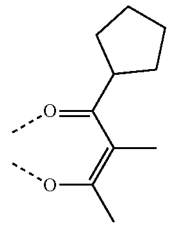
,
$L_{b47}$
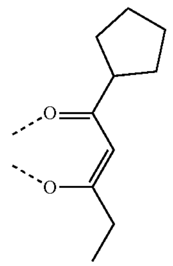
,
$L_{b48}$
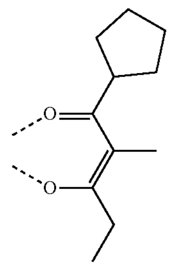
, -continued
$L_{b49}$
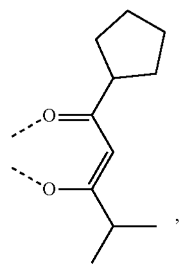
,
$L_{b50}$
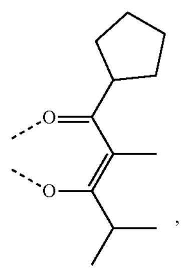
,
$L_{b51}$
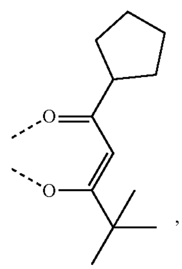
,
$L_{b52}$
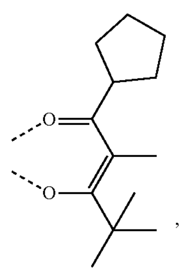
,
$L_{b53}$
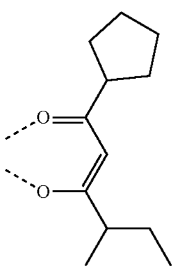
,
-continued
$L_{b54}$
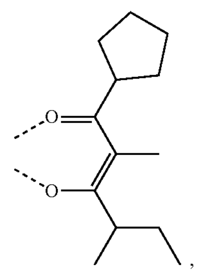
,
$L_{b55}$
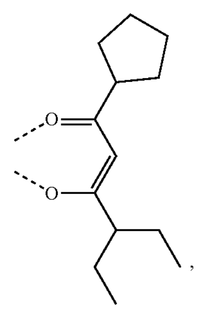
,
$L_{b56}$
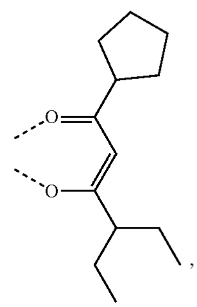
,
$L_{b57}$
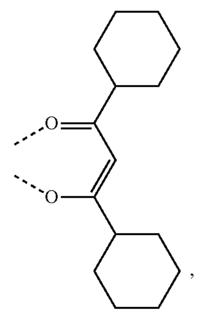
,
$L_{b58}$
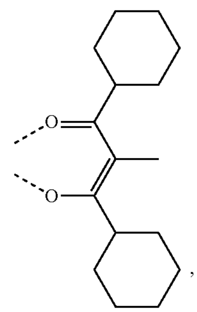
, -continued
$L_{b59}$
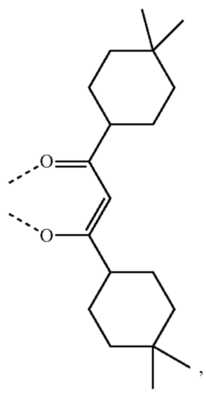
$L_{b60}$
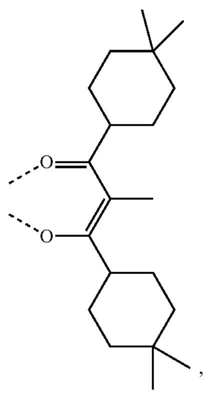
$L_{b61}$
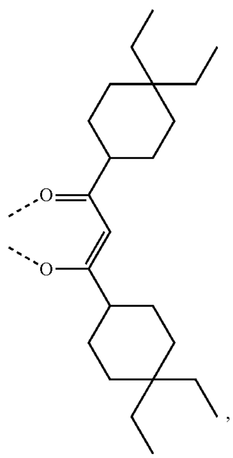
-continued
$L_{b62}$
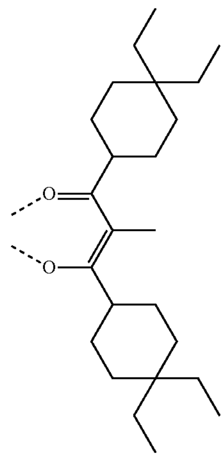
$L_{b63}$
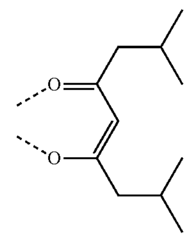
$L_{b64}$
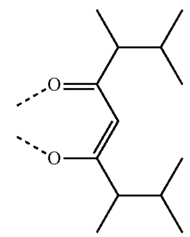
$L_{b65}$
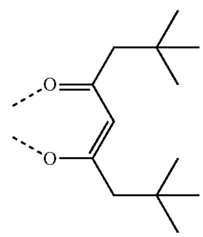
$L_{b66}$
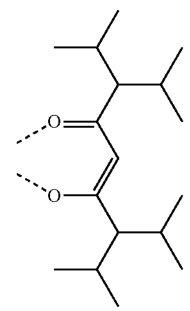

-continued
$L_{b67}$
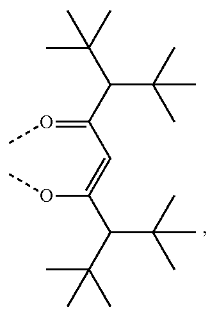
$L_{b68}$
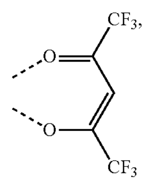
$L_{b69}$
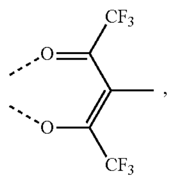
$L_{b70}$
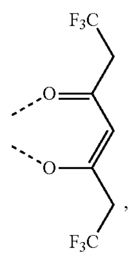
$L_{b71}$
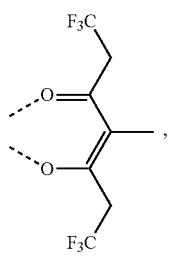
$L_{b72}$
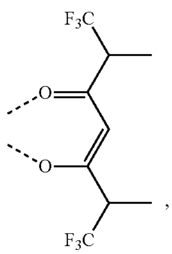
-continued
$L_{b73}$
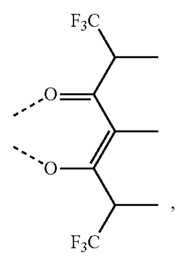
$L_{b74}$
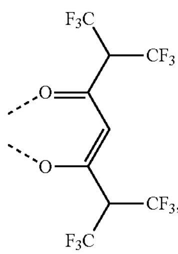
$L_{b75}$
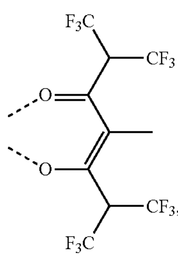
$L_{b76}$
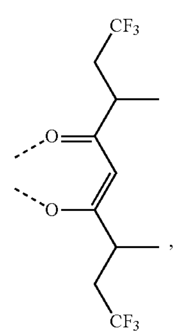
$L_{b77}$
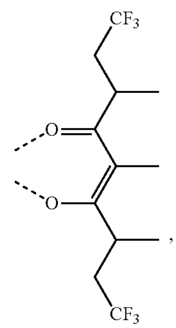

-continued
$L_{b78}$
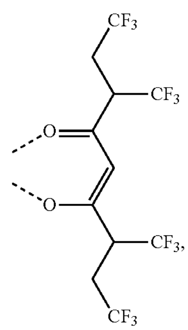
$L_{b79}$
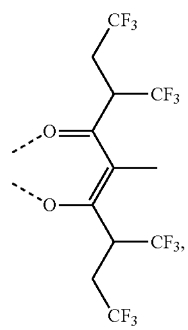
$L_{b80}$
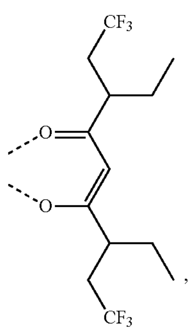
$L_{b81}$
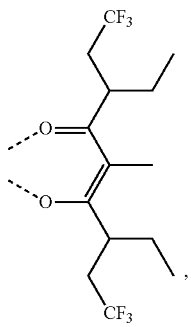
-continued
$L_{b82}$
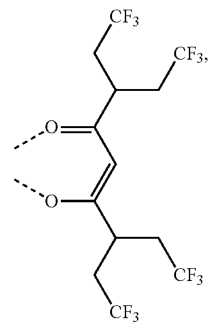
$L_{b83}$
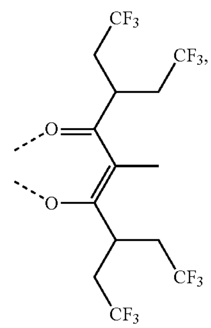
$L_{b84}$
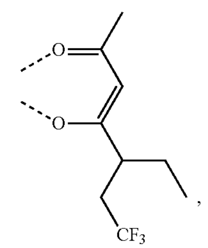
$L_{b85}$
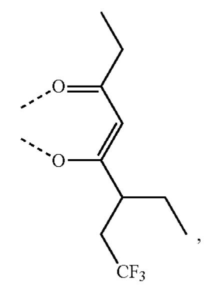
$L_{b86}$
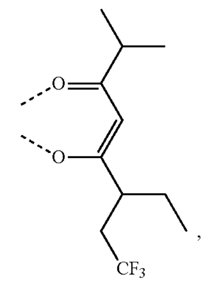

-continued
$L_{b87}$
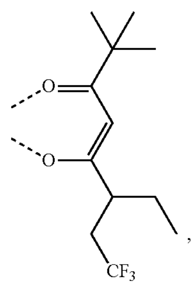
$L_{b88}$
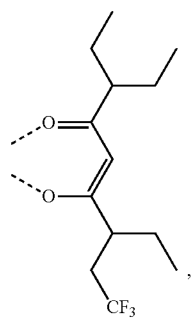
$L_{b89}$
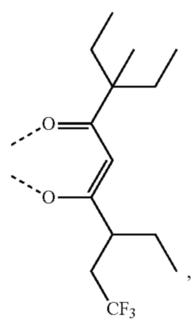
$L_{b90}$
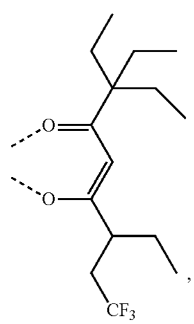
$L_{b91}$
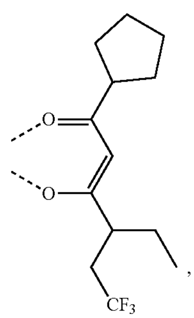
-continued
$L_{b92}$
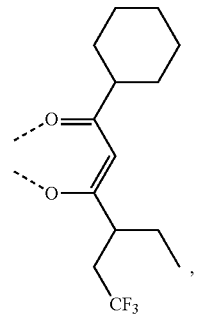
$L_{b93}$
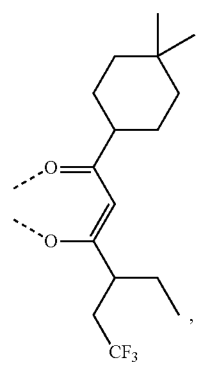
$L_{b94}$
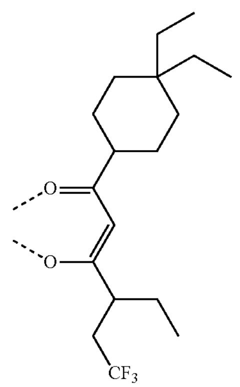
$L_{b95}$
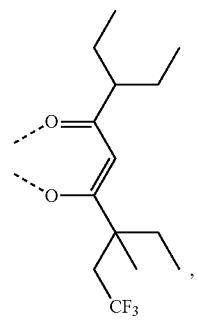

-continued
$L_{b96}$
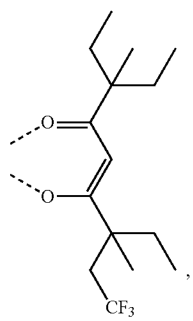
$L_{b97}$
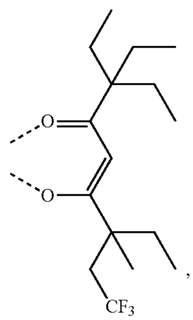
$L_{b98}$
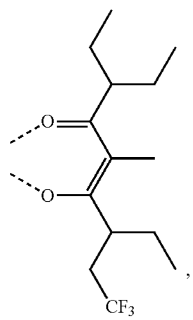
$L_{b99}$
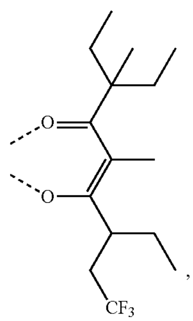
$L_{b100}$
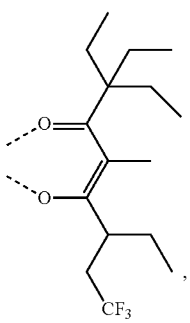
-continued
$L_{b101}$
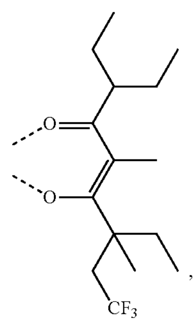
$L_{b102}$
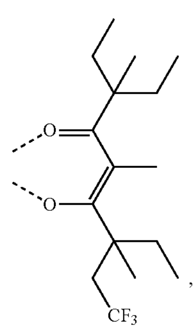
$L_{b103}$
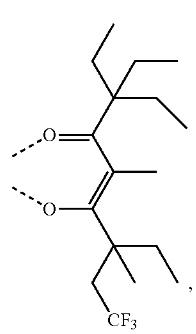
$L_{b104}$
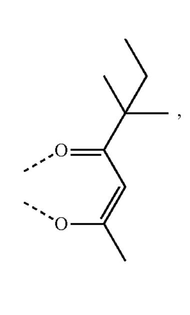
$L_{b105}$
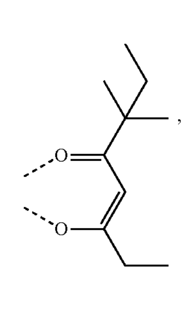

-continued
$L_{b106}$
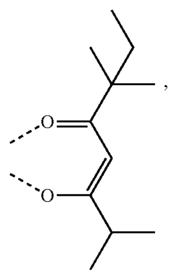
$L_{b107}$
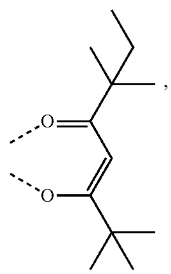
$L_{b108}$
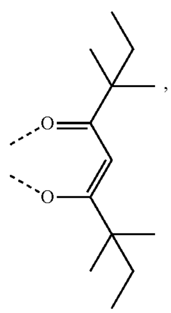
$L_{b109}$
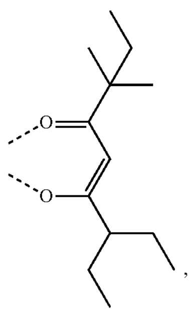
$L_{b110}$
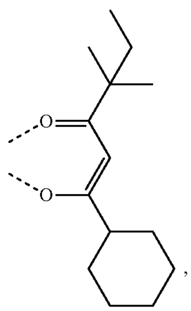
-continued
$L_{b111}$
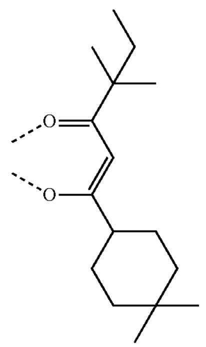
$L_{b112}$
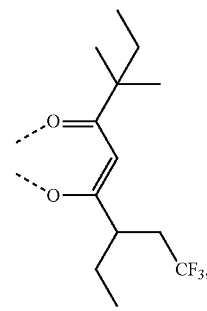
$L_{b113}$
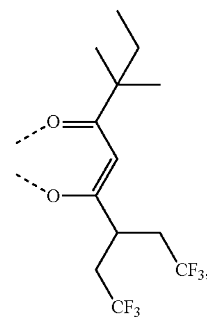
$L_{b114}$
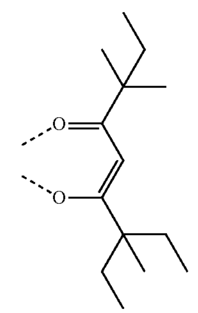
$L_{b115}$
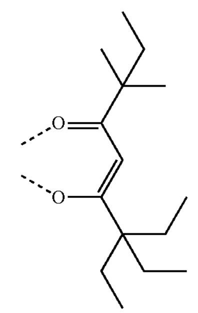

-continued
$L_{b116}$
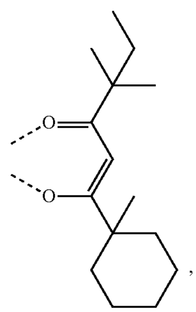
,
$L_{b117}$
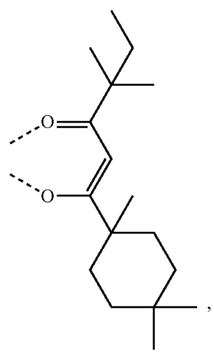
,
$L_{b118}$
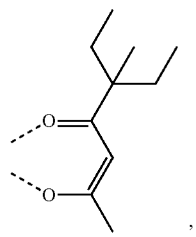
,
$L_{b119}$
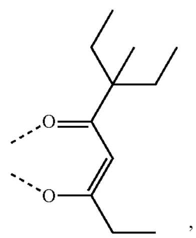
,
$L_{b120}$
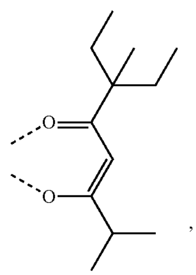
,
-continued
$L_{b121}$
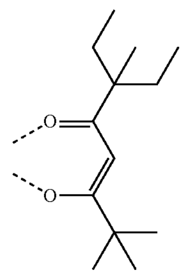
,
$L_{b122}$
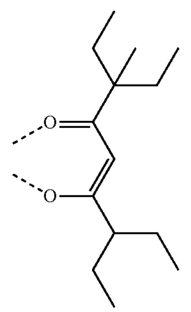
,
$L_{b123}$
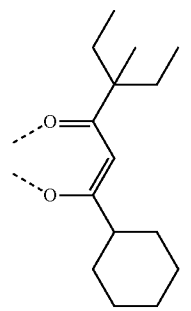
,
$L_{b124}$
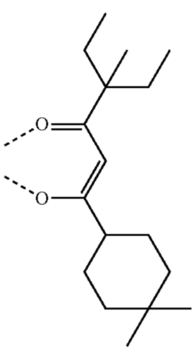
,
$L_{b125}$
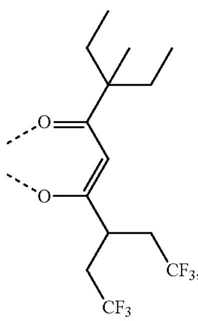
, $L_{b126}$
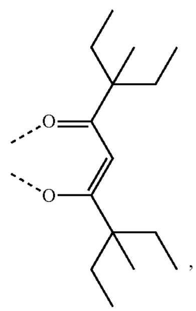
$L_{b127}$
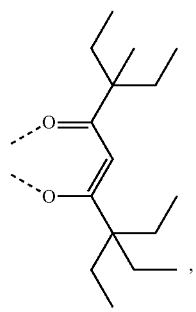
$L_{b128}$
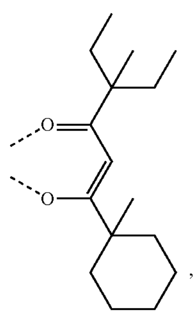
$L_{b129}$
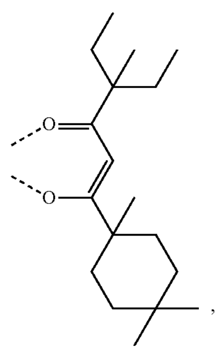
$L_{b130}$
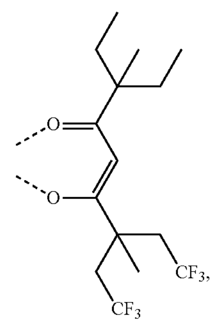
$L_{b131}$
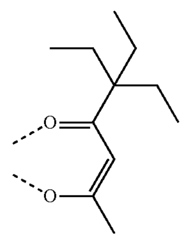
$L_{b132}$
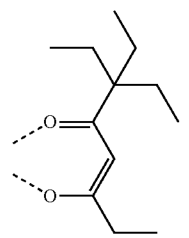
$L_{b133}$
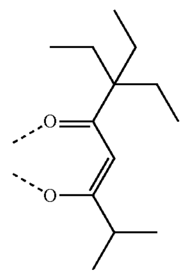
$L_{b134}$
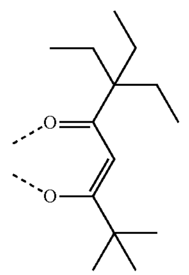
$L_{b135}$
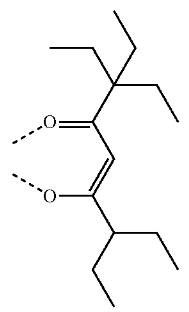

-continued
$L_{b136}$
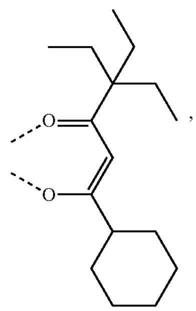
,
$L_{b137}$
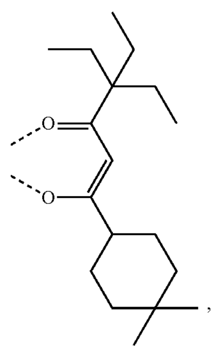
,
$L_{b138}$
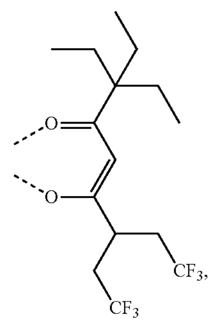
$L_{b139}$
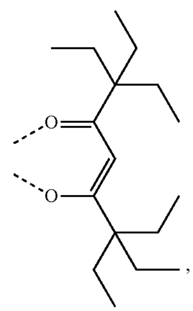
,
$L_{b140}$
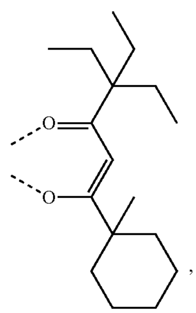
,
-continued
$L_{b141}$
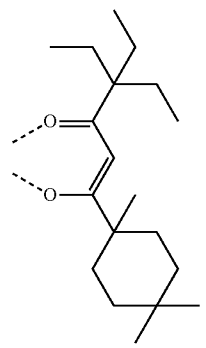
,
$L_{b142}$
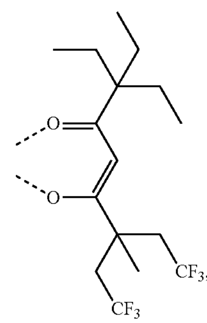
$L_{b143}$
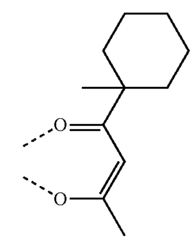
,
$L_{b144}$
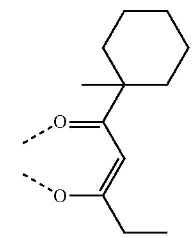
,
$L_{b145}$
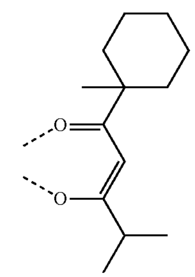
, -continued
$L_{b146}$
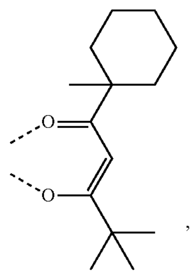
,
$L_{b147}$
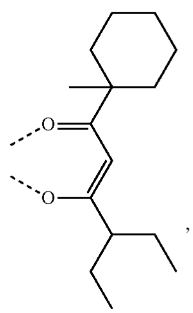
,
$L_{b148}$
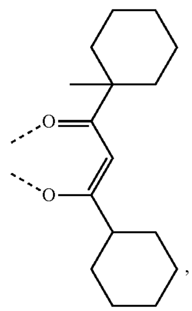
,
$L_{b149}$
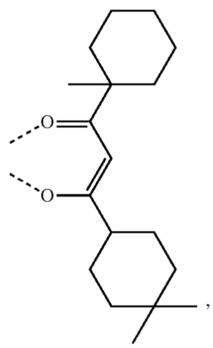
,
$L_{b150}$
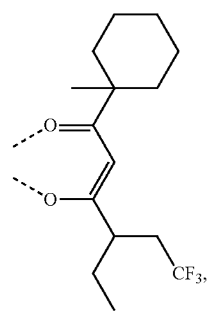
-continued
$L_{b151}$
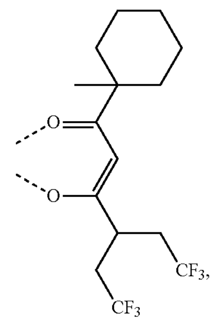
$L_{b152}$
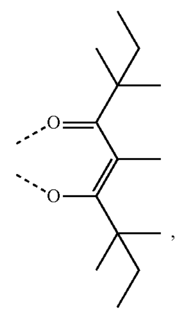
,
$L_{b153}$
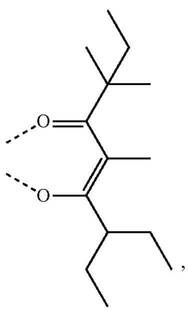
,
$L_{b154}$
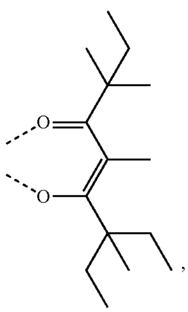
,
$L_{b155}$
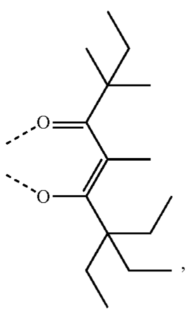
, -continued
$L_{b156}$
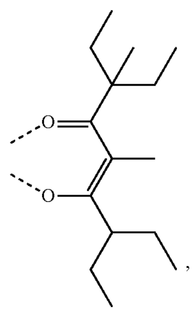
,
$L_{b157}$
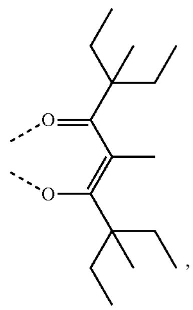
,
$L_{b158}$
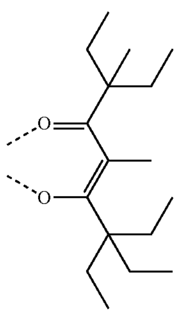
,
$L_{b159}$
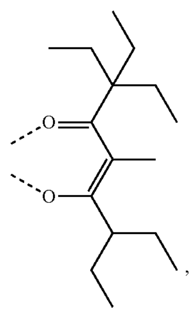
,
$L_{b160}$
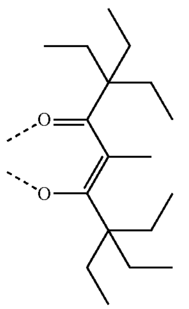
,
-continued
$L_{b161}$
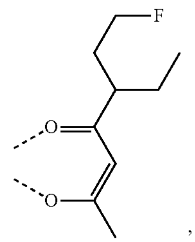
,
$L_{b162}$
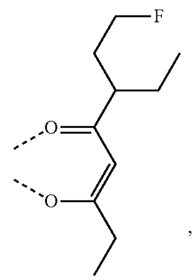
,
$L_{b163}$
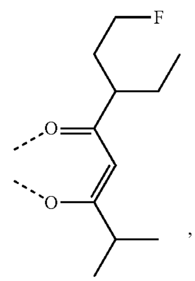
,
$L_{b164}$
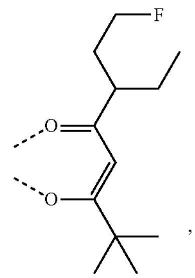
,
$L_{b165}$
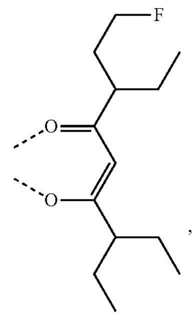
, -continued
$L_{b166}$
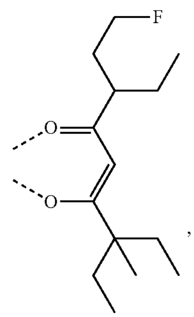
,
$L_{b167}$
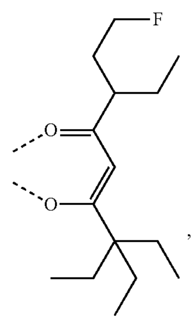
,
$L_{b168}$
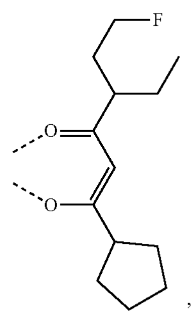
,
$L_{b169}$
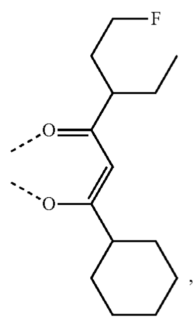
,
$L_{b170}$
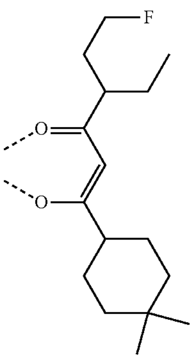
,
-continued
$L_{b171}$
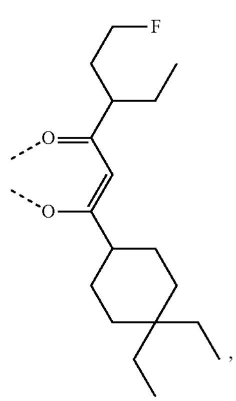
,
$L_{b172}$
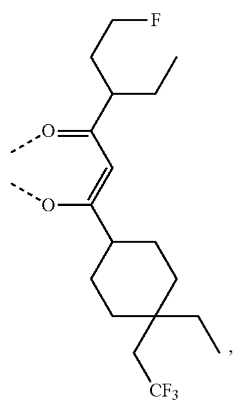
,
$L_{b173}$
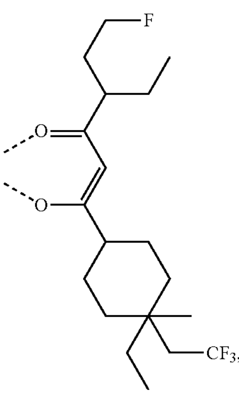
$L_{b174}$
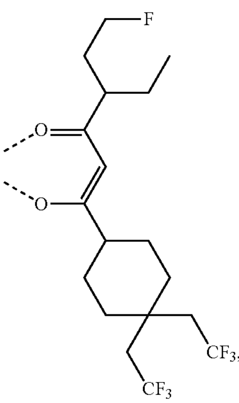

-continued
$L_{b175}$
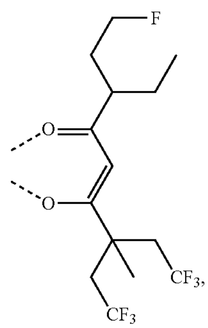
$L_{b176}$
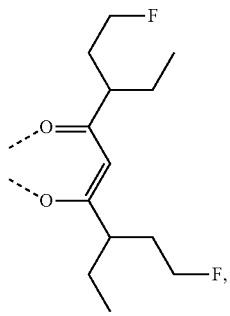
$L_{b177}$
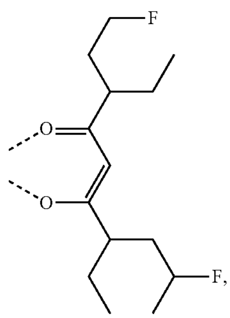
$L_{b178}$
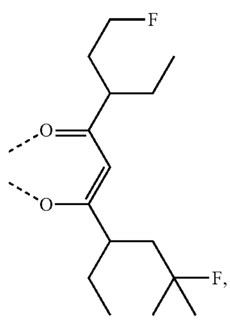
$L_{b179}$
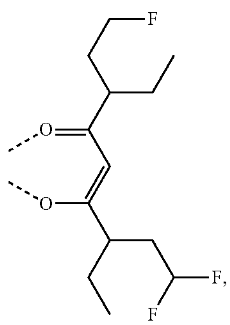
-continued
$L_{b180}$
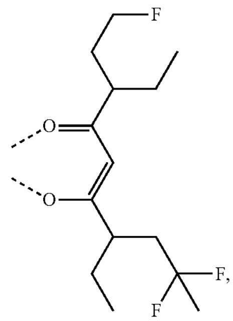
$L_{b181}$
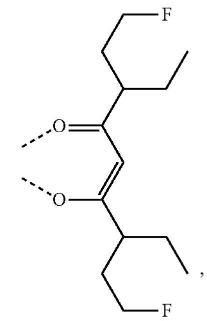
$L_{b182}$
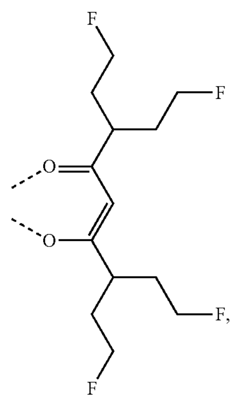
$L_{b183}$
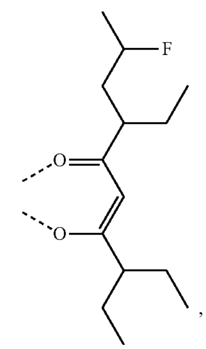

-continued
$L_{b184}$
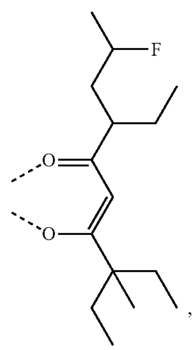
,
$L_{b185}$
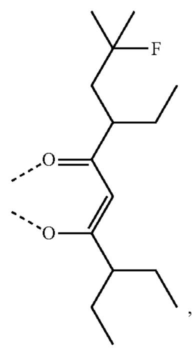
,
$L_{b186}$
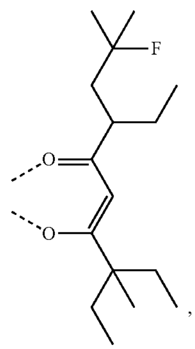
,
$L_{b187}$
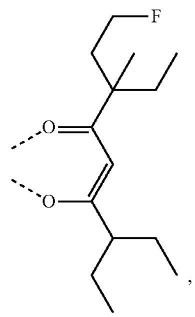
,
$L_{b188}$
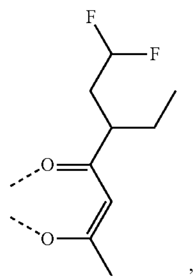
,
-continued
$L_{b189}$
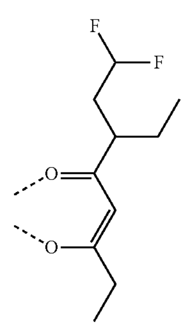
,
$L_{b190}$
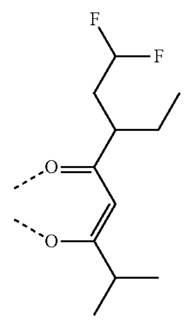
,
$L_{b191}$
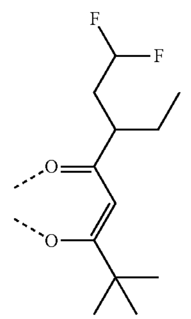
,
$L_{b192}$
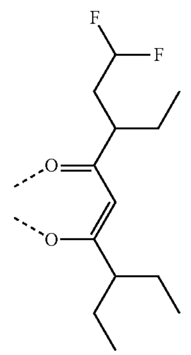
, -continued
$L_{b193}$
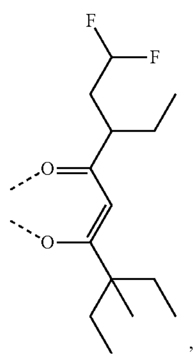
,
$L_{b194}$
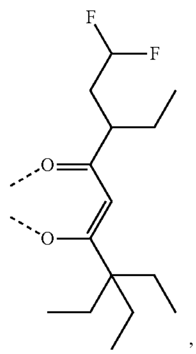
,
$L_{b195}$
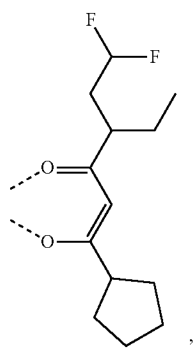
,
$L_{b196}$
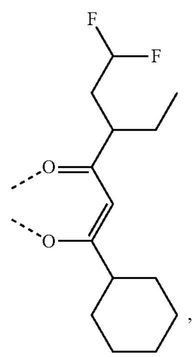
,
-continued
$L_{b197}$
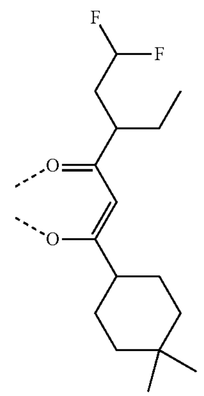
,
$L_{b198}$
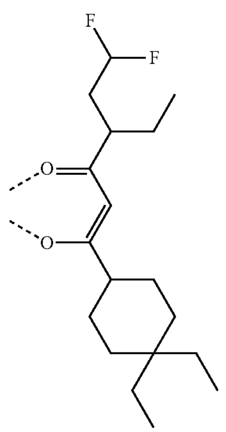
,
$L_{b199}$
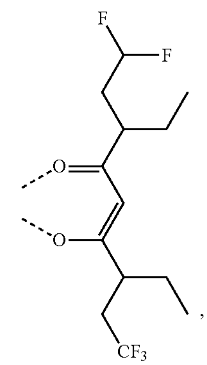
,
$L_{b200}$
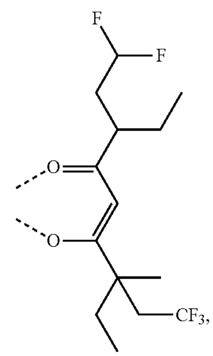
, -continued
$L_{b201}$
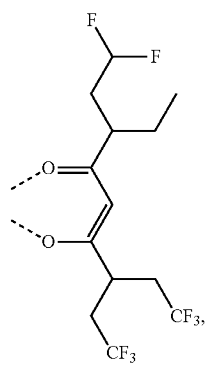
$L_{b202}$
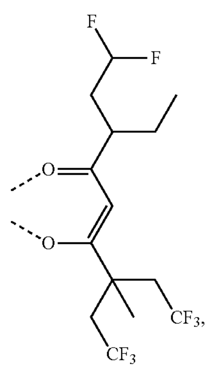
$L_{b203}$
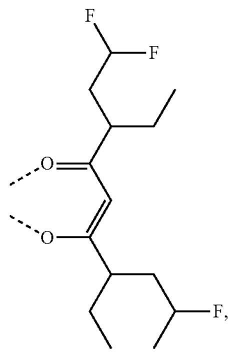
$L_{b204}$
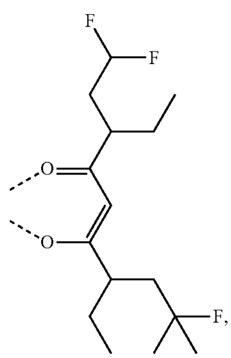
-continued
$L_{b205}$
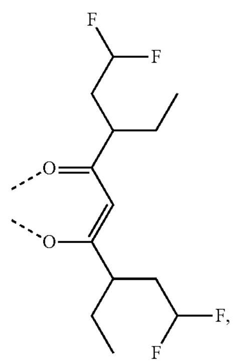
$L_{b206}$
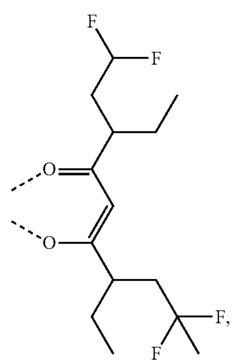
$L_{b207}$
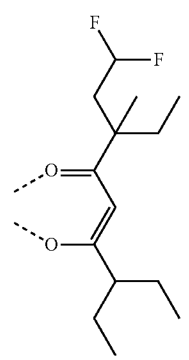
$L_{b208}$
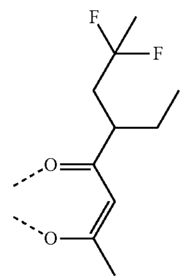

-continued
$L_{b209}$
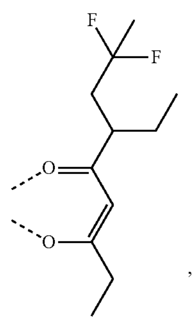
,
$L_{b210}$
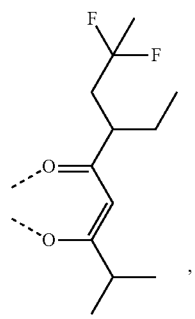
,
$L_{b211}$
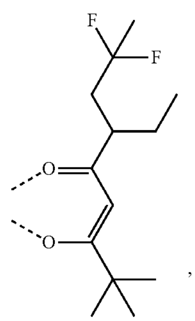
,
$L_{b212}$
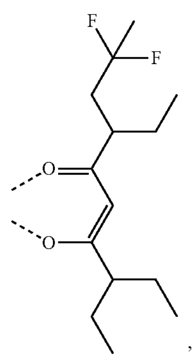
,
-continued
$L_{b213}$
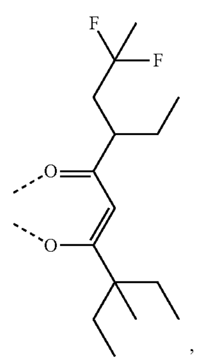
,
$L_{b214}$
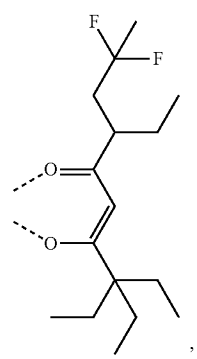
,
$L_{b215}$
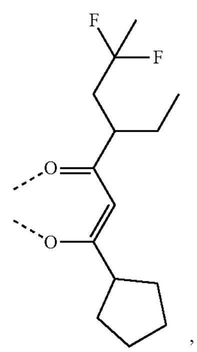
,
$L_{b216}$
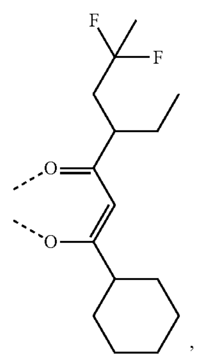
, -continued
$L_{b217}$
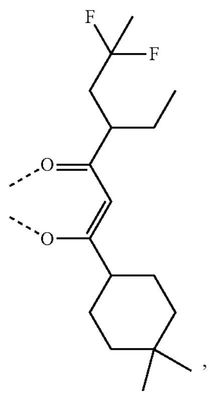
$L_{b218}$
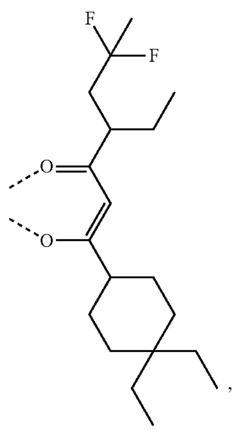
$L_{b219}$
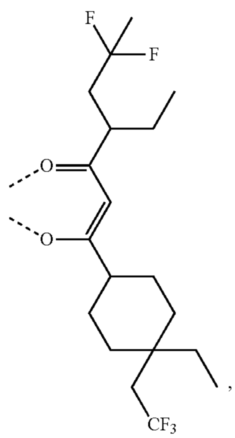
-continued
$L_{b220}$
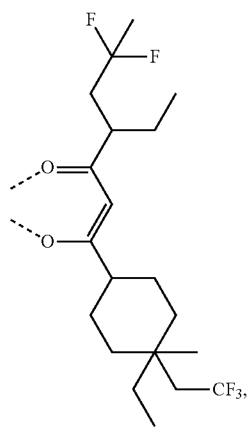
$L_{b221}$
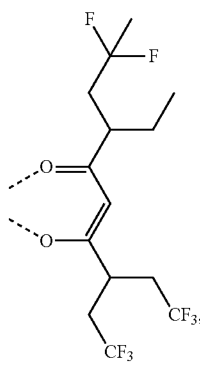
$L_{b222}$
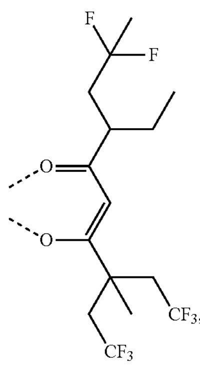
$L_{b223}$
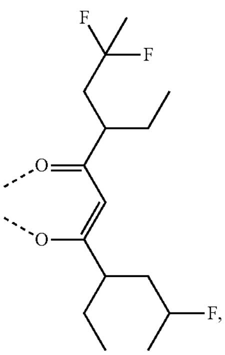

-continued
L$_{b224}$
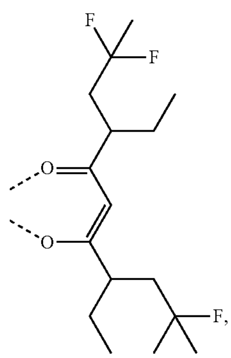
L$_{b225}$
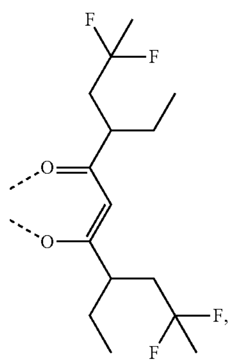
L$_{b226}$
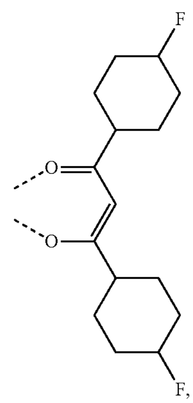
L$_{b227}$
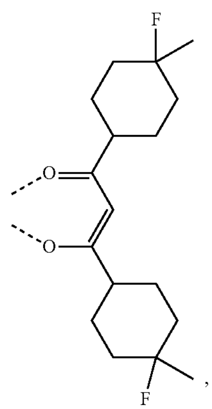
L$_{b228}$
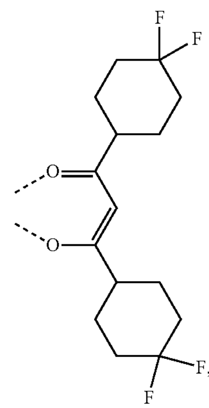
L$_{b229}$
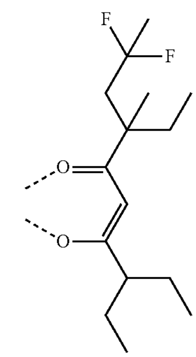
L$_{b230}$
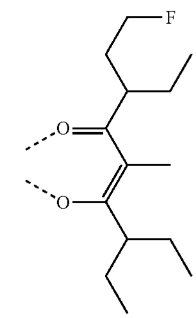
L$_{b231}$
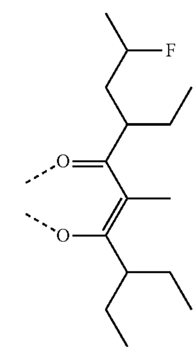

-continued
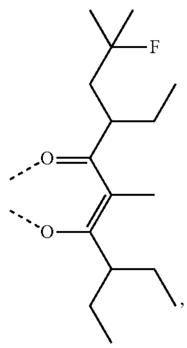
$L_{b232}$
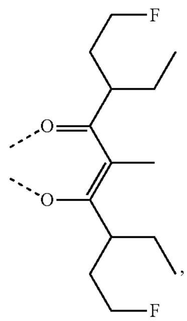
$L_{b233}$
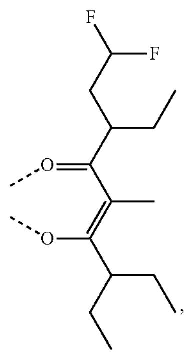
$L_{b234}$
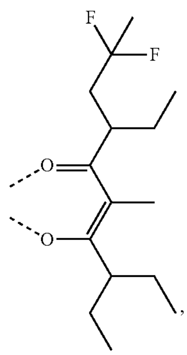
$L_{b235}$
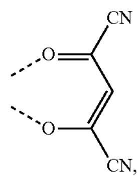
$L_{b236}$
-continued
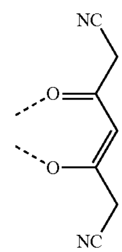
$L_{b237}$
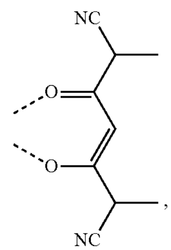
$L_{b238}$
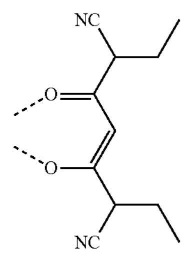
$L_{b239}$
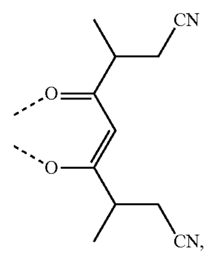
$L_{b240}$
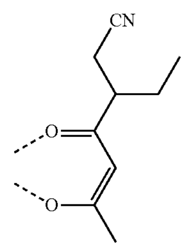
$L_{b241}$
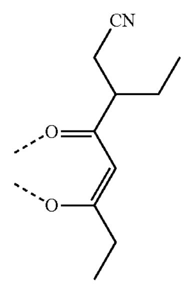
$L_{b242}$ $L_{b243}$
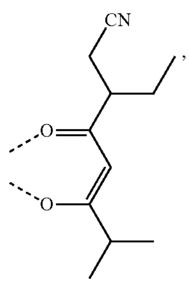
$L_{b244}$
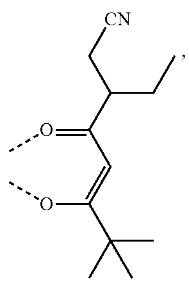
$L_{b245}$
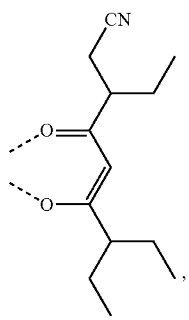
$L_{b246}$
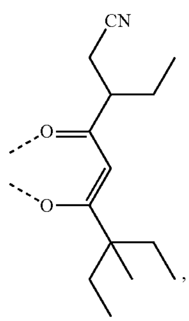
$L_{b247}$
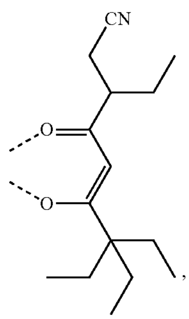
$L_{b248}$
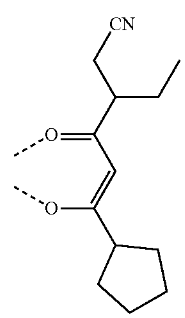
$L_{b249}$
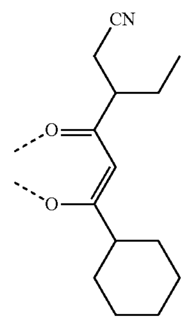
$L_{b250}$
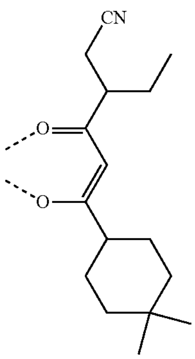
$L_{b251}$
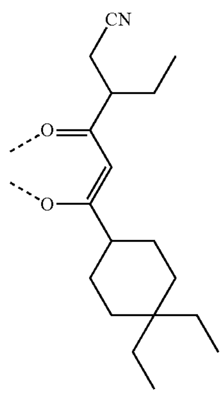

-continued
$L_{b252}$
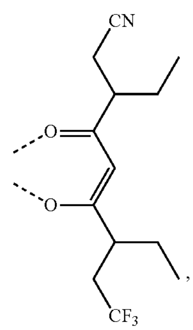
$L_{b253}$
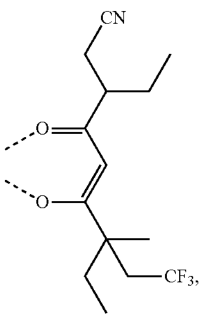
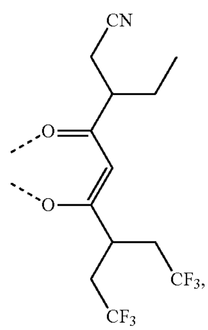
$L_{b255}$
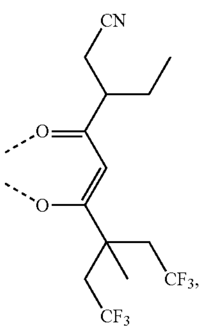
$L_{b256}$
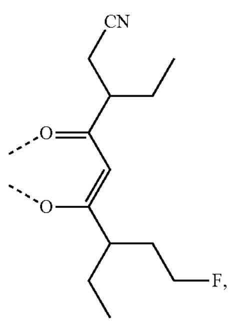
-continued
$L_{b257}$
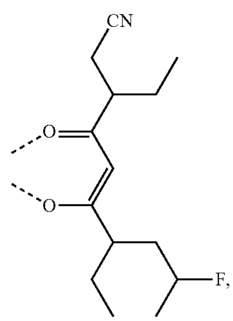
$L_{b258}$
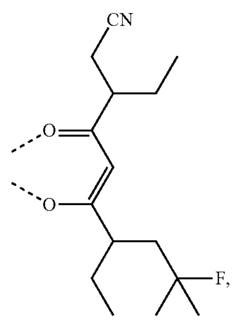
$L_{b259}$
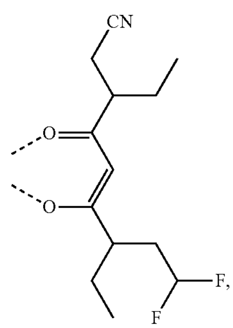
$L_{b260}$
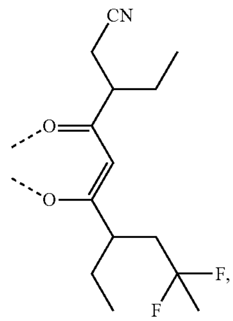
$L_{b261}$
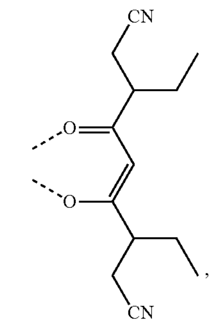

-continued
$L_{b262}$
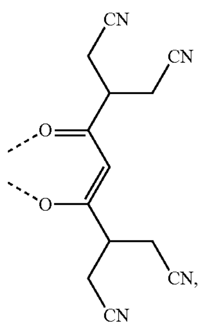
$L_{b263}$
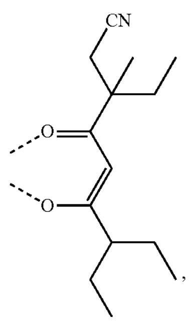
$L_{b264}$
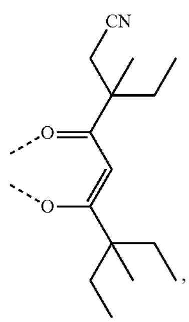
$L_{b265}$
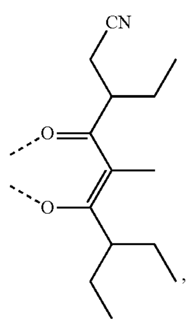
$L_{b266}$
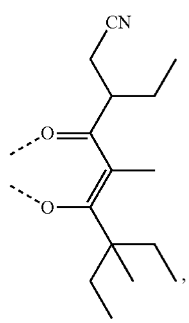
-continued
$L_{b267}$
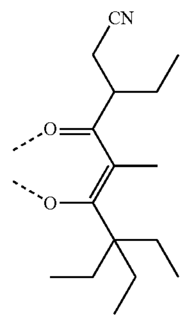
$L_{b268}$
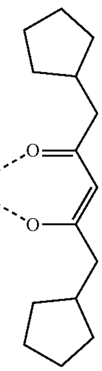
$L_{b269}$
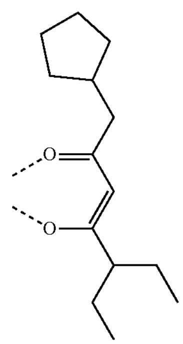
$L_{b270}$
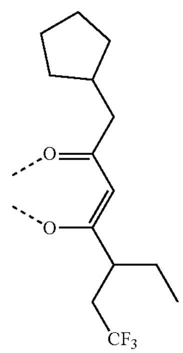

-continued
$L_{b271}$
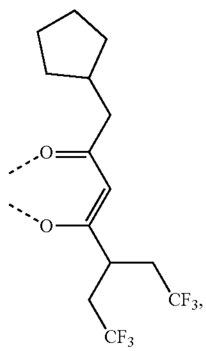
$L_{b272}$
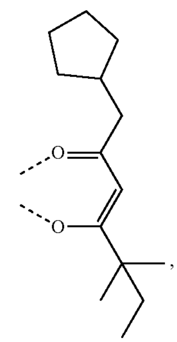
$L_{b273}$
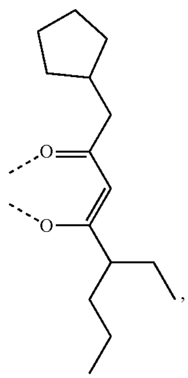
$L_{b274}$
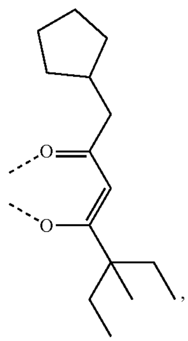
-continued
$L_{b275}$
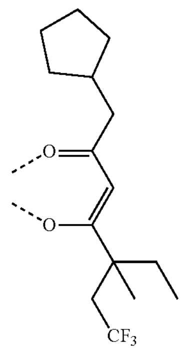
$L_{b276}$
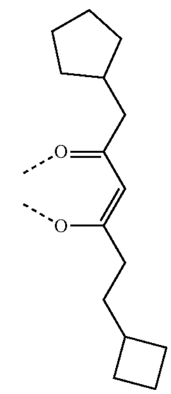
$L_{b277}$
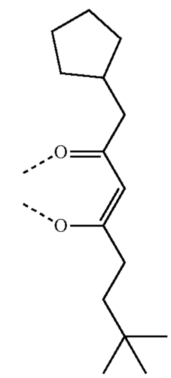
$L_{b278}$
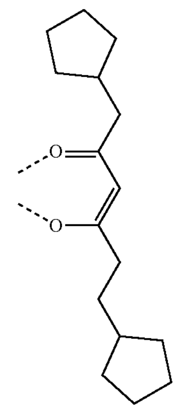

-continued
$L_{b279}$
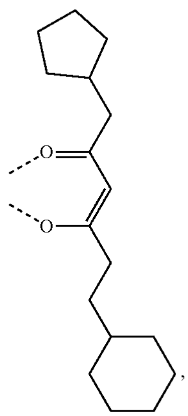
$L_{b280}$
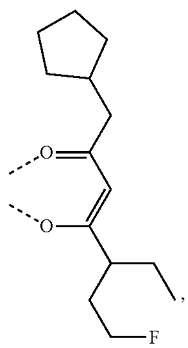
$L_{b281}$
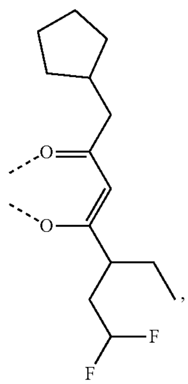
$L_{b282}$
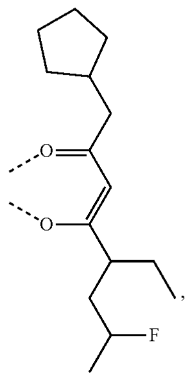
-continued
$L_{b283}$
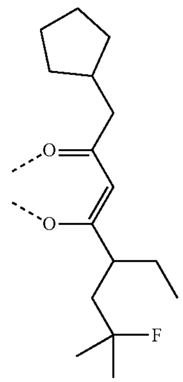
$L_{b284}$
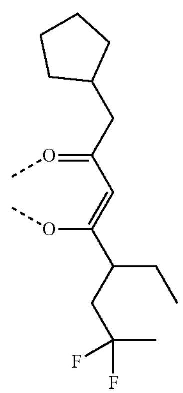
$L_{b285}$
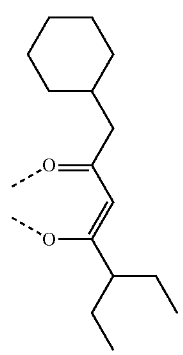
$L_{b286}$
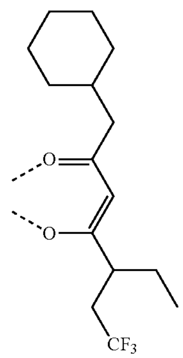

-continued
$L_{b287}$
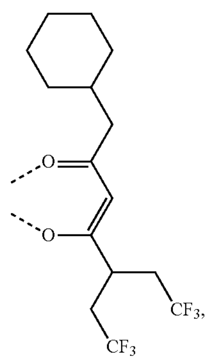
$L_{b288}$
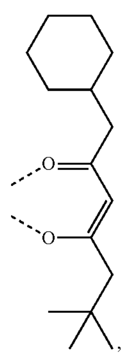
$L_{b289}$
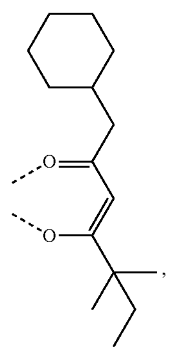
$L_{b290}$
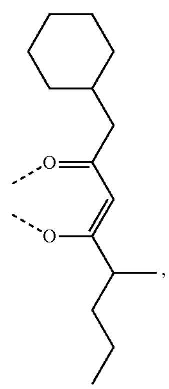
-continued
$L_{b291}$
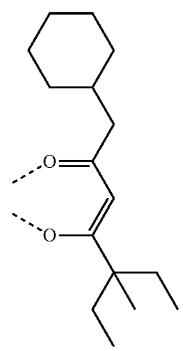
$L_{b292}$
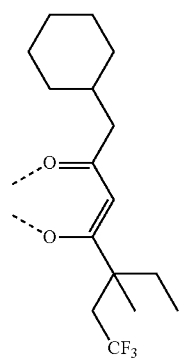
$L_{b293}$
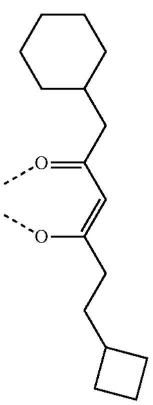
$L_{b294}$
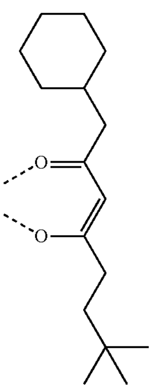

-continued
$L_{b295}$
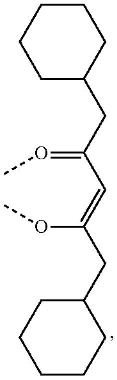
$L_{b296}$
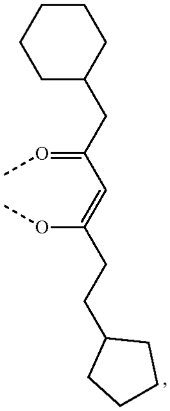
$L_{b297}$
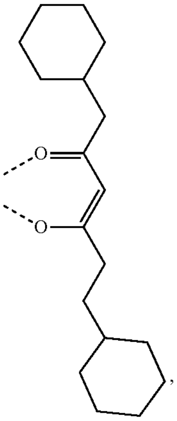
$L_{b298}$
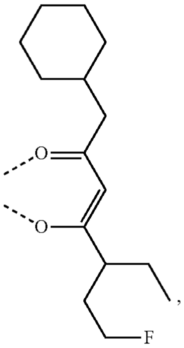
-continued
$L_{b299}$
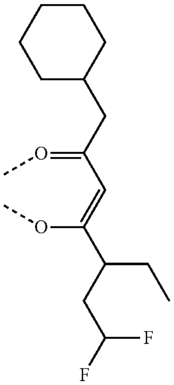
$L_{b300}$
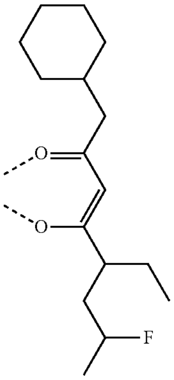
$L_{b301}$
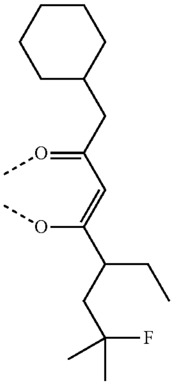
$L_{b302}$
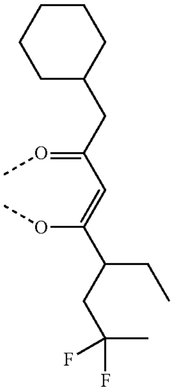

$L_{b303}$
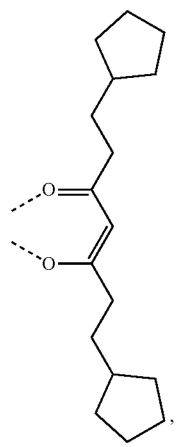
$L_{b304}$
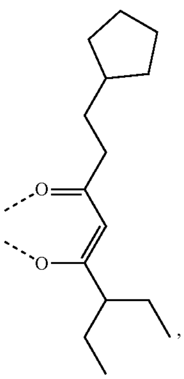
$L_{b305}$
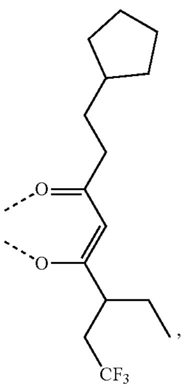
$L_{b306}$
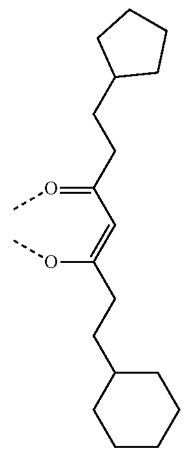
$L_{b307}$
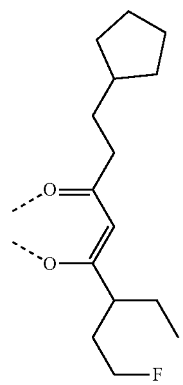
$L_{b308}$
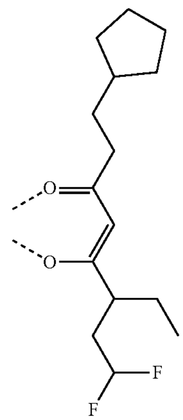

$L_{b309}$
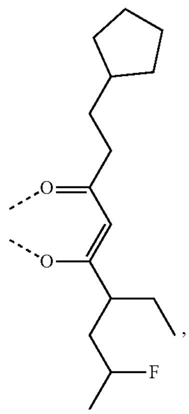
$L_{b310}$
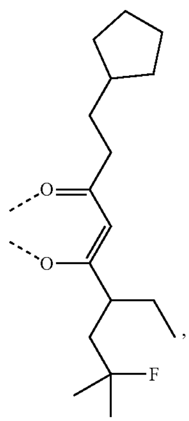
$L_{b311}$
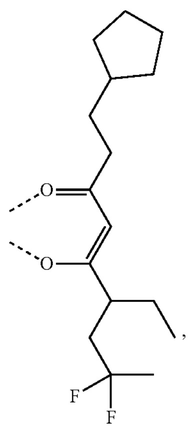
$L_{b312}$
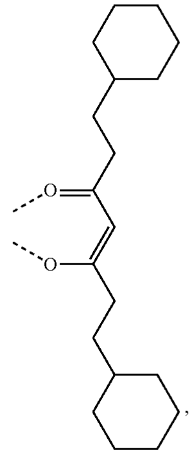
$L_{b313}$
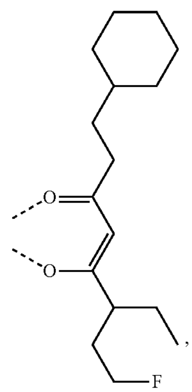
$L_{b314}$
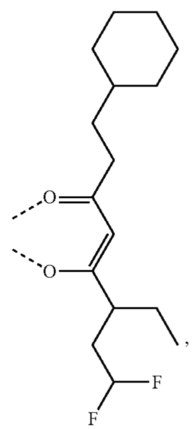

-continued
$L_{b315}$
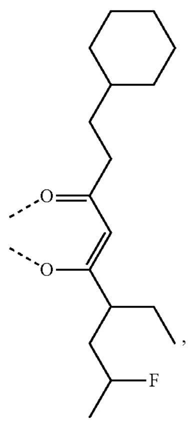
$L_{b316}$
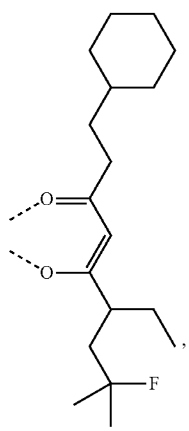
$L_{b317}$
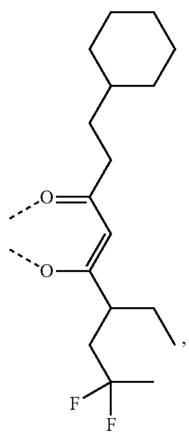
-continued
$L_{b318}$
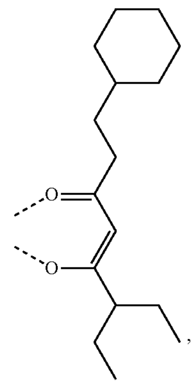
$L_{b319}$
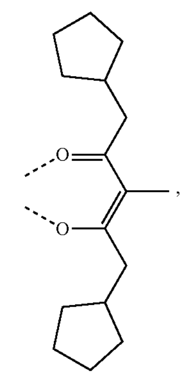
$L_{b320}$
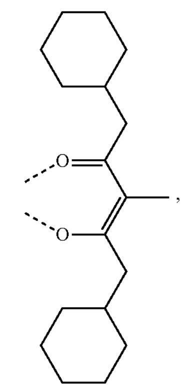
$L_{b321}$
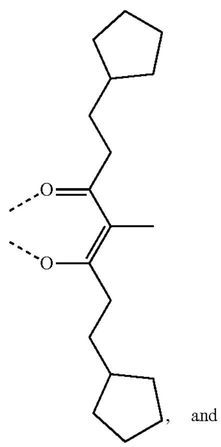
and $L_{b322}$
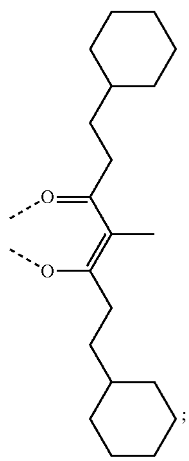
wherein $L_c$ is, at each occurrence identically or differently, selected from the group consisting of the following structures:
$L_{c1}$
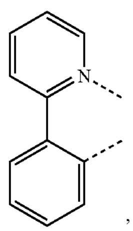
,
$L_{c2}$
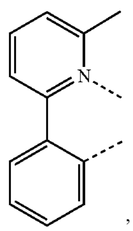
,
$L_{c3}$
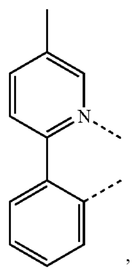
,
$L_{c4}$
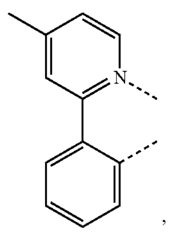
,
$L_{c5}$
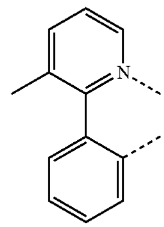
,
$L_{c6}$
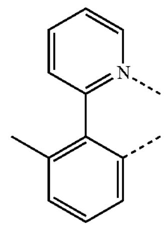
,
$L_{c7}$
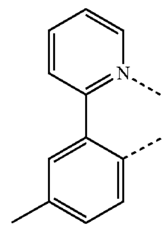
,
$L_{c8}$
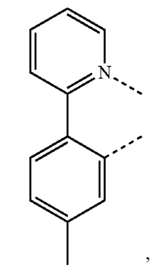
,
$L_{c9}$
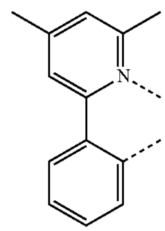
,
$L_{c10}$
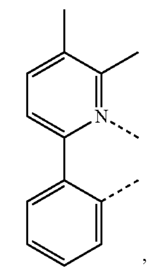
, -continued
$L_{c11}$
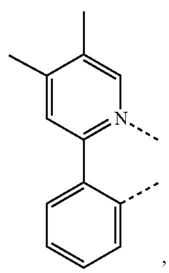
,
$L_{c12}$
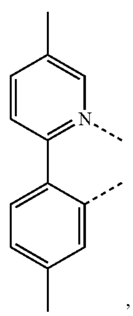
,
$L_{c13}$
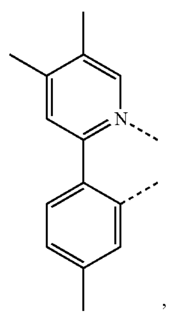
,
$L_{c14}$
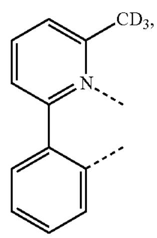
$L_{c15}$
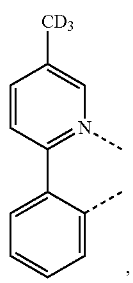
,
-continued
$L_{c16}$
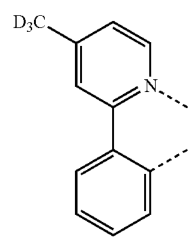
,
$L_{c17}$
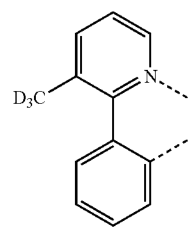
,
$L_{c18}$
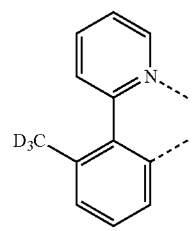
,
$L_{c19}$
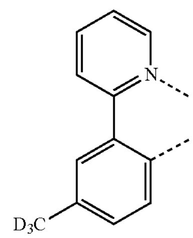
,
$L_{c20}$
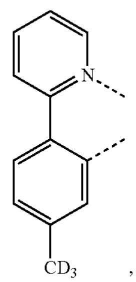
,
$L_{c21}$
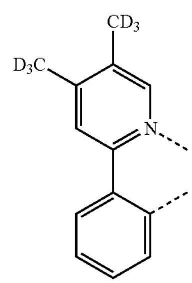
, -continued
$L_{c22}$
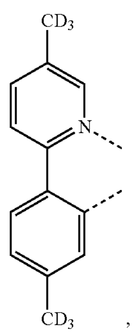
,
$L_{c23}$
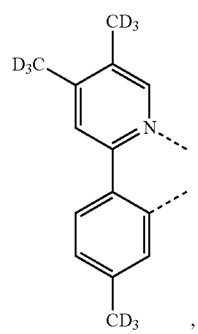
,
$L_{c24}$
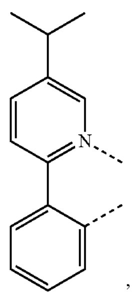
,
$L_{c25}$
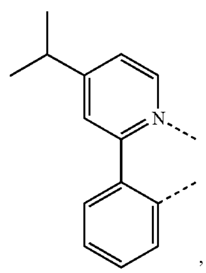
,
$L_{c26}$
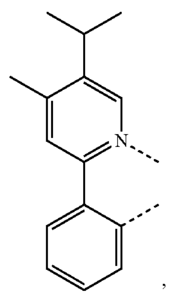
,
-continued
$L_{c27}$
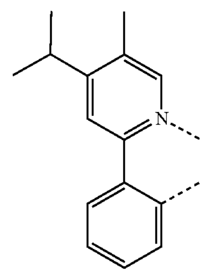
,
$L_{c28}$
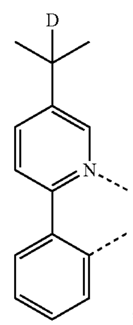
,
$L_{c29}$
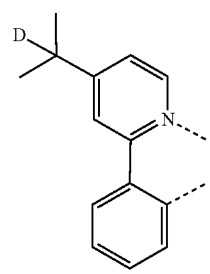
,
$L_{c30}$
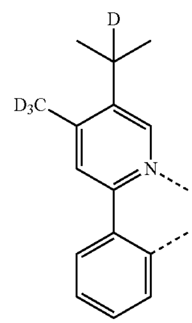
,
$L_{c31}$
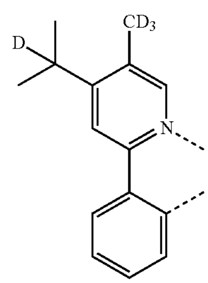
, -continued
$L_{c32}$
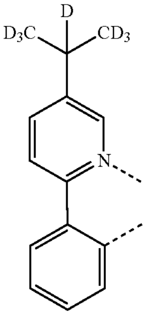
,
$L_{c33}$
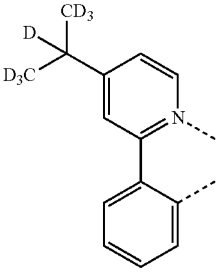
,
$L_{c34}$
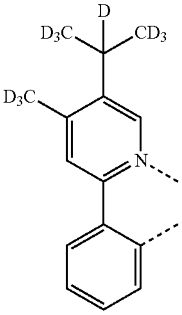
,
$L_{c35}$
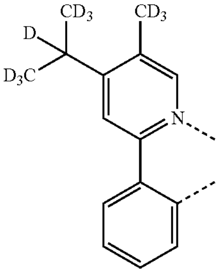
,
$L_{c36}$
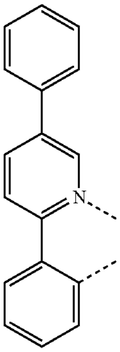
,
-continued
$L_{c37}$
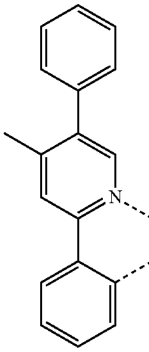
,
$L_{c38}$
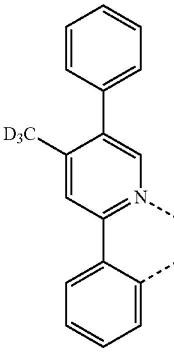
,
$L_{c39}$
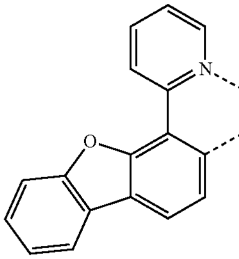
,
$L_{c40}$
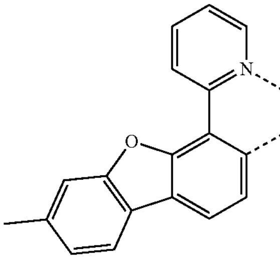
,
$L_{c41}$
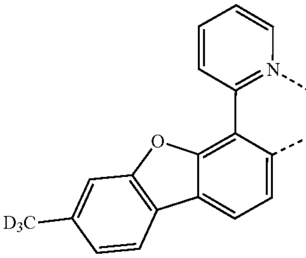
, -continued
$L_{c42}$
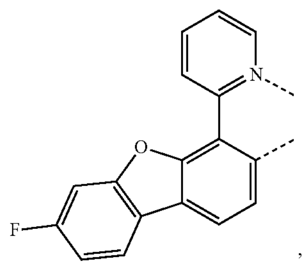
,
$L_{c43}$
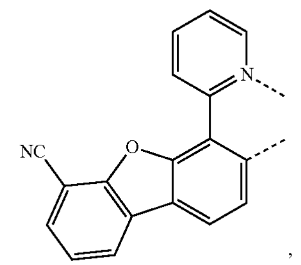
,
$L_{c44}$
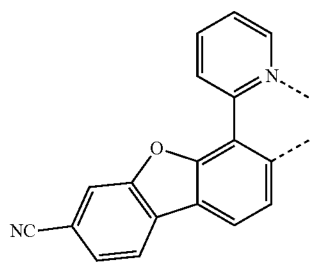
,
$L_{c45}$
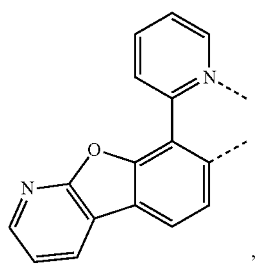
,
$L_{c46}$
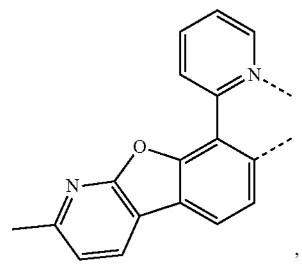
,
$L_{c47}$
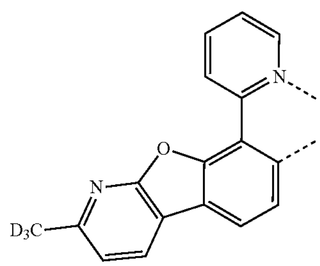
,
-continued
$L_{c48}$
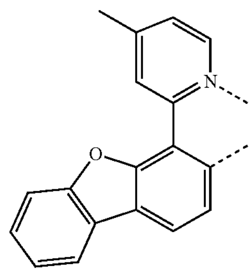
,
$L_{c49}$
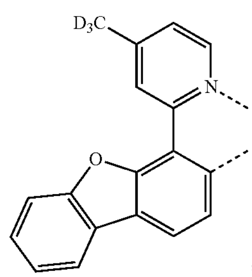
,
$L_{c50}$
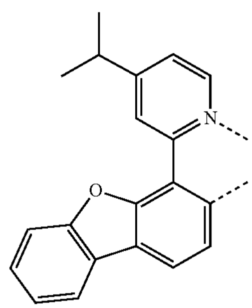
,
$L_{c51}$
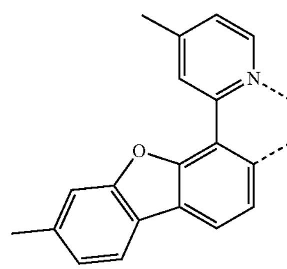
,
$L_{c52}$
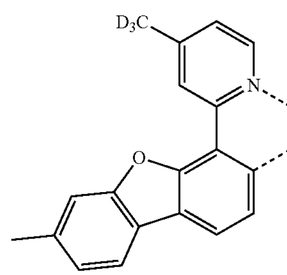
, -continued
$L_{c53}$
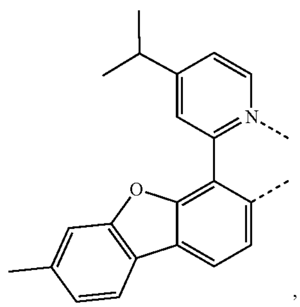
,
$L_{c54}$
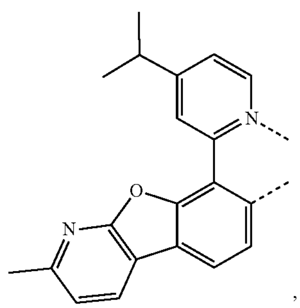
,
$L_{c55}$
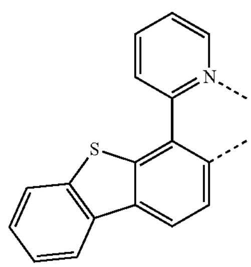
,
$L_{c56}$
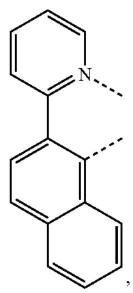
,
$L_{c57}$
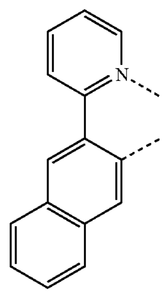
,
-continued
$L_{c58}$
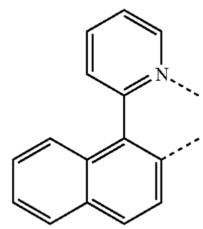
,
$L_{c59}$
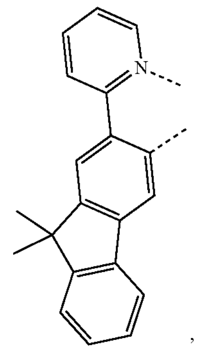
,
$L_{c60}$
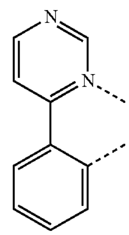
,
$L_{c61}$
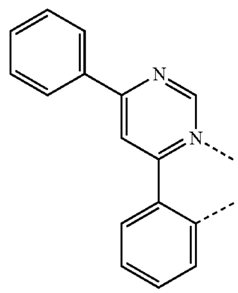
,
$L_{c62}$
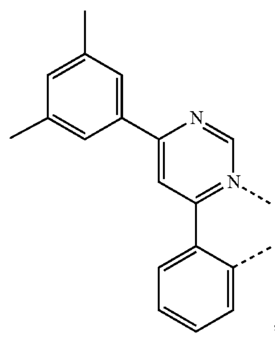
, -continued
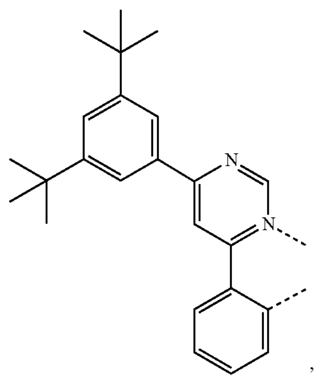
,
$L_{c63}$
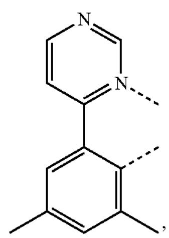
,
$L_{c64}$
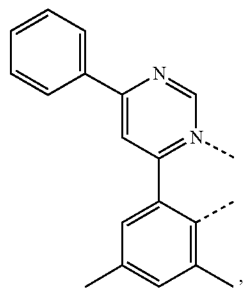
,
$L_{c65}$
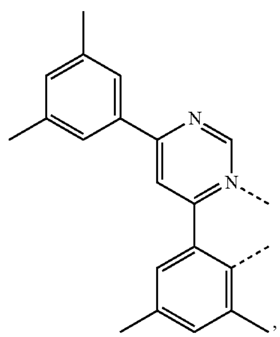
,
$L_{c66}$
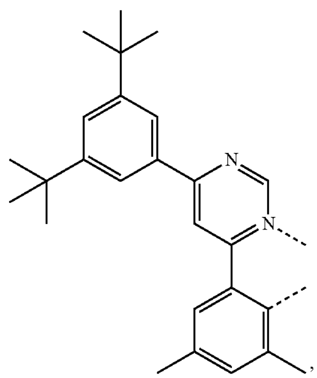
,
$L_{c67}$
-continued
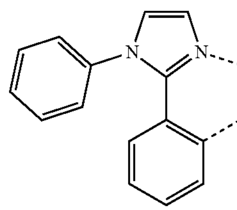
,
$L_{c68}$
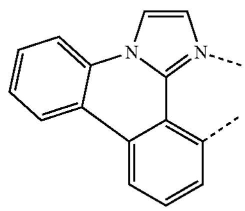
,
$L_{c69}$
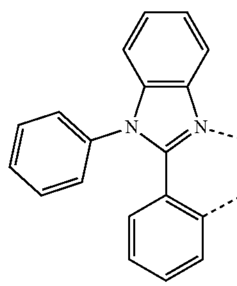
,
$L_{c70}$
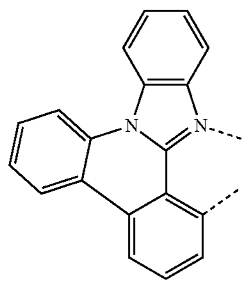
,
$L_{c71}$
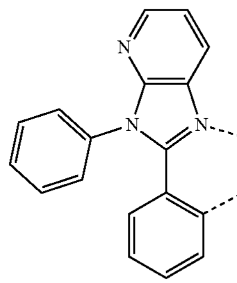
,
$L_{c72}$
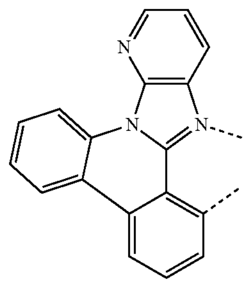
,
$L_{c73}$ -continued
$L_{c74}$
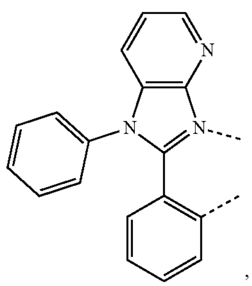
,
$L_{c75}$
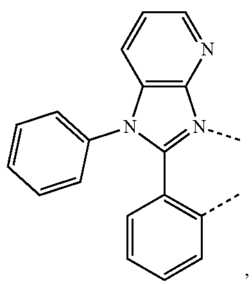
,
$L_{c76}$
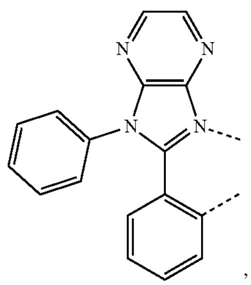
,
$L_{c77}$
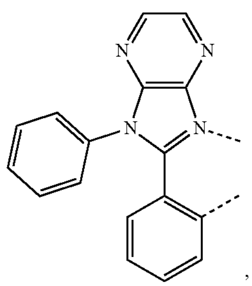
,
$L_{c78}$
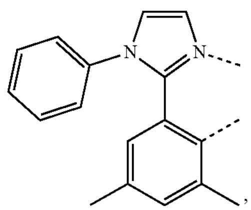
,
$L_{c79}$
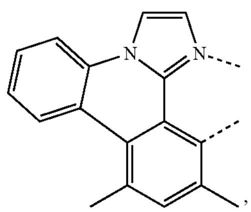
,
-continued
$L_{c80}$
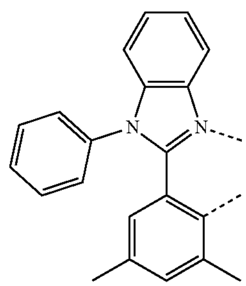
,
$L_{c81}$
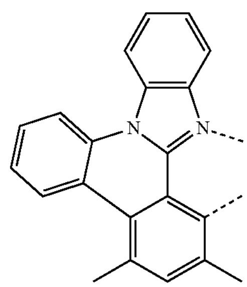
,
$L_{c82}$
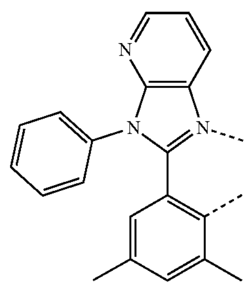
,
$L_{c83}$
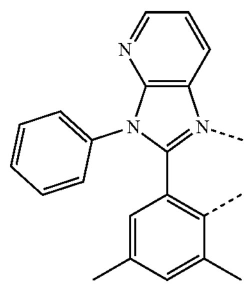
,
$L_{c84}$
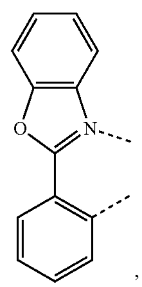
, -continued
$L_{c85}$
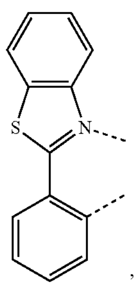
,
$L_{c86}$
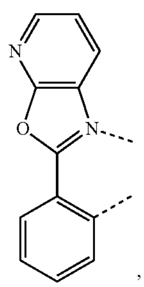
,
$L_{c87}$
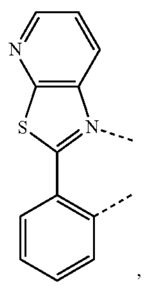
,
$L_{c88}$
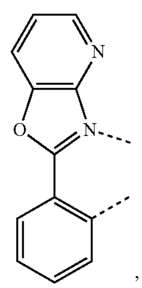
,
$L_{c89}$
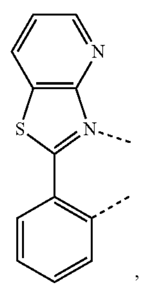
,
-continued
$L_{c90}$
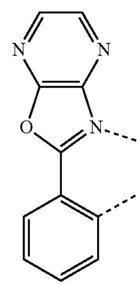
,
$L_{c91}$
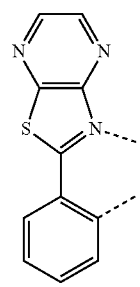
,
$L_{c92}$
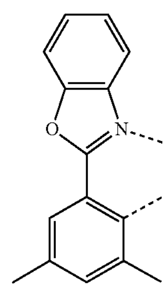
,
$L_{c93}$
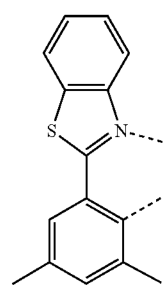
,
$L_{c94}$
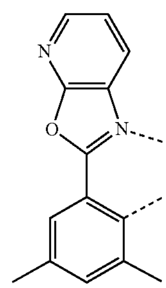
, -continued
$L_{c95}$
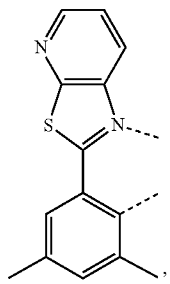
,
$L_{c96}$
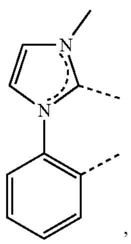
,
$L_{c97}$
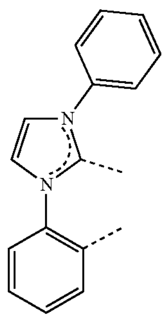
,
$L_{c98}$
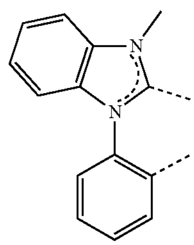
,
$L_{c99}$
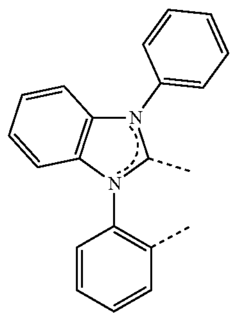
,
-continued
$L_{c100}$
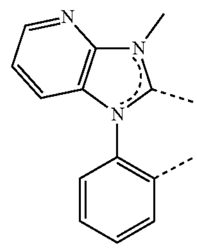
,
$L_{c101}$
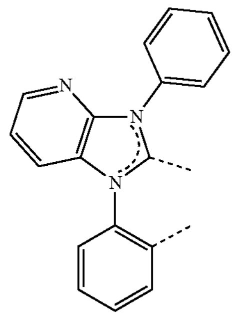
,
$L_{c102}$
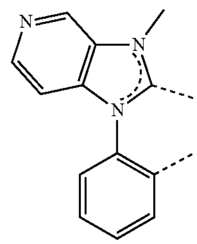
,
$L_{c103}$
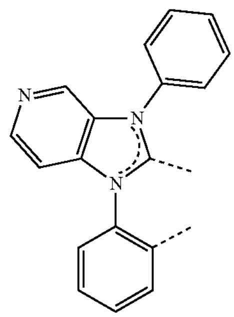
,
$L_{c104}$
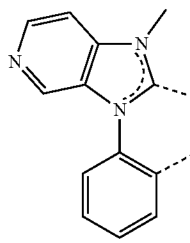
, -continued
$L_{c105}$
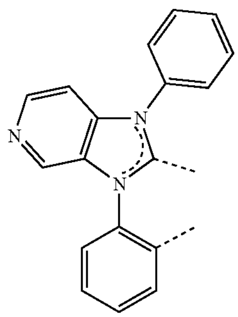
,
$L_{c106}$
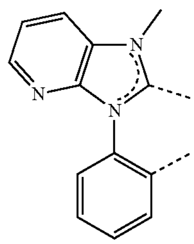
,
$L_{c107}$
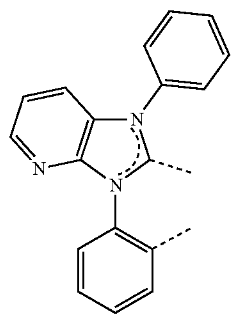
,
$L_{c108}$
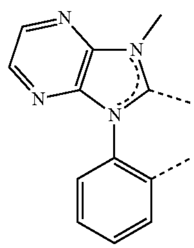
,
$L_{c109}$
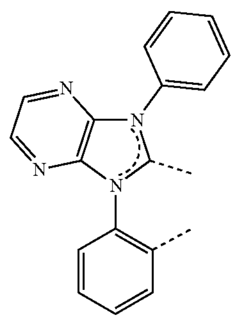
,
-continued
$L_{c110}$
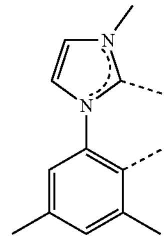
,
$L_{c111}$
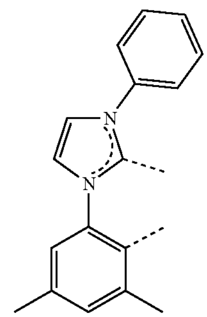
,
$L_{c112}$
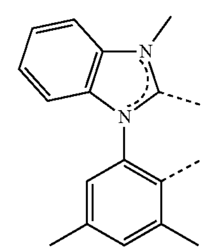
,
$L_{c113}$
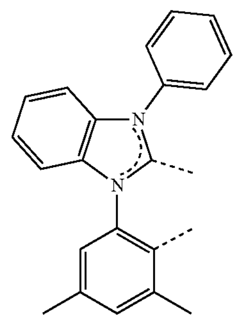
,
$L_{c114}$
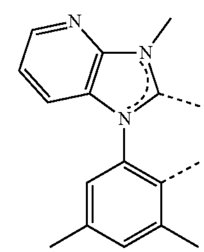
, -continued
$L_{c115}$
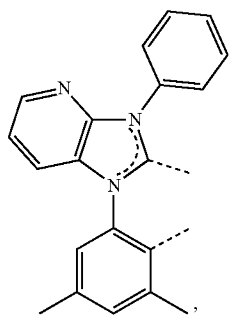
$L_{c116}$
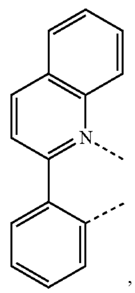
$L_{c117}$
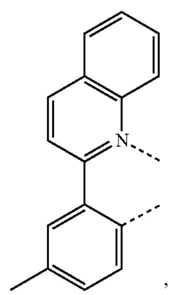
$L_{c118}$
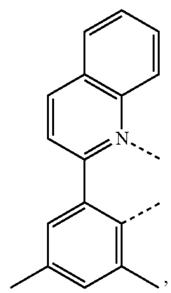
$L_{c119}$
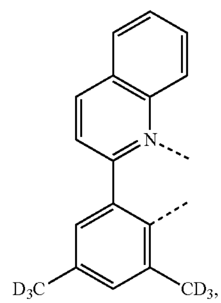
-continued
$L_{c120}$
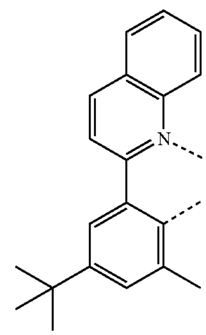
$L_{c121}$
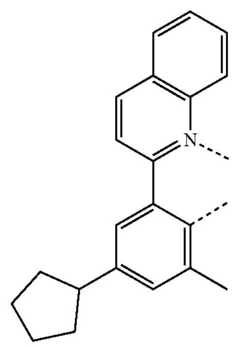
$L_{c122}$
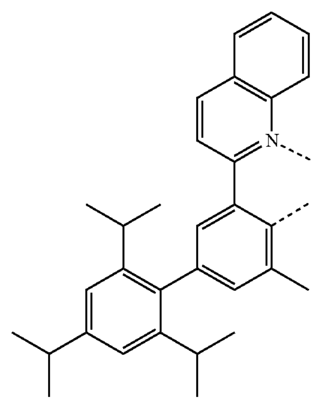
$L_{c123}$
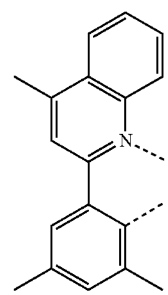

-continued
$L_{c124}$
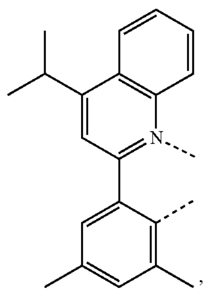
$L_{c125}$
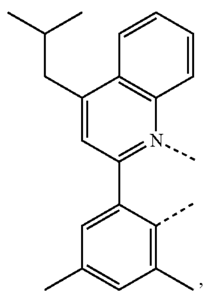
$L_{c126}$
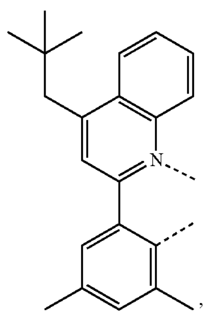
$L_{c127}$
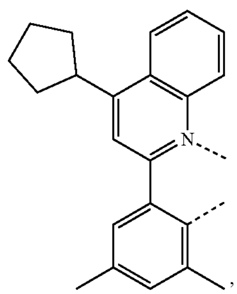
$L_{c128}$
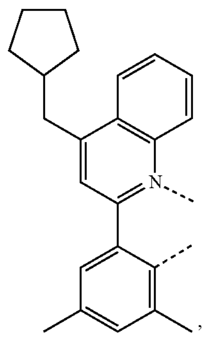
-continued
$L_{c129}$
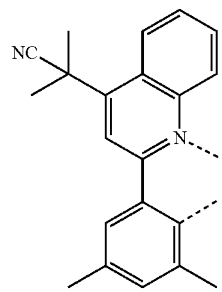
$L_{c130}$
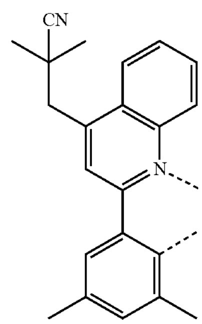
$L_{c131}$
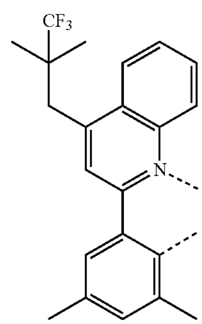
$L_{c132}$
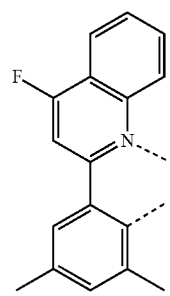
$L_{c133}$
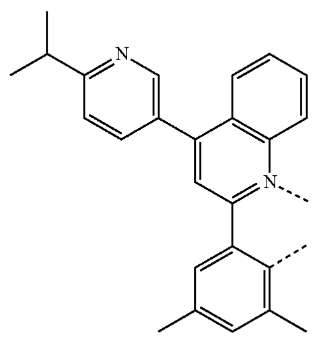

$L_{c134}$
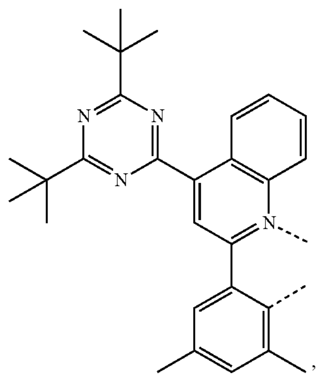
$L_{c135}$
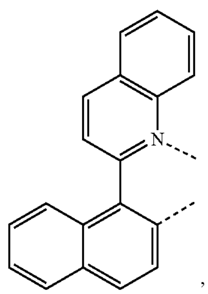
$L_{c136}$
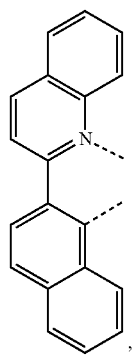
$L_{c137}$
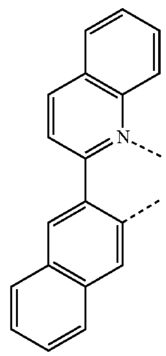
$L_{c138}$
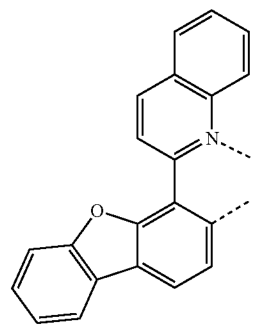
$L_{c139}$
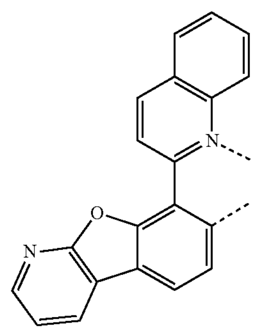
$L_{c140}$
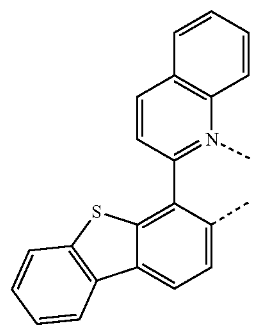
$L_{c141}$
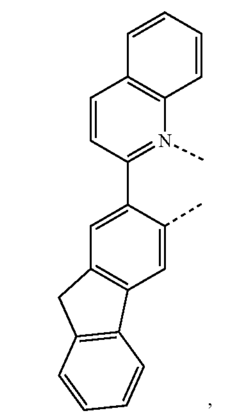
$L_{c142}$
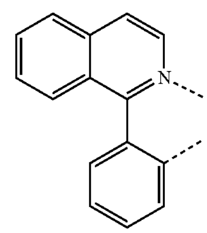

-continued
$L_{c143}$
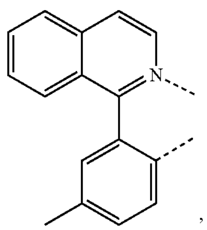
$L_{c144}$
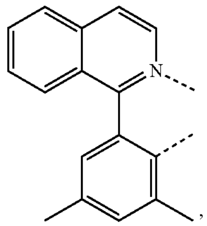
$L_{c145}$
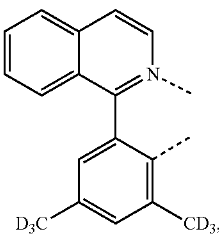
$L_{c146}$
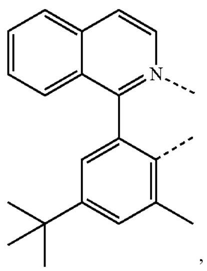
$L_{c147}$
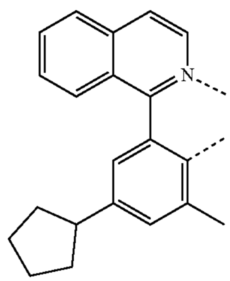
$L_{c148}$
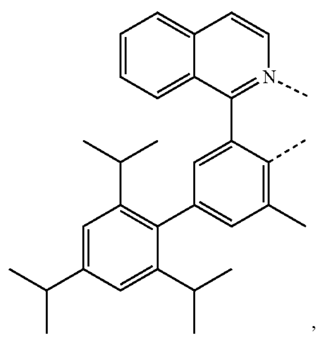
-continued
$L_{c149}$
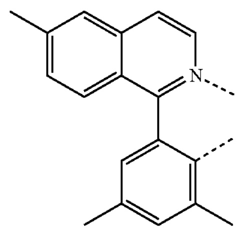
$L_{c150}$
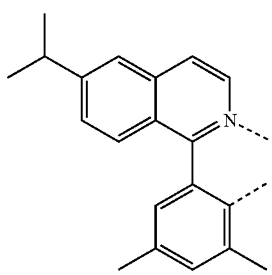
$L_{c151}$
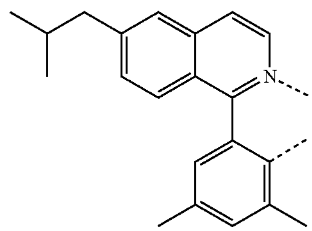
$L_{c152}$
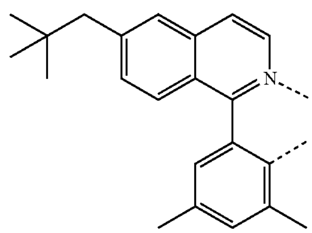
$L_{c153}$
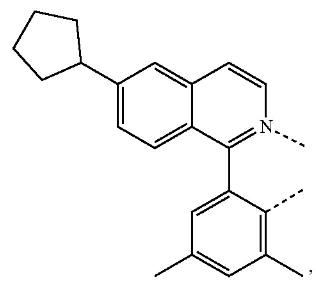
$L_{c154}$
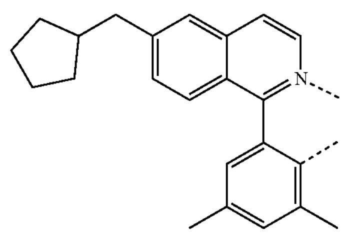

-continued
$L_{c155}$
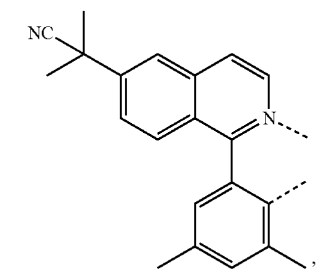
$L_{c156}$
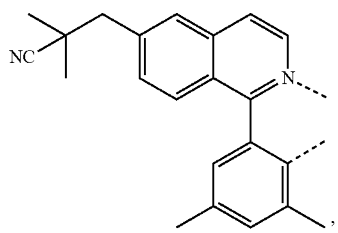
$L_{c157}$
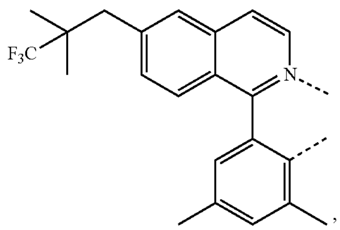
$L_{c161}$
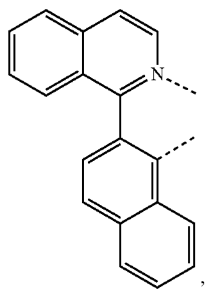
$L_{c162}$
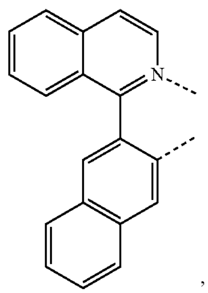
$L_{c163}$
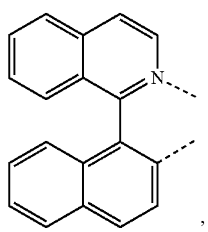
-continued
$L_{c164}$
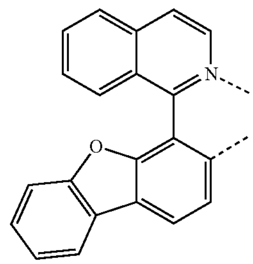
$L_{c165}$
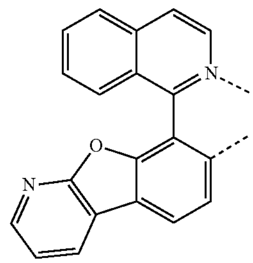
$L_{c166}$
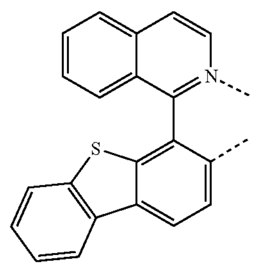
$L_{c167}$
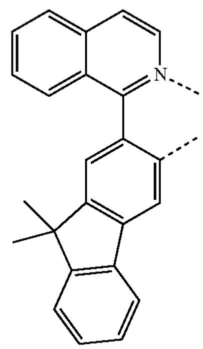
$L_{c168}$
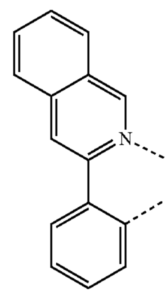

-continued
$L_{c169}$
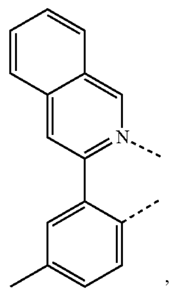
,
$L_{c170}$
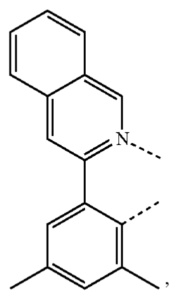
,
$L_{c171}$
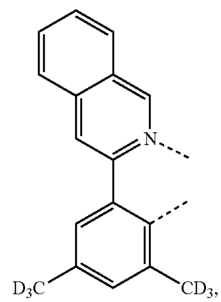
$L_{c172}$
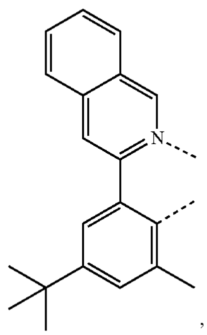
,
$L_{c173}$
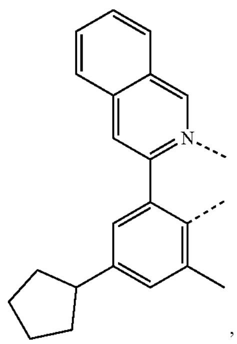
,
-continued
$L_{c174}$
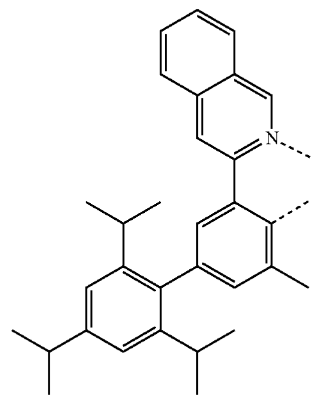
,
$L_{c175}$
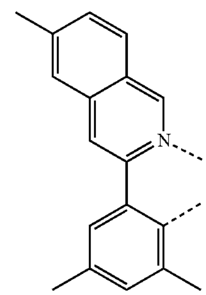
,
$L_{c176}$
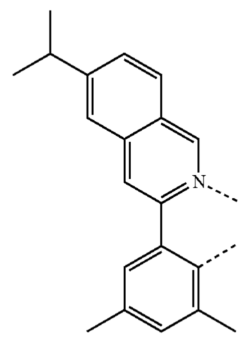
,
$L_{c177}$
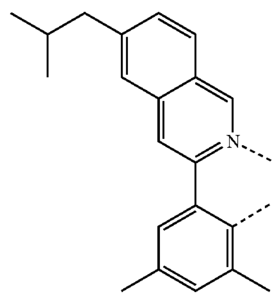
,
$L_{c178}$
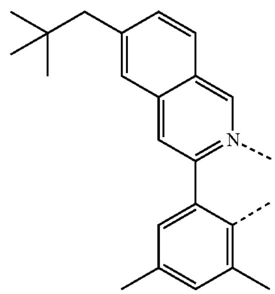
, -continued
$L_{c179}$
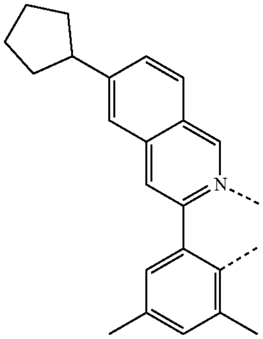
,
$L_{c180}$
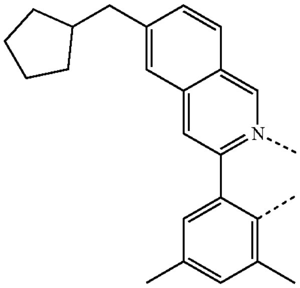
,
$L_{c181}$
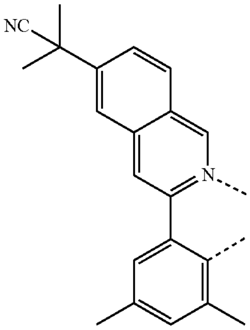
,
$L_{c182}$
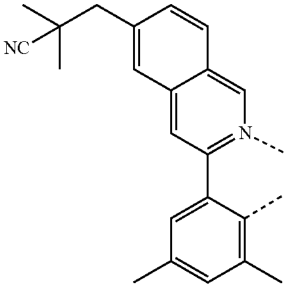
,
$L_{c183}$
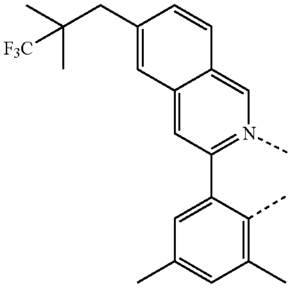
,
-continued
$L_{c184}$
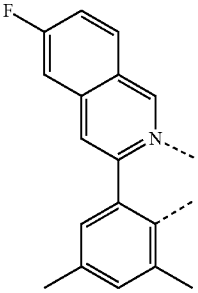
,
$L_{c185}$
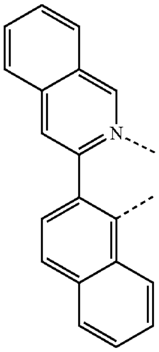
,
$L_{c186}$
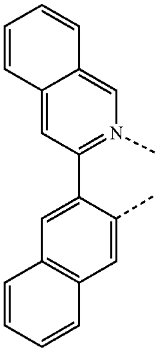
,
$L_{c187}$
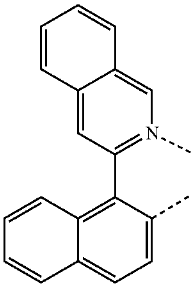
,
$L_{c188}$
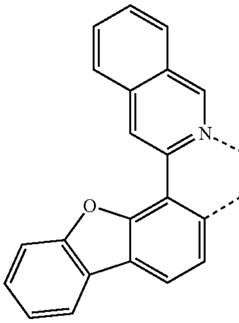
, -continued
$L_{c189}$
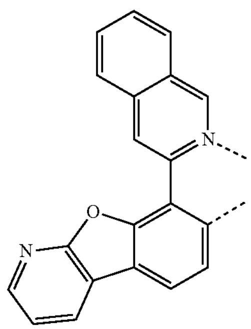
,
$L_{c190}$
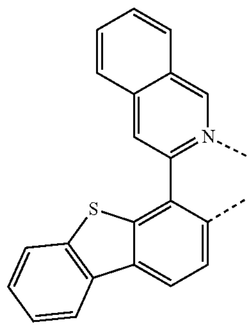
,
$L_{c191}$
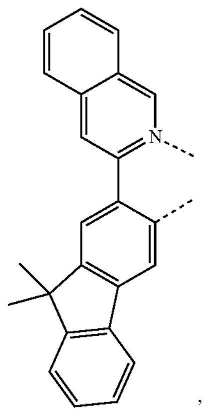
,
$L_{c192}$
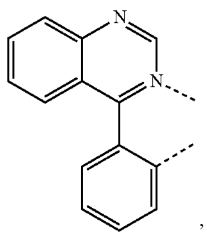
,
$L_{c193}$
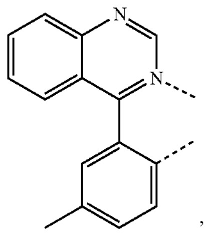
,
-continued
$L_{c194}$
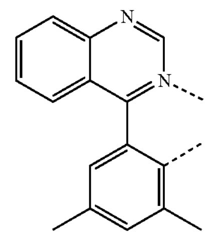
,
$L_{c195}$
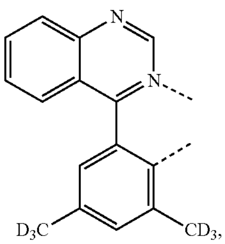
$L_{c196}$
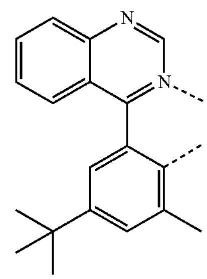
,
$L_{c197}$
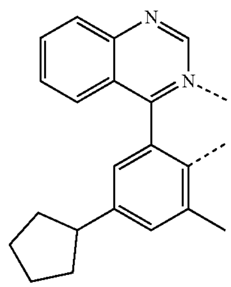
,
$L_{c198}$
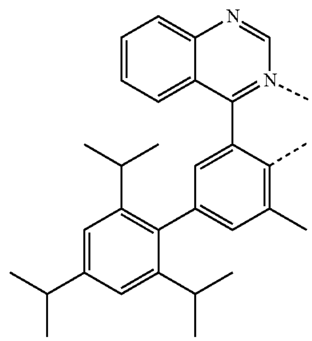
, -continued
$L_{c199}$
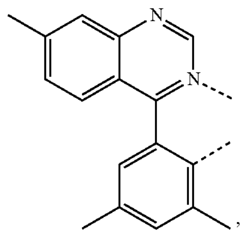
$L_{c200}$
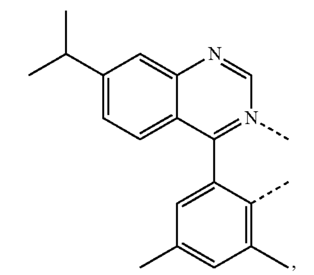
$L_{c201}$
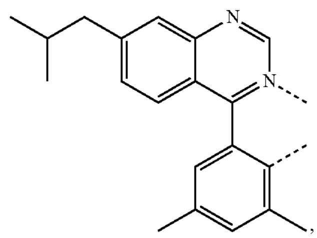
$L_{c202}$
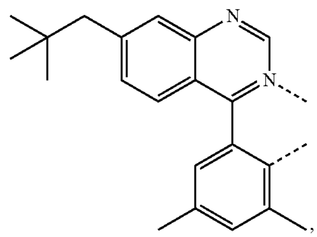
$L_{c203}$
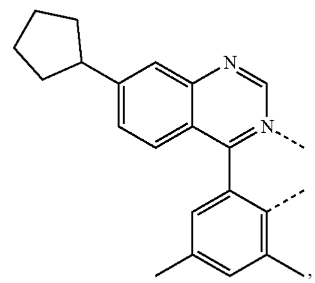
$L_{c204}$
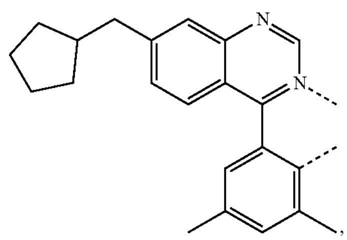
-continued
$L_{c205}$
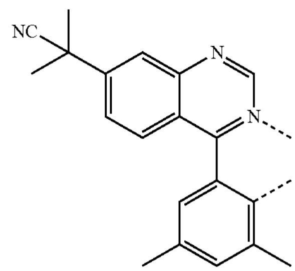
$L_{c206}$
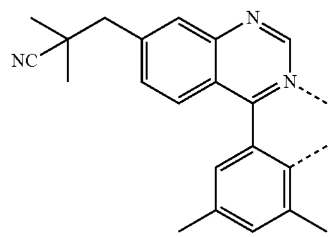
$L_{c207}$
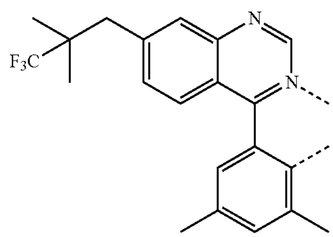
$L_{c208}$
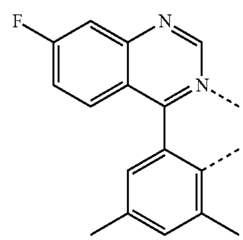
$L_{c209}$
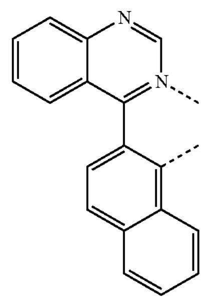
$L_{c210}$
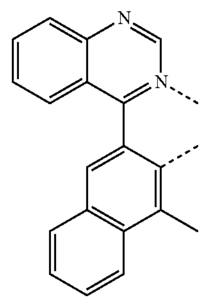

$L_{c211}$
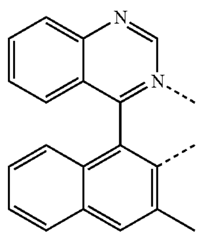
$L_{c212}$
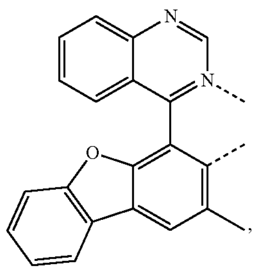
$L_{c213}$
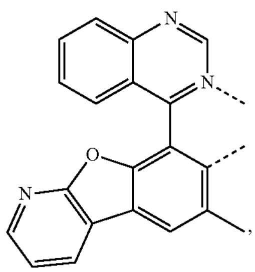
$L_{c214}$
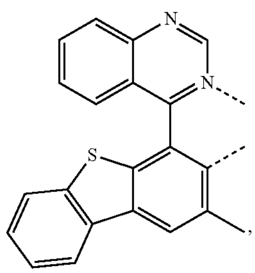
$L_{c215}$
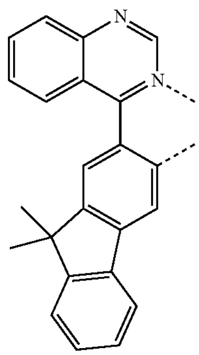
$L_{c216}$
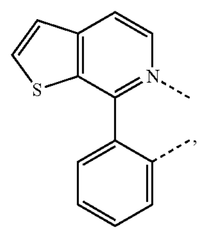
$L_{c217}$
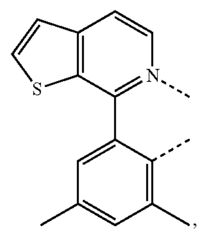
$L_{c218}$
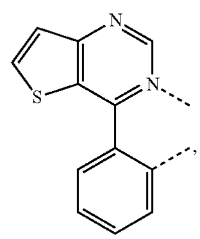
$L_{c219}$
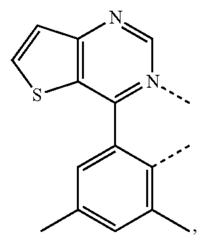
$L_{c220}$
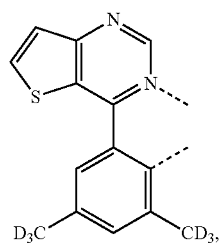
$L_{c221}$
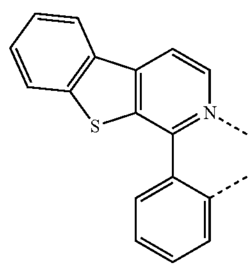

-continued
$L_{c222}$
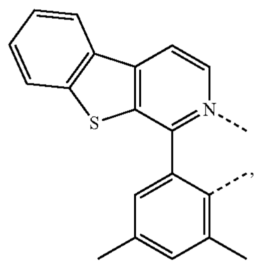
$L_{c223}$
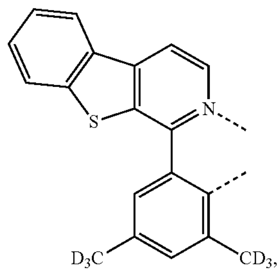
$L_{c224}$
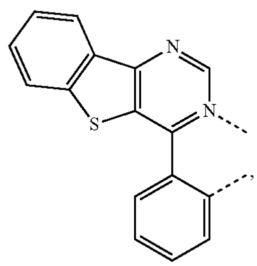
$L_{c225}$
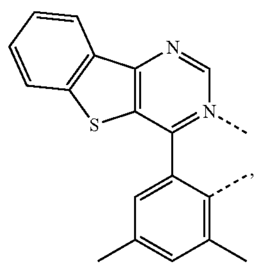
$L_{c226}$
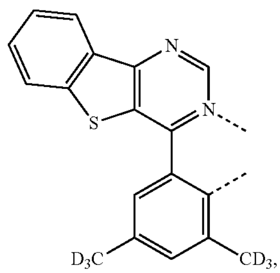
$L_{c227}$
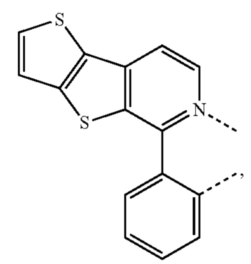
-continued
$L_{c228}$
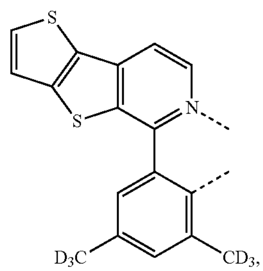
$L_{c229}$
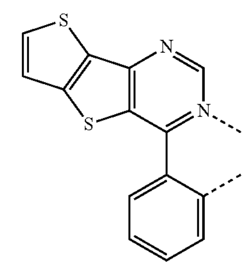
$L_{c230}$
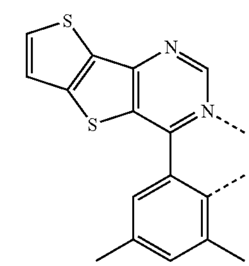
$L_{c231}$
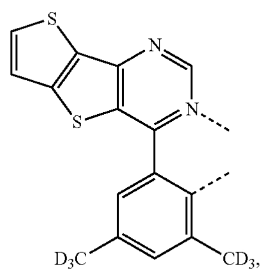
$L_{c232}$
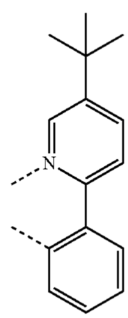

-continued
$L_{c233}$
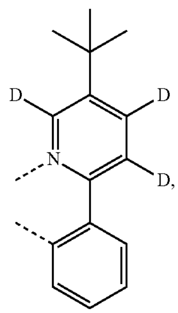
$L_{c234}$
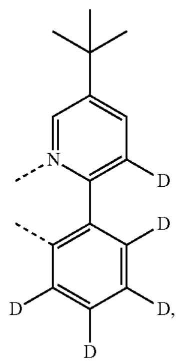
$L_{c235}$
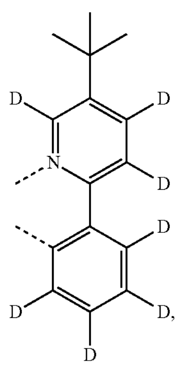
$L_{c236}$
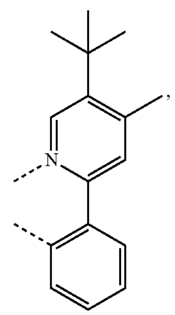
-continued
$L_{c237}$
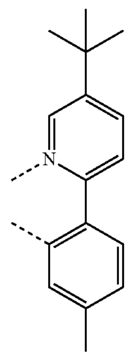
$L_{c238}$
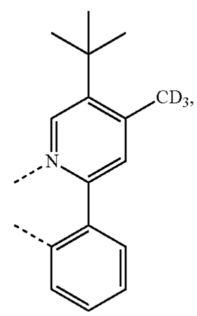
$L_{c239}$
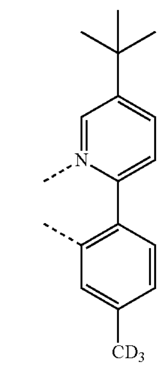
$L_{c240}$
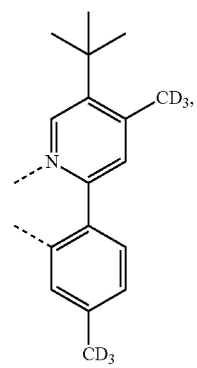

$L_{c241}$
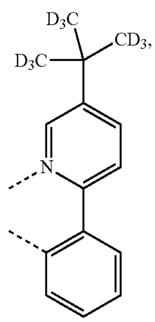
$L_{c242}$
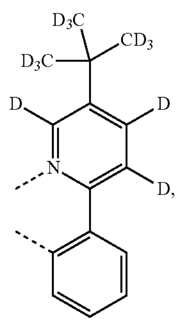
$L_{c243}$
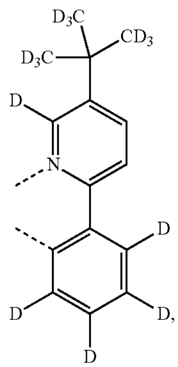
$L_{c244}$
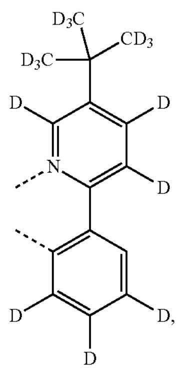
$L_{c245}$
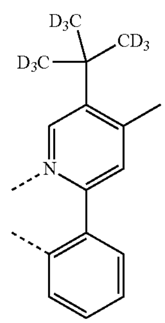
$L_{c246}$
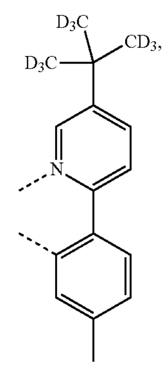
$L_{c247}$
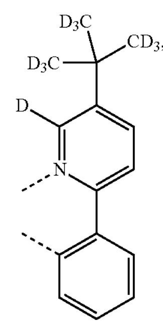
$L_{c248}$
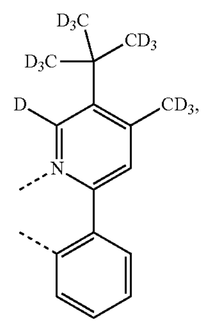

-continued
$L_{c249}$
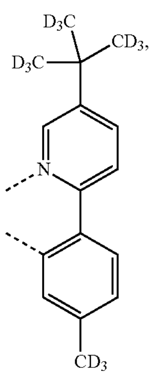
$L_{c250}$
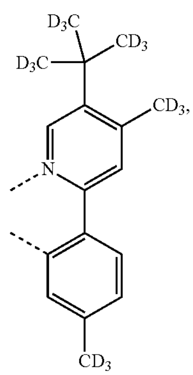
$L_{c251}$
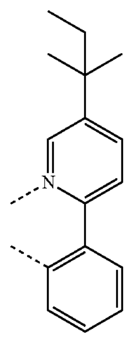
$L_{c252}$
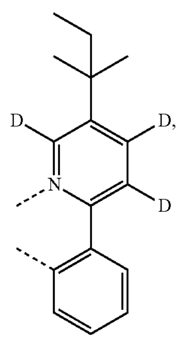
-continued
$L_{c253}$
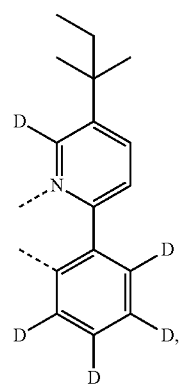
$L_{c254}$
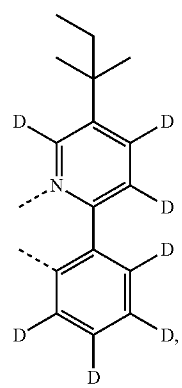
$L_{c255}$
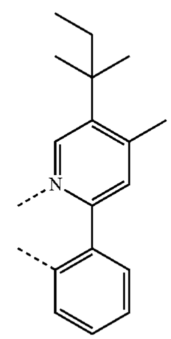
$L_{c256}$
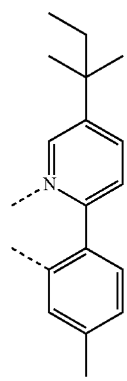

-continued
$L_{c257}$
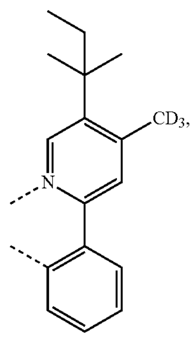
$L_{c258}$
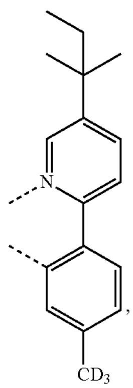
$L_{c259}$
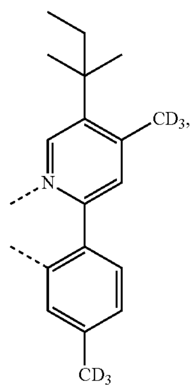
$L_{c260}$
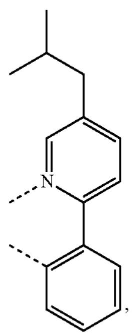
-continued
$L_{c261}$
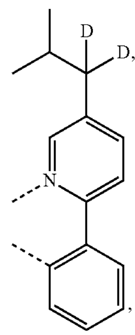
$L_{c262}$
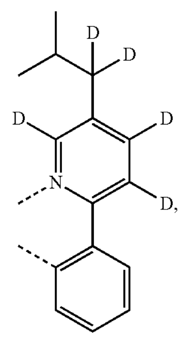
$L_{c263}$
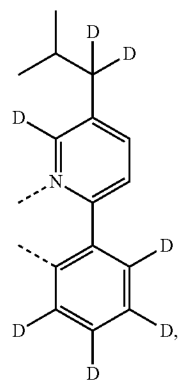
$L_{c264}$
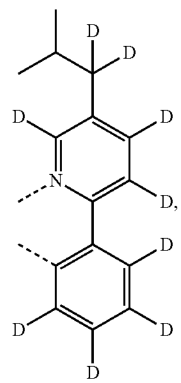

$L_{c265}$
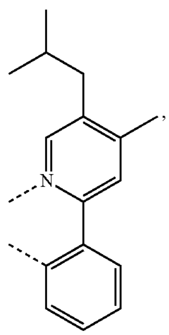
$L_{c266}$
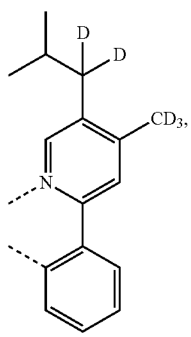
$L_{c267}$
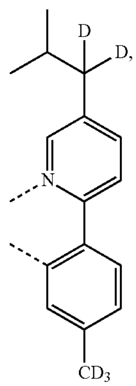
$L_{c268}$
$L_{c269}$
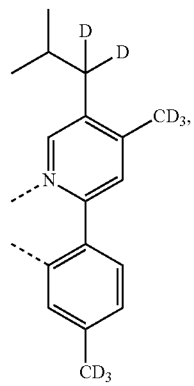
$L_{c270}$
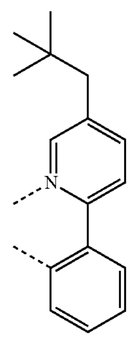
$L_{c271}$
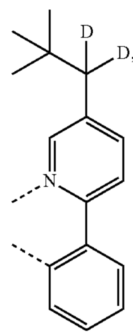
$L_{c272}$
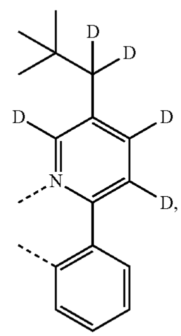

-continued
$L_{c273}$
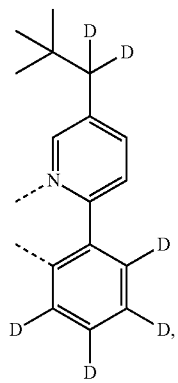
$L_{c274}$
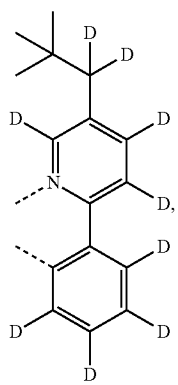
$L_{c275}$
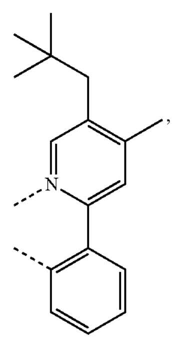
$L_{c276}$
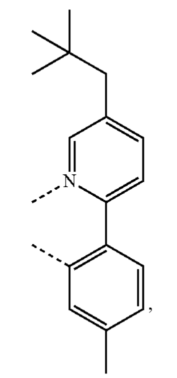
-continued
$L_{c277}$
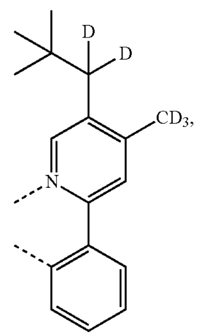
$L_{c278}$
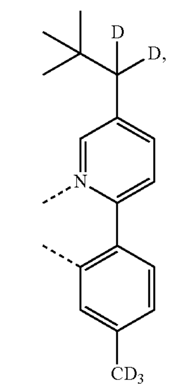
$L_{c279}$
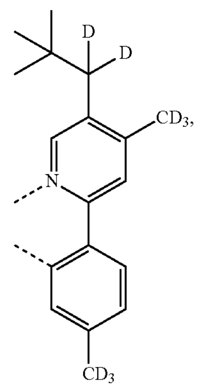
$L_{c280}$
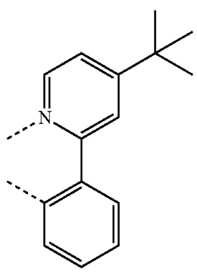

$L_{c281}$
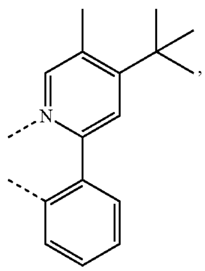
$L_{c282}$
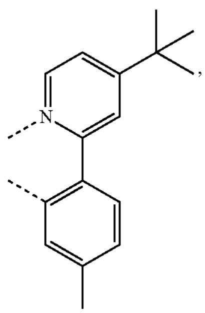
$L_{c283}$
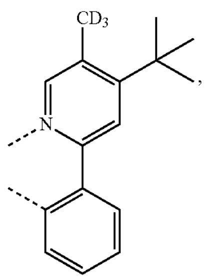
$L_{c284}$
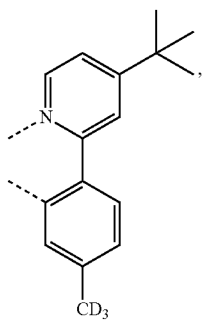
$L_{c285}$
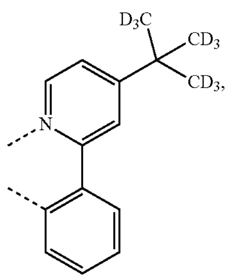
$L_{c286}$
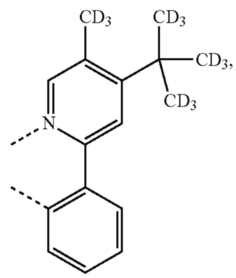
$L_{c287}$
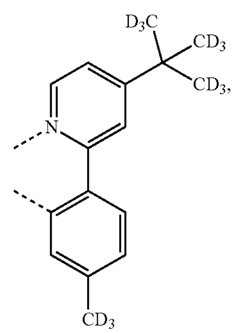
$L_{c288}$
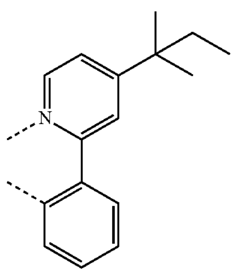
$L_{c289}$
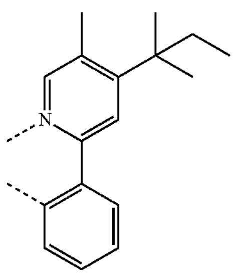
$L_{c290}$
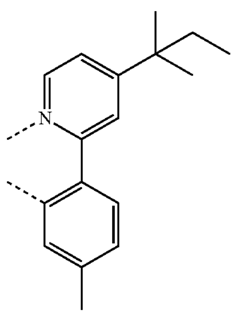

-continued
$L_{c291}$
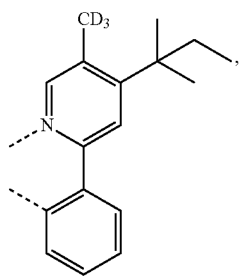
$L_{c292}$
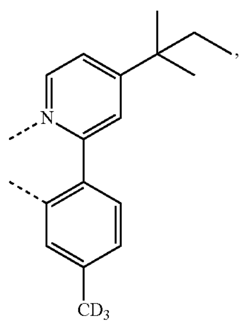
$L_{c293}$
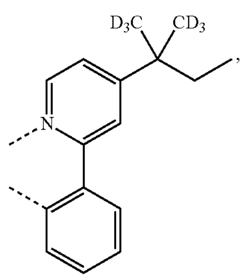
$L_{c294}$
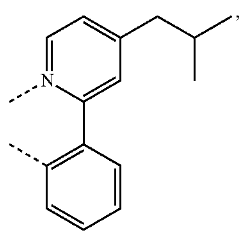
$L_{c295}$
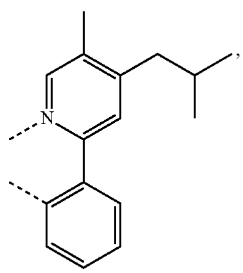
-continued
$L_{c296}$
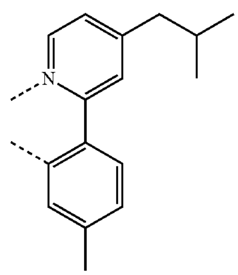
$L_{c297}$
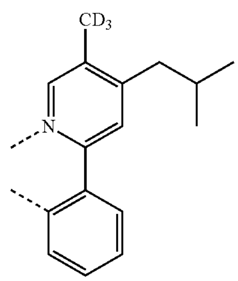
$L_{c298}$
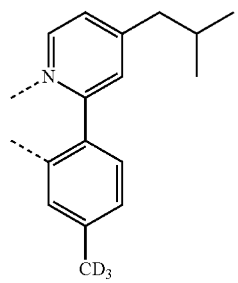
$L_{c299}$
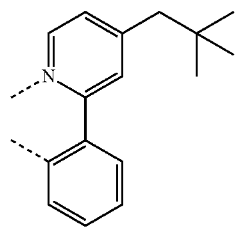
$L_{c300}$
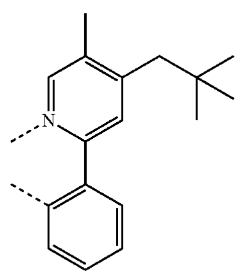

-continued
$L_{c301}$
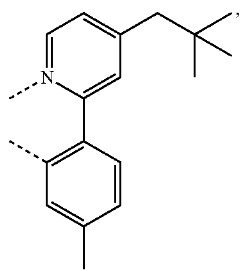
$L_{c302}$
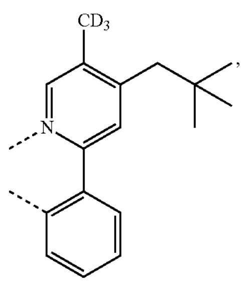
$L_{c303}$
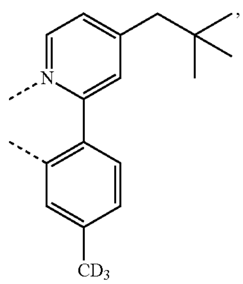
$L_{c304}$
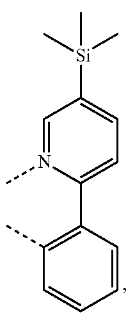
$L_{c305}$
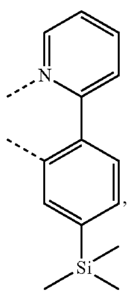
-continued
$L_{c306}$
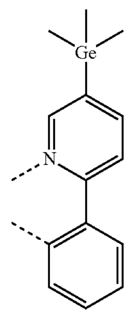
$L_{c307}$
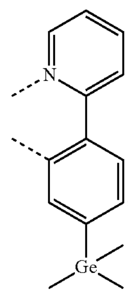
$L_{c308}$
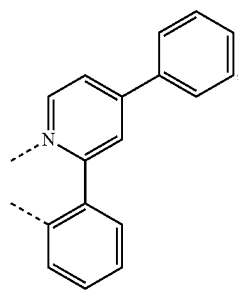
$L_{c309}$
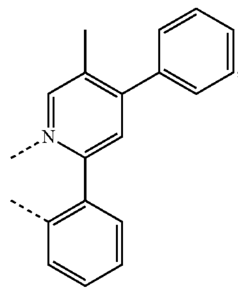
$L_{c310}$
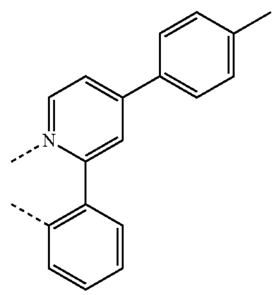

-continued
$L_{c311}$
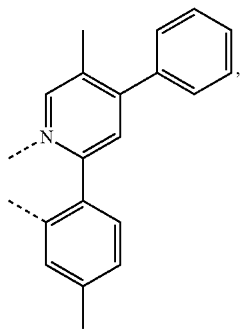
$L_{c312}$
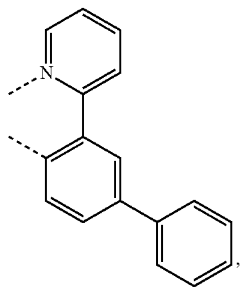
$L_{c313}$
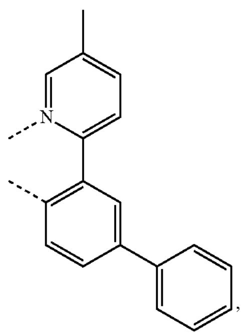
$L_{c314}$
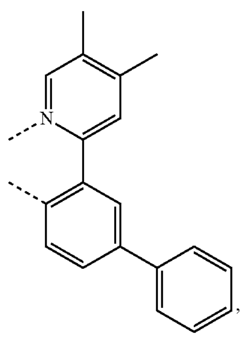
$L_{c315}$
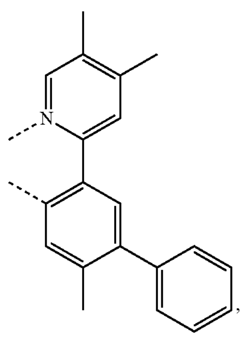
-continued
$L_{c316}$
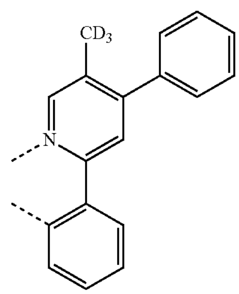
$L_{c317}$
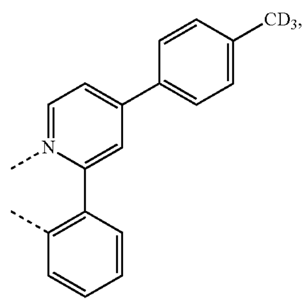
$L_{c318}$
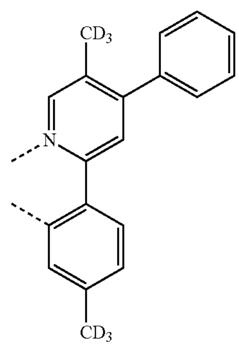
$L_{c319}$
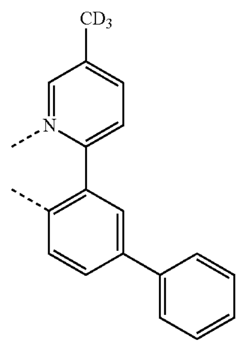
$L_{c320}$
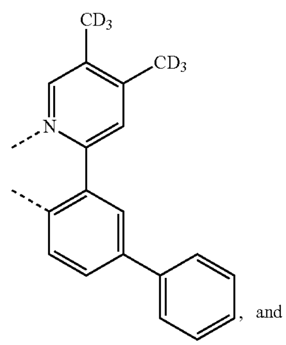
and -continued $L_{c321}$

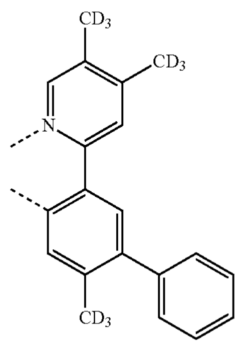

14. The metal complex of claim 13, wherein the metal complex is an Ir complex and has a structure represented by any one of $Ir(L_a)(L_b)(L_c)$, $Ir(L_a)_2(L_b)$, $Ir(L_a)_2(L_c)$, and $Ir(L_a)(L_c)_2$; when the metal complex has a structure of $Ir(L_a)(L_b)(L_c)$, $L_a$ is selected from any one of the group consisting of $L_{a1}$ to $L_{a1241}$, $L_b$ is selected from any one of the group consisting of $L_{b1}$ to $L_{b322}$, and $L_c$ is selected from any one of the group consisting of $L_{c1}$ to $L_{c321}$; when the metal complex has a structure of $Ir(L_a)_2(L_b)$, $L_a$ is, at each occurrence identically or differently, selected from any one or any two of the group consisting of $L_{a1}$ to $L_{a1241}$, and $L_b$ is selected from any one of the group consisting of $L_{b1}$ to $L_{b322}$; when the metal complex has a structure of $Ir(L_a)_2(L_c)$, $L_a$ is, at each occurrence identically or differently, selected from any one or any two of the group consisting of $L_{a1}$ to $L_{a1241}$, and $L_c$ is selected from any one of the group consisting of $L_{c1}$ to $L_{c321}$; when the metal complex has a structure of $Ir(L_a)(L_c)_2$, $L_a$ is selected from any one of the group consisting of $L_{a1}$ to $L_{a1241}$, and $L_c$ is, at each occurrence identically or differently, selected from any one or any two of the group consisting of $L_{c1}$ to $L_{c321}$; optionally, hydrogens in the structure of the metal complex can be partially or completely substituted with deuterium.

15. An electroluminescent device, comprising:

an anode, a cathode, and an organic layer disposed between the anode and the cathode, wherein the organic layer comprises the metal complex of claim 1.

16. The electroluminescent device of claim 15, wherein the organic layer is a light-emitting layer, and the metal complex is a light-emitting material.

17. The electroluminescent device of claim 15, wherein the electroluminescent device emits red light, yellow light, green light or white light.

18. The electroluminescent device of claim 16, wherein the light-emitting layer further comprises at least one host material.

19. A compound composition, comprising the metal complex of claim 1.

20. The metal complex of claim 2, wherein in $L_a$, ring A, ring C, and ring D are, at each occurrence identically or differently, selected from an aromatic ring having 6 to 10 carbon atoms or a heteroaromatic ring having 3 to 10 carbon atoms; and ring B is selected from a fused heteroaromatic ring having 8 to 18 ring atoms.

21. The metal complex of claim 7, wherein in Formula 2 to Formula 19, $R_a$, $R_b$, $R_c$, and $R_d$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkoxy having 1 to 20 carbon atoms, substituted or unsubstituted aryloxy having 6 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, a cyano group, and combinations thereof.

22. The metal complex of claim 10, wherein the metal M is selected from Ir, Pt or Os.

23. The metal complex of claim 14, wherein the metal complex is selected from the group consisting of Compound 1 to Compound 670;

wherein Compound 1 to Compound 538, Compound 669, and Compound 670 have the general formula of $Ir(L_a)_2(L_b)$, wherein two $L_a$ are identical, and $L_a$ and $L_b$ are selected from structures listed in the following table, respectively:

| Compound No. | $L_a$ | $L_b$ | Compound No. | $L_a$ | $L_b$ |
|---|---|---|---|---|---|
| 1 | $L_{a29}$ | $L_{b31}$ | 2 | $L_{a34}$ | $L_{b31}$ |
| 3 | $L_{a29}$ | $L_{b88}$ | 4 | $L_{a34}$ | $L_{b88}$ |
| 5 | $L_{a29}$ | $L_{b122}$ | 6 | $L_{a34}$ | $L_{b122}$ |
| 7 | $L_{a29}$ | $L_{b126}$ | 8 | $L_{a34}$ | $L_{b126}$ |
| 9 | $L_{a29}$ | $L_{b135}$ | 10 | $L_{a34}$ | $L_{b135}$ |
| 11 | $L_{a42}$ | $L_{b31}$ | 12 | $L_{a45}$ | $L_{b31}$ |
| 13 | $L_{a42}$ | $L_{b88}$ | 14 | $L_{a45}$ | $L_{b88}$ |
| 15 | $L_{a42}$ | $L_{b122}$ | 16 | $L_{a45}$ | $L_{b122}$ |
| 17 | $L_{a42}$ | $L_{b126}$ | 18 | $L_{a45}$ | $L_{b126}$ |
| 19 | $L_{a42}$ | $L_{b135}$ | 20 | $L_{a45}$ | $L_{b135}$ |
| 21 | $L_{a104}$ | $L_{b31}$ | 22 | $L_{a295}$ | $L_{b31}$ |
| 23 | $L_{a104}$ | $L_{b88}$ | 24 | $L_{a295}$ | $L_{b88}$ |
| 25 | $L_{a104}$ | $L_{b122}$ | 26 | $L_{a295}$ | $L_{b122}$ |
| 27 | $L_{a104}$ | $L_{b126}$ | 28 | $L_{a295}$ | $L_{b126}$ |
| 29 | $L_{a104}$ | $L_{b135}$ | 30 | $L_{a295}$ | $L_{b135}$ |
| 31 | $L_{a364}$ | $L_{b31}$ | 32 | $L_{a368}$ | $L_{b31}$ |
| 33 | $L_{a364}$ | $L_{b88}$ | 34 | $L_{a368}$ | $L_{b88}$ |
| 35 | $L_{a364}$ | $L_{b122}$ | 36 | $L_{a368}$ | $L_{b122}$ |
| 37 | $L_{a364}$ | $L_{b126}$ | 38 | $L_{a368}$ | $L_{b126}$ |
| 39 | $L_{a364}$ | $L_{b135}$ | 40 | $L_{a368}$ | $L_{b135}$ |
| 41 | $L_{a372}$ | $L_{b31}$ | 42 | $L_{a374}$ | $L_{b31}$ |
| 43 | $L_{a372}$ | $L_{b88}$ | 44 | $L_{a374}$ | $L_{b88}$ |
| 45 | $L_{a372}$ | $L_{b122}$ | 46 | $L_{a374}$ | $L_{b122}$ |
| 47 | $L_{a372}$ | $L_{b126}$ | 48 | $L_{a374}$ | $L_{b126}$ |
| 49 | $L_{a372}$ | $L_{b135}$ | 50 | $L_{a374}$ | $L_{b135}$ |
| 51 | $L_{a418}$ | $L_{b31}$ | 52 | $L_{a420}$ | $L_{b31}$ |
| 53 | $L_{a418}$ | $L_{b88}$ | 54 | $L_{a420}$ | $L_{b88}$ |
| 55 | $L_{a418}$ | $L_{b122}$ | 56 | $L_{a420}$ | $L_{b122}$ |
| 57 | $L_{a418}$ | $L_{b126}$ | 58 | $L_{a420}$ | $L_{b126}$ |
| 59 | $L_{a418}$ | $L_{b135}$ | 60 | $L_{a420}$ | $L_{b135}$ |
| 61 | $L_{a418}$ | $L_{b89}$ | 62 | $L_{a420}$ | $L_{b89}$ |
| 63 | $L_{a418}$ | $L_{b122}$ | 64 | $L_{a420}$ | $L_{b122}$ |
| 65 | $L_{a418}$ | $L_{b139}$ | 66 | $L_{a420}$ | $L_{b139}$ |
| 67 | $L_{a422}$ | $L_{b31}$ | 68 | $L_{a500}$ | $L_{b31}$ |
| 69 | $L_{a422}$ | $L_{b88}$ | 70 | $L_{a500}$ | $L_{b88}$ |
| 71 | $L_{a422}$ | $L_{b122}$ | 72 | $L_{a500}$ | $L_{b122}$ |
| 73 | $L_{a422}$ | $L_{b126}$ | 74 | $L_{a500}$ | $L_{b126}$ |
| 75 | $L_{a422}$ | $L_{b135}$ | 76 | $L_{a500}$ | $L_{b135}$ |
| 77 | $L_{a422}$ | $L_{b89}$ | 78 | $L_{a500}$ | $L_{b89}$ |
| 79 | $L_{a422}$ | $L_{b122}$ | 80 | $L_{a500}$ | $L_{b122}$ |
| 81 | $L_{a422}$ | $L_{b139}$ | 82 | $L_{a500}$ | $L_{b139}$ |
| 83 | $L_{a502}$ | $L_{b31}$ | 84 | $L_{a504}$ | $L_{b31}$ |
| 85 | $L_{a502}$ | $L_{b88}$ | 86 | $L_{a504}$ | $L_{b88}$ |
| 87 | $L_{a502}$ | $L_{b122}$ | 88 | $L_{a504}$ | $L_{b122}$ |
| 89 | $L_{a502}$ | $L_{b126}$ | 90 | $L_{a504}$ | $L_{b126}$ |
| 91 | $L_{a502}$ | $L_{b135}$ | 92 | $L_{a504}$ | $L_{b135}$ |
| 93 | $L_{a502}$ | $L_{b89}$ | 94 | $L_{a504}$ | $L_{b89}$ |
| 95 | $L_{a502}$ | $L_{b122}$ | 96 | $L_{a504}$ | $L_{b122}$ |

-continued

| Compound No. | $L_a$ | $L_b$ | Compound No. | $L_a$ | $L_b$ |
|---|---|---|---|---|---|
| 97 | $L_{a502}$ | $L_{b139}$ | 98 | $L_{a504}$ | $L_{b139}$ |
| 99 | $L_{a505}$ | $L_{b31}$ | 100 | $L_{a516}$ | $L_{b31}$ |
| 101 | $L_{a505}$ | $L_{b88}$ | 102 | $L_{a516}$ | $L_{b88}$ |
| 103 | $L_{a505}$ | $L_{b122}$ | 104 | $L_{a516}$ | $L_{b122}$ |
| 105 | $L_{a505}$ | $L_{b126}$ | 106 | $L_{a516}$ | $L_{b126}$ |
| 107 | $L_{a505}$ | $L_{b135}$ | 108 | $L_{a516}$ | $L_{b135}$ |
| 109 | $L_{a505}$ | $L_{b89}$ | 110 | $L_{a516}$ | $L_{b89}$ |
| 111 | $L_{a505}$ | $L_{b122}$ | 112 | $L_{a516}$ | $L_{b122}$ |
| 113 | $L_{a505}$ | $L_{b139}$ | 114 | $L_{a516}$ | $L_{b139}$ |
| 115 | $L_{a520}$ | $L_{b31}$ | 116 | $L_{a530}$ | $L_{b31}$ |
| 117 | $L_{a520}$ | $L_{b88}$ | 118 | $L_{a530}$ | $L_{b88}$ |
| 119 | $L_{a520}$ | $L_{b122}$ | 120 | $L_{a530}$ | $L_{b122}$ |
| 121 | $L_{a520}$ | $L_{b126}$ | 122 | $L_{a530}$ | $L_{b126}$ |
| 123 | $L_{a520}$ | $L_{b135}$ | 124 | $L_{a530}$ | $L_{b135}$ |
| 125 | $L_{a520}$ | $L_{b89}$ | 126 | $L_{a530}$ | $L_{b89}$ |
| 127 | $L_{a520}$ | $L_{b122}$ | 128 | $L_{a530}$ | $L_{b122}$ |
| 129 | $L_{a520}$ | $L_{b139}$ | 130 | $L_{a530}$ | $L_{b139}$ |
| 131 | $L_{a534}$ | $L_{b31}$ | 132 | $L_{a575}$ | $L_{b31}$ |
| 133 | $L_{a534}$ | $L_{b88}$ | 134 | $L_{a575}$ | $L_{b88}$ |
| 135 | $L_{a534}$ | $L_{b122}$ | 136 | $L_{a575}$ | $L_{b122}$ |
| 137 | $L_{a534}$ | $L_{b126}$ | 138 | $L_{a575}$ | $L_{b126}$ |
| 139 | $L_{a534}$ | $L_{b135}$ | 140 | $L_{a575}$ | $L_{b135}$ |
| 141 | $L_{a534}$ | $L_{b89}$ | 142 | $L_{a575}$ | $L_{b89}$ |
| 143 | $L_{a534}$ | $L_{b122}$ | 144 | $L_{a575}$ | $L_{b122}$ |
| 145 | $L_{a534}$ | $L_{b139}$ | 146 | $L_{a575}$ | $L_{b139}$ |
| 147 | $L_{a579}$ | $L_{b31}$ | 148 | $L_{a701}$ | $L_{b31}$ |
| 149 | $L_{a579}$ | $L_{b88}$ | 150 | $L_{a701}$ | $L_{b88}$ |
| 151 | $L_{a579}$ | $L_{b122}$ | 152 | $L_{a701}$ | $L_{b122}$ |
| 153 | $L_{a579}$ | $L_{b126}$ | 154 | $L_{a701}$ | $L_{b126}$ |
| 155 | $L_{a579}$ | $L_{b135}$ | 156 | $L_{a701}$ | $L_{b135}$ |
| 157 | $L_{a579}$ | $L_{b89}$ | 158 | $L_{a701}$ | $L_{b89}$ |
| 159 | $L_{a579}$ | $L_{b122}$ | 160 | $L_{a701}$ | $L_{b122}$ |
| 161 | $L_{a579}$ | $L_{b139}$ | 162 | $L_{a701}$ | $L_{b139}$ |
| 163 | $L_{a713}$ | $L_{b31}$ | 164 | $L_{a679}$ | $L_{b31}$ |
| 165 | $L_{a713}$ | $L_{b88}$ | 166 | $L_{a679}$ | $L_{b88}$ |
| 167 | $L_{a713}$ | $L_{b122}$ | 168 | $L_{a679}$ | $L_{b122}$ |
| 169 | $L_{a713}$ | $L_{b126}$ | 170 | $L_{a679}$ | $L_{b126}$ |
| 171 | $L_{a713}$ | $L_{b135}$ | 172 | $L_{a679}$ | $L_{b135}$ |
| 173 | $L_{a713}$ | $L_{b89}$ | 174 | $L_{a679}$ | $L_{b89}$ |
| 175 | $L_{a713}$ | $L_{b122}$ | 176 | $L_{a679}$ | $L_{b122}$ |
| 177 | $L_{a713}$ | $L_{b139}$ | 178 | $L_{a679}$ | $L_{b139}$ |
| 179 | $L_{a690}$ | $L_{b31}$ | 180 | $L_{a423}$ | $L_{b31}$ |
| 181 | $L_{a690}$ | $L_{b88}$ | 182 | $L_{a423}$ | $L_{b88}$ |
| 183 | $L_{a690}$ | $L_{b122}$ | 184 | $L_{a423}$ | $L_{b122}$ |
| 185 | $L_{a690}$ | $L_{b126}$ | 186 | $L_{a423}$ | $L_{b126}$ |
| 187 | $L_{a690}$ | $L_{b135}$ | 188 | $L_{a423}$ | $L_{b135}$ |
| 189 | $L_{a690}$ | $L_{b89}$ | 190 | $L_{a423}$ | $L_{b89}$ |
| 191 | $L_{a690}$ | $L_{b122}$ | 192 | $L_{a423}$ | $L_{b122}$ |
| 193 | $L_{a690}$ | $L_{b139}$ | 194 | $L_{a423}$ | $L_{b139}$ |
| 195 | $L_{a425}$ | $L_{b31}$ | 196 | $L_{a472}$ | $L_{b31}$ |
| 197 | $L_{a425}$ | $L_{b88}$ | 198 | $L_{a472}$ | $L_{b88}$ |
| 199 | $L_{a425}$ | $L_{b122}$ | 200 | $L_{a472}$ | $L_{b122}$ |
| 201 | $L_{a425}$ | $L_{b126}$ | 202 | $L_{a472}$ | $L_{b126}$ |
| 203 | $L_{a425}$ | $L_{b135}$ | 204 | $L_{a472}$ | $L_{b135}$ |
| 205 | $L_{a425}$ | $L_{b89}$ | 206 | $L_{a472}$ | $L_{b89}$ |
| 207 | $L_{a425}$ | $L_{b122}$ | 208 | $L_{a472}$ | $L_{b122}$ |
| 209 | $L_{a425}$ | $L_{b139}$ | 210 | $L_{a472}$ | $L_{b139}$ |
| 211 | $L_{a506}$ | $L_{b31}$ | 212 | $L_{a536}$ | $L_{b31}$ |
| 213 | $L_{a506}$ | $L_{b88}$ | 214 | $L_{a536}$ | $L_{b88}$ |
| 215 | $L_{a506}$ | $L_{b122}$ | 216 | $L_{a536}$ | $L_{b122}$ |
| 217 | $L_{a506}$ | $L_{b126}$ | 218 | $L_{a536}$ | $L_{b126}$ |
| 219 | $L_{a506}$ | $L_{b135}$ | 220 | $L_{a536}$ | $L_{b135}$ |
| 221 | $L_{a506}$ | $L_{b89}$ | 222 | $L_{a536}$ | $L_{b89}$ |
| 223 | $L_{a506}$ | $L_{b122}$ | 224 | $L_{a536}$ | $L_{b122}$ |
| 225 | $L_{a506}$ | $L_{b139}$ | 226 | $L_{a536}$ | $L_{b139}$ |
| 227 | $L_{a559}$ | $L_{b31}$ | 228 | $L_{a534}$ | $L_{b31}$ |
| 229 | $L_{a559}$ | $L_{b88}$ | 230 | $L_{a534}$ | $L_{b88}$ |
| 231 | $L_{a559}$ | $L_{b122}$ | 232 | $L_{a534}$ | $L_{b122}$ |
| 233 | $L_{a559}$ | $L_{b126}$ | 234 | $L_{a534}$ | $L_{b126}$ |
| 235 | $L_{a559}$ | $L_{b135}$ | 236 | $L_{a534}$ | $L_{b135}$ |
| 237 | $L_{a559}$ | $L_{b89}$ | 238 | $L_{a534}$ | $L_{b89}$ |
| 239 | $L_{a559}$ | $L_{b122}$ | 240 | $L_{a534}$ | $L_{b122}$ |
| 241 | $L_{a559}$ | $L_{b139}$ | 242 | $L_{a534}$ | $L_{b139}$ |
| 243 | $L_{a537}$ | $L_{b31}$ | 244 | $L_{a587}$ | $L_{b31}$ |
| 245 | $L_{a537}$ | $L_{b88}$ | 246 | $L_{a587}$ | $L_{b88}$ |
| 247 | $L_{a537}$ | $L_{b122}$ | 248 | $L_{a587}$ | $L_{b122}$ |

-continued

| Compound No. | $L_a$ | $L_b$ | Compound No. | $L_a$ | $L_b$ |
|---|---|---|---|---|---|
| 249 | $L_{a537}$ | $L_{b126}$ | 250 | $L_{a587}$ | $L_{b126}$ |
| 251 | $L_{a537}$ | $L_{b135}$ | 252 | $L_{a587}$ | $L_{b135}$ |
| 253 | $L_{a537}$ | $L_{b89}$ | 254 | $L_{a587}$ | $L_{b89}$ |
| 255 | $L_{a537}$ | $L_{b122}$ | 256 | $L_{a587}$ | $L_{b122}$ |
| 257 | $L_{a537}$ | $L_{b139}$ | 258 | $L_{a587}$ | $L_{b139}$ |
| 259 | $L_{a589}$ | $L_{b31}$ | 260 | $L_{a543}$ | $L_{b31}$ |
| 261 | $L_{a589}$ | $L_{b88}$ | 262 | $L_{a543}$ | $L_{b88}$ |
| 263 | $L_{a589}$ | $L_{b122}$ | 264 | $L_{a543}$ | $L_{b122}$ |
| 265 | $L_{a589}$ | $L_{b126}$ | 266 | $L_{a543}$ | $L_{b126}$ |
| 267 | $L_{a589}$ | $L_{b135}$ | 268 | $L_{a543}$ | $L_{b135}$ |
| 269 | $L_{a589}$ | $L_{b89}$ | 270 | $L_{a543}$ | $L_{b89}$ |
| 271 | $L_{a589}$ | $L_{b122}$ | 272 | $L_{a543}$ | $L_{b122}$ |
| 273 | $L_{a589}$ | $L_{b139}$ | 274 | $L_{a543}$ | $L_{b139}$ |
| 275 | $L_{a592}$ | $L_{b31}$ | 276 | $L_{a622}$ | $L_{b31}$ |
| 277 | $L_{a592}$ | $L_{b88}$ | 278 | $L_{a622}$ | $L_{b88}$ |
| 279 | $L_{a592}$ | $L_{b122}$ | 280 | $L_{a622}$ | $L_{b122}$ |
| 281 | $L_{a592}$ | $L_{b126}$ | 282 | $L_{a622}$ | $L_{b126}$ |
| 283 | $L_{a592}$ | $L_{b135}$ | 284 | $L_{a622}$ | $L_{b135}$ |
| 285 | $L_{a592}$ | $L_{b89}$ | 286 | $L_{a622}$ | $L_{b89}$ |
| 287 | $L_{a592}$ | $L_{b122}$ | 288 | $L_{a622}$ | $L_{b122}$ |
| 289 | $L_{a592}$ | $L_{b139}$ | 290 | $L_{a622}$ | $L_{b139}$ |
| 291 | $L_{a624}$ | $L_{b31}$ | 292 | $L_{a635}$ | $L_{b31}$ |
| 293 | $L_{a624}$ | $L_{b88}$ | 294 | $L_{a635}$ | $L_{b88}$ |
| 295 | $L_{a624}$ | $L_{b122}$ | 296 | $L_{a635}$ | $L_{b122}$ |
| 297 | $L_{a624}$ | $L_{b126}$ | 298 | $L_{a635}$ | $L_{b126}$ |
| 299 | $L_{a624}$ | $L_{b135}$ | 300 | $L_{a635}$ | $L_{b135}$ |
| 301 | $L_{a624}$ | $L_{b89}$ | 302 | $L_{a635}$ | $L_{b89}$ |
| 303 | $L_{a624}$ | $L_{b122}$ | 304 | $L_{a635}$ | $L_{b122}$ |
| 305 | $L_{a624}$ | $L_{b139}$ | 306 | $L_{a635}$ | $L_{b139}$ |
| 307 | $L_{a630}$ | $L_{b31}$ | 308 | $L_{a654}$ | $L_{b31}$ |
| 309 | $L_{a630}$ | $L_{b88}$ | 310 | $L_{a654}$ | $L_{b88}$ |
| 311 | $L_{a630}$ | $L_{b122}$ | 312 | $L_{a654}$ | $L_{b122}$ |
| 313 | $L_{a630}$ | $L_{b126}$ | 314 | $L_{a654}$ | $L_{b126}$ |
| 315 | $L_{a630}$ | $L_{b135}$ | 316 | $L_{a654}$ | $L_{b135}$ |
| 317 | $L_{a630}$ | $L_{b89}$ | 318 | $L_{a654}$ | $L_{b89}$ |
| 319 | $L_{a630}$ | $L_{b122}$ | 320 | $L_{a654}$ | $L_{b122}$ |
| 321 | $L_{a630}$ | $L_{b139}$ | 322 | $L_{a654}$ | $L_{b139}$ |
| 323 | $L_{a597}$ | $L_{b31}$ | 324 | $L_{a701}$ | $L_{b31}$ |
| 325 | $L_{a597}$ | $L_{b88}$ | 326 | $L_{a701}$ | $L_{b88}$ |
| 327 | $L_{a597}$ | $L_{b122}$ | 328 | $L_{a701}$ | $L_{b122}$ |
| 329 | $L_{a597}$ | $L_{b126}$ | 330 | $L_{a701}$ | $L_{b126}$ |
| 331 | $L_{a597}$ | $L_{b135}$ | 332 | $L_{a701}$ | $L_{b135}$ |
| 333 | $L_{a597}$ | $L_{b89}$ | 334 | $L_{a701}$ | $L_{b89}$ |
| 335 | $L_{a597}$ | $L_{b122}$ | 336 | $L_{a701}$ | $L_{b122}$ |
| 337 | $L_{a597}$ | $L_{b139}$ | 338 | $L_{a701}$ | $L_{b139}$ |
| 339 | $L_{a704}$ | $L_{b31}$ | 340 | $L_{a706}$ | $L_{b31}$ |
| 341 | $L_{a704}$ | $L_{b88}$ | 342 | $L_{a706}$ | $L_{b88}$ |
| 343 | $L_{a704}$ | $L_{b122}$ | 344 | $L_{a706}$ | $L_{b122}$ |
| 345 | $L_{a704}$ | $L_{b126}$ | 346 | $L_{a706}$ | $L_{b126}$ |
| 347 | $L_{a704}$ | $L_{b135}$ | 348 | $L_{a706}$ | $L_{b135}$ |
| 349 | $L_{a704}$ | $L_{b89}$ | 350 | $L_{a706}$ | $L_{b89}$ |
| 351 | $L_{a704}$ | $L_{b122}$ | 352 | $L_{a706}$ | $L_{b122}$ |
| 353 | $L_{a704}$ | $L_{b139}$ | 354 | $L_{a706}$ | $L_{b139}$ |
| 355 | $L_{a707}$ | $L_{b31}$ | 356 | $L_{a713}$ | $L_{b31}$ |
| 357 | $L_{a707}$ | $L_{b88}$ | 358 | $L_{a713}$ | $L_{b88}$ |
| 359 | $L_{a707}$ | $L_{b122}$ | 360 | $L_{a713}$ | $L_{b122}$ |
| 361 | $L_{a707}$ | $L_{b126}$ | 362 | $L_{a713}$ | $L_{b126}$ |
| 363 | $L_{a707}$ | $L_{b135}$ | 364 | $L_{a713}$ | $L_{b135}$ |
| 365 | $L_{a707}$ | $L_{b89}$ | 366 | $L_{a713}$ | $L_{b89}$ |
| 367 | $L_{a707}$ | $L_{b122}$ | 368 | $L_{a713}$ | $L_{b122}$ |
| 369 | $L_{a707}$ | $L_{b139}$ | 370 | $L_{a713}$ | $L_{b139}$ |
| 371 | $L_{a716}$ | $L_{b31}$ | 372 | $L_{a720}$ | $L_{b31}$ |
| 373 | $L_{a716}$ | $L_{b88}$ | 374 | $L_{a720}$ | $L_{b88}$ |
| 375 | $L_{a716}$ | $L_{b122}$ | 376 | $L_{a720}$ | $L_{b122}$ |
| 377 | $L_{a716}$ | $L_{b126}$ | 378 | $L_{a720}$ | $L_{b126}$ |
| 379 | $L_{a716}$ | $L_{b135}$ | 380 | $L_{a720}$ | $L_{b135}$ |
| 381 | $L_{a716}$ | $L_{b89}$ | 382 | $L_{a720}$ | $L_{b89}$ |
| 383 | $L_{a716}$ | $L_{b122}$ | 384 | $L_{a720}$ | $L_{b122}$ |
| 385 | $L_{a716}$ | $L_{b139}$ | 386 | $L_{a720}$ | $L_{b139}$ |
| 387 | $L_{a679}$ | $L_{b31}$ | 388 | $L_{a682}$ | $L_{b31}$ |
| 389 | $L_{a679}$ | $L_{b88}$ | 390 | $L_{a682}$ | $L_{b88}$ |
| 391 | $L_{a679}$ | $L_{b122}$ | 392 | $L_{a682}$ | $L_{b122}$ |
| 393 | $L_{a679}$ | $L_{b126}$ | 394 | $L_{a682}$ | $L_{b126}$ |
| 395 | $L_{a679}$ | $L_{b135}$ | 396 | $L_{a682}$ | $L_{b135}$ |
| 397 | $L_{a679}$ | $L_{b89}$ | 398 | $L_{a682}$ | $L_{b89}$ |
| 399 | $L_{a679}$ | $L_{b122}$ | 400 | $L_{a682}$ | $L_{b122}$ |

-continued

| Compound No. | $L_a$ | $L_b$ | Compound No. | $L_a$ | $L_b$ |
|---|---|---|---|---|---|
| 401 | $L_{a679}$ | $L_{b139}$ | 402 | $L_{a682}$ | $L_{b139}$ |
| 403 | $L_{a684}$ | $L_{b31}$ | 404 | $L_{a685}$ | $L_{b31}$ |
| 405 | $L_{a684}$ | $L_{b88}$ | 406 | $L_{a685}$ | $L_{b88}$ |
| 407 | $L_{a684}$ | $L_{b122}$ | 408 | $L_{a685}$ | $L_{b122}$ |
| 409 | $L_{a684}$ | $L_{b126}$ | 410 | $L_{a685}$ | $L_{b126}$ |
| 411 | $L_{a684}$ | $L_{b135}$ | 412 | $L_{a685}$ | $L_{b135}$ |
| 413 | $L_{a684}$ | $L_{b89}$ | 414 | $L_{a685}$ | $L_{b89}$ |
| 415 | $L_{a684}$ | $L_{b122}$ | 416 | $L_{a685}$ | $L_{b122}$ |
| 417 | $L_{a684}$ | $L_{b139}$ | 418 | $L_{a685}$ | $L_{b139}$ |
| 419 | $L_{a690}$ | $L_{b31}$ | 420 | $L_{a692}$ | $L_{b31}$ |
| 421 | $L_{a690}$ | $L_{b88}$ | 422 | $L_{a692}$ | $L_{b88}$ |
| 423 | $L_{a690}$ | $L_{b122}$ | 424 | $L_{a692}$ | $L_{b122}$ |
| 425 | $L_{a690}$ | $L_{b126}$ | 426 | $L_{a692}$ | $L_{b126}$ |
| 427 | $L_{a690}$ | $L_{b135}$ | 428 | $L_{a692}$ | $L_{b135}$ |
| 429 | $L_{a690}$ | $L_{b89}$ | 430 | $L_{a692}$ | $L_{b89}$ |
| 431 | $L_{a690}$ | $L_{b122}$ | 432 | $L_{a692}$ | $L_{b122}$ |
| 433 | $L_{a690}$ | $L_{b139}$ | 434 | $L_{a692}$ | $L_{b139}$ |
| 435 | $L_{a695}$ | $L_{b31}$ | 436 | $L_{a697}$ | $L_{b31}$ |
| 437 | $L_{a695}$ | $L_{b88}$ | 438 | $L_{a697}$ | $L_{b88}$ |
| 439 | $L_{a695}$ | $L_{b122}$ | 440 | $L_{a697}$ | $L_{b122}$ |
| 441 | $L_{a695}$ | $L_{b126}$ | 442 | $L_{a697}$ | $L_{b126}$ |
| 443 | $L_{a695}$ | $L_{b135}$ | 444 | $L_{a697}$ | $L_{b135}$ |
| 445 | $L_{a695}$ | $L_{b89}$ | 446 | $L_{a697}$ | $L_{b89}$ |
| 447 | $L_{a695}$ | $L_{b122}$ | 448 | $L_{a697}$ | $L_{b122}$ |
| 449 | $L_{a695}$ | $L_{b139}$ | 450 | $L_{a697}$ | $L_{b139}$ |
| 451 | $L_{a698}$ | $L_{b31}$ | 452 | $L_{a733}$ | $L_{b31}$ |
| 453 | $L_{a698}$ | $L_{b88}$ | 454 | $L_{a733}$ | $L_{b88}$ |
| 455 | $L_{a698}$ | $L_{b122}$ | 456 | $L_{a733}$ | $L_{b122}$ |
| 457 | $L_{a698}$ | $L_{b126}$ | 458 | $L_{a733}$ | $L_{b126}$ |
| 459 | $L_{a698}$ | $L_{b135}$ | 460 | $L_{a733}$ | $L_{b135}$ |
| 461 | $L_{a698}$ | $L_{b89}$ | 462 | $L_{a733}$ | $L_{b89}$ |
| 463 | $L_{a698}$ | $L_{b122}$ | 464 | $L_{a733}$ | $L_{b122}$ |
| 465 | $L_{a698}$ | $L_{b139}$ | 466 | $L_{a733}$ | $L_{b139}$ |
| 467 | $L_{a755}$ | $L_{b31}$ | 468 | $L_{a777}$ | $L_{b31}$ |
| 469 | $L_{a755}$ | $L_{b88}$ | 470 | $L_{a777}$ | $L_{b88}$ |
| 471 | $L_{a75}$ | $L_{b122}$ | 472 | $L_{a777}$ | $L_{b122}$ |
| 473 | $L_{a755}$ | $L_{b126}$ | 474 | $L_{a777}$ | $L_{b126}$ |
| 475 | $L_{a755}$ | $L_{b135}$ | 476 | $L_{a777}$ | $L_{b135}$ |
| 477 | $L_{a755}$ | $L_{b89}$ | 478 | $L_{a777}$ | $L_{b89}$ |
| 479 | $L_{a755}$ | $L_{b122}$ | 480 | $L_{a777}$ | $L_{b122}$ |
| 481 | $L_{a755}$ | $L_{b139}$ | 482 | $L_{a777}$ | $L_{b139}$ |
| 483 | $L_{a788}$ | $L_{b31}$ | 484 | $L_{a780}$ | $L_{b31}$ |
| 485 | $L_{a788}$ | $L_{b88}$ | 486 | $L_{a780}$ | $L_{b88}$ |
| 487 | $L_{a788}$ | $L_{b122}$ | 488 | $L_{a780}$ | $L_{b122}$ |
| 489 | $L_{a788}$ | $L_{b126}$ | 490 | $L_{a780}$ | $L_{b126}$ |
| 491 | $L_{a788}$ | $L_{b135}$ | 492 | $L_{a780}$ | $L_{b135}$ |
| 493 | $L_{a788}$ | $L_{b89}$ | 494 | $L_{a780}$ | $L_{b89}$ |
| 495 | $L_{a788}$ | $L_{b122}$ | 496 | $L_{a780}$ | $L_{b122}$ |
| 497 | $L_{a788}$ | $L_{b139}$ | 498 | $L_{a780}$ | $L_{b139}$ |
| 499 | $L_{a791}$ | $L_{b31}$ | 500 | $L_{a793}$ | $L_{b31}$ |
| 501 | $L_{a791}$ | $L_{b88}$ | 502 | $L_{a793}$ | $L_{b88}$ |
| 503 | $L_{a791}$ | $L_{b122}$ | 504 | $L_{a793}$ | $L_{b122}$ |
| 505 | $L_{a791}$ | $L_{b126}$ | 506 | $L_{a793}$ | $L_{b126}$ |
| 507 | $L_{a791}$ | $L_{b135}$ | 508 | $L_{a793}$ | $L_{b135}$ |
| 509 | $L_{a791}$ | $L_{b89}$ | 510 | $L_{a793}$ | $L_{b89}$ |
| 511 | $L_{a791}$ | $L_{b122}$ | 512 | $L_{a793}$ | $L_{b122}$ |
| 513 | $L_{a791}$ | $L_{b139}$ | 514 | $L_{a793}$ | $L_{b139}$ |
| 515 | $L_{a794}$ | $L_{b31}$ | 516 | $L_{a795}$ | $L_{b31}$ |
| 517 | $L_{a794}$ | $L_{b88}$ | 518 | $L_{a795}$ | $L_{b88}$ |
| 519 | $L_{a794}$ | $L_{b122}$ | 520 | $L_{a795}$ | $L_{b122}$ |
| 521 | $L_{a794}$ | $L_{b126}$ | 522 | $L_{a795}$ | $L_{b126}$ |
| 523 | $L_{a794}$ | $L_{b135}$ | 524 | $L_{a795}$ | $L_{b135}$ |
| 525 | $L_{a794}$ | $L_{b89}$ | 526 | $L_{a795}$ | $L_{b89}$ |
| 527 | $L_{a794}$ | $L_{b122}$ | 528 | $L_{a795}$ | $L_{b122}$ |
| 529 | $L_{a794}$ | $L_{b139}$ | 530 | $L_{a795}$ | $L_{b139}$ |
| 531 | $L_{a272}$ | $L_{b31}$ | 532 | $L_{a918}$ | $L_{b31}$ |
| 533 | $L_{a272}$ | $L_{b88}$ | 534 | $L_{a918}$ | $L_{b88}$ |
| 535 | $L_{a272}$ | $L_{b122}$ | 536 | $L_{a918}$ | $L_{b122}$ |
| 537 | $L_{a272}$ | $L_{b126}$ | 538 | $L_{a918}$ | $L_{b126}$ |
| 669 | $L_{a1235}$ | $L_{b122}$ | 670 | $L_{a1235}$ | $L_{b126}$ |

Compound 539 to Compound 668 have the general formula of $Ir(L_a)(L_c)_2$, wherein two $L_c$ are identical, and $L_a$ and $L_c$ are selected from structures listed in the following table, respectively:

| Compound No. | $L_a$ | $L_c$ | Compound No. | $L_a$ | $L_c$ |
|---|---|---|---|---|---|
| 539 | $L_{a1}$ | $L_{c1}$ | 540 | $L_{a1}$ | $L_{c3}$ |
| 541 | $L_{a1}$ | $L_{c4}$ | 542 | $L_{a1}$ | $L_{c11}$ |
| 543 | $L_{a1}$ | $L_{c12}$ | 544 | $L_{a1}$ | $L_{c13}$ |
| 545 | $L_{a1}$ | $L_{c15}$ | 546 | $L_{a1}$ | $L_{c16}$ |
| 547 | $L_{a1}$ | $L_{c20}$ | 548 | $L_{a1}$ | $L_{c21}$ |
| 549 | $L_{a1}$ | $L_{c22}$ | 550 | $L_{a1}$ | $L_{c23}$ |
| 551 | $L_{a1}$ | $L_{c36}$ | 552 | $L_{a1}$ | $L_{c37}$ |
| 553 | $L_{a1}$ | $L_{c38}$ | 554 | $L_{a1}$ | $L_{c39}$ |
| 555 | $L_{a1}$ | $L_{c42}$ | 556 | $L_{a1}$ | $L_{c43}$ |
| 557 | $L_{a1}$ | $L_{c44}$ | 558 | $L_{a1}$ | $L_{c47}$ |
| 559 | $L_{a1}$ | $L_{c232}$ | 560 | $L_{a1}$ | $L_{c233}$ |
| 561 | $L_{a1}$ | $L_{c235}$ | 562 | $L_{a1}$ | $L_{c251}$ |
| 563 | $L_{a1}$ | $L_{c261}$ | 564 | $L_{a1}$ | $L_{c271}$ |
| 565 | $L_{a1}$ | $L_{c308}$ | 566 | $L_{a1}$ | $L_{c309}$ |
| 567 | $L_{a1}$ | $L_{c316}$ | 568 | $L_{a1}$ | $L_{c319}$ |
| 569 | $L_{a1}$ | $L_{c320}$ | 570 | $L_{a1}$ | $L_{c321}$ |
| 571 | $L_{a21}$ | $L_{c1}$ | 572 | $L_{a21}$ | $L_{c3}$ |
| 573 | $L_{a21}$ | $L_{c4}$ | 574 | $L_{a21}$ | $L_{c11}$ |
| 575 | $L_{a21}$ | $L_{c12}$ | 576 | $L_{a21}$ | $L_{c13}$ |
| 577 | $L_{a21}$ | $L_{c15}$ | 578 | $L_{a21}$ | $L_{c16}$ |
| 579 | $L_{a21}$ | $L_{c20}$ | 580 | $L_{a21}$ | $L_{c21}$ |
| 581 | $L_{a21}$ | $L_{c22}$ | 582 | $L_{a21}$ | $L_{c23}$ |
| 583 | $L_{a21}$ | $L_{c36}$ | 584 | $L_{a21}$ | $L_{c37}$ |
| 585 | $L_{a21}$ | $L_{c38}$ | 586 | $L_{a21}$ | $L_{c39}$ |
| 587 | $L_{a21}$ | $L_{c42}$ | 588 | $L_{a21}$ | $L_{c43}$ |
| 589 | $L_{a21}$ | $L_{c44}$ | 590 | $L_{a21}$ | $L_{c47}$ |
| 591 | $L_{a21}$ | $L_{c232}$ | 592 | $L_{a21}$ | $L_{c233}$ |
| 593 | $L_{a21}$ | $L_{c235}$ | 594 | $L_{a21}$ | $L_{c251}$ |
| 595 | $L_{a21}$ | $L_{c261}$ | 596 | $L_{a21}$ | $L_{c271}$ |
| 597 | $L_{a21}$ | $L_{c308}$ | 598 | $L_{a21}$ | $L_{c309}$ |
| 599 | $L_{a21}$ | $L_{c316}$ | 600 | $L_{a21}$ | $L_{c319}$ |
| 601 | $L_{a21}$ | $L_{c320}$ | 602 | $L_{a21}$ | $L_{c321}$ |
| 603 | $L_{a1238}$ | $L_{c1}$ | 604 | $L_{a1238}$ | $L_{c3}$ |
| 605 | $L_{a1238}$ | $L_{c4}$ | 606 | $L_{a1238}$ | $L_{c11}$ |
| 607 | $L_{a1238}$ | $L_{c12}$ | 608 | $L_{a1238}$ | $L_{c13}$ |
| 609 | $L_{a1238}$ | $L_{c15}$ | 610 | $L_{a1238}$ | $L_{c16}$ |
| 611 | $L_{a1238}$ | $L_{c20}$ | 612 | $L_{a1238}$ | $L_{c21}$ |
| 613 | $L_{a1238}$ | $L_{c22}$ | 614 | $L_{a1238}$ | $L_{c23}$ |
| 615 | $L_{a1238}$ | $L_{c36}$ | 616 | $L_{a1238}$ | $L_{c37}$ |
| 617 | $L_{a1238}$ | $L_{c38}$ | 618 | $L_{a1238}$ | $L_{c39}$ |
| 619 | $L_{a1238}$ | $L_{c42}$ | 620 | $L_{a1238}$ | $L_{c43}$ |
| 621 | $L_{a1238}$ | $L_{c44}$ | 622 | $L_{a1238}$ | $L_{c47}$ |
| 623 | $L_{a1238}$ | $L_{c232}$ | 624 | $L_{a1238}$ | $L_{c233}$ |
| 625 | $L_{a1238}$ | $L_{c235}$ | 626 | $L_{a1238}$ | $L_{c251}$ |
| 627 | $L_{a1238}$ | $L_{c261}$ | 628 | $L_{a1238}$ | $L_{c271}$ |
| 629 | $L_{a1238}$ | $L_{c308}$ | 630 | $L_{a1238}$ | $L_{c309}$ |
| 631 | $L_{a1238}$ | $L_{c316}$ | 632 | $L_{a1238}$ | $L_{c319}$ |
| 633 | $L_{a1238}$ | $L_{c320}$ | 634 | $L_{a1238}$ | $L_{c321}$ |
| 635 | $L_{a1240}$ | $L_{c1}$ | 636 | $L_{a1240}$ | $L_{c3}$ |
| 637 | $L_{a1240}$ | $L_{c4}$ | 638 | $L_{a1240}$ | $L_{c11}$ |
| 639 | $L_{a1240}$ | $L_{c12}$ | 640 | $L_{a1240}$ | $L_{c13}$ |
| 641 | $L_{a1240}$ | $L_{c15}$ | 642 | $L_{a1240}$ | $L_{c16}$ |
| 643 | $L_{a1240}$ | $L_{c20}$ | 644 | $L_{a1240}$ | $L_{c21}$ |
| 645 | $L_{a1240}$ | $L_{c22}$ | 646 | $L_{a1240}$ | $L_{c23}$ |
| 647 | $L_{a1240}$ | $L_{c36}$ | 648 | $L_{a1240}$ | $L_{c37}$ |
| 649 | $L_{a1240}$ | $L_{c38}$ | 650 | $L_{a1240}$ | $L_{c39}$ |
| 651 | $L_{a1240}$ | $L_{c42}$ | 652 | $L_{a1240}$ | $L_{c43}$ |
| 653 | $L_{a1240}$ | $L_{c44}$ | 654 | $L_{a1240}$ | $L_{c47}$ |
| 655 | $L_{a1240}$ | $L_{c232}$ | 656 | $L_{a1240}$ | $L_{c233}$ |
| 657 | $L_{a1240}$ | $L_{c235}$ | 658 | $L_{a1240}$ | $L_{c251}$ |
| 659 | $L_{a1240}$ | $L_{c261}$ | 660 | $L_{a1240}$ | $L_{c271}$ |
| 661 | $L_{a1240}$ | $L_{c308}$ | 662 | $L_{a1240}$ | $L_{c309}$ |
| 663 | $L_{a1240}$ | $L_{c316}$ | 664 | $L_{a1240}$ | $L_{c319}$ |
| 665 | $L_{a1240}$ | $L_{c320}$ | 666 | $L_{a1240}$ | $L_{c321}$ |
| 667 | $L_{a1229}$ | $L_{c232}$ | 668 | $L_{a1232}$ | $L_{c232}$. |

* * * * *